US010944399B2

(12) United States Patent
Manipatruni et al.

(10) Patent No.: US 10,944,399 B2
(45) Date of Patent: Mar. 9, 2021

(54) MULTI-LEVEL SPIN LOGIC

(71) Applicant: Intel Corporation, Santa Clara, CA (US)

(72) Inventors: Sasikanth Manipatruni, Hillsboro, OR (US); Ian A. Young, Portland, OR (US); Dmitri E. Nikonov, Beaverton, OR (US); Uygar E. Avci, Portland, OR (US); Patrick Morrow, Portland, OR (US); Anurag Chaudhry, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 15/779,074

(22) PCT Filed: Dec. 23, 2016

(86) PCT No.: PCT/US2016/068596
§ 371 (c)(1),
(2) Date: Nov. 5, 2018

(87) PCT Pub. No.: WO2017/112959
PCT Pub. Date: Jun. 29, 2017

(65) Prior Publication Data

US 2019/0386661 A1 Dec. 19, 2019

Related U.S. Application Data

(63) Continuation of application No. PCT/US2015/000513, filed on Dec. 24, 2015.
(Continued)

(51) Int. Cl.
*H03K 19/00* (2006.01)
*H01L 43/04* (2006.01)
(Continued)

(52) U.S. Cl.
CPC ......... *H03K 19/0002* (2013.01); *H01L 43/04* (2013.01); *H01L 43/06* (2013.01); *H01L 43/10* (2013.01); *H03K 19/18* (2013.01)

(58) Field of Classification Search
None
See application file for complete search history.

(56) References Cited

U.S. PATENT DOCUMENTS

2002/0181185 A1* 12/2002 Kabumoto ........ H01L 23/49838 361/306.3
2007/0228501 A1* 10/2007 Nakamura ............ B82Y 25/00 257/421

(Continued)

FOREIGN PATENT DOCUMENTS

WO 2015038118 3/2015

OTHER PUBLICATIONS

Kardasz et al., Spin current studies in Fe/Ag, Au/Fe by ferromagnetic resonance and time-resolved magneto-optics, Feb. 21, 2008, Appl. Phys. 103, 07C509 (Year: 2008).*

(Continued)

*Primary Examiner* — Amy Cohen Johnson
*Assistant Examiner* — James H Cho
(74) *Attorney, Agent, or Firm* — Green, Howard & Mughal LLP

(57) ABSTRACT

Described is an apparatus which comprises: a 4-state input magnet; a first spin channel region adjacent to the 4-state input magnet; a 4-state output magnet; a second spin channel region adjacent to the 4-state input and output magnets; and a third spin channel region adjacent to the 4-state output magnet. Described in an apparatus which comprises: a 4-state input magnet; a first filter layer adjacent to the 4-state input magnet; a first spin channel region adjacent to the first filter layer; a 4-state output magnet; a second filter layer
(Continued)

adjacent to the 4-state output magnet; a second spin channel region adjacent to the first and second filter layers; and a third spin channel region adjacent to the second filter layer.

24 Claims, 205 Drawing Sheets

Related U.S. Application Data

(60) Provisional application No. 62/380,327, filed on Aug. 26, 2016.

(51) Int. Cl.
*H01L 43/06* (2006.01)
*H01L 43/10* (2006.01)
*H03K 19/18* (2006.01)

(56) References Cited

U.S. PATENT DOCUMENTS

2010/0176428 A1 7/2010 Hong et al.
2012/0176154 A1* 7/2012 Behin-Aein ........... H03K 19/16 326/37
2014/0139265 A1 5/2014 Manipatruni et al.
2015/0008549 A1* 1/2015 Lee ......................... H01L 43/10 257/421
2015/0341036 A1 11/2015 Manipatruni et al.
2016/0248427 A1* 8/2016 Nikonov ................ B82Y 25/00
2017/0178705 A1* 6/2017 Buhrman ................ H01L 43/08
2017/0243917 A1* 8/2017 Manipatruni ........... H01L 27/22
2018/0158587 A1* 6/2018 Manipatruni ....... H01F 10/1936

OTHER PUBLICATIONS

Marchenko et al., Giant Rashba splitting in graphene due to hybridization with gold, Nov. 27, 2012, Nature Communication, (Year: 2012).*

International Search Report and Written Opinion for International Patent Application No. PCT/US2016/068596, dated Apr. 25, 2017.

D'Souza, Noel et al., "Applications of 4-State Nanomagnetic Logic Using Multiferroic Nanomagnets Possessing Biaxial Magnetocrystalline Anisotropy and Experiments on 2-State Multiferroic Nanomagnetic Logic", VCU Scholars Compass, theses and Dissertations, Aug. 19, 2014.

Srinivasan, Srikant et al., "All-Spin Logic Device with inbuilt Non-Reciprocity", IEEE Transactions on Magnetics, Sep. 26, 2011, vol. 47, Issue 1.

Extended European Search Report from European Patent Application No. 16880168.6 notified Jul. 23, 2019, 8 pgs.

Srinivasan, Srikant et al., "All-Spin Logic Device With Inbuilt Nonreciprocity", IEEE Transactions on Magnetics, vol. 47, No. 10, Oct. 2011, 7 pgs.

International Preliminary Report on Patentability from PCT/US2016/068596 notified Jul. 5, 2018, 16 pgs.

* cited by examiner

MULTI-LEVEL SPIN LOGIC

CLAIM OF PRIORITY

This application claims priority to U.S. Provisional Application Ser. No. 62/380,327 titled "Multi-Level Spin Logic" and filed Aug. 26, 2016, which is incorporated by reference in its entirety. This application also claims priority to International Application No. PCT/US2015/000613 titled "Multi-Level Spin Buffer and Inverter" filed Dec. 24, 2015, which is also incorporated by reference in its entirety for all purposes.

BACKGROUND

Majority of the electronic computation today is carried out in Boolean logic in digital computers and electronics. Boolean logic is a form of algebra in which all values are reduced to either TRUE (1) or FALSE (0). Boolean logic gates have scaled following the Moore's law as transistor characteristic lengths have scaled (e.g., to 20 nm). Some limitations to Boolean logic are: limited density of logic gates limited by algebraic constrains in two level logic (Galois field-2 algebra); limited density of interconnect bandwidth limited by the number representation in base 2 number system; and limited density of memory states limited by the information content per logic element.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
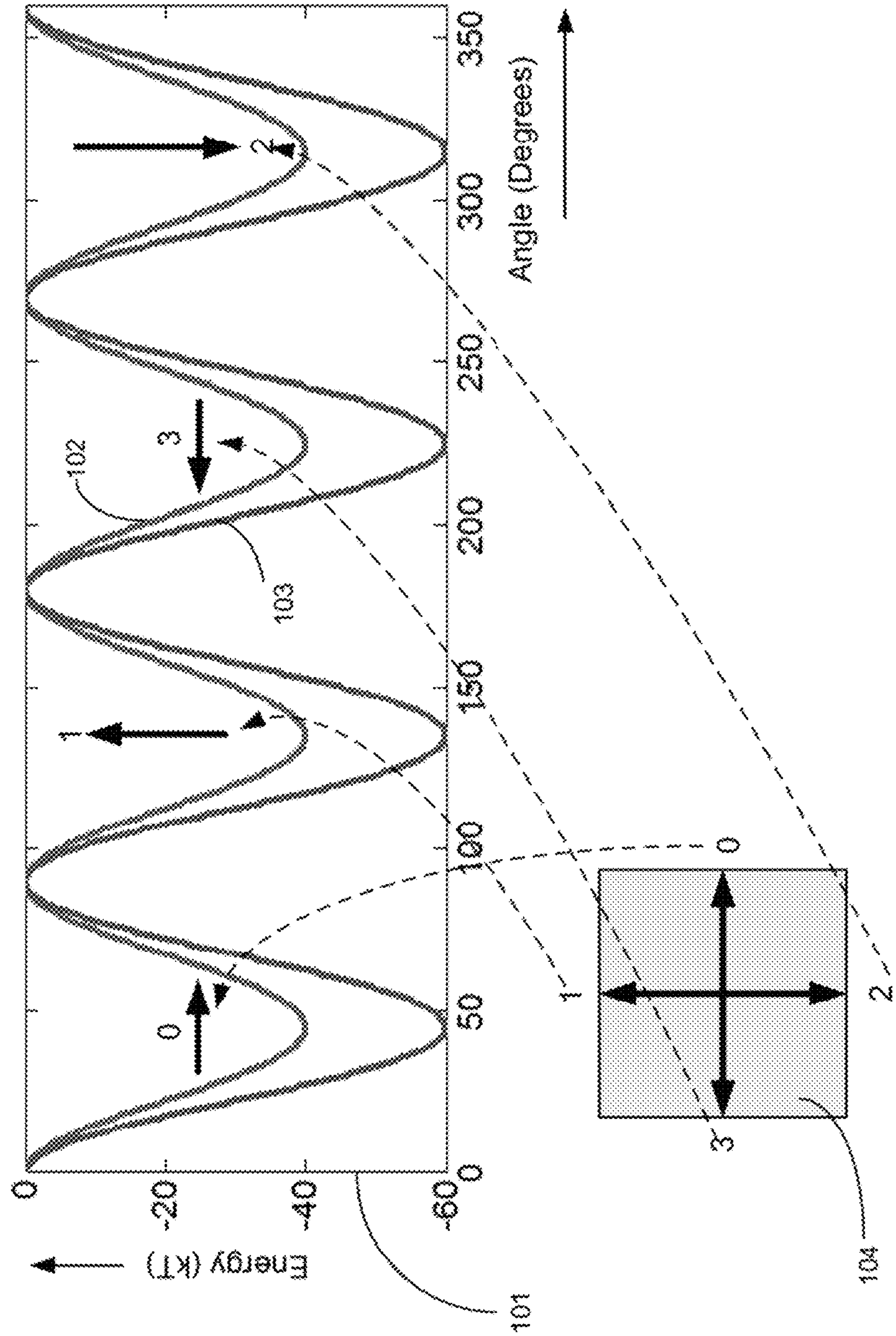
FIG. 1 illustrates a plot showing magnetic crystalline energy of a four state (4-state) magnet and corresponding 4-state magnet used for forming a 4-state spin logic device, in accordance with some embodiments of the disclosure.

Various embodiments describe a 4-state logic memory element which has four uniquely defined logic states. In some embodiments, the four states are separated by high energy barrier (e.g., from 40 kT to 60 kT) to provide low error rate operation. In some embodiments, a metal interconnect is provided which can conduct four uniquely defined interconnect states. In some embodiments, a quaternary logic gate is described which comprises two quaternary magnetic elements sharing a spin channel. In some embodiments, the quaternary logic gate is operable to function as a buffer or non-inverting gate that can buffer or invert spin current in two different orientations (e.g., +/−x and +/−y orientations). In some embodiments, the quaternary logic gate is operable to function as an inverter that can invert an input spin current. This input spin current can be in +/−x or +/−y orientations.

In some embodiments, four orientations (0, 1, 2, and 3) are defined for the 4-state logic memory element such that orientations '0' and '1' are separated by 90 degrees, orientations '1' and '3' are separated by 90 degrees, orientations '3' and '2' are separated by 90 degrees, orientations '0' and '3' are separated by 180 degrees, and orientations '1' and '2' are separated by 180 degrees. In some embodiments, with reference to a four quadrant two dimensional (2D) vector space, magnetic orientation facing +x direction (e.g., East) is orientation '0'; magnetic orientation facing +y direction (e.g., North) is orientation '1', magnetic orientation facing −x direction (e.g., West) is orientation '3', and magnetic orientation facing −y direction (e.g., South) is orientation '2'.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct physical, electrical, or wireless connection between the things that are connected, without any intermediary devices. The term "coupled" means either a direct electrical or wireless connection between the things that are connected or an indirect electrical or wireless connection through one or more passive or active intermediary devices. The term "circuit" means one or more passive and/or active components that are arranged to cooperate with one another to provide a desired function. The term "signal" means at least one current signal, voltage signal, magnetic signal, electromagnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over." "under," and the like in the description and in the claims, if any, are used for descriptive purposes and not necessarily for describing permanent relative positions.

4-State Magnet and their Respective Orientations

FIG. 1 illustrates plot 101 showing magnetic crystalline energy of a 4-state magnet and the corresponding 4-state magnet used for forming a 4-state spin logic device, in accordance with some embodiments of the disclosure. Here, the x-axis is angle in degrees, and the y-axis is Energy in kT (where 'k' is Boltzmann constant and 'T' is temperature). Plot 101 illustrates two waveforms—102 and 103. Waveform 102 illustrates the dependence energy of the magnetic configuration on the angle of magnetization in a 4-state magnet 104. In some embodiments, 4-state magnet 104 is formed of a material such that the four stable magnetic orientations corresponding to logical values '0', '1', '2', and '3' are separated by 40 kT of energy barrier as illustrated by waveform 102. Waveform 103 is similar to waveform 102 except the energy barrier between the four magnetic orientations is 60 kT.

In some embodiments, the four orientations are defined for the 4-state logic memory element such that orientations '0' and '1' are separated by 90 degrees, orientations '1' and '3' are separated by 90 degrees, orientations '3' and '2' are separated by 90 degrees, orientations '0' and '3' are separated by 180 degrees, and orientations '1' and '2' are separated by 180 degrees. In some embodiments, with reference to a four quadrant 2D vector space, magnetic orientation facing +x direction (e.g., East) is orientation '0'; magnetic orientation facing +y direction (e.g., North) is orientation '1', magnetic orientation facing −x direction (e.g., West) is orientation '3', and magnetic orientation facing −y direction (e.g., South) is orientation '2'.

In some embodiments, 4-state magnet 104 is formed using cubic magnetic crystalline anisotropy magnets. In some embodiments, 4-state magnet 104 is formed by combining shape and exchange coupling to create two equal easy axes for nanomagnets. In some embodiments, 4-state magnet 104 comprises a material selected from a group consisting of: Fe, Ni, Co and their alloys, magnetic insulators, and Heusler alloys of the form $X_2YZ$. In some embodiments, the magnetic insulators comprises a material selected from a group consisting of: magnetite $Fe_3O_4$ and $Y_3Al_5O_{12}$. In some embodiments, the Heusler alloys comprises one of: $Co_2FeSi$ and $Mn_2Ga$.

In some embodiments, 4-state magnet 104 is formed with high spin polarization materials. Heusler alloys are an example of high spin polarization materials. Heusler alloys are ferromagnetic metal alloys based on Heusler phase. Heusler phases are intermetallics with particular composition and face-centered cubic crystal structure. Heusler alloys are ferromagnetic because of double-exchange mechanism between neighboring magnetic ions. The neighboring magnetic ions are usually manganese ions, which sit at the body centers of the cubic structure and carry most of the magnetic moment of the alloy.

In some embodiments, 4-state magnet 104 is formed with a sufficiently high anisotropy effective field ($H_k$) and sufficiently low saturated magnetization ($M_s$) to increase injection of spin currents. For example, Heusler alloys of high $H_k$ and low $M_s$ are used to form 4-state magnet 104.

Saturated magnetization $M_s$ is generally the state reached when an increase in applied external magnetic field H cannot increase the magnetization of the material. Here, sufficiently low $M_s$ refers to $M_s$ less than 200 kA/m (kilo-Amperes per meter). Anisotropy effective field $H_k$ generally refers to the material property which is directionally dependent. Materials with $H_k$ are materials with material properties that are highly directionally dependent. Here, sufficiently high $H_k$ in context of Heusler alloys is considered to be greater than 2000 Oe (Oersted). For example, a half metal that does not have bandgap in spin up states but does have bandgap in spin down states (e.g., at the energies within the bandgap, the material has 100% spin up electrons). If the Fermi level of the material is in the bandgap, injected electrons will be close to 100% spin polarized. In this context, "spin up" generally refers to the positive direction of magnetization, and "spin down" generally refers to the negative direction of magnetization. Variations of the magnetization direction (e.g. due to thermal fluctuations) result in mixing of spin polarizations.

In some embodiments, Heusler alloys such as $Co_2FeAl$ and $Co_2FeGeGa$ are used for forming 4-state magnet 104. Other examples of Heusler alloys include: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2Val$, $Mn_2VGa$, $Co_2FeGe$, etc.

4-State Spin Torque Logic Device (Buffer or Inverter)

Figure 2:
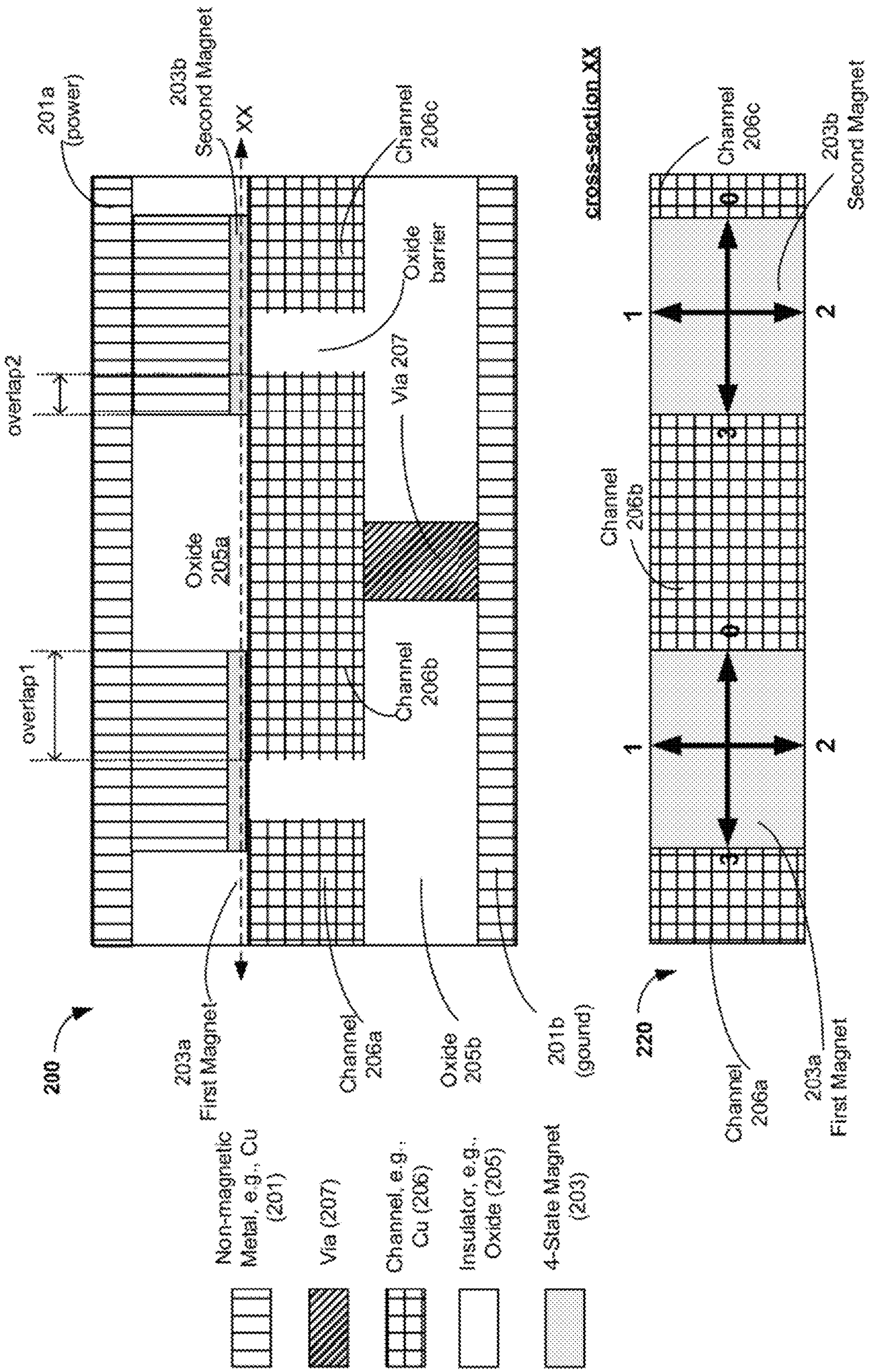
FIG. 2 illustrates a spin logic device with stacking of a 4-state magnet above a spin channel and with matched spacer, in accordance with some embodiments of the disclosure.

FIG. 2 illustrates cross-section 200 of spin logic device with stacking of a 4-state magnet above or below a spin channel and with matched spacer, in accordance with some embodiments of the disclosure. FIG. 2 also illustrates top view 220 of the spin logic device. It is pointed out that those elements of FIG. 2 having the same reference numbers (or names) as the elements of any other figure can operate or function in any manner similar to that described, but are not limited to such. Here, cross-section 200 of spin logic device is also referred to as spin logic device 200 or device 200.

In some embodiments, device 200 comprises a first metal layer 201*a*, First 4-state Magnet 203*a*, Second 4-state Magnet 203*b*, Oxide 205*a* between First and Second 4-state Magnets 203*a/b*, Spin Channel 206 *a/b/c*, Oxide layer 205*b* over Spin Channel 206*a/b/c*, Via 207, and second metal layer 201*b*. Here, Power and Ground metal layers 201*a* and 201*b*, respectively, may be collectively referred to as metal layers 201; First and Second 4-state Magnets 203*a* and 203*b*, respectively, may be collectively referred to as 4-state Magnets 203; Oxide layers 205*a* and 205*b* may be collectively referred to as oxide 205; and Spin Channel 206*a/b/c* may be collectively referred to as Spin Channel 206.

In some embodiments, the material(s) used for forming metal layers 201, Via 207, and Spin Channel 206 is/are the same. For example, Copper (Cu) can be used for forming metal layers 201, Via 207, and Spin Channel 206. In other embodiments, material(s) used for forming metal layers 201, Via 207, and Spin Channel 206 are different. For example, metal layers 201 may be formed of Cu while Via 207 may be formed of Tungsten (W). Any suitable metal or combination of metals can be used for forming metal layers 201, Via 207, and Spin Channel 206. For example, Spin Channel 206 can be formed of Silver (Ag), Aluminum (Al), Graphene, and other 2D conducting materials.

In some embodiments, First and Second 4-state Magnets 203*a/b* are formed using cubic magnetic crystalline anisotropy magnets. In some embodiments, First and Second 4-state Magnets 203*a/b* are formed by combining shape and exchange coupling to create two equal easy axes (e.g., axes with lower energy when magnetization is aligned with them) for a nanomagnets. First and Second 4-state Magnets 203*a/b* may be formed of the same materials as described with reference to 4-state magnet 104.

In some embodiments, Spin Channel 206 is partitioned into segments or regions 206*a*, 206*b*, and 206*c* such that Oxide 205*b* forms a barrier between the channel segments. One purpose of the barrier is to control the transfer of spin polarized current to direction of magnetization and vice versa. In some embodiments, the gap between First and Second Magnets 203*a/b*, provided by Oxide 205*b*, is chosen to be sufficient to permit isolation of the two magnets 203*a/b*. In some embodiments, a layer of oxide 205*b* is deposited before the Spin Channel 206 and then a via hole is etched for Via 207. In some embodiments, Via 207 couples Channel segment 206*b* to Ground supply layer 201*b* which is formed over Oxide layer 205*b*.

In some embodiments, spin device 200 of FIG. 2 is inverted. For example, magnets 203 of device 200 are placed below Spin Channel 206. As such, magnets 203 are closer to the bottom than the top as opposed to placing the magnets of device closer to the top than the bottom. Top view 220 shows the top view of the cross-section XX of cross-section 200, in accordance with some embodiments. Here, the four orientations of the four states of First and Second 4-state Magnets 203*a/b* are shown. In some embodiments, First and Second 4-state Magnets 203*a/b* are cube (or square) shaped. As such, each stable magnetic state of First and Second 4-state Magnets 203*a/b* is separated by the same barrier energy (e.g., 40 kT).

In some embodiments, First 4-state Magnet 203*a* dictates the flow of the spin current in channel 206*b*. This is realized by the asymmetry of First 4-state Magnet 203*a* overlap with channel 206*b*. Here, First 4-state Magnet 203*a* overlaps more with channel 206*b* than Second 4-state Magnet 203*b*. For example, overlap1 is greater than overlap2. This asymmetry in the overlap sets the direction of spin through channel 206*b*, in accordance with some embodiments.

In some embodiments, magnet 203*a* dictates the flow of the spin current in channel 206*b* due to proximity of via 207 which conducts charge current to the ground electrode 201*b*.

Figure 3:
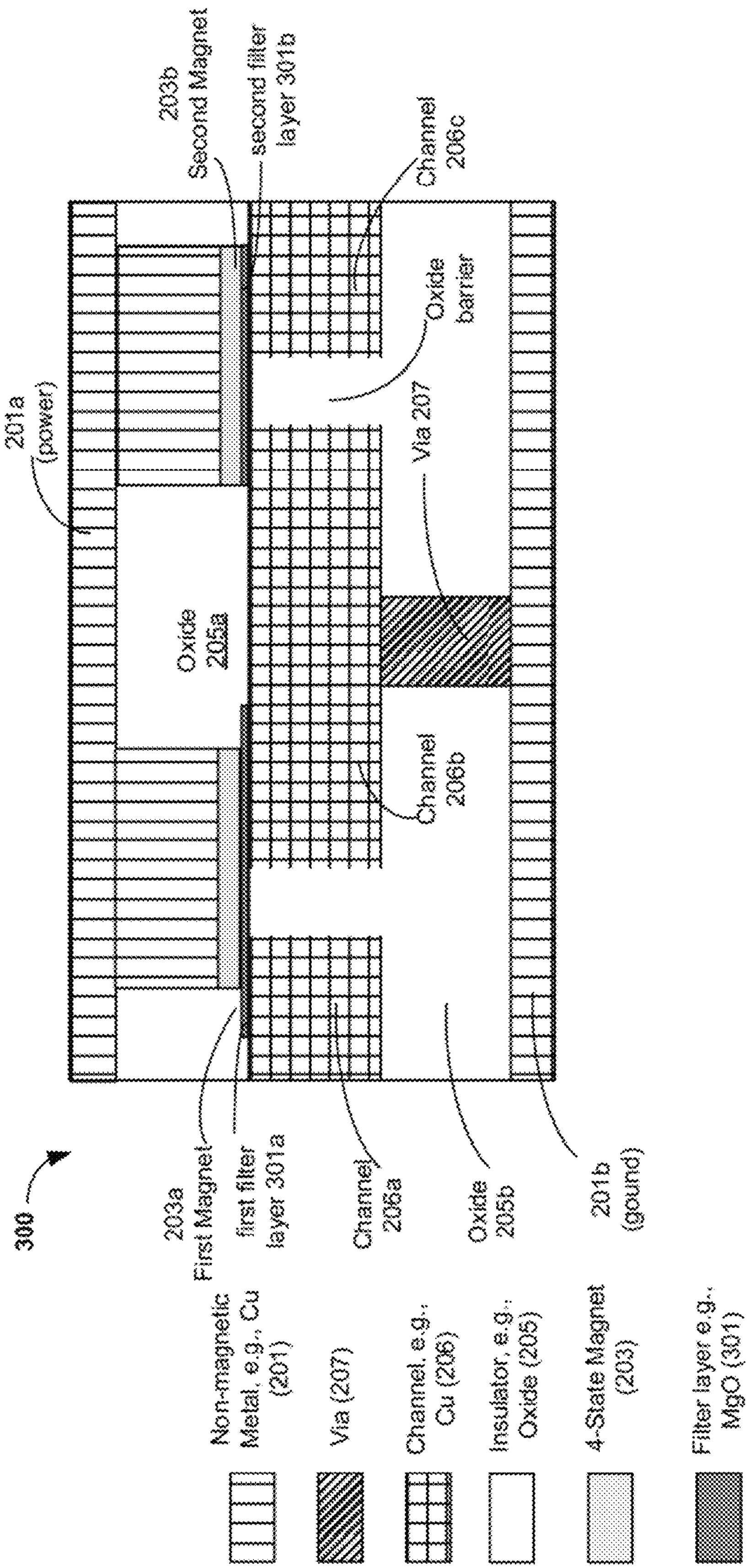
FIG. 3 illustrates a spin logic device with stacking of a 4-state magnet above a spin channel, with matched spacer leaving recessed metal region, in accordance with some embodiments of the disclosure.

FIG. 3 illustrates spin logic device 300 (or cross-section 300) with stacking of a 4-state magnet above or below a spin channel, with matched spacer leaving recessed metal region, in accordance with some embodiments of the disclosure. It is pointed out that those elements of FIG. 3 having the same reference numbers (or names) as the elements of any other figure can operate or function in any manner similar to that described, but are not limited to such. So as not to obscure the embodiments, differences between spin logic devices of FIG. 3 and FIG. 2 are described.

In some embodiments, spin logic device 300 comprises first filter layer 301*a* and second filter layer 301*b*. In some embodiments, first filter layer 301*a* is formed between First 4-state Magnet 203*a* and the portions of channel regions (or segments) 206*a* and 206*b*. As such, unlike First 4-state Magnet 203*a* being directly coupled or adjacent to the portions of channel regions (or segments) 206*a* and 206*b* as described with reference to FIG. 2, here First 4-state Magnet 203*a* is coupled to or adjacent to first filter layer 301*a*. In some embodiments, second filter layer 301*b* is formed between Second 4-state Magnet 203*b* and the portions of channel regions (or segments) 206*c* and 206*b*. As such, unlike Second 4-state Magnet 203*a* being directly coupled to or adjacent to the portions of channel regions (or segments) 206*a* and 206*b*, here Second 4-state Magnet 203*b* is coupled to or adjacent to second filter layer 301*b*.

In some embodiments, first and second filter layers 301*a/b* comprises a material selected from a group consisting of: MgO, $Al_2O_3$, BN, $MgAl_2O_4$, $ZnAl_2O_4$, $SiMg_2O_4$, and $SiZn_2O_4$, and NiFeO. One purpose of the filter layers is to provide high tunneling magnetoresistance, for example.

In some embodiments, First 4-state magnet 203*a* and the first filter layer 301*a* overlap the spin channel region 206*b* more than Second 4-state magnet 203*b* and second filter layer 301*b* overlap the second spin channel region. This asymmetry in the overlap sets the direction of spin through channel 206*b*, in accordance with some embodiments.

Figure 4:
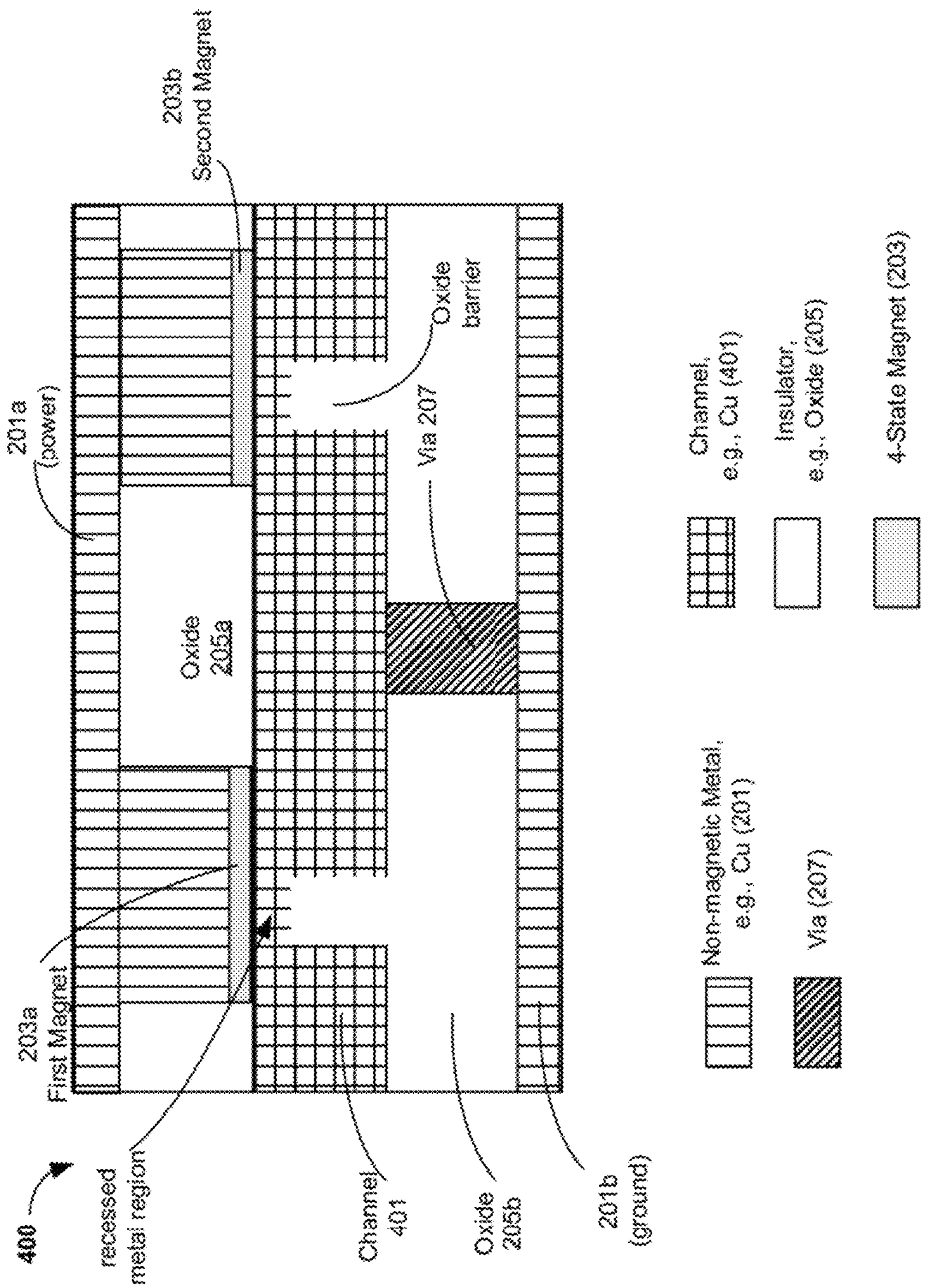
FIG. 4 illustrates a spin logic device with stacking of a 4-state magnet including a filtering layer above a spin channel and with matched spacer, in accordance with some embodiments of the disclosure.

FIG. 4 illustrates spin logic device 400 with stacking of a 4-state magnet including a filtering layer above or below a spin channel and with matched spacer, in accordance with some embodiments of the disclosure. It is pointed out that those elements of FIG. 4 having the same reference numbers (or names) as the elements of any other figure can operate or function in any manner similar to that described, but are not limited to such.

FIG. 4 is similar to FIG. 2 except that Oxide barriers 205*b* are not complete barriers between segments of Spin Channel 206 in FIG. 2. As such, Spin Channel 401 has sections of metal above Oxide barriers 205*b* for coupling the channel segments. One reason for having recessed metal region under Oxide barriers 205*b* is to control the rate of exchange of spin between channel segments. In some embodiments, the height or thickness of the recessed metal region controls the rate of exchange of spin. For example, the thicker the recessed metal region (i.e., lesser the metal recession) the higher the rate of exchange of spin. The embodiment of FIG. 4 provides an alternative way of connecting spin devices. In some embodiments, spin logic devices 200/300/400 are integrated to form majority gate spin logic devices.

Figure 5:
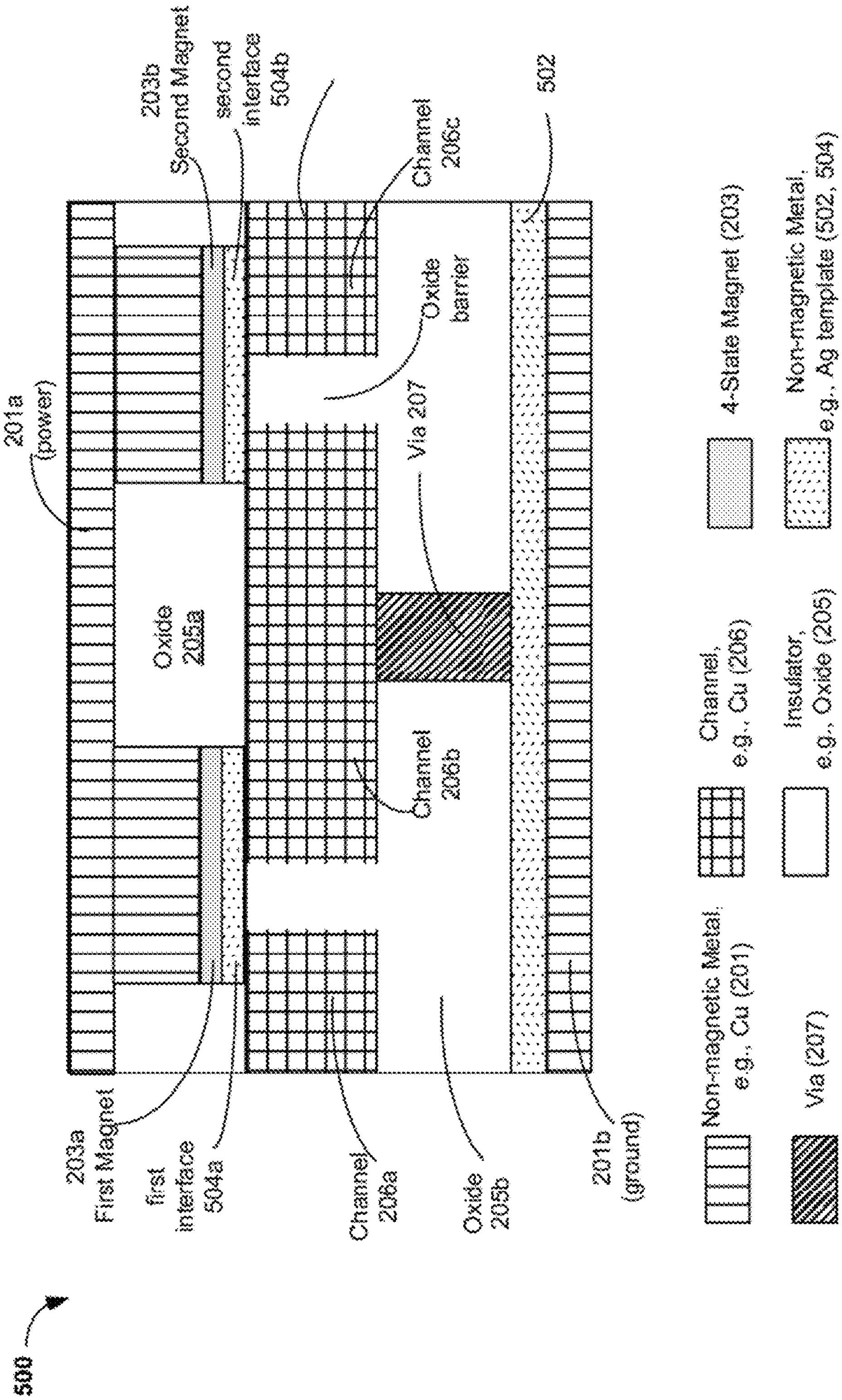
FIG. 5 illustrates a spin logic device with stacking of a 4-state magnet including a filtering layer above a spin channel and with matched spacer, in accordance with some embodiments of the disclosure.

FIG. 5 illustrates spin logic device 500 with stacking of a 4-state magnet including engineered interfaces coupled to the spin channel, in accordance with some embodiments of the disclosure. It is pointed out that those elements of FIG. 5 having the same reference numbers (or names) as the elements of any other figure can operate or function in any manner similar to that described, but are not limited to such.

In some embodiments, engineered interfaces are formed between magnets. For example, first set of interfaces 504*a/b* are formed between First and Second 4-state Magnets 203*a/b*, respectively and Spin Channel 206*a*. In some embodiments, second set of engineered interfaces 502 are coupled to Ground 201*b*. In some embodiments, the dimensions (width, length, and height/thickness) of Ground 201*b* is chosen to optimize (e.g., reduce) the energy-delay of spin device 200/300/400/500. In some embodiments, first set of engineered interfaces 504*a/b* and second set of engineered interfaces 502 are formed of non-magnetic material(s) such that the interface layers and the magnets together have sufficiently matched atomistic crystalline layers. For example, the non-magnetic material has a crystal periodicity which is matched through rotation or by mixing of elements.

Here, sufficiently matched atomistic crystalline layers refer to matching of the lattice constant 'a' within a threshold level above which atoms exhibit dislocation which is harmful to the device (e.g., the number and character of dislocations lead to a significant (e.g., greater than 10%) probability of spin flip while an electron traverses the interface layer). For instance, the threshold level is within 5% (i.e., threshold levels in the range of 0% to 5% of the relative difference of the lattice constants). As the matching improves (e.g., matching gets closer to perfect matching), spin injection efficiency from spin transfer from 4-state magnets 203 to Spin Channel 206 increases. Poor matching (e.g., matching worse than 5%) implies dislocation of atoms that is harmful for the device. In some embodiments, the non-magnetic material is Ag with a crystal lattice constant a=4.05 A which is matched to Heusler alloys CFA (i.e., $Co_2FeAl$) and CFGG (i.e., $Co_2FeGeGa$ with a=5.737 A) provided the direction of the crystal axes is turned by 45 degrees. Then the projection of the lattice constant is expressed as:

$$a/\sqrt{2}\approx 5.737\text{A}/1.414\approx 4.057\text{A}$$

As such, the magnetic structure stack (e.g., stack of 203*a* and 504*a*) allows for interfacial matching of Heusler alloys interfaces with the spin channel. In some embodiments, the stack also allows for templating of the bottom surface of the Heusler alloy.

In some embodiments, interface layers 504*a/b* (e.g., Ag) provide electrical contact to magnets 203. As such, a template is provided with the right crystal orientation to seed the formation of the Heusler alloy (which forms 4-state magnets 203). In some embodiments, the directionality of spin logic may be set by the geometric asymmetry in spin device 200/300/400/500. In some embodiments, the area of overlap of First 4-state magnet 203*a* (e.g., the input magnet) with Spin Channel 206*b* is larger than the area of overlap of Second 4-state magnet 203*b* (e.g., the output magnet) causing asymmetric spin in channel 206*b*.

One technical effect of the engineered interface layers 504*a/b* (e.g., Ag) between Heusler alloy based magnets 203*a/b* and Spin Channel 206 is that it provides for higher mechanical barrier to stop or inhibit the inter-diffusion of magnetic species with Spin Channel 206. In some embodiments, the engineered interface layers 504*a/b* maintain high spin injection at the interface between Spin Channel 206 and magnets 203. As such, engineered interface layers 504*a/b* improve the performance of spin device 500.

In some embodiments, the fabrication of Heusler alloy and the matching layer is via the use of an in situ processing flow. Here, in situ processing flow refers to a fabricating processing flow that does not break vacuum. As such, oxidation on interface layers 504*a/b* are avoided resulting in smooth surfaces at interfaces 504*a/b*.

In some embodiments, First 4-state magnet 203*a* and the first interface layer 504*a* overlap the spin channel region 206*b* more than Second 4-state magnet 203*b* and second interface layer 504*b* overlap the second spin channel region. This asymmetry in the overlap sets the direction of spin through channel 206*b*, in accordance with some embodiments.

Figure 6B:
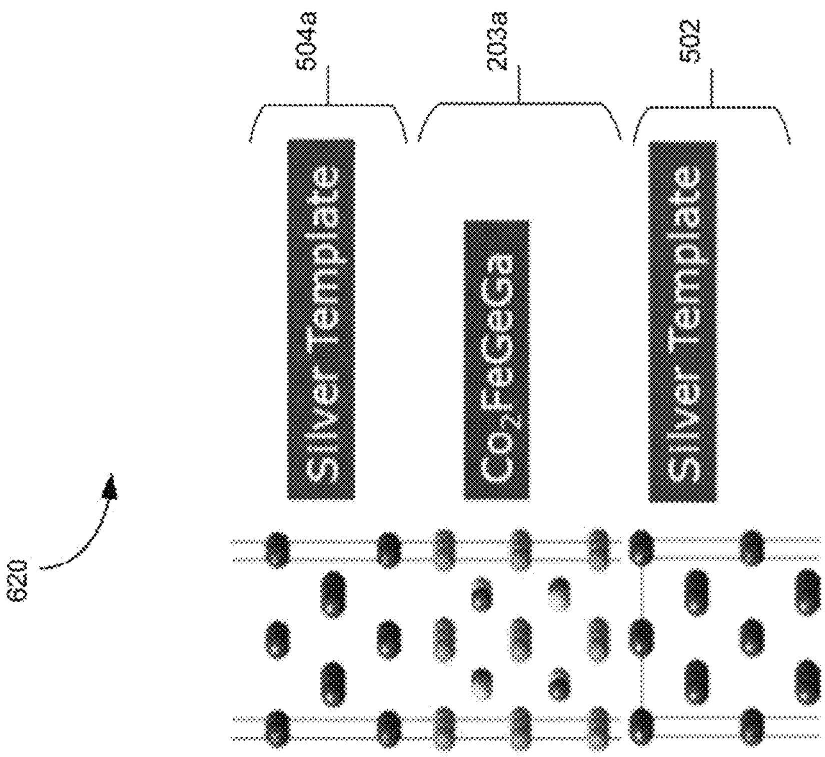
FIGS. 6A-B illustrate stacks for spin logic devices showing atomic templating of Heusler alloys for generating atomistic crystalline matched layers, according to some embodiments of the disclosure.
Figure 6A:
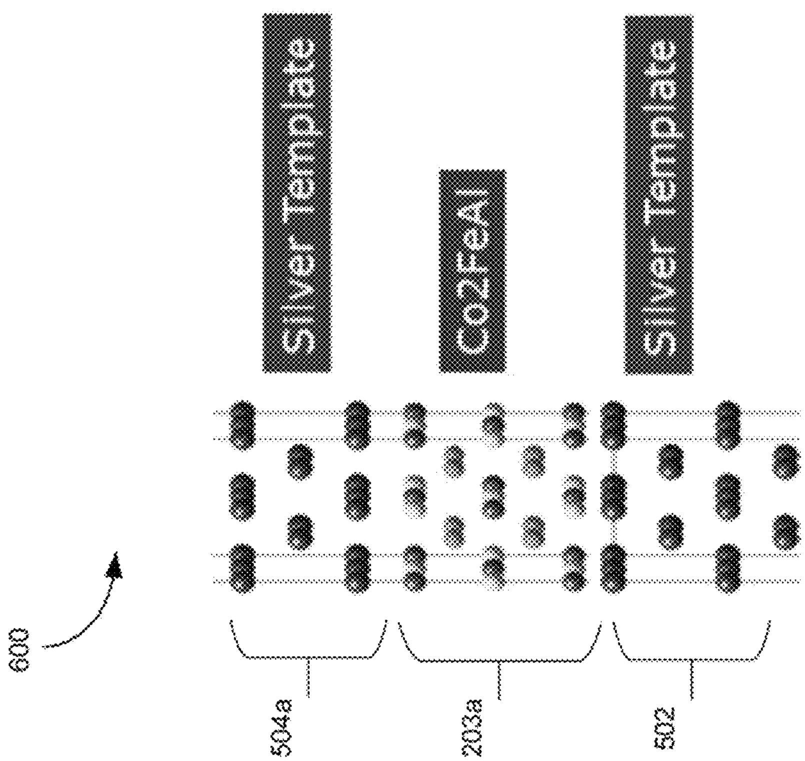

FIGS. 6A-B illustrate proposed stacks 600 and 620, respectively, for spin logic devices showing atomic templating of Heusler alloys for generating atomistic crystalline matched layers, according to some embodiments of the disclosure. It is pointed out that those elements of FIGS. 6A-B having the same reference numbers (or names) as the elements of any other figure can operate or function in any manner similar to that described, but are not limited to such.

Stacks 600 and 620 illustrate a naturally templated magnet using the magnetic structure of some embodiments. A characteristic of templated stacks is that the crystalline growth of a layer is not adversely affected by the crystal symmetry of the underlying layer. Stacks 600 and 620 are a stack of interface layer 502 (e.g., Ag), magnet layer 203*a*, and interface layer 504*a* (e.g., Ag). Stack 600 shows matching of Ag with $Co_2FeAl$ while stack 620 shows matching of Ag with $Co_2FeGeGa$. Here, there is a 2% difference in crystal periodicity which makes the interface between Ag with $Co_2FeAl$, and Ag with $Co_2FeGeGa$, well matched (e.g., Ag has a crystal periodicity which is matched well with the magnet through in-plane rotation).

In some embodiments, the direction of the injected spins is reverse of the magnet polarity for inverter. The direction of spins in the channel below the two magnets can be the same. For inverter, the spins under the injection magnet is opposite of the injector while for a buffer, the direction is identical, in accordance with some embodiments.

Figure 7:
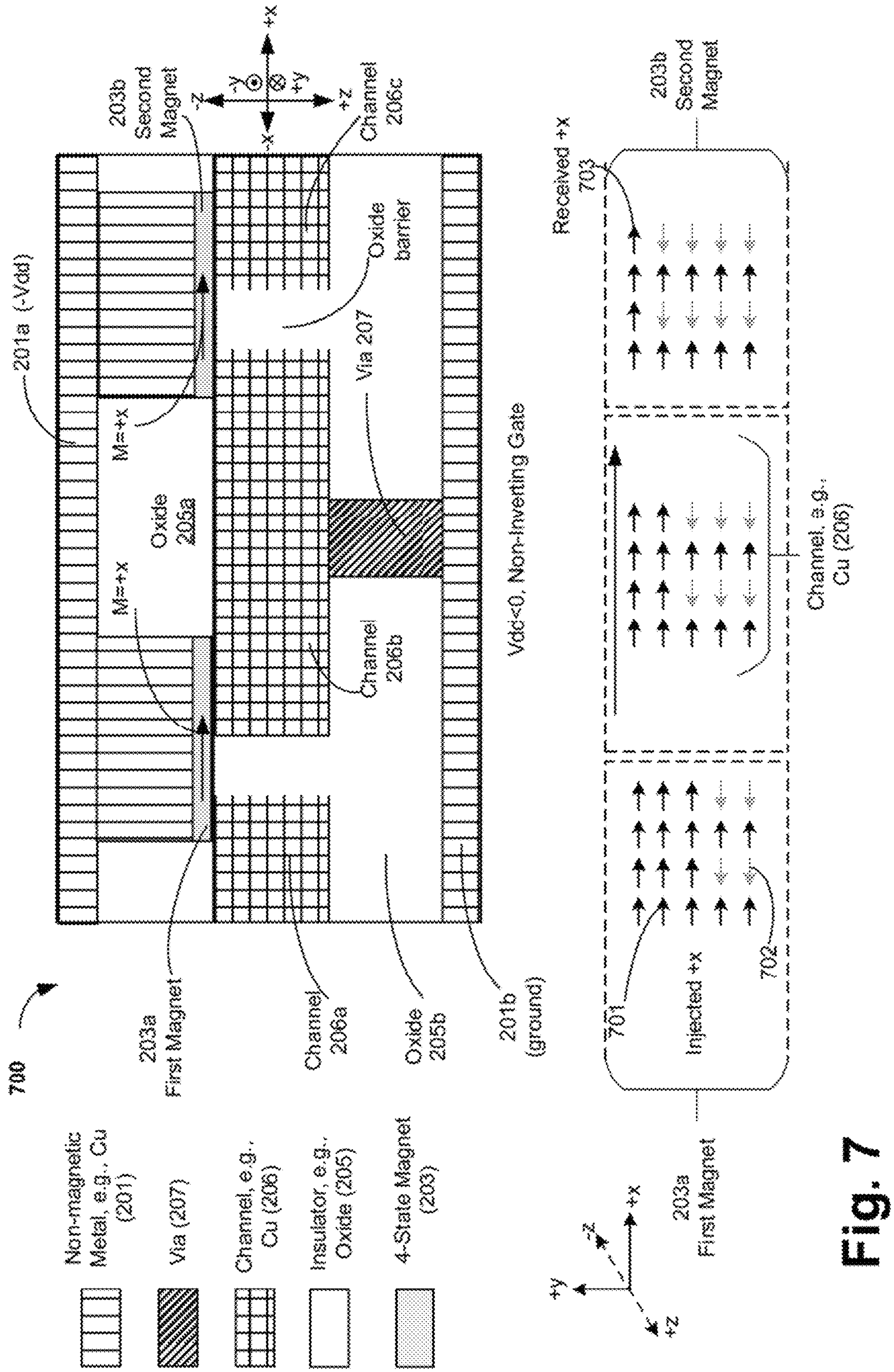
FIG. 7 illustrates a 4-state non-inverting spin gate or buffer injecting spins in the +x direction and receiving spins in the −x direction, in accordance with some embodiments of the disclosure.

FIG. 7 illustrates a 4-state non-inverting spin gate or buffer 700 injecting spins in +x direction and receiving spins in +x direction, in accordance with some embodiments of the disclosure. It is pointed out that those elements of FIG. 7 having the same reference numbers (or names) as the elements of any other figure can operate or function in any manner similar to that described, but are not limited to such.

In some embodiments, the spin injection from the 4-state magnets is setup to produce a spin population in the spin interconnect such that a spin current is generated that flows along the channel. Here, spin current in the +x direction is in channel region 206*a* under the First 4-state Magnet 203*a*. This spin current is also referred to as the injected spin current (e.g., injected in channel region 206*a*). The dominant spin current is shown by spin direction 701 in the +x direction while some minority spin 702 in channel 206*a* points in the −x direction.

In some embodiments, when a negative voltage (e.g., −Vdd) is applied to metal layer 201*a* and ground is applied to metal layer 201*b*, then device 700 behaves as a buffer. In this case, if the magnetic orientation ‘M’ of First 4-state Magnet 203*a* (i.e., the input magnet) is in +x direction (i.e., M=+x), it causes the majority of spins to traverse through channel 206*b* towards Second 4-state Magnet 203*b* (i.e., the output magnet). The spins (e.g., majority and minority spins) in channel region 206*b* are shown by the arrows channel 206*b*. The magnetic orientation ‘M’ of Second 4-state Magnet 203*b* is switched to the +x direction (i.e., M=+x) due to spin torque from the received spin current 703 in the +x direction. Spin current 703 is the spin current in channel region 206*c* under Second 4-state Magnet 206*b*. As such, the 4-state magnets allow the injected +x direction spin current 701 to be received as spin current 703 in the same direction (i.e., +x direction) at the receiving channel 206*c*.

In some embodiments, the input magnet 203*a* dictates the flow of the spin current in channel 206*b*. This is realized by the asymmetry of First 4-state Magnet 203*a* overlap with channel 206*c*. Here, First 4-state Magnet 203*a* overlaps more with channel 206*b* than Second 4-state Magnet 203*b*. In some embodiments, when −Vdd voltage is applied to metal layer 201*a*, the direction of the spin current in channel 206*b* is the same as the direction of the spins of First 4-state Magnet 203*a*. As such, a flow of spin current from First 4-state Magnet 203*a* to Second 4-state Magnet 203*b* comprises spins with the polarity of First 4-state Magnet 203*a*. For the buffer (or non-inverting gate of FIG. 7), the spins under the input magnet 203*a* is identical to the spins under the output magnet 203*b*, in accordance with some embodiments.

Figure 8:
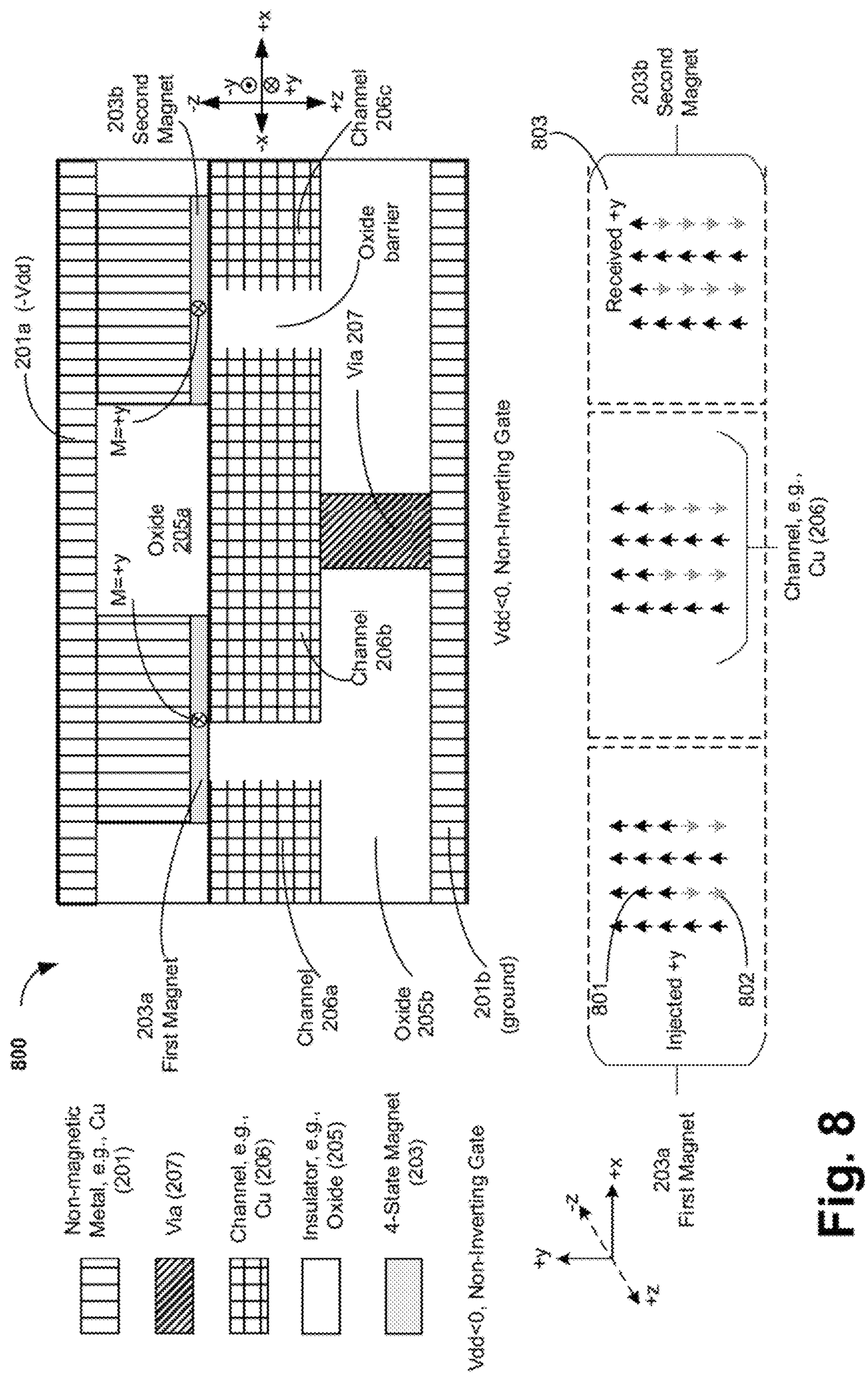
FIG. 8 illustrates a 4-state non-inverting spin gate or buffer injecting spins in the +y direction and receiving spins in the +y direction, in accordance with some embodiments of the disclosure.

FIG. 8 illustrates a 4-state non-inverting spin gate or buffer 800 injecting spins in the +y direction and receiving spins in the +y direction, in accordance with some embodiments of the disclosure. It is pointed out that those elements of FIG. 8 having the same reference numbers (or names) as the elements of any other figure can operate or function in any manner similar to that described, but are not limited to such.

Here, spin current in the +y direction is in channel region 206*a* under First 4-state Magnet 203*a*. This spin current is also referred to as the injected spin current (e.g., injected in channel region 206*a*). The dominant spin current is shown by spin direction 801 in the +y direction while minority spin 802 in channel 206*a* points in the −y direction.

In some embodiments, when a negative voltage (e.g., −Vdd) is applied to metal layer 201*a* and ground is applied to metal layer 201*b*, then device 800 behaves as a buffer. In this case, the magnetic orientation ‘M’ of First 4-state Magnet 203*a* (i.e., input magnet) in the +y direction (i.e., M=+y pointing out of the figure) influences the majority of spins in the +y direction to traverse through channel 206*b* towards Second 4-state Magnet 203*a* (i.e., the output magnet). The magnetic orientation ‘M’ of Second 4-state Magnet 203*b* is switched to the +y direction (i.e., M=+y pointing out of the figure) due to spin torque produced by the received spin current 803 in the +y direction. As such, the 4-state magnets allow the injected +y direction spin current 801 to be received in the same direction (i.e., +y direction) at the receiving channel 206*c*.

In some embodiments, the input magnet 203*a* dictates the flow of the spin current in channel 206*b*. This is realized by the asymmetry of First 4-state Magnet 203*a* overlap with channel 206*c*. Here, First 4-state Magnet 203*a* overlaps more with channel 206*b* than Second 4-state Magnet 203*b*. In some embodiments, when −Vdd voltage is applied to metal layer 201*a*, the direction of the spin current in channel 206*b* is the same as the direction of the spins of First 4-state Magnet 203*a*. As such, a flow of spin current from First 4-state Magnet 203*a* to Second 4-state Magnet 203*b* comprises spins with polarity of First 4-state Magnet 203*a*. In this example, the prevalence of majority spin current relative to minority spin current decreases along the channel (i.e., decreases from channel region 206*a* to channel region 206*c*). For the buffer (or non-inverting gate of FIG. 8), the spins under the input magnet 203*a* is identical to the spins under the output magnet 203*b*, in accordance with some embodiments.

Figure 9:
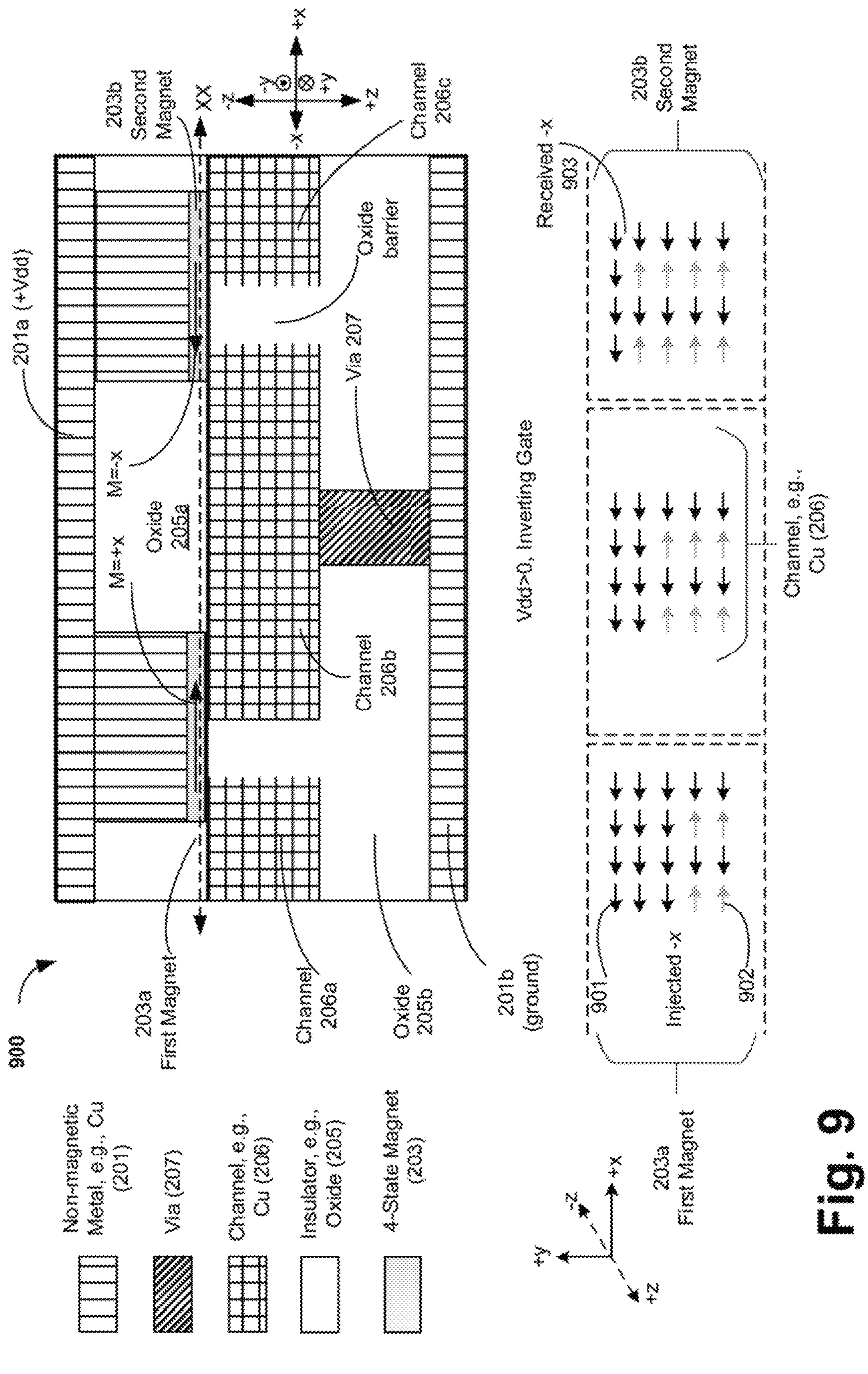
FIG. 9 illustrates a 4-state inverting spin gate injecting spins in the −x direction and receiving spins in the +x direction, in accordance with some embodiments of the disclosure.

FIG. 9 illustrates a 4-state inverting spin gate 900 injecting spins in the −x direction and receiving spins in the −x direction, in accordance with some embodiments of the disclosure. It is pointed out that those elements of FIG. 9 having the same reference numbers (or names) as the elements of any other figure can operate or function in any manner similar to that described, but are not limited to such.

Here, spin current in the −x direction is injected in channel region 206*a*. Note, here input magnet 203*a* is magnetized in the +x direction (i.e., M=+x), the spin under input magnet 203*a* is in the −x direction, and the spin under channel region 206*b* is in the −x direction. The dominant spin current is shown by spin direction 901 in the −x direction while some minority spin 902 in channel 206*a* points in the +x direction. The propagation of the spin current through device 900 depends on the magnetization of First and Second 4-state Magnets 203*a/b*. The spin current received in channel region 206*c* is in the −x direction as indicated by majority spin current 903. The prevalence of majority spin current relative to minority spin current decreases along the channel (i.e., decreases from channel region 206*a* to channel region 206*c*).

In some embodiments, when a positive voltage (e.g., +Vdd) is applied to metal layer 201*a* and ground is applied to metal layer 201*b*, then device 900 behaves as an inverter. In this case, the magnetic orientation of First 4-state Magnet 203*a* (i.e., the input magnet) is in +x direction causing the majority of spins to traverse through channel 206*b* towards Second 4-state Magnet 203*a* (i.e., the output magnet). In some embodiments, the input magnet (203*a*) dictates the flow of the spin current in channel 206*b*. This is realized by the asymmetry of the magnet overlap with the channel. For example, First 4-state Magnet 203*a* overlaps more with channel 206*b* than Second 4-state Magnet 203*a*.

In some embodiments, a flow of spin current from First 4-state Magnet 203*a* to Second 4-state Magnet 203*b* comprises spins with opposite polarity of First 4-state Magnet 203*a* (e.g., the ratio of majority spin current relative to minority spin current decreases along the channel from channel region 206*a* to channel region 206*c*). In some embodiments, for an inverter, the direction of the injected spins is reverse of the magnet polarity for inverter. For example, the direction of majority spins 901 is in the −x direction while the direction of magnetization of Second Magnet 203*b* is in the +x direction. In some embodiments, the direction of spins in channel region 206*b* below the two magnets can be the same for an inverter.

Figure 10:
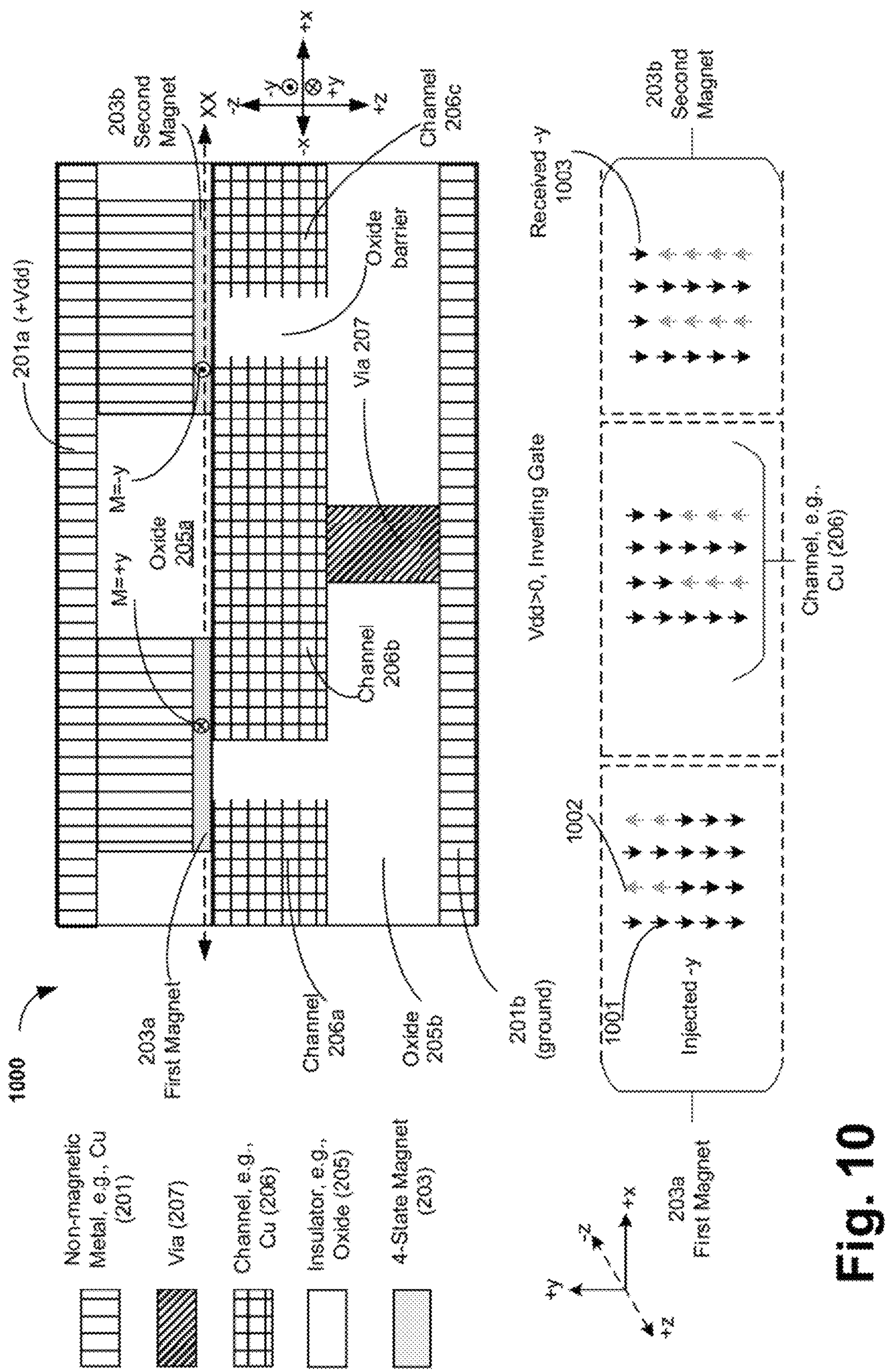
FIG. 10 illustrates a 4-state inverting spin gate injecting spins in the −y direction and receiving spins in the −y direction, in accordance with some embodiments of the disclosure.

FIG. 10 illustrates a 4-state inverting spin gate 1000 injecting spins in the −y direction (input magnet 203*a* is magnetized in the +y direction (i.e., M=+y), and spin under input magnet 203*a* and in channel region 206*b* is in the −y direction) and receiving spins in the −y direction, in accordance with some embodiments of the disclosure. It is pointed out that those elements of FIG. 10 having the same reference numbers (or names) as the elements of any other figure can operate or function in any manner similar to that described, but are not limited to such.

Here, spin current in the −y direction is injected in channel region 206*a*. The dominant spin current is shown by spin direction 1001 in the −y direction while some minority spin 1002 in channel 206*a* points in the +y direction. The propagation of the spin current through device 1000 depends on the magnetization of First and Second 4-state Magnets 203*a/b*.

In some embodiments, when a positive voltage (e.g., +Vdd) is applied to metal layer 201*a* and ground is applied to metal layer 201*b*, then device 1000 behaves as an inverter. In this case, the magnetic orientation 'M' of First 4-state Magnet 203*a* (i.e., input magnet) is in the +y direction (i.e., M=+y) causing the majority of spins to traverse through channel 206*b* towards Second 4-state Magnet 203*b* (i.e., output magnet). In some embodiments, the input magnet 203*a* dictates the flow of the spin current in channel 206*b*. This is realized by the asymmetry of the magnet overlap with the channel. For example, First 4-state Magnet 203*a* overlaps more with channel 206*b* than Second 4-state Magnet 203*b*.

In some embodiments, flow of spin current from First 4-state Magnet 203*a* to Second 4-state Magnet 203*b* comprises spins with opposite polarity of First 4-state Magnet 203*a*. In some embodiments, for an inverter, the direction of the injected spins is reverse of the magnet polarity for inverter. For example, the direction of majority spins in channel region 206*c* is in the −y direction (as indicated by majority spin current 1003) while the direction of magnetization of First Magnet 203*a* is in the +y direction. In some embodiments, the direction of spins in channel region 206*b* below the two magnets can be the same for an inverter.

The 4-state inverter operation can be described with reference to Table 1. In Table 1, the power supply to metal layer 201*a* is a positive supply +Vdd.

TABLE 1

| Input Magnet Orientation (i.e., 203a) | Output Magnet Orientation (i.e., 203b) | Function |
|---|---|---|
| +x (0) | −x (3) | inverter |
| −x (3) | +x (0) | inverter |
| +y (1) | −y (2) | inverter |
| −y (2) | +y (1) | inverter |

The 4-state buffer operation can be described with reference to Table 2. In Table 2, the power supply to metal layer 201*a* is a negative supply −Vdd.

TABLE 2

| Input Magnet Orientation (i.e., 203a) | Output Magnet Orientation (i.e., 203b) | Function |
|---|---|---|
| +x (0) | +x (0) | buffer |
| −x (3) | −x (3) | buffer |
| +y (1) | +y (1) | buffer |
| −y (2) | −y (2) | buffer |

Figure 11:
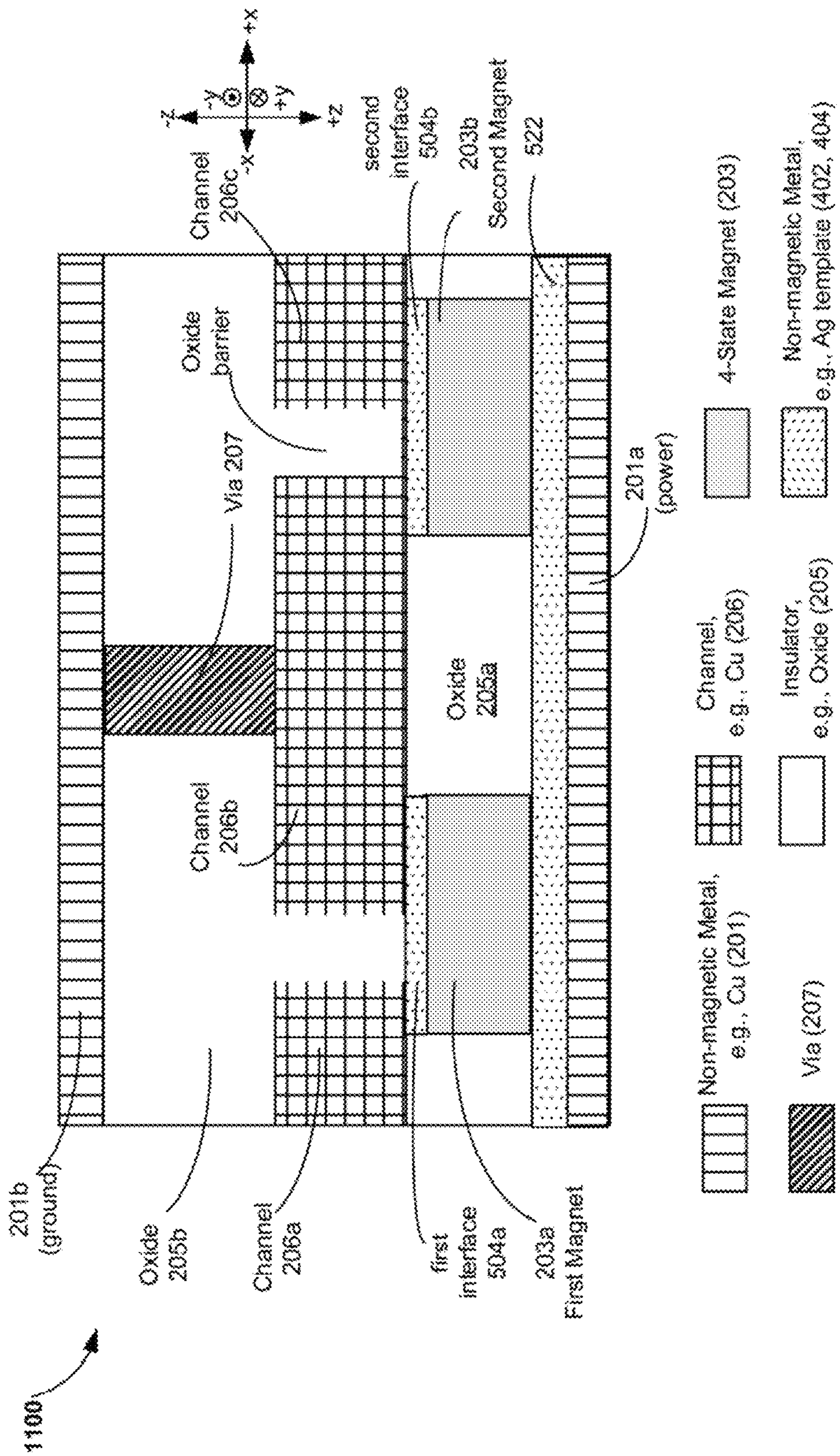
FIG. 11 illustrates a spin logic device with stacking of a 4-state magnet above a spin channel and with matched spacer, in accordance with some embodiments of the disclosure.

FIG. 11 illustrates spin logic device 1100 with 4-state magnet, according to some embodiments of the disclosure. It is pointed out that those elements of FIG. 11 having the same reference numbers (or names) as the elements of any other figure can operate or function in any manner similar to that described, but are not limited to such. Spin logic device 1100 is similar to spin logic device 500 in function except that an interface templating layer 522 (e.g., Ag) is deposited over metal layer 201*a* and the structure of the device is flipped upside down, in accordance with some embodiments.

Figure 12:
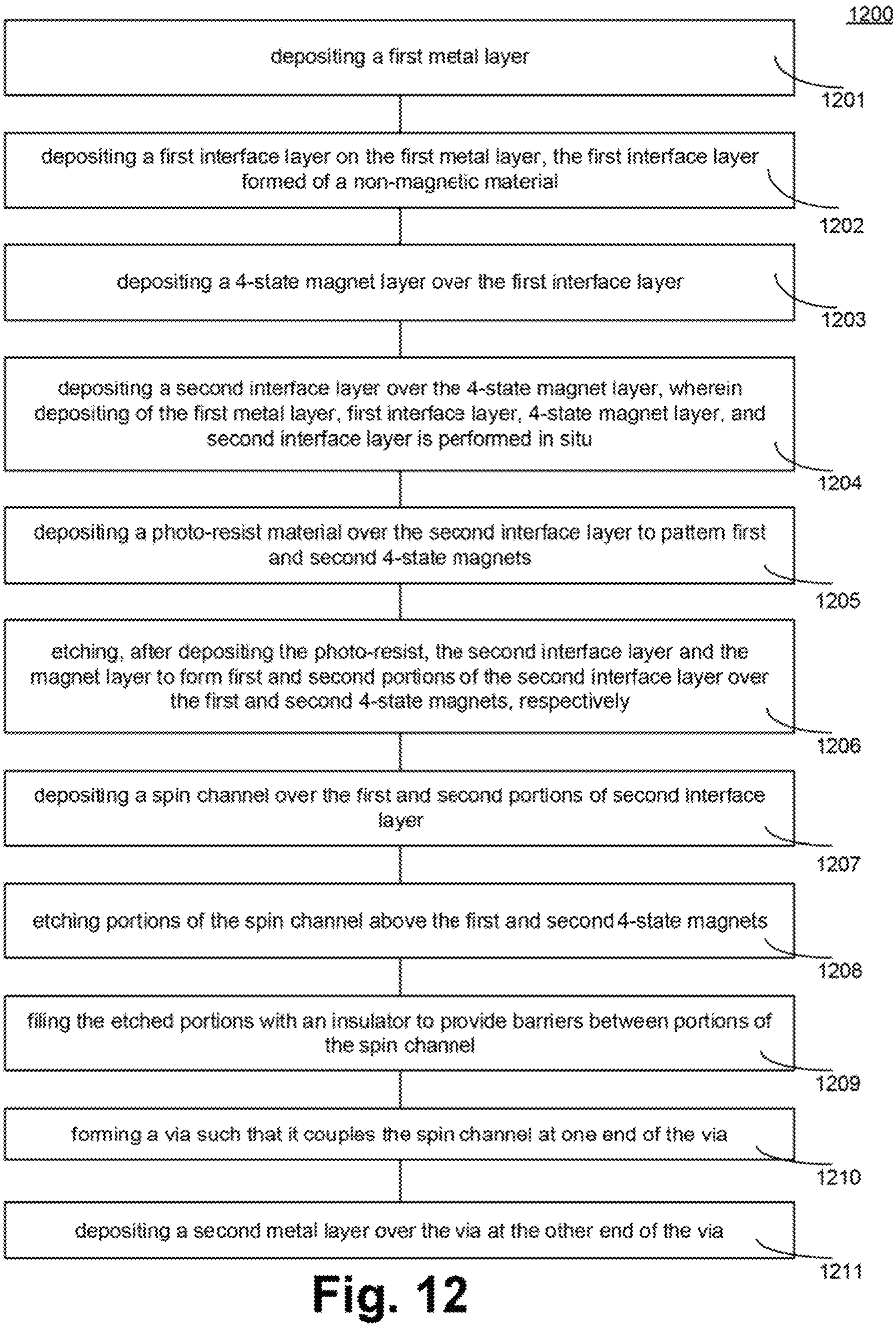
FIG. 12 illustrates a flowchart of a method for fabricating a spin logic device with 4-state magnets, according to some embodiments of the disclosure.

FIG. 12 illustrates flowchart 1200 of a method for fabricating a spin logic device with 4-state magnet (e.g., an upside down version of spin logic device 200 which is illustrated as spin logic device 1100), according to some embodiments of the disclosure. It is pointed out that those elements of FIG. 12 having the same reference numbers (or names) as the elements of any other figure can operate or function in any manner similar to that described, but are not limited to such.

Although the blocks in the flowchart with reference to FIG. 12 are shown in a particular order, the order of the actions can be modified. Thus, the illustrated embodiments can be performed in a different order, and some actions/blocks may be performed in parallel. Some of the blocks and/or operations listed in FIG. 12 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1201, first metal layer 201*a* is deposited. In some embodiments, first metal layer 201*a* is coupled to supply, either +Vdd or −Vdd depending on the desired logic function to be an inverter or buffer. At block 1202, interface layer 522 is deposited over first metal layer 201*a*. In some embodiments, interface layer 522 is formed of a non-magnetic material (e.g., Ag). At block 1203, a 4-state magnet layer 203 (e.g., before being etched to form input and output magnets 203*a/b*) is deposited over interface layer 522. In some embodiments, 4-state magnet layer 203 is formed of a material with a sufficiently high anisotropy and sufficiently low saturated magnetization to increase injection of spin currents.

At block 1204, interface layer 504 (before being etched to form interface layers 504*a/b*) is deposited over 4-state magnet layer 203 such that 4-state magnet layer 203 is sandwiched between the interface layers 504 and 522. In some embodiments, interface layers 504 and 522 are formed of non-magnetic material such that the interface layers and magnet layers 203 together have sufficiently matched atomistic crystalline layers.

In some embodiments, the processes of blocks 1201, 1202, 1203, and 1204 are perform in situ (e.g., the fabrication processes do not break vacuum). As such, oxidization between interfaces of the layers 201, 522, 203, and 504 is avoided (e.g., smooth interface surfaces are achieved). Smooth interface surfaces of the layers 201, 522, 203, and 504 allow for higher spin injection efficiency, according to some embodiments.

In some embodiments, 4-state magnet layer 203 is patterned to form First and Second 4-state Magnets 203*a* and 203*b*. This process breaks vacuum. For example, a photoresist material is deposited over interface layer 504 and then etched for forming a patterned photoresist layer, where the pattern indicates future locations of First and Second 4-state Magnets 203*a/b*. At block 1205, interface layer 504 and 4-state magnet layer 203 are selectively etched using the patterned photoresist to form first and second portions 504*a/b* of interface layer 504. As such, First and Second 4-state Magnets 203*a/b* are also formed. The photoresist material is then removed. Any suitable photoresist material may be used.

At block 1206, Spin Channel 206 (e.g., metal layer) is deposited over first and second portions 504*a/b* of interface layer 504. In some embodiments, Spin Channel 206 is patterned into segments 206*a/b/c* by photoresist deposition and patterning of the photoresist material. At block 1207, portions of Spin Channel 206 are etched to form segments of Spin Channel 206/*a/b/c*. In some embodiments, the depth of etching of Spin Channel 206 is adjusted as discussed with reference to FIG. 4. At block 1208, portions of Spin Channel 206 are etched above the first and second 4-state magnets.

In some embodiments, at block 1209 the etched portions are filled with an insulator (e.g., Oxide 205*b*). In some embodiments, Oxide 205*b* is etched to form a via hole which is then filled with a metal to form Via 207 such that it couples Spin Channel 206*b* at one end of Via 207 as illustrated by block 1210. At block 1211, a second metal layer 201*b* is deposited over Oxide 205*b* to make contact with the other end of Via 207. In some embodiments, second metal layer 201*b* is coupled to a Power supply.

4-State Mirror Operators Using Spin Orbit Effect (SOC)

Some embodiments describe a highly efficient transduction method and associated apparatus for converting spin currents to charge currents and then back to spin currents. In some embodiments, Spin Orbit Coupling (e.g., spin Hall effect) is used for transduction from the 4-state magnet state to charge current and vice versa. Spin Orbit Coupling (SOC) is more efficient switching mechanism for switching magnetization. In some embodiments, charge current via a non-magnetic interconnect carries the signal between input and output magnets rather than spin-polarized current. In some embodiments, the sign of the charge current is determined by the direction of magnetization in the input magnet.

In some embodiments, spin-to-charge conversion is achieved via spin orbit interaction in metallic interfaces (i.e., using Inverse Rashba-Edelstein Effect (IREE) and/or Inverse SHE (ISHE), where a spin current injected from an input magnet produces a charge current.

Table 3 summarizes transduction mechanisms for converting spin current to charge current and charge current to spin current for bulk materials and interfaces.

TABLE 3

Transduction mechanisms for Spin to Charge and Charge to Spin Conversion using SOC

| | Charge → Spin | Spin → Charge |
|---|---|---|
| Bulk | Spin Hall Effect | Inverse Spin Hall Effect |
| Interface | Rashba-Edelstein Effect | Inverse Rashba-Edelstein effect |

There are many technical effects of the various embodiments. For example, long distance interconnects are provided which can be used to convey the charge which does not attenuate as spin currents do. This charge is later converted to spin again for logic operations by the spin logic. As such, faster switching speed (e.g., five times faster) and lower switching energy (e.g., 1000 times lower) are observed for signal propagation from the input magnet to the output magnet compared to spin transfer based circuits. Other technical effects will be evident by the various embodiments.

Figure 13:
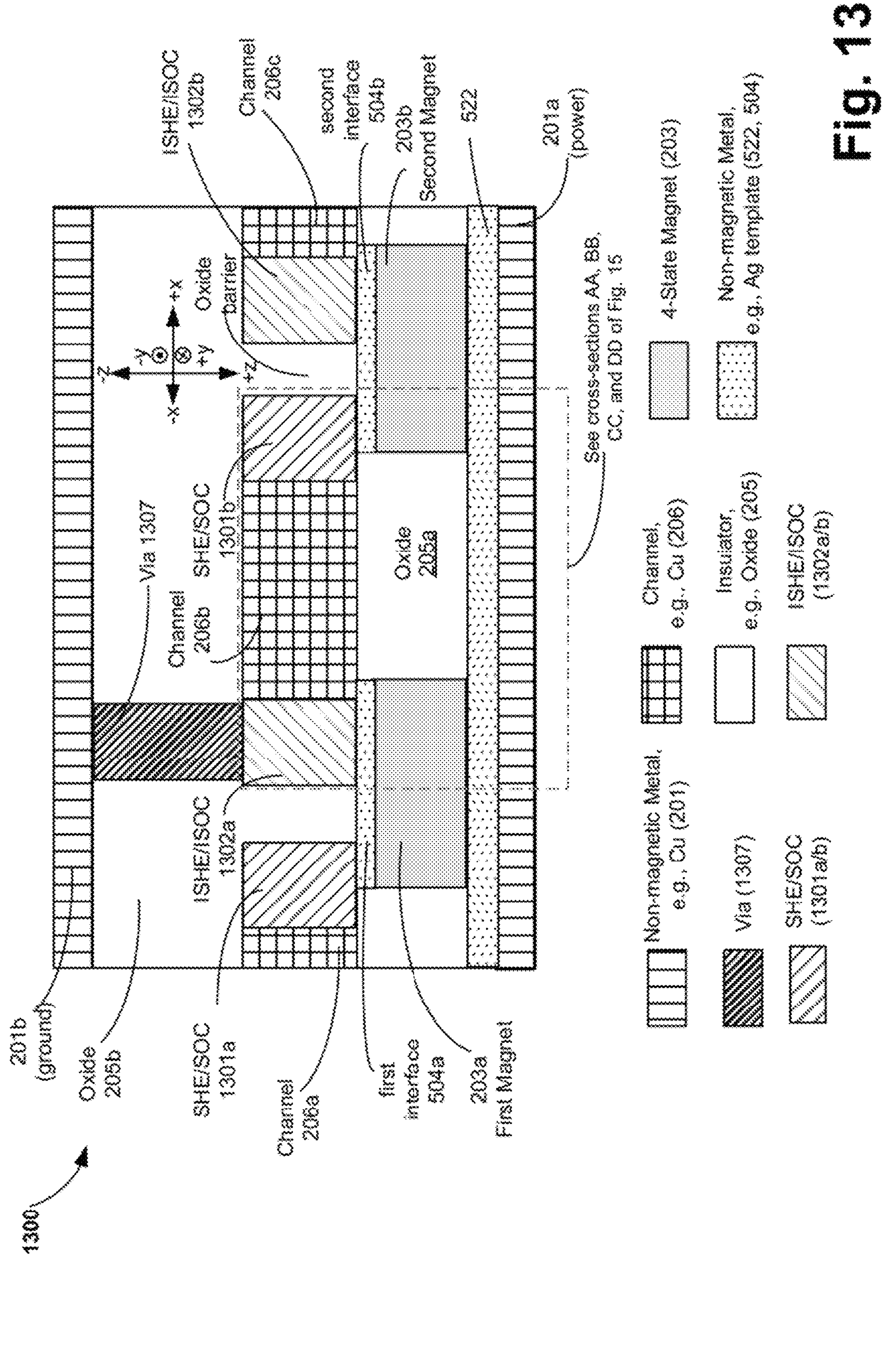
FIG. 13 illustrates a cross-section of a 4-state magnet based device with spin orbit effect transduction, in accordance with some embodiments of the disclosure.

FIG. 13 illustrates cross-section 1300 of a 4-state magnet based device (also referred to as SOCL) with spin orbit effect transduction, in accordance with some embodiments of the disclosure. It is pointed out that those elements of FIG. 13 having the same reference numbers (or names) as the elements of any other figure can operate or function in any manner similar to that described, but are not limited to such.

In some embodiments, cross-section 1300 of a SOCL (spin orbit coupling logic) device (also referred to as device 1300) comprises interface 522 of non-magnetic material (also referred to as the template), first 4-state magnet 203*a*, second 4-state magnet 203*b*, oxide 205*a* between first and second 4-state Magnets 203*a/b*, respectively, interfaces 504*a/b* over first and second 4-state magnets 203*a/b*, respectively, non-magnetic interconnect 206*a/b/c*, oxide 205*b* over non-magnetic interconnect 206*a/b/c*, Via 1307, and second metal layer 201*b* (e.g., ground layer), first layer 1301*a/b*, and second layers 1302*a/b*.

Here, interface layers 504*a* and 504*b* may be collectively referred to as interface layer 504. First and second 4-state magnets 203*a/b* are also referred to as first and second 4-state magnets. First 4-state magnet 203*a* is also referred to as the input 4-state magnet while second 4-state magnet 203*b* is also referred to as the output magnet. These labels are provided for purposes of describing the various embodiments, but do not change the structure of SOCL device 1300.

In some embodiments, first layers 1301*a/b* comprise layers of materials exhibiting spin orbit coupling (SOC) such as one of spin Hall effect (SHE). In some embodiments, second layers 1302*a/b* comprise layers of materials exhibiting inverse spin orbit coupling (ISOC) such as one of inverse spin Hall effect (ISHE) or inverse Rashba-Edelstein effect (IREE). In some embodiments, first layers 1301*a/b* and second layers 1302*a/b* comprises a stack of layers with materials exhibiting SHE and IREE (or ISHE) effects, respectively. In some embodiments, first layers 1301*a/b* and second layers 1302*a/b* comprise a metal layer, such as a layer of Copper (Cu), Silver (Ag), or Gold (Au), which is coupled to first 4-state magnet 203*a* via first interface layer 504*a*. In some embodiments, the metal layer is a non-alloy metal layer.

In some embodiments, interface layer 522 acts as the appropriate template for creating the 4-state ferromagnets 203*a/b*. In some embodiments, interface layer 522 also comprises layer(s) of a surface alloy, e.g. Bismuth (Bi) on Ag coupled to the metal layer. In some embodiments, the surface alloy is a templating metal layer to provide a template for forming the ferromagnet. In some embodiments, the metal of the metal layer which is directly coupled to first and second magnets 203*a/b* is a noble metal (e.g., Ag, Cu, or Au) doped with other elements from Group 4d and/or 5d of the Periodic Table.

In some embodiments, the surface alloy is one of: Bismuth-Silver (Bi—Ag), Antimony-Bismuth (Sb—Bi), Antimony-Silver (Sb—Ag), Lead-Nickel (Pb—Ni), Bismuth-Gold (Bi—Au), Lead-Silver (Pb—Ag), Lead-Gold (Pb—Au), Beta-Tantalum (β-Ta); Beta-Tungston (β-W); Platinum (Pt); or Bismuth Telluride ($Bi_2Te_3$). In some embodiments, one of the metals of the surface alloy is an alloy of heavy metal or of materials with high SOC strength, where the SOC strength is directly proportional to the fourth power of the atomic number of the metal.

Here, the crystals of Ag and Bi of first layer 201 have lattice mismatch (i.e., the distance between neighboring atoms of Ag and Bi is different). In some embodiments, the surface alloy is formed with surface corrugation resulting from the lattice mismatch, (i.e., the positions of Bi atoms are offset by varying distance from a plane parallel to a crystal plane of the underlying metal). In some embodiments, the surface alloy is a structure not symmetric relative to the mirror inversion defined by a crystal plane. This inversion asymmetry and/or material properties lead to spin-orbit coupling in electrons near the surface (also referred to as the Rashba effect).

In some embodiments, the input 4-state nanomagnets 203*a* are lattice matched to Ag (e.g., a material which is engineered to have a lattice constant close (e.g., within 3%) to that of Ag). In some embodiments, the direction of the spin polarization is determined by the magnetization direction of input 4-state magnet 203*a*.

In some embodiments, the material(s) used for forming metal layers 201*a/b*, Via 1307, and non-magnetic interconnect 206*a/b/c* is/are the same. For example, Copper (Cu) can be used for forming metal layers 201*a/b*, Via 1307, and non-magnetic interconnect 206*a/b/c*. In other embodiments, material(s) used for forming metal layers 201*a/b*, Via 1307, and non-magnetic interconnect 206*a/b/c* are different. For example, metal layer 201*a/b* may be formed of Cu while Via 1307 may be formed of Tungsten (W). Any suitable metal or combination of metals can be used for forming metal layers 201*a/b*, Via 1307, and non-magnetic interconnect 206*a/b/c*.

In some embodiments, engineered interfaces (e.g., 504*a/b* and 522) are formed between the magnets (i.e., first and second 4-state magnets 203*a* and 203*b*, respectively). In some embodiments, engineered interfaces 504*a/b* and 522 are formed of non-magnetic material(s) such that the interface layers and the magnets together have sufficiently matched atomistic crystalline layers. For example, the non-magnetic material has a crystal periodicity which is matched through rotation or by mixing of elements.

Here, sufficiently matched atomistic crystalline layers refer to matching of the lattice constant 'a' within a threshold level above which atoms exhibit dislocation which is harmful to the device (for instance, the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from first 4-state magnet 203*a* to first ISHE/ISOC layer 1302*a* increases. Poor matching (e.g., matching worse than 5%) implies dislocation of atoms that is harmful for the device.

In some embodiments, the non-magnetic material for templates 504*a/b* and 522 is Ag with a crystal lattice constant a=4.05 A which is matched to the material for the 4-state magnets. As such, the magnetic structure stack (e.g., stack of 504*a* and 203*a*) allows for interfacial matching of input 4-state magnet 203*a* with interface layer 504*a* and for interfacial matching of output 4-state magnet 203*b* with interface layer 504*b*. In some embodiments, the stack also allows for templating of the bottom surface of the input and output magnets 203*a/b*.

In some embodiments, interface layers 504*a/b* (e.g., Ag) provide electrical contact to magnets 203*a/b*, respectively. As such, a template is provided with the right crystal orientation to seed the formation of the magnetic material that forms input and output magnets 203*a/b*). In some embodiments, the directionality of SOC logic may be set by the geometric asymmetry in SOCL device 1300.

One technical effect of the engineered interface layer 504*a* (e.g., Ag) between input magnet 203*a* and layers of SOC 1301*a* and ISOC 1302*a* is that it provides for higher mechanical barrier to stop or inhibit the inter-diffusion of magnetic species with SOC 1301*a* and ISOC 1302*a*. The same is true for output magnet 203*b* and layers of SOC 1301*b* and ISOC 1302*b*. For instance, the engineered interface layer 504*b* provides for higher mechanical barrier to stop or inhibit the inter-diffusional of magnetic specifies with SOC 1301*b* and ISOC 1302*b*. In some embodiments, the engineered interface layer 504*a* maintains high spin injection at the interface between SOC layer 1301*a*, ISOC layer 1302*a* and input 4-state magnet 203*a*. In some embodiments, the engineered interface layer 504*b* maintains high spin injection at the interface between SOC layer 1301*b*, ISOC layer 1302*b* and output 4-state magnet 203*b*. As such, engineered interface layer(s) 504*a/b* improve the performance of spin device 1300, in accordance with some embodiments.

In some embodiments, a layer of oxide 205*b* is deposited over non-magnetic interconnect 206*a/b/c*, SOC layers 1301*a/b*, ISOC layers 1302*a/b*, and portions of interface layers 504*a/b*, and then a via hole is etched for Via 1307. In some embodiments, Via 1307 couples ISOC layer 1302*a* to ground layer 201*b* which is formed over Oxide layer 205*b*.

In some embodiments, the fabrication of first and second 4-state magnets 203*a/b* and the matching layer is via the use of an in situ processing flow. Here, in situ processing flow refers to a fabricating processing flow that does not break vacuum. As such, oxidation on interfaces 522 and 504*a/b* are avoided resulting in smooth surfaces at interfaces 522 and 504*a/b*. In some embodiments, the process of fabricating SOCL device 1300 allows for templating of 4-state magnets 203*a/b* for appropriate crystal structure.

In some embodiments, a drive current $I_{drive}$ (or charge current) is provided to channel 206*a* and depending on the voltage on the power interconnect 201*a*, SOCL device 1300 behaves as a mirror gate. In some embodiments, drive charge current $I_{drive}$ is converted into spin current $I_s$ by SHE/SOC layer 1301*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, when the spin current $I_s$ flows through the 2D (two dimensional) electron gas between Bi and Ag in ISHE/ISOC layer 1302*a* with high SOC, charge current $I_c$ is generated. In some embodiments, the interface surface alloy of $BiAg_2/PbAg_2$ of ISHE/ISOC layer 1302*a* comprises a high density 2D electron gas with high Rashba SOC. The spin orbit mechanism responsible for spin-to-charge conversion is described by Rashba effect in 2D electron gases. In some embodiments, 2D electron gases are formed between Bi and Ag, and when current flows through the 2D electron gases, it becomes a 2D spin gas because as charge flows, electrons get polarized.

The Hamiltonian energy $H_R$ of the SOC electrons in the 2D electron gas corresponding to the Rashba effect is expressed as:

$$H_R = \alpha_R(k \times \hat{z}) \cdot \grave{\sigma} \quad (3)$$

where $\alpha_R$ is the Rashba coefficient, is the operator of momentum of electrons, $\hat{z}$ is a unit vector perpendicular to the 2D electron gas, and $\grave{\sigma}$ is the operator of spin of electrons.

The spin polarized electrons with direction of polarization in-plane (in the xy-plane) experience an effective magnetic field dependent on the spin direction which is given as:

$$B(k) = \frac{\alpha_R}{\mu_B}(k \times \hat{Z}) \quad (4)$$

where $\mu_B$ is the Bohr magneton.

This results in the generation of a charge current in interconnect 206*b* proportional to the spin current $I_s$. The spin orbit interaction at the Ag/Bi interface (i.e., the Inverse Rashba-Edelstein Effect (IREE)) produces a charge current $I_c$ in the horizontal direction which is expressed as:

$$I_c = \frac{\lambda_{IREE} I_S}{w_m} \quad (5)$$

where $w_m$ is width of the input 4-state magnet 203*a*, and $\lambda_{IREE}$ is the TREE constant (with units of length) proportional to $\alpha_R$.

The IREE effect produces spin-to-charge current conversion around 0.1 with existing materials at 10 nm (nanometers) magnet width. For scaled nanomagnets (e.g., 5 nm width) and exploratory SHE materials such as $Bi_2Se_3$, the spin-to-charge conversion efficiency can be between 1 and 2.5, in accordance with some embodiments. The net conversion of the drive charge current $I_d$ to magnetization dependent charge current is:

$$I_c = \pm\frac{\lambda_{IREE} P I_d}{w_m} \quad (6)$$

where P is the spin polarization.

The charge current $I_c$ then propagates through the non-magnetic interconnect 206*a* coupled to ISHE/ISOC layer 1302*a*. In some embodiments, charge current $I_c$ conducts through non-magnetic interconnect 206*a* without loss to another transducer (e.g., SHE/SOC layer 1301*b*). In some embodiments, the SHE from SHE/SOC layer 1301*b* generates a torque on output 4-state magnet 203*b* which is much more efficient per unit charge than spin-transfer torque (STT). Positive charge currents (e.g., currents flowing in the +y direction) produce a spin injection current with transport direction along the +z direction and spins pointing to the +x direction in SHE/SOC layer 1301*b*. The injected spin current in-turn produces spin torque to align the free output 4-state magnet 203 (coupled to the SHE material) in the +x or −x directions.

In some embodiments, SHE/SOC layer 1301*b* is formed of materials that exhibit direct SHE. In some embodiments, SHE/SOC layer 1301*b* is formed of materials that exhibit SOC. In some embodiments, SHE/SOC layer 1301*b* is formed of the same material as ISHE/ISOC layer 1302*a*. In some embodiments, SHE/SOC layer 1301*b* is formed of a different material than the material for forming ISHE/ISOC layer 1302*a*. In some embodiments, SHE/SOC layer 1301*b* comprises of one or more of: β-Ta, β-W, W, Pt, Cu doped with Iridium, Cu doped with Bismuth, or Cu doped with an element(s) of Group 3d, 4d, 5d, 4f, or 5f of the Periodic Table.

In some embodiments, SOCL device 1300 is operable to function as a mirror gate. In some embodiments, the charge current $I_c$ in interconnect 206*b* is converted by SHE/SOC layer 1301*b* by SOC or SHE to spin current in second 4-state magnet 203*b* such that the effective magnetic field on second 4-state magnet 203*b* aligns its magnetization to be parallel to the magnetization of first 4-state magnet 203*a*. As such, the direction of $I_c$ is determined by the magnetization of input 4-state magnet 203*a*.

The transient spin dynamics and transport of SOCL device 1300 can be simulated using vector spin circuit models coupled with nanomagnets dynamics. As such, the operation of SOCL device 1300 can be verified using multi-physics simulation which treats the nanomagnets as single magnetic moments and uses spin circuit theory to calculate the scalar voltage and vector spin voltages.

The dynamics of nanomagnets can be described by Landau-Lifshitz-Gilbert (LLG) equations:

$$\frac{\partial m_1}{\partial t} = -\gamma\mu_0[m_1 \times \overline{H}_{eff}] + \alpha\left[m_1 \times \frac{\partial m_1}{\partial t}\right] - \frac{\overline{I}_{s1}}{eN_s}$$

$$\frac{\partial m_2}{\partial t} = -\gamma\mu[m_2 \times \overline{H}_{eff}] + \alpha\left[m_2 \times \frac{\partial m_2}{\partial t}\right] - \frac{\overline{I}_{s2}}{eN_s}$$

Here, $\overline{I}_{s1}$ and $\overline{I}_{s2}$ are the projections perpendicular to magnetizations of the spin polarized currents entering the two free nanomagnets—First and Second 4-state Magnet layers 203*a* and 203*b*, respectively. These projections are derived from the spin-circuit analysis. The effective magnetic field $\overline{H}_{eff}$ originating from the shape and material anisotropy, and the Gilbert damping constant 'α' are the properties of the magnets. The spin currents are obtained from a vector transport model for the magnetic stack. Here, $m_1$ and $m_2$ are magnetization vectors of the first and second 4-state magnet layers 203*a* and 203*b*, respectively, $N_s$ is the number of spins in each of first and second magnet layers 203*a* and 203*b*, respectively. In some embodiments, the spin equivalent circuit comprises a tensor spin conduction matrix governed by the present conduction of the magnet. In one embodiment, a self-consistent stochastic solver is used to account for thermal noise of the magnets.

In some embodiments, the spin current from second 4-state magnet 203*b* is converted into charge current by ISHE/ISOC layer 1302*b* just as spin current from first 4-state magnet 203*a* is converted into charge current by ISHE/ISOC layer 1302*a*. The charge current from ISHE/ISOC layer 1302*b* is provided to interconnect (or channel) 206*c* and propagated to another device for further processing, in accordance with some embodiments. As such, SOCL device 1300 is operable to couple with other SOCL devices (not shown) through conductors 206*a* and 206*c*.

One reason for coupling ISOC layer 1302*a* and SOC layer 1301*a* to input 4-state magnet 203*a* such that ISOC layer 1302*a* and SOC layer 1301*a* are separated from one another is to provide one-way flow of current/charge, in accordance with some embodiments. One-way flow of current/charge ensures that there is no current flowing in a backward direction so as switch the previous magnets (not shown) in the current path. In some embodiments, 4-state magnets 203*a/b* have higher resistance than the resistance of non-magnetic channels (e.g., hundred times more resistance than channel resistance), and that resistance difference provides for one-way current/charge path.

Figure 14:
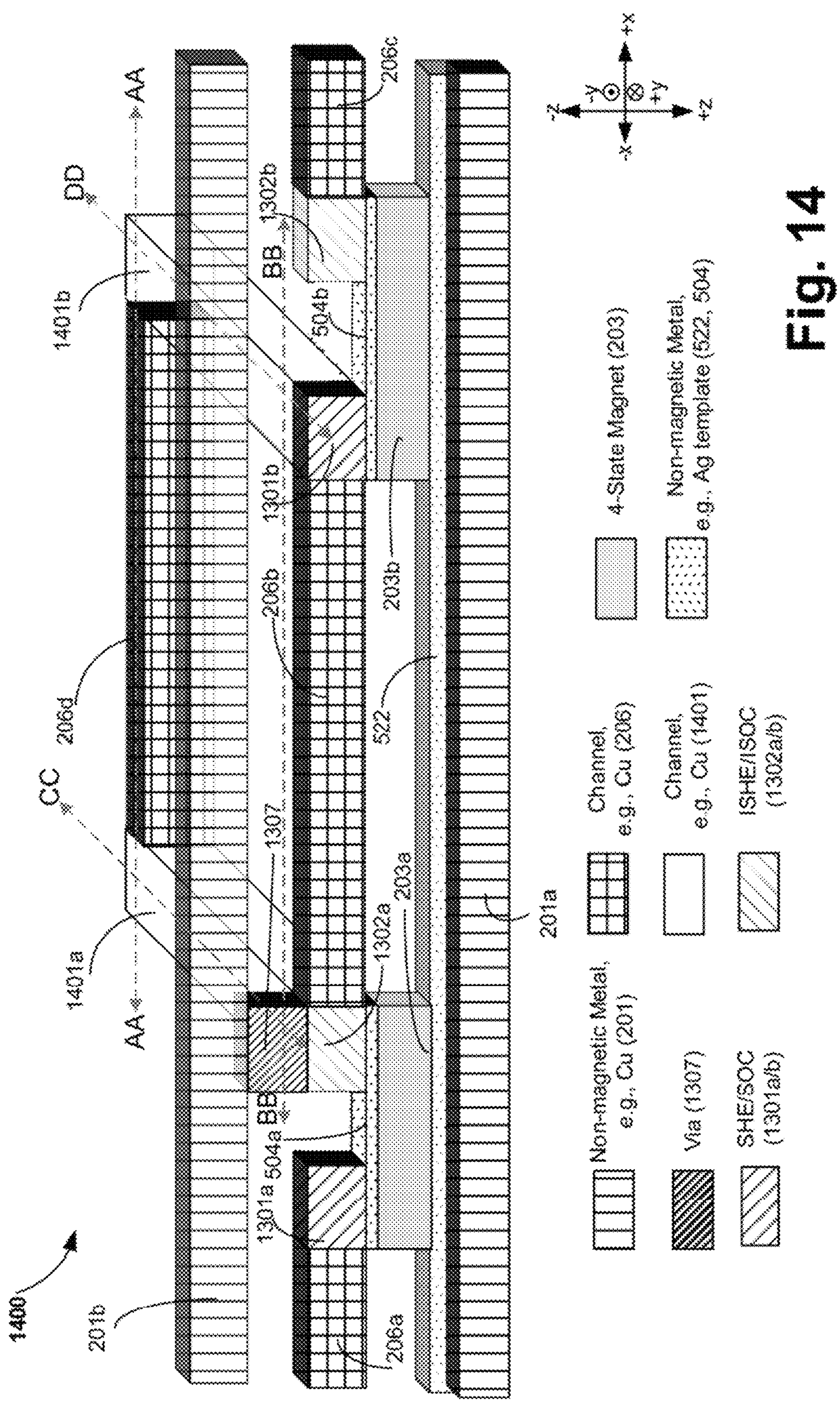
FIG. 14 illustrates a three dimensional (3D) view of the 4-state magnet based device with spin orbit effect transduction, in accordance with some embodiments of the disclosure.

FIG. 14 illustrates a three dimensional (3D) view 1400 of 4-state magnet SOCL device 1200, in accordance with some embodiments of the disclosure. It is pointed out that those elements of FIG. 14 having the same reference numbers (or names) as the elements of any other figure can operate or function in any manner similar to that described, but are not limited to such.

Figure 15:
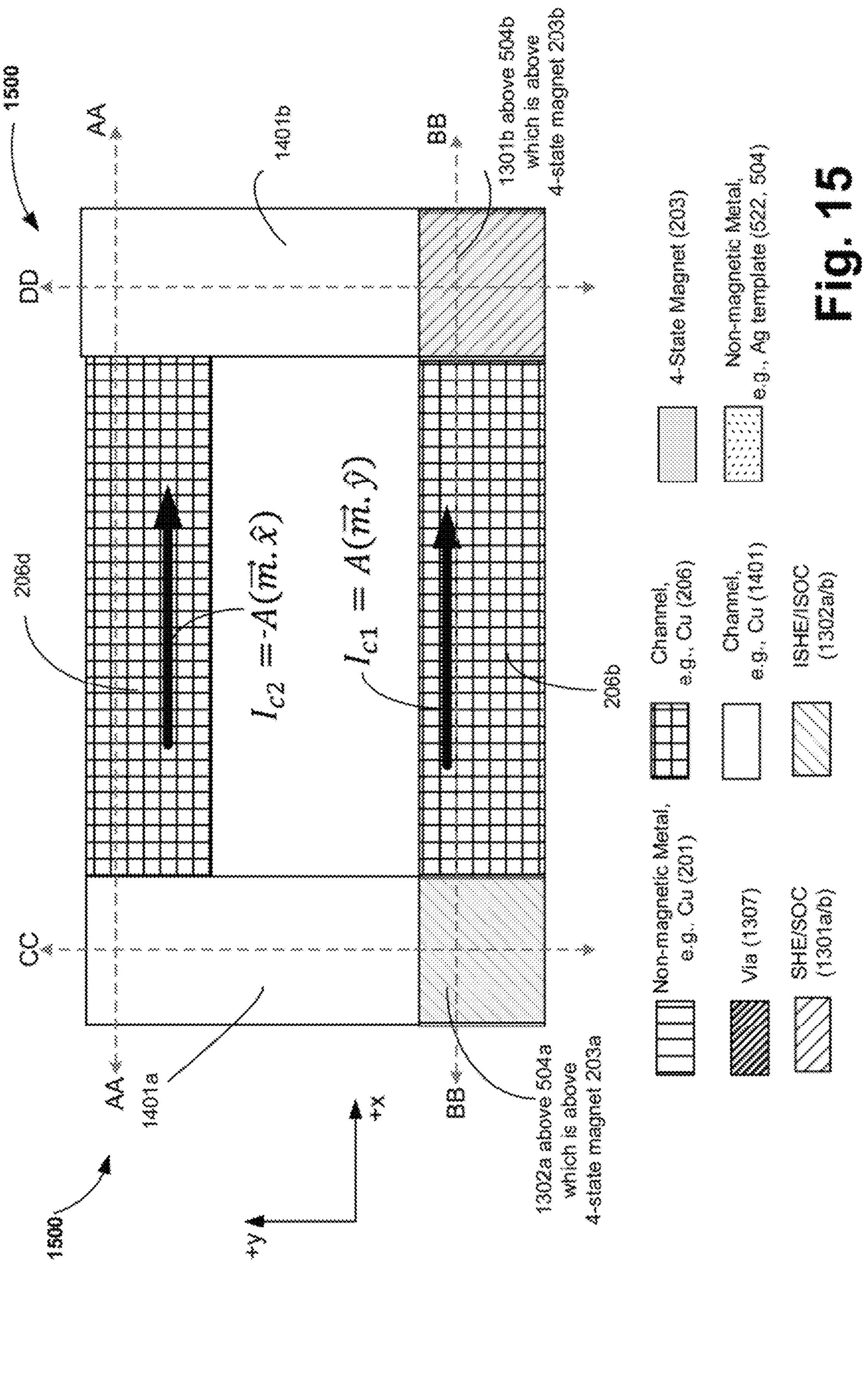
FIG. 15 illustrates a top view of a portion of the 4-state magnet based device with spin orbit effect transduction of FIG. 14, in accordance with some embodiments of the disclosure.

Compared to FIG. 2, which is an all spin logic (ASL) device using 4-state magnets, when 4-state magnets are used to form SOCL device 1400 that uses charge current as the main source of conduction from one 4-state magnet to another 4-state magnet, additional charge conductors 1401*a*, 1401*b*, and 206*d* are used. Spin current is vector based while charge current is not. As such, interconnect 206*b/d* are used for transportation of 'x' and 'y' charge currents. Cross-sections AA, BB, CC, and DD are shown in FIG. 15. Referring back to FIG. 14, in some embodiments, charge conductors 1401*a*, 1401*b*, and 206*d* are made of the same material as interconnect 206*b*. In some embodiments, interconnect 1401*a* and 1401*b* are parallel to one another, while interconnect 206*b* and interconnect 206*d* are parallel to each other. In some embodiments, interconnect 1401*a* and 1401*b* are orthogonal to interconnect 206*b* and interconnect 206*d*. In some embodiments, interconnect 1401*a* is coupled to ISHE/ISOC layer 1302*a* while interconnect 1401*b* is coupled to SHE/SOC 1301*b*. In some embodiments, interconnects 1401*a* and 1401*b* directly connect to interconnect 206*b*.

FIG. 15 illustrates top view 1500 of a portion of the 4-state magnet based device with spin orbit effect transduction of FIG. 14, in accordance with some embodiments of the disclosure. It is pointed out that those elements of FIG. 15 having the same reference numbers (or names) as the elements of any other figure can operate or function in any manner similar to that described, but are not limited to such.

Here, top view 1500 shows the conduction paths for the 'x' and 'y' charge currents which are proportional to the spin currents along the 'x' direction and the 'y' direction, respectively. These currents originate from ISHE/ISOC layer 1302*a* and are injected into interconnects 206*b* and 1401*a*. The 'x' component of the current $I_{c2}=-A(\vec{m}\cdot\hat{x})$ passes through interconnect 1401*a* and 206*d*, while the 'y' component of the current $I_{c1}=A(\vec{m}\cdot\hat{y})$ passes through interconnect 206*b*. The currents are effectively added in SHE/SOC layer 1301*b*, in accordance with some embodiments. In some embodiments, depending on the supply voltage (not shown) on metal layer 201*a* and the magnetization direction (not shown) of the 4-state input magnet 203*a*, the directions and magnitudes of currents $I_{c1}$ and $I_{c2}$ are determined. FIGS. 16-19 illustrate magnetizations and current directions when a 4-state Spin Orbit Coupling Logic (SOCL) device is configured as a mirror gate.

Table 4 below shows the magnetization of the input and output magnets for SOCL device when configured as a mirror x gate. In Table 4, the power supply to metal layer 201*a* is a negative supply −Vdd.

TABLE 4

| Input Magnet Orientation (i.e., 203a) | Output Magnet Orientation (i.e., 203b) | Function |
|---|---|---|
| +x (0) | −x (3) | mirror x |
| −x (3) | +x (0) | mirror x |
| +y (1) | +y (1) | mirror x |
| −y (2) | −y (2) | mirror x |

Figure 16A:
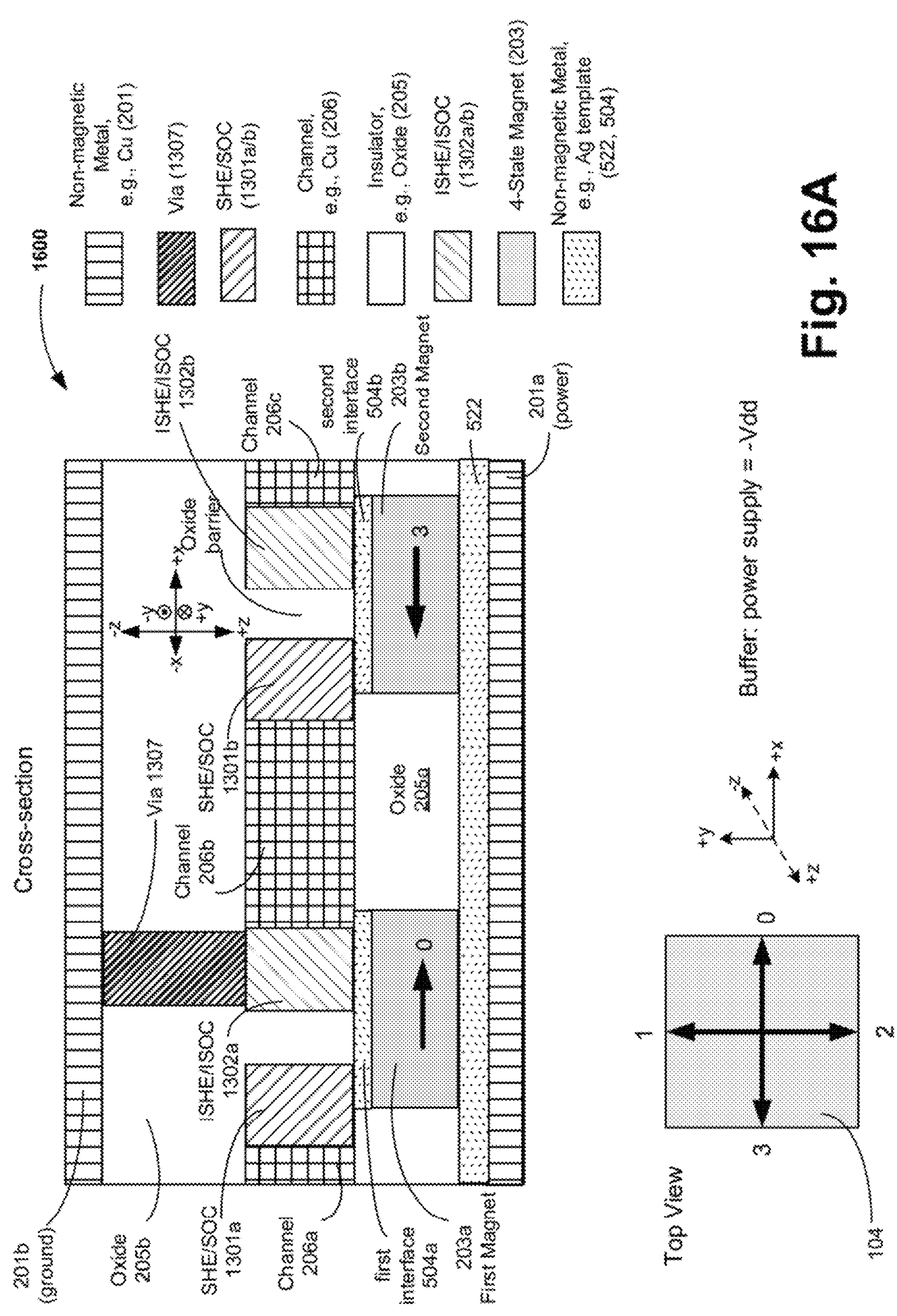
FIG. 16A illustrates a cross-section of a 4-state Spin Orbit Coupling Logic (SOCL) device configured as a buffer with the input and output 4-state magnets aligned in the +x direction, in accordance with some embodiments.

FIG. 16A illustrates cross-section 1600 along dotted line BB of 4-state SOCL device 1400 of FIG. 14 configured as a mirror x with the input and output 4-state magnets aligned in the +x direction, in accordance with some embodiments. It is pointed out that those elements of FIG. 16A having the same reference numbers (or names) as the elements of any other figure can operate or function in any manner similar to that described, but are not limited to such.

When a negative power supply is applied to 201*a* (e.g., supply is set to −Vdd), the 4-state SOCL device is configured as a mirror x, in accordance with some embodiments. In this case, the magnetization of First Magnet 203*a* is set to '0' direction (e.g., +x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*b* by SOC or SHE to spin current in second 4-state magnet 203*b* such that the effective magnetic field on second 4-state magnet 203*b* aligns its magnetization to be parallel to the magnetization of first 4-state magnet 203*a*. In this case, the magnetization of second 4-state magnet 203*b* is '3' (i.e., opposite to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 16B:
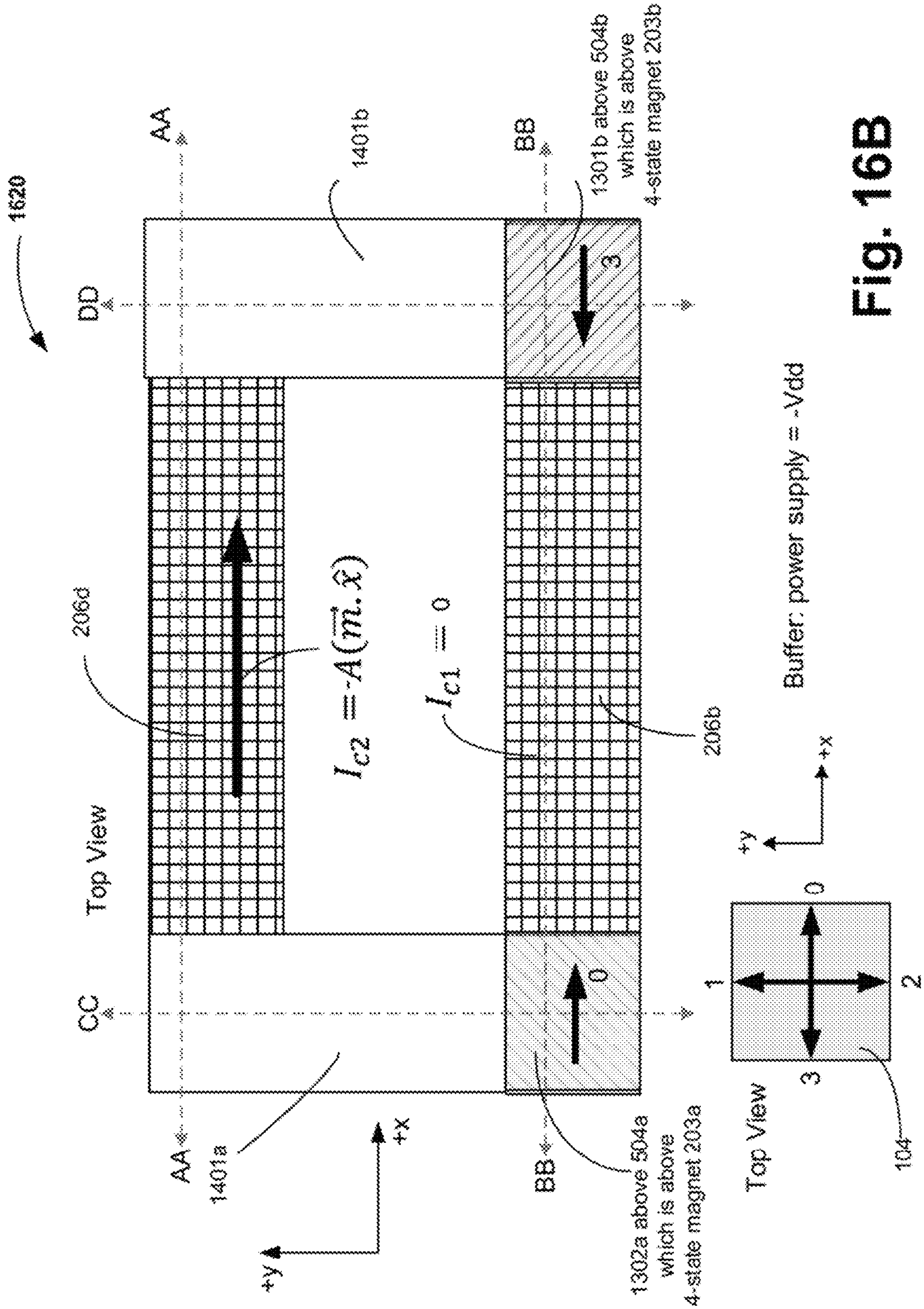
FIG. 16B illustrates a top view of the SOCL device of FIG. 16A, according to some embodiments of the disclosure.

FIG. 16B illustrates top view 1620 of the SOCL device of FIG. 16A (same as device 1400 of FIG. 14), according to some embodiments of the disclosure. It is pointed out that those elements of FIG. 16B having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1302*a*, and where the second ends of interconnects 206*b* and 1401*b* are coupled to SHE/SOC layer 1301*b*.

When a negative power supply (−Vdd) is applied to power rail 201*a*, and the magnetization of the 4-state input magnet 203*a* is aligned in the '0' direction, then no current flows through interconnect 206*b* (i.e., the 'y' current component is zero, $I_{c2}=0$) while the 'x' current component flows through interconnect 1401*a* though 206*d* and 1401*b* to SHE/SOC layer 1301*b*, where the 'x' current component in interconnect 206*d* is $I_{c2}=-A(\vec{m}\cdot\hat{x})$. This current component $I_{c2}$ is converted into spin current by SHE/SOC layer 1301*b*, and this spin current causes the magnetization of 4-state second magnet 203*b* to be aligned in the '3' direction.

Figure 17A:
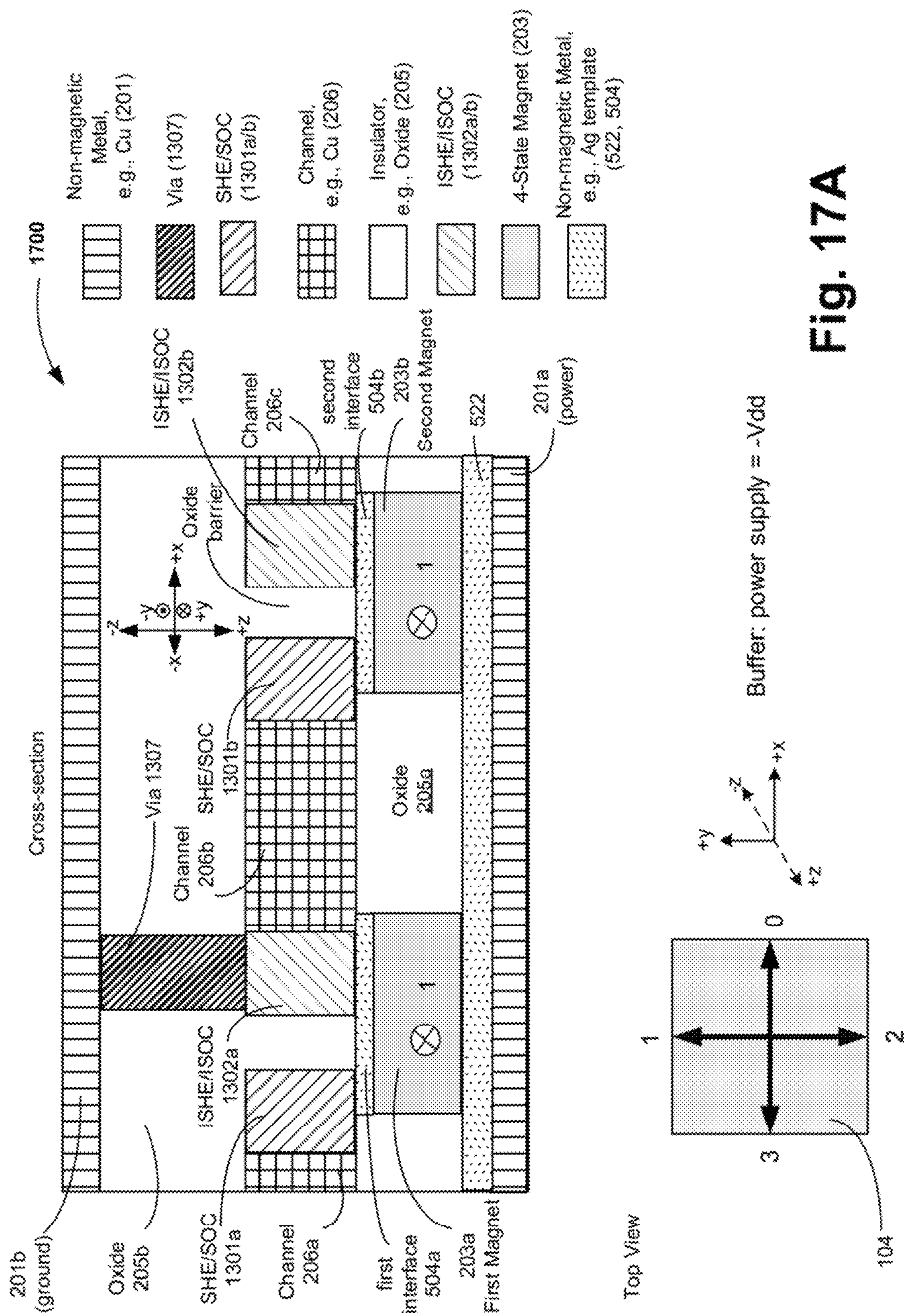
FIG. 17A illustrates a cross-section of a 4-state SOCL device configured as a buffer with the input and output 4-state magnets aligned in the +y direction, in accordance with some embodiments.

FIG. 17A illustrates cross-section 1700 along dotted line BB of 4-state SOCL device 1400 of FIG. 14 configured as a mirror x with the input and output 4-state magnets aligned in the +y direction, in accordance with some embodiments. It is pointed out that those elements of FIG. 17A having the same reference numbers (or names) as the elements of any other figure can operate or function in any manner similar to that described, but are not limited to such.

When negative power supply is applied to 201*a* (e.g., supply is set to −Vdd), the 4-state SOCL device 1400 is configured as a mirror x, in accordance with some embodiments. In this case, the magnetization of First Magnet 203*a* is set to '1' direction (e.g., +y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*b* by SOC or SHE to spin current in second 4-state magnet 203*b* such that the effective magnetic field on second 4-state magnet 203*b* aligns its magnetization to be parallel to the magnetization of first 4-state magnet 203*a*.

In this case, the magnetization of second 4-state magnet 203*b* is '1' (i.e., the same as the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 17B:
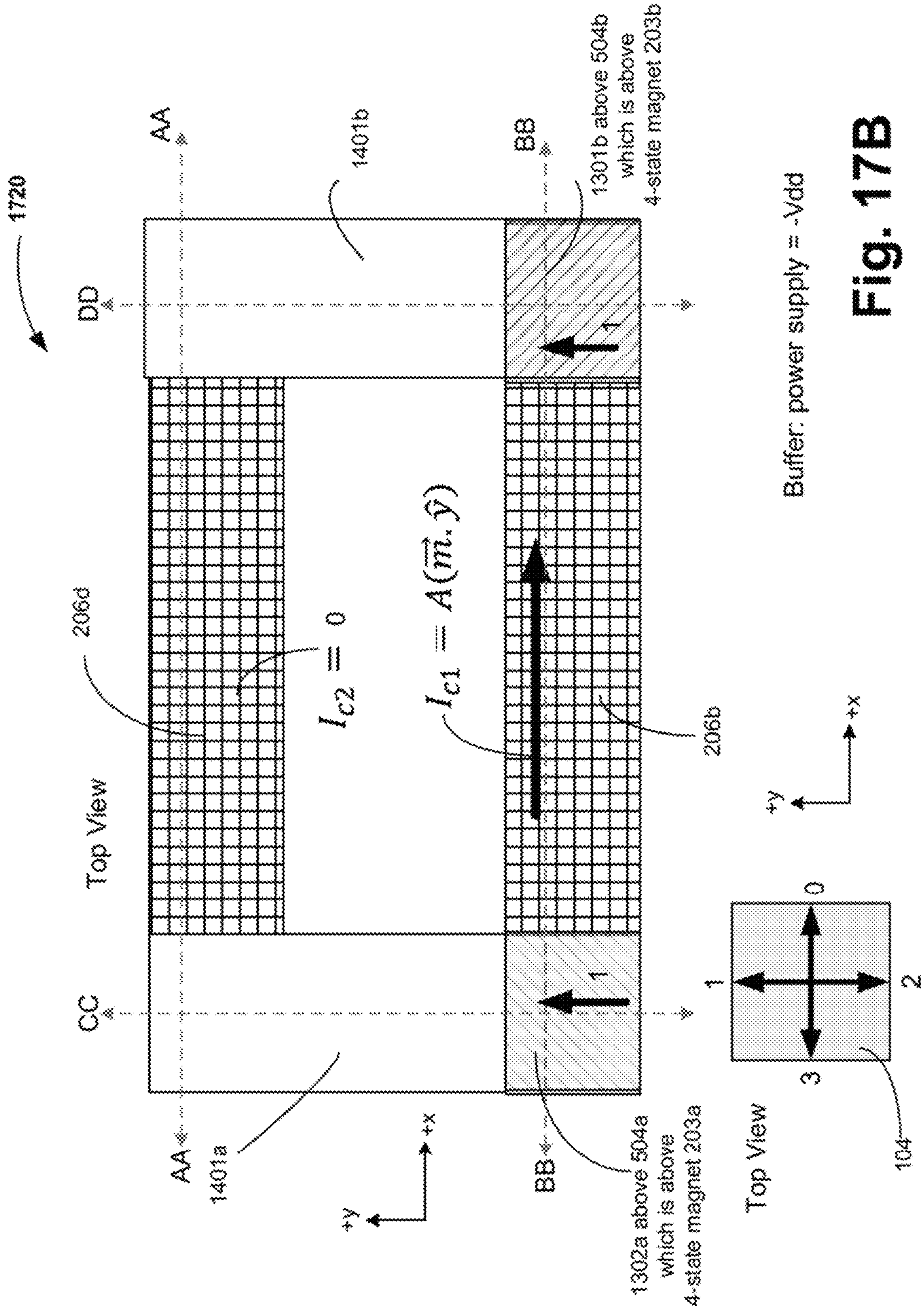
FIG. 17B illustrates a top view of the SOCL device of FIG. 17A, according to some embodiments of the disclosure.

FIG. 17B illustrates top view 1720 of the SOCL device of FIG. 17A, according to some embodiments of the disclosure. It is pointed out that those elements of FIG. 17B having the same reference numbers (or names) as the elements of any other figure can operate or function in any manner similar to that described, but are not limited to such. As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1302*a*, and where the second ends of interconnects 206*b* and 1401*b* are coupled to SHE/SOC layer 1301*b*.

When a negative power supply (−Vdd) is applied to power rail 201*a*, and the magnetization of the 4-state input magnet 203*a* is aligned in the '1' direction, then no current flows through interconnect 206*d* (i.e., the 'x' current component is zero, $I_{c2}=0$) while the 'y' current component flows through interconnect 206*b* to SHE/SOC layer 1301*b*, where the 'y' current component in interconnect 206*b* is $I_{c1}=A(\vec{m}\cdot\hat{y})$. This current component $I_{c1}$ is converted into spin current by SHE/SOC layer 1301*b*, and the spin current causes the magnetization of 4-state second magnet 203*b* to be aligned in the '1' direction.

Figure 18A:
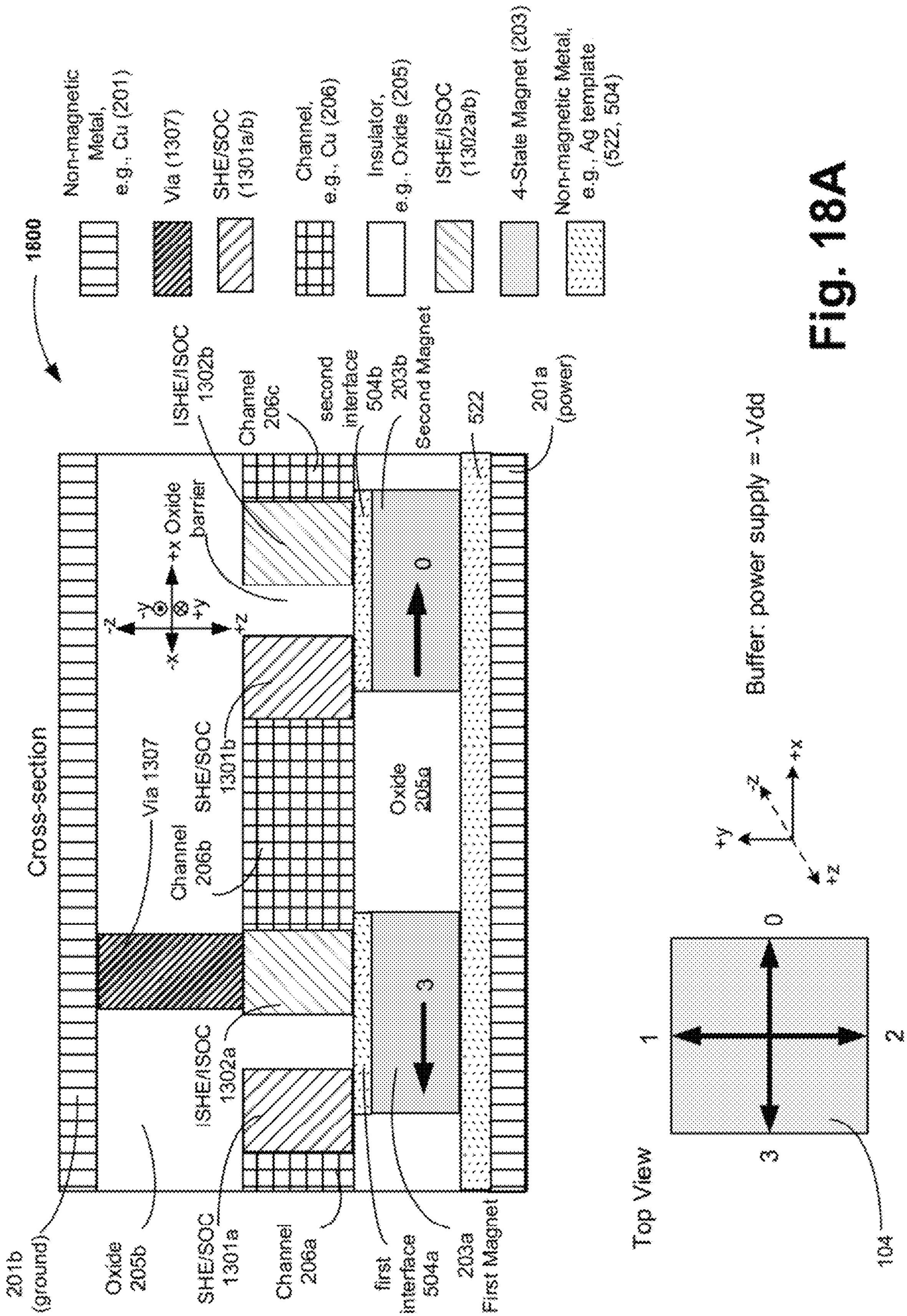
FIG. 18A illustrates a cross-section of a 4-state SOCL device configured as a buffer with the input and output 4-state magnets aligned in the −x direction, in accordance with some embodiments.

FIG. 18A illustrates cross-section 1800 along dotted line BB of 4-state SOCL device 1400 of FIG. 14 configured as a mirror x with the input and output 4-state magnets aligned in the −x direction, in accordance with some embodiments. It is pointed out that those elements of FIG. 18A having the same reference numbers (or names) as the elements of any other figure can operate or function in any manner similar to that described, but are not limited to such.

When a negative power supply is applied to 201*a* (e.g., supply is set to −Vdd), the 4-state SOCL device 1400 is configured as a mirror x, in accordance with some embodiments. In this case, the magnetization of First Magnet 203*a* is set to '3' direction (e.g., −x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*b* by SOC or SHE to spin current in second 4-state magnet 203*b* such that the effective magnetic field on second 4-state magnet 203*b* aligns its magnetization to be parallel to the magnetization of first 4-state magnet 203*a*.

In this case, the magnetization of second 4-state magnet 203*b* is '0' (i.e., opposite to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 18B:
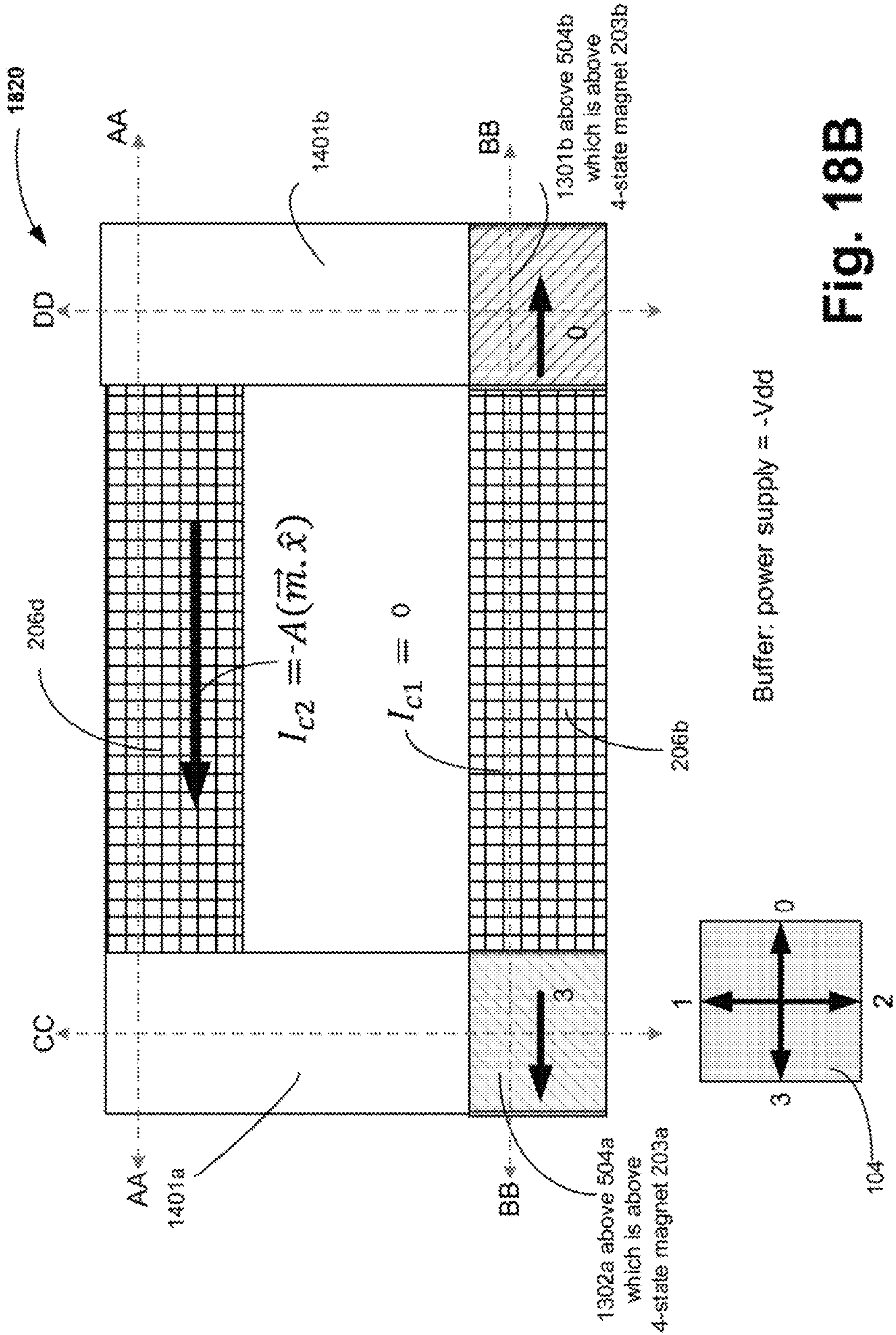
FIG. 18B illustrates a top view of the SOCL device of FIG. 18A, according to some embodiments of the disclosure.

FIG. 18B illustrates top view 1820 of the SOCL device of FIG. 18A, according to some embodiments of the disclosure. It is pointed out that those elements of FIG. 18B having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1302*a*, and where the second ends of interconnects 206*b* and 1401*b* are coupled to SHE/SOC layer 1301*b*.

When a negative power supply (−Vdd) is applied to power rail 201*a*, and the magnetization of the 4-state input magnet 203*a* is aligned in direction '3', then no current flows through interconnect 206*b* (i.e., the 'y' current component is zero, $I_{c2}=0$) while the 'x' current component flows through interconnect 1401*a* though 206*d* and 1401*b* to SHE/SOC layer 1301*b*, where the 'x' current component in interconnect 206*d* is $I_{c1}=-A(\vec{m}\cdot\hat{x})$. Note, the direction of $I_{c1}$ is opposite of the direction of $I_{c1}$ in FIG. 16B because the magnetizations of the 4-state magnets are opposite from those discussed in FIG. 16B. The current component $I_{c1}$ is converted into spin current by SHE/SOC layer 1301*b*, and this spin current causes the magnetization of 4-state second magnet 203*b* to be aligned in the '0' direction.

Figure 19A:
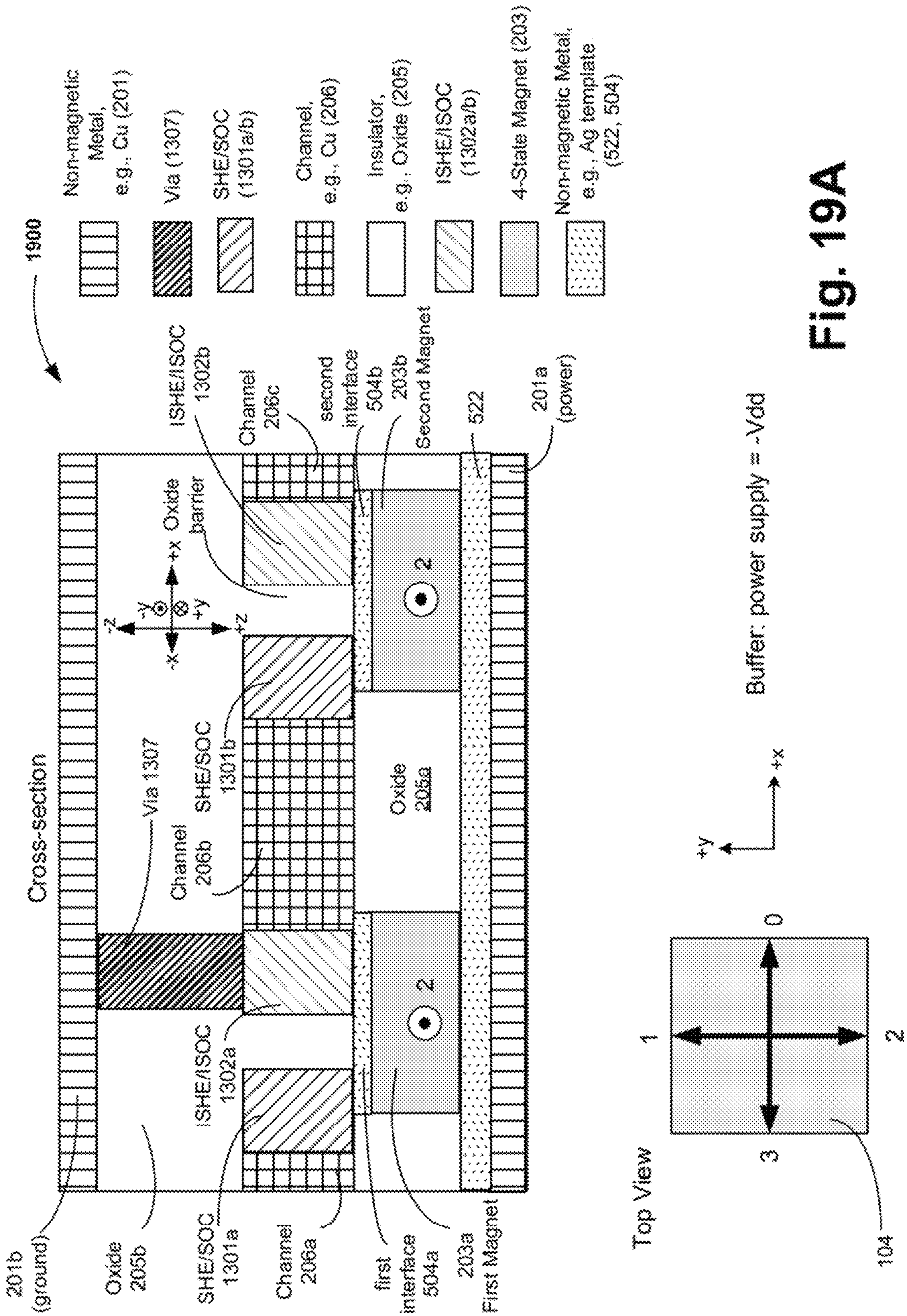
FIG. 19A illustrates a cross-section of a 4-state SOCL device configured as a buffer with the input and output 4-state magnets aligned in the −y direction, in accordance with some embodiments.

FIG. 19A illustrates cross-section 1900 along dotted line BB of 4-state SOCL device 1400 of FIG. 14 configured as a mirror x with the input and output 4-state magnets aligned in the −y direction, in accordance with some embodiments. It is pointed out that those elements of FIG. 19A having the same reference numbers (or names) as the elements of any other figure can operate or function in any manner similar to that described, but are not limited to such.

When negative power supply is applied to 201*a* (e.g., supply is set to −Vdd), the 4-state SOCL device is configured as a mirror x, in accordance with some embodiments. In this case, the magnetization of First Magnet 203*a* is set to direction '2' (e.g., −y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*b* by SOC or SHE to spin current in second 4-state magnet 203*b* such that the effective magnetic field on second 4-state magnet 203*b* aligns its magnetization to be parallel to the magnetization of first 4-state magnet 203*a*.

In this case, the magnetization of second 4-state magnet 203*b* is '2' (i.e., the same as the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 19B:
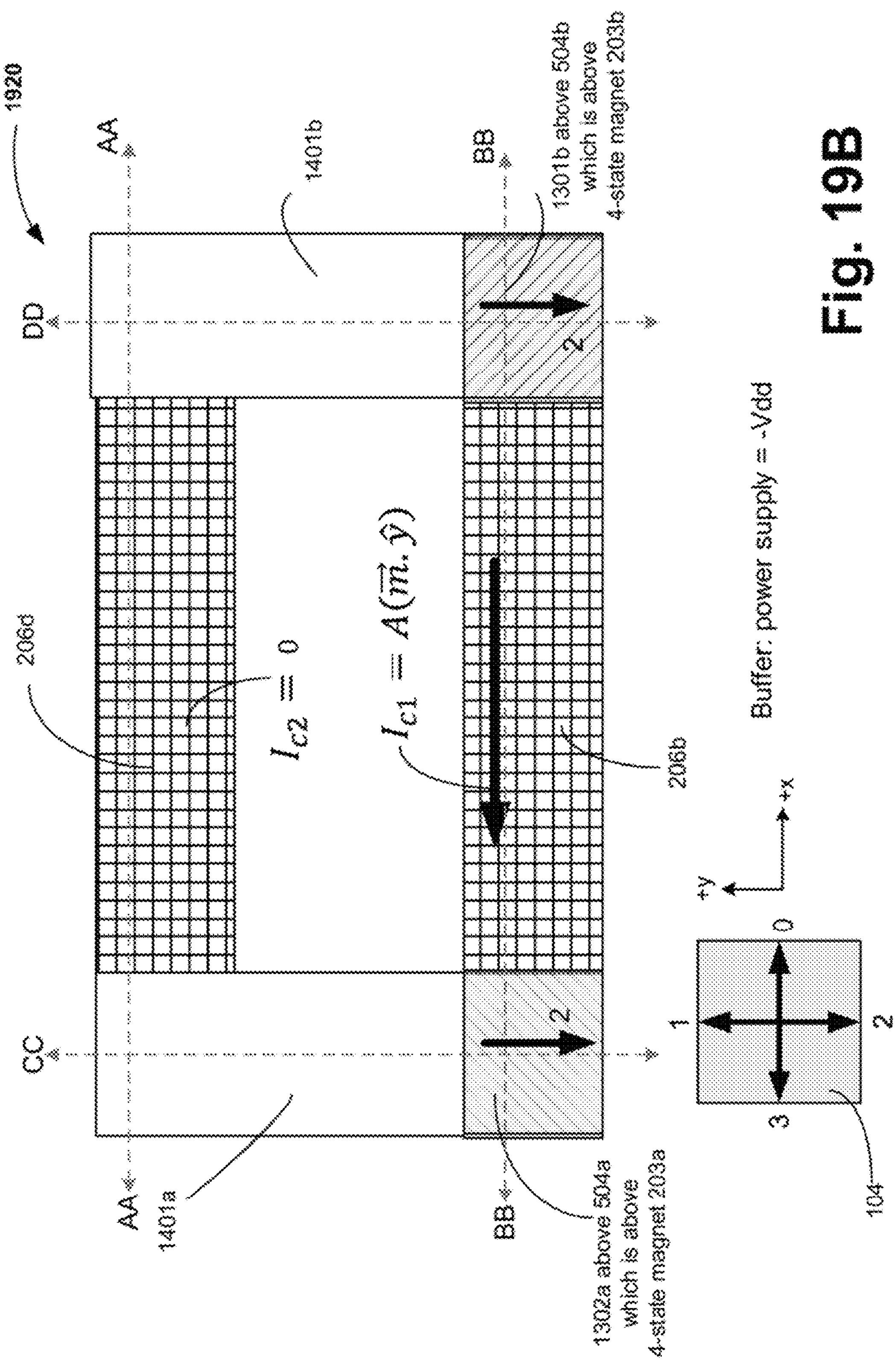
FIG. 19B illustrates a top view of the SOCL device of FIG. 19A, according to some embodiments of the disclosure.

FIG. 19B illustrates top view 1920 of the SOCL device of FIG. 19A, according to some embodiments of the disclosure. It is pointed out that those elements of FIG. 19B having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1301*a*, and where the second ends of interconnects 206*b* and 1401*b* are coupled to SHE/SOC layer 1302*b*.

When a negative power supply (−Vdd) is applied to power rail 201*a*, and the magnetization of the 4-state input magnet 203*a* is aligned in the '2' direction, then no current flows through interconnect 206*b* (i.e., the 'x' current component is zero, $I_{c2}=0$) while the 'y' current component flows through interconnect 206*d* to SHE/SOC layer 1301*b*, where the 'y' current component in interconnect 206*b* is $I_{c1}=A(\vec{m}\cdot\hat{y})$. Note, the direction of $I_{c1}$ is opposite of the direction of $I_{c1}$ in FIG. 17B because the magnetizations of the 4-state magnets are opposite from those discussed in FIG. 17B. This current component $I_{c1}$ is converted into spin current by SHE/SOC layer 1301*b*, and the spin current causes the magnetization of 4-state second magnet 203*b* to be aligned in the '2' direction.

FIGS. 20-23A-B illustrate magnetizations and current directions when 4-state SOCL device 1400 of FIG. 14 is configured as a mirror y. Table 5 below shows the magnetization of the input and output magnets for SOCL device when configured as a mirror y.

In Table 5, the power supply to metal layer 201*a* is a positive supply +Vdd. Note that the same logical functionality can be achieved by rotating the device by 90 degrees and setting a negative supply −Vdd.

TABLE 5

| Input Magnet Orientation (i.e., 203a) | Output Magnet Orientation (i.e., 203b) | Function |
|---|---|---|
| +x (0) | +x (0) | mirror y |
| −x (3) | −x (3) | mirror y |
| +y (1) | −y (2) | mirror y |
| −y (2) | +y (1) | mirror y |

Figure 20A:
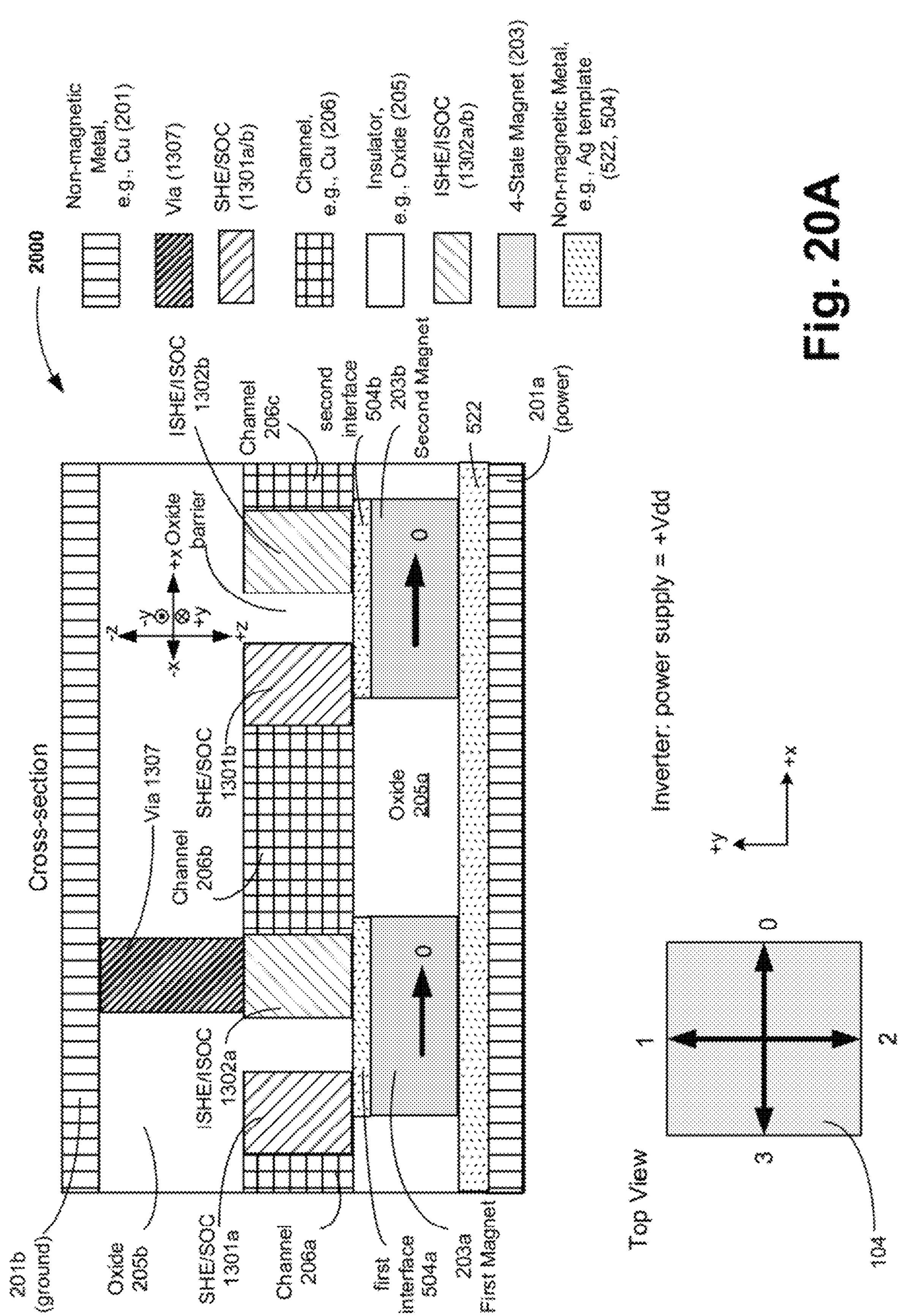
FIG. 20A illustrates a cross-section of a 4-state SOCL device configured as an inverter with the input and output 4-state magnets aligned in the +x and −x directions, respectively, in accordance with some embodiments.

FIG. 20A illustrates cross-section 2000 along dotted line BB of 4-state SOCL device 1400 of FIG. 14 configured as a mirror y with the input and output 4-state magnets aligned in the +x and −x directions, respectively, in accordance with some embodiments. It is pointed out that those elements of FIG. 20A having the same reference numbers (or names) as the elements of any other figure can operate or function in any manner similar to that described, but are not limited to such.

When a positive power supply is applied to 201*a* (e.g., supply is set to +Vdd), 4-state SOCL device 1400 is configured as a mirror y, in accordance with some embodiments. In this case, the magnetization of First Magnet 203*a* is set to '0' direction (e.g., +x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*b* by SOC or SHE to spin current in second 4-state magnet 203*b* such that the effective magnetic field on second 4-state magnet 203*b* aligns its magnetization to be parallel, but opposite, to the magnetization of first 4-state magnet 203*a*.

In this case, the magnetization of second 4-state magnet 203*b* is '0' (i.e., the same as the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 20B:
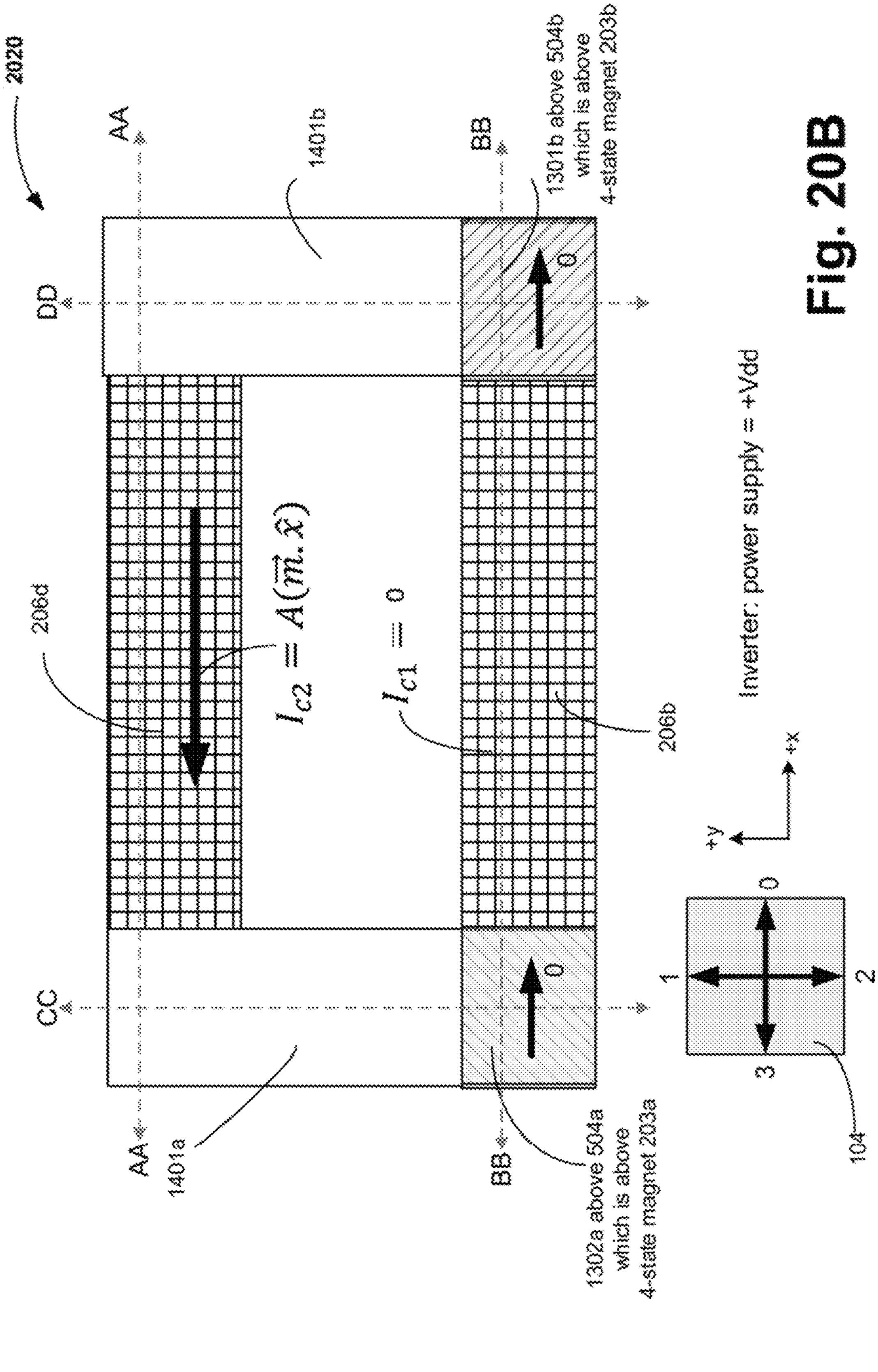
FIG. 20B illustrates a top view of the SOCL device of FIG. 20A, according to some embodiments of the disclosure.

FIG. 20B illustrates top view 2020 of the SOCL device of FIG. 20A, according to some embodiments of the disclosure. It is pointed out that those elements of FIG. 20A having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1301*a*, and where the second ends of interconnects 206*b* and 1401*b* are coupled to SHE/SOC layer 1301*b*. When a positive power supply (+Vdd) is applied to power rail 201*a*, and the magnetization of the 4-state input magnet 203*a* is aligned in the '0' direction, then no current flows through interconnect 206*b* (i.e., the 'y' current component is zero, $I_{c1}=0$) while the 'x' current component flows through interconnect 1401*a* though 206*d* and 1401*b* to SHE/SOC layer 1301*b*, where the 'x' current component in interconnect 206*d* is $I_{c2}=A(\vec{m}\cdot\hat{x})$. Note, the direction of $I_{c2}$ is opposite to the direction of $I_{c2}$ of FIG. 16B in which a negative supply was applied to interconnect 201*a*. The current component $I_{c2}$ is converted into spin current by SHE/SOC layer 1301*b*, and this spin current causes the magnetization of 4-state second magnet 203*b* to be aligned in the '0' direction (i.e., +x direction).

Figure 21A:
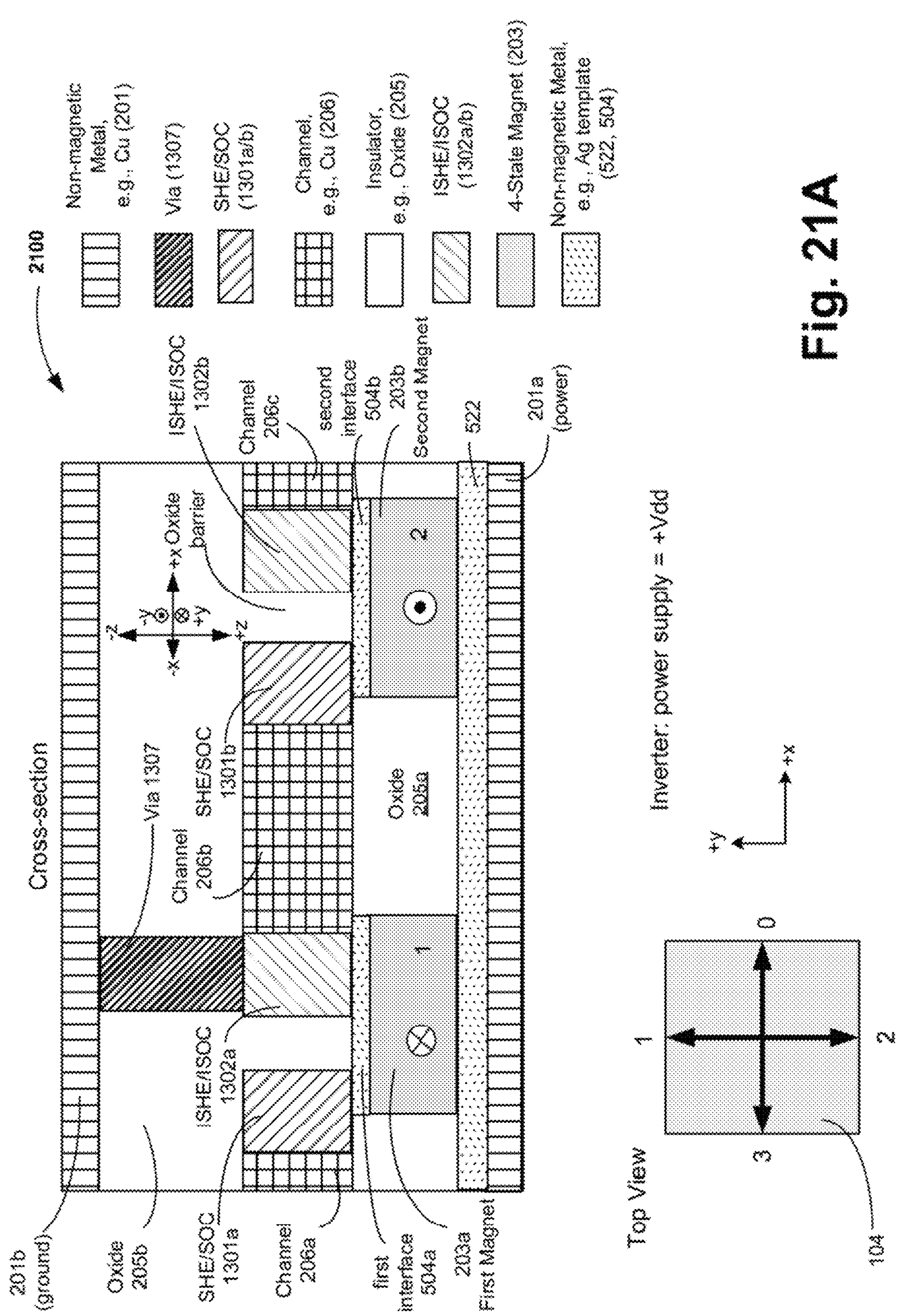
FIG. 21A illustrates a cross-section of a 4-state SOCL device configured as an inverter with the input and output 4-state magnets aligned in the +y direction, in accordance with some embodiments.

FIG. 21A illustrates cross-section 2100 along dotted line BB of 4-state SOCL device 1400 of FIG. 14 configured as a mirror y with the input and output 4-state magnets aligned in the +y and −y directions, respectively, in accordance with some embodiments. It is pointed out that those elements of FIG. 21A having the same reference numbers (or names) as the elements of any other figure can operate or function in any manner similar to that described, but are not limited to such. When a positive power supply is applied to 201*a* (e.g., supply is set to +Vdd), 4-state SOCL device 1400 is configured as a mirror y, in accordance with some embodiments.

In this case, the magnetization of First Magnet 203*a* is set to '1' direction (e.g., +y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*b* by SOC or SHE to spin current in second 4-state magnet 203*b* such that the effective magnetic field on second 4-state magnet 203*b* aligns its magnetization to be parallel, but opposite, to the magnetization of first 4-state magnet 203*a*.

In this case, the magnetization of second 4-state magnet 203*b* is '2' (i.e., the parallel but opposite as the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 21B:
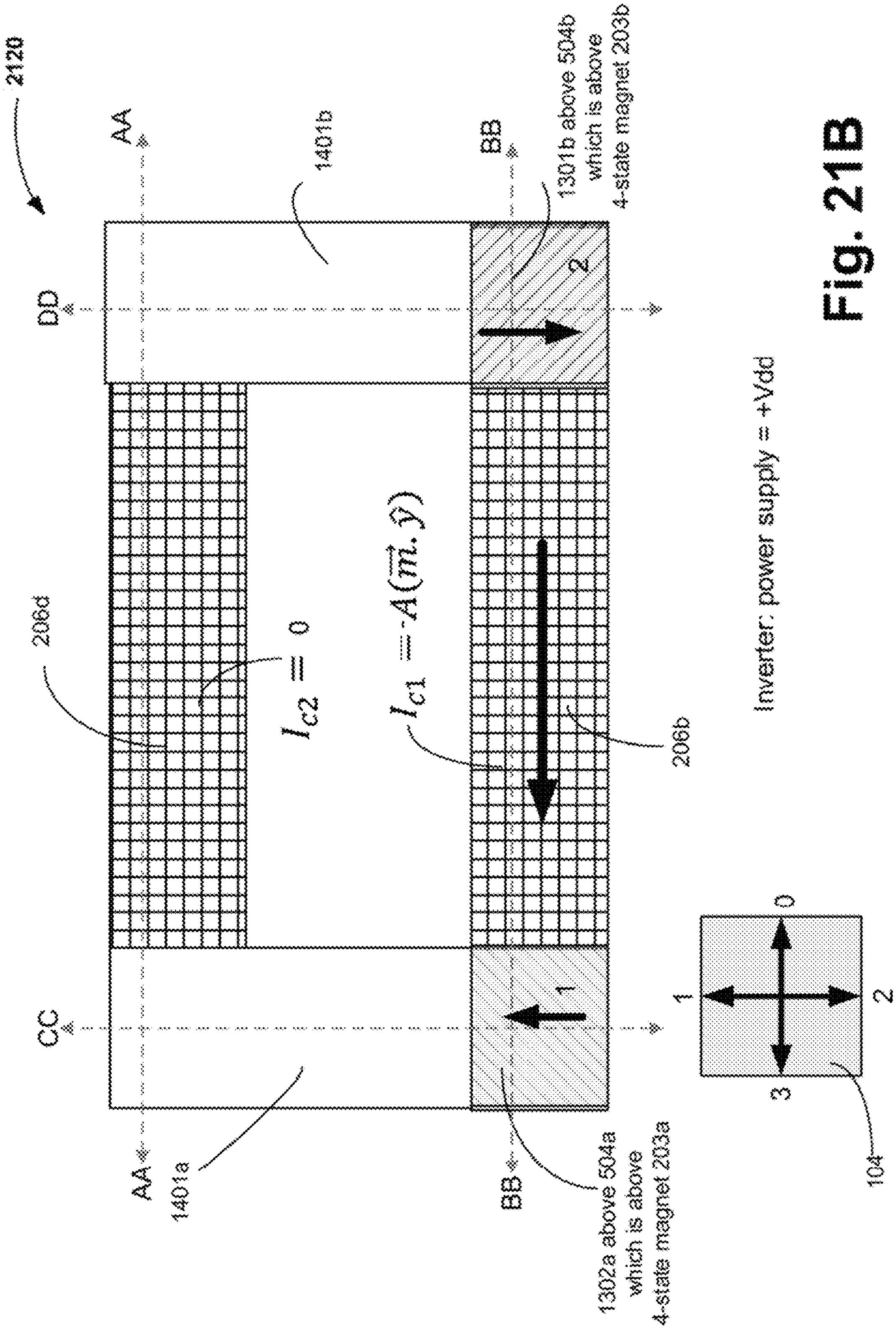
FIG. 21B illustrates a top view of the SOCL device of FIG. 21A, according to some embodiments of the disclosure.

FIG. 21B illustrates top view 2120 of the SOCL device of FIG. 21A, according to some embodiments of the disclosure. It is pointed out that those elements of FIG. 21B having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1301*a*, and where the second ends of interconnects 206*b* and 1401*b* are coupled to SHE/SOC layer 1302*b*.

When a positive power supply (+Vdd) is applied to power rail 201*a*, and the magnetization of the 4-state input magnet 203*a* is aligned in the 'y' direction, then no current flows through interconnect 206*b* (i.e., the 'x' current component is zero, $I_{c2}=0$) while the 'y' current component flows through interconnect 206*b* to SHE/SOC layer 1301*b*, where the 'y' current component in interconnect 206*b* is $I_{c1}=-A(\vec{m}\cdot\hat{y})$. Note, the direction of $I_{c1}$ is opposite to the direction of $I_{c1}$ of FIG. 17B in which a negative supply was applied to interconnect 201*a*. The current component $I_{c1}$ is converted into spin current by SHE/SOC layer 1301*b*, and this spin current causes the magnetization of 4-state second magnet 203*b* to be aligned in the '2' direction (i.e., −y direction).

Figure 22A:
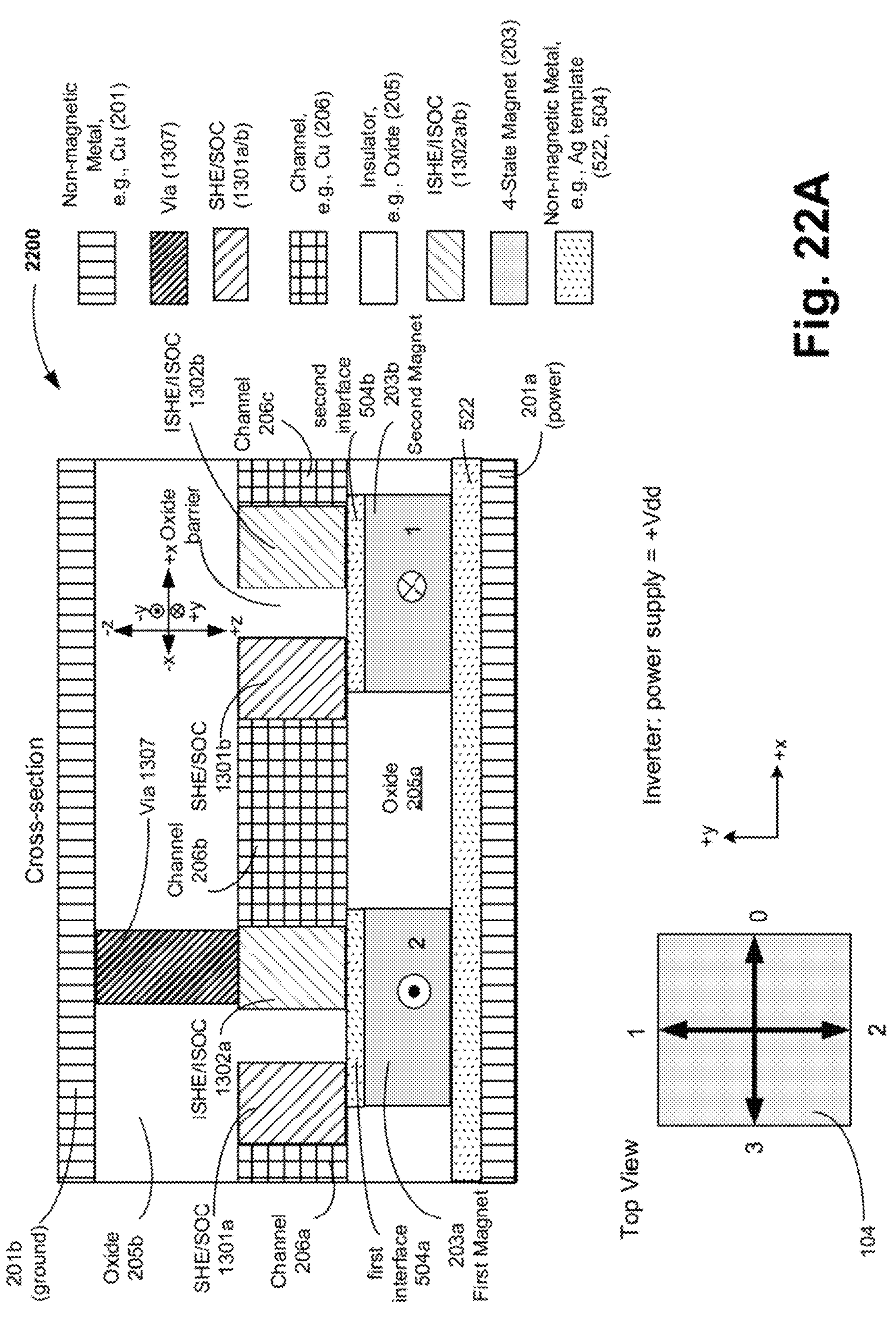
FIG. 22A illustrates a cross-section of a 4-state SOCL device configured as an inverter with the input and output 4-state magnets aligned in the −x direction, in accordance with some embodiments.

FIG. 22A illustrates cross-section 2200 along dotted line BB of 4-state SOCL device 1400 of FIG. 14 configured as a mirror y with the input and output 4-state magnets aligned in the −y and +y directions, in accordance with some embodiments. It is pointed out that those elements of FIG. 22A having the same reference numbers (or names) as the elements of any other figure can operate or function in any manner similar to that described, but are not limited to such.

When a positive power supply is applied to 201*a* (e.g., supply is set to +Vdd), the 4-state SOCL device is configured as a mirror y, in accordance with some embodiments. In this case, the magnetization of First Magnet 203*a* is set to '2' direction (e.g., −y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by ISHE/ISOC layer 1301*a* by SOC or SHE to spin current in second 4-state magnet 203*b* such that the effective magnetic field on second 4-state magnet 203*b* aligns its magnetization to be parallel, but opposite, to the magnetization of first 4-state magnet 203*a*.

In this case, the magnetization of second 4-state magnet 203*b* is '1' (i.e., the parallel but opposite as the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 22B:
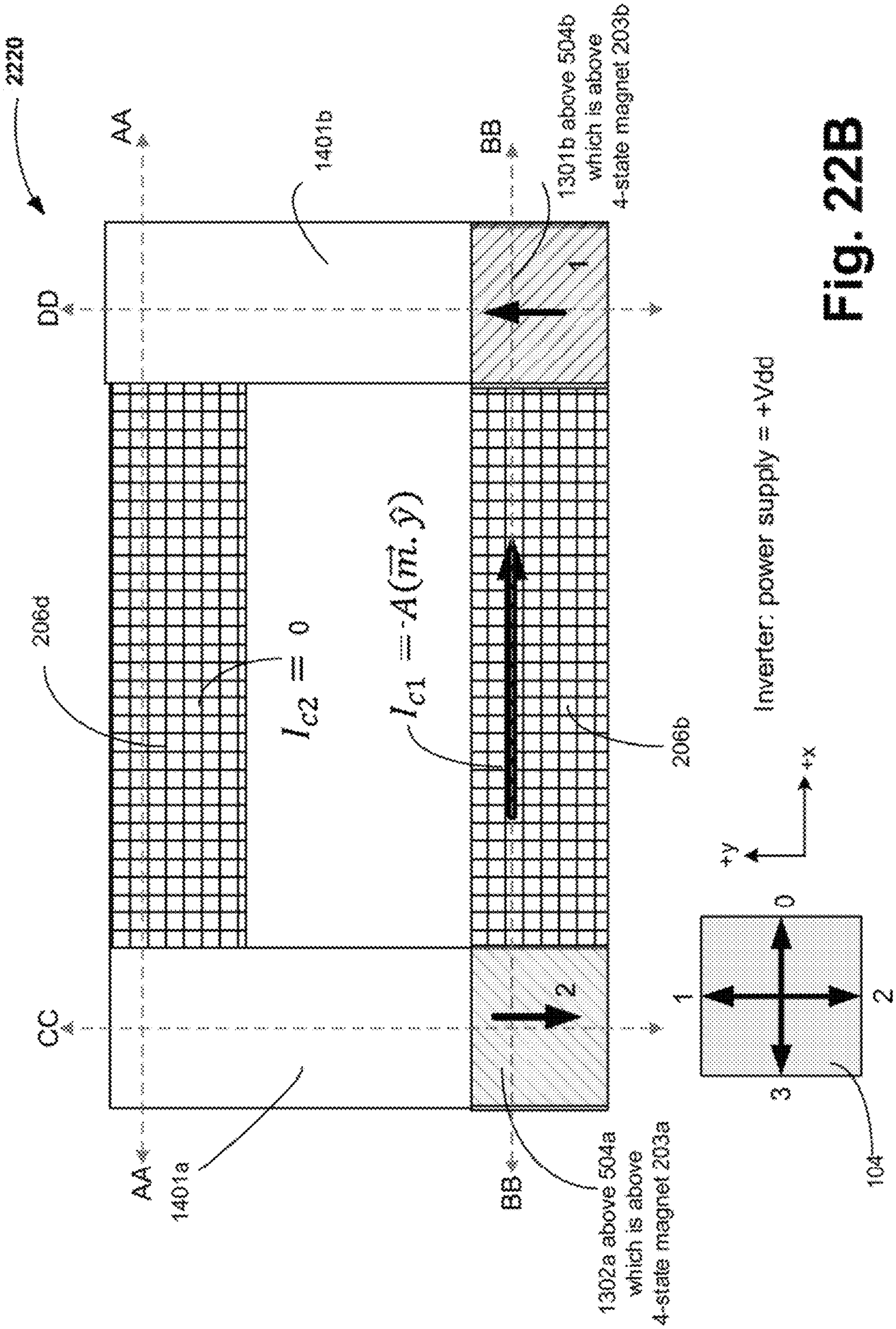
FIG. 22B illustrates a top view of the SOCL device of FIG. 22A, according to some embodiments of the disclosure.

FIG. 22B illustrates top view 2220 of the SOCL device of FIG. 22A, according to some embodiments of the disclosure. Some of the blocks and/or operations listed in FIG. 22B are optional in accordance with certain embodiments. It is pointed out that those elements of FIG. 22B having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1301*a*, and where the second ends of interconnects 206*b* and 1401*b* are coupled to SHE/SOC layer 1301*b*.

When a positive power supply (+Vdd) is applied to power rail 201*a*, and the magnetization of the 4-state input magnet 203*a* is aligned in the −y direction, then no current flows through interconnect 206*b* (i.e., the 'x' current component is zero, $I_{c2}=0$) while the 'y' current component flows through interconnect 206*b* to SHE/SOC layer 1301*b*, where the 'y' current component in interconnect 206*b* is $I_{c1}=-A(\vec{m}\cdot\hat{y})$. Note, the direction of $I_{c1}$ is opposite to the direction of $I_{c1}$ of FIG. 19B in which a negative supply was applied to interconnect 201*a*. The current component $I_{c1}$ is converted into spin current by ISHE/ISOC layer 1301*b*, and this spin current causes the magnetization of 4-state second magnet 203*b* to be aligned in the '1' direction (i.e., +y direction).

Figure 23A:
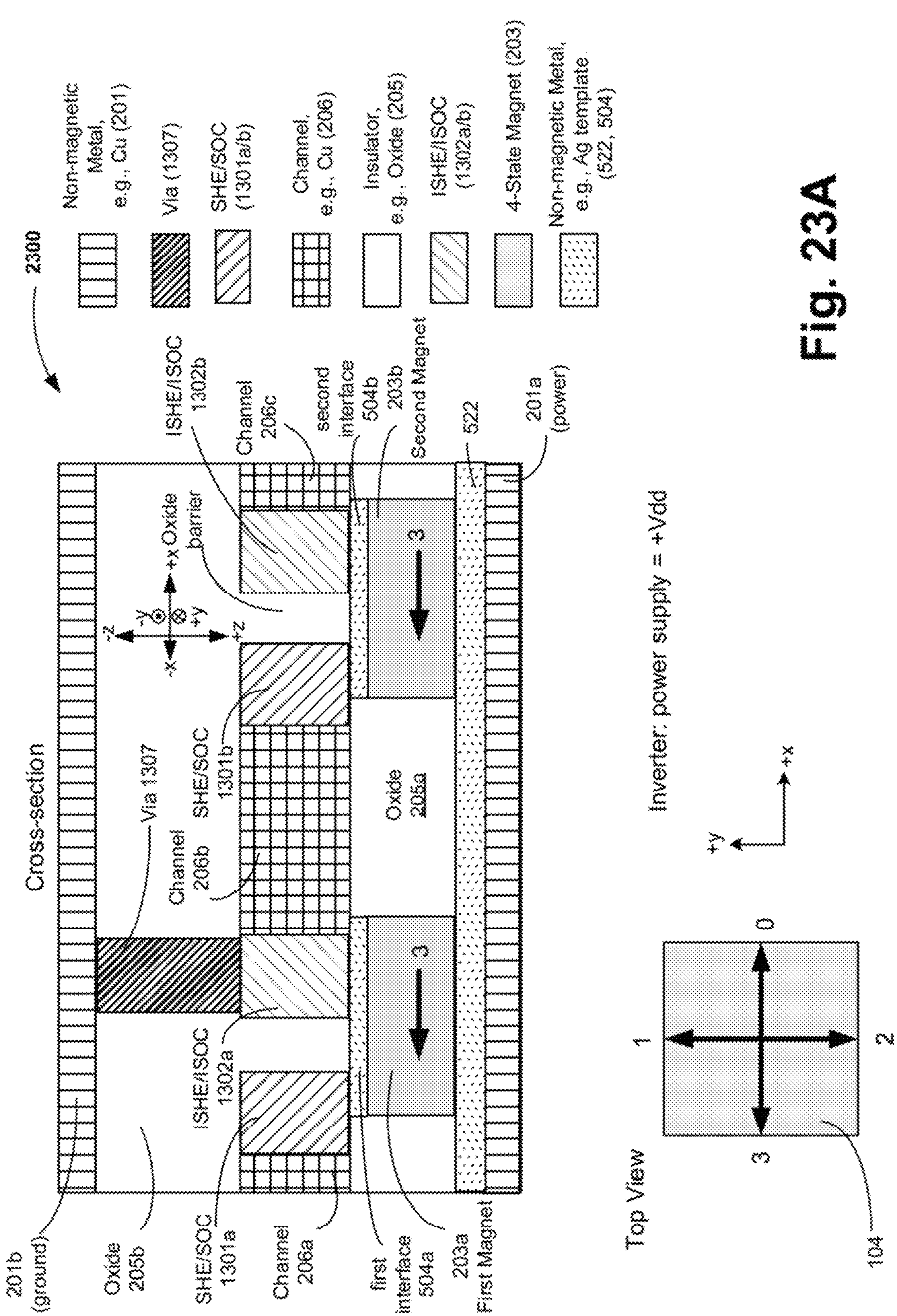
FIG. 23A illustrates a cross-section of a 4-state SOCL device configured as an inverter with the input and output 4-state magnets aligned in the −y direction, in accordance with some embodiments.

FIG. 23A illustrates cross-section 2300 along dotted line BB of 4-state SOCL device 1400 of FIG. 14 configured as a mirror y with the input and output 4-state magnets aligned in the −x and +x directions, respectively, in accordance with some embodiments. It is pointed out that those elements of FIG. 23A having the same reference numbers (or names) as the elements of any other figure can operate or function in any manner similar to that described, but are not limited to such.

When a positive power supply is applied to 201*a* (e.g., supply is set to +Vdd), 4-state SOCL device 1400 is configured as a mirror y, in accordance with some embodiments.

In this case, the magnetization of First Magnet 203*a* is set to '3' direction (e.g., −x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. In some embodiments, the charge current $I_c$ is converted by SHE/SOC layer 1301*a* by SOC or SHE to spin current in second 4-state magnet 203*b* such that the effective magnetic field on second 4-state magnet 203*b* aligns its magnetization to be parallel, but opposite, to the magnetization of first 4-state magnet 203*a*.

In this case, the magnetization of second 4-state magnet 203*b* is '3' (i.e., the same as the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*b* is provided to interconnect (or channel) 206*c* and propagated to another device for further processing, in accordance with some embodiments.

Figure 23B:
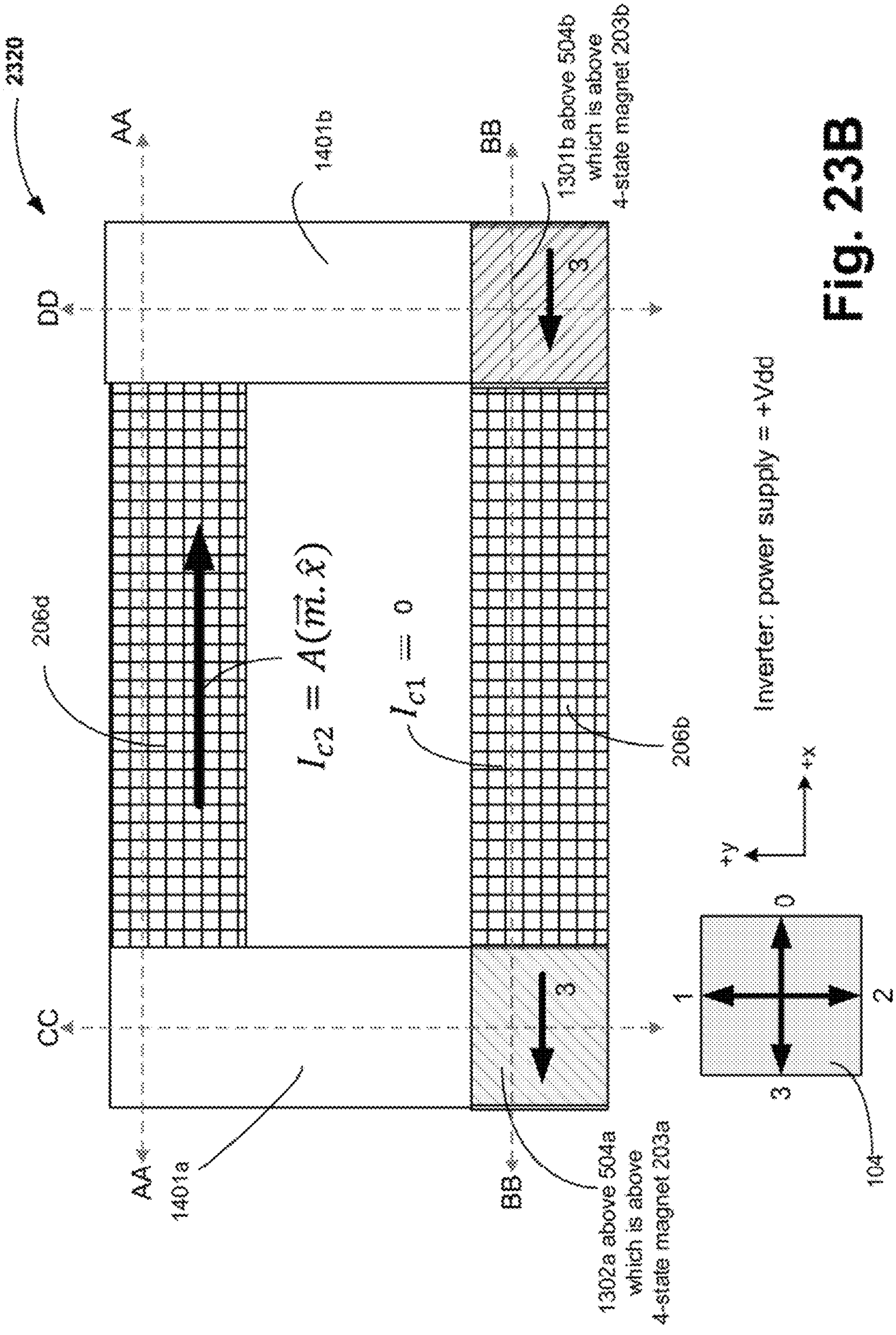
FIG. 23B illustrates a top view of the SOCL device of FIG. 23A, according to some embodiments of the disclosure.

FIG. 23B illustrates top view 2320 of the SOCL device of FIG. 23A, according to some embodiments of the disclosure. It is pointed out that those elements of FIG. 23B having the same reference numbers (or names) as the elements of any other figure can operate or function in any manner similar to that described, but are not limited to such.

As discussed with reference to FIG. 14, a conducting loop is formed from ISHE/ISOC 1302*a* to SHE/SOC 1301*b*. The loop is formed by interconnects 1401*a*, 206*d*, 1401*b*, and 206*b*, where the first ends of interconnects 206*b* and 1401*a* are coupled to ISHE/ISOC layer 1302*a* and where the second ends of interconnects 206*b* and 1401*b* are coupled to SHE/SOC layer 1301*b*.

When a positive power supply (+Vdd) is applied to power rail 201*a*, and the magnetization of the 4-state input magnet 203*a* is aligned in the −x direction, then no current flows through interconnect 206*b* (i.e., the 'y' current component is zero, $I_{c1}=0$) while the 'x' current component flows through interconnect 206*d* to SHE/SOC layer 1301*b*, where the 'x' current component in interconnect 206*d* is $I_{c2}=A(\vec{m}\cdot\hat{x})$. Note, the direction of $I_{c2}$ is opposite to the direction of $I_{c1}$ of FIG. 18B in which a negative supply was applied to interconnect 201*a*. The current component $I_{c2}$ is converted into spin current by SHE/SOC layer 1301*b*, and this spin current causes the magnetization of 4-state second magnet 203*b* to be aligned in the '3' direction (i.e., +x direction).

4-State Quaternary Cyclic, Half Complement and 1.5-Complmenet Logic Gate Using Spin Orbit Effect (SOC)

For Galois field-4 (GF04) algebra to form a complete logic family, half order and 1.5 order complements are required, where the term "order", r, (also known as 'radix') refers to the number of elements in GF04. These two operations constitute a +90 degree rotation and −90 degree geometric rotations of the state of the digital element (e.g. direction of magnetization), respectively. These logic functions are related (but not equivalent) to the cyclic operations in the space of m='0', '1', '2', '3'. Clockwise cyclic+k operations are defined as m'=mod(m+k, r). Counterclockwise cyclic-k operations are defined as m'=mod(m−k, r). It should be emphasized that 'clockwise' and 'counterclockwise' in this context do not refer to geometrical rotations of magnetization.

Figure 24:
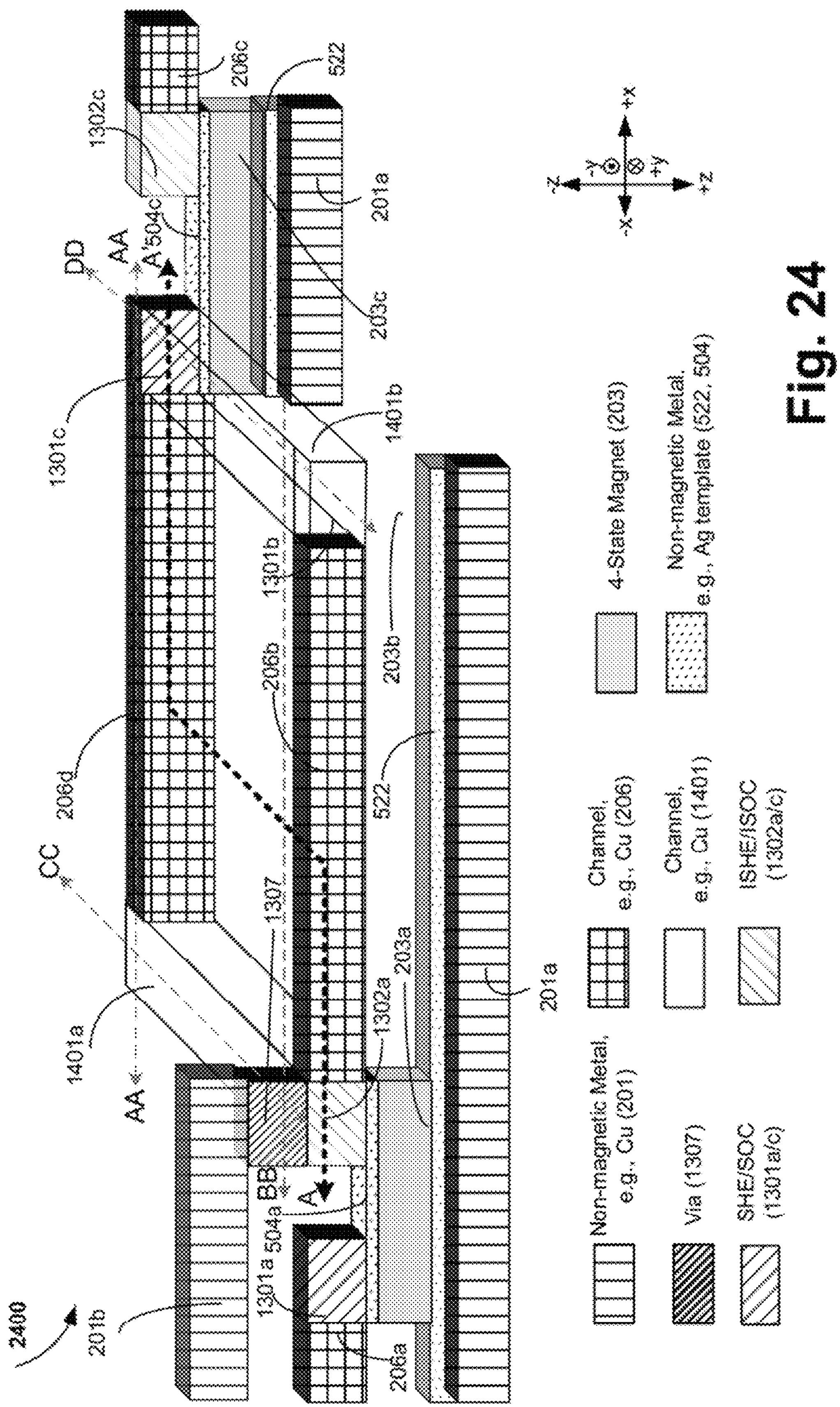
FIG. 24 illustrates a 3D view of the 4-state magnet based SOCL device which is configurable as quaternary counter clockwise (ccw) cyclic-1 and 1.5-complmenet logic gate, in accordance with some embodiments of the disclosure.

FIG. 24 illustrates a 3D view of the 4-state magnet based SOCL device 2400 which is configurable as quaternary cw cyclic+2 and 1.5-complmenet logic gate, in accordance with some embodiments of the disclosure. It is pointed out that those elements of FIG. 24 having the same reference numbers (or names) as the elements of any other figure can operate or function in any manner similar to that described, but are not limited to such.

Compared to FIG. 14, which is a quaternary SOCL device using 4-state magnets along the same line of axis, here, the input and output 4-state magnets are positioned along a diagonal and respectively coupled to ISHE/ISOC and SHE/SOC layers. As such, quaternary cw cyclic+2 and ccw cyclic-1 logic gate based SOCL devices are formed in accordance with some embodiments. For example, instead of having SHE/SOC 1301*b* of FIG. 14 being coupled to interconnect 206*b*, here interconnect 1401*b* is directly coupled to interconnect 206*b* at one end of interconnect 206*b*. In some embodiments, SHE/SOC 1301*c* is coupled to one end of interconnect 206*d* while the other end of interconnect 206*d* is coupled to an end of interconnect 1401*a*.

Figure 25:
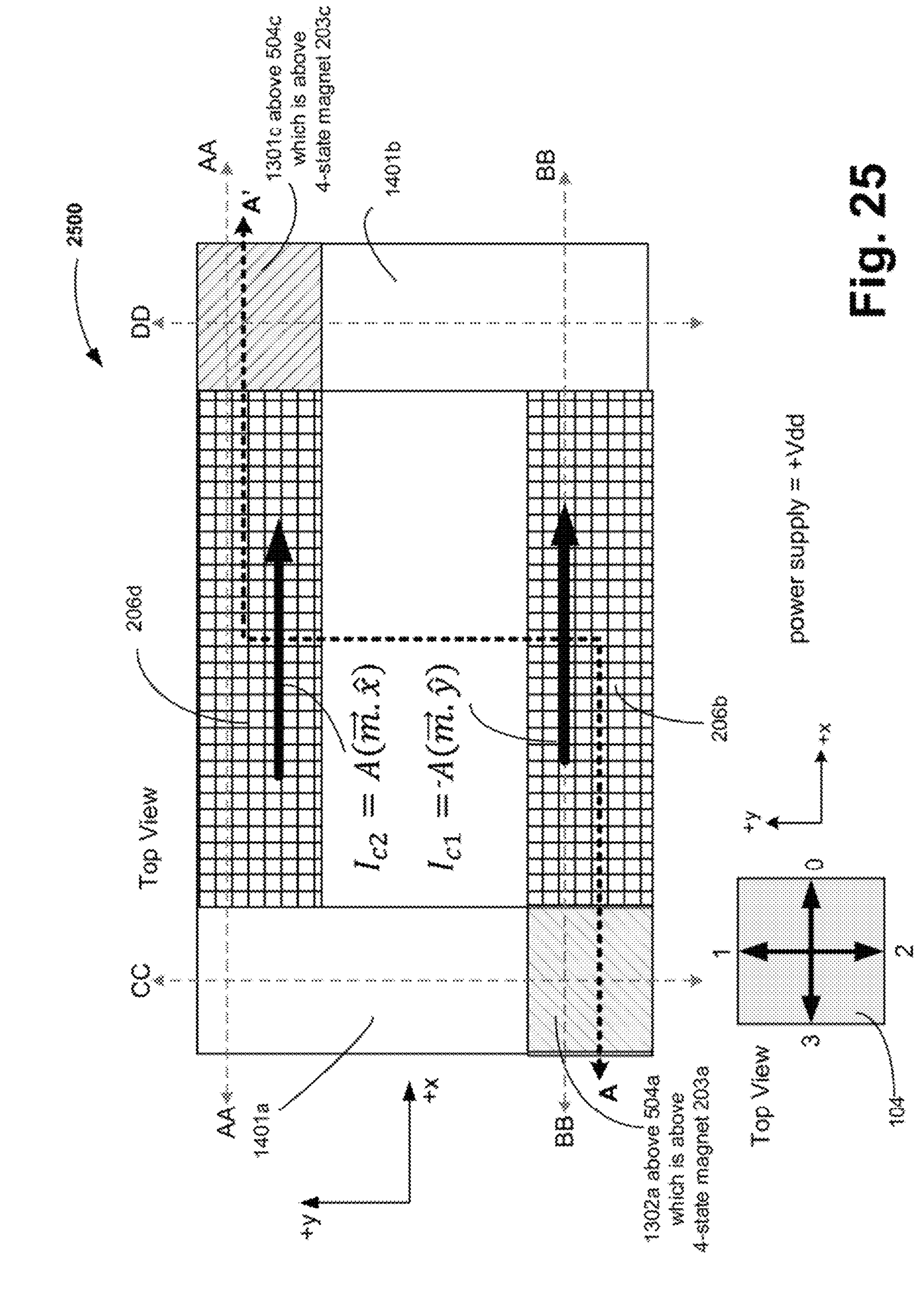
FIG. 25 illustrates a top view of cross-section AA' of the SOCL device of FIG. 24, according to some embodiments of the disclosure.

In some embodiments, SHE/SOC 1301*c* is coupled to a template layer 504*c* which in turn is coupled to second 4-state magnet 203*c*. For example, SHE/SOC 1301*c* is coupled to one end of template layer 504*c*. The materials for template layer 504*c* are selected from the same materials described with reference to template layer 504*a*, and the materials for second 4-state magnet 203*c* are selected from the same materials described with reference to second 4-state magnet 203*b*. In some embodiments, templating layer 522 is coupled to (or adjacent to) second 4-state magnet 203*b*. In some embodiments, power rail 201*a* is coupled to templating layer 522. In some embodiments, ISHE/ISOC 1302*c* is coupled to another end of template layer 504*c*. In some embodiments, an output interconnect 206*c* is coupled to ISHE/ISOC 1302*c* and is used for coupling to another device. Interconnect 206*b/d* are used for transportation of 'y' and 'x' charge currents. Cross-sections AA, BB, CC, and DD are shown in FIG. 25. Referring back to FIG. 24, the dotted line AA' is drawn to show a cross-sectional view of quaternary cw cyclic+2 and ccw cyclic-1 logic gate with both magnets in a cross-sectional view.

FIG. 25 illustrates top view 2500 of cross-section AA' of the SOCL device 2400 of FIG. 24, according to some embodiments of the disclosure. It is pointed out that those elements of FIG. 25 having the same reference numbers (or names) as the elements of any other figure can operate or function in any manner similar to that described, but are not limited to such.

Here, top view 2500 shows the conduction paths for the 'x' and 'y' charge currents which are proportional to the spin currents along 'x' direction and 'y' direction, respectively. These currents originate from ISHE/ISOC layer 1302*a* and are injected into interconnects 206*b* and 1401*a*. The 'x' component of the current $I_{c2}=A(\vec{m}\cdot\hat{x})$ passes through interconnect 1401*a* and 206*d*, while the 'y' component of the current $I_{c1}=-A(\vec{m}\cdot\hat{y})$ passes through interconnect 206*b*, provided that positive supply voltage +Vdd is applied to the layer 201*a*. The currents are effectively added in SHE/SOC layer 1301*c* in accordance with some embodiments. In some embodiments, depending on the supply voltage on 201*a* and the magnetization of the 4-state input magnet 203*a*, the directions and magnitudes of currents $I_{c1}$ and $I_{c2}$ are determined.

FIGS. 26-29A-B illustrate magnetizations and current directions when 4-state SOCL device 2400 is configured as quaternary ccw cyclic-1 logic gate. The power supply to metal layer 201*a* is a positive supply +Vdd.

Table 6a/b below shows the magnetization of the input and output magnets for the quaternary 1.5 complement logic gate and for the SOCL device when configured as a ccw cyclic-1 gate. The logical function of 1.5 complement is obtained by cascading the ccw cyclic-1 gate and the mirror y gate.

TABLE 6

| a | | |
|---|---|---|
| Input Magnet Orientation | Output Magnet Orientation | Function |
| +x (0) | −y (2) | 1.5 complement |
| +y (1) | +x (0) | 1.5 complement |
| −x (3) | +y (1) | 1.5 complement |
| −y (2) | −x (3) | 1.5 complement |

TABLE 6-continued

| b | | |
|---|---|---|
| Input Magnet Orientation (i.e., 203a) | Output Magnet Orientation (i.e., 203c) | Function |
| +x (0) | +y (1) | Ccw cyclic − 1 |
| +y (1) | +x (0) | Ccw cyclic − 1 |
| −x (3) | −y (2) | Ccw cyclic − 1 |
| −y (2) | −x (3) | Ccw cyclic − 1 |

Figure 26A:
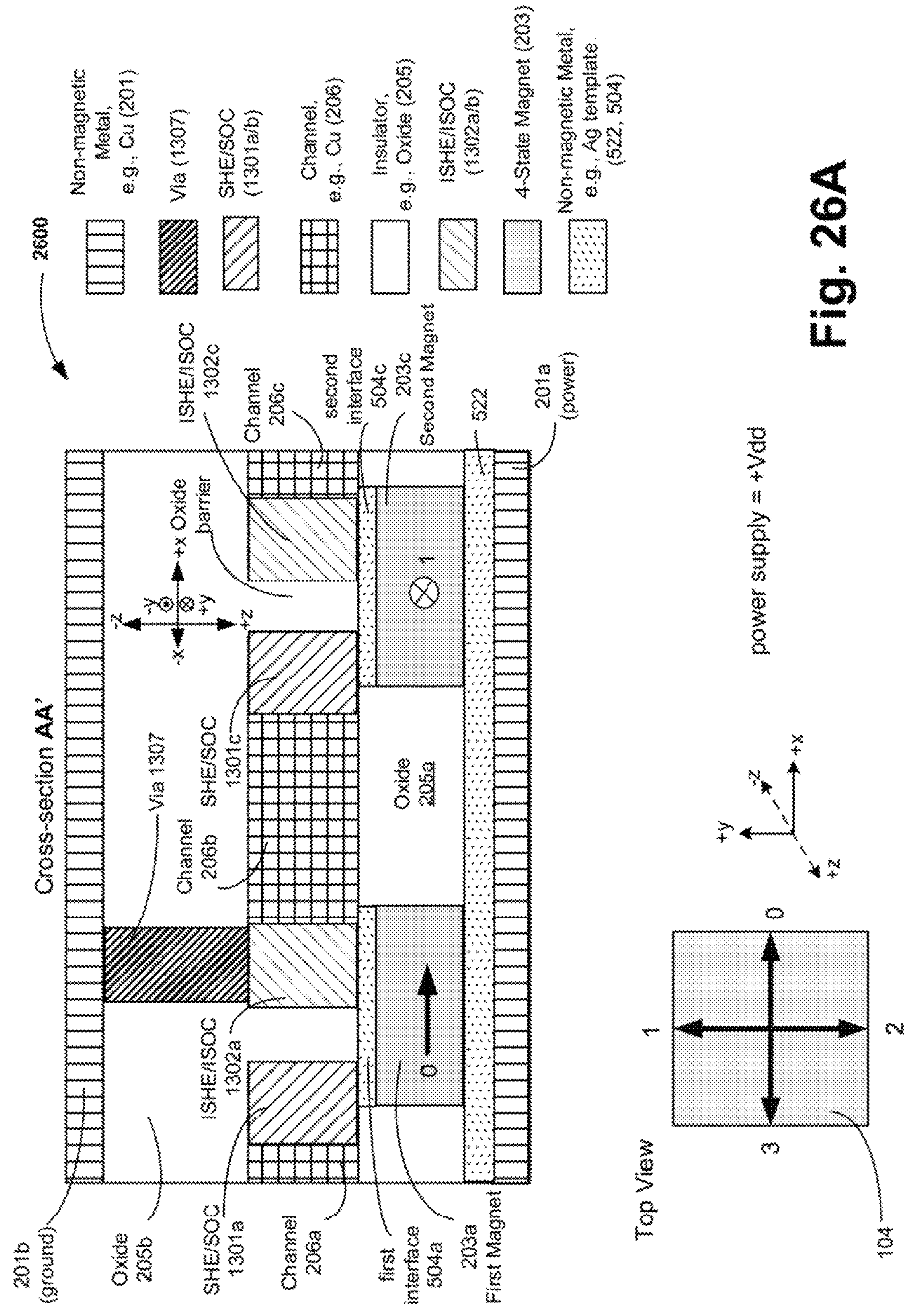
FIG. 26A illustrates a cross-sectional view of section AA' of the quaternary ccw cyclic-1 SOCL device of FIG. 24 when the input 4-state magnet has magnetization direction ‘0’ and the output 4-state magnet has magnetization direction ‘1’, according to some embodiments of the disclosure.

FIG. 26A illustrates cross-sectional view 2600 of section AA' of the quaternary ccw cyclic-1 SOCL device 2400 of FIG. 24 when input 4-state magnet 203*a* has magnetization direction '0' and output 4-state magnet 203*c* has magnetization direction '1', according to some embodiments of the disclosure. It is pointed out that those elements of FIG. 26A having the same reference numbers (or names) as the elements of any other figure can operate or function in any manner similar to that described, but are not limited to such.

When positive power supply is applied to 201*a* (e.g., supply is set to +Vdd), 4-state SOCL device 2400 is configured as a quaternary ccw cyclic-1 logic gate, in accordance with some embodiments. In this case, the magnetization of First Magnet 203*a* is set to '0' direction (e.g., +x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. For example, the current may be directed to second 4-state magnet 203*c* via interconnects 206*b* and 1401*b*, and/or via interconnects 1401*a* and 206*d*. In some embodiments, the charge current $I_c$ is converted by SHE/SOC layer 1301*c* by SOC or SHE to spin current in second 4-state magnet 203*c* such that the effective magnetic field on second 4-state magnet 203*c* aligns its magnetization to be orthogonal to the magnetization of first 4-state magnet 203*a*.

In this case, the magnetization of second 4-state magnet 203*c* is '1' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 26B:
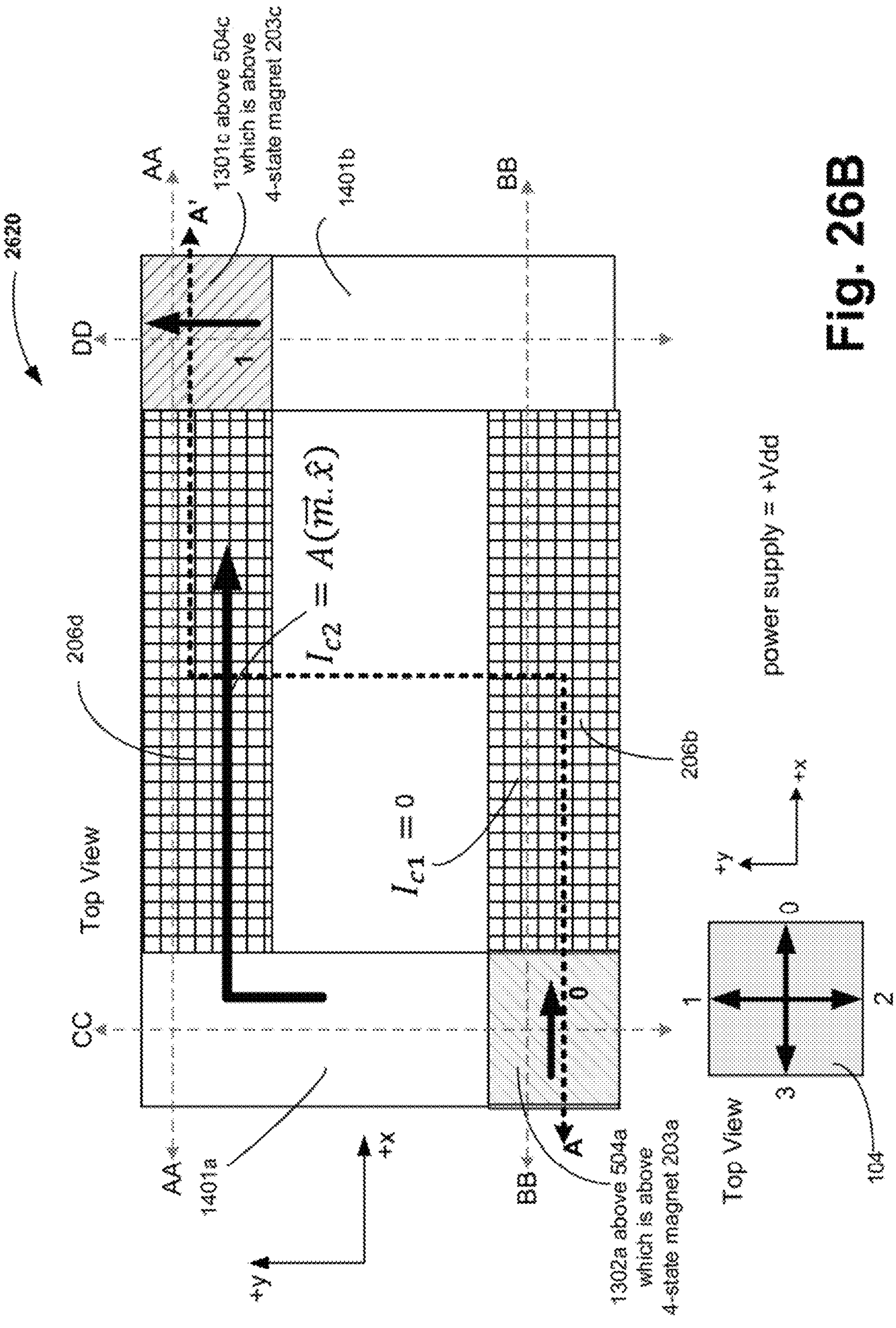
FIG. 26B illustrates a top view of section AA' of the quaternary ccw cyclic-1 SOCL device of FIG. 24 when the input 4-state magnet has magnetization direction ‘0’ and the output 4-state magnet has magnetization direction ‘1’, according to some embodiments of the disclosure.

FIG. 26B illustrates top view 2620 of section AA' of the quaternary ccw cyclic-1 SOCL device 2400 of FIG. 24 when the input 4-state magnet has magnetization direction '0' and the output 4-state magnet has magnetization direction '1', according to some embodiments of the disclosure. It is pointed out that those elements of FIG. 26B having the same reference numbers (or names) as the elements of any other figure can operate or function in any manner similar to that described, but are not limited to such.

As discussed with reference to FIG. 24, a conducting loop is formed from ISHE/ISOC 1302*a* to SHE/SOC 1301*c*. The loop is formed by interconnects 1401*a*, 206*d*, 1401*b*, and 206*b*, where the first ends of interconnects 206*b* and 1401*a* are coupled to ISHE/ISOC layer 1302*a*, where the second end of interconnects 206*c* is coupled to an end of interconnect 1401*b*, and where one end of interconnect 206*d* is coupled to interconnect 1401*a* and another end of interconnect 206*d* is coupled to SHE/SOC layer 1301*c*.

When a positive power supply (+Vdd) is applied to power rail 201*a*, and the magnetization of the 4-state input magnet 203*a* is aligned in the +x direction, then no current flows through interconnect 206*b* (i.e., the 'y' current component is zero, $I_{c1}=0$) while the 'x' current component flows through interconnect 206*d* to ISHE/ISOC layer 1302*c*, where the 'x' current component in interconnect 206*d* is $I_{c2}=A(\vec{m}\cdot\hat{x})$. The current component $I_{c2}$ is converted into spin current by SHE/SOC layer 1301*c*, and this spin current causes the magnetization of 4-state second magnet 203*c* to be aligned in the '1' direction (i.e., +y direction).

Figure 27A:
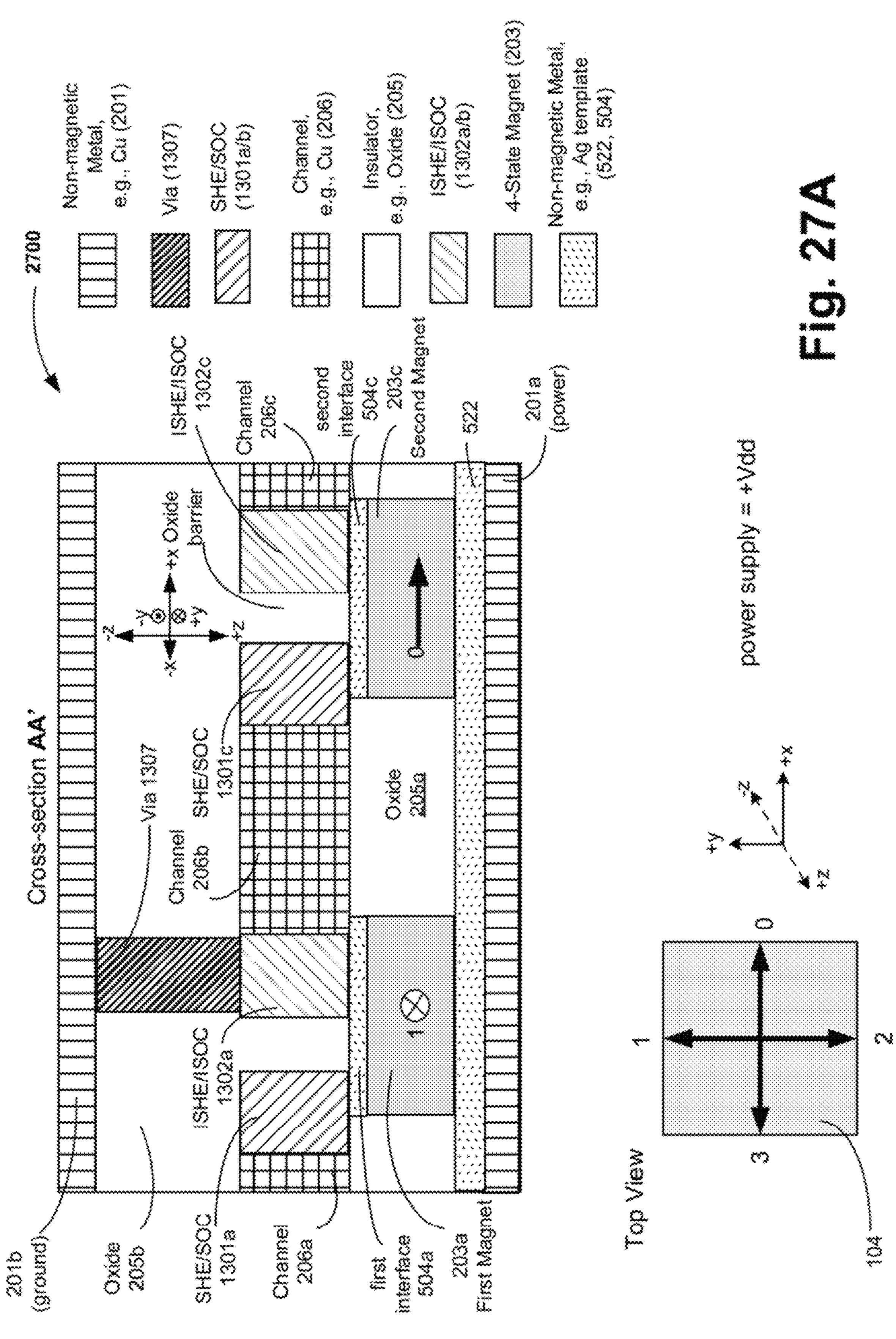
FIG. 27A illustrates a cross-sectional view of section AA' of the quaternary ccw cyclic-1 SOCL device of FIG. 24 when the input 4-state magnet has magnetization direction ‘1’ and the output 4-state magnet has magnetization direction ‘3’, according to some embodiments of the disclosure.

FIG. 27A illustrates a cross-sectional view of section AA' of the quaternary ccw cyclic-1 SOCL device 2400 of FIG. 24 when the input 4-state magnet has magnetization direction '1' and the output 4-state magnet has magnetization direction '0', according to some embodiments of the disclosure. It is pointed out that those elements of FIG. 27A having the same reference numbers (or names) as the elements of any other figure can operate or function in any manner similar to that described, but are not limited to such.

When a positive power supply is applied to 201*a* (e.g., supply is set to +Vdd), the 4-state SOCL device is configured as a quaternary ccw cyclic-1 logic gate, in accordance with some embodiments. In this case, the magnetization of First Magnet 203*a* is set to '1' direction (e.g., +y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. For example, the current may be directed to second 4-state magnet 203*c* via interconnects 206*b* and 1401*b*, and/or via interconnects 1401*a* and 206*d*. In some embodiments, the charge current $I_c$ is converted by SHE/SOC layer 1301*c* by SOC or SHE to spin current in second 4-state magnet 203*c* such that the effective magnetic field on second 4-state magnet 203*c* aligns its magnetization to be orthogonal to the magnetization of first 4-state magnet 203*a*.

In this case, the magnetization of second 4-state magnet 203*c* is '0' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 27B:
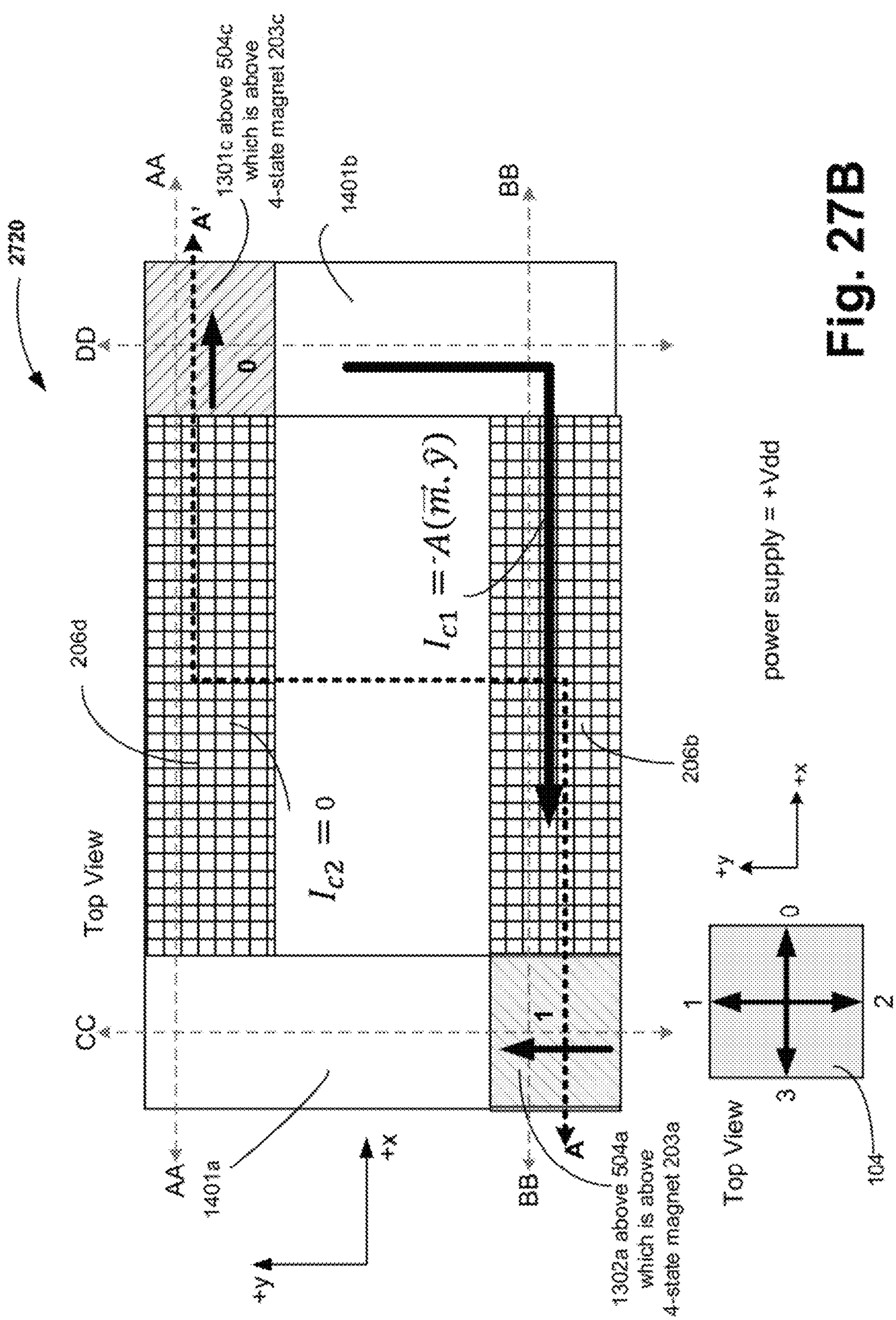
FIG. 27B illustrates a top view of section AA' of the quaternary ccw cyclic-1 SOCL device of FIG. 24 when the input 4-state magnet has magnetization direction ‘1’ and the output 4-state magnet has magnetization direction ‘3’, according to some embodiments of the disclosure.

FIG. 27B illustrates top view 2720 of section AA' of the quaternary ccw cyclic-1 SOCL device of FIG. 24 when the input 4-state magnet has magnetization direction '1' and the output 4-state magnet has magnetization direction '0', according to some embodiments of the disclosure. It is pointed out that those elements of FIG. 27B having the same reference numbers (or names) as the elements of any other figure can operate or function in any manner similar to that described, but are not limited to such.

As discussed with reference to FIG. 24, a conducting loop is formed from ISHE/ISOC 1302*a* to SHE/SOC 1301*c*. The loop is formed by interconnects 1401*a*, 206*d*, 1401*b*, and 206*b*, where the first ends of interconnects 206*b* and 1401*a* are coupled to ISHE/ISOC layer 1301*a*, where the second end of interconnects 206*b* is coupled to an end of interconnect 1401*b*, where one end of interconnect 206*d* is coupled to interconnect 1401*a* and another end of interconnect 206*d* is coupled to SHE/SOC layer 1301*c*.

When a positive power supply (+Vdd) is applied to power rail 201*a*, and the magnetization of the 4-state input magnet 203*a* is aligned in the +y direction, then no current flows through interconnect 206*d* (i.e., the 'x' current component is zero, $I_{c2}=0$) while the 'y' current component flows through interconnect 206*b* to ISHE/ISOC layer 1302*c*, where the 'y' current component in interconnect 206*b* is $I_{c1}=-A(\vec{m}\cdot\hat{y})$. The current component $I_{c1}$ is converted into spin current by SHE/SOC layer 1301*c*, and this spin current causes the magnetization of 4-state second magnet 203*c* to be aligned in the '0' direction (i.e., +x direction).

Figure 28A:
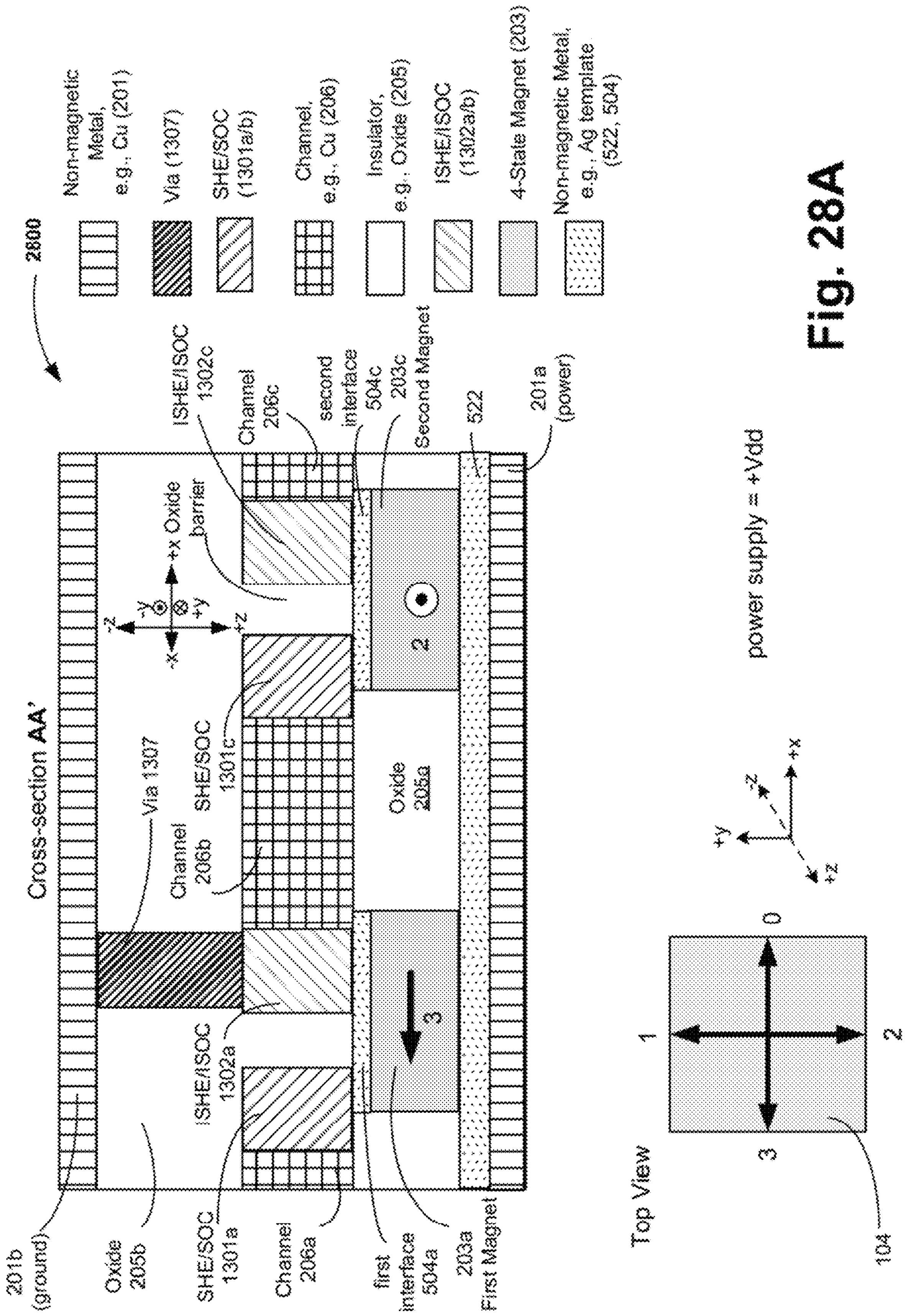
FIG. 28A illustrates a cross-sectional view of section AA' of the quaternary ccw cyclic-1 SOCL device of FIG. 24 when the input 4-state magnet has magnetization direction ‘3’ and the output 4-state magnet has magnetization direction ‘2’, according to some embodiments of the disclosure.

FIG. 28A illustrates cross-sectional view 2800 of section AA' of the quaternary ccw cyclic-1 SOCL device 2400 of FIG. 24 when the input 4-state magnet has magnetization direction '3' and the output 4-state magnet has magnetization direction '2', according to some embodiments of the disclosure. It is pointed out that those elements of FIG. 28B having the same reference numbers (or names) as the elements of any other figure can operate or function in any manner similar to that described, but are not limited to such.

When a positive power supply is applied to 201*a* (e.g., supply is set to +Vdd), the 4-state SOCL device is configured as a quaternary ccw cyclic-1 logic gate, in accordance with some embodiments. In this case, the magnetization of First Magnet 203*a* is set to '3' direction (e.g., −x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. For example, the current may be directed to second 4-state magnet 203*c* via interconnects 206*b* and 1401*b*, and/or via interconnects 1401*a* and 206*d*. In some embodiments, the charge current $I_c$ is converted by SHE/SOC layer 1301*c* by SOC or SHE to spin current in second 4-state magnet 203*c* such that the effective magnetic field on second 4-state magnet 203*c* aligns its magnetization to be orthogonal to the magnetization of first 4-state magnet 203*a*.

In this case, the magnetization of second 4-state magnet 203*c* is '2' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 28B:
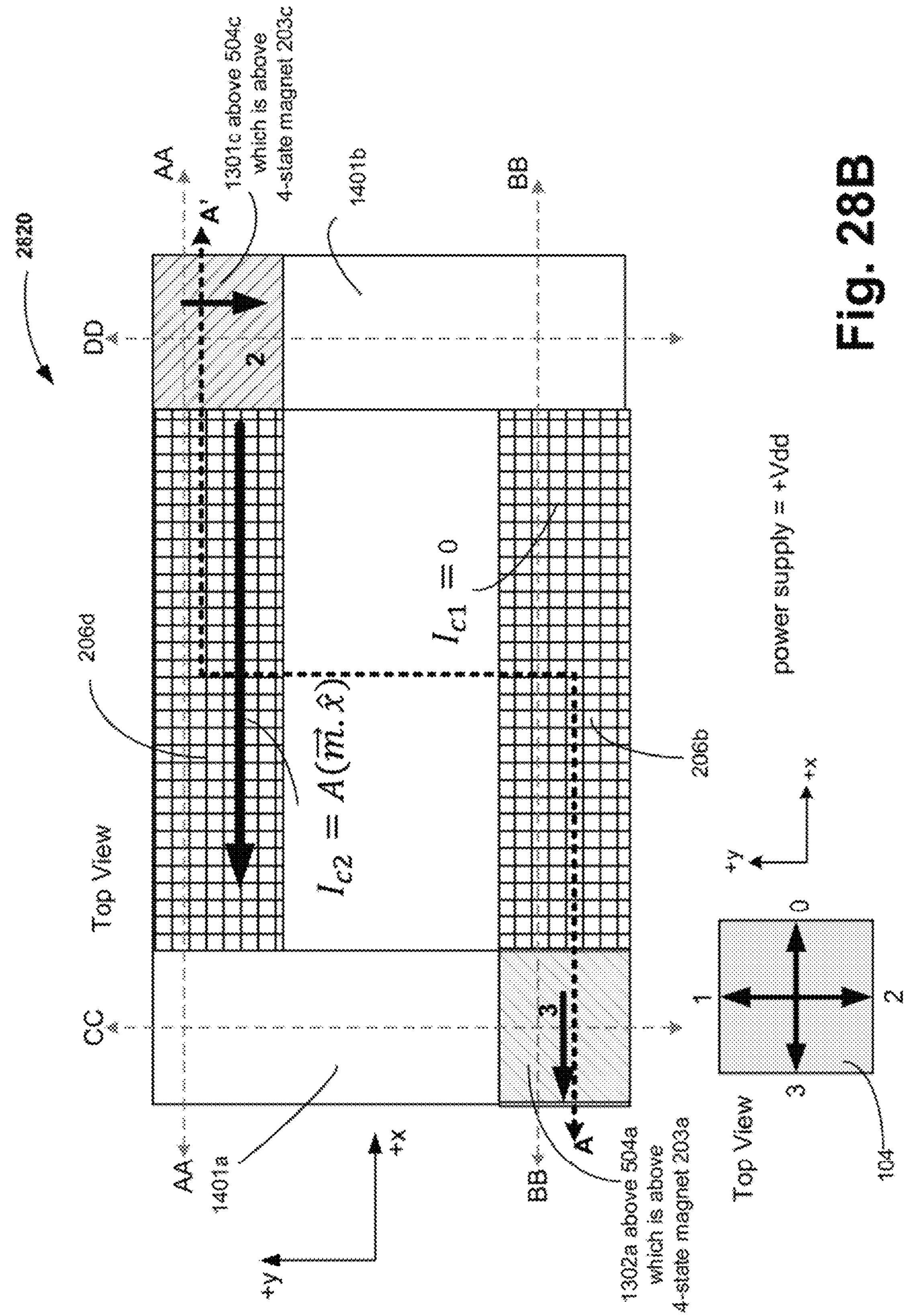
FIG. 28B illustrates a top view of section AA' of the quaternary ccw cyclic-1 SOCL device of FIG. 24 when the input 4-state magnet has magnetization direction ‘3’ and the output 4-state magnet has magnetization direction ‘2’, according to some embodiments of the disclosure.

FIG. 28B illustrates top view 2820 of section AA' of the quaternary ccw cyclic-1 SOCL device 2400 of FIG. 24 when the input 4-state magnet has magnetization direction '3' and the output 4-state magnet has magnetization direction '2', according to some embodiments of the disclosure. It is pointed out that those elements of FIG. 28B having the same reference numbers (or names) as the elements of any other figure can operate or function in any manner similar to that described, but are not limited to such.

As discussed with reference to FIG. 24, a conducting loop is formed from ISHE/ISOC 1302*a* to SHE/SOC 1301*c*. The loop is formed by interconnects 1401*a*, 206*d*, 1401*b*, and 206*b*, where the first ends of interconnects 206*b* and 1401*a* are coupled to SHE/SOC layer 1301*b*, where the second end of interconnects 206*b* is coupled to an end of interconnect 1401*b*, where one end of interconnect 206*d* is coupled to interconnect 1401*a* and another end of interconnect 206*d* is coupled to SHE/SOC layer 1301*c*.

When a positive power supply (+Vdd) is applied to power rail 201*a*, and the magnetization of the 4-state input magnet 203*a* is aligned in the −x direction, then no current flows through interconnect 206*b* (i.e., the 'y' current component is zero, $I_{c1}=0$) while the 'x' current component flows through interconnect 206*b* to SHE/SOC layer 1301*c*, where the 'x' current component in interconnect 206*d* is $I_{c2}=A(\vec{m}\cdot\hat{x})$. Here, the current component $I_{c2}$ is converted into spin current by SHE/SOC layer 1301*c*, and this spin current causes the magnetization of 4-state second magnet 203*c* to be aligned in the '2' direction (i.e., −y direction).

Figure 29A:
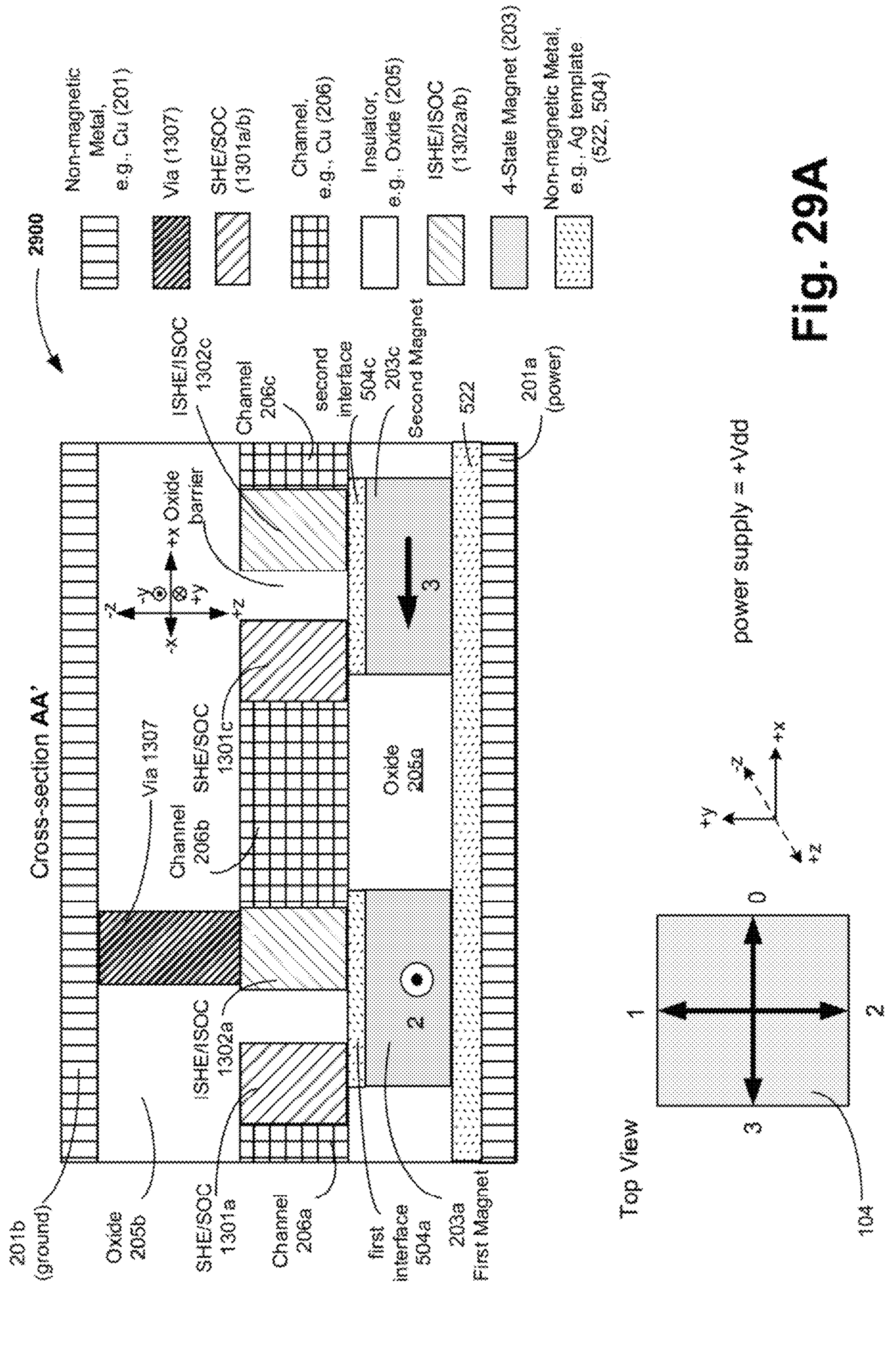
FIG. 29A illustrates a cross-sectional view of section AA' of the ccw cyclic-1 SOCL device of FIG. 24 when the input 4-state magnet has magnetization direction ‘2’ and the output 4-state magnet has magnetization direction ‘0’, according to some embodiments of the disclosure.

FIG. 29A illustrates cross-sectional view 2900 of section AA' of the quaternary ccw cyclic-1 SOCL device 2400 of FIG. 24 when the input 4-state magnet has magnetization direction '2' and the output 4-state magnet has magnetization direction '3', according to some embodiments of the disclosure. It is pointed out that those elements of FIG. 29A having the same reference numbers (or names) as the elements of any other figure can operate or function in any manner similar to that described, but are not limited to such.

When positive power supply is applied to 201*a* (e.g., supply is set to +Vdd), the 4-state SOCL device 2400 is configured as a quaternary ccw cyclic-1 logic gate, in accordance with some embodiments. In this case, the magnetization of First Magnet 203*a* is set to '2' direction (e.g., −y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. For example, the current may be directed to second 4-state magnet 203*c* via interconnects 206*b* and 1401*b*, and/or via interconnects 1401*a* and 206*d*. In some embodiments, the charge current $I_c$ is converted by SHE/SOC layer 1301*c* by SOC or SHE to spin current in second 4-state magnet 203*c* such that the effective magnetic field on second 4-state magnet 203*c* aligns its magnetization to be orthogonal to the magnetization of first 4-state magnet 203*a*.

In this case, the magnetization of second 4-state magnet 203*c* is '3' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 29B:
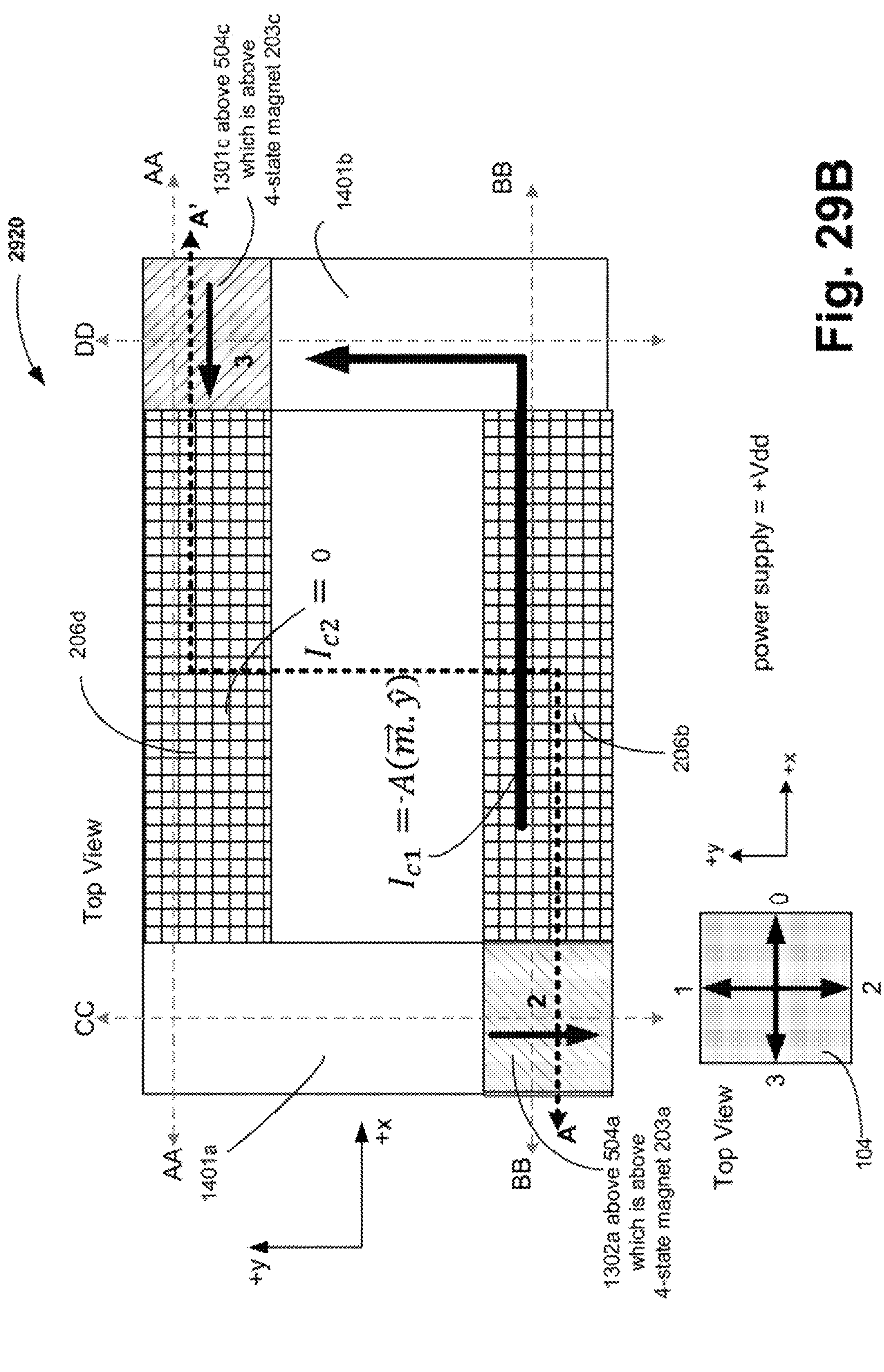
FIG. 29B illustrates a top view of section AA' of the quaternary ccw cyclic-1 SOCL device of FIG. 24 when the input 4-state magnet has magnetization direction ‘2’ and the output 4-state magnet has magnetization direction ‘0’, according to some embodiments of the disclosure.

FIG. 29B illustrates top view 2920 of section AA' of the quaternary ccw cyclic-1 SOCL device 2400 of FIG. 24 when the input 4-state magnet has magnetization direction '2' and the output 4-state magnet has magnetization direction '3', according to some embodiments of the disclosure. It is pointed out that those elements of FIG. 29B having the same reference numbers (or names) as the elements of any other figure can operate or function in any manner similar to that described, but are not limited to such.

As discussed with reference to FIG. 24, a conducting loop is formed from ISHE/ISOC 1302*a* to SHE/SOC 1301*c*. The loop is formed by interconnects 1401*a*, 206*d*, 1401*b*, and 206*b*, where the first ends of interconnects 206*b* and 1401*a* are coupled to ISHE/ISOC layer 1301*a*, where the second end of interconnect 206*b* is coupled to an end of interconnect 1401*b*, where one end of interconnect 206*d* is coupled to interconnect 1401*a* and another end of interconnect 206*d* is coupled to SHE/SOC layer 1301*c*.

When a positive power supply (+Vdd) is applied to power rail 201*a*, and the magnetization of the 4-state input magnet 203*a* is aligned in the −y direction, then no current flows through interconnect 206*d* (i.e., the 'x' current component is zero, $I_{c2}=0$) while the 'y' current component flows through interconnect 206*b* to ISHE/ISOC layer 1302*b*, where the 'y' current component in interconnect 206*d* is $I_{c1}=-A(\vec{m}\cdot\hat{y})$. The current component $I_{c1}$ is converted into spin current by SHE/SOC layer 1301*c*, and this spin current causes the magnetization of 4-state second magnet 203*c* to be aligned in the '3' direction (i.e., −x direction). FIGS. 30-33 illustrate magnetizations and current directions when 4-state SOCL device 2400 is configured as quaternary half complement logic gate. The power supply to metal layer 201*a* is a negative supply −Vdd.

Table 7a/b below shows the magnetization of the input and output magnets for the quaternary 1.5 complement logic gate and for the SOCL device when configured as a cw cyclic+2 gate. The logical function of half complement is obtained by cascading the cw cyclic+2 gate and the mirror y gate.

TABLE 7 a

| Input Magnet Orientation (i.e., 203a) | Output Magnet Orientation (i.e., 203c) | Function |
|---|---|---|
| +x (0) | +y (1) | half complement |
| +y (1) | −x (3) | half complement |
| −x (3) | −y (2) | half complement |
| −y (2) | +x (0) | half complement |

b

| Input Magnet Orientation (i.e., 203a) | Output Magnet Orientation (i.e., 203c) | Function |
|---|---|---|
| +x (0) | −y (2) | Cw cyclic + 2 |
| +y (1) | −x (3) | Cw cyclic + 2 |
| −x (3) | +y (1) | Cw cyclic + 2 |
| −y (2) | +x (0) | Cw cyclic + 2 |

Figure 30A:
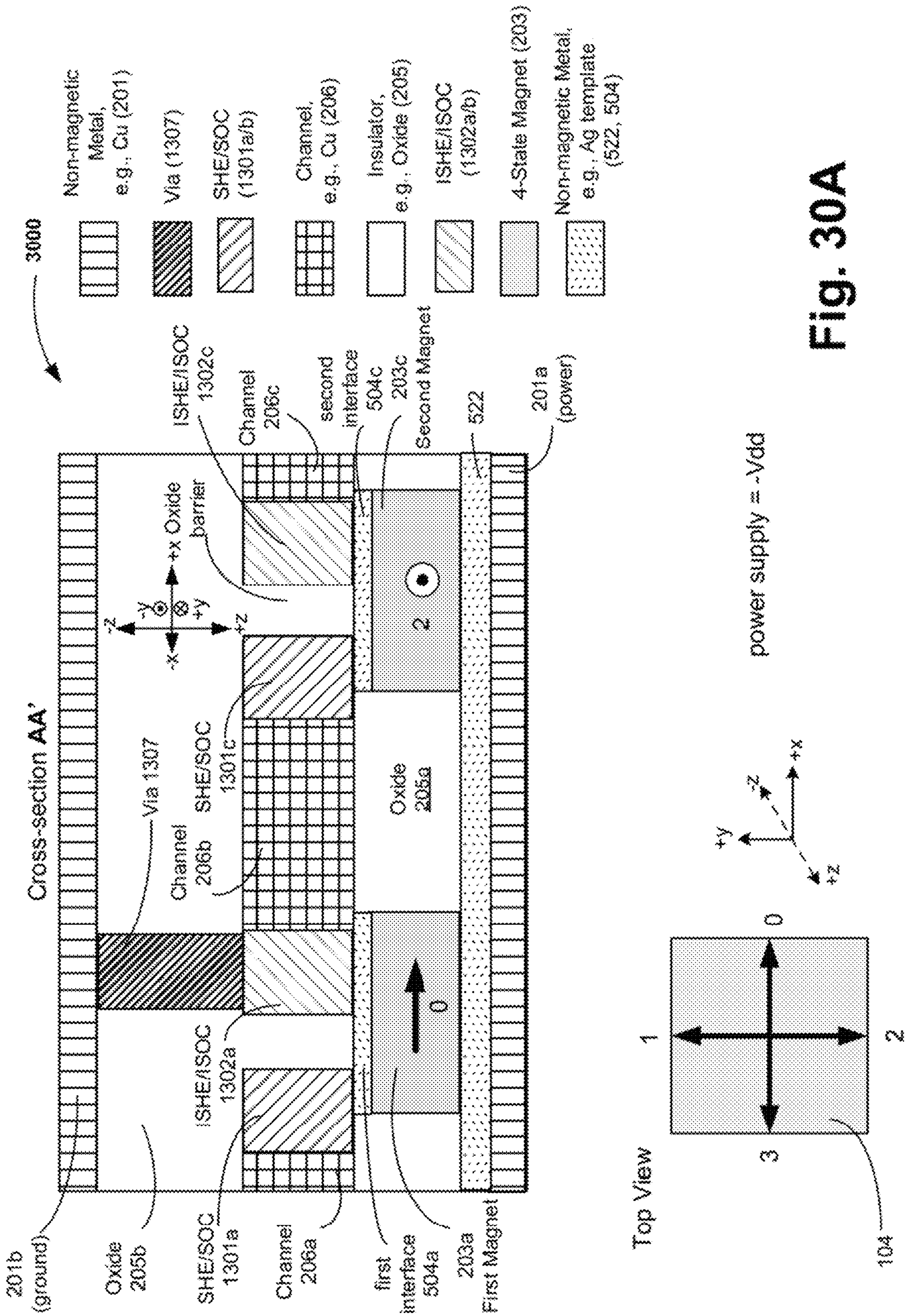
FIG. 30A illustrates a cross-sectional view of section AA' of a quaternary clockwise (cw) cyclic+2 SOCL device of FIG. 24 when the input 4-state magnet has magnetization direction ‘0’ and the output 4-state magnet has magnetization direction ‘2’, according to some embodiments of the disclosure.

FIG. 30A illustrates cross-sectional view 3000 of section AA' of a quaternary cw cyclic+2 SOCL device of FIG. 24 when the input 4-state magnet has magnetization direction '0' and the output 4-state magnet has magnetization direction '2', according to some embodiments of the disclosure. It is pointed out that those elements of FIG. 30A having the same reference numbers (or names) as the elements of any other figure can operate or function in any manner similar to that described, but are not limited to such.

When a negative power supply is applied to 201*a* (e.g., supply is set to −Vdd), the 4-state SOCL device 2400 is configured as a quaternary cw cyclic+2 logic gate, in accordance with some embodiments. In this case, the magnetization of First Magnet 203*a* is set to '0' direction (e.g., +x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In some embodiments, depending on the applied supply voltage and the magnetization of first 4-state magnet 203*a*, the charge current $I_c$ is provided to interconnect 206*b*, 1401*a*, 206*d*, and/or 1401*b*. For example, the current may be directed to second 4-state magnet 203*c* via interconnects 206*b* and 1401*b*, and/or via interconnects 1401*a* and 206*d*. In some embodiments, the charge current $I_c$ is converted by SHE/SOC layer 1301*c* by SOC or SHE to spin current in second 4-state magnet 203*c* such that the effective magnetic field on second 4-state magnet 203*c* aligns its magnetization to be orthogonal to the magnetization of first 4-state magnet 203*a*.

In this case, the magnetization of second 4-state magnet 203*c* is '2' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 30B:
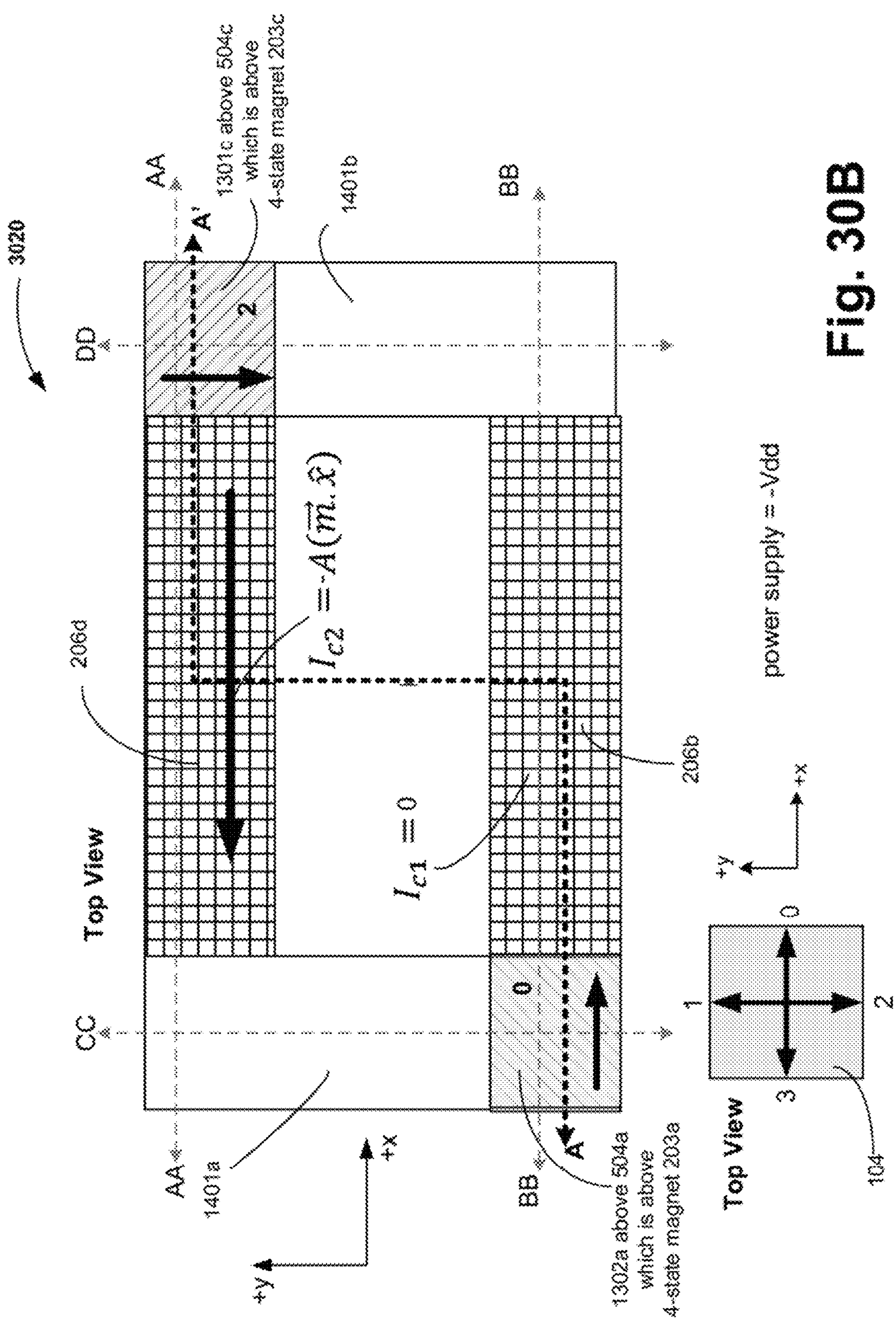
FIG. 30B illustrates a top view of section AA' of the quaternary cw cyclic+2 SOCL device of FIG. 24 when the input 4-state magnet has magnetization direction ‘0’ and the output 4-state magnet has magnetization direction ‘2’, according to some embodiments of the disclosure.

FIG. 30B illustrates top view 3020 of section AA' of the quaternary cw cyclic+2 SOCL device 2400 of FIG. 24 when the input 4-state magnet has magnetization direction '0' and the output 4-state magnet has magnetization direction '2', according to some embodiments of the disclosure. It is pointed out that those elements of FIG. 30B having the same reference numbers (or names) as the elements of any other figure can operate or function in any manner similar to that described, but are not limited to such.

As discussed with reference to FIG. 24, a conducting loop is formed from ISHE/ISOC 1302*a* to SHE/SOC 1301*c*. The loop is formed by interconnects 1401*a*, 206*d*, 1401*b*, and 206*b*, where the first ends of interconnects 206*b* and 1401*a* are coupled to ISHE/SOC layer 1302*a*, where the second end of interconnects 206*b* is coupled to an end of interconnect 1401*b*, where one end of interconnect 206*d* is coupled to interconnect 1401*a* and another end of interconnect 206*d* is coupled to SHE/SOC layer 1301*c*.

When a negative power supply (−Vdd) is applied to power rail 201*a*, and the magnetization of the 4-state input magnet 203*a* is aligned in the +x direction (i.e., direction '0'), then no current flows through interconnect 206*b* (i.e., the 'y' current component is zero, $I_{c1}=0$) while the 'x' current component flows through interconnect 206*d* to SHE/SOC layer 130'*c*, where the 'x' current component in interconnect 206*d* is $I_{c2}=-A(\vec{m}\cdot\hat{x})$. Here, the negative sign to current $I_{c2}$ indicates the sign of the current relative to $I_{c2}$ of FIG. 25. Referring back to FIG. 30B, the current component $I_{c2}$ is converted into spin current by SHE/SOC layer 1301*c*, and this spin current causes the magnetization of 4-state second magnet 203*c* to be aligned in the '2' direction (i.e., −y direction).

Figure 31A:
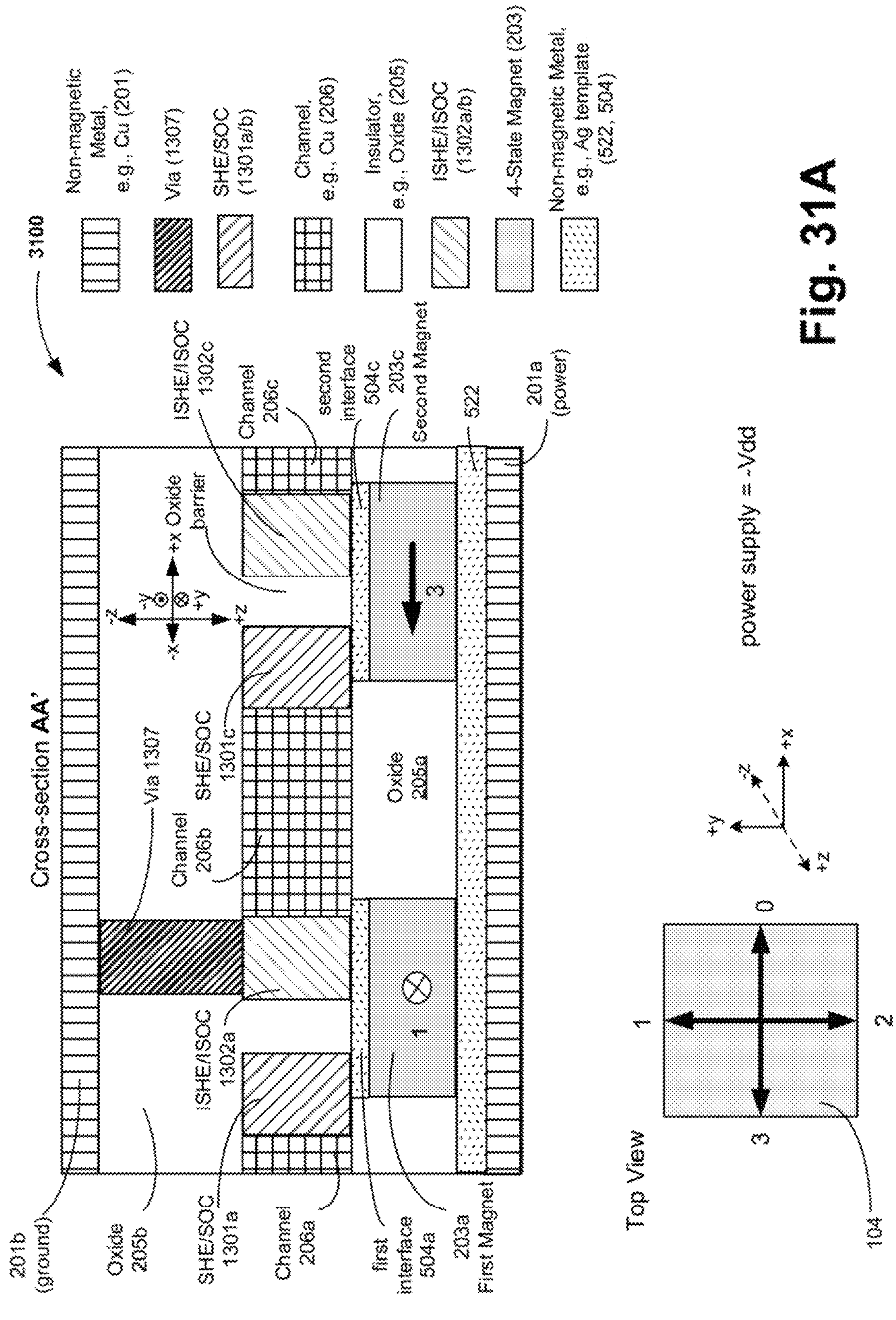
FIG. 31A illustrates a cross-sectional view of section AA' of a quaternary cw cyclic+2 SOCL device of FIG. 24 when the input 4-state magnet has magnetization direction ‘1’ and the output 4-state magnet has magnetization direction ‘0’, according to some embodiments of the disclosure.

FIG. 31A illustrates cross-sectional view 3100 of section AA' of a quaternary cw cyclic+2 SOCL device 2400 of FIG. 24 when the input 4-state magnet has magnetization direction '1' and the output 4-state magnet has magnetization direction '3', according to some embodiments of the disclosure. It is pointed out that those elements of FIG. 31A having the same reference numbers (or names) as the elements of any other figure can operate or function in any manner similar to that described, but are not limited to such.

When a negative power supply is applied to 201*a* (e.g., supply is set to −Vdd), the 4-state SOCL device 2400 is configured as a quaternary cw cyclic+2 logic gate, in accordance with some embodiments. In this case, the magnetization of First Magnet 203*a* is set to '1' direction (e.g., +y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In this case, the magnetization of second 4-state magnet 203*c* is '3' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 31B:
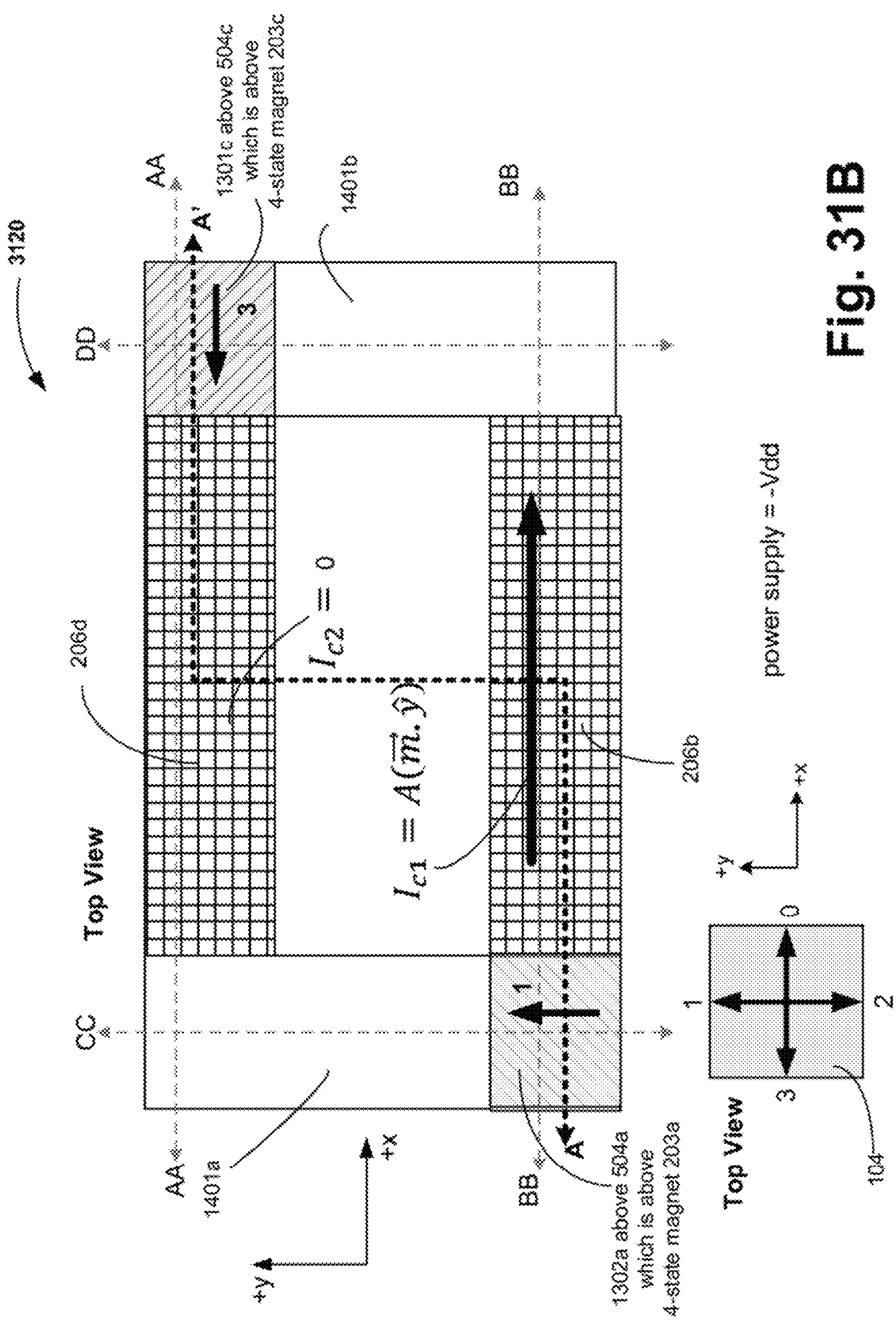
FIG. 31B illustrates a top view of section AA' of the quaternary cw cyclic+2 SOCL device of FIG. 24 when the input 4-state magnet has magnetization direction ‘1’ and the output 4-state magnet has magnetization direction ‘0’, according to some embodiments of the disclosure.

FIG. 31B illustrates top view 3120 of section AA' of the quaternary cw cyclic+2 SOCL device 2400 of FIG. 24 when the input 4-state magnet has magnetization direction '1' and the output 4-state magnet has magnetization direction '3', according to some embodiments of the disclosure. It is pointed out that those elements of FIG. 31B having the same reference numbers (or names) as the elements of any other figure can operate or function in any manner similar to that described, but are not limited to such.

When a negative power supply (−Vdd) is applied to power rail 201*a*, and the magnetization of the 4-state input magnet 203*a* is aligned in the +y direction (i.e., direction '1'), then no current flows through interconnect 206*d* (i.e., the 'x' current component is zero, $I_{c2}=0$) while the 'y' current component flows through interconnect 206*d* to SHE/SOC layer 1301*c*, where the 'y' current component in interconnect 206*b* is $I_{c1}=A(\vec{m}\cdot\hat{y})$. The current component $I_{c1}$ is converted into spin current by SHE/SOC layer 1301*c*, and this spin current causes the magnetization of 4-state second magnet 203*c* to be aligned in the '3' direction (i.e., −x direction).

Figure 32A:
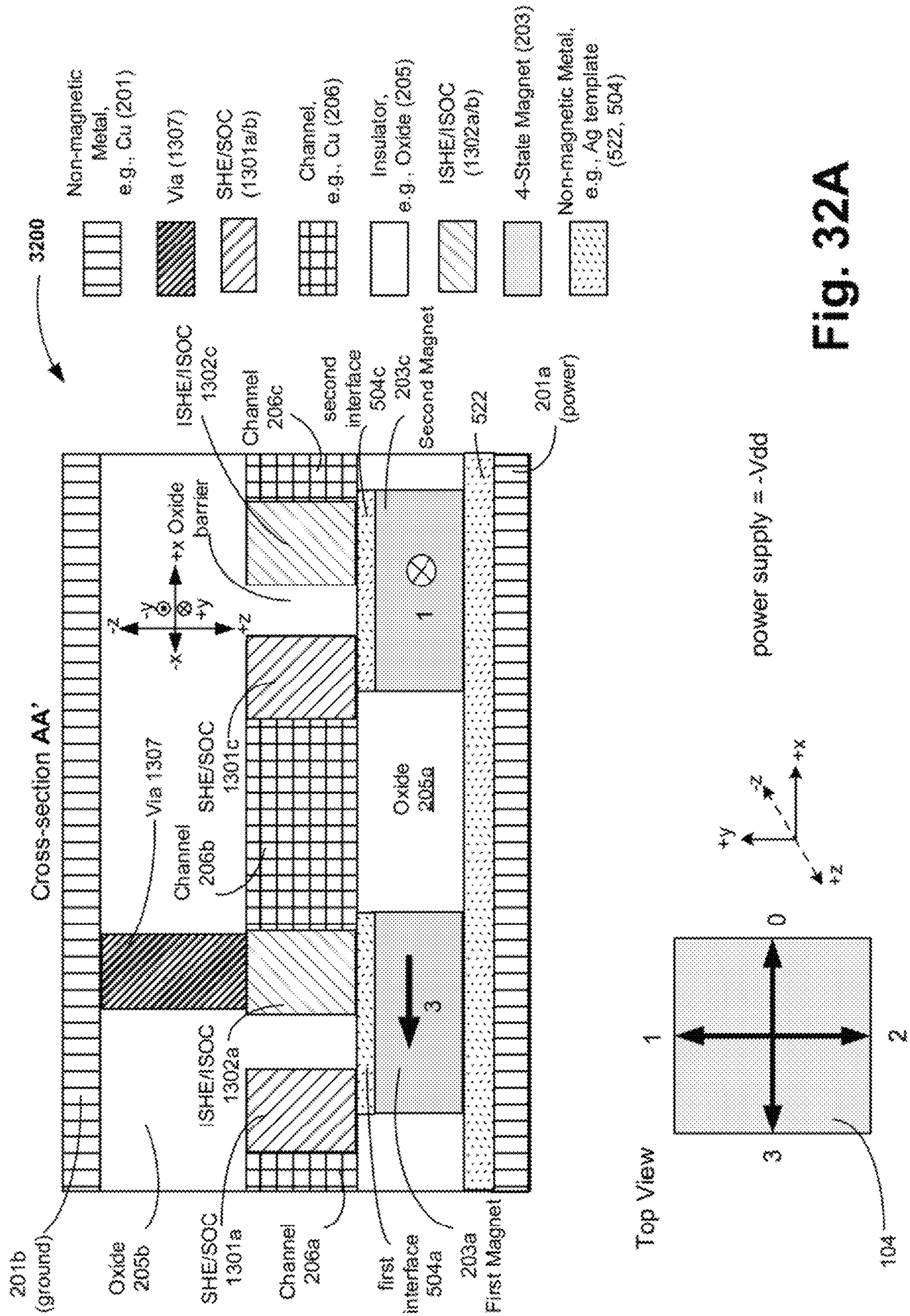
FIG. 32A illustrates a cross-sectional view of section AA' of a quaternary cw cyclic+2 SOCL device of FIG. 24 when the input 4-state magnet has magnetization direction ‘3’ and the output 4-state magnet has magnetization direction ‘1’, according to some embodiments of the disclosure.

FIG. 32A illustrates cross-sectional view 3200 of section AA' of a quaternary cw cyclic+2 SOCL device 2400 of FIG. 24 when the input 4-state magnet has magnetization direction '3' and the output 4-state magnet has magnetization direction '1', according to some embodiments of the disclosure. It is pointed out that those elements of FIG. 32A having the same reference numbers (or names) as the elements of any other figure can operate or function in any manner similar to that described, but are not limited to such.

When a negative power supply is applied to 201*a* (e.g., supply is set to –Vdd), the 4-state SOCL device is configured as a quaternary cw cyclic+2 logic gate, in accordance with some embodiments. In this case, the magnetization of First Magnet 203*a* is set to '3' direction (e.g., –x direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In this case, the magnetization of second 4-state magnet 203*c* is '1' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 32B:
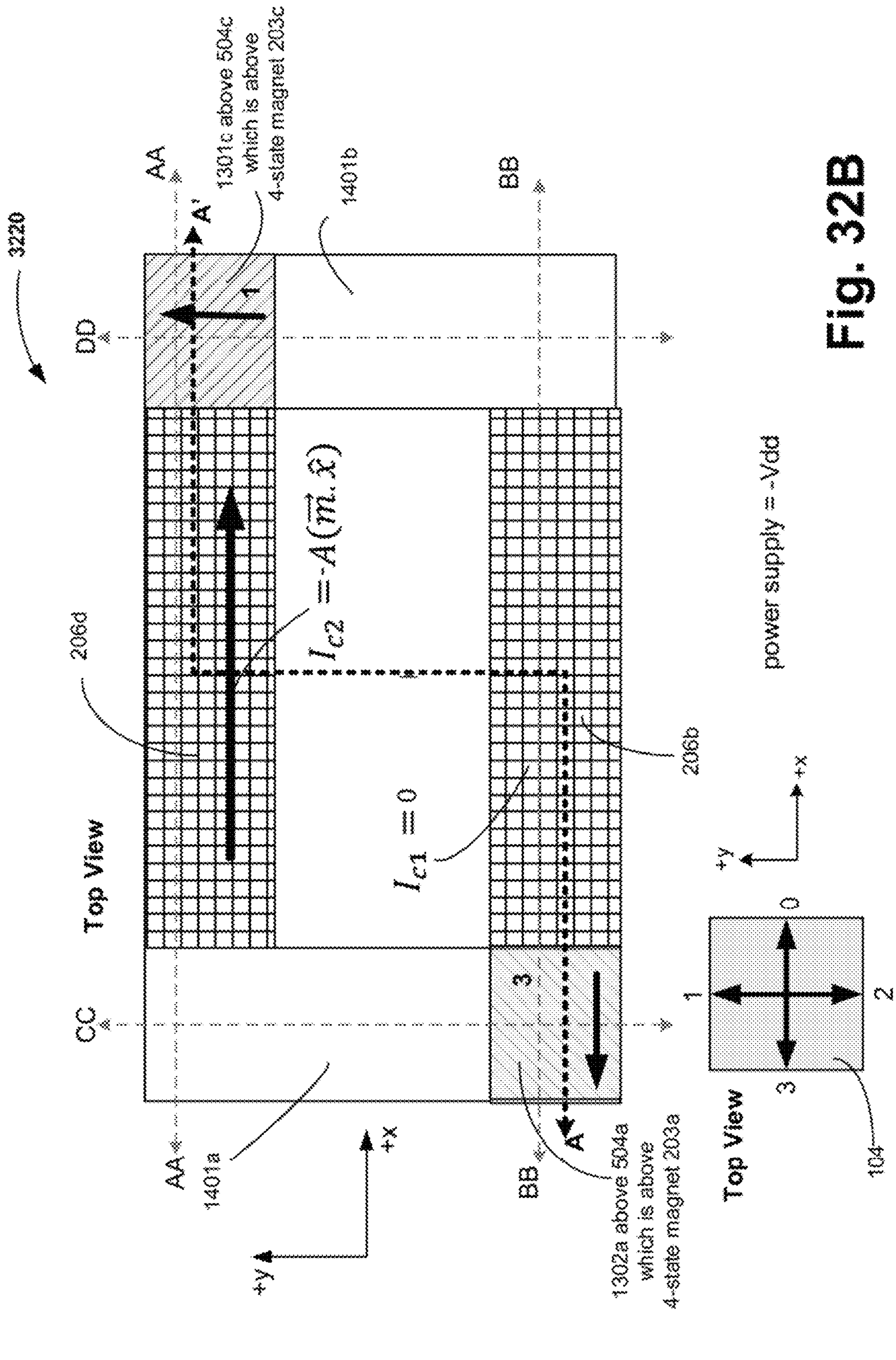
FIG. 32B illustrates a top view of section AA' of the quaternary cw cyclic+2 SOCL device of FIG. 24 when the input 4-state magnet has magnetization direction ‘3’ and the output 4-state magnet has magnetization direction ‘1’, according to some embodiments of the disclosure.

FIG. 32B illustrates top view 3220 of section AA' of the quaternary cw cyclic+2 SOCL device 2400 of FIG. 24 when the input 4-state magnet has magnetization direction '3' and the output 4-state magnet has magnetization direction '1', according to some embodiments of the disclosure. It is pointed out that those elements of FIG. 33B having the same reference numbers (or names) as the elements of any other figure can operate or function in any manner similar to that described, but are not limited to such.

When a negative power supply (–Vdd) is applied to power rail 201*a*, and the magnetization of the 4-state input magnet 203*a* is aligned in the –x direction (i.e., direction '3'), then no current flows through interconnect 206*b* (i.e., the 'y' current component is zero, $I_{c1}=0$) while the 'x' current component flows through interconnect 206*d* to SHE/SOC layer 1301*c*, where the 'x' current component in interconnect 206*d* is $I_{c2}=-A(\vec{m}\cdot\hat{x})$. The current component $I_{c2}$ is converted into spin current by SHE/SOC layer 1301*c*, and this spin current causes the magnetization of 4-state second magnet 203*c* to be aligned in the '1' direction (i.e., –y direction).

Figure 33A:
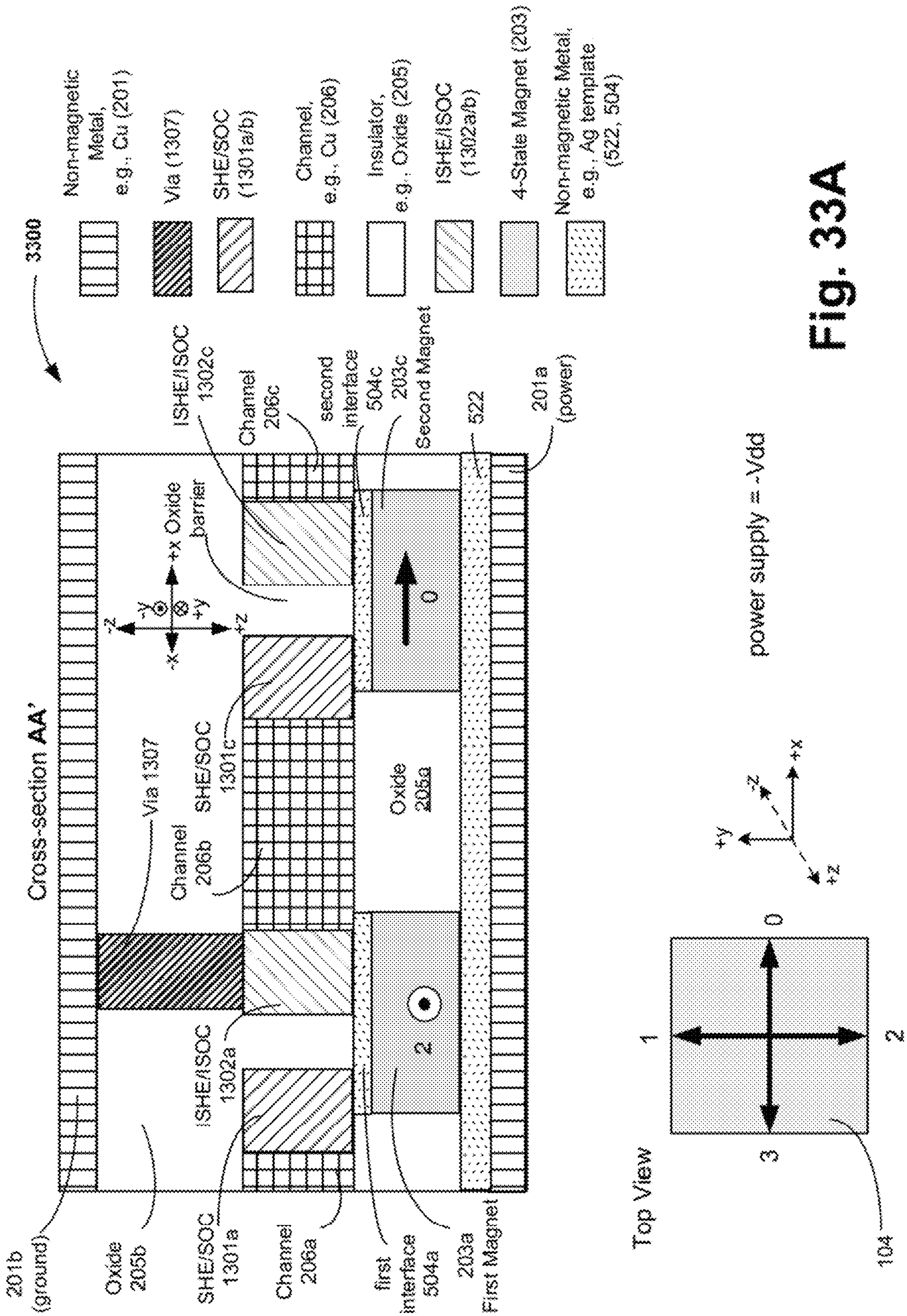
FIG. 33A illustrates a cross-sectional view of section AA' of a quaternary cw cyclic+2 SOCL device of FIG. 24 when the input 4-state magnet has magnetization direction ‘2’ and the output 4-state magnet has magnetization direction ‘3’, according to some embodiments of the disclosure.

FIG. 33A illustrates cross-sectional view 3300 of section AA' of a quaternary cw cyclic+2 SOCL device 2400 of FIG. 24 when the input 4-state magnet has magnetization direction '2' and the output 4-state magnet has magnetization direction '0', according to some embodiments of the disclosure. It is pointed out that those elements of FIG. 33A having the same reference numbers (or names) as the elements of any other figure can operate or function in any manner similar to that described, but are not limited to such. When a negative power supply is applied to 201*a* (e.g., supply is set to –Vdd), the 4-state SOCL device is configured as a quaternary cw cyclic+2 logic gate, in accordance with some embodiments. In this case, the magnetization of First Magnet 203*a* is set to '2' direction (e.g., –y direction) as shown. In some embodiments, input charge current $I_c$ in interconnect 206*a* is converted by SHE/SOC layer 1301*a* by SOC or SHE to spin current $I_s$ in first 4-state magnet 203*a*. The spin current $I_s$ is then received by ISHE/ISOC layer 1302*a* which converts the spin polarized current $I_s$ to corresponding charge current $I_c$, the sign of which is determined by the magnetization direction of first 4-state magnet 203*a*.

In this case, the magnetization of second 4-state magnet 203*c* is '0' (i.e., orthogonal to the magnetization of the first 4-state magnet 203*a*). As such, the direction of $I_c$ is determined by the magnetization of input 4-state magnet 203*a* and the applied voltage on power rail 201*a*. In some embodiments, the charge current from ISHE/ISOC layer 1302*c* is provided to interconnect (or channel) 206*c* and propagated to another device for further processing, in accordance with some embodiments.

Figure 33B:
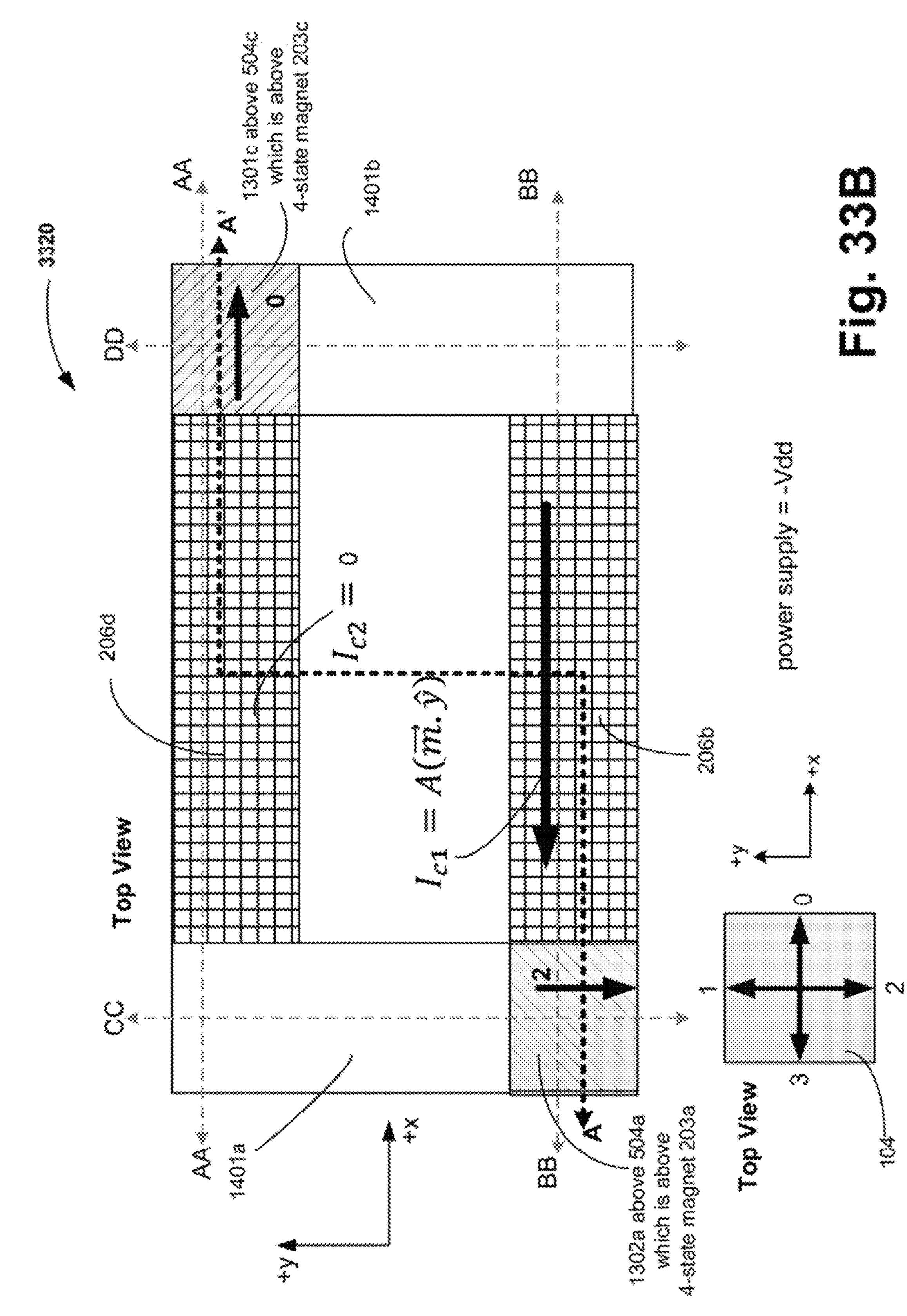
FIG. 33B illustrates a top view of section AA' of the quaternary cw cyclic+2 SOCL device of FIG. 24 when the input 4-state magnet has magnetization direction ‘2’ and the output 4-state magnet has magnetization direction ‘3’, according to some embodiments of the disclosure.

FIG. 33B illustrates top view 3320 of section AA' of the quaternary cw cyclic+2 SOCL device 2400 of FIG. 24 when the input 4-state magnet has magnetization direction '2' and the output 4-state magnet has magnetization direction '3', according to some embodiments of the disclosure. It is pointed out that those elements of FIG. 33B having the same reference numbers (or names) as the elements of any other figure can operate or function in any manner similar to that described, but are not limited to such.

When a negative power supply (–Vdd) is applied to power rail 201*a*, and the magnetization of the 4-state input magnet 203*a* is aligned in the –y direction (i.e., direction '2'), then no current flows through interconnect 206*d* (i.e., the 'x' current component is zero, $I_{c2}=0$) while the 'y' current component flows through interconnect 206*b* to SHE/SOC layer 1302*c*, where the 'y' current component in interconnect 206*d* is $I_{c1}=A(\vec{m}\cdot\hat{y})$. Here, the negative sign to current $I_{c1}$ indicates the sign of the current relative to $I_{c1}$ of FIG. 25. Referring back to FIG. 33B, the current component $I_{c1}$ is converted into spin current by SHE/SOC layer 1301*c*, and this spin current causes the magnetization of 4-state second magnet 203*c* to be aligned in the '0' direction (i.e., +x direction).

Quaternary Upper Threshold ASL Gate

Upper and lower threshold gates are required to form a complete logic family in GF04 algebra. These gates function as logic comparators setting the value of the output to upper or lower threshold values, in accordance with some embodiments.

In some embodiments, to form a logic family in quaternary logic the following logic gates are formed—min-gate, max-gate, and window literal gate. In some embodiments, the window literal gate further comprises upper threshold gates and lower threshold gates. Quaternary threshold gates are a set of four gates defined for detecting and/or resolving each threshold values (e.g., 0, 1, 2, and 3 for a 4-state magnet based logic gate), in accordance with some embodiments. In some embodiments, the Quaternary threshold gates are formed using an All Spin Logic (ASL) device which is based on ASL device 1100 of FIG. 11. A person skilled in the art would appreciate that an inverse (or up-side down) version of ASL device 1100, such as ASL device 200 can also form the basis of Quaternary threshold ASL gates.

Figure 34:
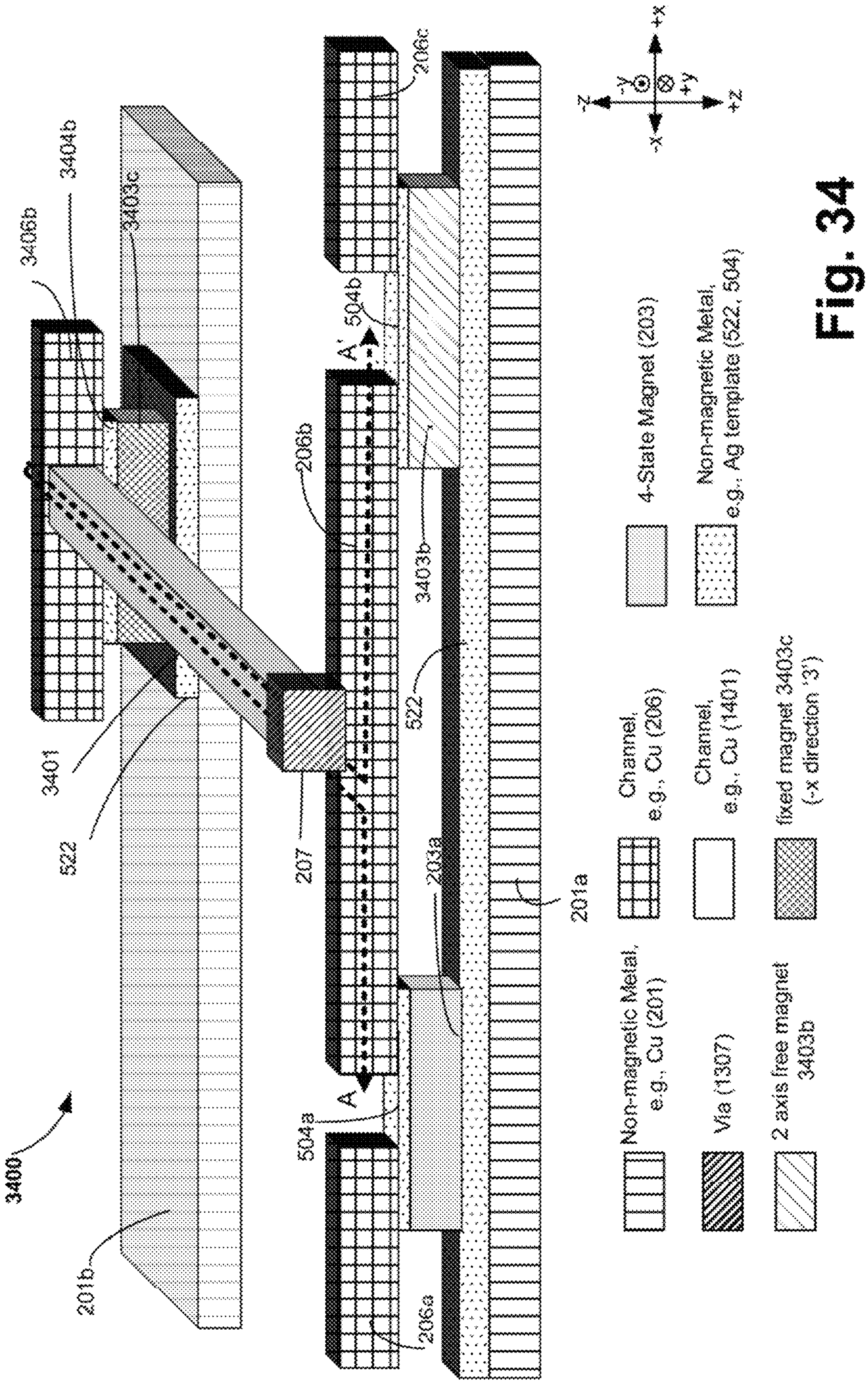
FIG. 34 illustrates a 3D view of the 4-state magnet based All Spin Logic (ASL) device which is configurable as quaternary upper threshold logic gate, in accordance with some embodiments of the disclosure.

FIG. 34 illustrates 3D view 3400 of the 4-state magnet based ASL gate which is configurable as quaternary upper threshold logic gate, in accordance with some embodiments of the disclosure. It is pointed out that those elements of FIG. 34 having the same reference numbers (or names) as the elements of any other figure can operate or function in any manner similar to that described, but are not limited to such. Compared to FIG. 11, via 207 is moved substantially to the middle of interconnect 206*b*, in accordance with some embodiments. In some embodiments, second 4-state magnet 203*b* is replaced with a biaxial free magnet 3403*b*. In some embodiments, free magnet 3403*b* can have two possible states (e.g., magnetization in the +x direction or magnetization in the –x direction). In some embodiments, 2-axis free magnet 3403*b* is formed of a material selected from a group consisting of: Fe, Ni, Co and their alloys, magnetic insulators, and Heusler alloys of the form $X_2YZ$.

In some embodiments, interconnect 3401 is provided which is coupled to (or positioned adjacent to) via 207 such that interconnect 3401 is orthogonal to interconnect 206*b*. In some embodiments, interconnect 3401 is formed of the same material as interconnect 206*b*. In some embodiments, interconnect 3401 is formed of any non-magnetic conducting material. In some embodiments, one end of interconnect 3401 is coupled to via 207 while another end of interconnect 3401 is coupled to interconnect 3406*b*. In some embodiments, interconnect 3401 and interconnect 3406*b* are orthogonal to one another such that interconnect 3406*b* is parallel to interconnect 206*b*. In some embodiments, interconnect 3406*b* is formed of the same material as interconnect 206*b*.

In some embodiments, template layer 3404*b* is coupled to (or adjacent to) interconnect 3406*b*. Template layer 3404*b* is formed of the same material as template material 504*a* and has the same function as template layer 504*a* (e.g., to template third magnet 3403*c*). In some embodiments, third magnet 3403*c* is coupled to (or adjacent to) template layer 3404*b*. In some embodiments, third magnet 3403*c* is a fixed magnet (or pinned magnet).

In some embodiments, the magnetization of third magnet 3403*c* sets the threshold of quaternary upper threshold logic gate. As such, for each threshold logic gate, a unique magnetization is set for third magnet 3403*c*, in accordance with some embodiments. In some embodiments, another templating layer 522 is coupled to third magnet 3403*c*. In some embodiments, supply rail 201*b* is coupled to templating layer 522 (which is coupled to magnet 3403*c*). In some embodiments, ground supply is provided to interconnect 201*b* while power supply (positive or negative) is provided to interconnect 201*a*.

FIGS. 35-42 illustrate quaternary upper threshold logic gates (Gate 0, Gate 1, Gate 2, and Gate 3), according to some embodiments of the disclosure. FIGS. 35-38 refer to logic Gate 0. FIGS. 39-42 refer to logic Gate 1 which corresponds to cross-sections of ASL device 3400 along dotted line AA' with magnetizations corresponding to a particular threshold. For each quaternary upper threshold logic Gate 1, the magnetization of third magnet 3403*c* is fixed in the −x direction (i.e., magnetization state 3), in accordance with some embodiments. FIGS. 44-47 refer to logic Gate 2 which corresponds ASL device 4300 of FIG. 43. FIGS. 49-52 refer to logic Gate 3 which corresponds ASL device 4800 of FIG. 48.

Table 8 below shows the truth table of the of quaternary upper threshold logic gates (Gate 0, Gate 1, Gate 2, and Gate 3).

TABLE 8

| Type of Logic Gate | Input Magnet Orientation | Output Magnet Orientation |
|---|---|---|
| Gate 0 | +x (0) | −x (3) |
| | +y (1) | −x (3) |
| | −x (3) | −x (3) |
| | −y (2) | −x (3) |
| Gate 1 | +x (0) | +x (0) |
| | +y (1) | −x (3) |
| | −x (3) | −x (3) |
| | −y (2) | −x (3) |
| Gate 2 | +x (0) | +x (0) |
| | +y (1) | +x (0) |
| | −x (3) | −x (3) |
| | −y (2) | −x (3) |

TABLE 8-continued

| Type of Logic Gate | Input Magnet Orientation | Output Magnet Orientation |
|---|---|---|
| Gate 3 | +x (0) | +x (0) |
| | +y (1) | +x (0) |
| | −x (3) | +x (0) |
| | −y (2) | −x (3) |

FIGS. 35-38 illustrates quaternary upper threshold logic Gate 0, in accordance with some embodiments, according to some embodiments of the disclosure.

Figure 35:
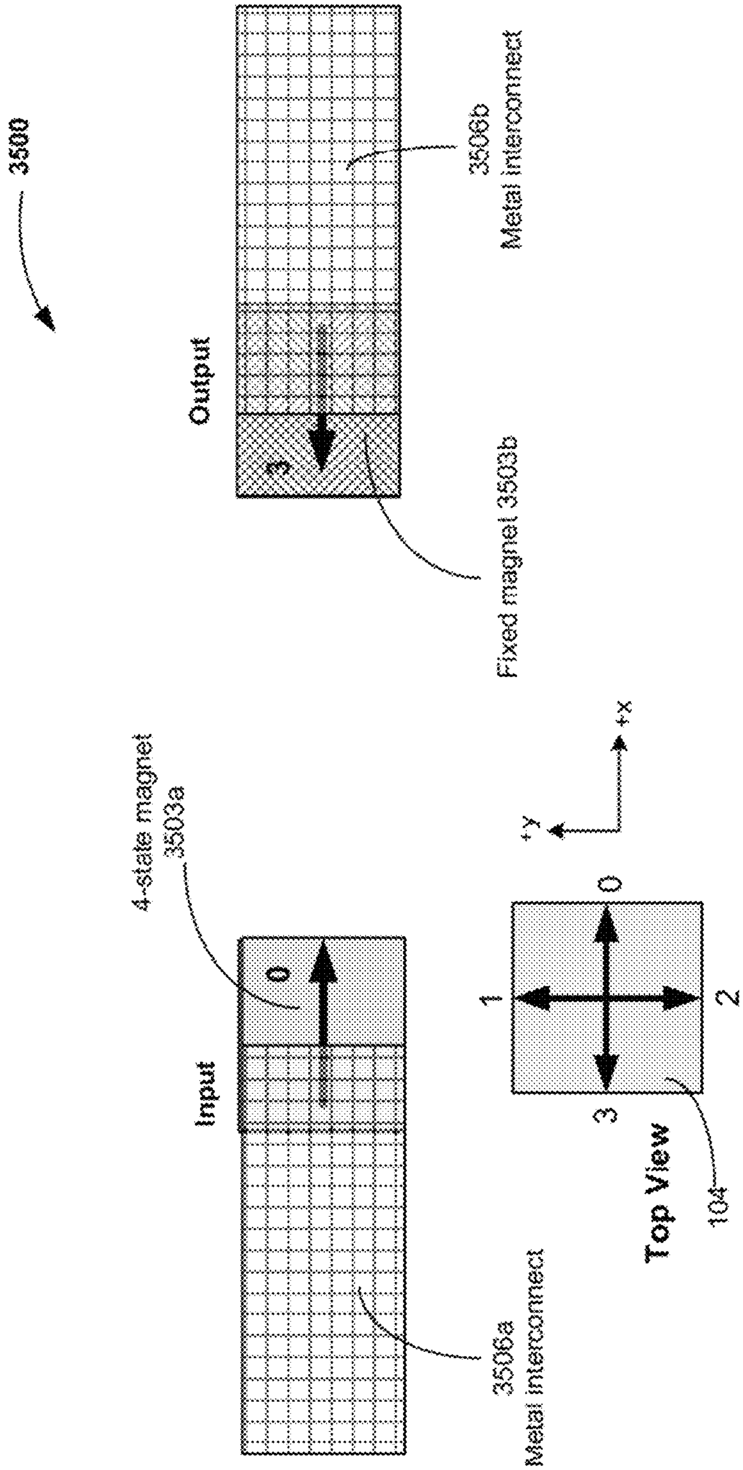
FIGS. 35-38 illustrate quaternary upper threshold logic Gate 0, in accordance with some embodiments, according to some embodiments of the disclosure.

FIG. 35 illustrates top view of ASL device 3500 with input 4-state magnet 3503*a* having orientation ‘0’ (i.e., +x direction) and fixed output magnet 3503*b* having orientation ‘3’ (i.e., −x direction), according to some embodiments of the disclosure. ASL device 3500 forms quaternary upper threshold logic Gate 0 of Table 8, according to some embodiments. In some embodiments, 4-state magnet 3503*a* is coupled to metal interconnect 3506*a*, which forms the input interconnect. In some embodiments, metal interconnect 3506*b* is coupled to fixed output magnet 3503*b*, which forms the output interconnect. The materials for metal interconnect 3506*a/b* are similar to materials for charge/spin interconnect 206*a/b/c*. ASL device 3500 has a fixed logic that always produces output magnet magnetized along direction ‘3’.

Figure 36:
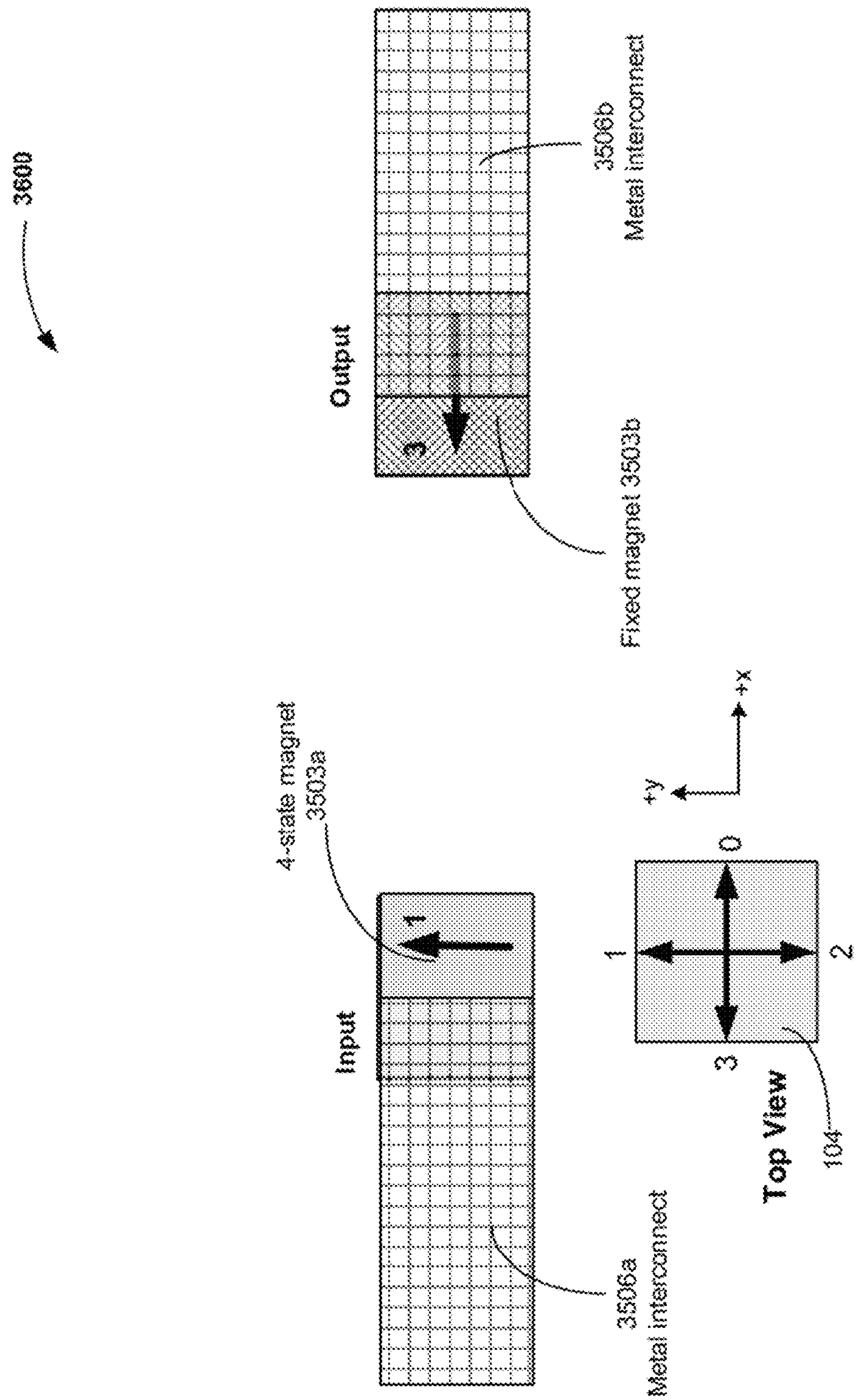

FIG. 36 illustrates top view of an ASL device 3600 with input 4-state magnet orientation ‘1’ (i.e., +y direction) and output 4-state magnet orientation ‘3’ (i.e., −x direction), according to some embodiments of the disclosure. It is pointed out that those elements of FIG. 36 having the same reference numbers (or names) as the elements of any other figure can operate or function in any manner similar to that described, but are not limited to such. ASL device 3600 forms quaternary upper threshold logic Gate 0 of Table 8, according to some embodiments. ASL device 3600 has a fixed logic that always produces output magnet magnetized along direction ‘3’ regardless of the magnetization of the input magnet 3503*a*.

Figure 37:
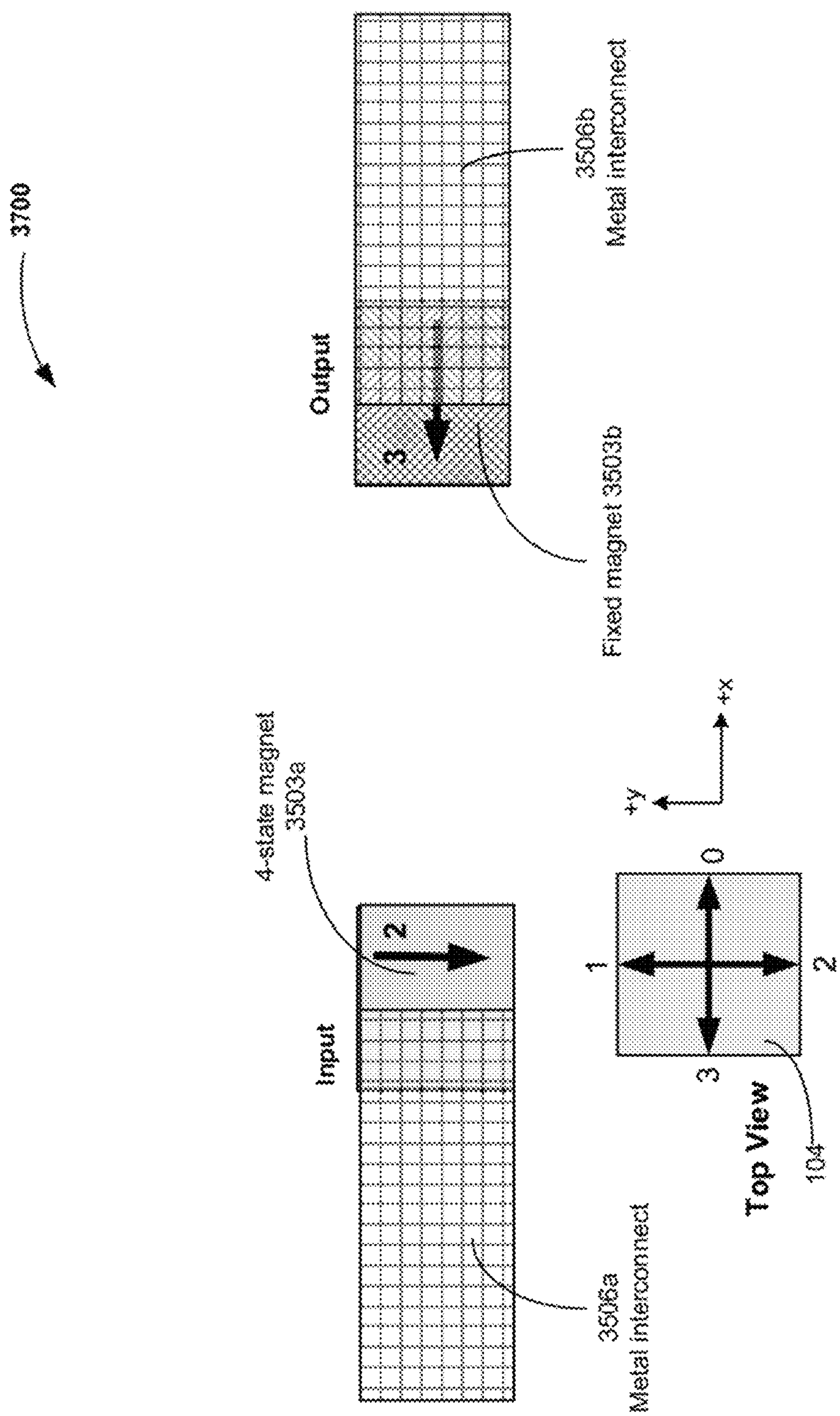

FIG. 37 illustrates top view of an ASL device 3700 with input 4-state magnet orientation ‘2’ (i.e., −y direction) and output 4-state magnet orientation ‘3’ (i.e., −x direction), according to some embodiments of the disclosure. It is pointed out that those elements of FIG. 37 having the same reference numbers (or names) as the elements of any other figure can operate or function in any manner similar to that described, but are not limited to such. ASL device 3700 forms quaternary upper threshold logic Gate 0 of Table 8, according to some embodiments. ASL device 3700 has a fixed logic that always produces output magnet magnetized along direction ‘3’ regardless of the magnetization of the input magnet 3503*a*.

Figure 38:
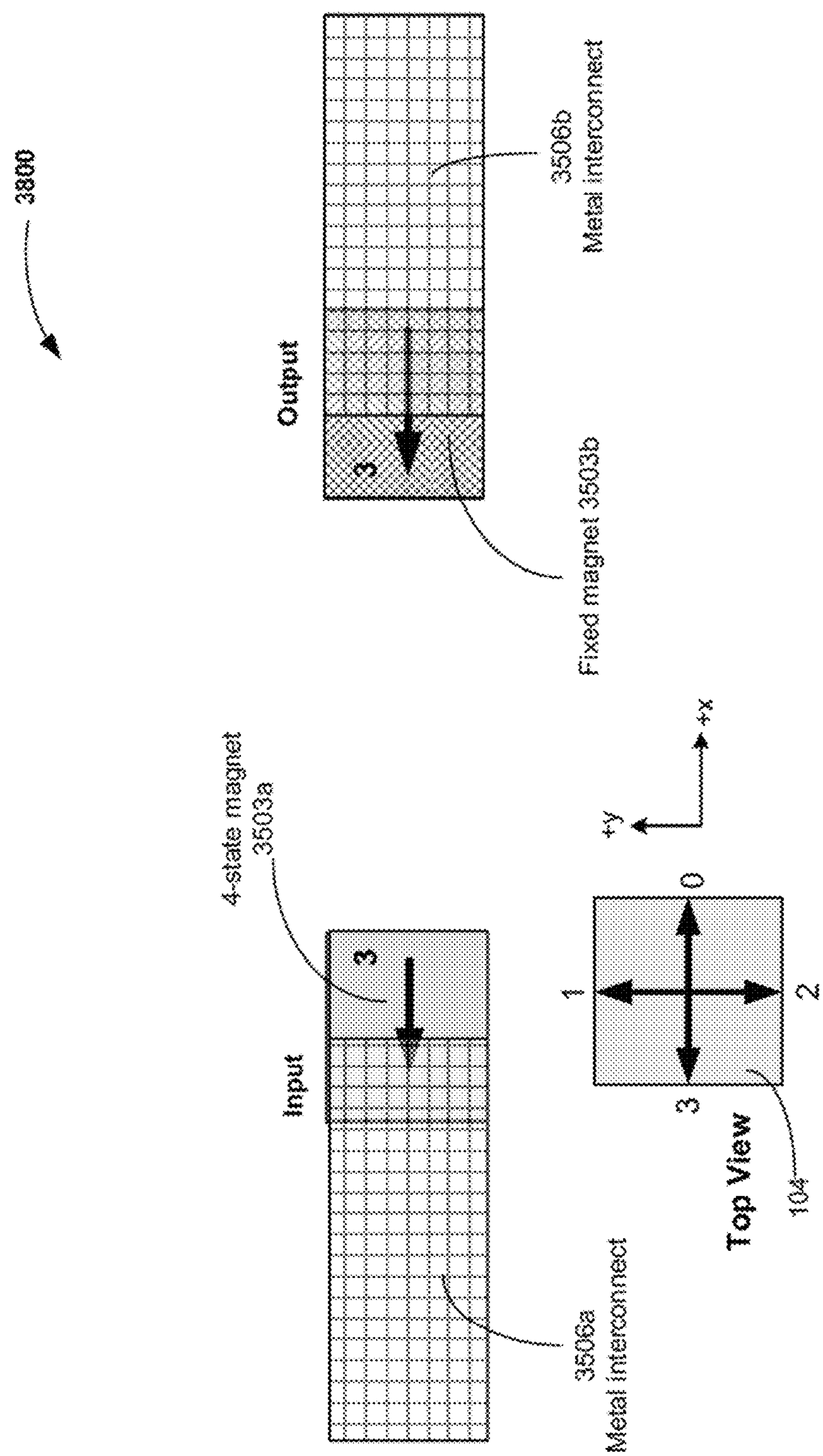

FIG. 38 illustrates top view of an ASL device 3800 with input 4-state magnet orientation ‘3’ (i.e., −x direction) and output 4-state magnet orientation ‘3’ (i.e., −x direction), according to some embodiments of the disclosure. It is pointed out that those elements of FIG. 38 having the same reference numbers (or names) as the elements of any other figure can operate or function in any manner similar to that described, but are not limited to such. ASL device 3800 forms quaternary upper threshold logic Gate 0 of Table 8, according to some embodiments. ASL device 3800 has a fixed logic that always produces output magnet magnetized along direction ‘3’ regardless of the magnetization of the input magnet 3503*a*.

FIGS. 39-42 illustrate quaternary upper threshold logic Gate 1 which corresponds to cross-sections of ASL device 3400 of FIG. 34 along dotted line AA' with magnetizations corresponding to a particular threshold, according to some embodiments of the disclosure. It is pointed out that those elements of FIGS. 39-42 having the same reference numbers (or names) as the elements of any other figure can operate or function in any manner similar to that described, but are not limited to such. For FIGS. 39-42, interconnect or metal 201*a* and interconnect 201*b* are tied to a negative supply (e.g., −Vdd). Similar to an ASL gate, here ground is located under the channel 206*b*.

Figure 39:
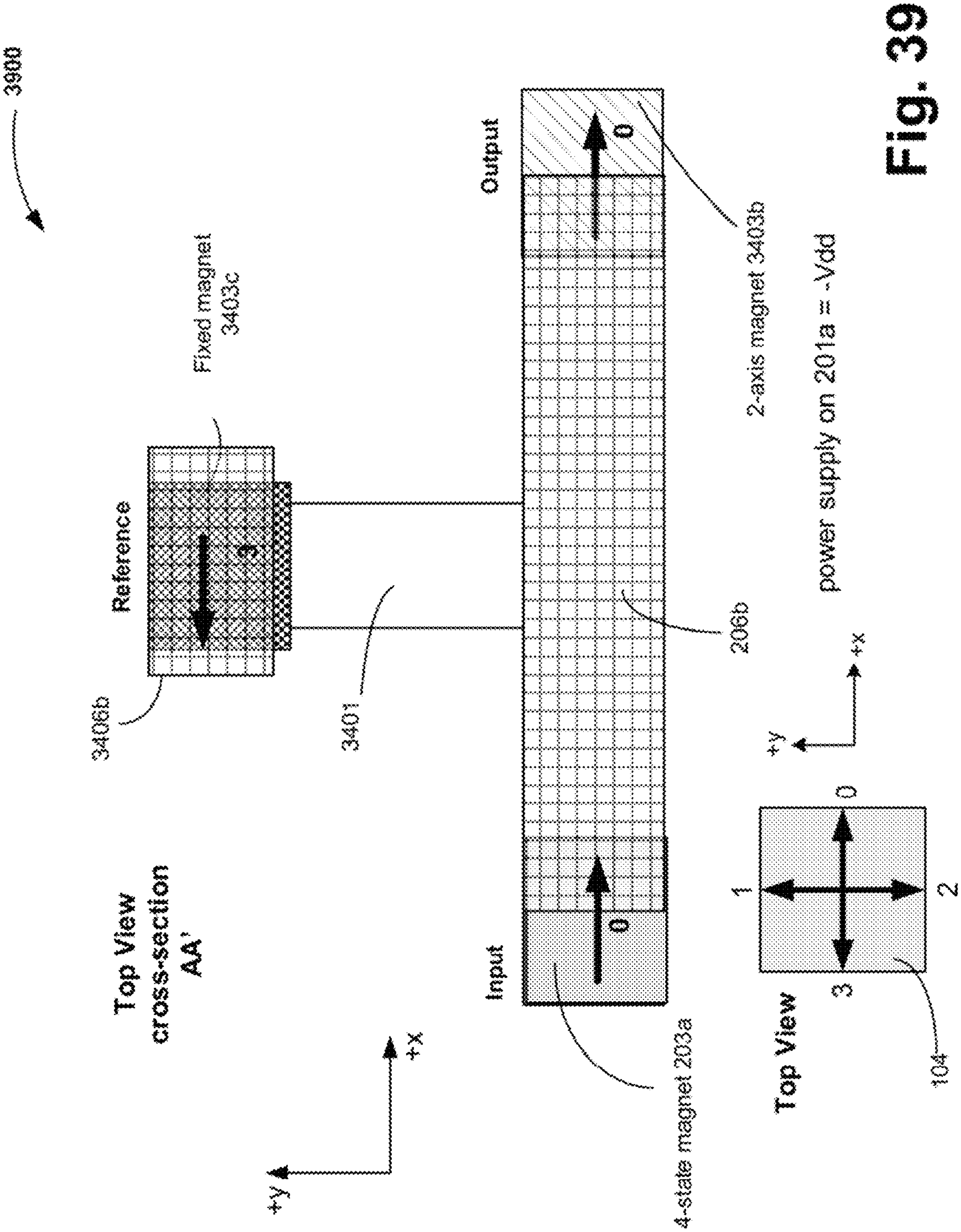
FIGS. 39-42 illustrate quaternary upper threshold logic Gate 1 which corresponds to cross-sections of ASL device of FIG. 34 along AA' with magnetizations corresponding to a particular threshold, according to some embodiments of the disclosure.

FIG. 39 illustrates top view 3900 of cross-section AA' of the ASL device 3400 of FIG. 34 with input 4-state magnet orientation '0' (i.e., +x direction) and reference fixed magnet orientation '3' (i.e., −x direction), according to some embodiments of the disclosure. It is pointed out that those elements of FIG. 39 having the same reference numbers (or names) as the elements of any other figure can operate or function in any manner similar to that described, but are not limited to such.

ASL device 3900 forms quaternary upper threshold logic Gate 1 of Table 8, according to some embodiments. ASL device 3900 is a top-view of ASL device 3400 along the dotted line AA'. Here, the input magnet is 4-state magnet 203*a*, output magnet 3403*b* is a biaxial (2-state or bi-stable magnet), and reference magnet 3403*c* is a fixed magnet having a magnetization in the −x direction (or along state '3'). In some embodiments, when input spin current in the +x direction arrives at input 4-state magnet 203*a*, the magnetization of output magnet 3403*b* is along direction '0' (i.e., +x direction).

Figure 40:
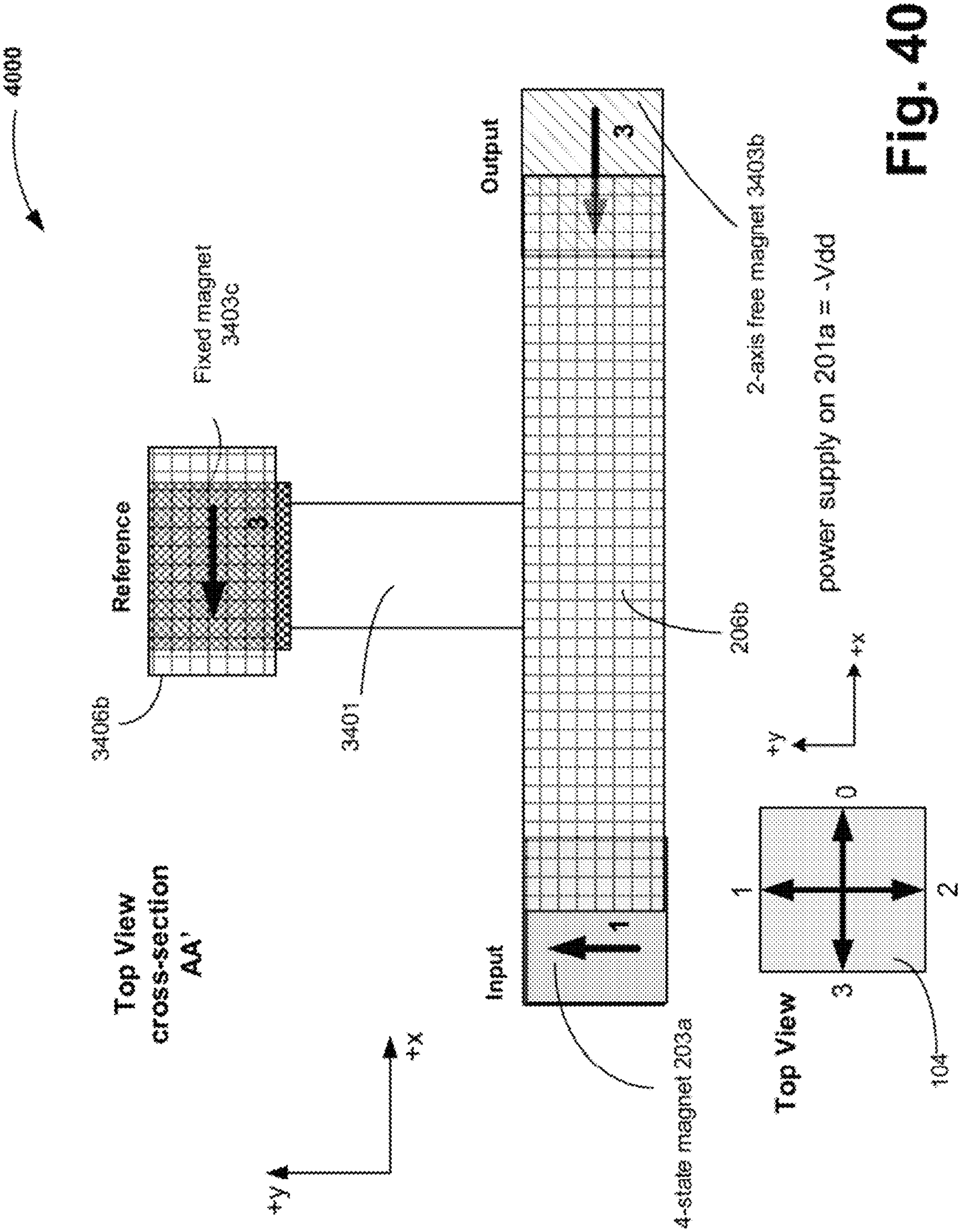

FIG. 40 illustrates top view 4000 of cross-section AA' of the ASL device of FIG. 34 with input 4-state magnet orientation '1' (i.e., +y direction) and reference fixed magnet orientation '3' (i.e., −x direction), according to some embodiments of the disclosure. It is pointed out that those elements of FIG. 40 having the same reference numbers (or names) as the elements of any other figure can operate or function in any manner similar to that described, but are not limited to such.

ASL device 4000 forms quaternary upper threshold logic Gate 1 of Table 8, according to some embodiments. ASL device 4000 is a top-view of ASL device 3400 along the dotted line AA'. Here, the input magnet is 4-state magnet 203*a* with magnetization along direction '1' (i.e., along +y axis), output magnet 3403*b* is a biaxial (2-state or bi-stable magnet), and reference magnet 3403*c* is a fixed magnet having a magnetization in the −x direction (or along direction '3'). In some embodiments, when input spin current in the −x direction arrives at input 4-state magnet 203*a*, the magnetization of output magnet 3403*b* is along direction '3' (i.e., −x direction).

In some embodiments, ASL device 4000 uses a fixed magnetic spin current input in the −x direction. This breaks the symmetry to enable the logic gate to generate the output. For ASL device 4000, output magnet 3403*b* is a bi-stable magnet with shape or crystalline anisotropy pointing only in one direction. In this case, the direction of magnetization of output magnet 3403*b* is in the direction '3' (i.e., −x direction) regardless of the input spin current direction received by input magnet 203*a* (which is magnetized in direction '1').

Figure 41:
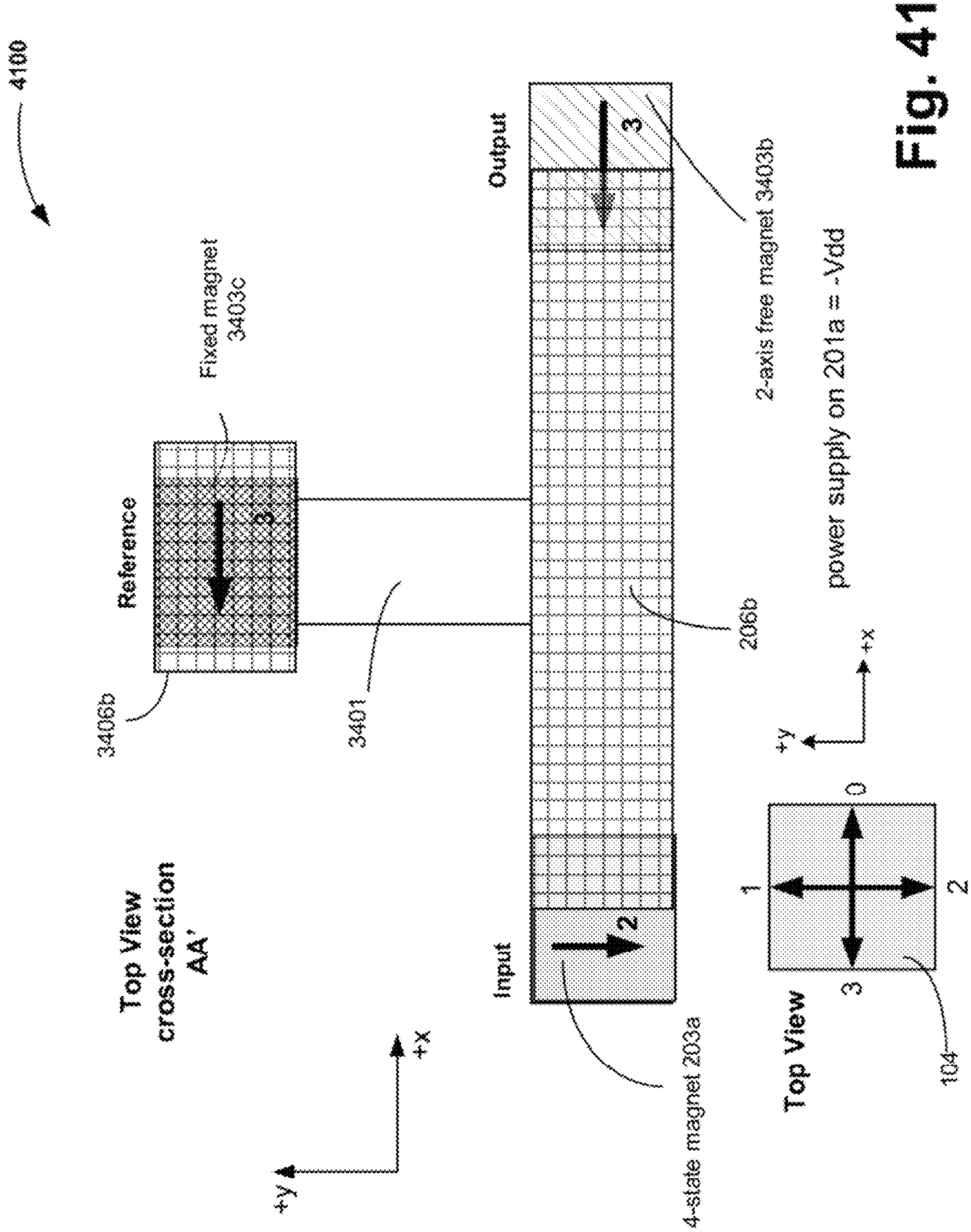

FIG. 41 illustrates top view 4100 of cross-section AA' of the ASL device 3400 of FIG. 34 with input 4-state magnet orientation '2' (i.e., −y direction) and reference fixed magnet orientation '3' (i.e., −x direction), according to some embodiments of the disclosure. It is pointed out that those elements of FIG. 41 having the same reference numbers (or names) as the elements of any other figure can operate or function in any manner similar to that described, but are not limited to such.

ASL device 4100 forms quaternary upper threshold logic Gate 1 of Table 8, according to some embodiments. ASL device 4100 is a top-view of ASL device 3400 along the dotted line AA'. Here, the input magnet is 4-state magnet 203*a* with magnetization along direction '2' (i.e., along −y axis), output magnet 3403*b* is a biaxial (2-state or bi-stable magnet), and reference magnet 3403*c* is a fixed magnet having a magnetization in the −x direction (or along direction '3'). In some embodiments, when input spin current arrives at input 4-state magnet 203*a*, the magnetization of output magnet 3403*b* is always along direction '3' (i.e., −x direction).

In some embodiments, ASL device 4100 uses a fixed magnetic spin current input in the −x direction. This breaks the symmetry to enable the logic gate to generate the output. For ASL device 4100, output magnet 3403*b* is a bi-stable magnet with shape or crystalline anisotropy pointing only in one direction. In this case, direction of magnetization of output magnet 3403*b* is in the direction '3' (i.e., −x direction) regardless of the input spin current direction received by input magnet 203*a* (which is magnetized in direction '2').

Figure 42:
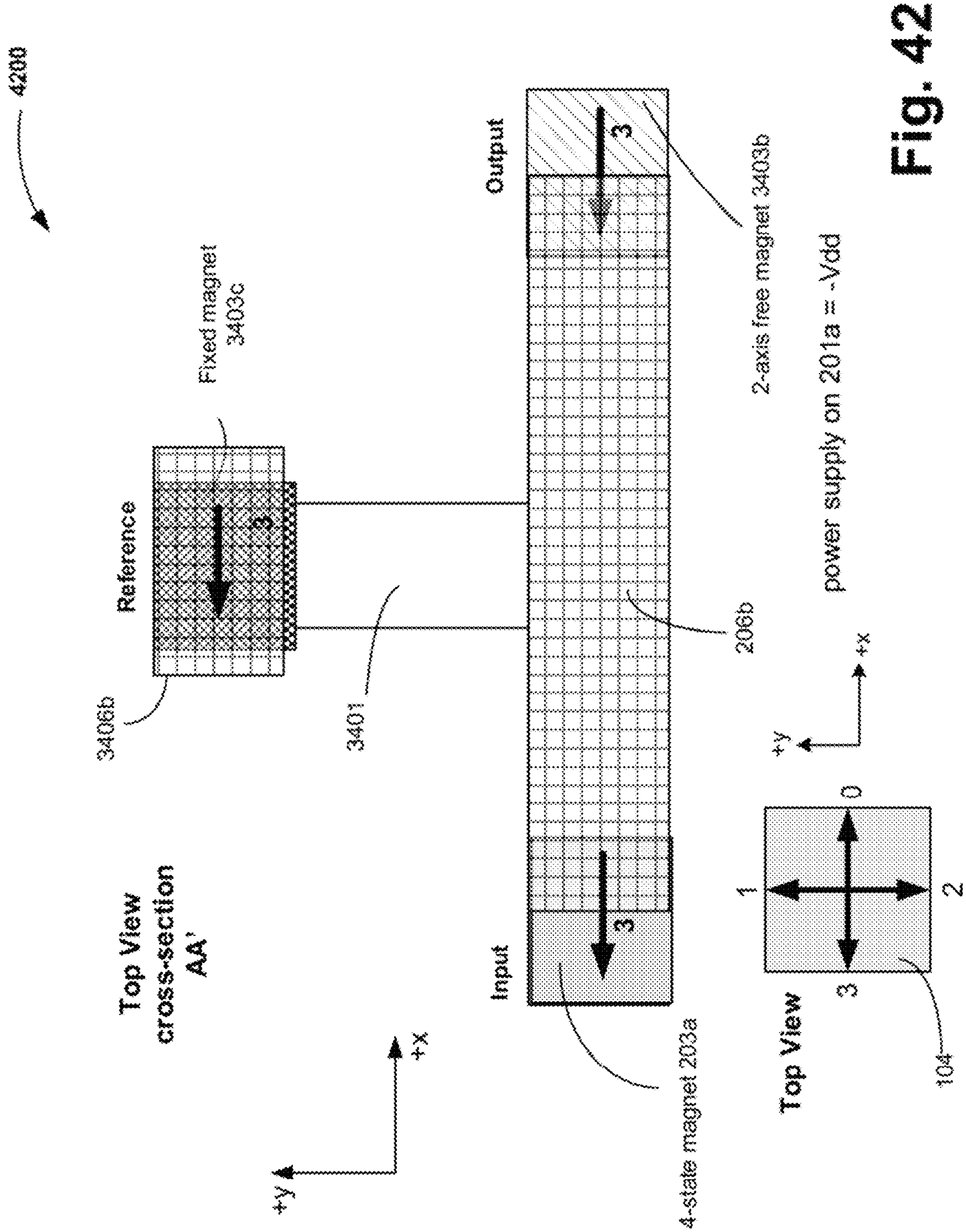

FIG. 42 illustrates top view 4200 of cross-section AA' of the ASL device 3400 of FIG. 34 with input 4-state magnet orientation '3' (i.e., −x direction) and reference fixed magnet orientation '3' (i.e., −x direction), according to some embodiments of the disclosure. It is pointed out that those elements of FIG. 42 having the same reference numbers (or names) as the elements of any other figure can operate or function in any manner similar to that described, but are not limited to such.

ASL device 4200 forms quaternary upper threshold logic Gate 1 of Table 8, according to some embodiments. ASL device 4200 is a top-view of ASL device 3400 along the dotted line AA'. Here, the input magnet is 4-state magnet 203*a* with magnetization along direction '3' (i.e., along −x axis), output magnet 3403*b* is a biaxial (2-state or bi-stable magnet), and reference magnet 3403*c* is a fixed magnet having a magnetization in the −x direction (or along direction '3'). In some embodiments, when input spin current arrives at input 4-state magnet 203*a*, the magnetization of output magnet 3403*b* is always along direction '3' (i.e., −x direction).

In some embodiments, ASL device 4200 uses a fixed magnetic spin current input in the −x direction. This breaks the symmetry to enable the logic gate to generate the output. For ASL device 4200, output magnet 3403*b* is a bi-stable magnet with shape or crystalline anisotropy pointing only in one direction. In this case, direction of magnetization of output magnet 3403*b* is in the direction '3' (i.e., −x direction) regardless of the input spin current direction received by input magnet 203*a* (which is magnetized in direction '3').

Figure 43:
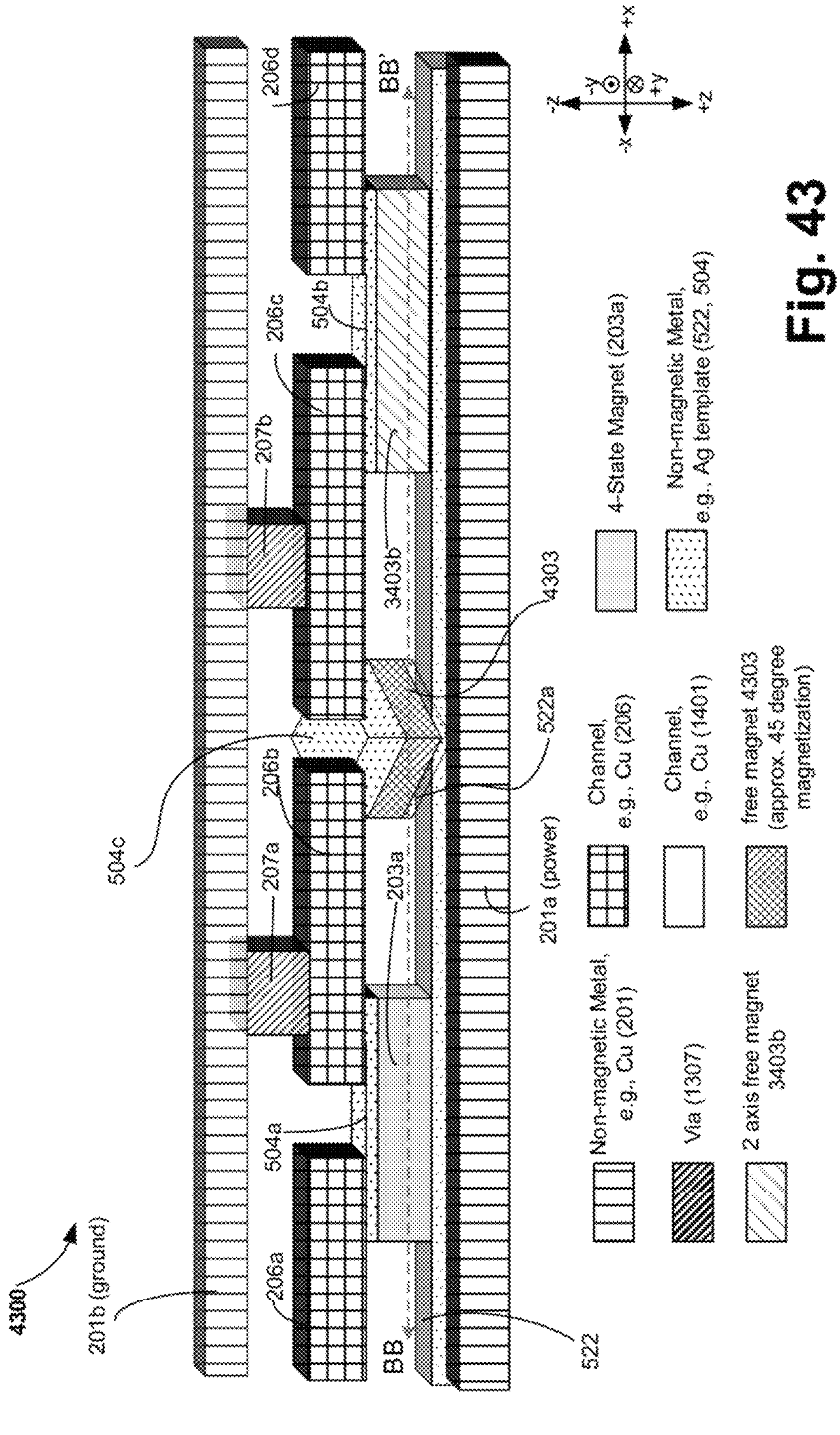
FIG. 43 illustrates a 3D view of quaternary upper threshold logic Gate 2, according to some embodiments of the disclosure.

FIG. 43 illustrates a 3D view of quaternary upper threshold ASL device 4300 which is Gate 2 of Table 8, according to some embodiments of the disclosure. It is pointed out that those elements of FIG. 43 having the same reference numbers (or names) as the elements of any other figure can operate or function in any manner similar to that described, but are not limited to such.

Compared to FIG. 34, via 207 and interconnect 206*b* is split as via 207*a/b* and interconnect 206*b/c*. In some embodiment, interconnect 206*b* couples input magnet 203*a* with a tilted magnet 4303 through corresponding interface layers 504*a* and 504*c*. In some embodiments, interconnect 206*c* couples tilted magnet 4303 with output magnet 3403*b* through corresponding interface layers 504*c* and 504*b*, respectively, such that there is a gap (e.g., filed with oxide) between interconnects 206*b* and 206*c*. In some embodiments, the output magnet 3403*b* is connectable to another device via interconnect 206*d*. In some embodiments, interconnect 201*b* couples to vias 207*a* and 207*b*. In some embodiments, interconnect 201*b* is coupled to ground. In some embodiments, interconnect 201*a* is coupled to a power supply (e.g., a negative power supply −Vdd or a positive power supply +Vdd, depending on the desired logic). In some embodiments, template layer 504*c* is formed of the same material as template material 504*a* and has the same function as template layer 504*a* (e.g., to template tilted magnet 4303). In some embodiments, template layer 522*a* is also adjacent to tilted magnet 4303 such that tilted magnet 4303 is templated from the bottom and top sides. In some embodiments, template layer 522*a* is same as template layer 522 but for being a tilted section of template layer 522.

In some embodiments, tilted magnet 4303 is tilted at 45° (or substantially at 45°) relative to input magnet 203*a* and output magnet 3403*b* to differentiate between the logic states (0,1) and (2,3). In some embodiments, tilted magnet 4303 forms an intermediate stage which uses a bi-stable magnet with uniaxial anisotropy or shape anisotropy. In some embodiments, tilted magnet 4303 is a 2-axis free magnet comprising a material selected from a group consisting of: Fe, Ni, Co and their alloys, magnetic insulators, and Heusler alloys of the form $X_2YZ$. In some embodiments, tilted magnet 4303 can have two possible states—one along the +45° (e.g., in the first quadrant of an xy plane) and another along the +45° (e.g., in the third quadrant of an xy plane). In some embodiments, the injected spin current from input magnet 203*a* switches the intermediate state magnet 4304 to x+y vector direction or −x-y vector direction which is then resolved to +/−x direction by output magnet 3403*b*.

FIGS. 44-47 illustrate quaternary upper threshold logic Gate 2 of Table 8 which corresponds cross-section BB-BB' through ASL device 4300 of FIG. 43. It is pointed out that those elements of FIGS. 44-47 having the same reference numbers (or names) as the elements of any other figure can operate or function in any manner similar to that described, but are not limited to such. For FIGS. 44-47, interconnect 201*a* is coupled to negative power supply (e.g., −Vdd).

Figure 44:
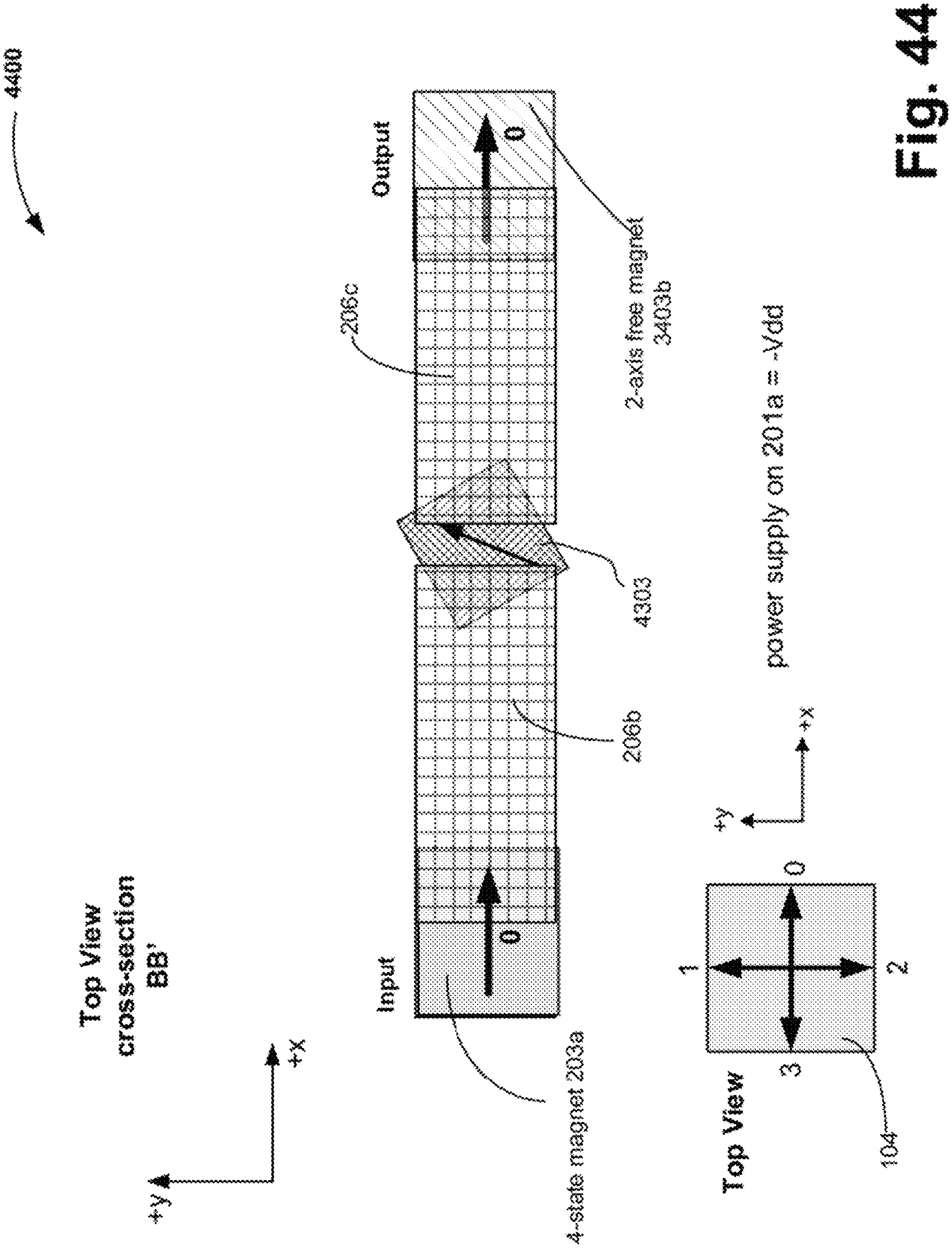
FIGS. 44-47 illustrate quaternary upper threshold logic Gate 2 which corresponds to ASL device of FIG. 43, according to some embodiments of the disclosure.

FIG. 44 illustrates top view 4400 of cross-section BB-BB' of ASL device 4300 of FIG. 43 with input 4-state magnet orientation ‘0’ (i.e., +x direction), according to some embodiments of the disclosure. It is pointed out that those elements of FIG. 44 having the same reference numbers (or names) as the elements of any other figure can operate or function in any manner similar to that described, but are not limited to such. In some embodiments, when spin current is injected into input 4-state magnet 203*a* with magnetization in direction ‘0’, tilted magnet 4303 develops a magnetization along the +45° as shown. As such, the spin current in interconnect 206*c* causes output magnet 3403*b* to develop magnetization along direction ‘0’.

Figure 45:
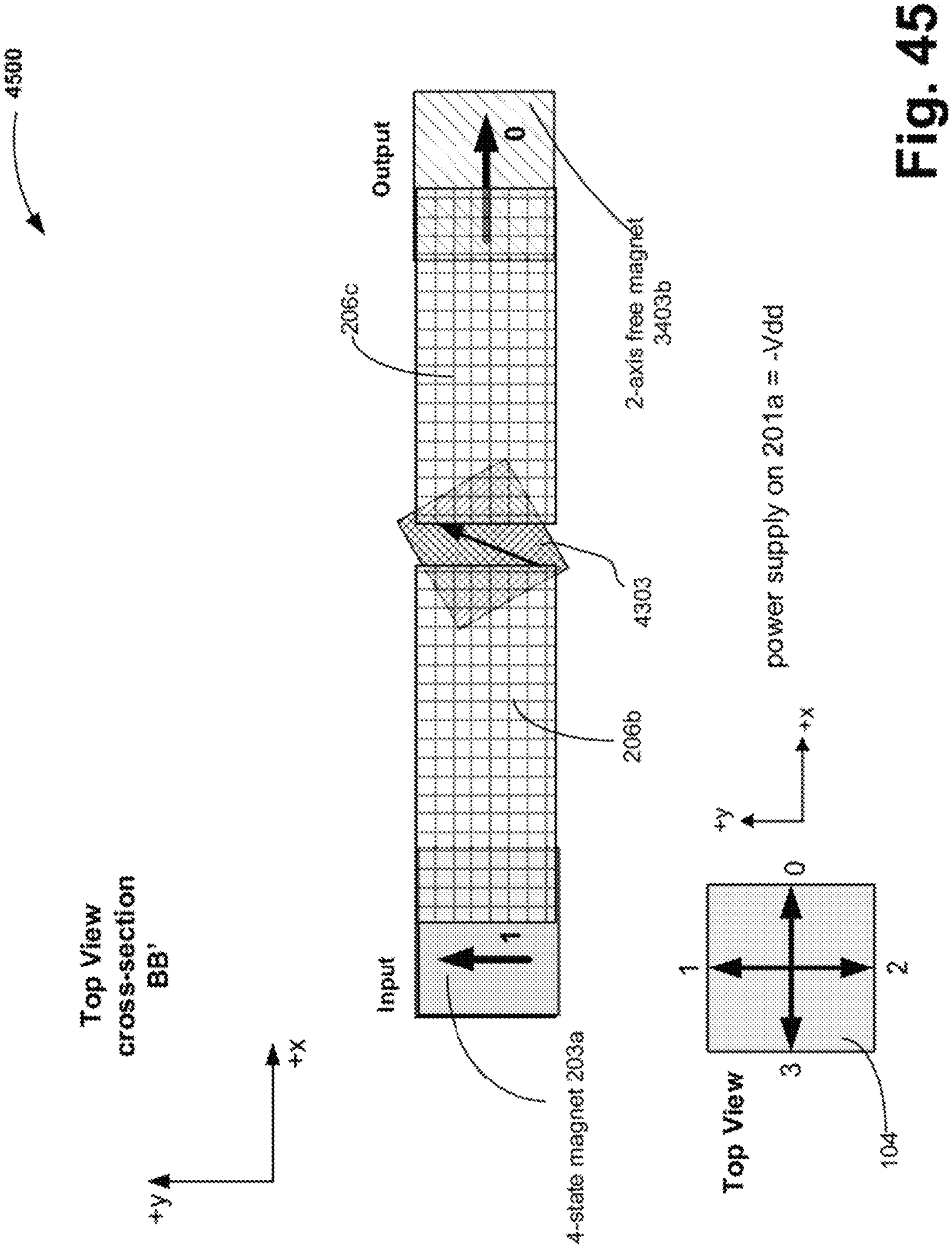

FIG. 45 illustrates top view 4500 of cross-section BB-BB' of ASL device 4300 of FIG. 43 with input 4-state magnet orientation ‘1’ (i.e., +y direction), according to some embodiments of the disclosure. It is pointed out that those elements of FIG. 45 having the same reference numbers (or names) as the elements of any other figure can operate or function in any manner similar to that described, but are not limited to such. In some embodiments, when spin current is injected into input 4-state magnet 203*a* with magnetization in direction ‘1’, tilted magnet 4303 develops a magnetization along the +45° as shown. As such, the spin current in interconnect 206*c* causes output magnet 3403*b* to develop magnetization along direction ‘0’.

Figure 46:
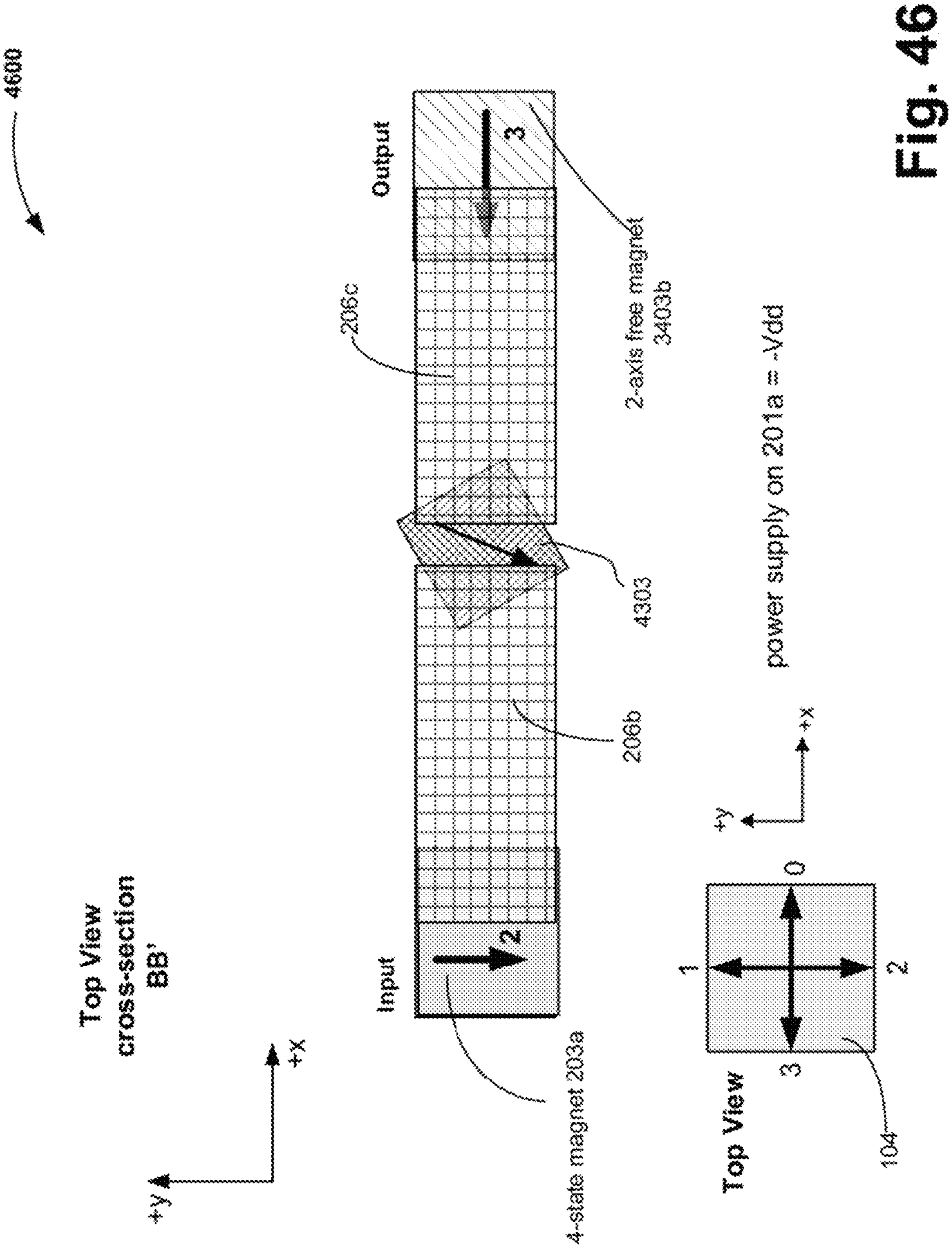

FIG. 46 illustrates top view 4600 of cross-section BB-BB' of ASL device 4300 of FIG. 43 with input 4-state magnet orientation ‘2’ (i.e., −y direction), according to some embodiments of the disclosure. It is pointed out that those elements of FIG. 46 having the same reference numbers (or names) as the elements of any other figure can operate or function in any manner similar to that described, but are not limited to such. In some embodiments, when spin current is injected into input 4-state magnet 203*a* with magnetization in direction ‘2’, tilted magnet 4303 develops a magnetization along the −45° as shown. As such, the spin current in interconnect 206*c* causes output magnet 3403*b* to develop magnetization along direction ‘3’.

Figure 47:
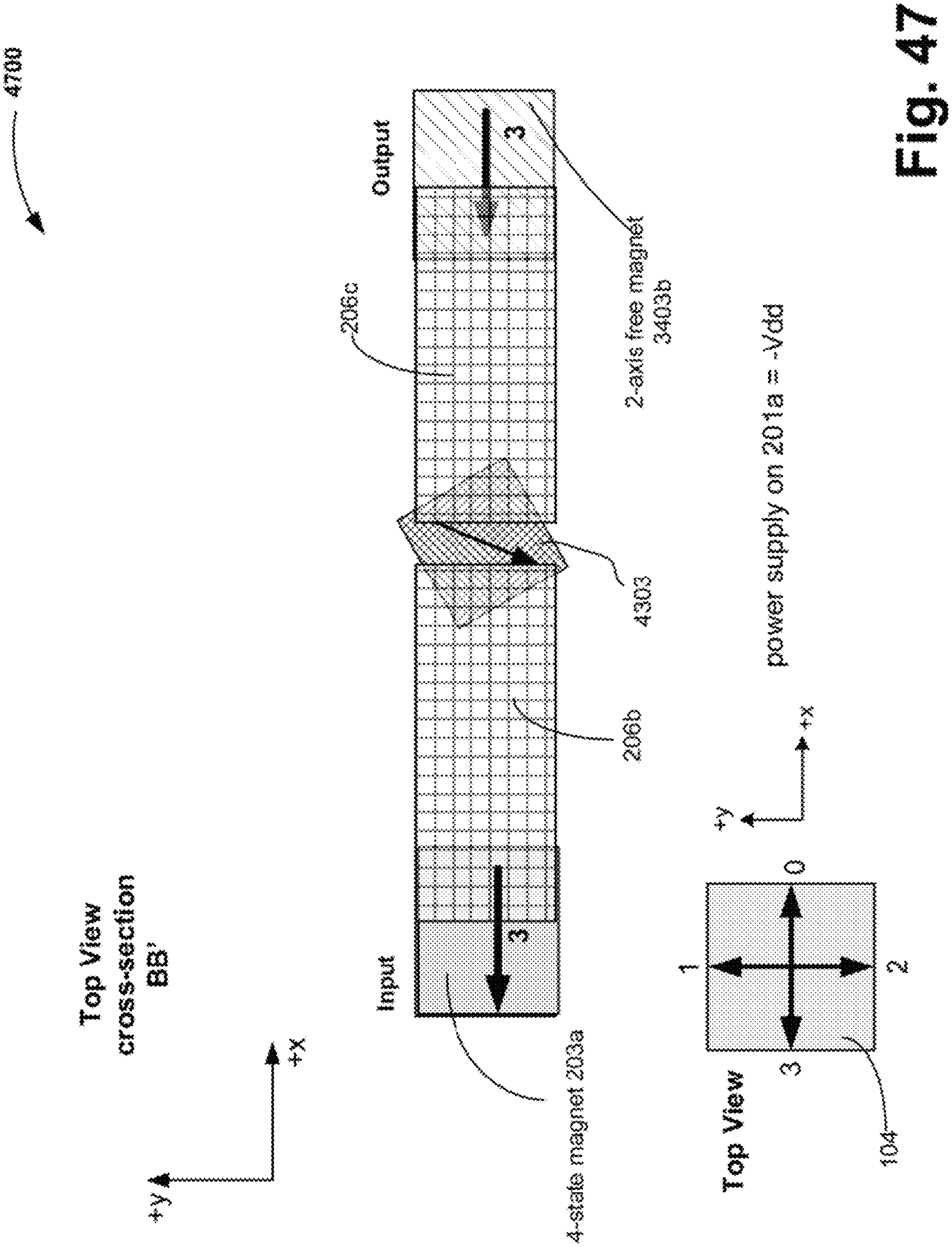

FIG. 47 illustrates top view 4700 of cross-section BB-BB' of ASL device 4300 of FIG. 43 with input 4-state magnet orientation ‘3’ (i.e., −x direction), according to some embodiments of the disclosure. It is pointed out that those elements of FIG. 47 having the same reference numbers (or names) as the elements of any other figure can operate or function in any manner similar to that described, but are not limited to such. In some embodiments, when spin current is injected into input 4-state magnet 203*a* with magnetization in direction ‘3’, tilted magnet 4303 develops a magnetization along the −45° as shown. As such, the spin current in interconnect 206*c* causes output magnet 3403*b* to develop magnetization along direction ‘3’.

While the embodiments of FIGS. 44-47 describe quaternary upper threshold gate 2 with interconnect 201*a* being coupled to a negative power supply (e.g., −Vdd), the same results for magnetization of output magnet 3403*b* are achieved when interconnect 201*a* is coupled to a positive power supply (e.g., +Vdd), in accordance with some embodiments.

In some embodiments, when interconnect 201*a* of device 4300 is coupled to a positive power supply and when spin current is injected into input 4-state magnet 203*a* with magnetization in direction ‘0’, tilted magnet 4303 develops a magnetization along the −45° (as opposed to +45° shown in FIG. 44). As such, the spin current in interconnect 206*c* causes output magnet 3403*b* to develop magnetization along direction ‘0’.

In some embodiments, when interconnect 201*a* of device 4300 is coupled to a positive power supply and when spin current is injected into input 4-state magnet 203*a* with magnetization in direction ‘1’, tilted magnet 4303 develops a magnetization along the −45° (as opposed to +45° shown in FIG. 45). As such, the spin current in interconnect 206*c* causes output magnet 3403*b* to develop magnetization along direction ‘0’.

In some embodiments, when interconnect 201*a* of device 4300 is coupled to a positive power supply and when spin current is injected into input 4-state magnet 203*a* with magnetization in direction ‘2’, tilted magnet 4303 develops a magnetization along the +45° (as opposed to −45° shown in FIG. 46). As such, the spin current in interconnect 206*c* causes output magnet 3403*b* to develop magnetization along direction ‘3’.

In some embodiments, when interconnect 201*a* of device 4300 is coupled to a positive power supply and when spin current is injected into input 4-state magnet 203*a* with magnetization in direction ‘3’, tilted magnet 4303 develops a magnetization along the +45° (as opposed to −45° shown in FIG. 47). As such, the spin current in interconnect 206*c* causes output magnet 3403*b* to develop magnetization along direction '3'.

Figure 48:
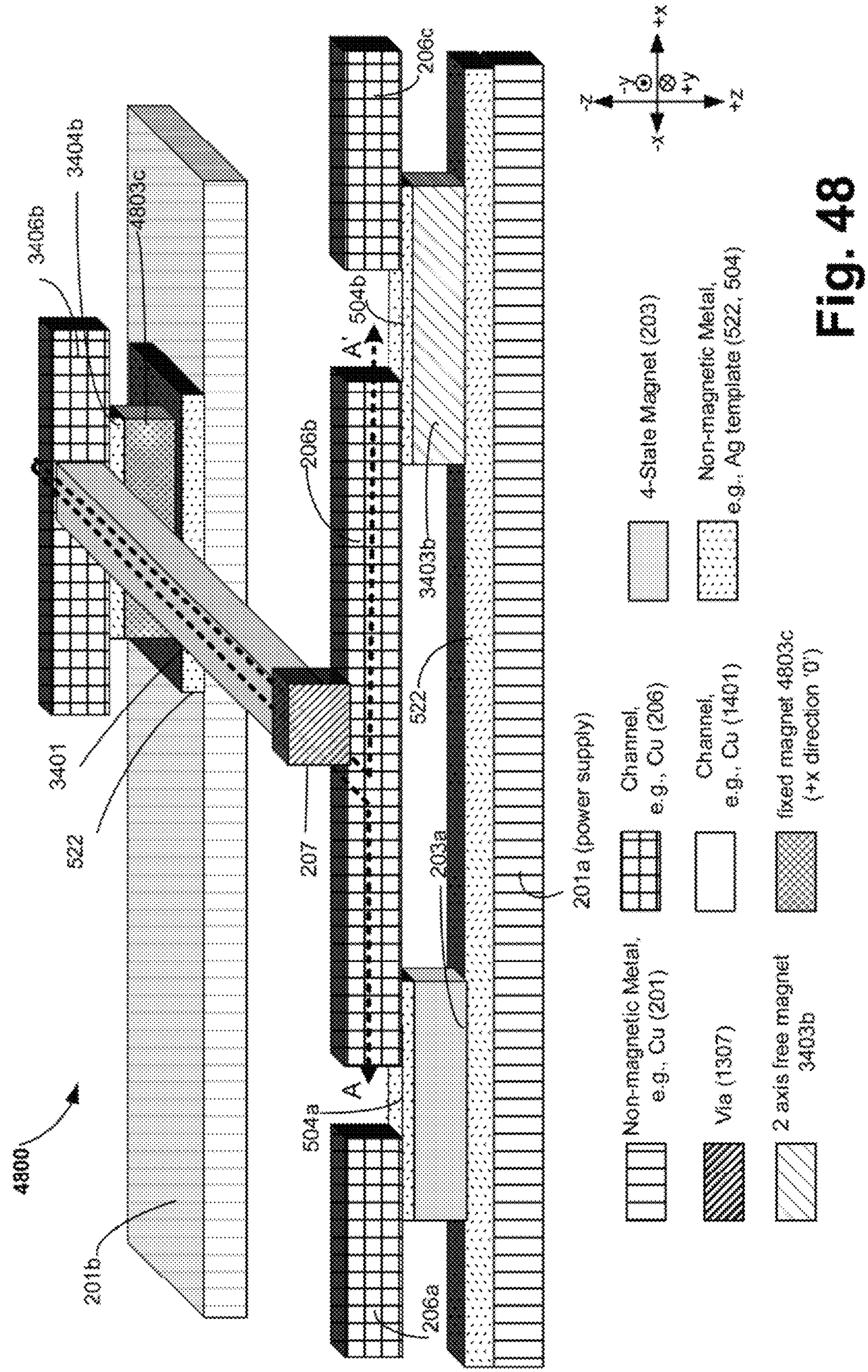
FIG. 48 illustrates a 3D view of quaternary upper threshold logic Gate 3, according to some embodiments of the disclosure.

FIG. 48 illustrates a 3D view of quaternary upper threshold logic device 4800 which is Gate 3 of Table 8, according to some embodiments of the disclosure. It is pointed out that those elements of FIG. 48 having the same reference numbers (or names) as the elements of any other figure can operate or function in any manner similar to that described, but are not limited to such. FIG. 48 is similar to FIG. 34 except that fixed magnet 3403*c* is replaced with fixed magnet 4803*c*, where fixed magnet 4803*c* has magnetization in direction '0' (i.e., along the +x axis). In some embodiments, fixed magnet 4803*c* comprises a material selected from a group consisting of: Fe, Ni, Co and their alloys, magnetic insulators, and Heusler alloys of the form $X_2YZ$.

FIGS. 49-52 illustrate quaternary upper threshold logic device of Gate 3 of Table 8 which corresponds to ASL device 4800 of FIG. 48 using a negative power supply (−Vdd) for interconnects 201*a* and 201*b*, according to some embodiments of the disclosure.

Figure 49:
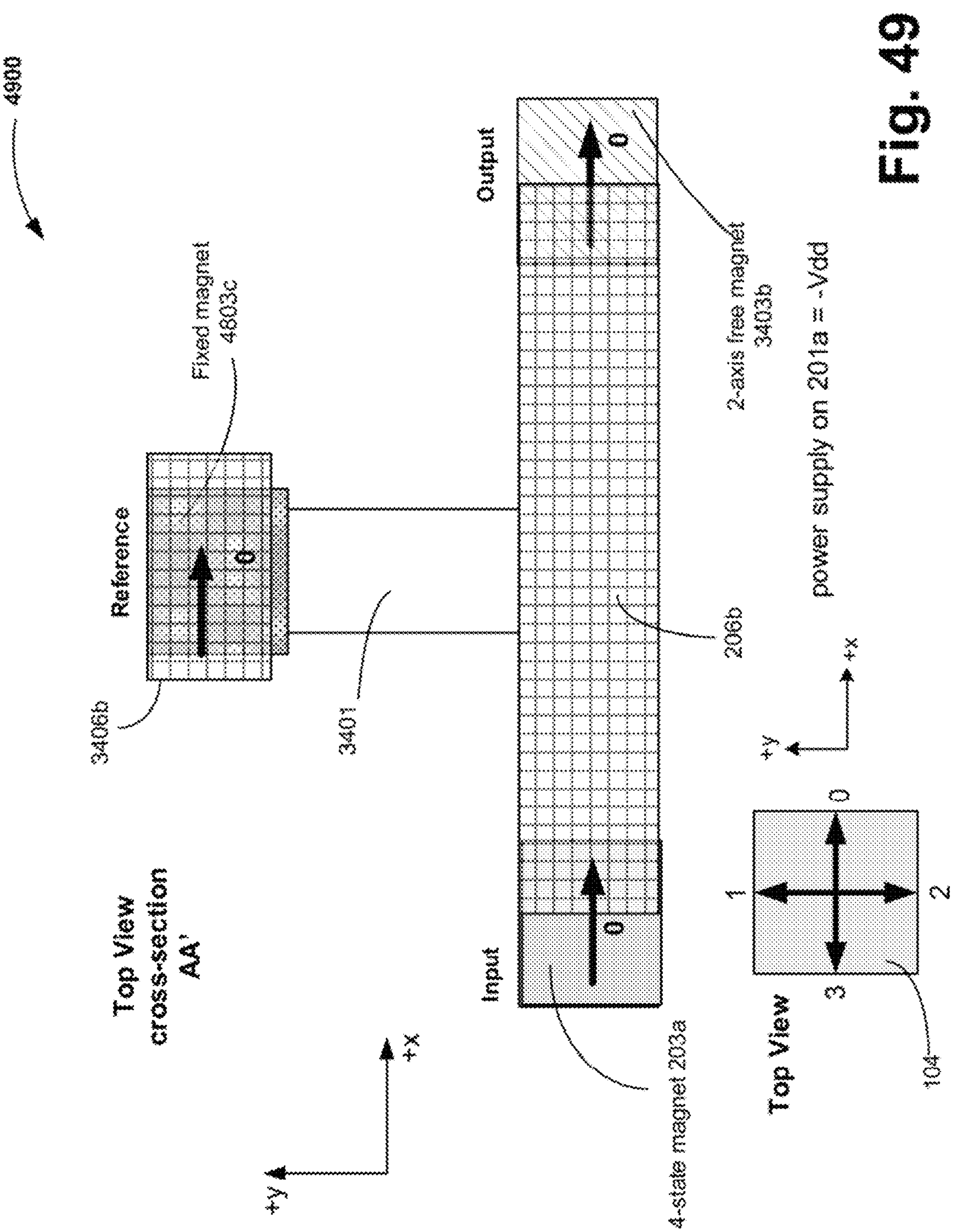
FIGS. 49-52 illustrate quaternary upper threshold logic Gate 3 which corresponds to ASL device of FIG. 48 using negative power supply, according to some embodiments of the disclosure.

FIG. 49 illustrates quaternary upper threshold logic device 4900 of Gate 3 of Table 8 which corresponds to ASL device 4800 of FIG. 48 using a negative power supply, according to some embodiments of the disclosure. It is pointed out that those elements of FIG. 49 having the same reference numbers (or names) as the elements of any other figure can operate or function in any manner similar to that described, but are not limited to such.

ASL device 4900 forms quaternary upper threshold logic Gate 3 of Table 8, according to some embodiments. ASL device 4900 is a top-view of ASL device 4800 along the dotted line AA'. Here, the input magnet is 4-state magnet 203*a*, output magnet 3403*b* is a biaxial (2-state or bi-stable magnet), and reference magnet 4803*c* is a fixed magnet having a magnetization in the +x direction (or along magnetization state '0'). In some embodiments, when input spin current in the +x direction arrives at input 4-state magnet 203*a*, the magnetization of output magnet 3403*b* is along direction '0' (i.e., +x direction).

Figure 50:
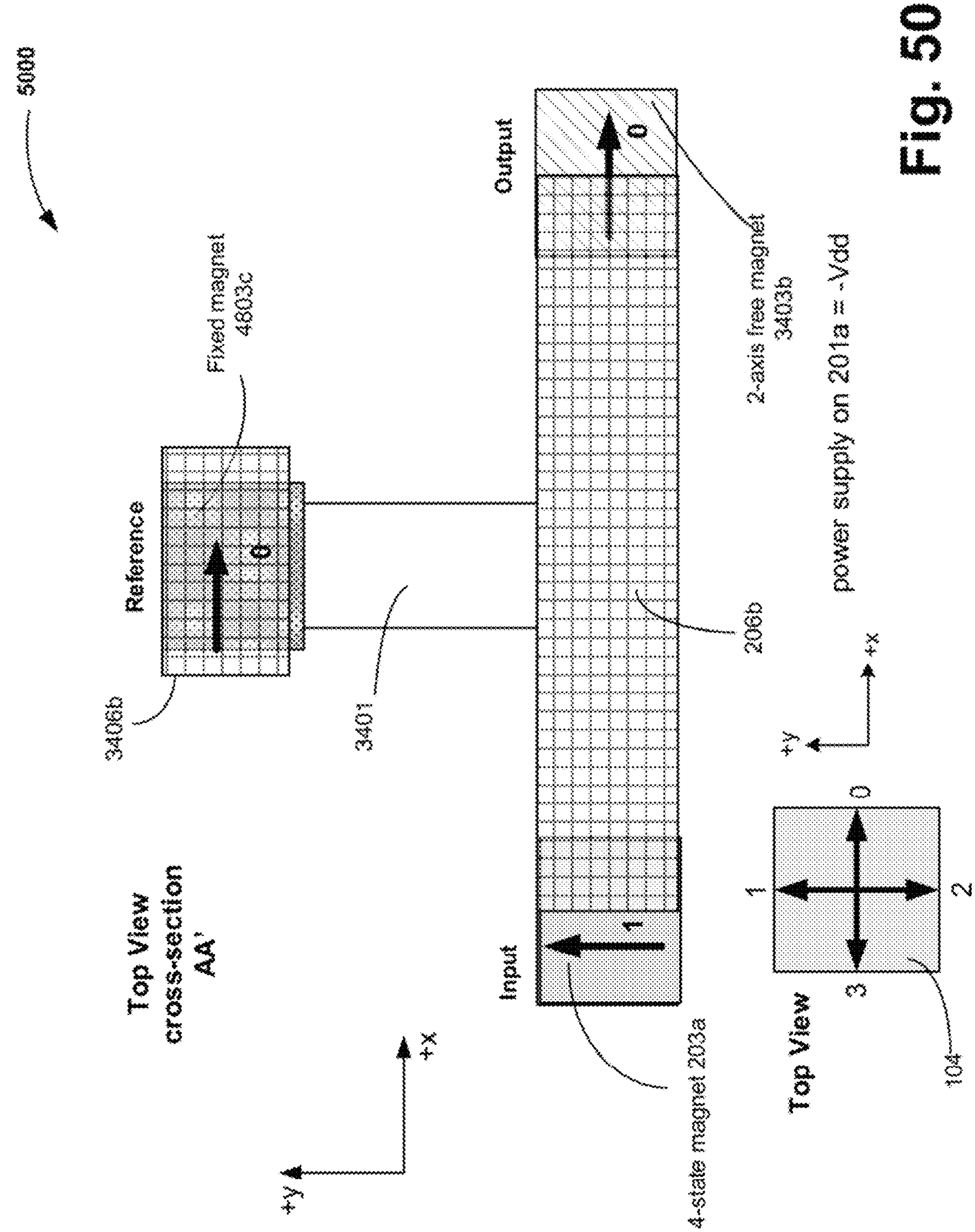

FIG. 50 illustrates quaternary upper threshold logic device 5000 of Gate 3 of Table 8 which corresponds ASL device 4800 of FIG. 48 using negative power supply, according to some embodiments of the disclosure. It is pointed out that those elements of FIG. 50 having the same reference numbers (or names) as the elements of any other figure can operate or function in any manner similar to that described, but are not limited to such.

ASL device 5000 forms quaternary upper threshold logic Gate 3 of Table 8, according to some embodiments. ASL device 5000 is a top-view of ASL device 4800 along the dotted line AA'. Here, the input magnet is 4-state magnet 203*a* with magnetization along direction '1' (i.e., along +y axis), output magnet 3403*b* is a biaxial (2-state or bi-stable magnet), and reference magnet 4803*c* is a fixed magnet having a magnetization in the +x direction (or along direction '0'). In some embodiments, when input spin current arrives at input 4-state magnet 203*a*, the magnetization of output magnet 3403*b* is always along direction '0' (i.e., +x direction).

In some embodiments, ASL device 5000 uses a fixed magnetic spin current input in the +x direction. This breaks the symmetry to enable the logic gate to generate the output. For ASL device 5000, output magnet 3403*b* is a bi-stable magnet with shape or crystalline anisotropy pointing only in one direction. In this case, the direction of magnetization of output magnet 3403*b* is in the direction '0' (i.e., +x direction) regardless of the input spin current direction received by input magnet 203*a* (which is magnetized in direction '1').

Figure 51:
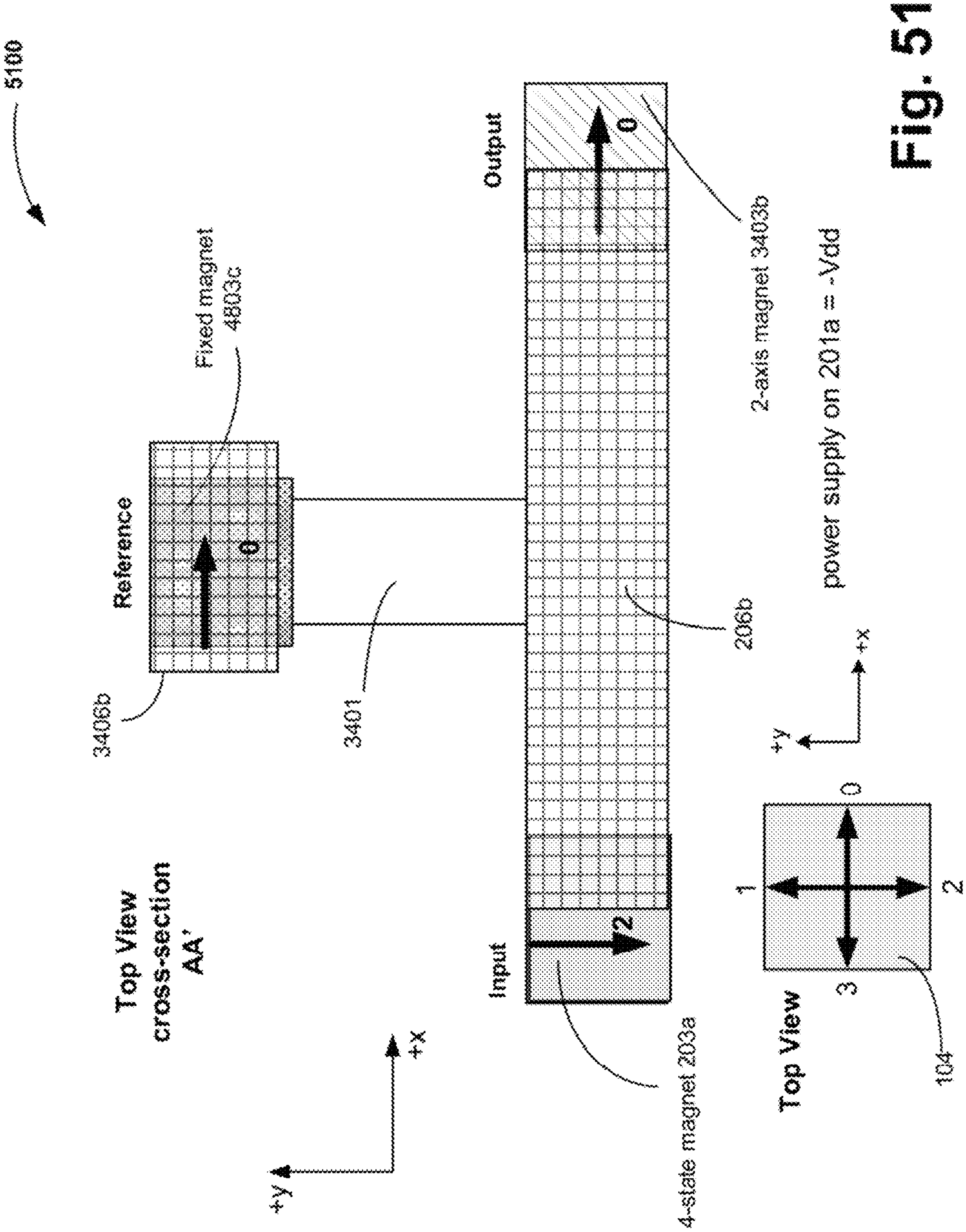

FIG. 51 illustrates quaternary upper threshold logic device 5100 of Gate 3 of Table 8 which corresponds ASL device 4800 of FIG. 48 using negative power supply, according to some embodiments of the disclosure. It is pointed out that those elements of FIG. 51 having the same reference numbers (or names) as the elements of any other figure can operate or function in any manner similar to that described, but are not limited to such.

ASL device 5100 forms quaternary upper threshold logic Gate 3 of Table 8, according to some embodiments. ASL device 5100 is a top-view of ASL device 4800 along the dotted line AA'. Here, the input magnet is 4-state magnet 203*a* with magnetization along direction '2' (i.e., along −y axis), output magnet 3403*b* is a biaxial (2-state or bi-stable magnet), and reference magnet 4803*c* is a fixed magnet having a magnetization in the +x direction (or along direction '0'). In some embodiments, when input spin current arrives at input 4-state magnet 203*a*, the magnetization of output magnet 3403*b* is always along direction '0' (i.e., +x direction).

In some embodiments, ASL device 5100 uses a fixed magnetic spin current input in the +x direction. This breaks the symmetry to enable the logic gate to generate the output. For ASL device 5100, output magnet 3403*b* is a bi-stable magnet with shape or crystalline anisotropy pointing only in one direction. In this case, the direction of magnetization of output magnet 3403*b* is in the direction '0' (i.e., +x direction) regardless of the input spin current direction received by input magnet 203*a* (which is magnetized in direction '2').

Figure 52:
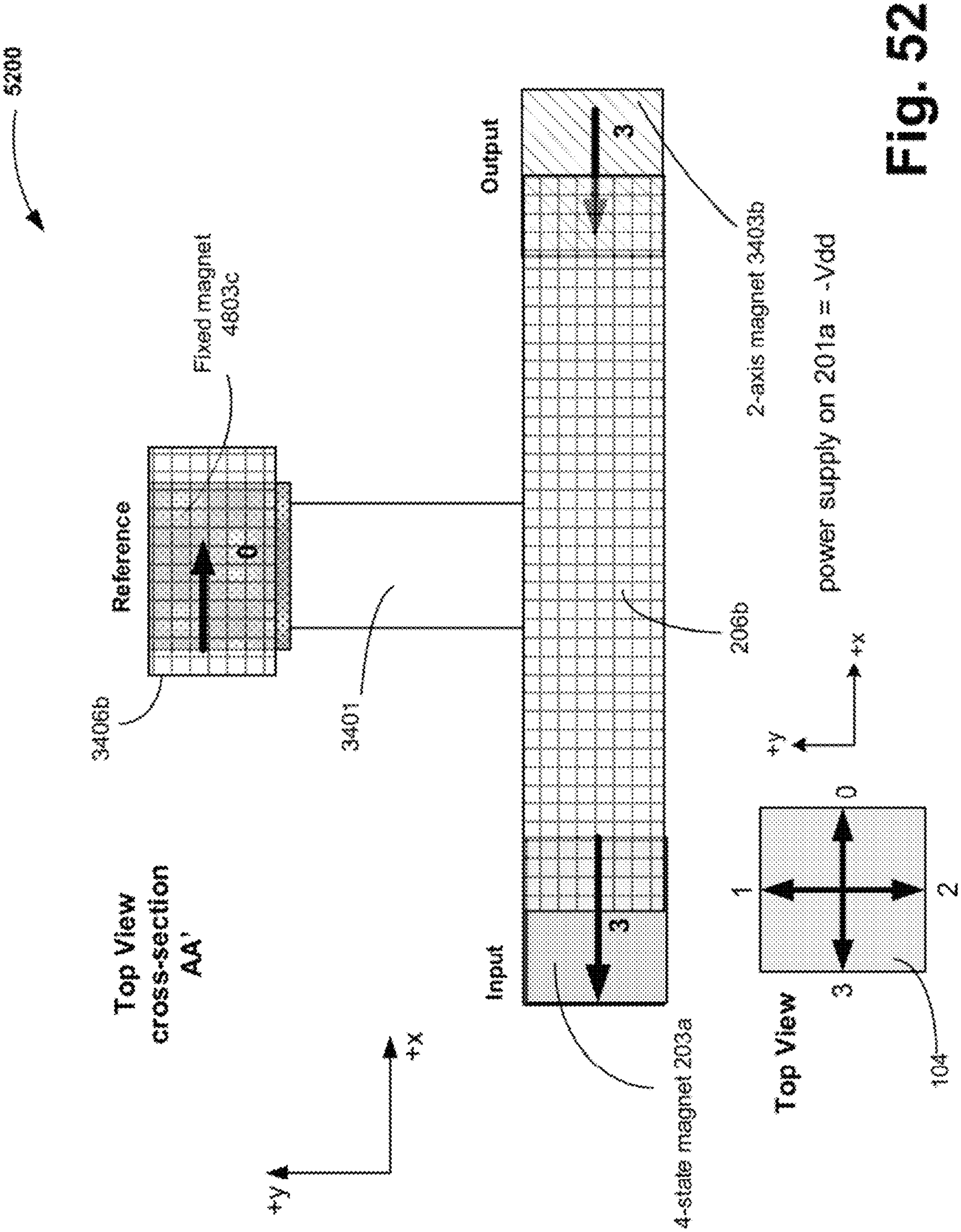

FIG. 52 illustrates top view 5200 of cross-section AA' of the ASL device 4800 of FIG. 48 with input 4-state magnet orientation '3' (i.e., −x direction) and reference fixed magnet orientation '0' (i.e., +x direction), according to some embodiments of the disclosure. It is pointed out that those elements of FIG. 52 having the same reference numbers (or names) as the elements of any other figure can operate or function in any manner similar to that described, but are not limited to such.

ASL device 5200 forms quaternary upper threshold logic Gate 3 of Table 8, according to some embodiments. ASL device 5200 is a top-view of ASL device 4800 along the dotted line AA'. Here, the input magnet is 4-state magnet 203*a* with magnetization along direction '3' (i.e., along −x axis), output magnet 3403*b* is a biaxial (2-state or bi-stable magnet), and reference magnet 4803*c* is a fixed magnet having a magnetization in the +x direction (or along direction '0'). In some embodiments, when input spin current arrives at input 4-state magnet 203*a*, the magnetization of output magnet 3403*b* is always along direction '3' (i.e., −x direction).

In some embodiments, ASL device 5200 uses a fixed magnetic spin current input in the +x direction. This breaks the symmetry to enable the logic gate to generate the output. For ASL device 5200, output magnet 3403*b* is a bi-stable magnet with shape or crystalline anisotropy pointing only in one direction. In this case, the direction of magnetization of output magnet 3403*b* is in the direction '3' (i.e., −x direction) regardless of the input spin current direction received by input magnet 203*a* (which is magnetized in direction '3').

FIGS. 53-56 illustrate quaternary upper threshold logic Gate 3 of Table 8 which corresponds to ASL device 4800 of FIG. 48 using a positive power supply (+Vdd) for interconnects 201*a* and 201*b*, according to some embodiments of the disclosure.

Figure 53:
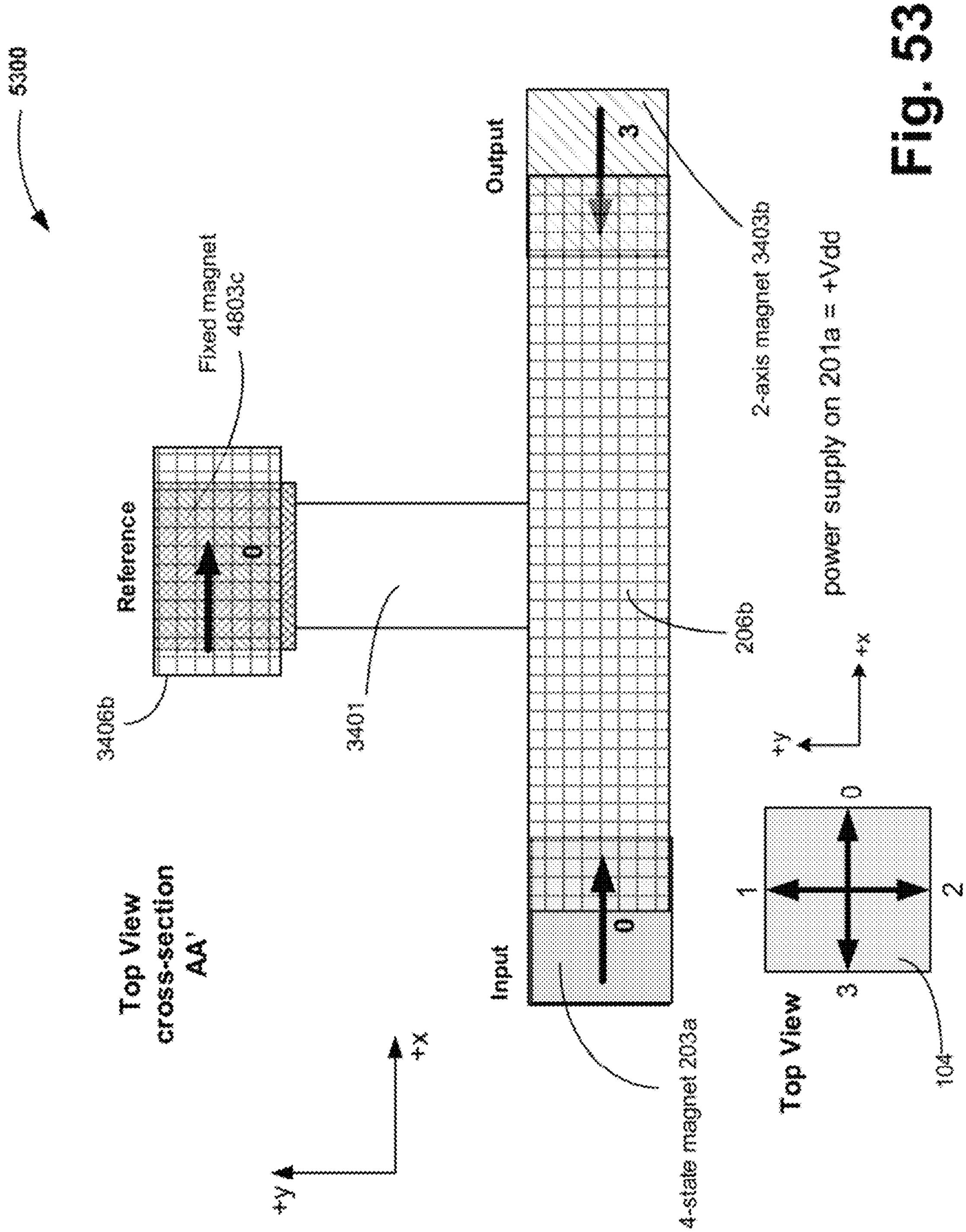
FIGS. 53-56 illustrate quaternary upper threshold logic Gate 3 which corresponds to ASL device of FIG. 48 using positive power supply, according to some embodiments of the disclosure.

FIG. 53 illustrates quaternary upper threshold logic device 5300 for Gate 3 of Table 8 which corresponds ASL device 4800 of FIG. 48 using a positive power supply, according to some embodiments of the disclosure. It is pointed out that those elements of FIG. 53 having the same reference numbers (or names) as the elements of any other figure can operate or function in any manner similar to that described, but are not limited to such.

ASL device 5300 forms quaternary upper threshold logic Gate 3 of Table 8, according to some embodiments. ASL device 5300 is a top-view of ASL device 4800 along the dotted line AA'. Here, the input magnet is 4-state magnet 203*a*, output magnet 3403*b* is a biaxial (2-state or bi-stable magnet), and reference magnet 4803*c* is a fixed magnet having a magnetization in the +x direction (or along state '0'). In some embodiments, when input spin current in the +x direction arrives at input 4-state magnet 203*a*, the magnetization of output magnet 3403*b* is along direction '3' (i.e., −x direction).

Figure 54:
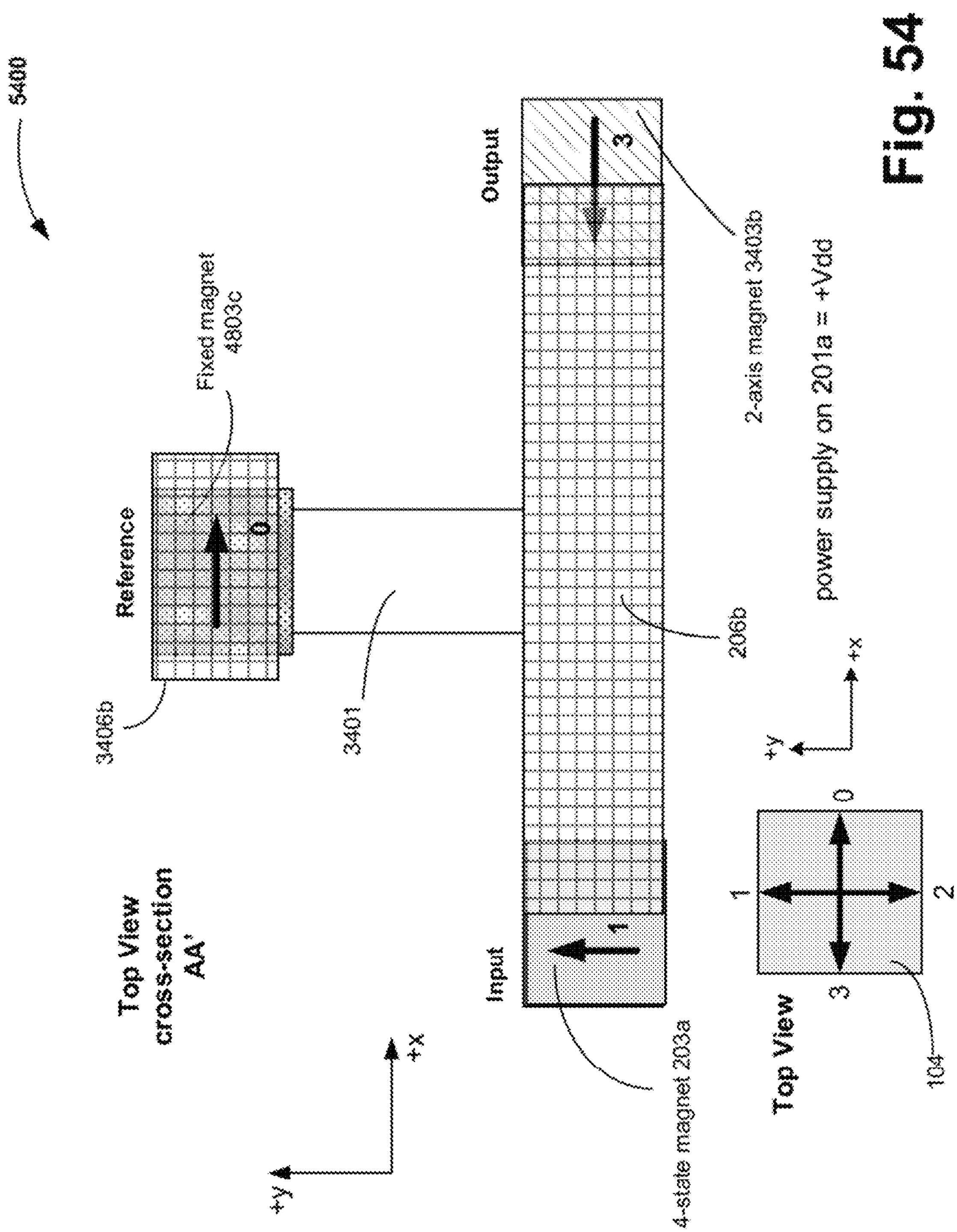

FIG. 54 illustrates quaternary upper threshold logic device 5400 for Gate 3 of Table 8 which corresponds to ASL device 4800 of FIG. 48 using positive power supply, according to some embodiments of the disclosure. It is pointed out that those elements of FIG. 54 having the same reference numbers (or names) as the elements of any other figure can operate or function in any manner similar to that described, but are not limited to such.

ASL device 5400 forms quaternary upper threshold logic Gate 3 of Table 8, according to some embodiments. ASL device 5400 is a top-view of ASL device 4800 along the dotted line AA'. Here, the input magnet is 4-state magnet 203*a* with magnetization along direction '1' (i.e., along +y axis), output magnet 3403*b* is a biaxial (2-state or bi-stable magnet), and reference magnet 4803*c* is a fixed magnet having a magnetization in the +x direction (or along direction '0'). In some embodiments, when input spin current arrives at input 4-state magnet 203*a*, the magnetization of output magnet 3403*b* is always along direction '3' (i.e., −x direction).

In some embodiments, ASL device 5400 uses a fixed magnetic spin current input in the +x direction. This breaks the symmetry to enable the logic gate to generate the output. For ASL device 5400, output magnet 3403*b* is a bi-stable magnet with shape or crystalline anisotropy pointing only in one direction. In this case, direction of magnetization of output magnet 3403*b* is in the direction '3' (i.e., −x direction) regardless of the input spin current direction received by input magnet 203*a* (which is magnetized in direction '1').

Figure 55:
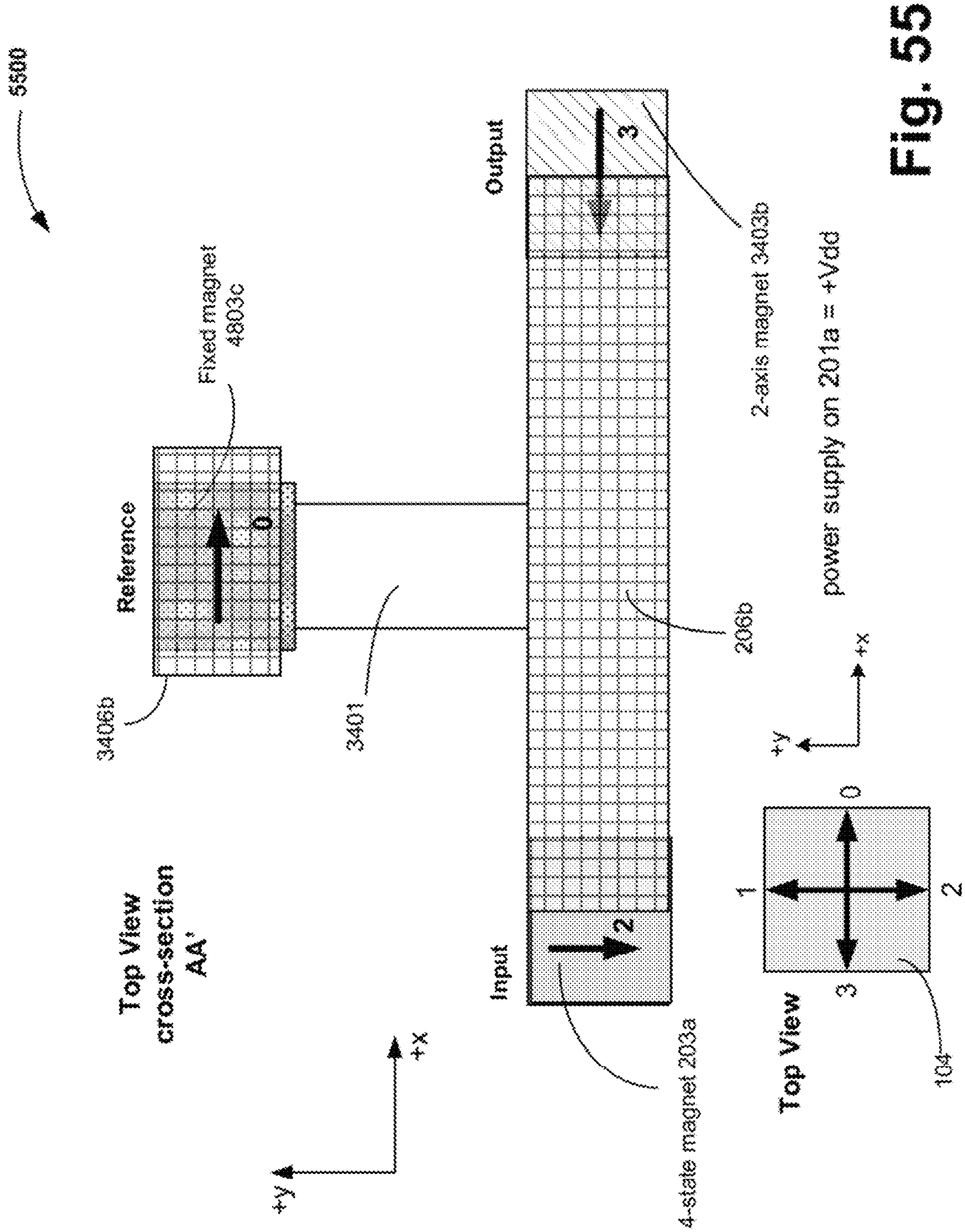

FIG. 55 illustrates quaternary upper threshold logic device 5500 for Gate 3 which corresponds to ASL device 4800 of FIG. 48 using positive power supply, according to some embodiments of the disclosure. It is pointed out that those elements of FIG. 55 having the same reference numbers (or names) as the elements of any other figure can operate or function in any manner similar to that described, but are not limited to such.

ASL device 5500 forms quaternary upper threshold logic Gate 3 of Table 8, according to some embodiments. ASL device 5500 is a top-view of ASL device 4800 along the dotted line AA'. Here, the input magnet is 4-state magnet 203*a* with magnetization along direction '2' (i.e., along −y axis), output magnet 3403*b* is a biaxial (2-state or bi-stable magnet), and reference magnet 4803*c* is a fixed magnet having a magnetization in the +x direction (or along direction '0'). In some embodiments, when input spin current arrives at input 4-state magnet 203*a*, the magnetization of output magnet 3403*b* is always along direction '3' (i.e., −x direction).

In some embodiments, ASL device 5500 uses a fixed magnetic spin current input in the +x direction. This breaks the symmetry to enable the logic gate to generate the output. For ASL device 5500, output magnet 3403*b* is a bi-stable magnet with shape or crystalline anisotropy pointing only in one direction. In this case, direction of magnetization of output magnet 3403*b* is in the direction '3' (i.e., −x direction) regardless of the input spin current direction received by input magnet 203*a* (which is magnetized in direction '2').

Figure 56:
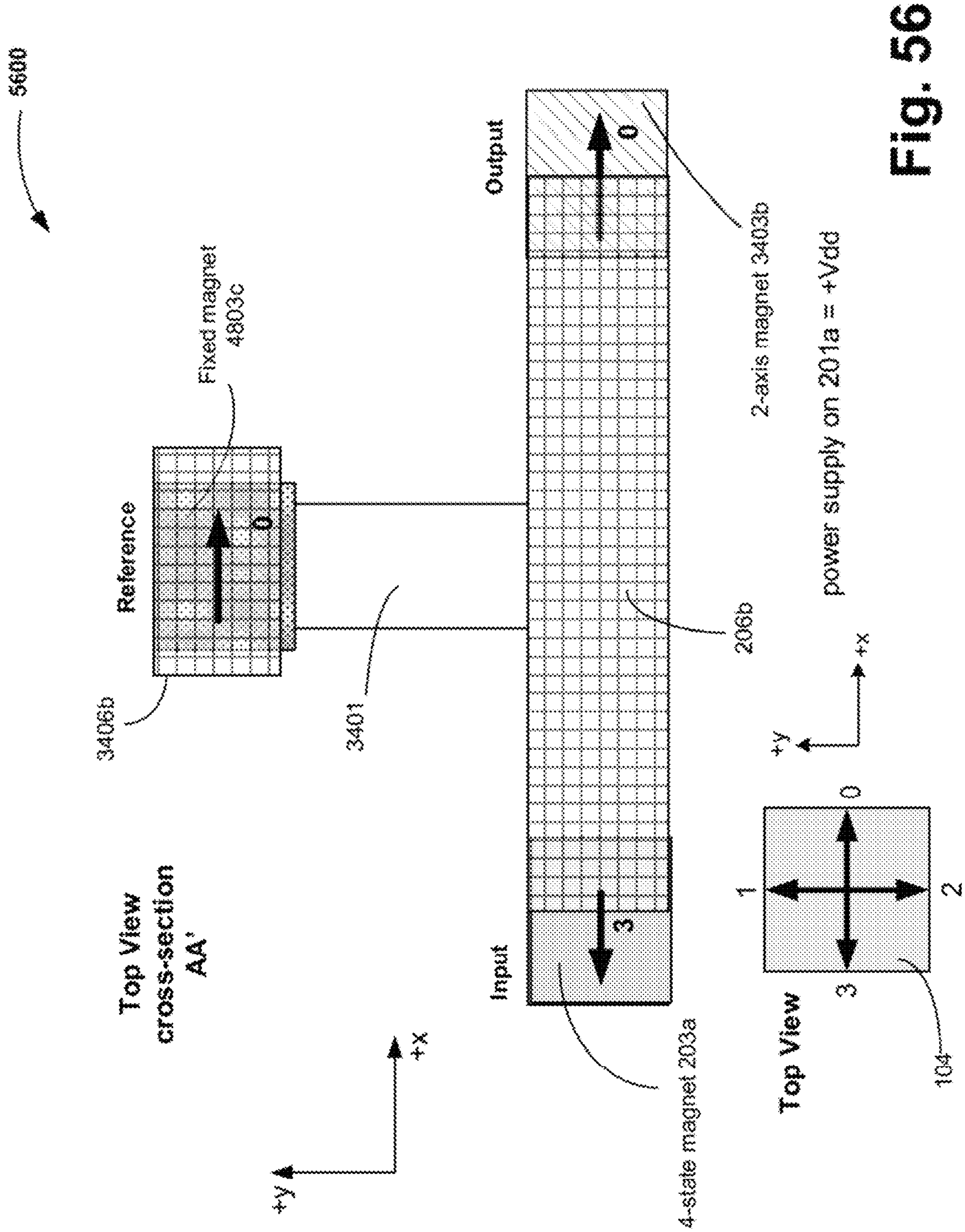

FIG. 56 illustrates top view 5600 of cross-section AA' of the ASL device 4800 of FIG. 48 with input 4-state magnet orientation '3' (i.e., −x direction) and reference fixed magnet orientation '0' (i.e., +x direction), and using positive power supply, according to some embodiments of the disclosure. It is pointed out that those elements of FIG. 56 having the same reference numbers (or names) as the elements of any other figure can operate or function in any manner similar to that described, but are not limited to such.

ASL device 5600 forms quaternary upper threshold logic Gate 3 of Table 8, according to some embodiments. ASL device 5600 is a top-view of ASL device 4800 along the dotted line AA'. Here, the input magnet is 4-state magnet 203*a* with magnetization along direction '3' (i.e., along −x axis), output magnet 3403*b* is a biaxial (2-state or bi-stable magnet), and reference magnet 4803*c* is a fixed magnet having a magnetization in the +x direction (or along direction '0'). In some embodiments, when input spin current arrives at input 4-state magnet 203*a*, the magnetization of output magnet 3403*b* is always along direction '0' (i.e., +x direction).

In some embodiments, ASL device 5600 uses a fixed magnetic spin current input in the +x direction. This breaks the symmetry to enable the logic gate to generate the output. For ASL device 5600, output magnet 3403*b* is a bi-stable magnet with shape or crystalline anisotropy pointing only in one direction. In this case, direction of magnetization of output magnet 3403*b* is in the direction '0' (i.e., +x direction) regardless of the input spin current direction received by input magnet 203*a* (which is magnetized in direction '3').

FIGS. 57-60 illustrate quaternary upper threshold logic Gate 1 of Table 8 which corresponds ASL device of FIG. 34 using a positive power supply (+Vdd) for interconnects 201*a* and 201*b*, according to some embodiments of the disclosure.

Figure 57:
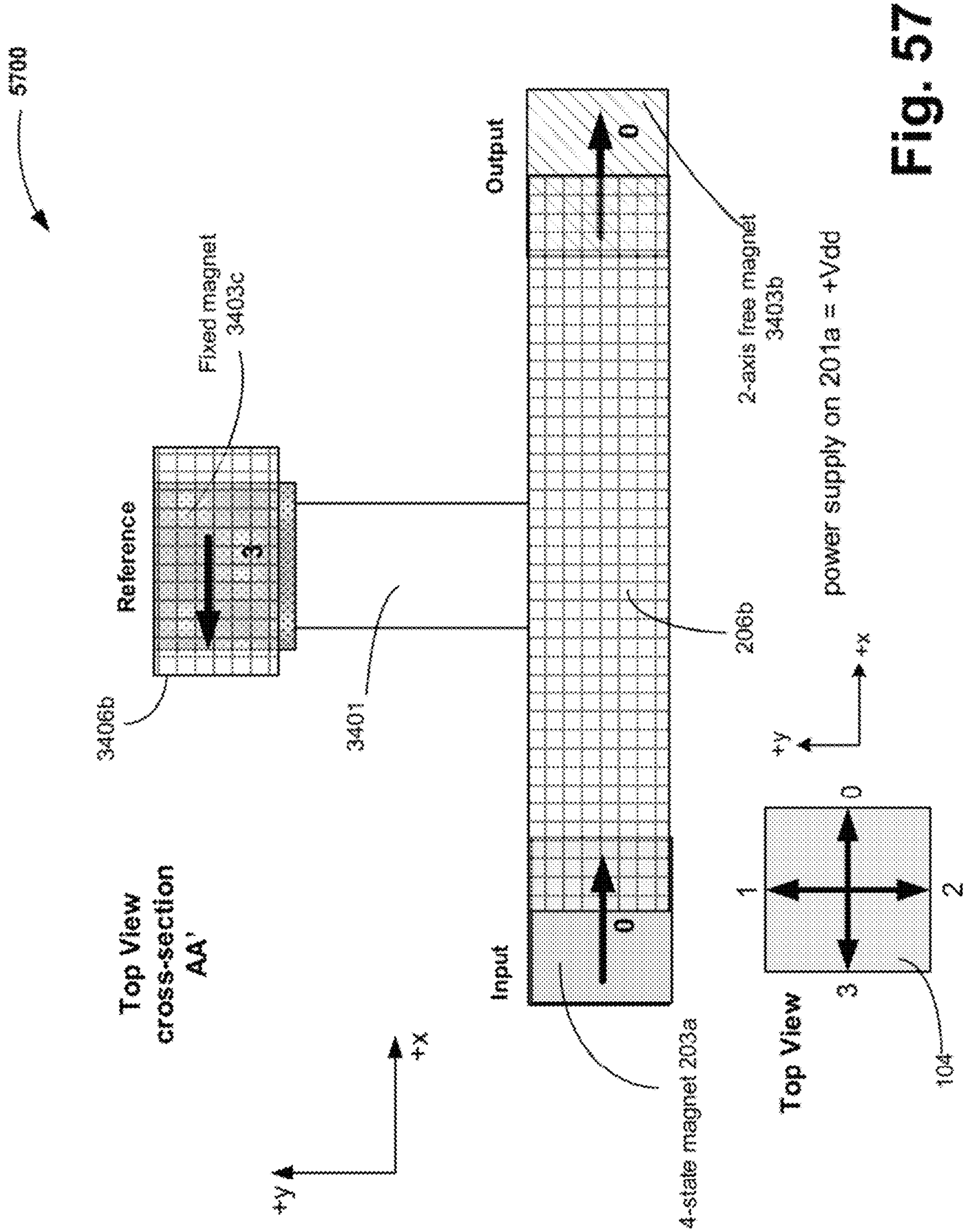
FIGS. 57-60 illustrate quaternary upper threshold logic Gate 1 which corresponds to ASL device of FIG. 34 using positive power supply, according to some embodiments of the disclosure.

FIG. 57 illustrates quaternary upper threshold logic device 5700 for Gate 1 of Table 8 which corresponds to ASL device 3400 of FIG. 34 using a positive power supply, according to some embodiments of the disclosure. It is pointed out that those elements of FIG. 57 having the same reference numbers (or names) as the elements of any other figure can operate or function in any manner similar to that described, but are not limited to such.

ASL device 5700 forms quaternary upper threshold logic Gate 1 of Table 8, according to some embodiments. ASL device 5700 is a top-view of ASL device 3400 along the dotted line AA'. Here, the input magnet is 4-state magnet 203*a*, output magnet 3403*b* is a biaxial (2-state or bi-stable magnet), and reference magnet 3403*c* is a fixed magnet having a magnetization in the −x direction (or along state '3'). In some embodiments, when input spin current in the +x direction arrives at input 4-state magnet 203*a*, the magnetization of output magnet 3403*b* is along direction '0' (i.e., +x direction).

Figure 58:
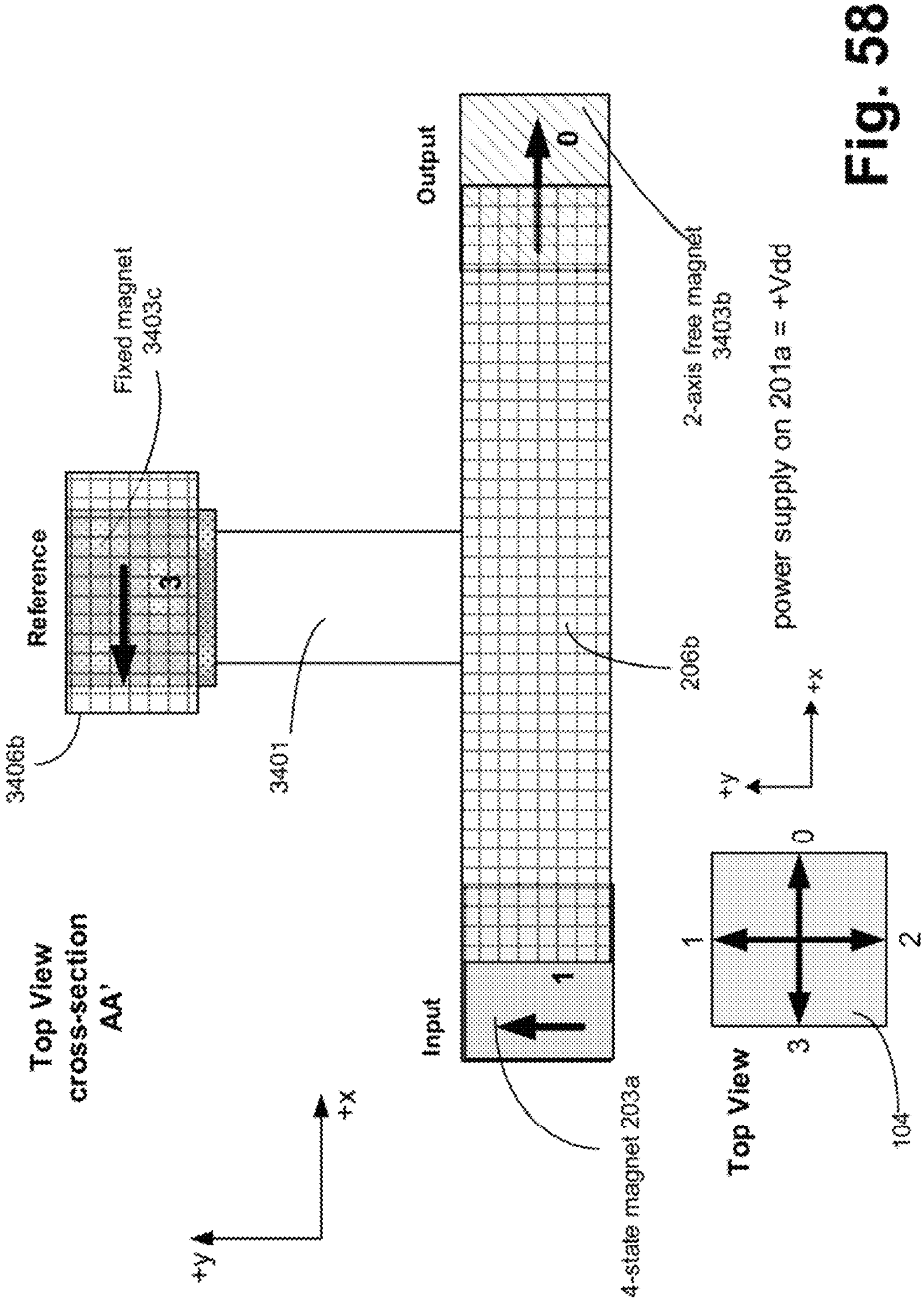

FIG. 58 illustrates quaternary upper threshold logic device 5800 of Gate 1 which corresponds ASL device 3400 of FIG. 34 using positive power supply, according to some embodiments of the disclosure. It is pointed out that those elements of FIG. 58 having the same reference numbers (or names) as the elements of any other figure can operate or function in any manner similar to that described, but are not limited to such.

ASL device 5800 forms quaternary upper threshold logic Gate 1 of Table 8, according to some embodiments. ASL device 5800 is a top-view of ASL device 3400 along the dotted line AA'. Here, the input magnet is 4-state magnet 203*a* with magnetization along direction '1' (i.e., along +y axis), output magnet 3403*b* is a biaxial (2-state or bi-stable magnet), and reference magnet 3403*c* is a fixed magnet having a magnetization in the −x direction (or along direction '3'). In some embodiments, when input spin current arrives at input 4-state magnet 203*a*, the magnetization of output magnet 3403*b* is always along direction '0' (i.e., +x direction).

In some embodiments, ASL device 5800 uses a fixed magnetic spin current input in the −x direction. This breaks the symmetry to enable the logic gate to generate the output. For ASL device 5800, output magnet 3403*b* is a bi-stable magnet with shape or crystalline anisotropy pointing only in one direction. In this case, the direction of magnetization of output magnet 3403*b* is in the direction '0' (i.e., +x direction) regardless of the input spin current direction received by input magnet 203*a* (which is magnetized in direction '1').

Figure 59:
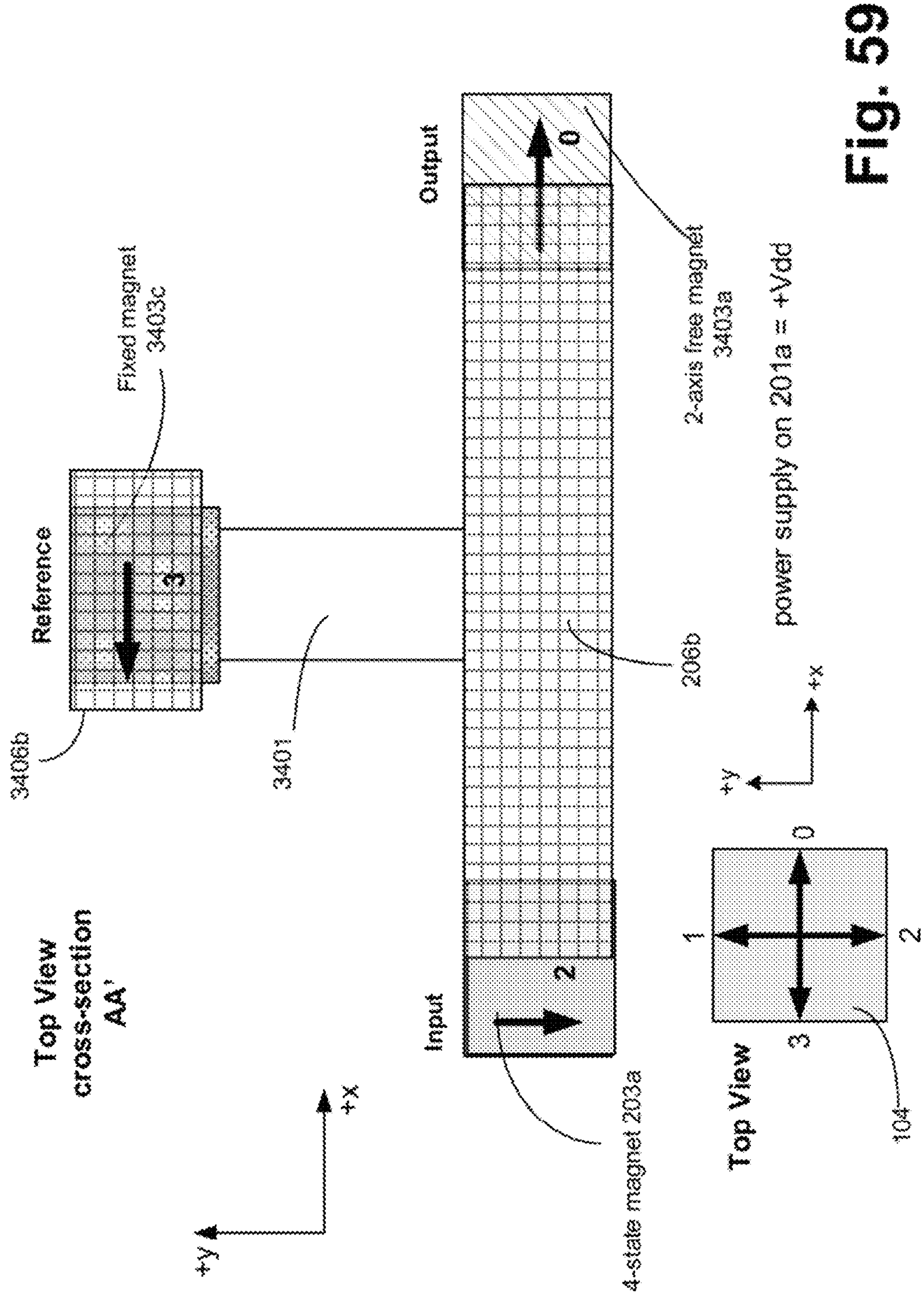

FIG. 59 illustrates quaternary upper threshold logic device 5900 for Gate 1 of Table 8 which corresponds to ASL device 3400 of FIG. 34 using positive power supply, according to some embodiments of the disclosure. It is pointed out that those elements of FIG. 59 having the same reference numbers (or names) as the elements of any other figure can operate or function in any manner similar to that described, but are not limited to such.

ASL device 5900 forms quaternary upper threshold logic Gate 1 of Table 8, according to some embodiments. ASL device 5900 is a top-view of ASL device 3400 along the dotted line AA'. Here, the input magnet is 4-state magnet 203*a* with magnetization along direction '2' (i.e., along −y axis), output magnet 3403*b* is a biaxial (2-state or bi-stable magnet), and reference magnet 3403*c* is a fixed magnet having a magnetization in the −x direction (or along direction '3'). In some embodiments, when input spin current arrives at input 4-state magnet 203*a*, the magnetization of output magnet 3403*b* is always along direction '0' (i.e., +x direction).

In some embodiments, ASL device 5900 uses a fixed magnetic spin current input in the −x direction. This breaks the symmetry to enable the logic gate to generate the output. For ASL device 5900, output magnet 3403*b* is a bi-stable magnet with shape or crystalline anisotropy pointing only in one direction. In this case, direction of magnetization of output magnet 3403*b* is in the direction '0' (i.e., +x direction) regardless of the input spin current direction received by input magnet 203*a* (which is magnetized in direction '2').

Figure 60:
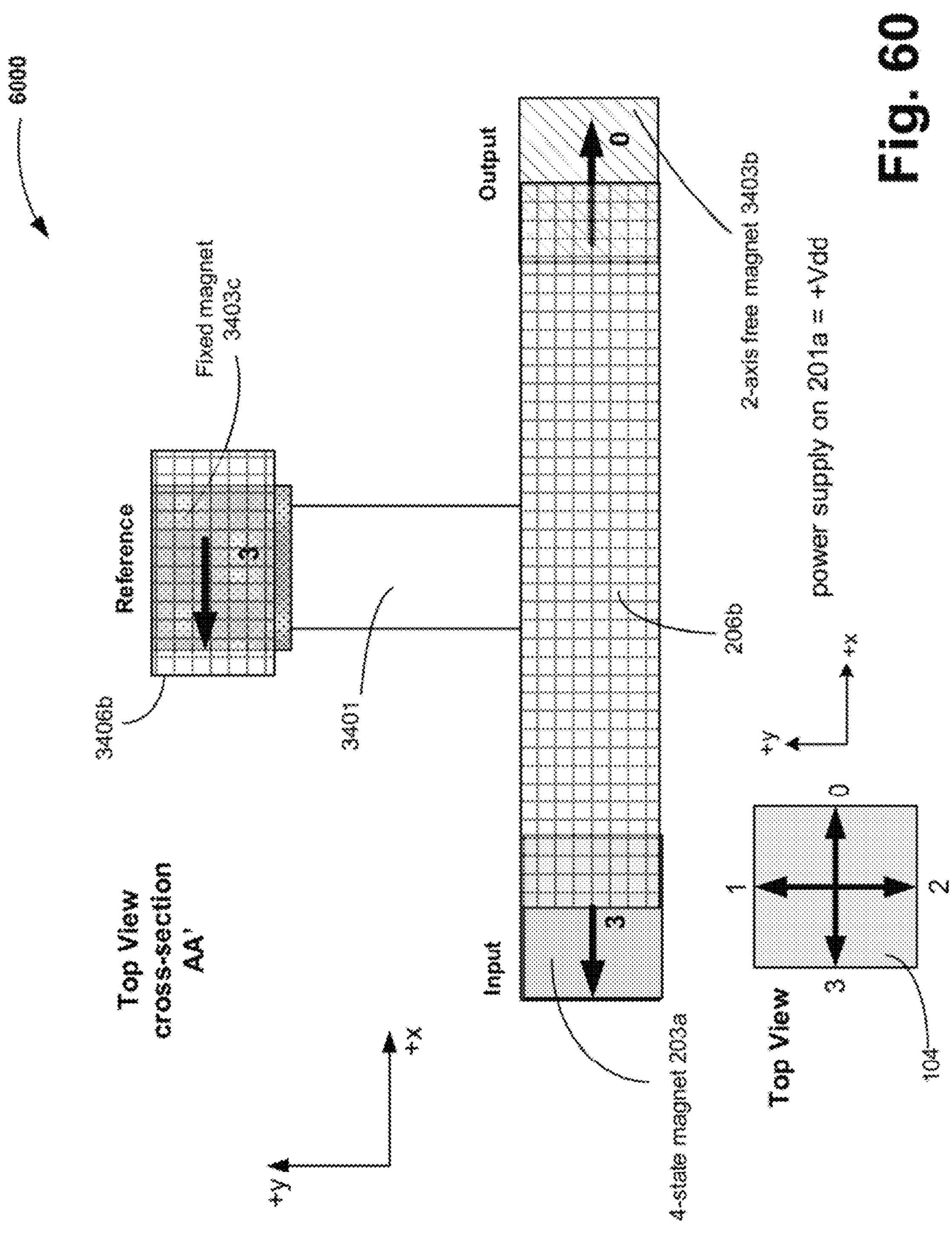

FIG. 60 illustrates top view 6000 of cross-section AA' of the ASL device 3400 of FIG. 34 with input 4-state magnet orientation '3' (i.e., −x direction) and reference fixed magnet orientation '3' (i.e., −x direction) using a positive power supply, according to some embodiments of the disclosure. It is pointed out that those elements of FIG. 52 having the same reference numbers (or names) as the elements of any other figure can operate or function in any manner similar to that described, but are not limited to such.

ASL device 6000 forms quaternary upper threshold logic Gate 1 of Table 8, according to some embodiments. ASL device 6000 is a top-view of ASL device 3400 along the dotted line AA'. Here, the input magnet is 4-state magnet 203*a* with magnetization along direction '3' (i.e., along −x axis), output magnet 3403*b* is a biaxial (2-state or bi-stable magnet), and reference magnet 3403*c* is a fixed magnet having a magnetization in the −x direction (or along direction '3'). In some embodiments, when input spin current arrives at input 4-state magnet 203*a*, the magnetization of output magnet 3403*b* is always along direction '0' (i.e., +x direction).

In some embodiments, ASL device 6000 uses a fixed magnetic spin current input in the −x direction. This breaks the symmetry to enable the logic gate to generate the output. For ASL device 6000, output magnet 3403*b* is a bi-stable magnet with shape or crystalline anisotropy pointing only in one direction. In this case, the direction of magnetization of output magnet 3403*b* is in the direction '0' (i.e., +x direction) regardless of the input spin current direction received by input magnet 203*a* (which is magnetized in direction '3').

Quaternary Lower Threshold Gate

Table 9 below shows the truth table of quaternary lower threshold logic gates (i.e., Gate 0, Gate 1, Gate 2, and Gate 3).

TABLE 9

| Quaternary Lower Threshold Gate | | |
|---|---|---|
| Type of Logic Gate | Input Magnet Orientation | Output Magnet Orientation |
| Gate 0 | +x (0) | −x (3) |
| | +y (1) | +x (0) |
| | −x (3) | +x (0) |
| | −y (2) | +x (0) |
| Gate 1 | +x (0) | −x (3) |
| | +y (1) | −x (3) |
| | −x (3) | +x (0) |
| | −y (2) | −x (0) |
| Gate 2 | +x (0) | −x (3) |
| | +y (1) | −x (3) |
| | −x (3) | +x (0) |
| | −y (2) | −x (3) |
| Gate 3 | +x (0) | −x (3) |
| | +y (1) | −x (3) |
| | −x (3) | −x (3) |
| | −y (2) | −x (3) |

Figure 61A:
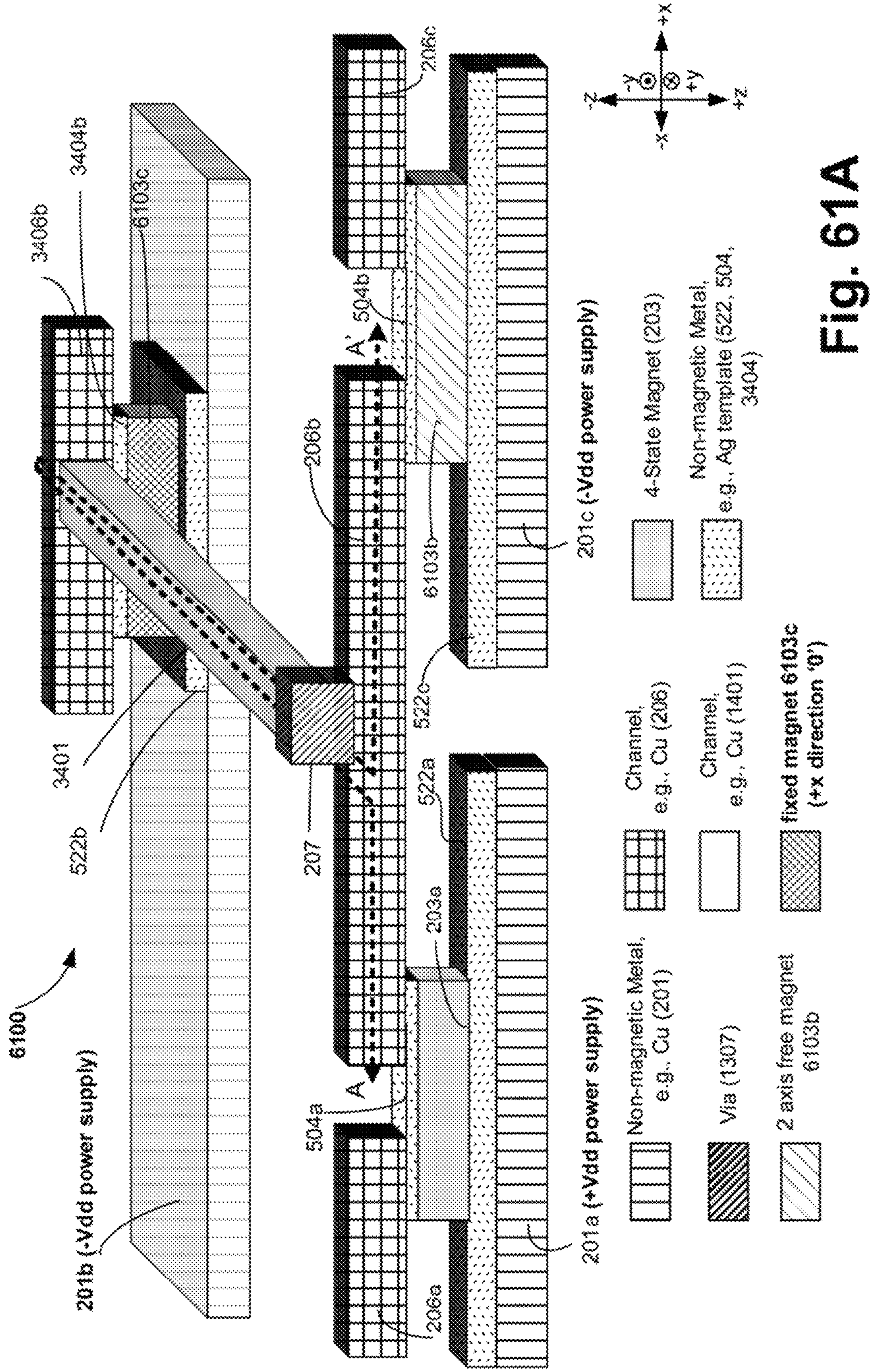
FIGS. 61A-B illustrate a 3D view of an ASL device which is operable to perform one of logics of lower threshold logic gate, according to some embodiments of the disclosure.
Figure 61B:
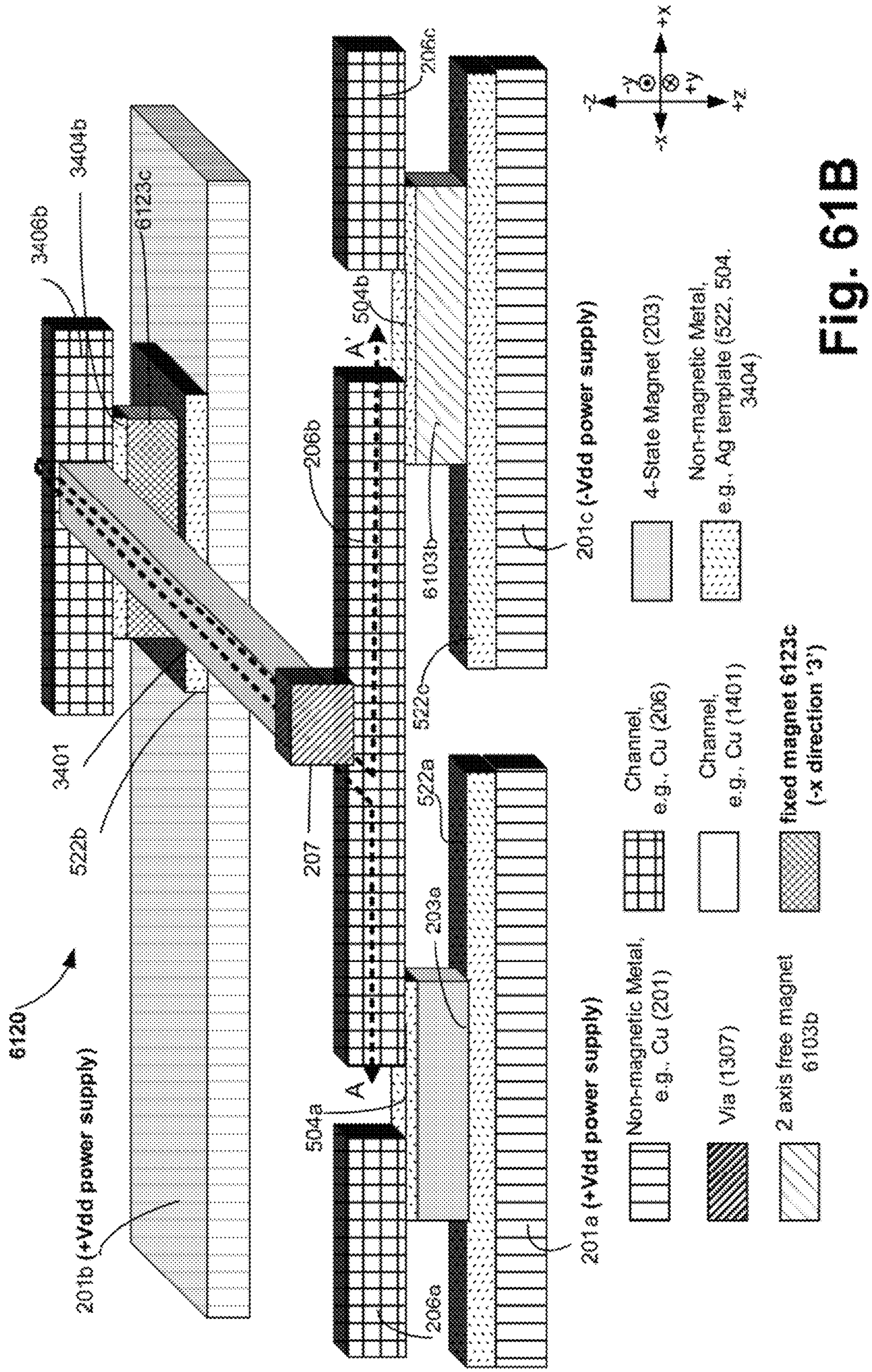

FIGS. 61-79 illustrate quaternary lower threshold logic gates Gate 0, Gate 1, Gate 2, and Gate 3, respectively, as described in Table 9, according to some embodiments of the disclosure. FIG. 61A illustrates a 3D view of ASL device 6100 which is operable to perform one of logics of lower threshold logic gate, according to some embodiments of the disclosure. FIG. 61B illustrates a 3D view of ASL device 6120 which is operable to perform one of logics of lower threshold logic gate, according to some embodiments of the disclosure. FIG. 62A, FIG. 63A, FIG. 64A, and FIG. 65A refer to logic Gate 0 of Table 9 of the quaternary lower threshold logic gates which correspond to device 6100 of FIG. 61A along cross-section AA', according to some embodiments of the disclosure. FIG. 62B, FIG. 63B, FIG. 64B, and FIG. 65B refer to logic Gate 0 of Table 9 of the quaternary lower threshold logic gates which correspond to device 6120 of FIG. 61B along cross-section AA', according to some embodiments of the disclosure.

FIG. 61A is described with reference to FIGS. 11 and 34. Compared to FIG. 11, via 207 is moved substantially to the middle of interconnect 206*b*, in accordance with some embodiments. In some embodiments, second 4-state magnet 203*b* is replaced with a biaxial free magnet 6103*b*. In some embodiments, free magnet 6103*b* can have two possible states (e.g., magnetization in the +x direction or magnetization in the −x direction). In some embodiments, 2-axis free magnet 6103*b* comprises a material selected from a group consisting of: Fe, Ni, Co and their alloys, magnetic insulators, and Heusler alloys of the form $X_2YZ$.

In some embodiments, power supply interconnect 201*a* is split into interconnect 201*a* and interconnect 201*c*. In some embodiments, interconnect 201*a* is coupled to template layer 522*a*. In some embodiments, template layer 522*a* is coupled to 4-state free magnet 203*a*. Template layer 522*a* is formed of the same material as template material 522 and has the same function as template layer 522 (e.g., to template first magnet 203*a*). In some embodiments, interconnect 201*a* is coupled to a positive power supply +Vdd.

In some embodiments, interconnect 201*c* is coupled to template layer 522*c*, Iii some embodiments, template layer 522*c* is coupled to 2-axis free magnet 6103*b*. Template layer 522*c* is formed of the same material as template material 522 and has the same function as template layer 522 (e.g., to template 2-axis free magnet 6103*b*). In some embodiments, interconnect 201*c* is coupled to a negative power supply −Vdd.

In some embodiments, interconnect 3401 is provided which is coupled to (or positioned adjacent to) via 207 such that interconnect 3401 is orthogonal to interconnect 206*b*. In some embodiments, interconnect 3401 is formed of the same material as interconnect 206*b*. In some embodiments, interconnect 3401 is formed of any non-magnetic conducting material. In some embodiments, one end of interconnect 3401 is coupled to via 207 while another end of interconnect 3401 is coupled to interconnect 3406*b*. In some embodiments, interconnect 3401 and interconnect 3406*b* are orthogonal to one another such that interconnect 3406*b* is parallel to interconnect 206*b*. In some embodiments, interconnect 3406*b* is formed of the same material as interconnect 206*b*.

In some embodiments, a template layer 3404*b* is coupled to (or adjacent to) interconnect 3406*b*. Template layer 3404*b* is formed of the same material as template material 504*a* and has the same function as template layer 504*a* (e.g., to template third magnet 6103*c*). In some embodiments, third magnet 6103*c* is coupled to (or adjacent to) template layer 3404*b*. In some embodiments, third magnet 6103*c* is a fixed magnet (or pinned magnet).

In some embodiments, the magnetization of third magnet 6103*c* sets the threshold of quaternary lower threshold logic gate 6100. As such, for some threshold logic gates, a unique magnetization is set for third magnet 6103*c*, in accordance with some embodiments. In some embodiments, another templating layer 522*b* is coupled to third magnet 6103*c*. In some embodiments, supply rail 201*b* is coupled to templating layer 522*b* (which is coupled to magnet 6103*c*). In some embodiments, negative supply is provided on interconnect 201*b*. In some embodiments, the ground is located under the nanomagnets. For each quaternary lower threshold logic Gate 0 of Table 9, the magnetization of third magnet 6103*c* is fixed in the +x direction (i.e., magnetization state '0'), in accordance with some embodiments.

FIG. 62A, FIG. 63A, FIG. 64A, and FIG. 65A refer to logic Gate 0 of Table 9 of the quaternary lower threshold logic gates which correspond to device 6100 of FIG. 61A along cross-section AA', according to some embodiments of the disclosure.

Figure 62A:
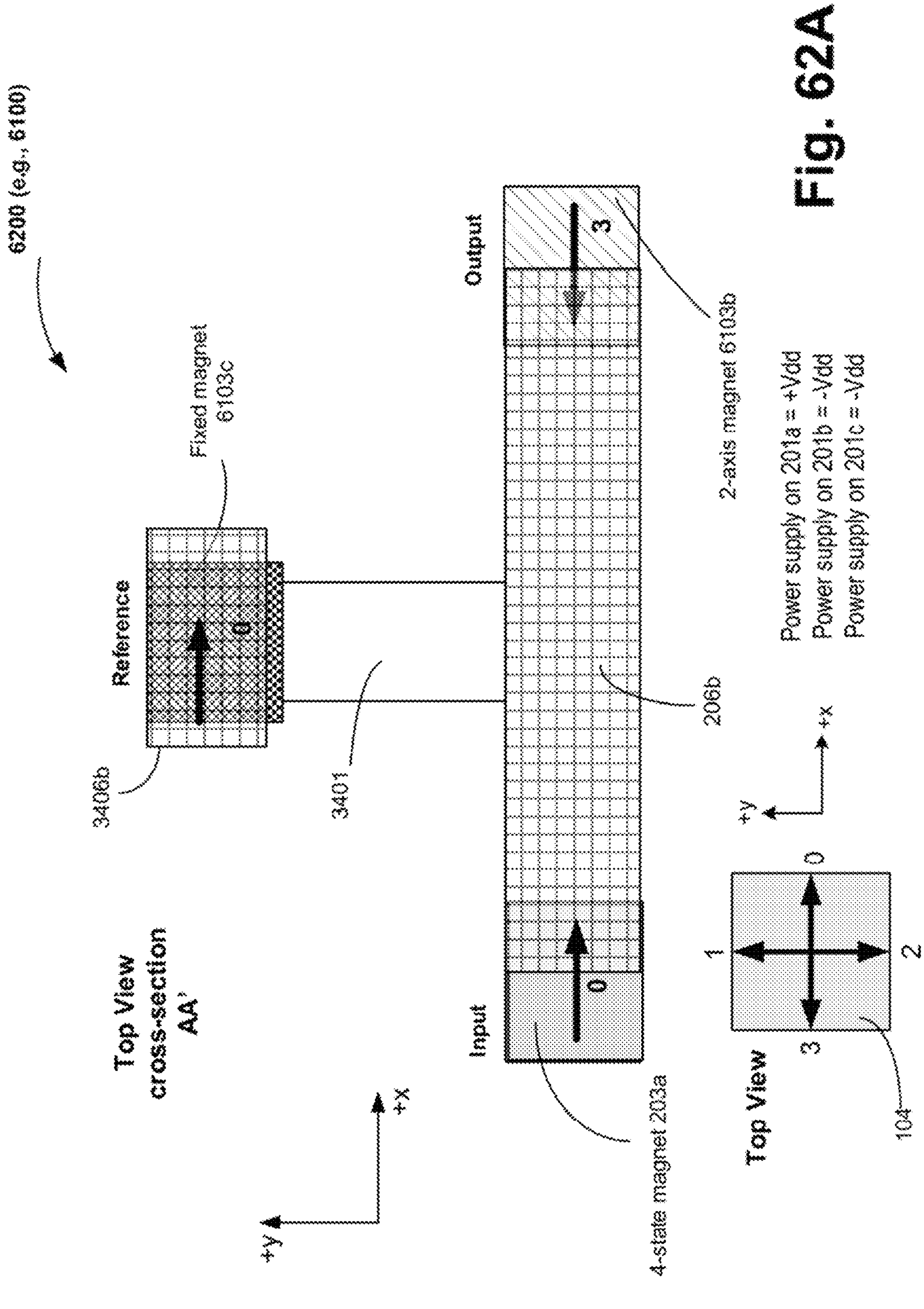
FIGS. 62A-B to FIGS. 65A-B illustrate logic Gate 0 of the quaternary lower threshold logic gate which correspond to the ASL device of FIG. 61, according to some embodiments of the disclosure.

FIG. 62A illustrates top view 6200 of cross-section AA' of the ASL device 6100 of FIG. 61A with input 4-state magnet orientation '0' (i.e., +x direction) and reference fixed magnet orientation '0' (i.e., +x direction), according to some embodiments of the disclosure. It is pointed out that those elements of FIG. 62A having the same reference numbers (or names) as the elements of any other figure can operate or function in any manner similar to that described, but are not limited to such.

ASL device 6200 forms quaternary lower threshold logic Gate 0 of Table 9, according to some embodiments. ASL device 6200 is a top-view of ASL device 6100 along the dotted line AA'. Here, the input magnet is 4-state magnet 203*a*, output magnet 6103*b* is a biaxial (2-state or bi-stable magnet), and reference magnet 6103*c* is a fixed magnet having a magnetization in the +x direction (or along state '0'). Here, the power supply on interconnect 201*a* is +Vdd (positive power supply), power supply on interconnect 201*b* is −Vdd (negative power supply), and power supply on interconnect 201*c* is −Vdd (negative power supply).

In some embodiments, the positive power supply on interconnect 201*a* reverses the effective magnetization direction of input magnet 203*a* relative to the input spin current. In some embodiments, when the input spin current in the +x direction arrives at input 4-state magnet 203*a*, the magnetization of output magnet 6103*b* is along direction '3' (i.e., −x direction).

Figure 63A:
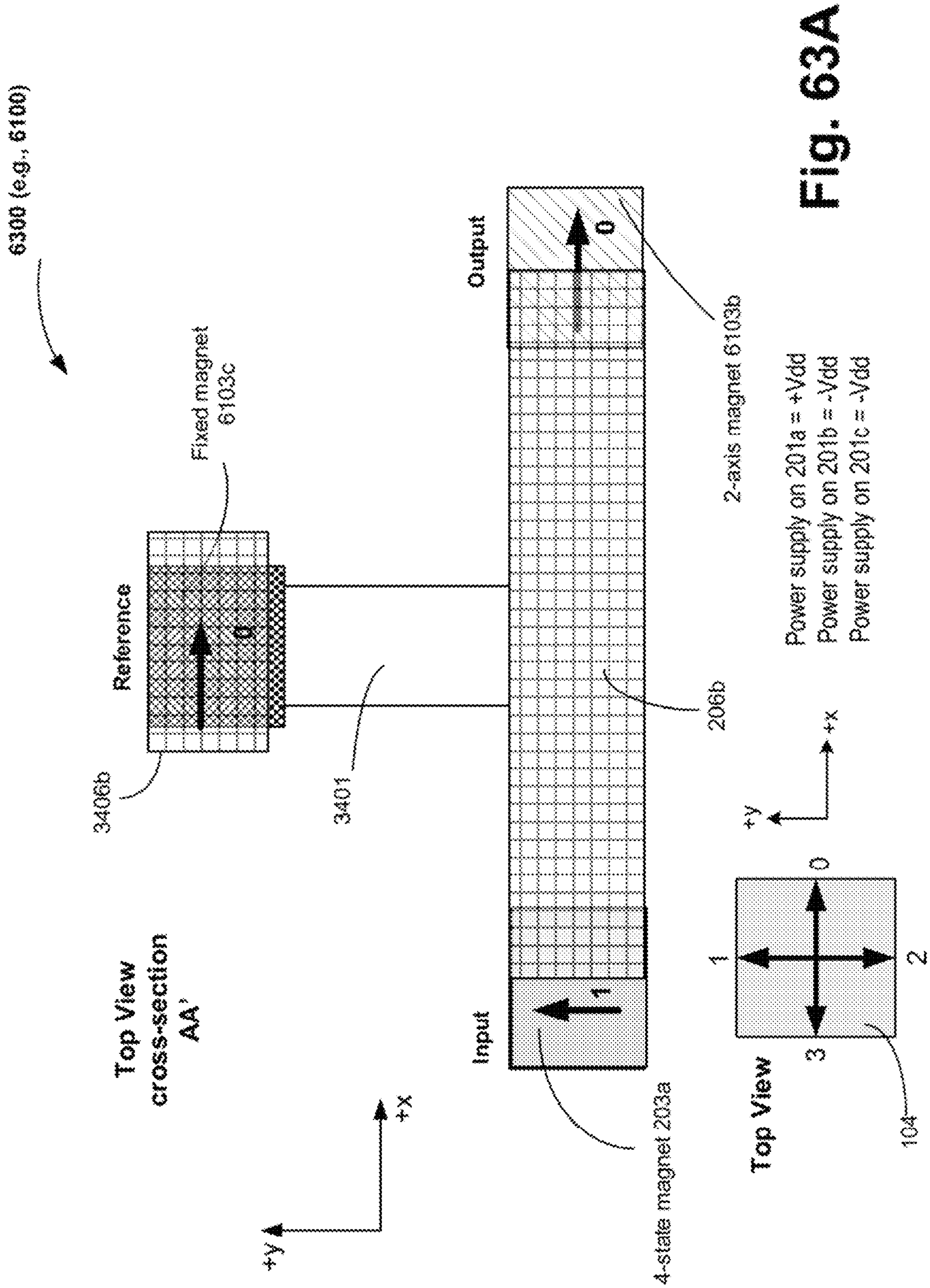

FIG. 63A illustrates top view 6300 of cross-section AA' of the ASL device 6100 of FIG. 61A with input 4-state magnet orientation '1' (i.e., +y direction) and reference fixed magnet orientation '0' (i.e., +x direction), according to some embodiments of the disclosure. It is pointed out that those elements of FIG. 63A having the same reference numbers (or names) as the elements of any other figure can operate or function in any manner similar to that described, but are not limited to such.

ASL device 6300 forms quaternary upper threshold logic Gate 0 of Table 9, according to some embodiments. ASL device 6300 is a top-view of ASL device 6100 along the dotted line AA'. Here, the input magnet is 4-state magnet 203*a* with magnetization along direction '1' (i.e., along the +y axis), output magnet 6103*b* is a biaxial (e.g., 2-state or bi-stable magnet), and reference magnet 6103*c* is a fixed magnet having a magnetization in the +x direction (or along direction '0'). In some embodiments, when the input spin current in the +x direction arrives at input 4-state magnet 203*a*, the magnetization of output magnet 6103*b* is always along direction '0' (i.e., +x direction).

In some embodiments, ASL device 6300 uses a fixed magnetic spin current input in the +x direction. This breaks the symmetry to enable the logic gate to generate the output. For ASL device 6300, output magnet 6103*b* is a bi-stable magnet with shape or crystalline anisotropy pointing only in one direction. In this case, direction of magnetization of output magnet 6103*b* is in the direction '0' (i.e., +x direction) regardless of the input spin current direction received by input magnet 203*a* (which is magnetized in direction '1').

Here, the power supply on interconnect 201*a* is +Vdd (positive power supply), power supply on interconnect 201*b* is +Vdd (positive power supply), and power supply on interconnect 201*c* is −Vdd (negative power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

Figure 64A:
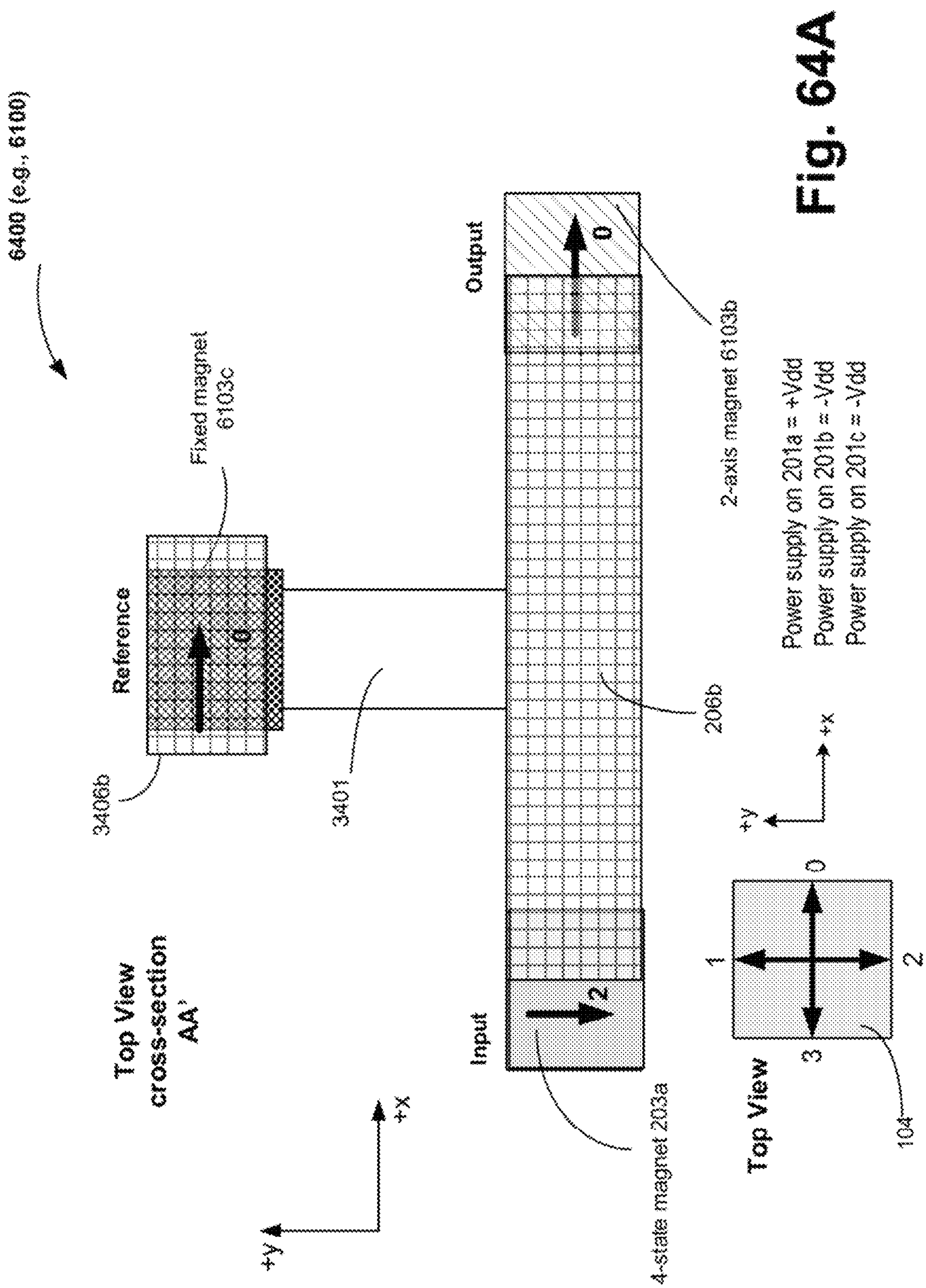

FIG. 64A illustrates top view 6400 of cross-section AA' of the ASL device 6100 of FIG. 61A with input 4-state magnet orientation '2' (i.e., −y direction) and reference fixed magnet orientation '0' (i.e., +x direction), according to some embodiments of the disclosure. It is pointed out that those elements of FIG. 64A having the same reference numbers (or names) as the elements of any other figure can operate or function in any manner similar to that described, but are not limited to such.

ASL device 6400 forms quaternary upper threshold logic Gate 0 of Table 9, according to some embodiments. ASL device 6400 is a top-view of ASL device 6100 along the dotted line AA'. Here, the input magnet is 4-state magnet 203*a* with magnetization along direction '2' (i.e., along the −y axis), output magnet 6103*b* is a biaxial (e.g., 2-state or bi-stable magnet), and reference magnet 6103*c* is a fixed magnet having a magnetization in the +x direction (or along direction '0'). In some embodiments, when input spin current in the +x direction arrives at input 4-state magnet 203*a*, the magnetization of output magnet 6103*b* is always along direction '0' (i.e., +x direction).

In some embodiments, ASL device 6400 uses a fixed magnetic spin current input in the +x direction. This breaks the symmetry to enable the logic gate to generate the output. For ASL device 6400, output magnet 6103*b* is a bi-stable magnet with shape or crystalline anisotropy pointing only in one direction. In this case, direction of magnetization of output magnet 6103*b* is in the direction '0' (i.e., +x direction) regardless of the input spin current direction received by input magnet 203*a* (which is magnetized in direction '2').

Here, the power supply on interconnect 201*a* is +Vdd (positive power supply), power supply on interconnect 201*b* is −Vdd (negative power supply), and power supply on interconnect 201*c* is −Vdd (negative power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

Figure 65A:
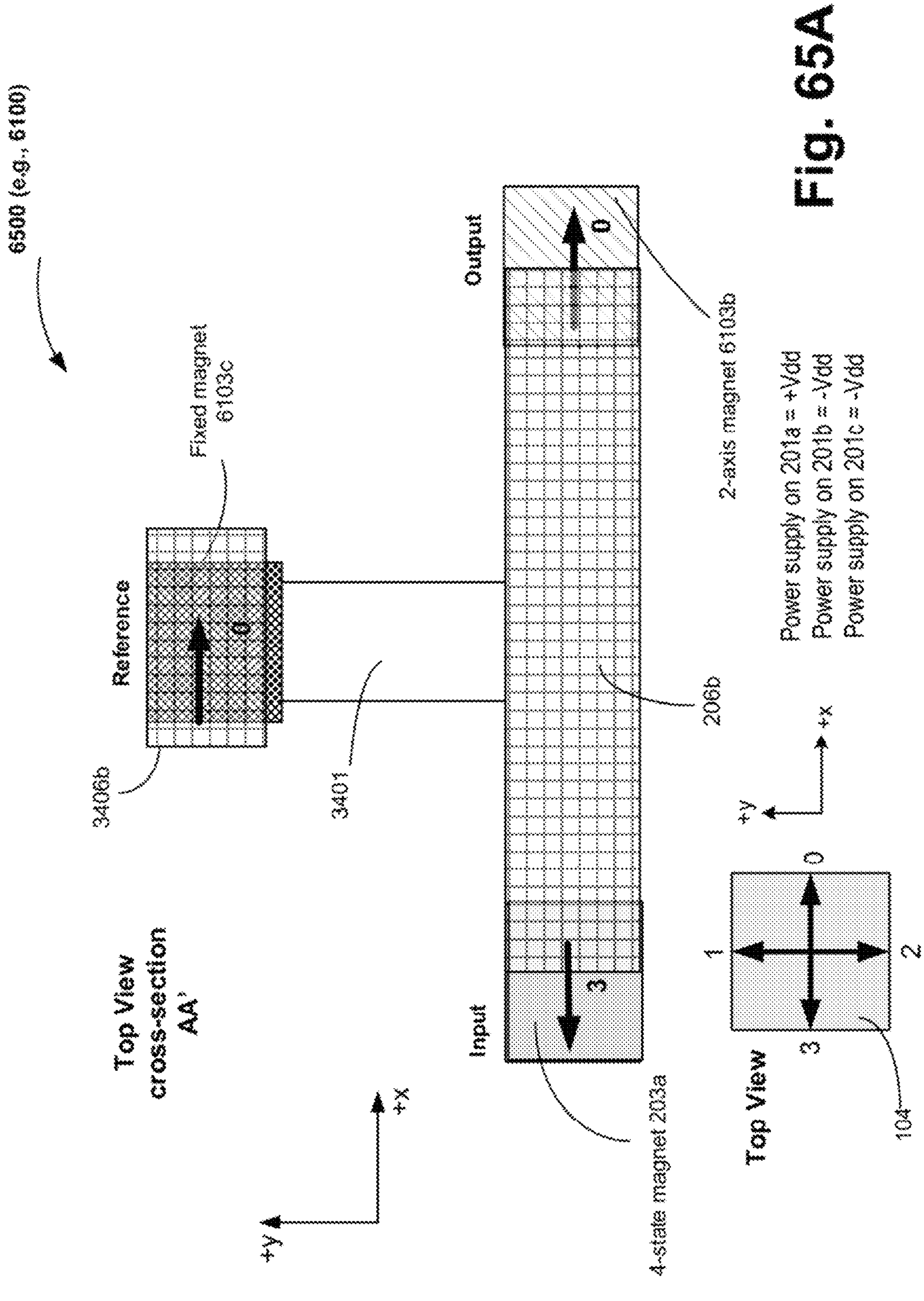

FIG. 65A illustrates top view 6500 of cross-section AA' of the ASL device 6100 of FIG. 61A with input 4-state magnet orientation '3' (i.e., −x direction) and reference fixed magnet orientation '0' (i.e., +x direction), according to some embodiments of the disclosure. It is pointed out that those elements of FIG. 65A having the same reference numbers (or names) as the elements of any other figure can operate or function in any manner similar to that described, but are not limited to such.

ASL device 6500 forms quaternary upper threshold logic Gate 0 of Table 9, according to some embodiments. ASL device 6500 is a top-view of ASL device 6100 along the dotted line AA'. Here, the input magnet is 4-state magnet 203*a* with magnetization along direction '3' (i.e., along the −x axis), output magnet 6103*b* is a biaxial (2-state or bi-stable magnet), and reference magnet 6103*c* is a fixed magnet having a magnetization in the +x direction (or along direction '0'). In some embodiments, when the input spin current in the +x direction arrives at input 4-state magnet 203*a*, the magnetization of output magnet 6103*b* is always along direction '0' (i.e., +x direction).

In some embodiments, ASL device 6500 uses a fixed magnetic spin current input in the +x direction. This breaks the symmetry to enable the logic gate to generate the output. For ASL device 6500, output magnet 6103*b* is a bi-stable magnet with shape or crystalline anisotropy pointing only in one direction. In this case, direction of magnetization of output magnet 6103*b* is in the direction '0' (i.e., +x direction) regardless of the input spin current direction received by input magnet 203*a* (which is magnetized in direction '3').

Here, power supply on interconnect 201*a* is +Vdd (positive power supply), power supply on interconnect 201*b* is −Vdd (negative power supply), and power supply on interconnect 201*c* is −Vdd (negative power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

FIG. 61B illustrates a 3D view of ASL device 6120 which is operable to perform one of logics of lower threshold logic gate, according to some embodiments of the disclosure. It is pointed out that those elements of FIG. 61B having the same reference numbers (or names) as the elements of any other figure can operate or function in any manner similar to that described, but are not limited to such. So as not to obscure the embodiment of FIG. 61B, differences between FIG. 61A and FIG. 61B are described.

In some embodiments instead of applying negative power supply −Vdd to interconnect 201*b*, positive power supply +Vdd is applied to interconnect 201*b*. In some embodiments, third magnet 6103*c* is replaced with third magnet 6123*c*, where third magnet 6123*c* is a fixed magnet with magnetization in the −x axis (i.e., direction '3'). Functionally, ASL device 6100 is same as ASL device 6120.

FIG. 62B, FIG. 63B, FIG. 64B, and FIG. 65B refer to logic Gate 0 of the quaternary lower threshold logic gates which correspond to device 6120 of FIG. 61B along cross-section AA', according to some embodiments of the disclosure.

Figure 62B:
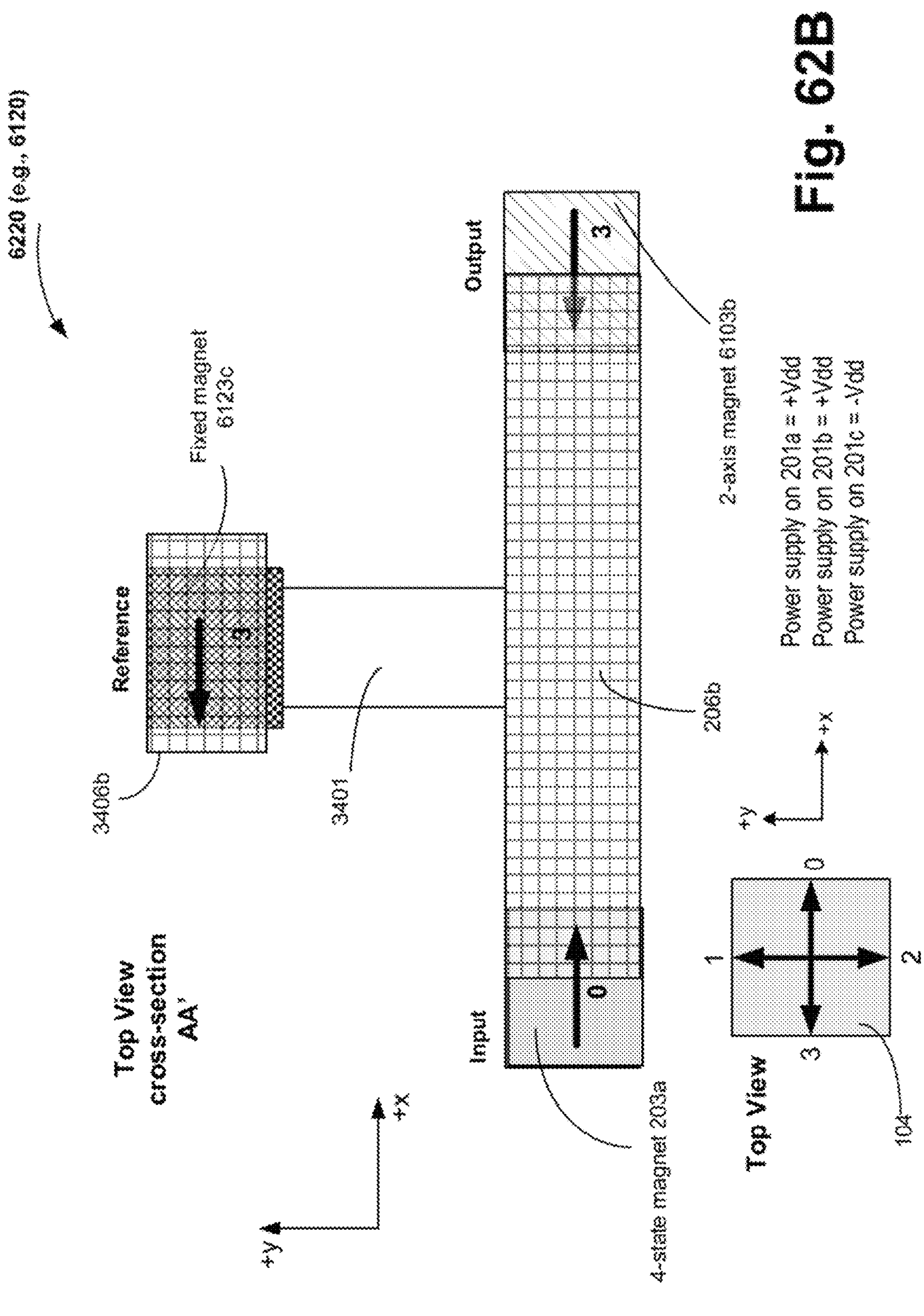

FIG. 62B illustrates top view 6220 of cross-section AA' of the ASL device 6120 of FIG. 61B with input 4-state magnet orientation '0' (i.e., +x direction) and reference fixed magnet orientation '3' (i.e., −x direction), according to some embodiments of the disclosure. It is pointed out that those elements of FIG. 62B having the same reference numbers (or names) as the elements of any other figure can operate or function in any manner similar to that described, but are not limited to such.

ASL device 6220 forms quaternary lower threshold logic Gate 0 of Table 9, according to some embodiments. ASL device 6220 is a top-view of ASL device 6120 along the dotted line AA'. Here, the input magnet is 4-state magnet 203*a*, output magnet 6103*b* is a biaxial (e.g., 2-state or bi-stable magnet), and reference magnet 6123*c* is a fixed magnet having a magnetization in the −x direction (or along state '3'). Here, the power supply on interconnect 201*a* is +Vdd (positive power supply), power supply on interconnect 201*b* is +Vdd (positive power supply), and power supply on interconnect 201*c* is −Vdd (negative power supply).

In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '3' (i.e., −x direction).

Figure 63B:
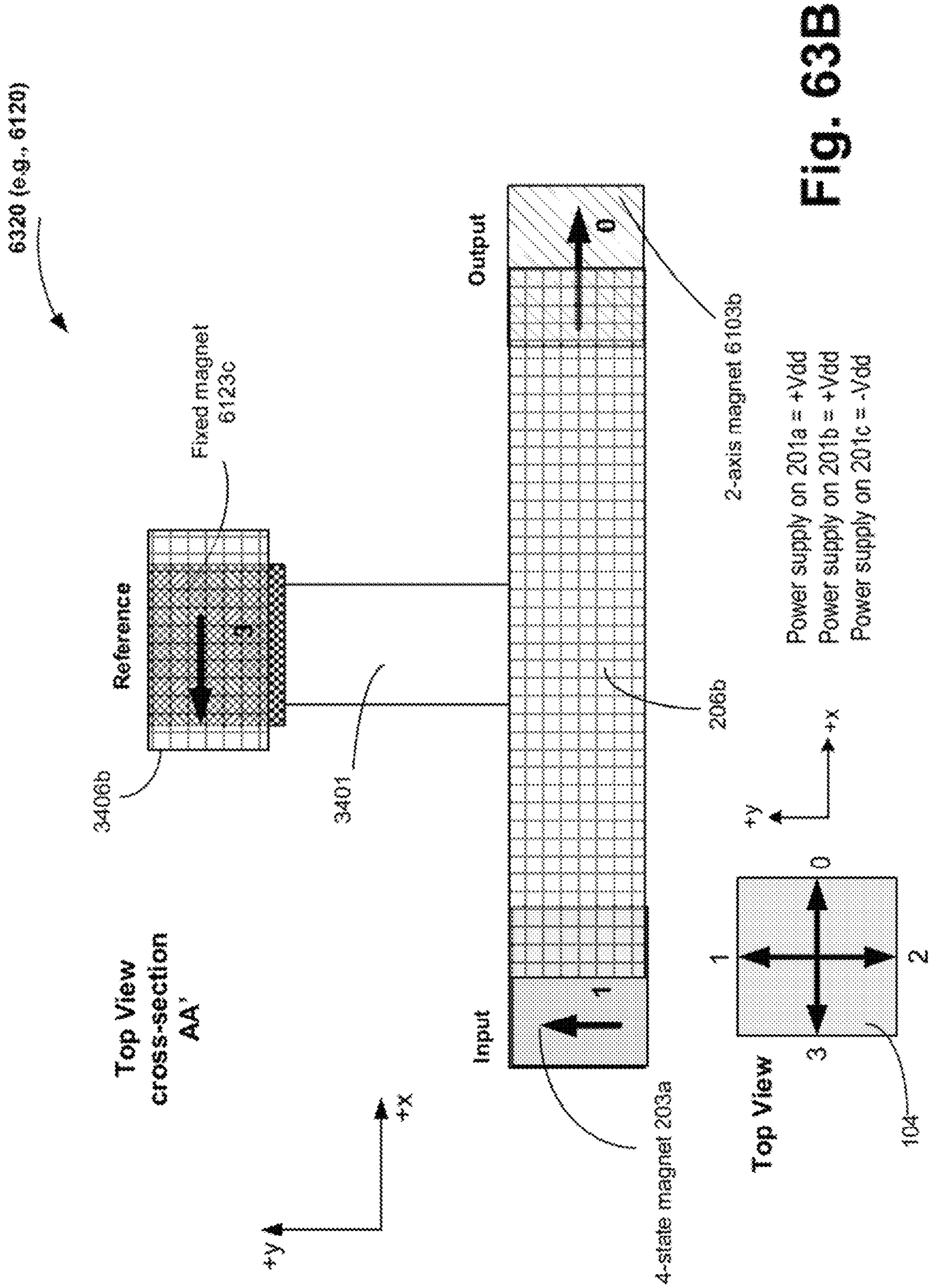

FIG. 63B illustrates top view 6320 of cross-section AA' of the ASL device 6120 of FIG. 61B with input 4-state magnet orientation '1' (i.e., +y direction) and reference fixed magnet orientation '3' (i.e., −x direction), according to some embodiments of the disclosure. It is pointed out that those elements of FIG. 63B having the same reference numbers (or names) as the elements of any other figure can operate or function in any manner similar to that described, but are not limited to such.

ASL device 6320 forms quaternary upper threshold logic Gate 0 of Table 9, according to some embodiments. ASL device 6320 is a top-view of ASL device 6120 along the dotted line AA'. Here, the input magnet is 4-state magnet 203*a* with magnetization along direction '1' (i.e., along +y axis), output magnet 6103*b* is a biaxial (e.g., 2-state or bi-stable magnet), and reference magnet 6123*c* is a fixed magnet having a magnetization in the −x direction (or along direction '3'). In some embodiments, when the input spin current in the +x direction arrives at input 4-state magnet 203*a*, the magnetization of output magnet 6103*b* is always along direction '0' (i.e., +x direction).

In some embodiments, ASL device 6320 uses a fixed magnetic spin current input in the −x direction. This breaks the symmetry to enable the logic gate to generate the output. For ASL device 6320, output magnet 6103*b* is a bi-stable magnet with shape or crystalline anisotropy pointing only in one direction. In this case, direction of magnetization of output magnet 6103*b* is in the direction '0' (i.e., the +x direction) regardless of the input spin current direction received by input magnet 203*a* (which is magnetized in direction '1').

Here, power supply on interconnect 201*a* is +Vdd (positive power supply), power supply on interconnect 201*b* is +Vdd (positive power supply), and power supply on interconnect 201*c* is −Vdd (negative power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

Figure 64B:
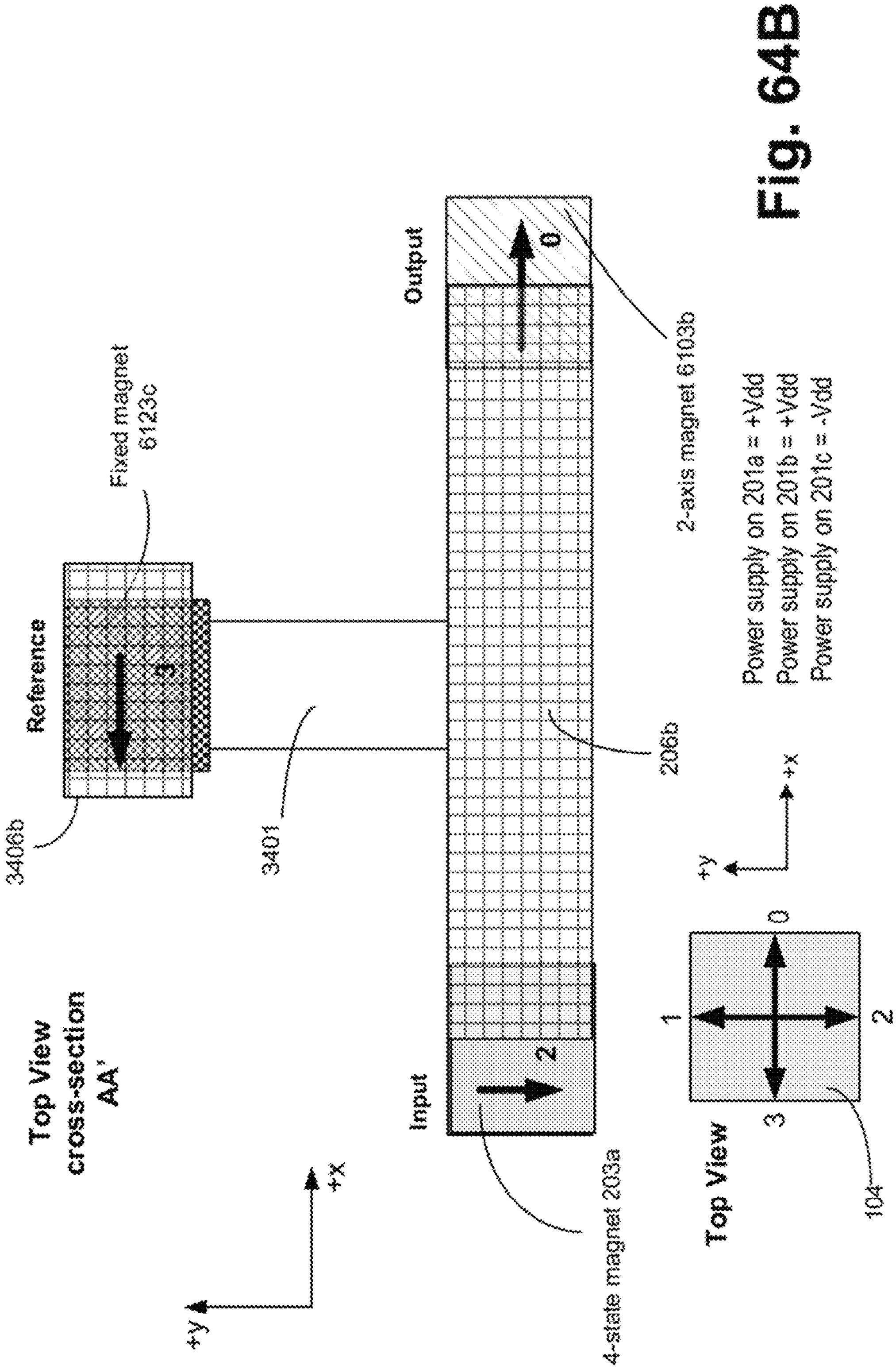

FIG. 64B illustrates top view 6420 of cross-section AA' of the ASL device 6120 of FIG. 61B with input 4-state magnet orientation '2' (i.e., −y direction) and reference fixed magnet orientation '3' (i.e., −x direction), according to some embodiments of the disclosure. It is pointed out that those elements of FIG. 64B having the same reference numbers (or names) as the elements of any other figure can operate or function in any manner similar to that described, but are not limited to such.

ASL device 6420 forms quaternary upper threshold logic Gate 0 of Table 9, according to some embodiments. ASL device 6420 is a top-view of ASL device 6120 along the dotted line AA'. Here, the input magnet is 4-state magnet 203*a* with magnetization along direction '2' (i.e., along −y axis), output magnet 6103*b* is a biaxial (2-state or bi-stable magnet), and reference magnet 6123*c* is a fixed magnet having a magnetization in the −x direction (or along direction '3'). In some embodiments, when the input spin current in the +x direction arrives at input 4-state magnet 203*a*, the magnetization of output magnet 6103*b* is always along direction '0' (i.e., +x direction).

In some embodiments, ASL device 6420 uses a fixed magnetic spin current input in the −x direction. This breaks the symmetry to enable the logic gate to generate the output. For ASL device 6420, output magnet 6103*b* is a bi-stable magnet with shape or crystalline anisotropy pointing only in one direction. In this case, the direction of magnetization of output magnet 6103*b* is in the direction '0' (i.e., +x direction) regardless of the input spin current direction received by input magnet 203*a* (which is magnetized in direction '2').

Here, the power supply on interconnect 201*a* is +Vdd (positive power supply), power supply on interconnect 201*b* is +Vdd (positive power supply), and power supply on interconnect 201*c* is −Vdd (negative power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

Figure 65B:
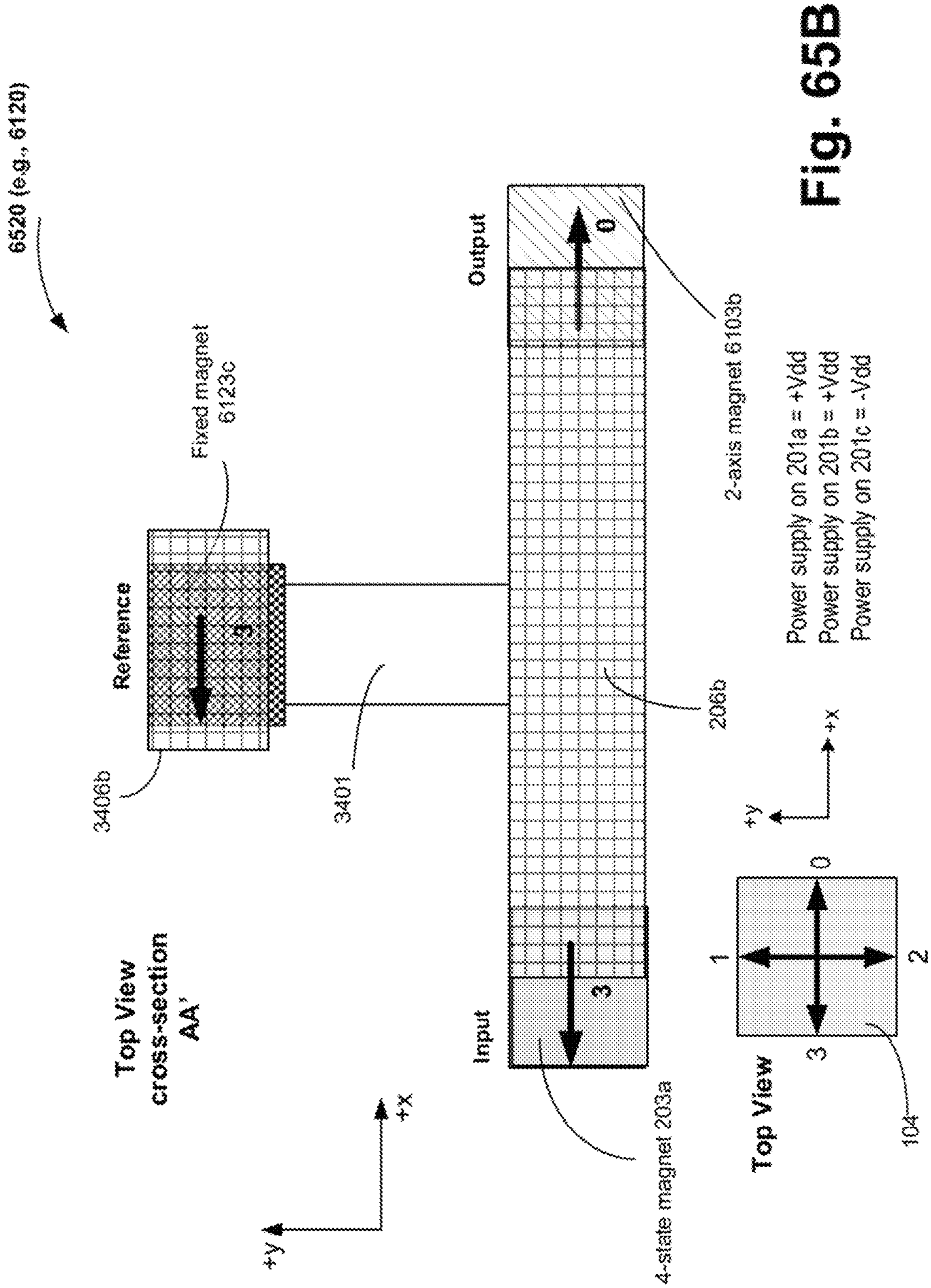

FIG. 65B illustrates top view 6520 of cross-section AA' of the ASL device 6120 of FIG. 61B with input 4-state magnet orientation '3' (i.e., −x direction) and reference fixed magnet orientation '3' (i.e., −x direction), according to some embodiments of the disclosure. It is pointed out that those elements of FIG. 65B having the same reference numbers (or names) as the elements of any other figure can operate or function in any manner similar to that described, but are not limited to such.

ASL device 6520 forms quaternary upper threshold logic Gate 0 of Table 9, according to some embodiments. ASL device 6520 is a top-view of ASL device 6120 along the dotted line AA'. Here, the input magnet is 4-state magnet 203*a* with magnetization along direction '3' (i.e., along −x axis), output magnet 6103*b* is a biaxial (2-state or bi-stable magnet), and reference magnet 6103*c* is a fixed magnet having a magnetization in the −x direction (or along direction '3'). In some embodiments, when the input spin current in the +x direction arrives at input 4-state magnet 203*a*, the magnetization of output magnet 6103*b* is always along direction '0' (i.e., +x direction).

In some embodiments, ASL device 6520 uses a fixed magnetic spin current input in the −x direction. This breaks the symmetry to enable the logic gate to generate the output. For ASL device 6520, output magnet 6103*b* is a bi-stable magnet with shape or crystalline anisotropy pointing only in one direction. In this case, direction of magnetization of output magnet 6103*b* is in the direction '0' (i.e., +x direction) regardless of the input spin current direction received by input magnet 203*a* (which is magnetized in direction '3').

Here, power supply on interconnect 201*a* is +Vdd (positive power supply), power supply on interconnect 201*b* is +Vdd (positive power supply), and power supply on interconnect 201*c* is −Vdd (negative power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

Figure 66:
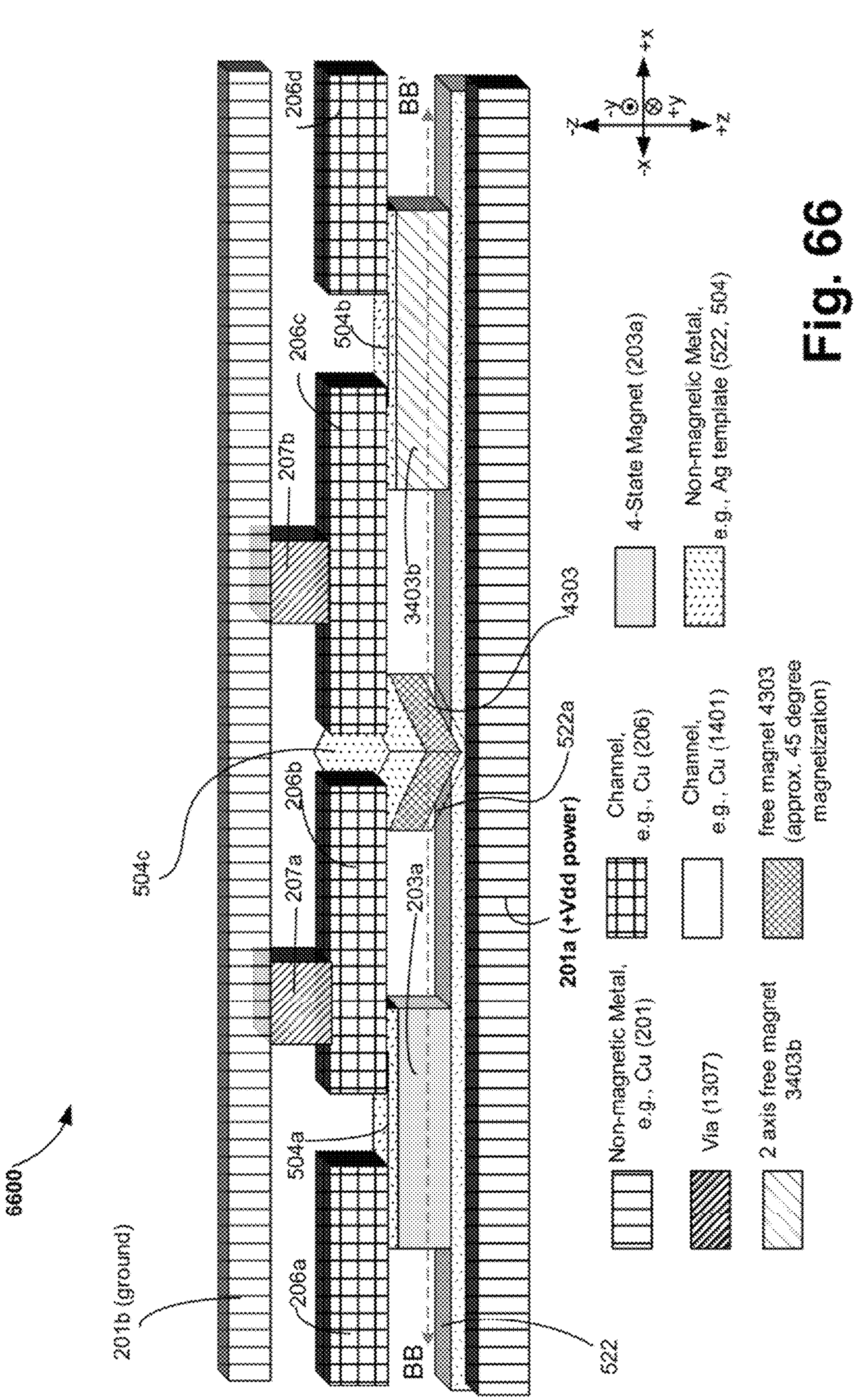
FIG. 66 illustrates a 3D view of an ASL device which is operable to perform one of logics of lower threshold logic gate, according to some embodiments of the disclosure.

FIG. 66 illustrates a 3D view of an ASL device 6600 which is operable to perform one of logics of lower threshold logic gate. It is pointed out that those elements of FIG. 66 having the same reference numbers (or names) as the elements of any other figure can operate or function in any manner similar to that described, but are not limited to such. Compared to FIG. 43, the power supply applied to interconnect 201*a* for ASL device 6600 is a positive power supply (+Vdd). Positive supply (+Vdd) extracts spin polarization aligned with the magnet, according to some embodiments.

FIGS. 67-70 refer to logic Gate 1 of Table 9 of the quaternary lower threshold logic gate which corresponds to device 6600 along cross-section AA'.

Figure 67:
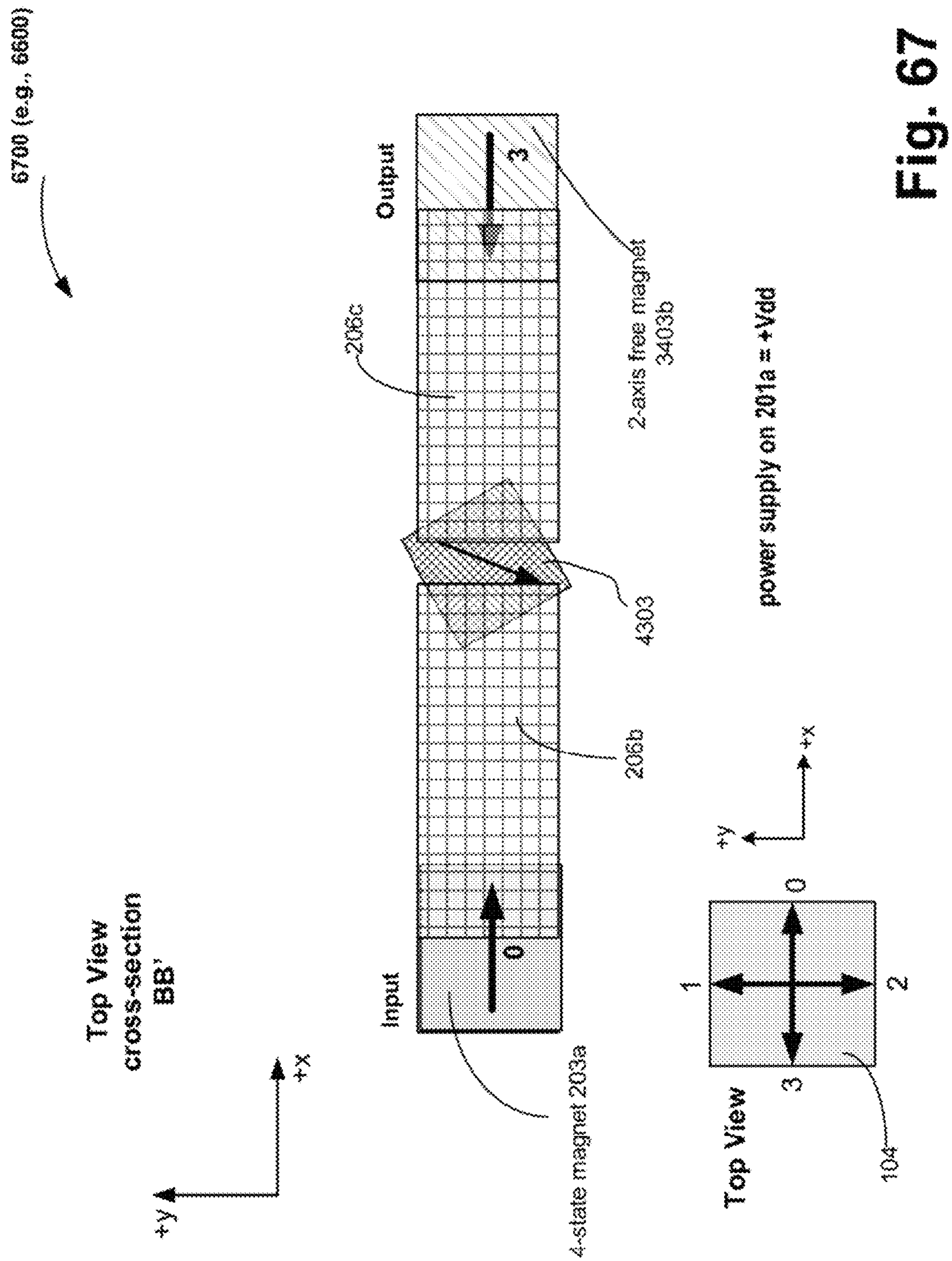
FIGS. 67-70 illustrate logic Gate 1 of the quaternary lower threshold logic gate which corresponds to the ASL device of FIG. 66, according to some embodiments of the disclosure.

FIG. 67 illustrates top view 6700 of cross-section BB-BB' of ASL device 6600 of FIG. 66 with input 4-state magnet orientation '0' (i.e., +x direction), according to some embodiments of the disclosure. It is pointed out that those elements of FIG. 67 having the same reference numbers (or names) as the elements of any other figure can operate or function in any manner similar to that described, but are not limited to such. In some embodiments, when positive supply is provided to interconnect 201*a* and when spin current is injected into input 4-state magnet 203*a* with magnetization in direction '0', tilted magnet 4303 develops a magnetization along the −45° as shown. As such, the spin current in interconnect 206*c* causes output magnet 3403*b* to develop magnetization along direction '3'.

While the embodiments of FIGS. 67-70 describe quaternary lower threshold gate 1 of Table 9 with interconnect 201*a* being coupled to positive power supply (e.g., +Vdd), the same results for magnetization of output magnet 3403*b* are achieved when interconnect 201*a* is coupled to negative power supply (e.g., −Vdd), in accordance with some embodiments.

Figure 68:
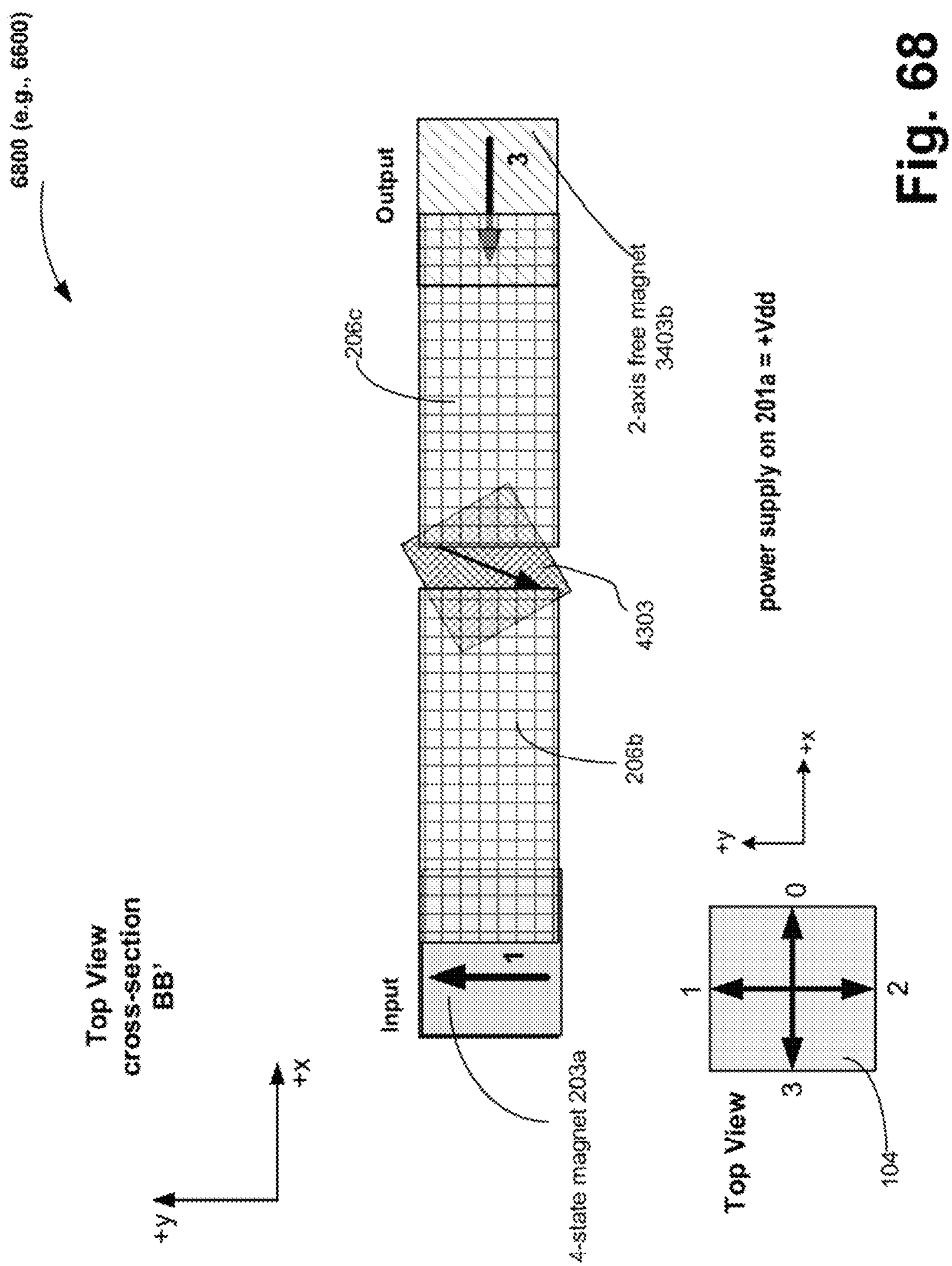

FIG. 68 illustrates top view 6800 of cross-section BB-BB' of ASL device 6600 of FIG. 66 with input 4-state magnet orientation '1' (i.e., +x direction), according to some embodiments of the disclosure. It is pointed out that those elements of FIG. 68 having the same reference numbers (or names) as the elements of any other figure can operate or function in any manner similar to that described, but are not limited to such. In some embodiments, when a positive supply is provided to interconnect 201*a* and when spin current is injected into input 4-state magnet 203*a* with magnetization in direction '1', tilted magnet 4303 develops a magnetization along the −45° as shown. As such, the spin current in interconnect 206*c* causes output magnet 3403*b* to develop magnetization along direction '3'.

Figure 69:
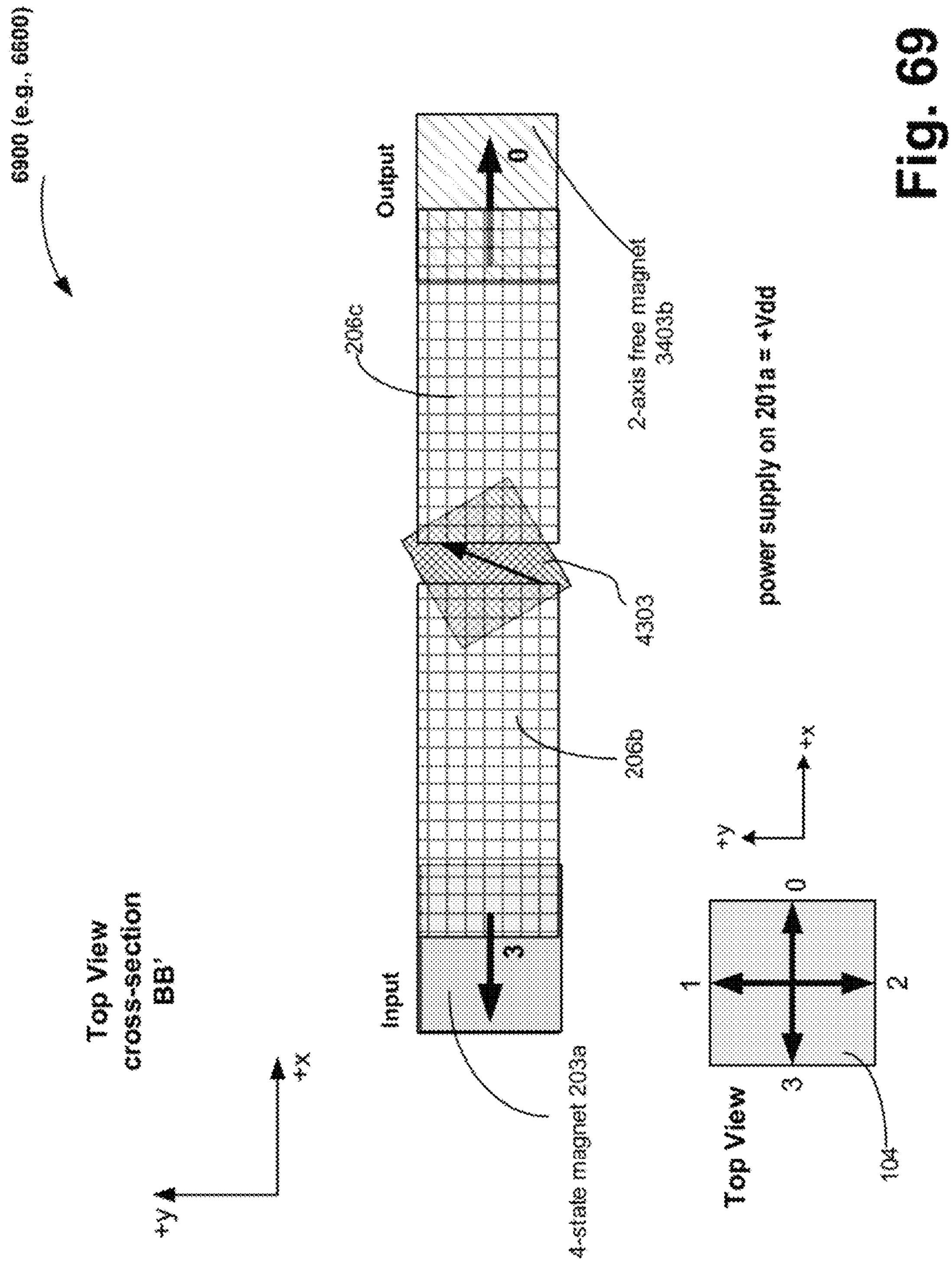

FIG. 69 illustrates top view 6900 of cross-section BB-BB' of ASL device 6600 of FIG. 66 with input 4-state magnet orientation '3' (i.e., +x direction), according to some embodiments of the disclosure. It is pointed out that those elements of FIG. 69 having the same reference numbers (or names) as the elements of any other figure can operate or function in any manner similar to that described, but are not limited to such. In some embodiments, when a positive supply is provided to interconnect 201*a* and when spin current is injected into input 4-state magnet 203*a* with magnetization in direction '3', tilted magnet 4303 develops a magnetization along the +45° as shown. As such, the spin current in interconnect 206*c* causes output magnet 3403*b* to develop magnetization along direction '0'.

Figure 70:
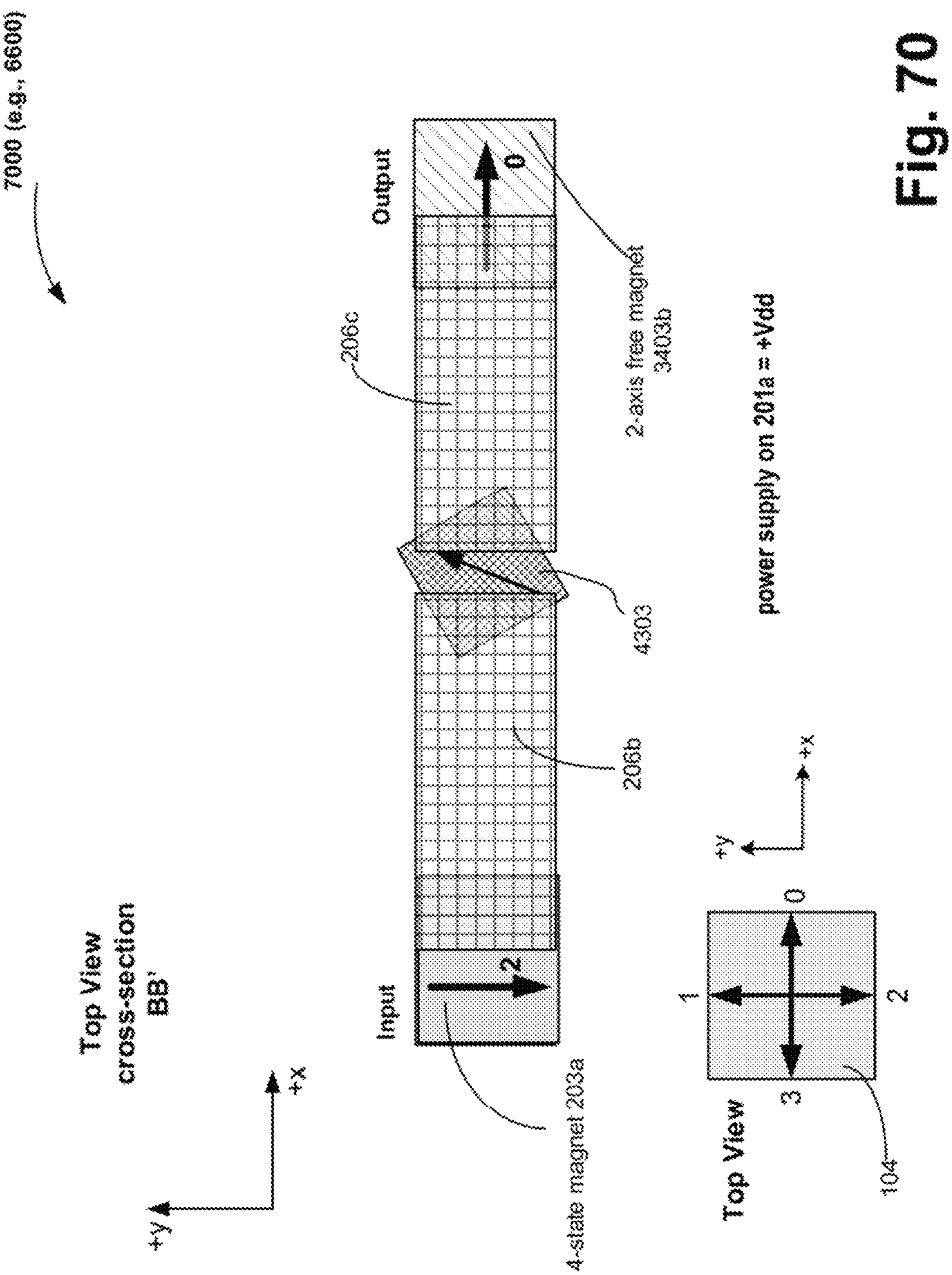

FIG. 70 illustrates top view 7000 of cross-section BB-BB' of ASL device 6600 of FIG. 66 with the input 4-state magnet orientation '2' (i.e., +x direction), according to some embodiments of the disclosure. It is pointed out that those elements of FIG. 70 having the same reference numbers (or names) as the elements of any other figure can operate or function in any manner similar to that described, but are not limited to such. In some embodiments, when positive supply is provided to interconnect 201*a* and when spin current is injected into input 4-state magnet 203*a* with magnetization in direction '2', tilted magnet 4303 develops a magnetization along the +45° as shown. As such, the spin current in interconnect 206*c* causes output magnet 3403*b* to develop magnetization along direction '0'.

Figure 71A:
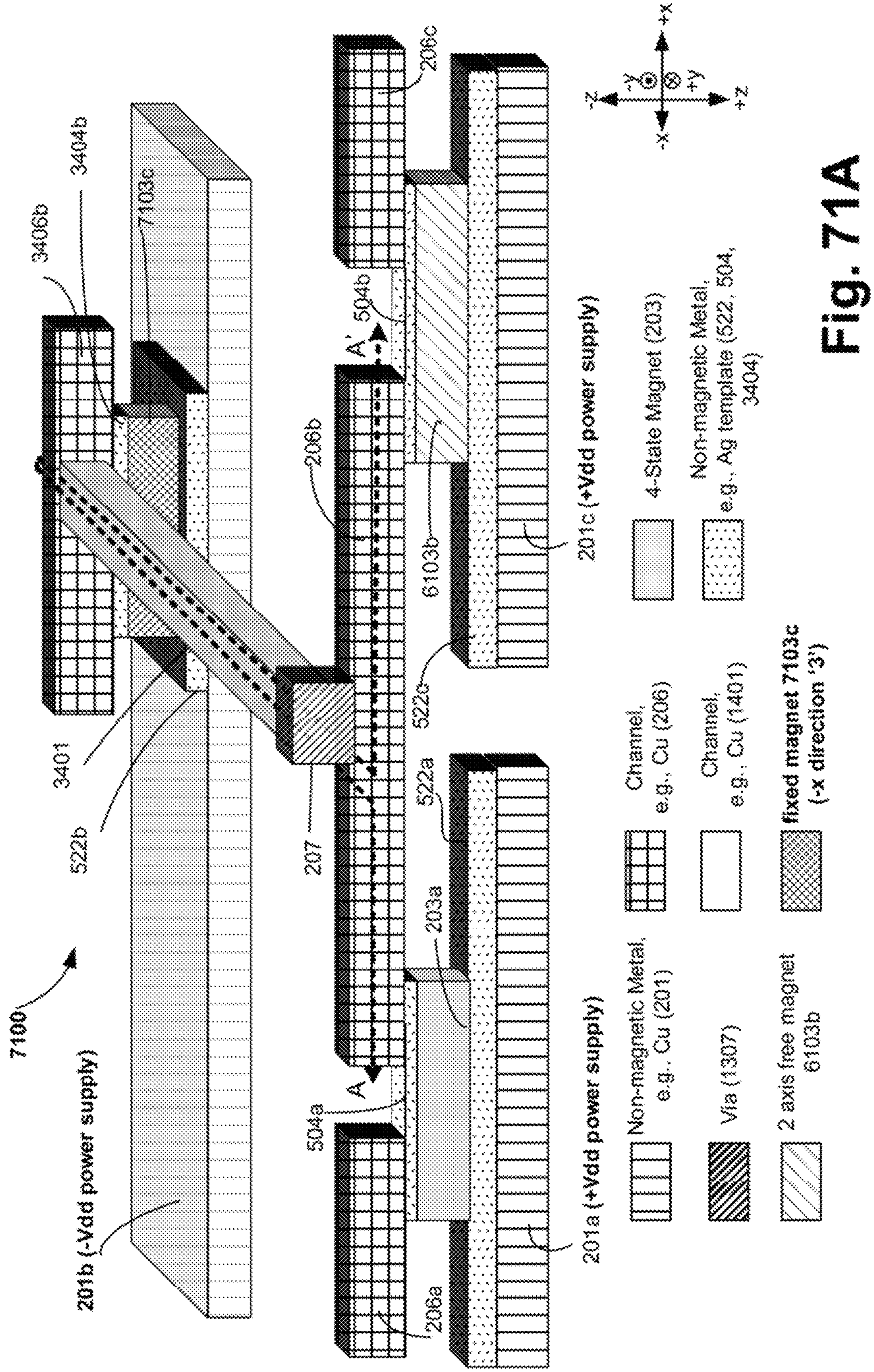
FIGS. 71A-B illustrate a 3D view of an ASL device with a tilted magnet which is operable to perform logic of Gate 2 of quaternary lower threshold logic, according to some embodiments of the disclosure.

FIG. 71A illustrates a 3D view of ASL device 7100 which is operable to perform one of logics of lower threshold logic gate, according to some embodiments of the disclosure. Compared to FIG. 61A, fixed magnet 6103*c* is replaced with fixed magnet 7103*c*, where fixed magnet 7103*c* is pinned in the −x direction (i.e., direction '3'), in accordance with some embodiments. For ASL device 7100, interconnect 201*a* is provided with a positive power supply (+Vdd), interconnect 201*b* is provided with negative power supply (−Vdd), and interconnect 201*c* is provided with positive power supply (+Vdd). FIG. 72A, FIG. 73A, FIG. 74A, and FIG. 75A refer to logic Gate 3 of the quaternary lower threshold logic gates which correspond to device 7100 of FIG. 71A along cross-section AA', according to some embodiments of the disclosure.

Figure 71B:
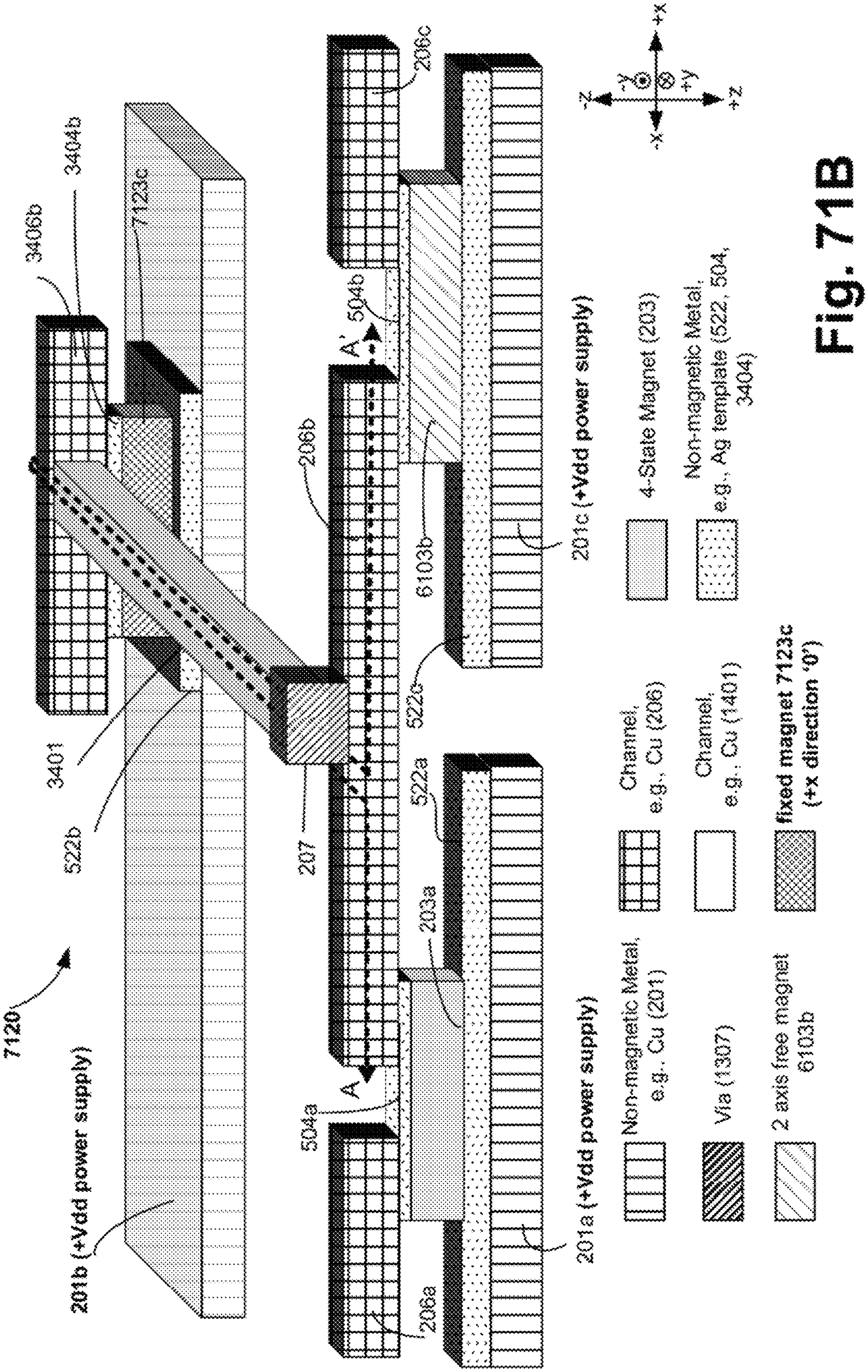

FIG. 71B illustrates a 3D view of ASL device 7120 which is operable to perform one of logics of lower threshold logic gate, according to some embodiments of the disclosure. Compared to FIG. 61B, fixed magnet 6123*c* is replaced with fixed magnet 7123*c*, where fixed magnet 7123*c* is pinned in the +x direction (i.e., direction '0'), in accordance with some embodiments. For ASL device 7120, interconnect 201*a* is provided with positive power supply (+Vdd), interconnect 201*b* is provided with positive power supply (+Vdd), and interconnect 201*c* is provided with positive power supply (+Vdd). FIG. 72B, FIG. 73B, FIG. 74B, and FIG. 75B refer to logic Gate 3 of Table 9 of the quaternary lower threshold logic gates which correspond to device 7120 of FIG. 71B along cross-section AA', according to some embodiments of the disclosure.

Figure 72A:
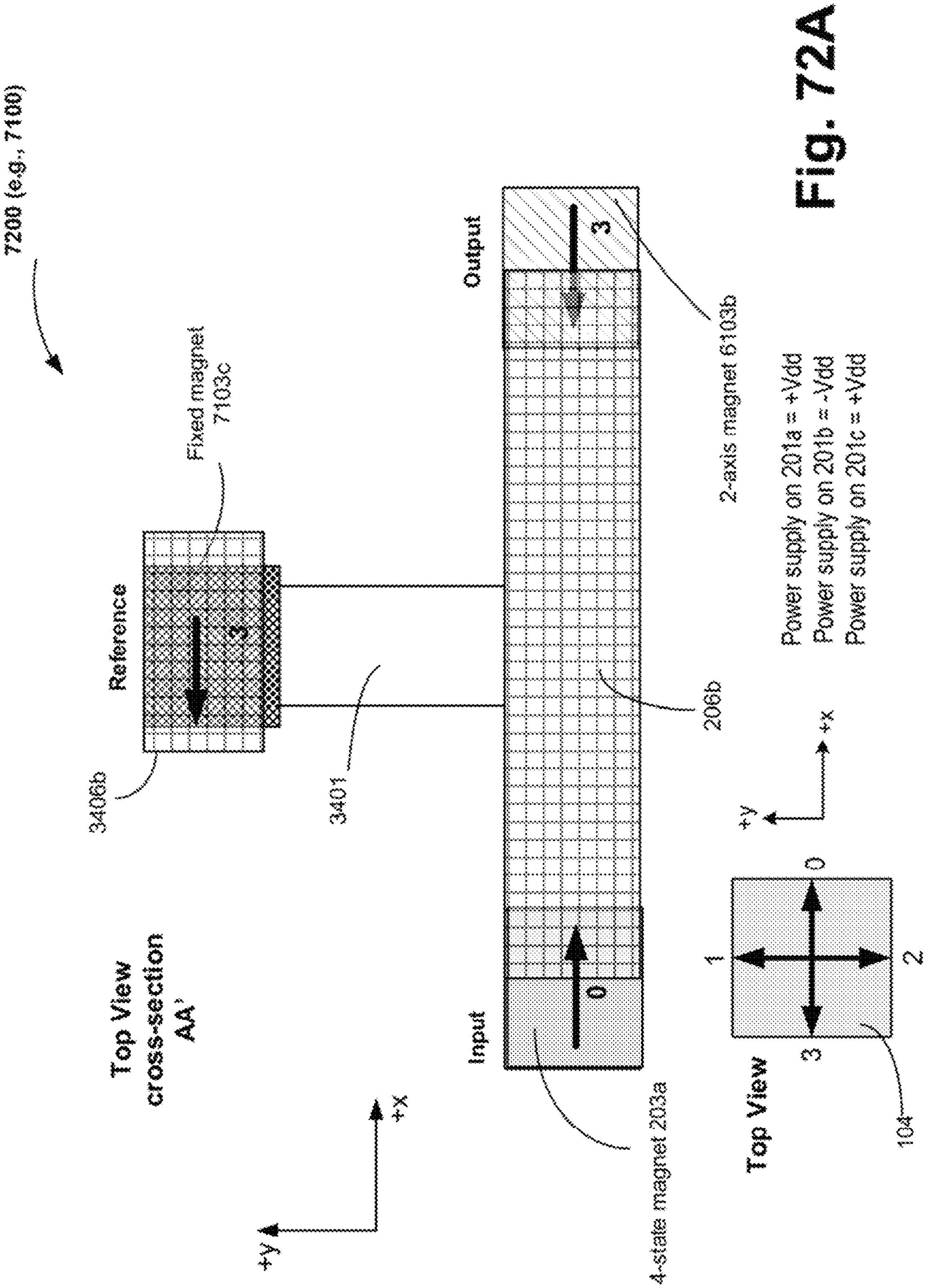
FIGS. 72A-B to FIGS. 75A-B illustrate logic Gate 2 which corresponds to ASL device of FIG. 71, according to some embodiments.

FIG. 72A illustrates top view 7200 of cross-section AA' of the ASL device 7100 of FIG. 71A with input 4-state magnet orientation '3' (i.e., −x direction) and reference fixed magnet orientation '3' (i.e., −x direction), according to some embodiments of the disclosure. It is pointed out that those elements of FIG. 72A having the same reference numbers (or names) as the elements of any other figure can operate or function in any manner similar to that described, but are not limited to such.

ASL device 7200 forms quaternary lower threshold logic Gate 3 of Table 9, according to some embodiments. ASL device 7200 is a top-view of ASL device 7100 along the dotted line AA'. Here, the input magnet is 4-state magnet 203*a*, output magnet 6103*b* is a biaxial (2-state or bi-stable magnet), and reference magnet 7103*c* is a fixed magnet having a magnetization in the −x direction (or along state '3'). Here, power supply on interconnect 201*a* is +Vdd (positive power supply), power supply on interconnect 201*b* is −Vdd (negative power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when the input spin current in the +x direction arrives at input 4-state magnet 203*a*, the magnetization of output magnet 6103*b* is along direction '3' (i.e., −x direction).

Figure 73A:
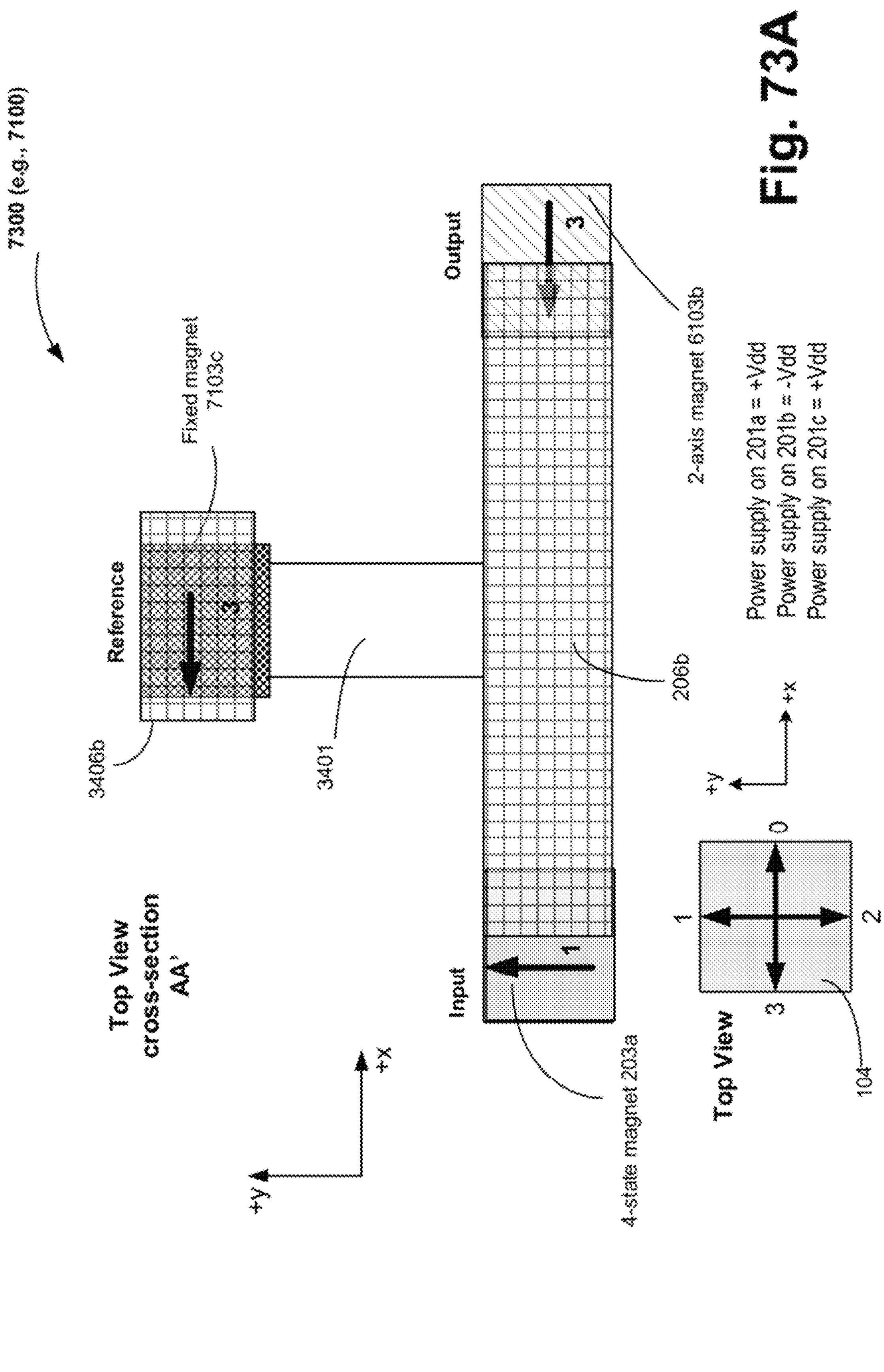

FIG. 73A illustrates top view 7300 of cross-section AA' of the ASL device 7100 of FIG. 71A with input 4-state magnet orientation '1' (i.e., +y direction) and reference fixed magnet orientation '3' (i.e., −x direction), according to some embodiments of the disclosure. It is pointed out that those elements of FIG. 73A having the same reference numbers (or names) as the elements of any other figure can operate or function in any manner similar to that described, but are not limited to such.

ASL device 7300 forms quaternary upper threshold logic Gate 3 of Table 9, according to some embodiments. ASL device 7300 is a top-view of ASL device 7100 along the dotted line AA'. Here, the input magnet is 4-state magnet 203*a* with magnetization along direction '1' (i.e., along +y axis), output magnet 6103*b* is a biaxial (2-state or bi-stable magnet), and reference magnet 7103*c* is a fixed magnet having a magnetization in the −x direction (or along direction '3'). In some embodiments, when input spin current in the +x direction arrives at input 4-state magnet 203*a*, the magnetization of output magnet 6103*b* is always along direction '3' (i.e., −x direction).

In some embodiments, ASL device 7300 uses a fixed magnetic spin current input in the −x direction. This breaks the symmetry to enable the logic gate to generate the output. For ASL device 7300, output magnet 6103*b* is a bi-stable magnet with shape or crystalline anisotropy pointing only in one direction. In this case, the direction of magnetization of output magnet 6103*b* is in the direction '3' (i.e., −x direction) regardless of the input spin current direction received by input magnet 203*a* (which is magnetized in direction '1').

Here, power supply on interconnect 201*a* is +Vdd (positive power supply), power supply on interconnect 201*b* is −Vdd (negative power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '3' (i.e., −x direction).

Figure 74A:
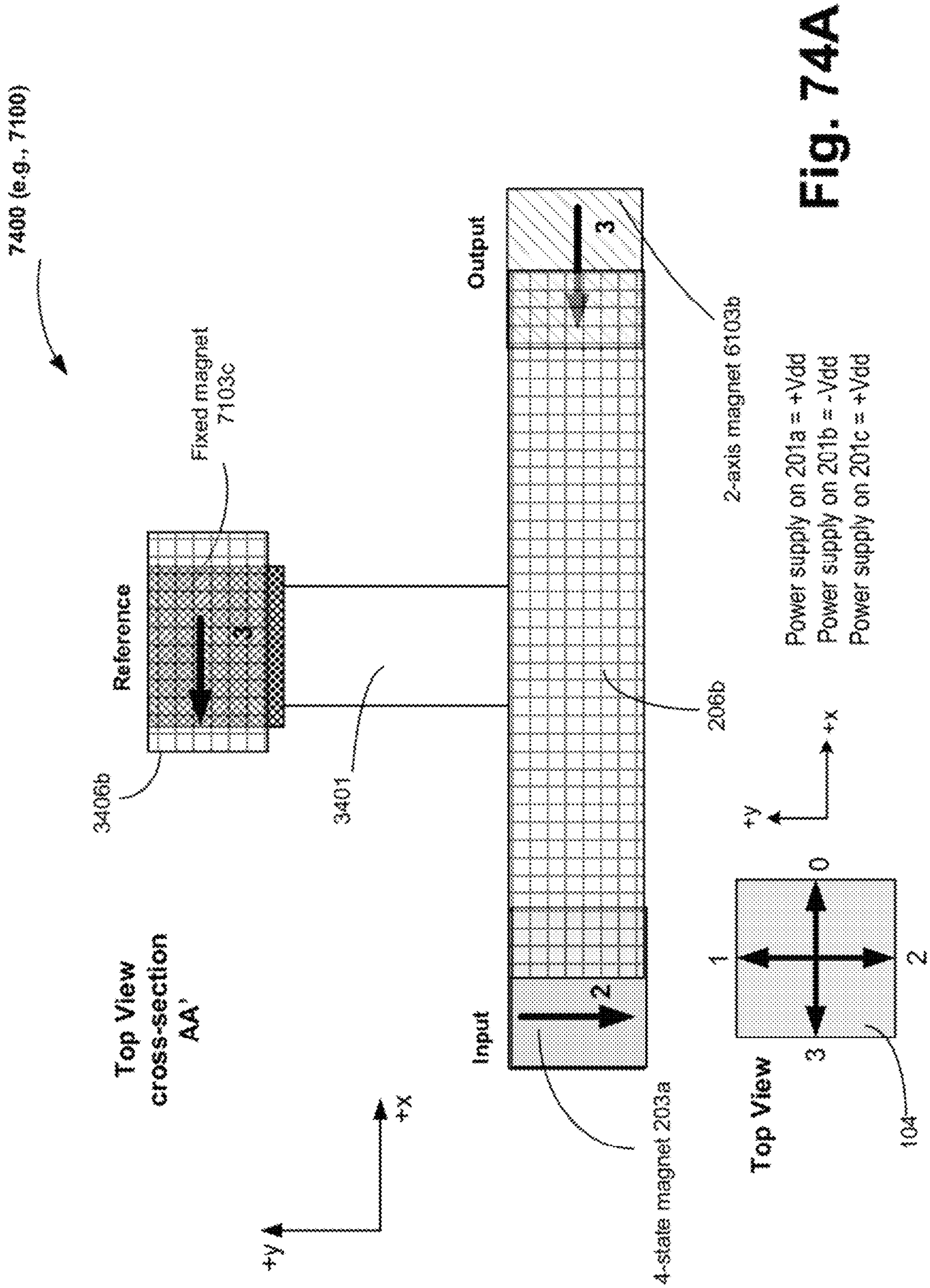

FIG. 74A illustrates top view 7400 of cross-section AA' of the ASL device 7100 of FIG. 71A with input 4-state magnet orientation '2' (i.e., −y direction) and reference fixed magnet orientation '3' (i.e., −x direction), according to some embodiments of the disclosure. It is pointed out that those elements of FIG. 74A having the same reference numbers (or names) as the elements of any other figure can operate or function in any manner similar to that described, but are not limited to such.

ASL device 7400 forms quaternary upper threshold logic Gate 3 of Table 9, according to some embodiments. ASL device 7400 is a top-view of ASL device 7100 along the dotted line AA'. Here, the input magnet is 4-state magnet 203*a* with magnetization along direction '2' (i.e., along −y axis), output magnet 6103*b* is a biaxial (2-state or bi-stable magnet), and reference magnet 7103*c* is a fixed magnet having a magnetization in the −x direction (or along direction '3'). In some embodiments, when input spin current in the +x direction arrives at input 4-state magnet 203*a*, the magnetization of output magnet 6103*b* is always along direction '3' (i.e., −x direction).

In some embodiments, ASL device 7400 uses a fixed magnetic spin current input in the −x direction. This breaks the symmetry to enable the logic gate to generate the output. For ASL device 7400, output magnet 6103*b* is a bi-stable magnet with shape or crystalline anisotropy pointing only in one direction. In this case, direction of magnetization of output magnet 6103*b* is in the direction '3' (i.e., −x direction) regardless of the input spin current direction received by input magnet 203*a* (which is magnetized in direction '2').

Here, power supply on interconnect 201*a* is +Vdd (positive power supply), power supply on interconnect 201*b* is −Vdd (negative power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '3' (i.e., −x direction).

Figure 75A:
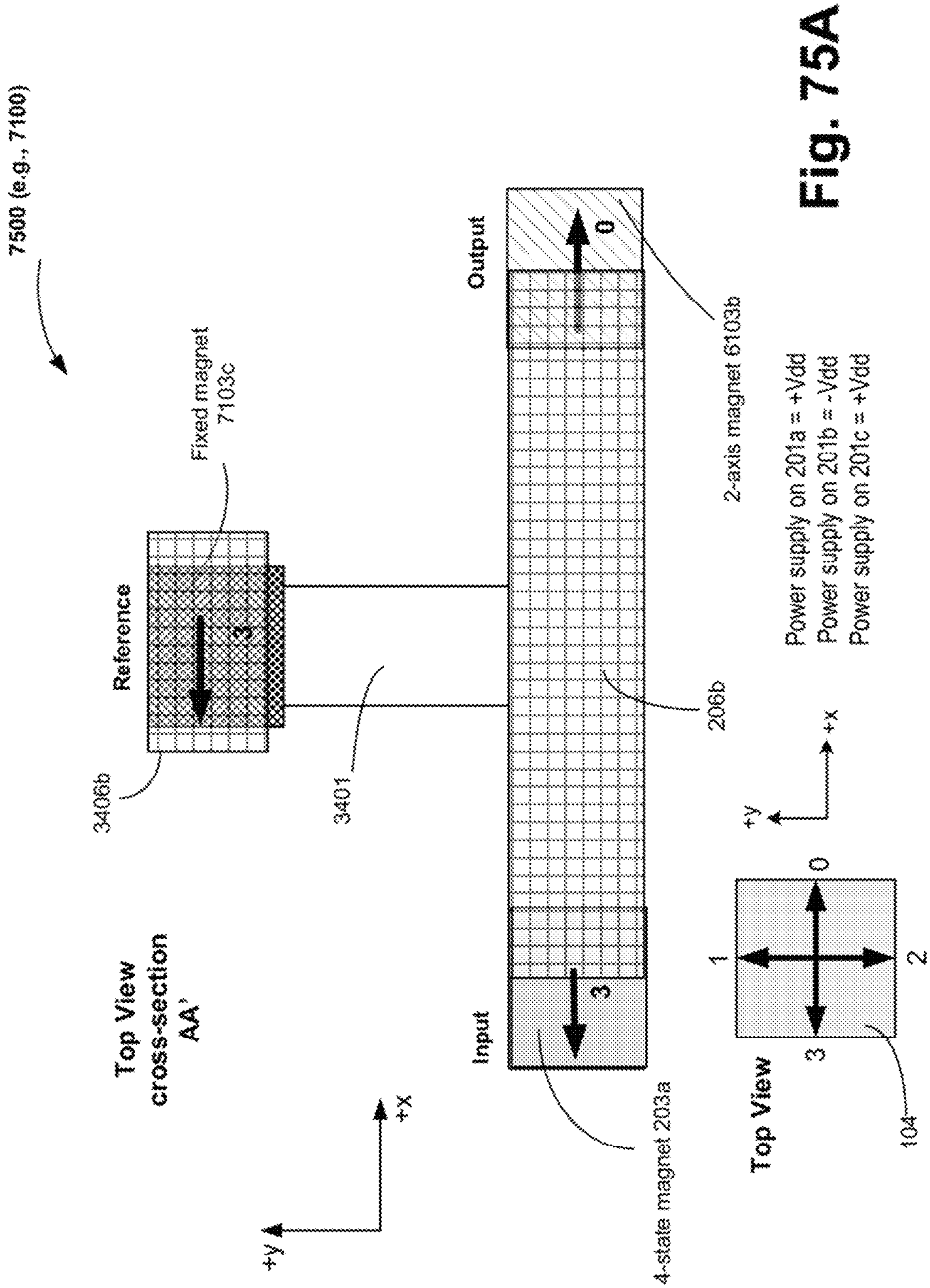

FIG. 75A illustrates top view 7500 of cross-section AA' of the ASL device 7100 of FIG. 71A with input 4-state magnet orientation '3' (i.e., −x direction) and reference fixed magnet orientation '3' (i.e., −x direction), according to some embodiments of the disclosure. It is pointed out that those elements of FIG. 75A having the same reference numbers (or names) as the elements of any other figure can operate or function in any manner similar to that described, but are not limited to such.

ASL device 7500 forms quaternary upper threshold logic Gate 3 of Table 9, according to some embodiments. ASL device 7500 is a top-view of ASL device 7100 along the dotted line AA'. Here, the input magnet is 4-state magnet 203*a* with magnetization along direction '3' (i.e., along −x axis), output magnet 6103*b* is a biaxial (2-state or bi-stable magnet), and reference magnet 7103*c* is a fixed magnet having a magnetization in the −x direction (or along direction '3'). In some embodiments, when input spin current in the +x direction arrives at input 4-state magnet 203*a*, the magnetization of output magnet 6103*b* is always along direction '0' (i.e., +x direction).

In some embodiments, ASL device 7500 uses a fixed magnetic spin current input in the −x direction. This breaks the symmetry to enable the logic gate to generate the output. For ASL device 7500, output magnet 6103*b* is a bi-stable magnet with shape or crystalline anisotropy pointing only in one direction. In this case, the direction of magnetization of output magnet 6103*b* is in the direction '0' (i.e., +x direction) regardless of the input spin current direction received by input magnet 203*a* (which is magnetized in direction '3').

Here, power supply on interconnect 201*a* is +Vdd (positive power supply), power supply on interconnect 201*b* is −Vdd (negative power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

FIG. 72B, FIG. 73B, FIG. 74B, and FIG. 75B refer to logic Gate 0 of Table 9 of the quaternary lower threshold logic gates which correspond to device 7120 of FIG. 71B along cross-section AA', according to some embodiments of the disclosure.

Figure 72B:
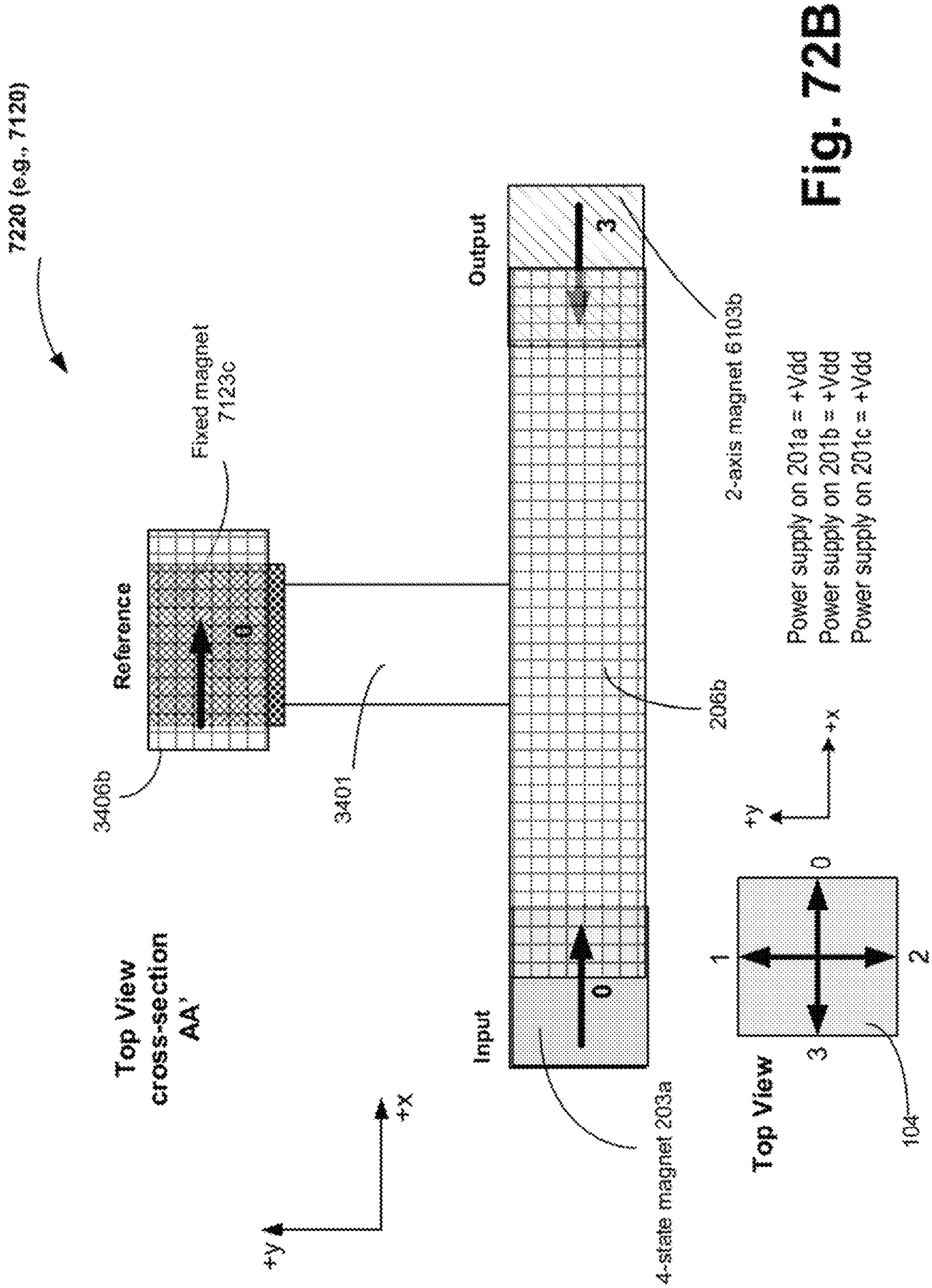

FIG. 72B illustrates top view 7220 of cross-section AA' of the ASL device 7120 of FIG. 71B with input 4-state magnet orientation '0' (i.e., +x direction) and reference fixed magnet orientation '0' (i.e., +x direction), according to some embodiments of the disclosure. It is pointed out that those elements of FIG. 72B having the same reference numbers (or names) as the elements of any other figure can operate or function in any manner similar to that described, but are not limited to such.

ASL device 7220 forms quaternary lower threshold logic Gate 3 of Table 9, according to some embodiments. ASL device 7220 is a top-view of ASL device 7120 along the dotted line AA'. Here, the input magnet is 4-state magnet 203*a*, output magnet 6103*b* is a biaxial (2-state or bi-stable magnet), and reference magnet 7123*c* is a fixed magnet having a magnetization in the +x direction (or along magnetization state '0'). Here, power supply on interconnect 201*a* is +Vdd (positive power supply), power supply on interconnect 201*b* is +Vdd (positive power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '3' (i.e., −x direction).

Figure 73B:
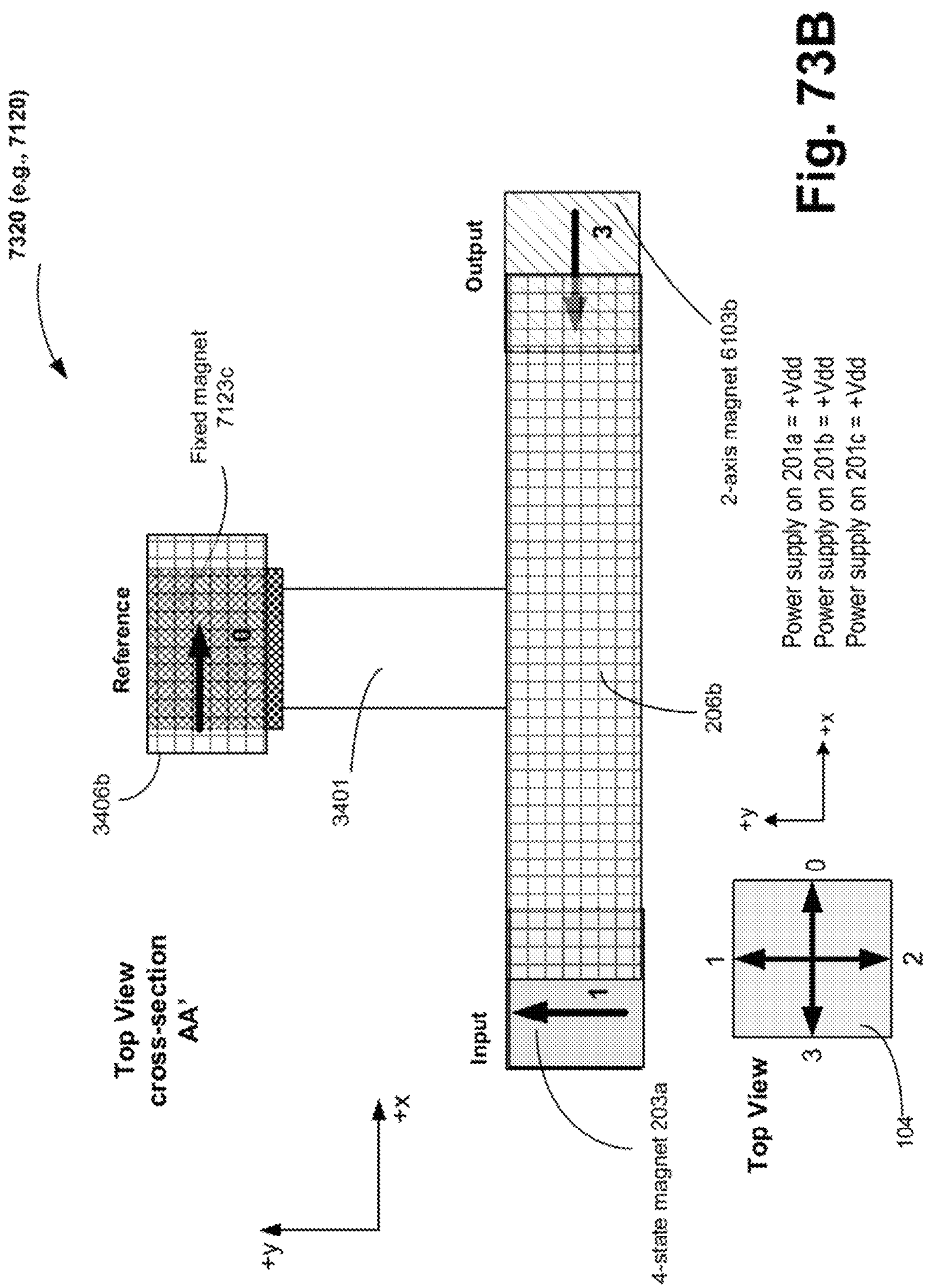

FIG. 73B illustrates top view 7320 of cross-section AA' of the ASL device 7120 of FIG. 71B with input 4-state magnet orientation '1' (i.e., +y direction) and reference fixed magnet orientation '0' (i.e., +x direction), according to some embodiments of the disclosure. It is pointed out that those elements of FIG. 73B having the same reference numbers (or names) as the elements of any other figure can operate or function in any manner similar to that described, but are not limited to such.

ASL device 7320 forms quaternary upper threshold logic Gate 3 of Table 9, according to some embodiments. ASL device 7320 is a top-view of ASL device 7120 along the dotted line AA'. Here, the input magnet is 4-state magnet 203*a* with magnetization along direction '1' (i.e., along +y axis), output magnet 6103*b* is a biaxial (2-state or bi-stable magnet), and reference magnet 7123*c* is a fixed magnet having a magnetization in the +x direction (or along direction '0'). In some embodiments, when input spin current in the +x direction arrives at input 4-state magnet 203*a*, the magnetization of output magnet 6103*b* is always along direction '3' (i.e., −x direction).

In some embodiments, ASL device 7320 uses a fixed magnetic spin current input in the +x direction. This breaks the symmetry to enable the logic gate to generate the output. For ASL device 7320, output magnet 6103*b* is a bi-stable magnet with shape or crystalline anisotropy pointing only in one direction. In this case, direction of magnetization of output magnet 6103*b* is in the direction '3' (i.e., −x direction) regardless of the input spin current direction received by input magnet 203*a* (which is magnetized in direction '1').

Here, power supply on interconnect 201*a* is +Vdd (positive power supply), power supply on interconnect 201*b* is +Vdd (positive power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when the input spin current in the +x direction arrives at input 4-state magnet 203*a*, the magnetization of output magnet 6103*b* is along direction '3' (i.e., −x direction).

Figure 74B:
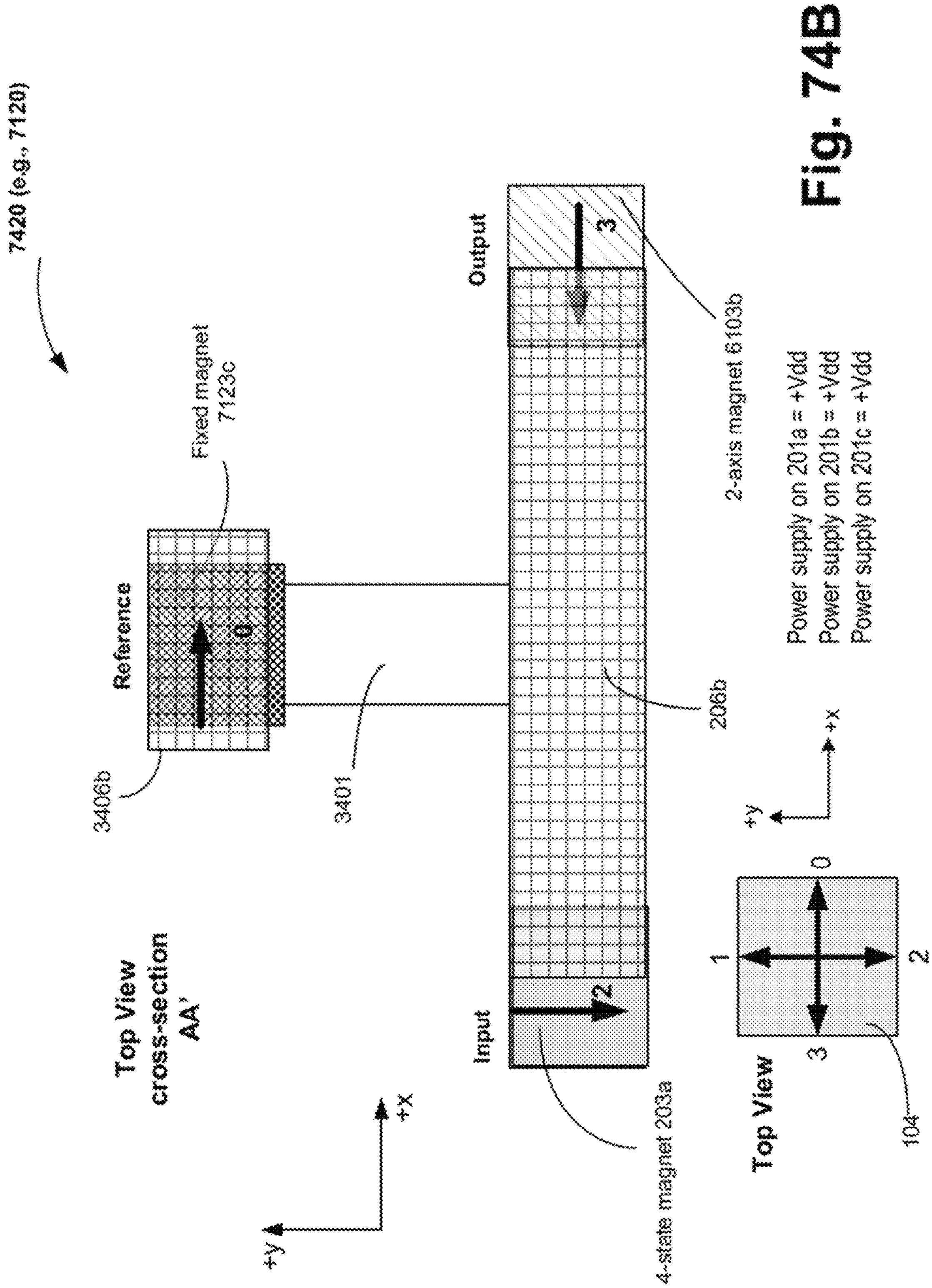

FIG. 74B illustrates top view 7420 of cross-section AA' of the ASL device 7120 of FIG. 71B with input 4-state magnet orientation '2' (i.e., −y direction) and reference fixed magnet orientation '0' (i.e., +x direction), according to some embodiments of the disclosure. It is pointed out that those elements of FIG. 74B having the same reference numbers (or names) as the elements of any other figure can operate or function in any manner similar to that described, but are not limited to such.

ASL device 7420 forms quaternary upper threshold logic Gate 3 of Table 9, according to some embodiments. ASL device 7420 is a top-view of ASL device 7120 along the dotted line AA'. Here, the input magnet is 4-state magnet 203*a* with magnetization along direction '2' (i.e., along −y axis), output magnet 6103*b* is a biaxial (e.g., 2-state or bi-stable magnet), and reference magnet 7123*c* is a fixed magnet having a magnetization in the +x direction (or along direction '0'). In some embodiments, when input spin current in the +x direction arrives at input 4-state magnet 203*a*, the magnetization of output magnet 6103*b* is always along direction '3' (i.e., −x direction).

In some embodiments, ASL device 7420 uses a fixed magnetic spin current input in the +x direction. This breaks the symmetry to enable the logic gate to generate the output. For ASL device 7420, output magnet 6103*b* is a bi-stable magnet with shape or crystalline anisotropy pointing only in one direction. In this case, the direction of magnetization of output magnet 6103*b* is in the direction '3' (i.e., −x direction) regardless of the input spin current direction received by input magnet 203*a* (which is magnetized in direction '2').

Here, power supply on interconnect 201*a* is +Vdd (positive power supply), power supply on interconnect 201*b* is +Vdd (positive power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '3' (i.e., −x direction).

Figure 75B:
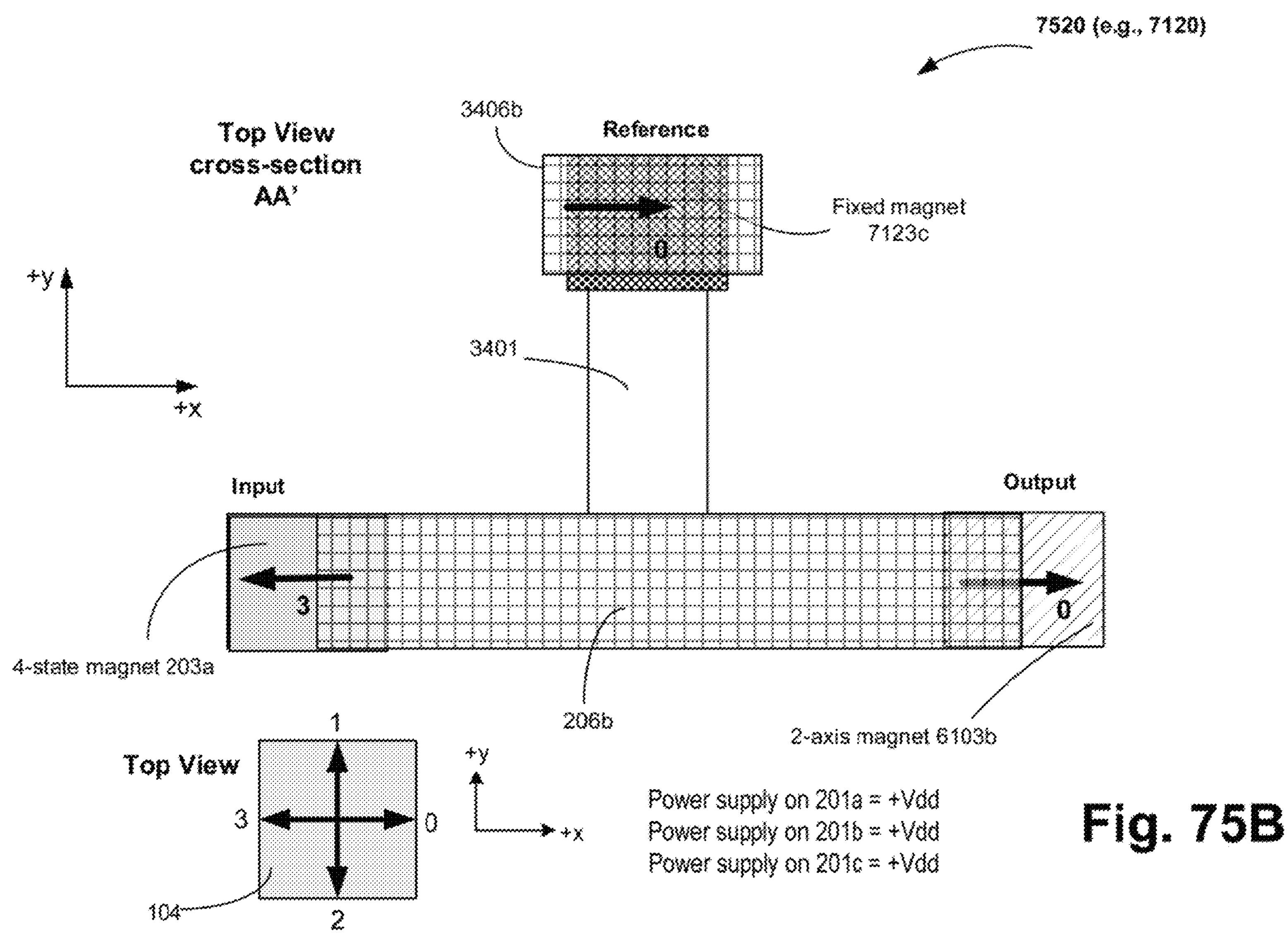

FIG. 75B illustrates top view 7520 of cross-section AA' of the ASL device 7120 of FIG. 71B with input 4-state magnet orientation '3' (i.e., −x direction) and reference fixed magnet orientation '0' (i.e., +x direction), according to some embodiments of the disclosure. It is pointed out that those elements of FIG. 75B having the same reference numbers (or names) as the elements of any other figure can operate or function in any manner similar to that described, but are not limited to such.

ASL device 7520 forms quaternary upper threshold logic Gate 3 of Table 9, according to some embodiments. ASL device 7520 is a top-view of ASL device 7120 along the dotted line AA'. Here, the input magnet is 4-state magnet 203*a* with magnetization along direction '3' (i.e., along −x axis), output magnet 6103*b* is a biaxial (2-state or bi-stable magnet), and reference magnet 7123*c* is a fixed magnet having a magnetization in the +x direction (or along direction '0'). In some embodiments, when input spin current in the +x direction arrives at input 4-state magnet 203*a*, the magnetization of output magnet 6103*b* is always along direction '0' (i.e., +x direction).

In some embodiments, ASL device 7520 uses a fixed magnetic spin current input in the +x direction. This breaks the symmetry to enable the logic gate to generate the output. For ASL device 7520, output magnet 6103*b* is a bi-stable magnet with shape or crystalline anisotropy pointing only in one direction. In this case, direction of magnetization of output magnet 6103*b* is in the direction '0' (i.e., +x direction) regardless of the input spin current direction received by input magnet 203*a* (which is magnetized in direction '3').

Here, power supply on interconnect 201*a* is +Vdd (positive power supply), power supply on interconnect 201*b* is +Vdd (positive power supply), and power supply on interconnect 201*c* is +Vdd (positive power supply). In some embodiments, the positive power supply on interconnect 201*a* reverses the effective magnetization direction of input magnet 203*a* relative to the input spin current. In some embodiments, when input spin current in the +x direction arrives at input 4-state magnet 203*a*, the magnetization of output magnet 6103*b* is along direction '0' (i.e., +x direction).

FIGS. 76-79 illustrates quaternary upper threshold logic Gate 3 of Table 9, in accordance with some embodiments, according to some embodiments of the disclosure. It is pointed out that those elements of FIGS. 76-79 having the same reference numbers (or names) as the elements of any other figure can operate or function in any manner similar to that described, but are not limited to such.

Figure 76:
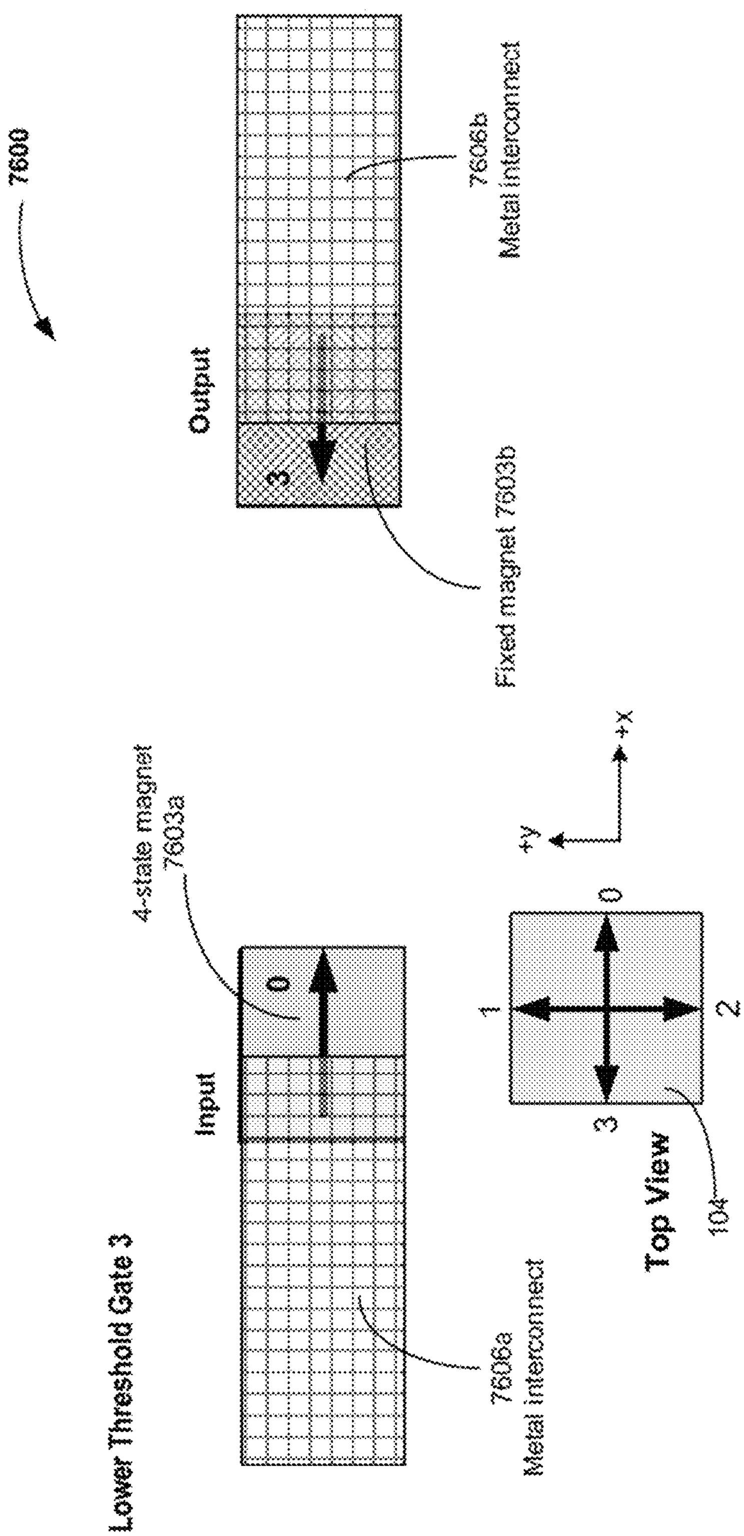
FIGS. 76-79 illustrate logic Gate 3 of quaternary lower threshold logic gate, according to some embodiments of the disclosure.

FIG. 76 illustrates a top view of an ASL device 7600 with input 4-state magnet 7603*a* having orientation '0' (i.e., +x direction) and fixed output magnet 7603*b* having orientation '3' (i.e., −x direction), according to some embodiments of the disclosure. ASL device 7600 forms quaternary upper threshold logic Gate 3 of Table 9, according to some embodiments. In some embodiments, 4-state magnet 7603*a* is coupled to metal interconnect 7606*a*, which forms the input interconnect. In some embodiments, metal interconnect 7606*b* is coupled to fixed output magnet 7603*b*, which forms the output interconnect. The materials for metal interconnect 7606*a/b* are similar to materials for charge/spin interconnect 206*a/b/c*. ASL device 7600 has a fixed logic that always produces output magnet magnetized along direction '3'.

Figure 77:
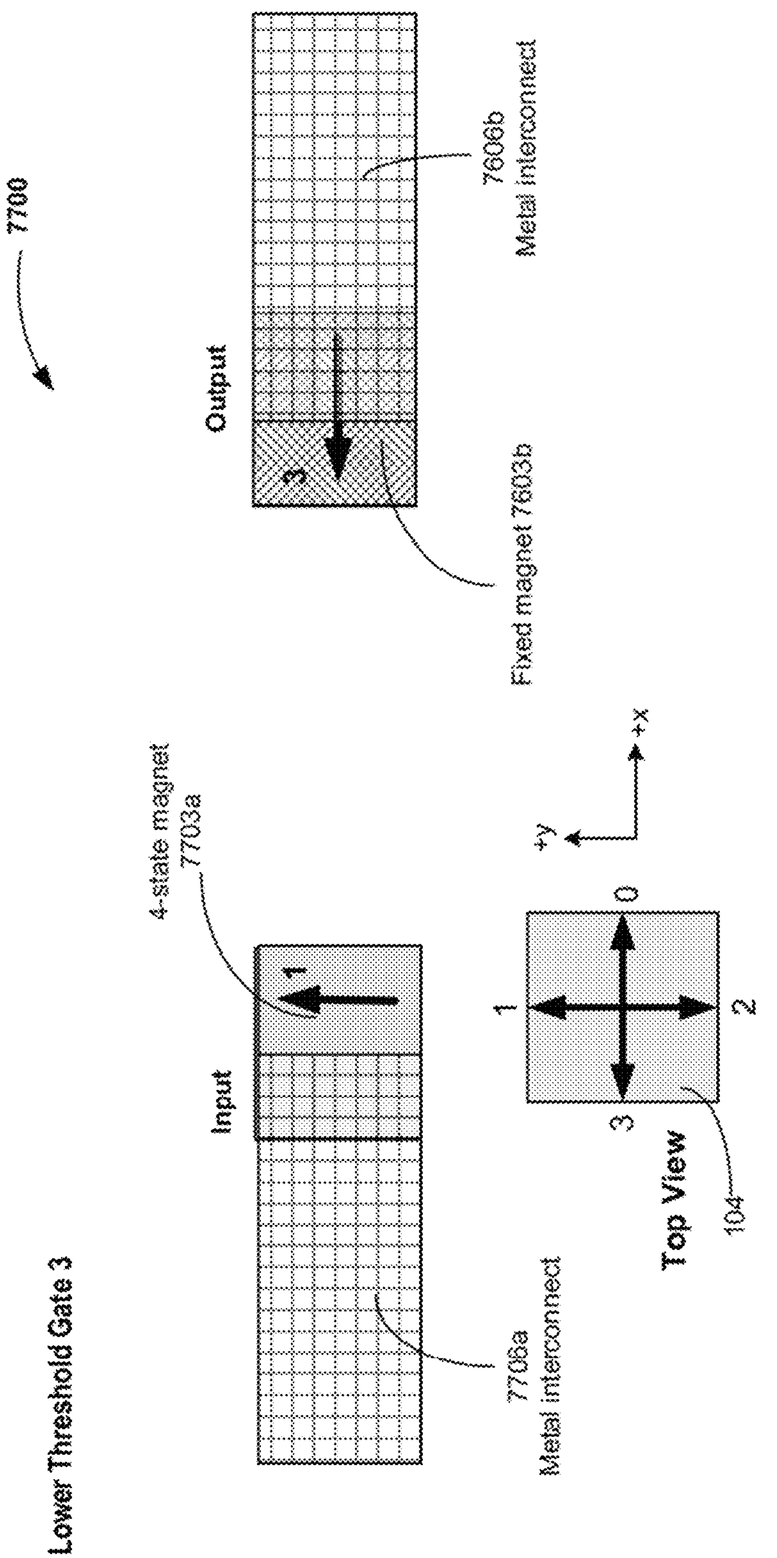

FIG. 77 illustrates a top view of an ASL device 7700 with input 4-state magnet orientation '1' (i.e., +y direction) and output 4-state magnet orientation '3' (i.e., −x direction), according to some embodiments of the disclosure. It is pointed out that those elements of FIG. 77 having the same reference numbers (or names) as the elements of any other figure can operate or function in any manner similar to that described, but are not limited to such. ASL device 7700 forms quaternary upper threshold logic Gate 3 of Table 9, according to some embodiments. In some embodiments, 4-state magnet 7703*a* is coupled to metal interconnect 7706*a*, which forms the input interconnect. ASL device 7700 has a fixed logic that always produces output magnet magnetized along direction '3' regardless of the magnetization of the input magnet 7703*a*.

Figure 78:
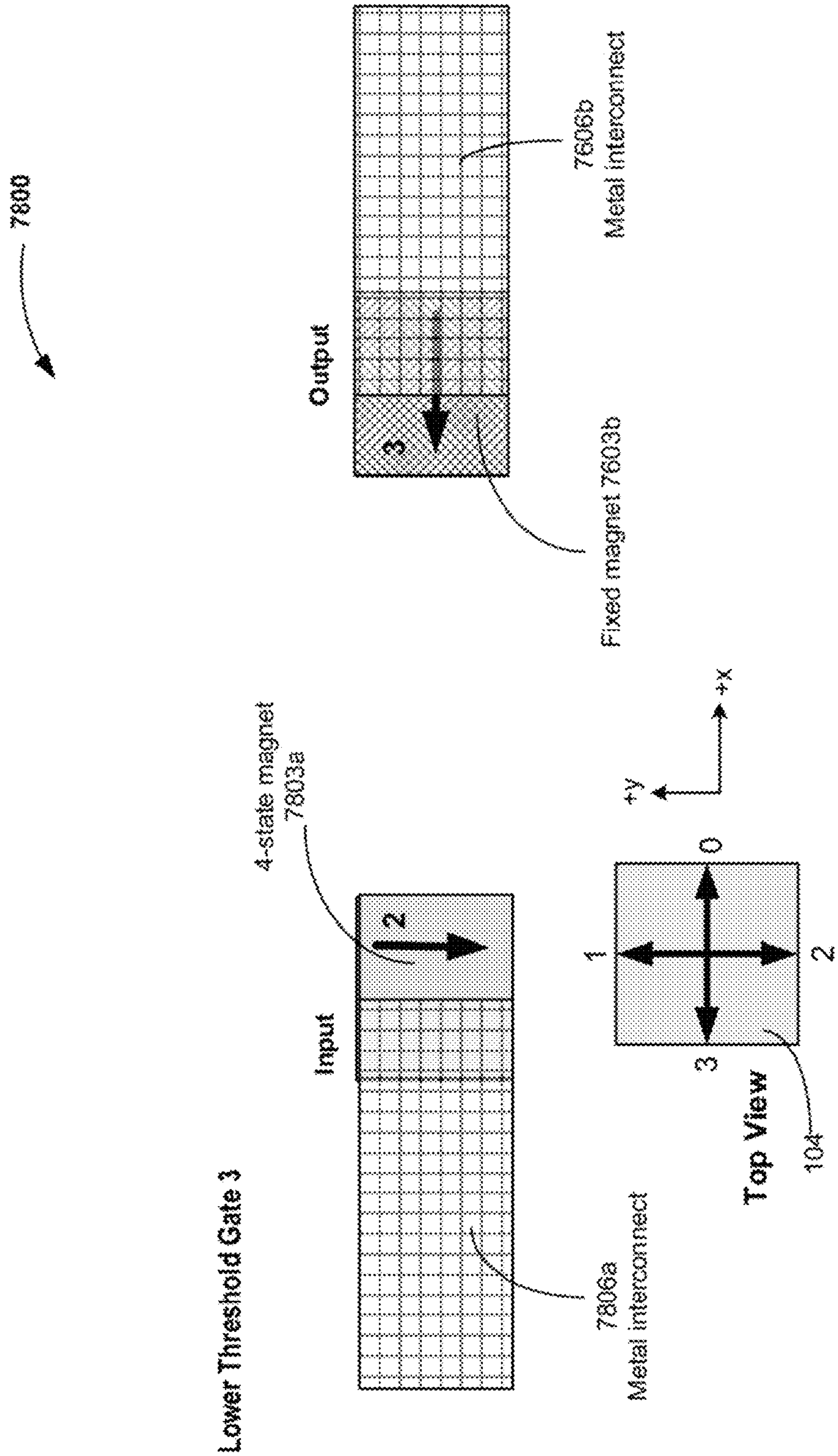

FIG. 78 illustrates a top view of an ASL device 7800 with input 4-state magnet orientation '2' (i.e., −y direction) and output 4-state magnet orientation '3' (i.e., −x direction), according to some embodiments of the disclosure. It is pointed out that those elements of FIG. 78 having the same reference numbers (or names) as the elements of any other figure can operate or function in any manner similar to that described, but are not limited to such. ASL device 7800 forms quaternary upper threshold logic Gate 3 of Table 9, according to some embodiments. In some embodiments, 4-state magnet 7803*a* is coupled to metal interconnect 7806*a*, which forms the input interconnect. ASL device 7800 has a fixed logic that always produces output magnet magnetized along direction '3' regardless of the magnetization of the input magnet 7803*a*.

Figure 79:
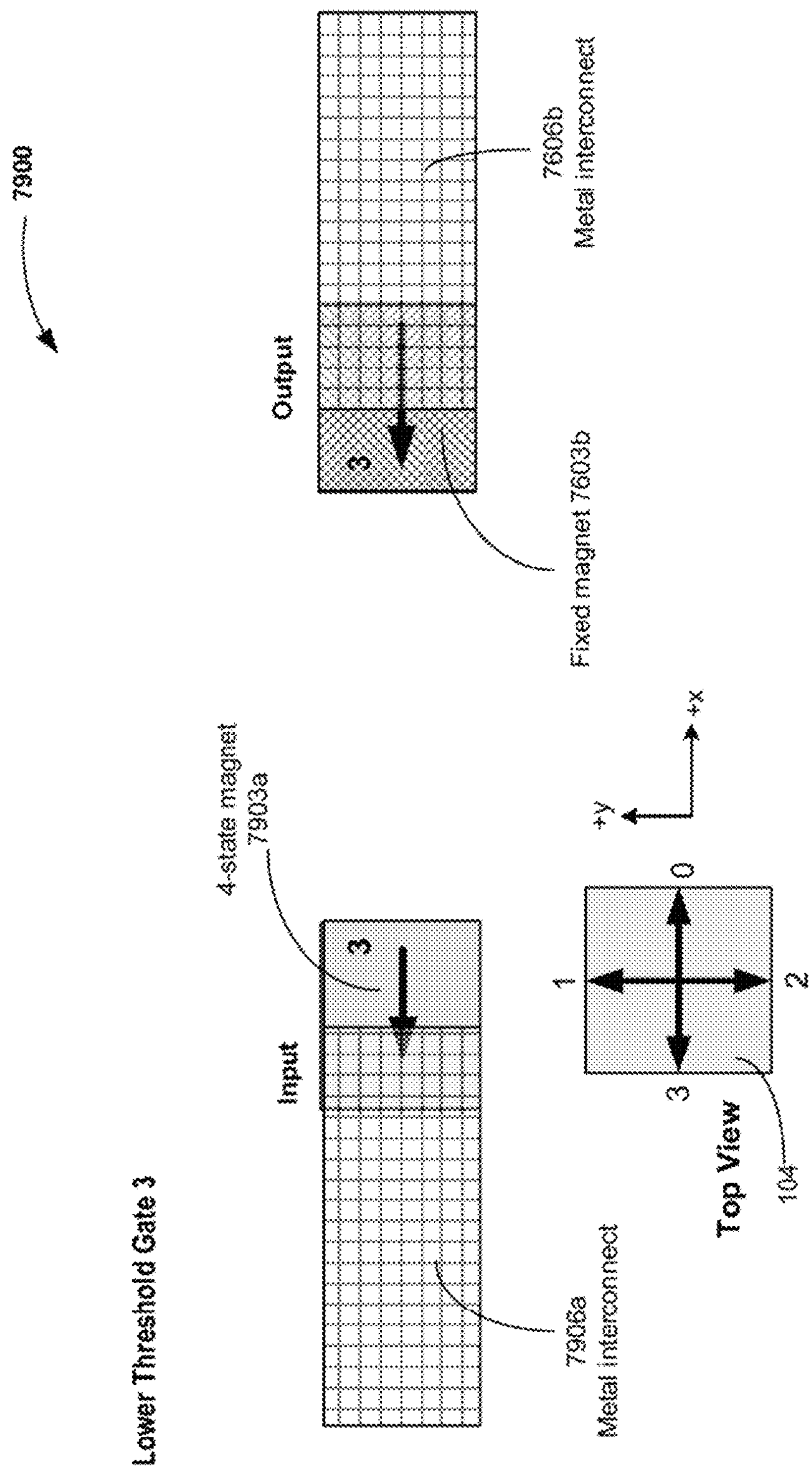

FIG. 79 illustrates a top view of an ASL device 7900 with input 4-state magnet orientation '3' (i.e., −x direction) and output 4-state magnet orientation '3' (i.e., −x direction), according to some embodiments of the disclosure. It is pointed out that those elements of FIG. 79 having the same reference numbers (or names) as the elements of any other figure can operate or function in any manner similar to that described, but are not limited to such. ASL device 7900 forms quaternary upper threshold logic Gate 3 of Table 9, according to some embodiments. In some embodiments, 4-state magnet 7903*a* is coupled to metal interconnect 7906*a*, which forms the input interconnect. ASL device 7900 has a fixed logic that always produces output magnet magnetized along direction '3' regardless of the magnetization of the input magnet 7903*a*.

Quaternary Window Literal Gate (16 Logic Gates)

In some embodiments, a full set of quaternary window literal gates are provided which are implemented using the minimum quaternary gates or maximum quaternary gates. In some embodiments, the gates for window literal operation are implemented as lower threshold quaternary gates or upper threshold quaternary gates.

FIGS. 80A-J illustrate discrete plots showing input and output magnetizations for a window literal gate, according to some embodiments of the disclosure. The x-axis of the plots are the input magnetization to a window literal gate formed of a 4-state magnet, while the y-axis is the output magnetization of a 4-state magnet of the window literal gate. Here, ${}^{a}X^{b}$ refers to a window literal gate logic where 'a' refers the input magnetization and 'b' refers to the output magnetization. For example, ${}^{a}X^{b}$ refers to an input window that starts at 'a' and ends at 'b'.

Table 10 illustrates a logic table of a 4-valued logic based window literal gate.

TABLE 10

| | | Output magnet orientation per given input (e.g., one of '0', '1', '2', and '3') | | | |
|---|---|---|---|---|---|
| ${}^{a}X^{b}$ | Type of Logic Gate | 0 | 1 | 2 | 3 |
| ${}^{0}X^{0}$ | Lower Threshold Gate | −x (3) | +x (0) | +x (0) | +x (0) |
| ${}^{0}X^{1}$ | | −x (3) | −x (3) | +x (0) | +x (0) |
| ${}^{0}X^{2}$ | | −x (3) | −x (3) | −x (3) | +x (0) |
| ${}^{0}X^{3}$ | | −x (3) | −x (3) | −x (3) | −x (3) |
| ${}^{1}X^{1}$ | Majority Gate of: Gate 1 of lower threshold, Gate 1 of upper threshold, and +x(0) | +x (0) | −x (3) | +x (0) | +x (0) |
| ${}^{1}X^{2}$ | Majority Gate of: Gate 2 of lower threshold, Gate 1 of upper threshold, and +x(0) | +x (0) | −x (3) | −x (3) | +x (0) |
| ${}^{1}X^{3}$ | Gate 1 of upper threshold | +x (0) | −x (3) | −x (3) | −x (3) |
| ${}^{2}X^{2}$ | Majority Gate of: Gate 2 of lower threshold, Gate 2 of upper threshold, and +x(0) | +x (0) | +x (0) | −x (3) | +x (0) |
| ${}^{2}X^{3}$ | Gate 2 upper threshold | +x (0) | +x (0) | −x (3) | −x (3) |
| ${}^{3}X^{3}$ | Gate 3 of upper threshold | +x (0) | +x (0) | +x (0) | −x (3) |

Figure 80A:
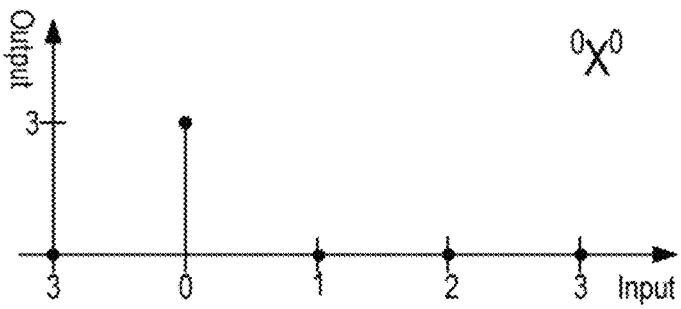
FIGS. 80A-J illustrate discrete plots showing input and output magnetizations for a window literal gate, according to some embodiments of the disclosure.

FIG. 80A illustrates ${}^{0}X^{0}$ as a discrete plot. The plot illustrates that when input magnetizations of a 4-state magnet forming a window literal gate logic is between magnetization directions of '0' then the output magnetization is fixed at direction '3' (i.e., −x direction).

Figure 80B:
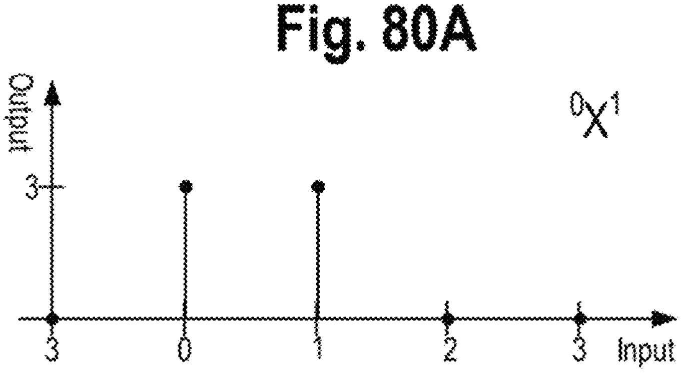

FIG. 80B illustrates ${}^{0}X^{1}$ as a discrete plot. The plot illustrates that when input magnetizations of a 4-state magnet forming a window literal gate logic is between magnetization directions of '0' and '1' then the output magnetization is fixed at direction '3' (i.e., −x direction).

Figure 80C:
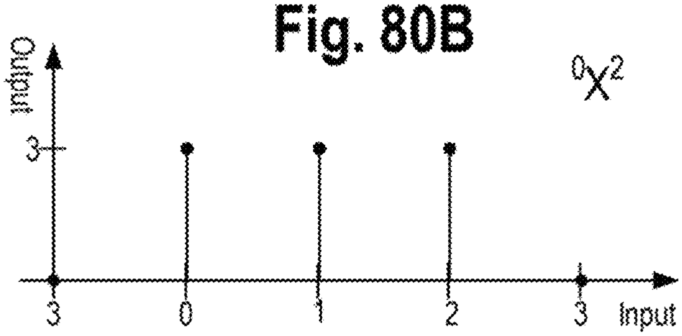

FIG. 80C illustrates ${}^{0}X^{2}$ as a discrete plot. The plot illustrates that when input magnetizations of a 4-state magnet forming a window literal gate logic is between magnetization directions of '0' and '2' then the output magnetization is fixed at direction '3' (i.e., −x direction).

Figure 80D:
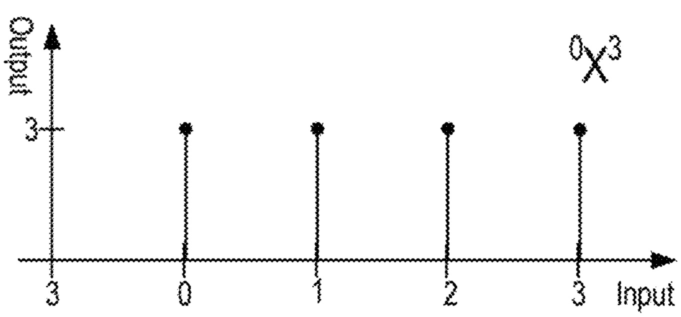

FIG. 80D illustrates ${}^{0}X^{3}$ as a discrete plot. The plot illustrates that when input magnetizations of a 4-state magnet forming a window literal gate logic is between magnetization directions of '0' and '3' then the output magnetization is fixed at direction '3' (i.e., −x direction). In some embodiments, logic gates for FIGS. 80A-D are realized as quaternary lower threshold gates (e.g., Gates 0-3 of Table 9).

Figure 80E:
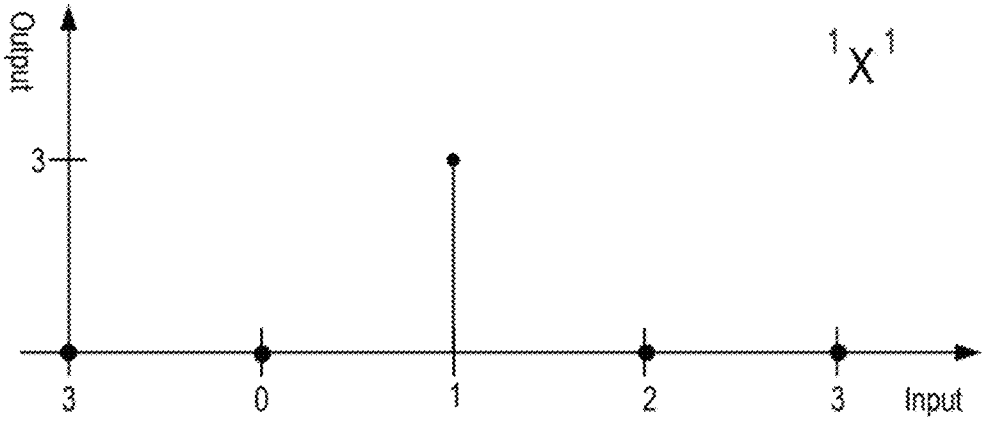

FIG. 80E illustrates $^{1}X^{1}$ as a discrete plot. The plot illustrates that when input magnetizations of a 4-state magnet forming a window literal gate logic is between magnetization directions of '1' then the output magnetization is a majority gate function. In some embodiments, $^{1}X^{1}$=Sum ($^{0}X^{1}$, $^{1}X^{3}$). In some embodiments, the majority gate function is realized by a majority gate formed of a combination of Gate 1 of the quaternary lower threshold gate of Table 9, Gate 1 of the quaternary upper threshold gate of Table 8, and a fixed magnet with magnetization in the '0' direction (+x direction). One such majority gate is illustrated by FIGS. 81-84. In alternative embodiments, $^{1}X^{1}$=half complement ($^{0}X^{0}$).

Figure 80F:
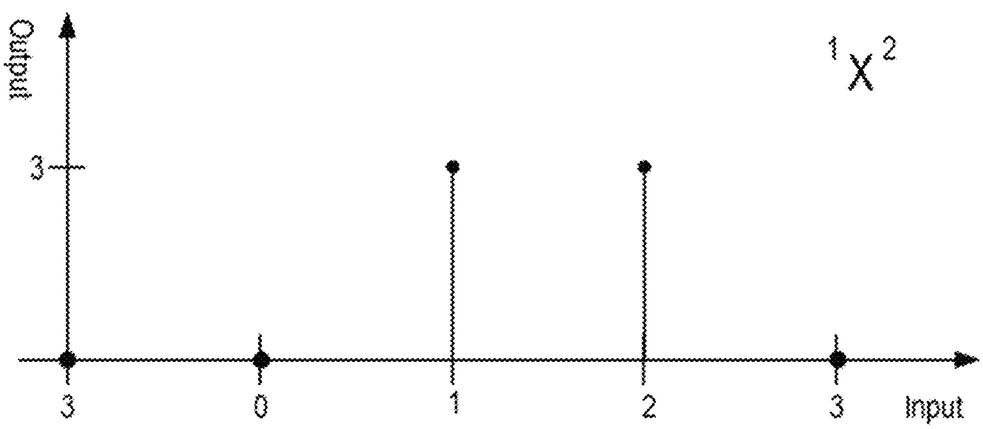

FIG. 80F illustrates $^{1}X^{2}$ as a discrete plot. The plot illustrates that when input magnetizations of a 4-state magnet forming a window literal gate logic is between magnetization directions of '1' and '2' then the output magnetization is a majority gate function. In some embodiments, the majority gate function is realized by a majority gate formed of a combination of Gate 2 of the quaternary lower threshold gate of Table 9 and Gate 1 of the quaternary upper threshold gate of Table 8. One such majority gate is illustrated by FIGS. 85-88.

Figure 80G:
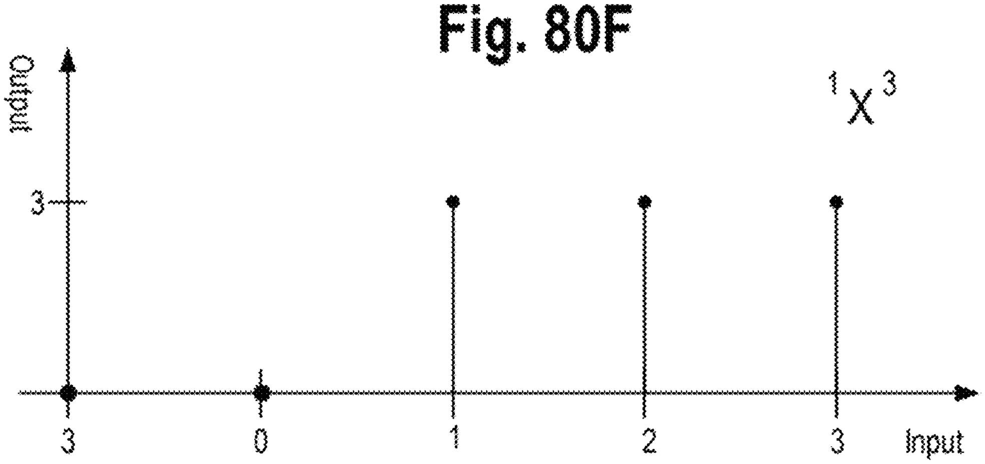

FIG. 80G illustrates $^{1}X^{3}$ as a discrete plot. The plot illustrates that when input magnetizations of a 4-state magnet forming a window literal gate logic is between magnetization directions of '1' and '3' then the output magnetization is according to Gate 1 of the quaternary upper threshold gate of Table 8.

Figure 80H:
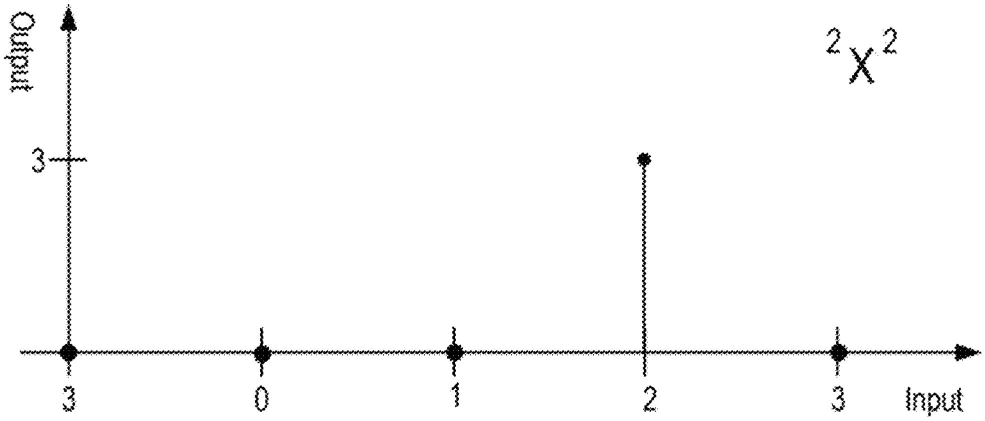

FIG. 80H illustrates $^{2}X^{2}$ as a discrete plot. The plot illustrates that when input magnetizations of a 4-state magnet forming a window literal gate logic is between magnetization directions of '2' then the output magnetization is a majority gate function. In some embodiments, $^{2}X^{2}$=Sum ($^{0}X^{2}$, $^{2}X^{3}$). In some embodiments, the majority gate function is realized by a majority gate formed of a combination of Gate 2 of the quaternary lower threshold gate of Table 9, Gate 2 of the quaternary upper threshold gate of Table 8, and a fixed magnet with magnetization in the '0' direction (+x direction). One such majority gate is illustrated by FIGS. 89-92. In alternative embodiments, $^{2}X^{2}$=half complement ($^{3}X^{3}$).

Figure 80I:
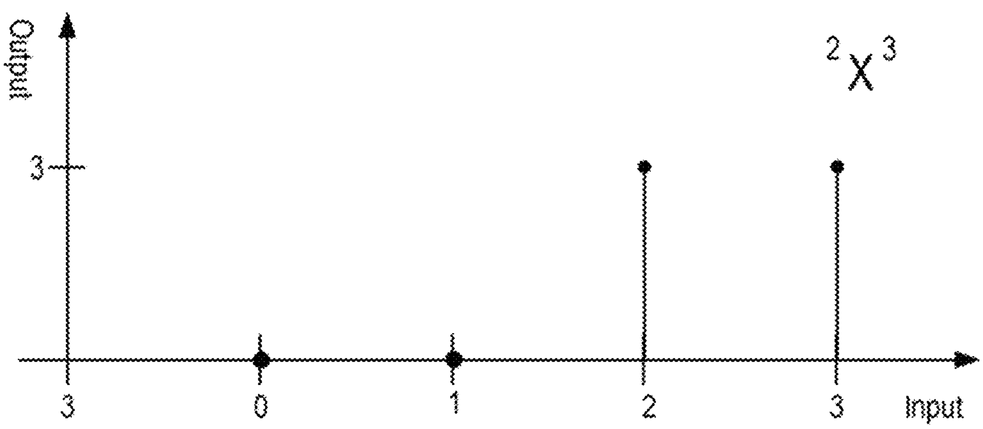

FIG. 80I illustrates $^{2}X^{3}$ as a discrete plot. The plot illustrates that when input magnetizations of a 4-state magnet forming a window literal gate logic is between magnetization directions of '2' and '3' then the output magnetization is according to Gate 2 of the quaternary upper threshold gate.

Figure 80J:
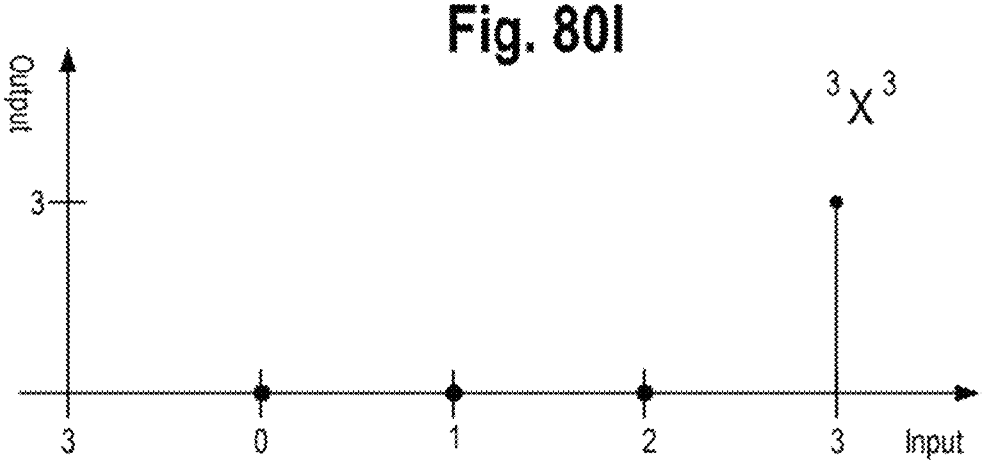

FIG. 80J illustrates $^{3}X^{3}$ as a discrete plot. The plot illustrates that when input magnetizations of a 4-state magnet forming a window literal gate logic is between magnetization directions of '3' then the output magnetization is according to Gate 3 of the quaternary upper threshold gate of Table 8.

FIGS. 81-84 illustrate top views 8100, 8200, 8300, and 8400, respectively, of majority gates to perform $^{1}X^{1}$ window literal gate logic, according to some embodiments of the disclosure. A majority gate function is realized by an odd number of inputs and a single output.

Figure 81:
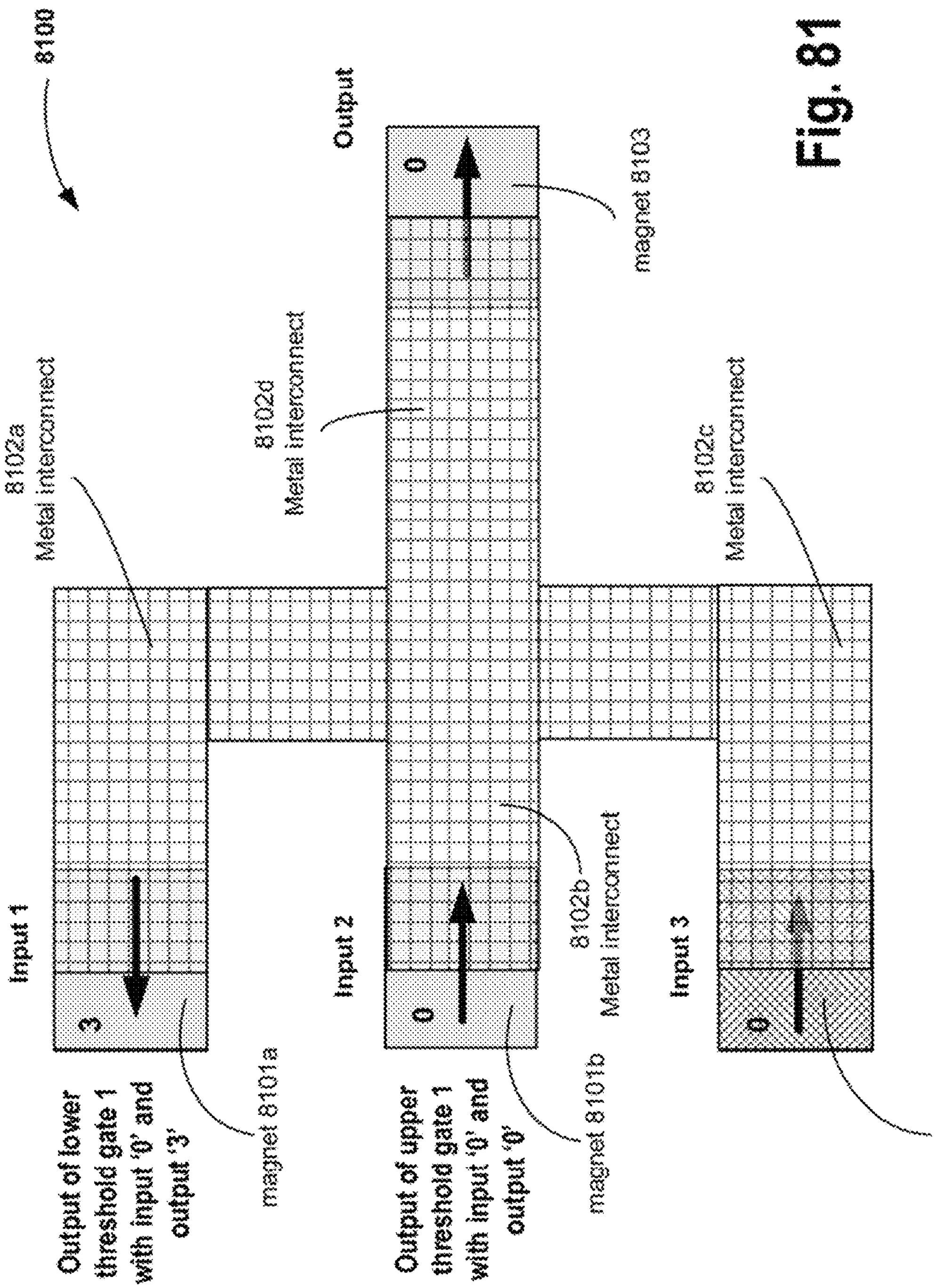
FIGS. 81-84 illustrate top views of a majority gate to perform ${}^{1}X^{1}$ window literal gate logic, according to some embodiments of the disclosure.

In some embodiments, majority gate 8100 of FIG. 81 is realized to perform $^{1}X^{1}$ window literal gate logic. In some embodiments, majority gate 8100 comprises first input magnet 8101*a*, second input magnet 8101*b*, third input magnet 8101*c* (fixed magnet), output magnet 8103, first metal interconnect 8102*a*, second metal interconnect 8102*b*, third metal interconnect 8102*c*, and fourth interconnect 8102*d* coupled together as shown. The materials for the magnets and interconnects are according to the materials of magnets and interconnects described with reference to other embodiments and figures.

In some embodiments, first input magnet 8101*a* is the output magnet of Gate 1 of the quaternary lower threshold gate. In some embodiments, when the input magnetization of Gate 1 of the quaternary lower threshold gate is in the '0' direction, its output magnet has magnetization in the '3' direction. This output magnet of Gate 1 of the quaternary lower threshold gate forms the first input magnet 8101*a* (Input 1), in accordance with some embodiments. In some embodiments, second input magnet 8101*b* is the output magnet of Gate 1 of the quaternary upper threshold gate. In some embodiments, when the input magnetization of Gate 1 of the quaternary upper threshold gate is in the '0' direction, its output magnet has magnetization in the '0' direction. This output magnet of quaternary upper threshold gate forms the second input magnet 8101*b* (Input 2), in accordance with some embodiments. In some embodiments, third input magnet 8101*c* is a fixed magnet that has magnetization in the '0' direction.

In some embodiments, spin currents from the input magnets (Input 1, Input 2, and Input 3) conduct through their respective interconnects (e.g., first interconnect 8102*a*, second interconnect 8102*b*, and third interconnect 8102*c*) and combine at interconnect 8102*d* to produce a spin current having a direction according to the majority of the spin currents from interconnects 8102*a*, 8102*b*, and 8102*c*. This resultant spin current in interconnect 8102*d* determines the magnetization of output magnet 8103, in accordance with some embodiments.

In some embodiments, $^{1}X^{1}$ window literal gate logic is formed by a majority function of the output of lower threshold Gate 1, the output of upper threshold Gate 1, and fixed magnet with '0' direction. Majority gate 8100 illustrates the gate when first input magnet 8101*a* has magnetization in direction '3', second input magnet 8101*b* has magnetization in direction '0', and third input magnet 8101*c* has magnetization in direction '0' to generate a magnetization in direction '0' for output magnet 8103.

Figure 82:
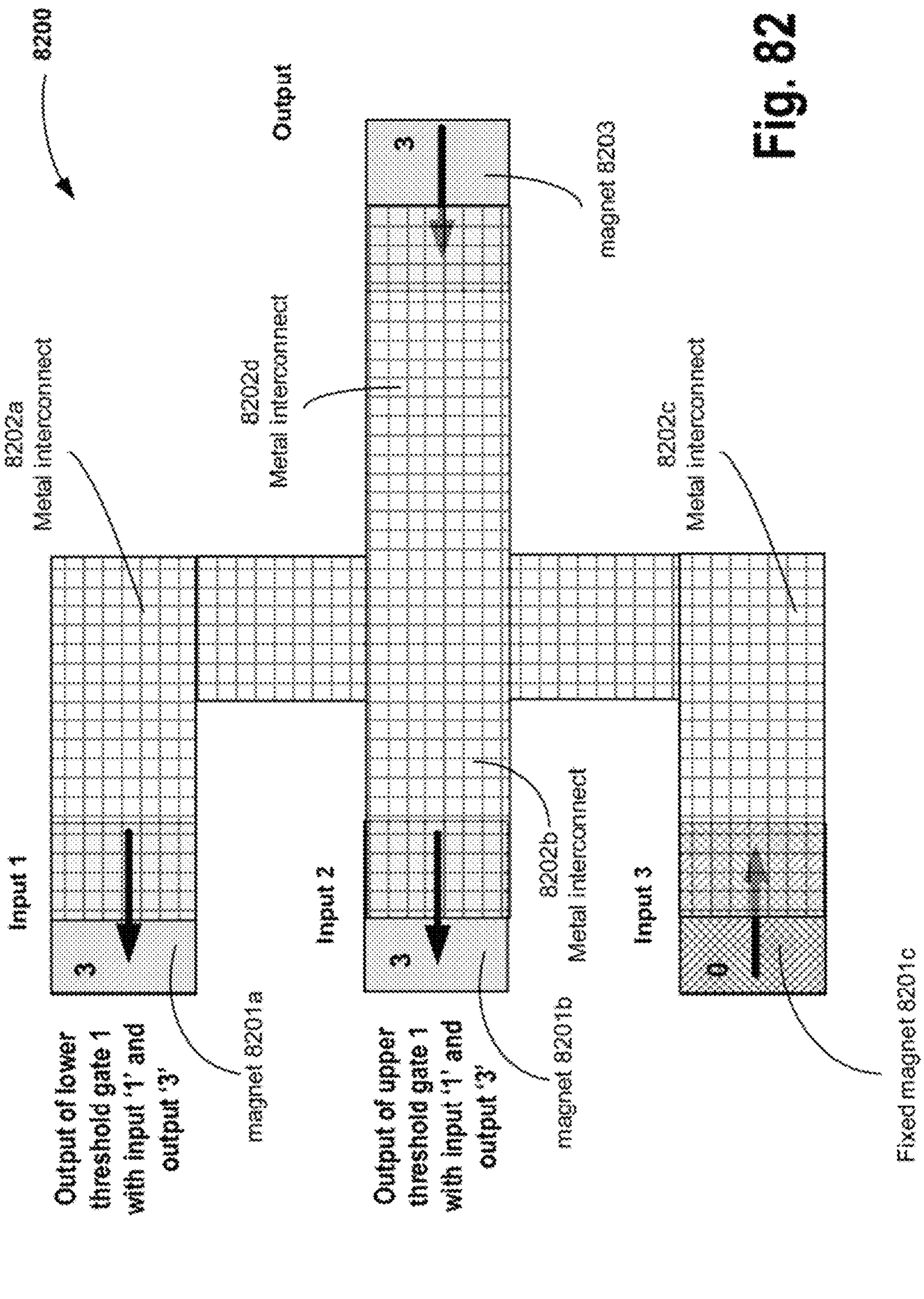

In some embodiments, majority gate 8200 of FIG. 82 is realized to perform $^{1}X^{1}$ window literal gate logic. In some embodiments, majority gate 8200 comprises first input magnet 8201*a*, second input magnet 8201*b*, third input magnet 8201*c*, output magnet 8203, first metal interconnect 8202*a*, second metal interconnect 8202*b*, third metal interconnect 8202*c*, and fourth interconnect 8202*d* coupled together as shown. The materials for the magnets and interconnects are according to the materials of magnets and interconnects described with reference to other embodiments and figures.

In some embodiments, first input magnet 8201*a* is the output magnet of Gate 1 of the quaternary lower threshold gate. In some embodiments, when the input magnetization of Gate 1 of the quaternary lower threshold gate is in the '1' direction, its output magnet has magnetization in the '3' direction. This output magnet of Gate 1 of the quaternary lower threshold gate forms the first input magnet 8201*a* (Input 1), in accordance with some embodiments. In some embodiments, second input magnet 8201*b* is the output magnet of Gate 1 of the quaternary upper threshold gate. In some embodiments, when the input magnetization of Gate 1 of the quaternary upper threshold gate is in the '1' direction, its output magnet has magnetization in the '3' direction. This output magnet of quaternary upper threshold gate forms the second input magnet 8201*b* (Input 2), in accordance with some embodiments. In some embodiments, third input magnet 8201*c* is a fixed magnet that has magnetization in the '0' direction.

In some embodiments, spin currents from the input magnets (Input 1, Input 2, and Input 3) conduct through their respective interconnects (e.g., first interconnect 8202*a*, second interconnect 8202*b*, and third interconnect 8202*c*) and combine at interconnect 8202*d* to produce a spin current have a direction according to the majority of the spin currents from interconnects 8202*a*, 8202*b*, and 8202*c*. This resultant spin current in interconnect 8202*d* determines the magnetization of output magnet 8203, in accordance with some embodiments.

In some embodiments, $^{1}X^{1}$ window literal gate logic is formed by a majority function of the output of lower threshold Gate 1, the output of upper threshold Gate 1, and fixed magnet with '0' direction. Majority gate 8200 illustrates the gate when first input magnet 8201*a* has magnetization in direction '3', second input magnet 8201*b* has magnetization in direction '3', and third input magnet 8201*c* has magnetization in direction '0' to generate a magnetization in direction '3' for output magnet 8203.

Figure 83:
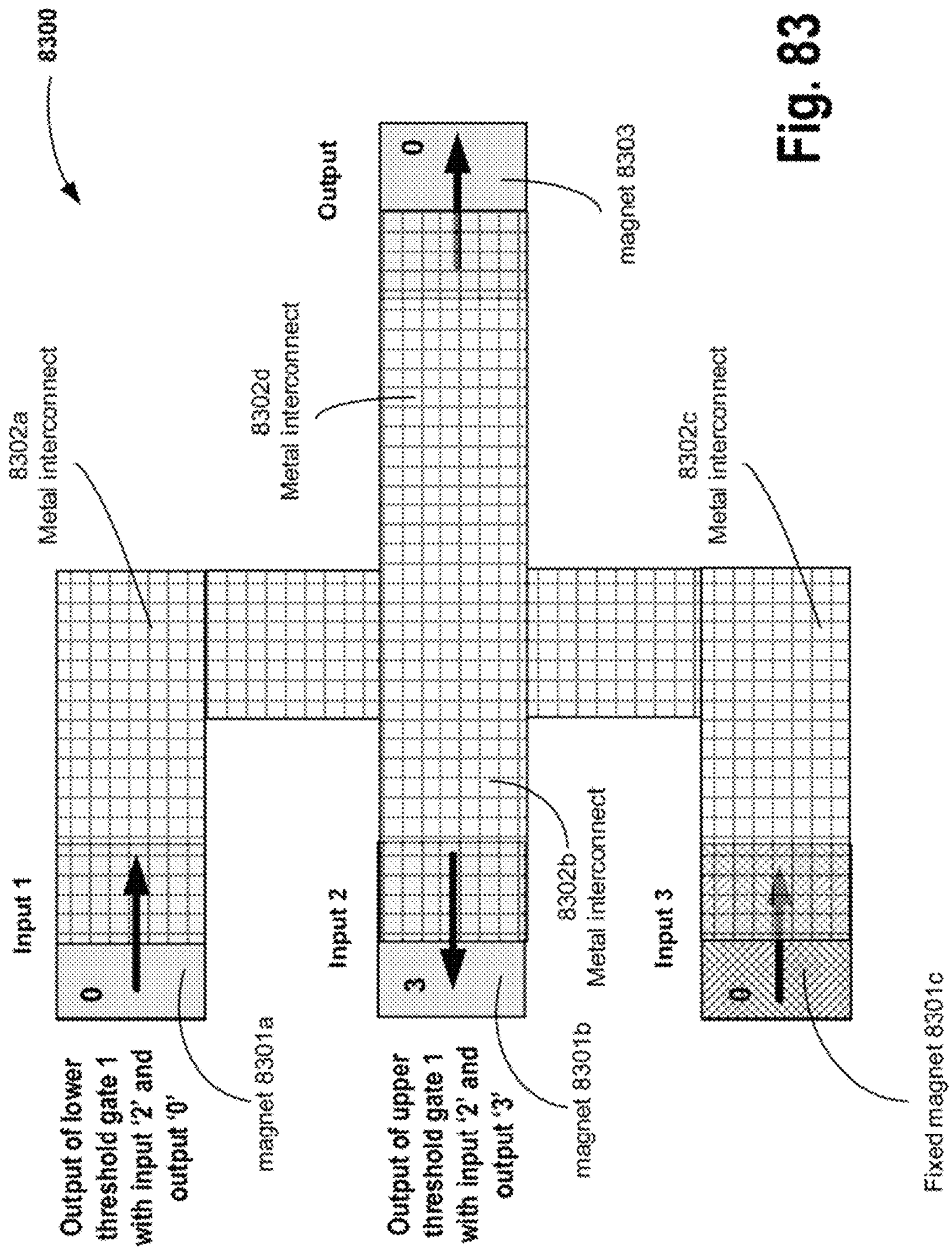

In some embodiments, majority gate 8300 of FIG. 83 is realized to perform $^{1}X^{1}$ window literal gate logic. In some embodiments, majority gate 8300 comprises first input magnet 8301*a*, second input magnet 8301*b*, third input magnet 8301*c*, output magnet 8303, first metal interconnect 8302*a*, second metal interconnect 8302*b*, third metal interconnect 8302*c*, and fourth interconnect 8302*d* coupled together as shown. The materials for the magnets and interconnects are according to the materials of magnets and interconnects described with reference to other embodiments and figures.

In some embodiments, first input magnet 8301*a* is the output magnet of Gate 1 of the quaternary lower threshold gate. In some embodiments, when the input magnetization of Gate 1 of the quaternary lower threshold gate is in the '2' direction, its output magnet has magnetization in the '0' direction. This output magnet of Gate 1 of the quaternary lower threshold gate forms the first input magnet 8301*a* (Input 1), in accordance with some embodiments. In some embodiments, second input magnet 8301*b* is the output magnet of Gate 1 of the quaternary upper threshold gate. In some embodiments, when the input magnetization of Gate 1 of the quaternary upper threshold gate is in the '2' direction, its output magnet has magnetization in the '3' direction. This output magnet of quaternary upper threshold gate forms the second input magnet 8301*b* (Input 2), in accordance with some embodiments. In some embodiments, third input magnet 8301*c* is a fixed magnet that has magnetization in the '0' direction.

In some embodiments, spin currents from the input magnets (Input 1, Input 2, and Input 3) conduct through their respective interconnects (e.g., first interconnect 8302*a*, second interconnect 8302*b*, and third interconnect 8302*c*) and combine at interconnect 8302*d* to produce a spin current having a direction according to the majority of the spin currents from interconnects 8302*a*, 8302*b*, and 8302*c*. This resultant spin current in interconnect 8302*d* determines the magnetization of output magnet 8303, in accordance with some embodiments.

In some embodiments, $^{1}X^{1}$ window literal gate logic is formed by a majority function of the output of lower threshold Gate 1, the output of upper threshold Gate 1, and fixed magnet with '0' direction. Majority gate 8300 illustrates the gate when first input magnet 8301*a* has magnetization in direction '0', second input magnet 8301*b* has magnetization in direction '3', and third input magnet 8301*c* has magnetization in direction '0' to generate a magnetization in direction '0' for output magnet 8303.

Figure 84:
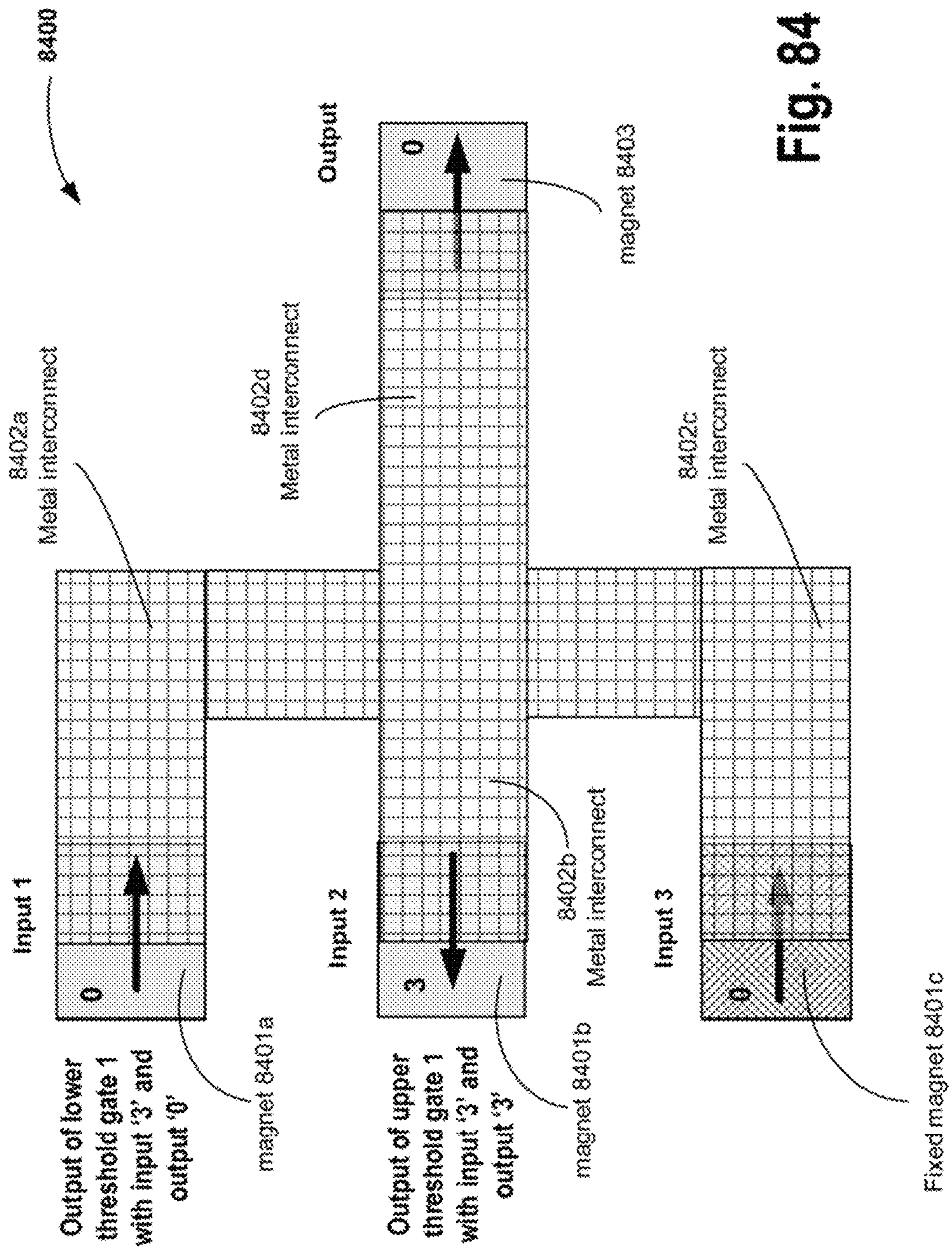

In some embodiments, majority gate 8400 of FIG. 84 is realized to perform $^{1}X^{1}$ window literal gate logic. In some embodiments, majority gate 8400 comprises first input magnet 8401*a*, second input magnet 8401*b*, third input magnet 8401*c*, output magnet 8403, first metal interconnect 8402*a*, second metal interconnect 8402*b*, third metal interconnect 8402*c*, and fourth interconnect 8402*d* coupled together as shown. The materials for the magnets and interconnects are according to the materials of magnets and interconnects described with reference to other embodiments and figures.

In some embodiments, first input magnet 8401*a* is the output magnet of Gate 1 of the quaternary lower threshold gate. In some embodiments, when the input magnetization of Gate 1 of the quaternary lower threshold gate is in the '3' direction, its output magnet has magnetization in the '0' direction. This output magnet of Gate 1 of the quaternary lower threshold gate forms the first input magnet 8401*a* (Input 1), in accordance with some embodiments. In some embodiments, second input magnet 8401*b* is the output magnet of Gate 1 of the quaternary upper threshold gate. In some embodiments, when the input magnetization of Gate 1 of the quaternary upper threshold gate is in the '3' direction, its output magnet has magnetization in the '3' direction. This output magnet of quaternary upper threshold gate forms the second input magnet 8401*b* (Input 2), in accordance with some embodiments. In some embodiments, third input magnet 8401*c* is a fixed magnet that has magnetization in the '0' direction.

In some embodiments, spin currents from the input magnets (Input 1, Input 2, and Input 3) conduct through their respective interconnects (e.g., first interconnect 8402*a*, second interconnect 8402*b*, and third interconnect 8402*c*) and combine at interconnect 8402*d* to produce a spin current having a direction according to the majority of the spin currents from interconnects 8402*a*, 8402*b*, and 8402*c*. This resultant spin current in interconnect 8402*d* determines the magnetization of output magnet 8403, in accordance with some embodiments.

In some embodiments, $^{1}X^{1}$ window literal gate logic is formed by a majority function of the output of lower threshold Gate 1, the output of upper threshold Gate 1, and fixed magnet with '0' direction. Majority gate 8400 illustrates the gate when first input magnet 8401*a* has magnetization in direction '0', second input magnet 8401*b* has magnetization in direction '3', and third input magnet 8401*c* has magnetization in direction '0' to generate a magnetization in direction '0' for output magnet 8403.

FIGS. 85-88 illustrate top views 8500, 8600, 8700, and 8800, respectively, of a majority gate to perform $^{1}X^{2}$ window literal gate logic, according to some embodiments of the disclosure.

Figure 85:
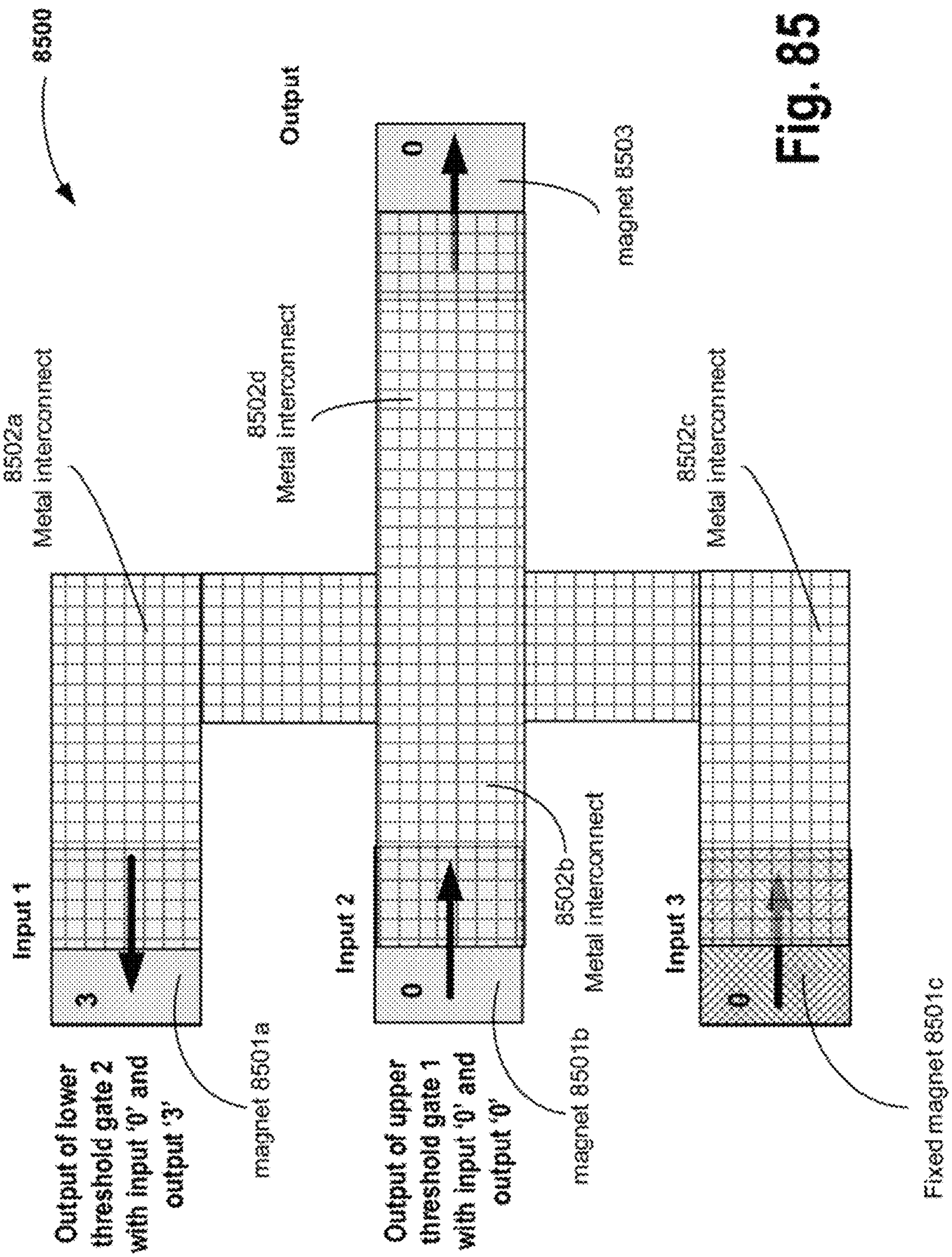
FIGS. 85-88 illustrate top views of a majority gate to perform ${}^{1}X^{2}$ window literal gate logic, according to some embodiments of the disclosure.

In some embodiments, majority gate 8500 of FIG. 85 is realized to perform $^{1}X^{2}$ window literal gate logic. In some embodiments, majority gate 8500 comprises first input magnet 8501*a*, second input magnet 8501*b*, third input magnet 8501*c*, output magnet 8503, first metal interconnect 8502*a*, second metal interconnect 8502*b*, third metal interconnect 8502*c*, and fourth interconnect 8502*d* coupled together as shown. The materials for the magnets and interconnects are according to the materials of magnets and interconnects described with reference to other embodiments and figures.

In some embodiments, first input magnet 8501*a* is the output magnet of Gate 2 of the quaternary lower threshold gate. In some embodiments, when the input magnetization of Gate 2 of the quaternary lower threshold gate is in the '0' direction, its output magnet has magnetization in the '3' direction. This output magnet of Gate 2 of the quaternary lower threshold gate forms the first input magnet 8501*a* (Input 1), in accordance with some embodiments. In some embodiments, second input magnet 8501*b* is the output magnet of Gate 1 of the quaternary upper threshold gate. In some embodiments, when the input magnetization of Gate 1 of the quaternary upper threshold gate is in the '0' direction, its output magnet has magnetization in the '0' direction. This output magnet of quaternary upper threshold gate forms the second input magnet 8501*b* (Input 2), in accordance with some embodiments. In some embodiments, third input magnet 8501*c* is a fixed magnet that has magnetization in the '0' direction.

In some embodiments, spin currents from the input magnets (Input 1, Input 2, and Input 3) conduct through their respective interconnects (e.g., first interconnect 8502*a*, second interconnect 8502*b*, and third interconnect 8502*c*) and combine at interconnect 8502*d* to produce a spin current having a direction according to the majority of the spin currents from interconnects 8502*a*, 8502*b*, and 8502*c*. This resultant spin current in interconnect 8502*d* determines the magnetization of output magnet 8503, in accordance with some embodiments.

In some embodiments, $^1X^2$ window literal gate logic is formed by a majority function of the output of lower threshold Gate 2, the output of upper threshold Gate 1, and fixed magnet with '0' direction. Majority gate 8500 illustrates the gate when first input magnet 8501*a* has magnetization in direction '3', second input magnet 8501*b* has magnetization in direction '0', and third input magnet 8501*c* has magnetization in direction '0' to generate a magnetization in direction '0' for output magnet 8503.

Figure 86:
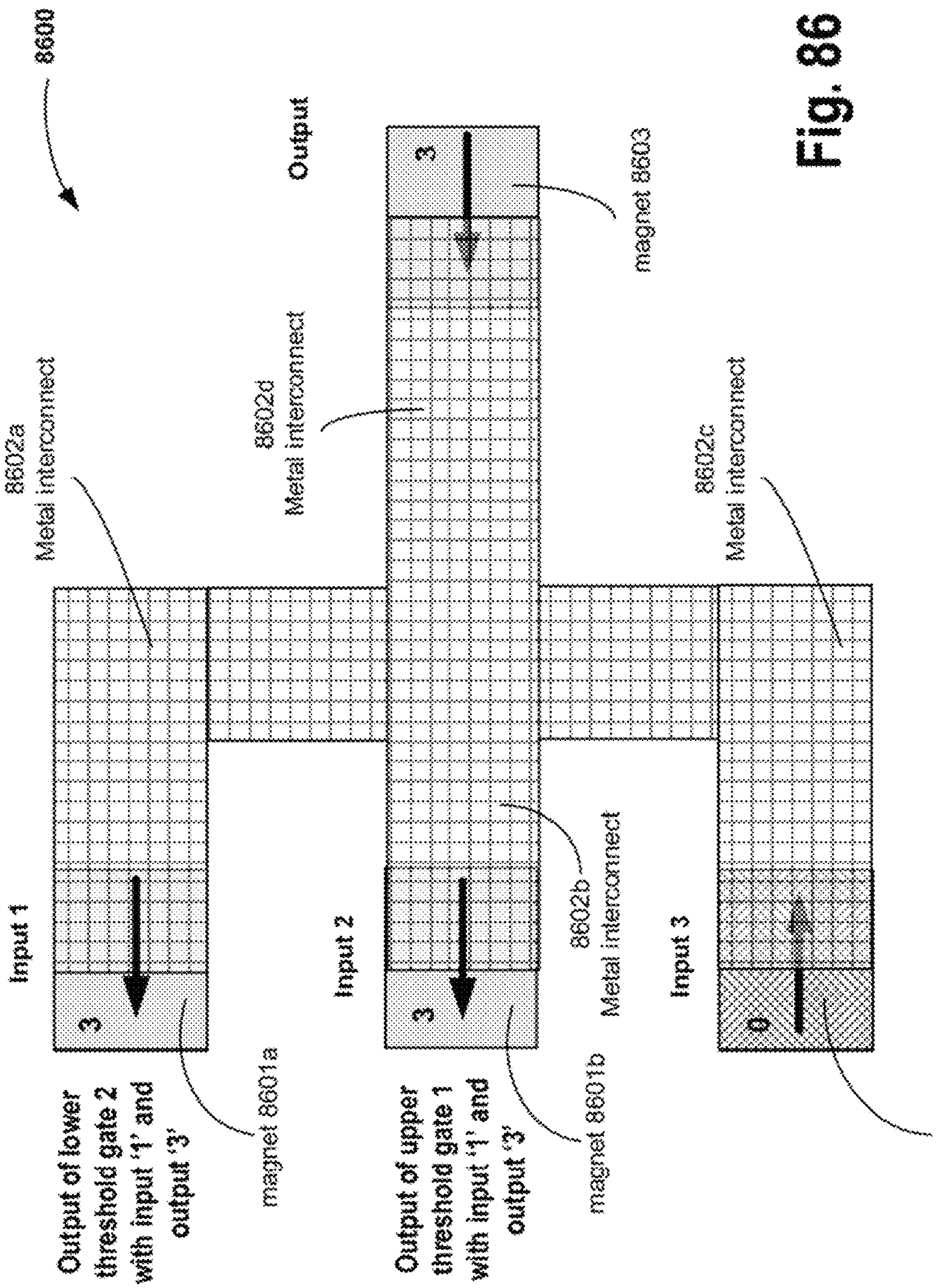

In some embodiments, majority gate 8600 of FIG. 86 is realized to perform $^1X^2$ window literal gate logic. In some embodiments, majority gate 8600 comprises first input magnet 8601*a*, second input magnet 8601*b*, third input magnet 8601*c*, output magnet 8603, first metal interconnect 8602*a*, second metal interconnect 8602*b*, third metal interconnect 8602*c*, and fourth interconnect 8602*d* coupled together as shown. The materials for the magnets and interconnects are according to the materials of magnets and interconnects described with reference to other embodiments and figures.

In some embodiments, first input magnet 8601*a* is the output magnet of Gate 2 of the quaternary lower threshold gate. In some embodiments, when the input magnetization of Gate 2 of the quaternary lower threshold gate is in the '1' direction, its output magnet has magnetization in the '3' direction. This output magnet of Gate 2 of the quaternary lower threshold gate forms the first input magnet 8601*a* (Input 1), in accordance with some embodiments. In some embodiments, second input magnet 8601*b* is the output magnet of Gate 1 of the quaternary upper threshold gate. In some embodiments, when the input magnetization of Gate 1 of the quaternary upper threshold gate is in the '1' direction, its output magnet has magnetization in the '3' direction. This output magnet of quaternary upper threshold gate forms the second input magnet 8601*b* (Input 2), in accordance with some embodiments. In some embodiments, third input magnet 8601*c* is a fixed magnet that has magnetization in the '0' direction.

In some embodiments, spin currents from the input magnets (Input 1, Input 2, and Input 3) conduct through their respective interconnects (e.g., first interconnect 8602*a*, second interconnect 8602*b*, and third interconnect 8602*c*) and combine at interconnect 8602*d* to produce a spin current having a direction according to the majority of the spin currents from interconnects 8602*a*, 8602*b*, and 8602*c*. This resultant spin current in interconnect 8602*d* determines the magnetization of output magnet 8603, in accordance with some embodiments.

In some embodiments, $^1X^2$ window literal gate logic is formed by a majority function of the output of lower threshold Gate 2, the output of upper threshold Gate 1, and fixed magnet with '0' direction. Majority gate 8600 illustrates the gate when first input magnet 8601*a* has magnetization in direction '3', second input magnet 8601*b* has magnetization in direction '3', and third input magnet 8601*c* has magnetization in direction '0' to generate a magnetization in direction '0' for output magnet 8603.

Figure 87:
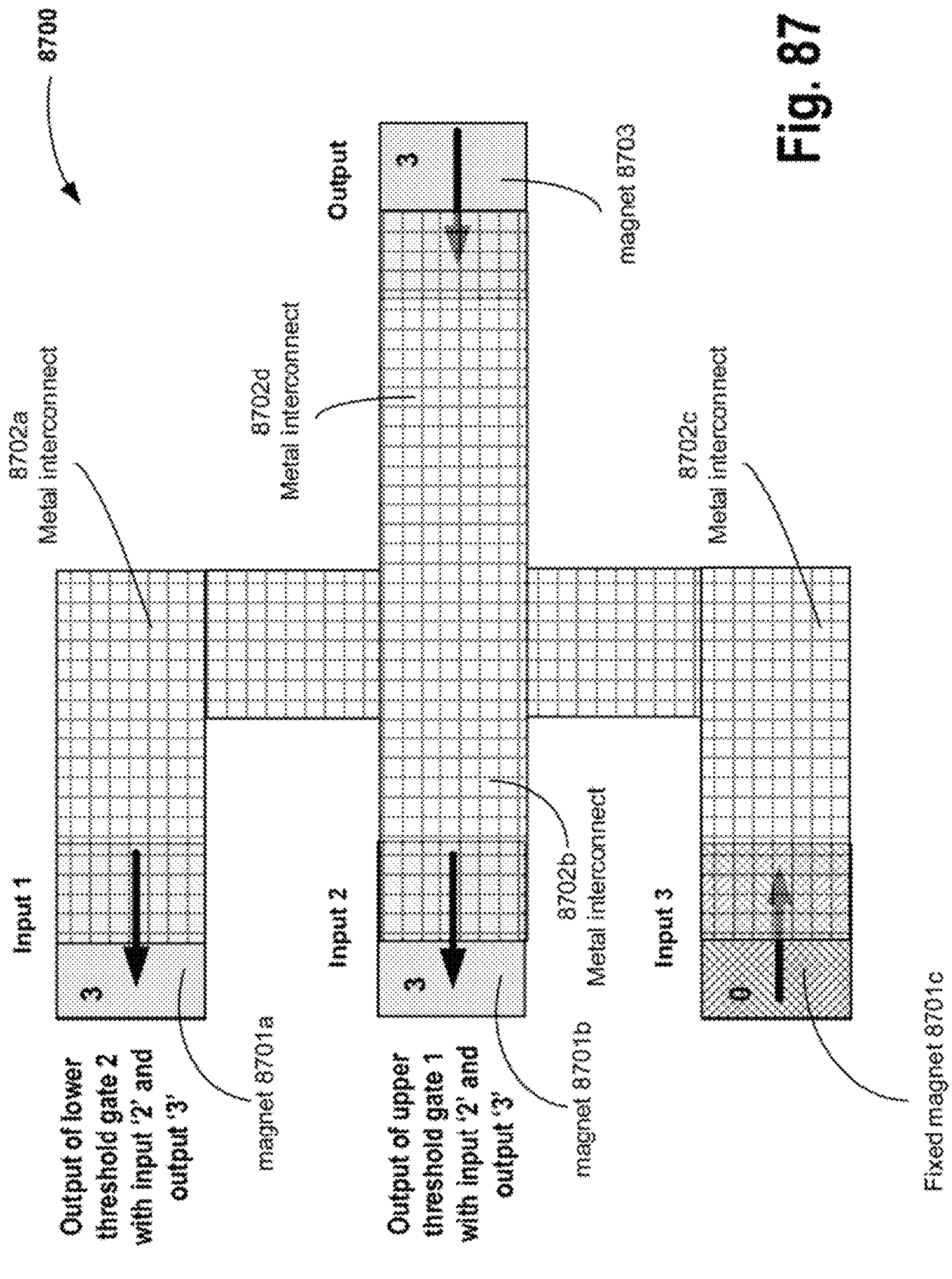

In some embodiments, majority gate 8700 of FIG. 87 is realized to perform $^1X^2$ window literal gate logic. In some embodiments, majority gate 8700 comprises first input magnet 8701*a*, second input magnet 8701*b*, third input magnet 8701*c*, output magnet 8703, first metal interconnect 8702*a*, second metal interconnect 8702*b*, third metal interconnect 8702*c*, and fourth interconnect 8702*d* coupled together as shown. The materials for the magnets and interconnects are according to the materials of magnets and interconnects described with reference to other embodiments and figures.

In some embodiments, first input magnet 8701*a* is the output magnet of Gate 1 of the quaternary lower threshold gate. In some embodiments, when the input magnetization of Gate 2 of the quaternary lower threshold gate is in the '2' direction, its output magnet has magnetization in the '3' direction. This output magnet of Gate 2 of the quaternary lower threshold gate forms the first input magnet 8701*a* (Input 1), in accordance with some embodiments. In some embodiments, second input magnet 8701*b* is the output magnet of Gate 1 of the quaternary upper threshold gate. In some embodiments, when the input magnetization of Gate 1 of the quaternary upper threshold gate is in the '2' direction, its output magnet has magnetization in the '3' direction. This output magnet of quaternary upper threshold gate forms the second input magnet 8701*b* (Input 2), in accordance with some embodiments. In some embodiments, third input magnet 8701*c* is a fixed magnet that has magnetization in the '0' direction.

In some embodiments, spin currents from the input magnets (Input 1, Input 2, and Input 3) conduct through their respective interconnects (e.g., first interconnect 8702*a*, second interconnect 8702*b*, and third interconnect 8702*c*) and combine at interconnect 8702*d* to produce a spin current having a direction according to the majority of the spin currents from interconnects 8702*a*, 8702*b*, and 8702*c*. This resultant spin current in interconnect 8702*d* determines the magnetization of output magnet 8703, in accordance with some embodiments.

In some embodiments, $^1X^2$ window literal gate logic is formed by a majority function of the output of lower threshold Gate 2, the output of upper threshold Gate 1, and fixed magnet with '0' direction. Majority gate 8700 illustrates the gate when first input magnet 8701*a* has magnetization in direction '3', second input magnet 8701*b* has magnetization in direction '3', and third input magnet 8701*c* has magnetization in direction '0' to generate a magnetization in direction '3' for output magnet 8703.

Figure 88:
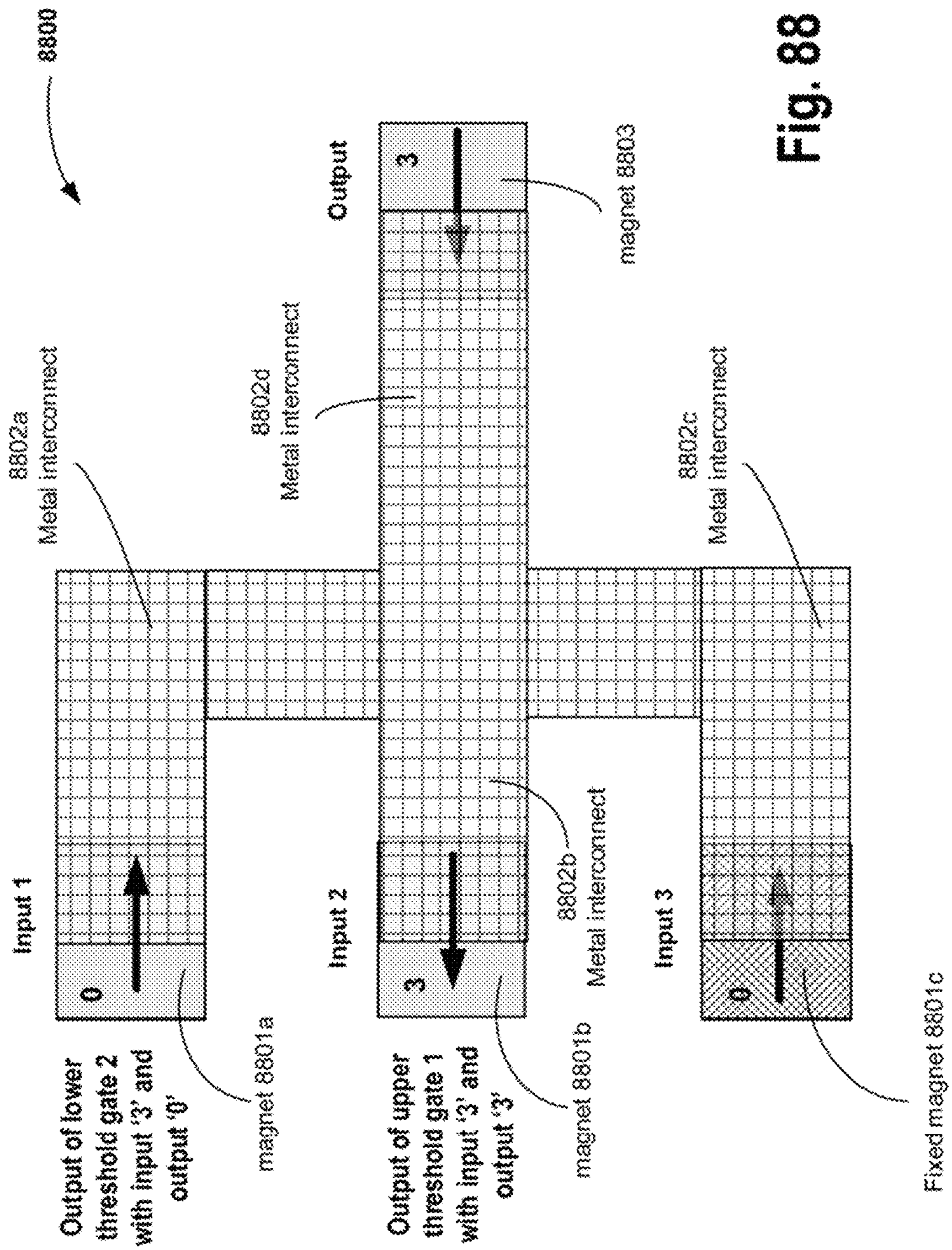

In some embodiments, majority gate 8800 of FIG. 88 is realized to perform $^1X^2$ window literal gate logic. In some embodiments, majority gate 8800 comprises first input magnet 8801*a*, second input magnet 8801*b*, third input magnet 8801*c*, output magnet 8803, first metal interconnect 8802*a*, second metal interconnect 8802*b*, third metal interconnect 8802*c*, and fourth interconnect 8802*d* coupled together as shown. The materials for the magnets and interconnects are according to the materials of magnets and interconnects described with reference to other embodiments and figures.

In some embodiments, first input magnet 8801*a* is the output magnet of Gate 2 of the quaternary lower threshold gate. In some embodiments, when the input magnetization of Gate 2 of the quaternary lower threshold gate is in the '3' direction, its output magnet has magnetization in the '0' direction. This output magnet of Gate 2 of the quaternary lower threshold gate forms the first input magnet 8801*a* (Input 1), in accordance with some embodiments. In some embodiments, second input magnet 8801*b* is the output magnet of Gate 1 of the quaternary upper threshold gate. In some embodiments, when the input magnetization of Gate 1 of the quaternary upper threshold gate is in the '3' direction, its output magnet has magnetization in the '3' direction. This output magnet of quaternary upper threshold gate forms the second input magnet 8801*b* (Input 2), in accordance with some embodiments. In some embodiments, third input magnet 8801*c* is a fixed magnet that has magnetization in the '0' direction.

In some embodiments, spin currents from the input magnets (Input 1, Input 2, and Input 3) conduct through their respective interconnects (e.g., first interconnect 8802*a*, second interconnect 8802*b*, and third interconnect 8802*c*) and combine at interconnect 8802*d* to produce a spin current having a direction according to the majority of the spin currents from interconnects 8802*a*, 8802*b*, and 8802*c*. This resultant spin current in interconnect 8802*d* determines the magnetization of output magnet 8803, in accordance with some embodiments.

In some embodiments, $^{1}X^{2}$ window literal gate logic is formed by a majority function of the output of lower threshold Gate 2, the output of upper threshold Gate 1, and fixed magnet with '0' direction. Majority gate 8800 illustrates the gate when first input magnet 8801*a* has magnetization in direction '0', second input magnet 8801*b* has magnetization in direction '3', and third input magnet 8801*c* has magnetization in direction '0' to generate a magnetization in direction '3' for output magnet 8803.

FIGS. 89-92 illustrate top views 8900, 9000, 9100, and 9200, respectively, of a majority gate to perform $^{2}X^{2}$ window literal gate logic, according to some embodiments of the disclosure.

Figure 89:
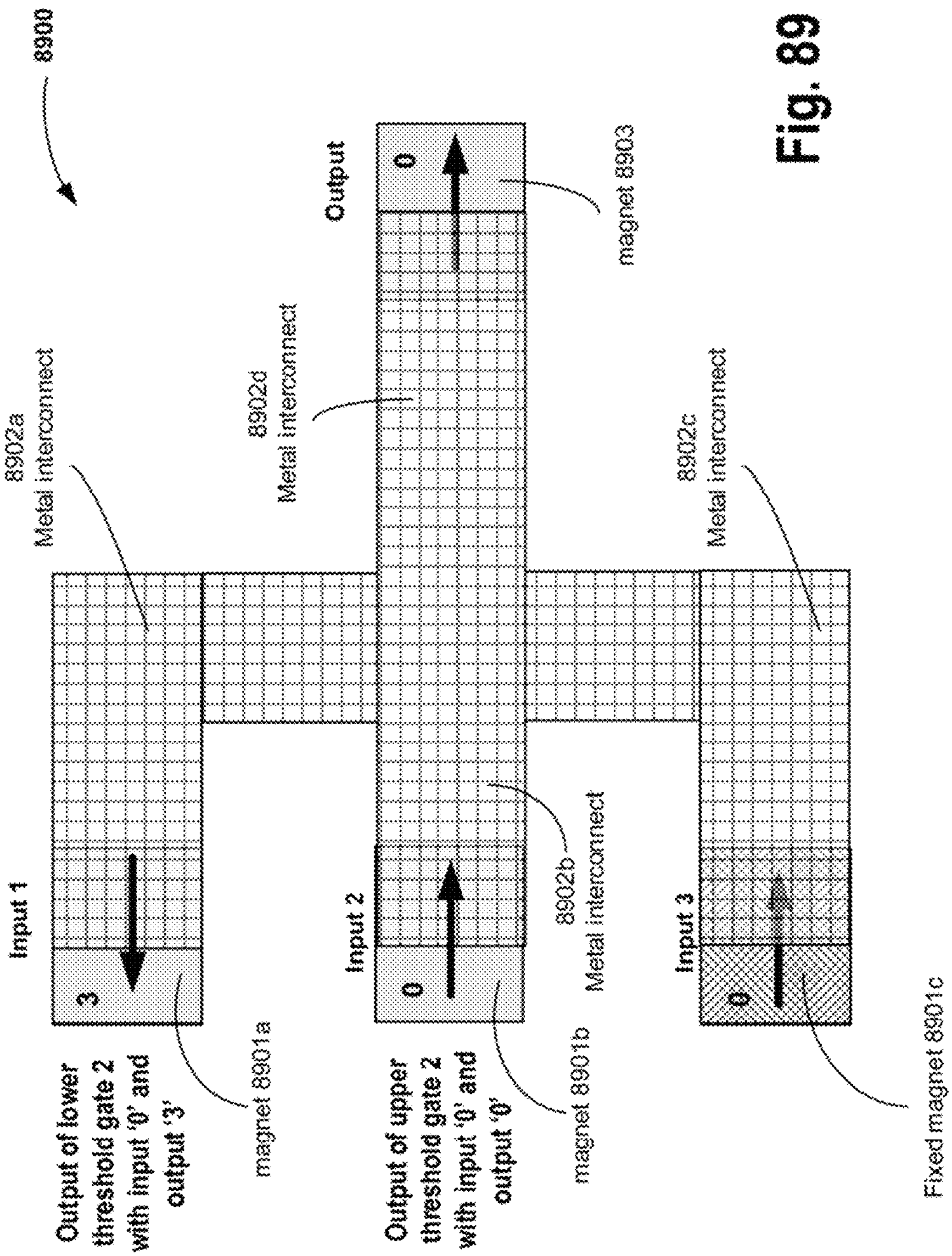
FIGS. 89-92 illustrate top views of a majority gate to perform ${}^{2}X^{2}$ window literal gate logic, according to some embodiments of the disclosure.

In some embodiments, majority gate 8900 of FIG. 89 is realized to perform $^{2}X^{2}$ window literal gate logic. In some embodiments, majority gate 8900 comprises first input magnet 8901*a*, second input magnet 8901*b*, third input magnet 8901*c*, output magnet 8903, first metal interconnect 8902*a*, second metal interconnect 8902*b*, third metal interconnect 8902*c*, and fourth interconnect 8902*d* coupled together as shown. The materials for the magnets and interconnects are according to the materials of magnets and interconnects described with reference to other embodiments and figures.

In some embodiments, first input magnet 8901*a* is the output magnet of Gate 2 of the quaternary lower threshold gate. In some embodiments, when the input magnetization of Gate 2 of the quaternary lower threshold gate is in the '0' direction, its output magnet has magnetization in the '3' direction. This output magnet of Gate 2 of the quaternary lower threshold gate forms the first input magnet 8901*a* (Input 1), in accordance with some embodiments. In some embodiments, second input magnet 8901*b* is the output magnet of Gate 2 of the quaternary upper threshold gate. In some embodiments, when the input magnetization of Gate 2 of the quaternary upper threshold gate is in the '0' direction, its output magnet has magnetization in the '0' direction. This output magnet of quaternary upper threshold gate forms the second input magnet 8901*b* (Input 2), in accordance with some embodiments. In some embodiments, third input magnet 8901*c* is a fixed magnet that has magnetization in the '0' direction.

In some embodiments, spin currents from the input magnets (Input 1, Input 2, and Input 3) conduct through their respective interconnects (e.g., first interconnect 8902*a*, second interconnect 8902*b*, and third interconnect 8902*c*) and combine at interconnect 8902*d* to produce a spin current having a direction according to the majority of the spin currents from interconnects 8902*a*, 8902*b*, and 8902*c*. This resultant spin current in interconnect 8902*d* determines the magnetization of output magnet 8903, in accordance with some embodiments.

In some embodiments, $^{2}X^{2}$ window literal gate logic is formed by a majority function of the output of lower threshold Gate 2, the output of upper threshold Gate 2, and fixed magnet with '0' direction. Majority gate 8900 illustrates the gate when first input magnet 8901*a* has magnetization in direction '3', second input magnet 8901*b* has magnetization in direction '0', and third input magnet 8901*c* has magnetization in direction '0' to generate a magnetization in direction '0' for output magnet 8903.

Figure 90:
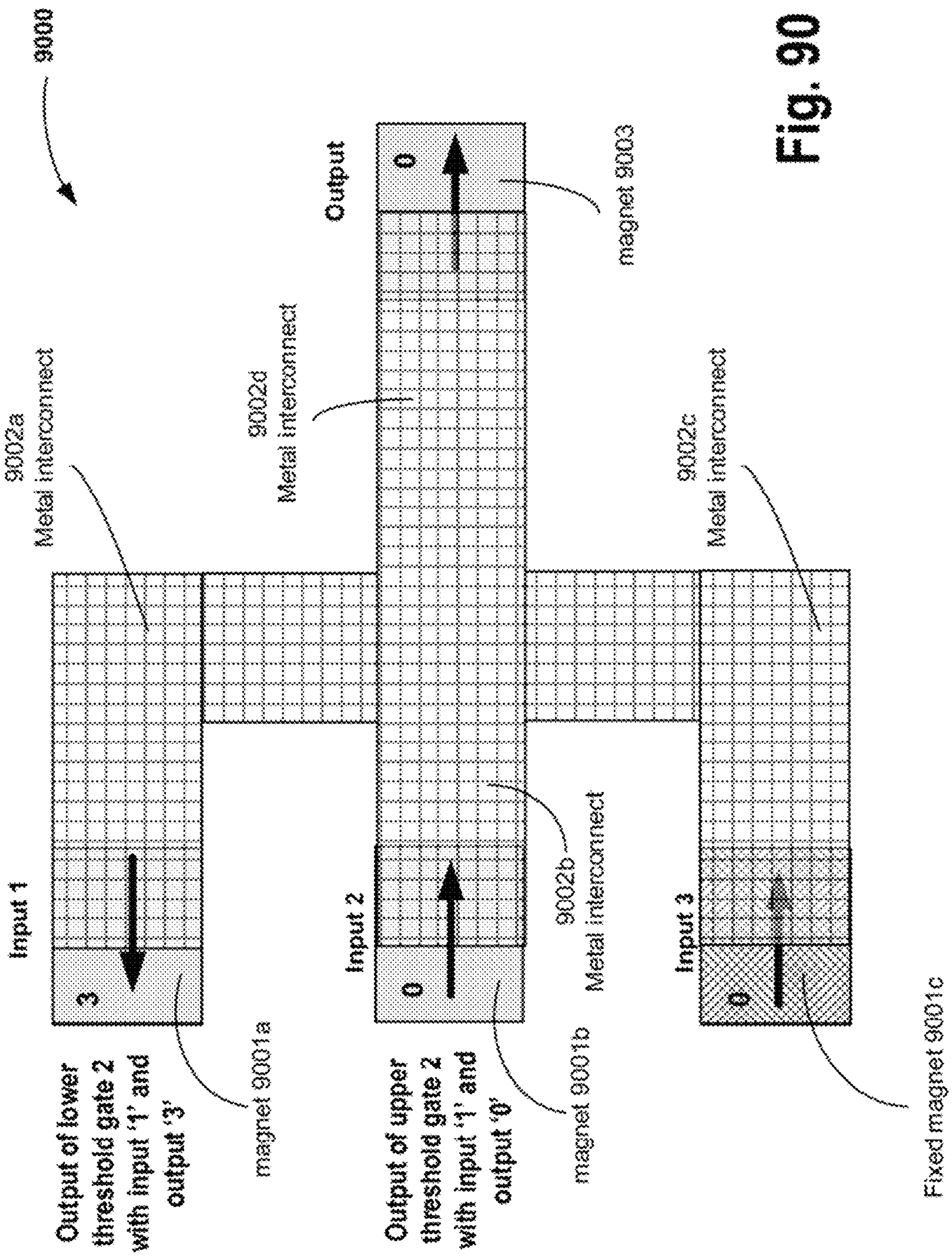

In some embodiments, majority gate 9000 of FIG. 90 is realized to perform $^{2}X^{2}$ window literal gate logic. In some embodiments, majority gate 9000 comprises first input magnet 9001*a*, second input magnet 9001*b*, third input magnet 9001*c*, output magnet 9003, first metal interconnect 9002*a*, second metal interconnect 9002*b*, third metal interconnect 9002*c*, and fourth interconnect 9002*d* coupled together as shown. The materials for the magnets and interconnects are according to the materials of magnets and interconnects described with reference to other embodiments and figures.

In some embodiments, first input magnet 9001*a* is the output magnet of Gate 2 of the quaternary lower threshold gate. In some embodiments, when the input magnetization of Gate 2 of the quaternary lower threshold gate is in the '1' direction, its output magnet has magnetization in the '3' direction. This output magnet of Gate 2 of the quaternary lower threshold gate forms the first input magnet 9001*a* (Input 1), in accordance with some embodiments. In some embodiments, second input magnet 9001*b* is the output magnet of Gate 2 of the quaternary upper threshold gate. In some embodiments, when the input magnetization of Gate 2 of the quaternary upper threshold gate is in the '1' direction, its output magnet has magnetization in the '0' direction. This output magnet of quaternary upper threshold gate forms the second input magnet 9001*b* (Input 2), in accordance with some embodiments. In some embodiments, third input magnet 9001*c* is a fixed magnet that has magnetization in the '0' direction.

In some embodiments, spin currents from the input magnets (Input 1, Input 2, and Input 3) conduct through their respective interconnects (e.g., first interconnect 9002*a*, second interconnect 9002*b*, and third interconnect 9002*c*) and combine at interconnect 9002*d* to produce a spin current having a direction according to the majority of the spin currents from interconnects 9002*a*, 9002*b*, and 9002*c*. This resultant spin current in interconnect 9002*d* determines the magnetization of output magnet 9003, in accordance with some embodiments.

In some embodiments, $^{2}X^{2}$ window literal gate logic is formed by a majority function of the output of lower threshold Gate 2, the output of upper threshold Gate 2, and fixed magnet with '0' direction. Majority gate 9000 illustrates the gate when first input magnet 9001*a* has magnetization in direction '3', second input magnet 9001*b* has magnetization in direction '0', and third input magnet 9001*c* has magnetization in direction '0' to generate a magnetization in direction '0' for output magnet 9003.

Figure 91:
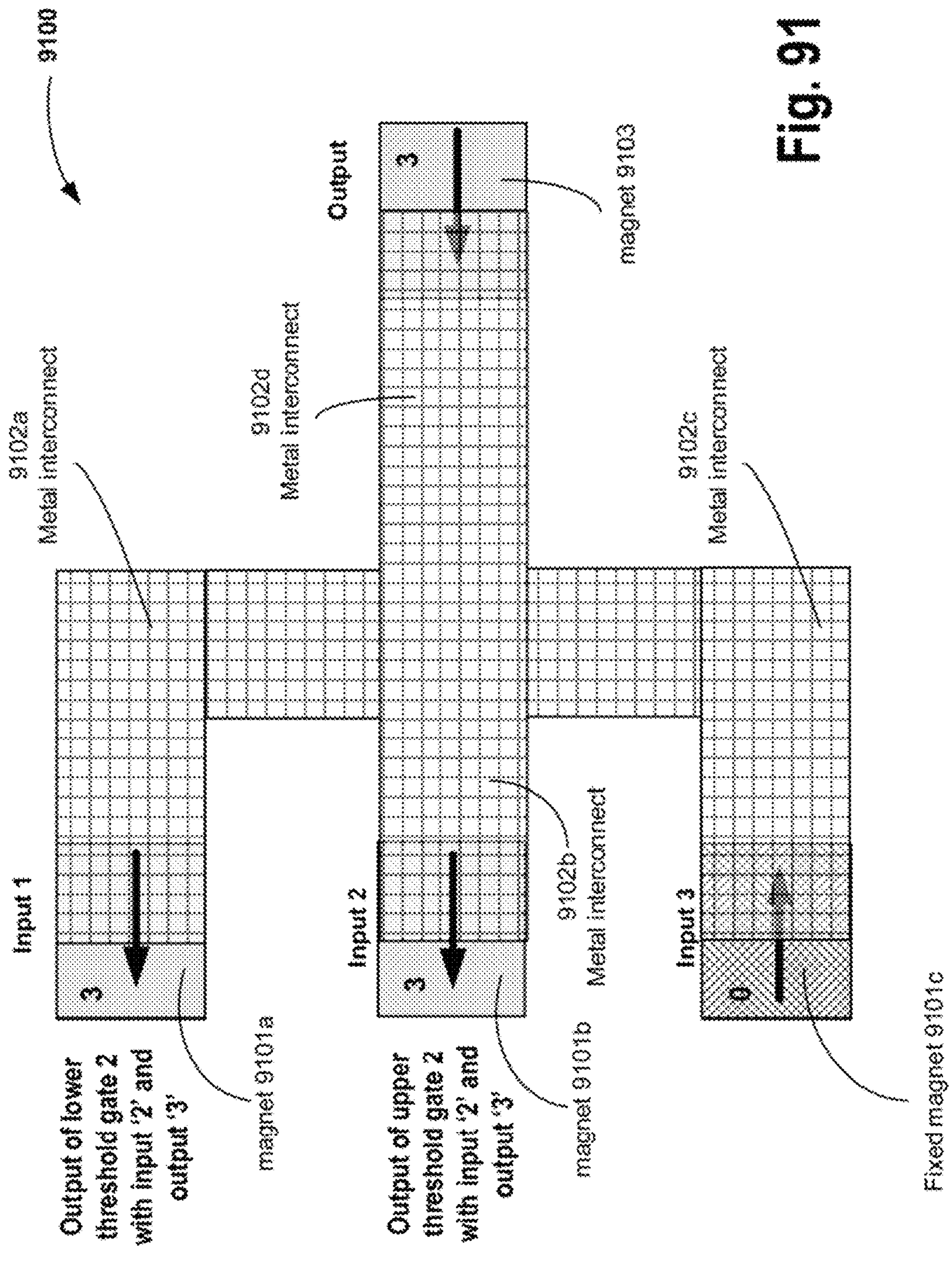

In some embodiments, majority gate 9100 of FIG. 91 is realized to perform $^2X^2$ window literal gate logic. In some embodiments, majority gate 9100 comprises first input magnet 9101*a*, second input magnet 9101*b*, third input magnet 9101*c*, output magnet 9103, first metal interconnect 9102*a*, second metal interconnect 9102*b*, third metal interconnect 9102*c*, and fourth interconnect 9102*d* coupled together as shown. The materials for the magnets and interconnects are according to the materials of magnets and interconnects described with reference to other embodiments and figures.

In some embodiments, first input magnet 9101*a* is the output magnet of Gate 2 of the quaternary lower threshold gate. In some embodiments, when the input magnetization of Gate 2 of the quaternary lower threshold gate is in the '2' direction, its output magnet has magnetization in the '3' direction. This output magnet of Gate 2 of the quaternary lower threshold gate forms the first input magnet 9101*a* (Input 1), in accordance with some embodiments. In some embodiments, second input magnet 9101*b* is the output magnet of Gate 2 of the quaternary upper threshold gate. In some embodiments, when the input magnetization of Gate 2 of the quaternary upper threshold gate is in the '2' direction, its output magnet has magnetization in the '3' direction. This output magnet of quaternary upper threshold gate forms the second input magnet 9101*b* (Input 2), in accordance with some embodiments. In some embodiments, third input magnet 9101*c* is a fixed magnet that has magnetization in the '0' direction.

In some embodiments, spin currents from the input magnets (Input 1, Input 2, and Input 3) conduct through their respective interconnects (e.g., first interconnect 9102*a*, second interconnect 9102*b*, and third interconnect 9102*c*) and combine at interconnect 9102*d* to produce a spin current having a direction according to the majority of the spin currents from interconnects 9102*a*, 9102*b*, and 9102*c*. This resultant spin current in interconnect 9102*d* determines the magnetization of output magnet 9103, in accordance with some embodiments.

In some embodiments, $^2X^2$ window literal gate logic is formed by a majority function of the output of lower threshold Gate 2, the output of upper threshold Gate 2, and fixed magnet with '0' direction. Majority gate 9100 illustrates the gate when first input magnet 9101*a* has magnetization in direction '3', second input magnet 9101*b* has magnetization in direction '3', and third input magnet 9101*c* has magnetization in direction '0' to generate a magnetization in direction '3' for output magnet 9103.

Figure 92:
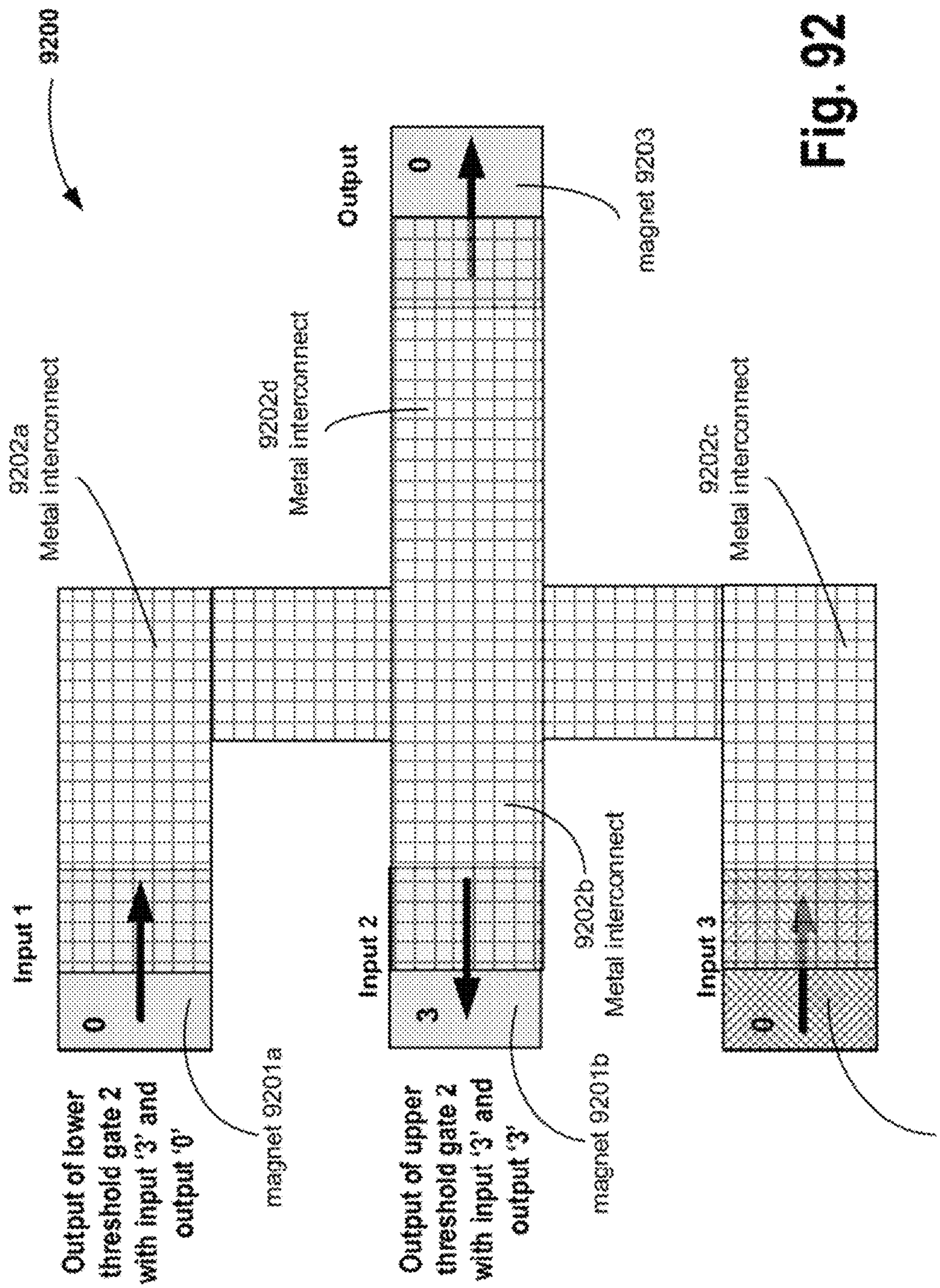

In some embodiments, majority gate 9200 of FIG. 92 is realized to perform $^2X^2$ window literal gate logic. In some embodiments, majority gate 9200 comprises first input magnet 9201*a*, second input magnet 9201*b*, third input magnet 9201*c*, output magnet 9203, first metal interconnect 9202*a*, second metal interconnect 9202*b*, third metal interconnect 9202*c*, and fourth interconnect 9202*d* coupled together as shown. The materials for the magnets and interconnects are according to the materials of magnets and interconnects described with reference to other embodiments and figures.

In some embodiments, first input magnet 9201*a* is the output magnet of Gate 2 of the quaternary lower threshold gate. In some embodiments, when the input magnetization of Gate 2 of the quaternary lower threshold gate is in the '3' direction, its output magnet has magnetization in the '0' direction. This output magnet of Gate 2 of the quaternary lower threshold gate forms the first input magnet 9201*a* (Input 1), in accordance with some embodiments. In some embodiments, second input magnet 9201*b* is the output magnet of Gate 2 of the quaternary upper threshold gate. In some embodiments, when the input magnetization of Gate 2 of the quaternary upper threshold gate is in the '3' direction, its output magnet has magnetization in the '3' direction. This output magnet of quaternary upper threshold gate forms the second input magnet 9201*b* (Input 2), in accordance with some embodiments. In some embodiments, third input magnet 9201*c* is a fixed magnet that has magnetization in the '0' direction.

In some embodiments, spin currents from the input magnets (Input 1, Input 2, and Input 3) conduct through their respective interconnects (e.g., first interconnect 9202*a*, second interconnect 9202*b*, and third interconnect 9202*c*) and combine at interconnect 9202*d* to produce a spin current having a direction according to the majority of the spin currents from interconnects 9202*a*, 9202*b*, and 9202*c*. This resultant spin current in interconnect 9202*d* determines the magnetization of output magnet 9203, in accordance with some embodiments.

In some embodiments, $^2X^2$ window literal gate logic is formed by a majority function of the output of lower threshold Gate 2, the output of upper threshold Gate 2, and fixed magnet with '0' direction. Majority gate 9200 illustrates the gate when first input magnet 9201*a* has magnetization in direction '0', second input magnet 9201*b* has magnetization in direction '3', and third input magnet 9201*c* has magnetization in direction '0' to generate a magnetization in direction '0' for output magnet 9203.

Quaternary Max Gate—Mode A, Mode B

Figure 93:
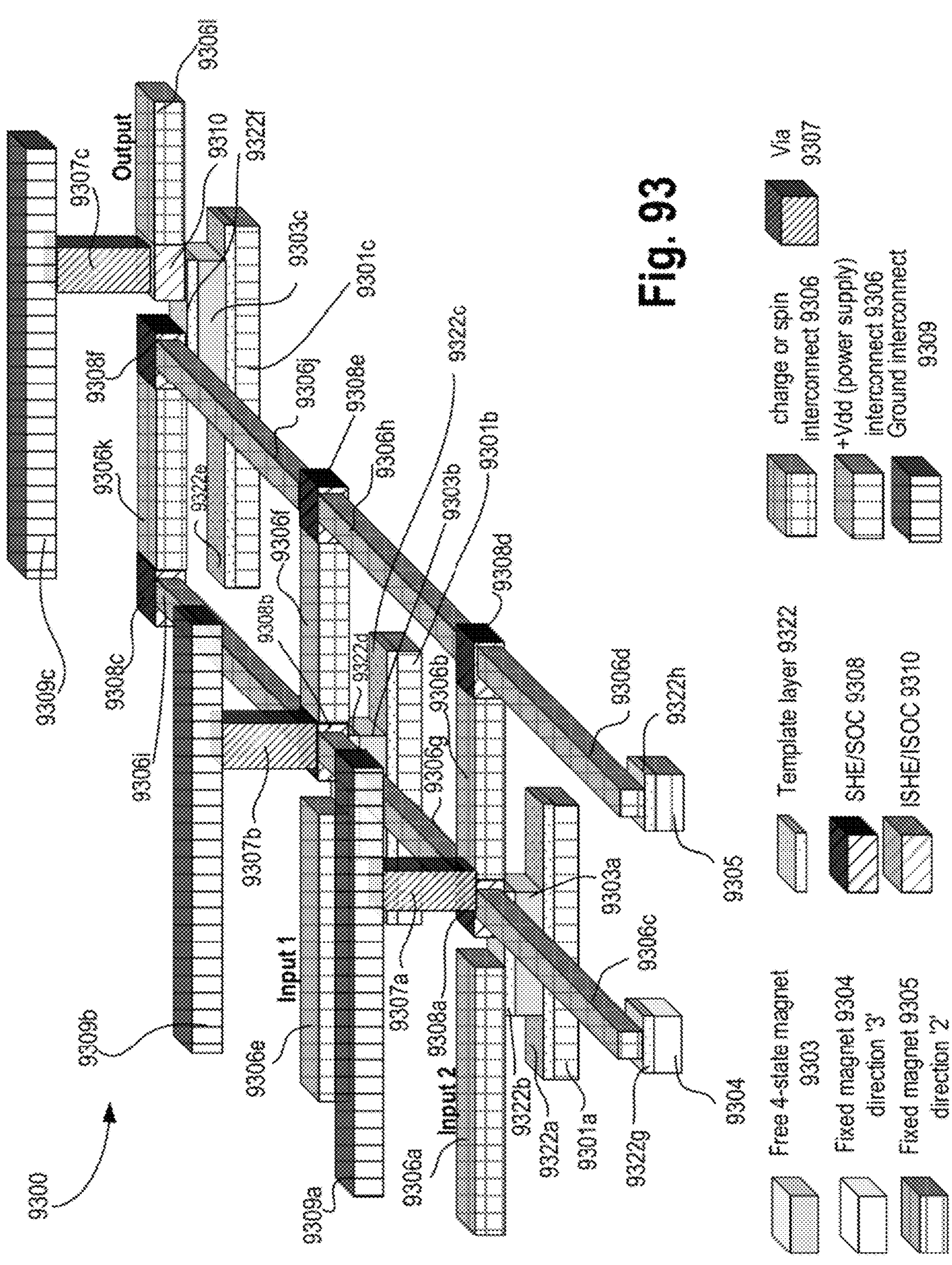
FIG. 93 illustrates a 3D view of a max-gate, according to some embodiments of the disclosure.

FIG. 93 illustrates a 3D view of max gate 9300, according to some embodiments of the disclosure. It is pointed out that those elements of FIG. 93 having the same reference numbers (or names) as the elements of any other figure can operate or function in any manner similar to that described, but are not limited to such.

In some embodiments, max gate 9300 comprises two fixed magnetic injectors 9304 and 9305 (either using fixed magnets or charge to spin conversion using spin hall effect) injecting spin during two complementary operation conditions. The materials for the fixed magnets can be according to the fixed magnets described with reference to various embodiments. In some embodiments, max gate 9300 comprises input spin interconnects 9306*a* and 9306*e* and output charge interconnect 93061. In some embodiments, max gate 9300 comprises 4-state input free magnets 9322*a* and 9303*b* coupled to the input spin interconnects.

In some embodiments, the 4-state input free magnets 9322*a* and 9303*b* are templated as discussed with reference to other embodiments. Here, the associated template layers for the 4-state input free magnets are 9322*a*, 9322*b*, 9322*c*, and 9322*d* coupled to their respective magnets. In some embodiments, the output interconnect 9306*l* is coupled to an output magnet 9303*c*. In some embodiments, the output magnet 9303*c* is a 4-state free magnet. In some embodiments, the 4-state free output magnet 9303*c* is templated as discussed with reference to other embodiments. Here, the associated template layers are 9322*e* and 9322*f*. The template layers 9322*a*, 9322*b*, 9322*c*, 9322*d*, 9322*e*, 9322*f* are formed according to the template layers described with reference to various embodiments.

In some embodiments, template layer 9322*a* is formed over metal interconnect 9301*a*. In some embodiments, metal interconnect 9301*a* is coupled to a power supply (e.g., negative power supply −Vdd). In some embodiments, template layer 9322*b* is formed over metal interconnect 9301*b*. In some embodiments, metal interconnect 9301*b* is coupled to a power supply (e.g., negative power supply −Vdd). In some embodiments, template layer 9322*e* is formed over metal interconnect 9301*c*. In some embodiments, metal interconnect 9301*c* is coupled to a power supply (e.g., negative power supply −Vdd).

In some embodiments, SHE/SOC layer is deposited on the magnets (or on their template layers) for generating Rashba effect based charge currents. In some embodiments, SHE/SOC layer 9308*a* is deposited on template layer 9322*b* coupled to 4-state input free magnet 9303*a*. In some embodiments, SHE/SOC layer 9308*b* is deposited on template layer 9322*d* coupled to 4-state input free magnet 9303*b*. SHE/SOC layers 9308*a* and 9308*b* are formed using the SHE materials described with reference to various embodiments. In some embodiments, output interconnect 9306I is coupled to a layer of ISHE/ISOC 9310. In some embodiments, layer of ISHE/ISOC 9310 is coupled to the output 4-state free magnet 9303*c* via template layer 9322*f*.

In some embodiments, a ground supply is provided to SHE/SOC layers 9308*a* and 9308*b*. In some embodiments, via 9307*a* is formed over SHE/SOC layer 9308*a*, and then interconnect 9309*a* is coupled to one end of via 9307*a*. In some embodiments, via 9307*b* is formed over SHE/SOC layer 9308*b*, and then interconnect 9309*b* is coupled to one end of via 9307*b*. In some embodiments, ground supply is provided to ISHE/SOC layer 9310. In some embodiments, via 9307*c* is formed over ISHE/ISOC layer 9310, and then interconnect 9309*c* is coupled to one end of via 9307*c*. In some embodiments, interconnect 9301*c* is coupled to ground.

In some embodiments, there is a gap between input spin interconnects and the SHE/SOC layers. This gap may be filed with oxide (e.g., $SiO_2$), in accordance with some embodiments. For example, there is a gap between interconnect 9306 and SHE/SOC layer 9308*a*, and a gap between interconnect 9306 and SHE/SOC layer 9308*b*. In some embodiments, four main conduction paths are provided in max gate 9300.

In some embodiments, the first conduction path comprises interconnects 9306*c*, 9306*g*, and 9306*i*. In some embodiments, one end of interconnect 9306*c* is coupled to fixed magnet 9304 via template layer 9322*g*. In some embodiments, the other end of interconnect 9306*c* is coupled to SHE/SOC layer 9308*a*. In some embodiments, one end of interconnect 9306*g* is coupled to SHE/SOC layer 9308*a* and another end of interconnect 9306*g* is coupled to SHE/SOC layer 9308*b*. In some embodiments, one end of interconnect 9306*i* is coupled to SHE/SOC layer 9308*b* and another end of interconnect 9306*g* is coupled to SHE/SOC layer 9308*c*. In some embodiments, interconnect 9306*k* is coupled to SHE/SOC layer 9308*c*. In some embodiments, interconnect 9306*k* extends orthogonal to interconnect 9306*i*.

In some embodiments, the second conduction path comprises interconnect 9306*b* (a charge interconnect) which couples to SHE/SOC layer 9308*a* at one end and SHE/SOC layer 9308*d* at another end. In some embodiments, interconnect 9306*b* extends orthogonal to interconnect 9306*c*. In some embodiments, the third conduction path comprises interconnect 9306*f* (a charge interconnect) which couples to SHE/SOC layer 9308*b* at one end and SHE/SOC layer 9308*e* at another end. In some embodiments, interconnect 9306*f* extends orthogonal to interconnect 9306*g*.

In some embodiments, the fourth conduction path comprises interconnects 9306*d*, 9306*h*, and 9306*j*. In some embodiments, one end of interconnect 9306*d* is coupled to fixed magnet 9305 via template layer 9322*h*. In some embodiments, the other end of interconnect 9306*d* is coupled to SHE/SOC layer 9308*d*. In some embodiments, one end of interconnect 9306*h* is coupled to SHE/SOC layer 9308*d* and another end of interconnect 9306*h* is coupled to SHE/SOC layer 9308*e*. In some embodiments, one end of interconnect 9306*j* is coupled to SHE/SOC layer 9308*e* and another end of interconnect 9306*j* is coupled to SHE/SOC layer 9308*f*. In some embodiments, SHE/SOC layer 9308*f* couples to output free magnet 9303*c* via template layer 9310. In some embodiments, there is a gap between SHE/SOC layer 9308*f* and SHE/SOC layer 9310. In some embodiments, interconnects of the fourth conduction are spin interconnects.

Figure 94:
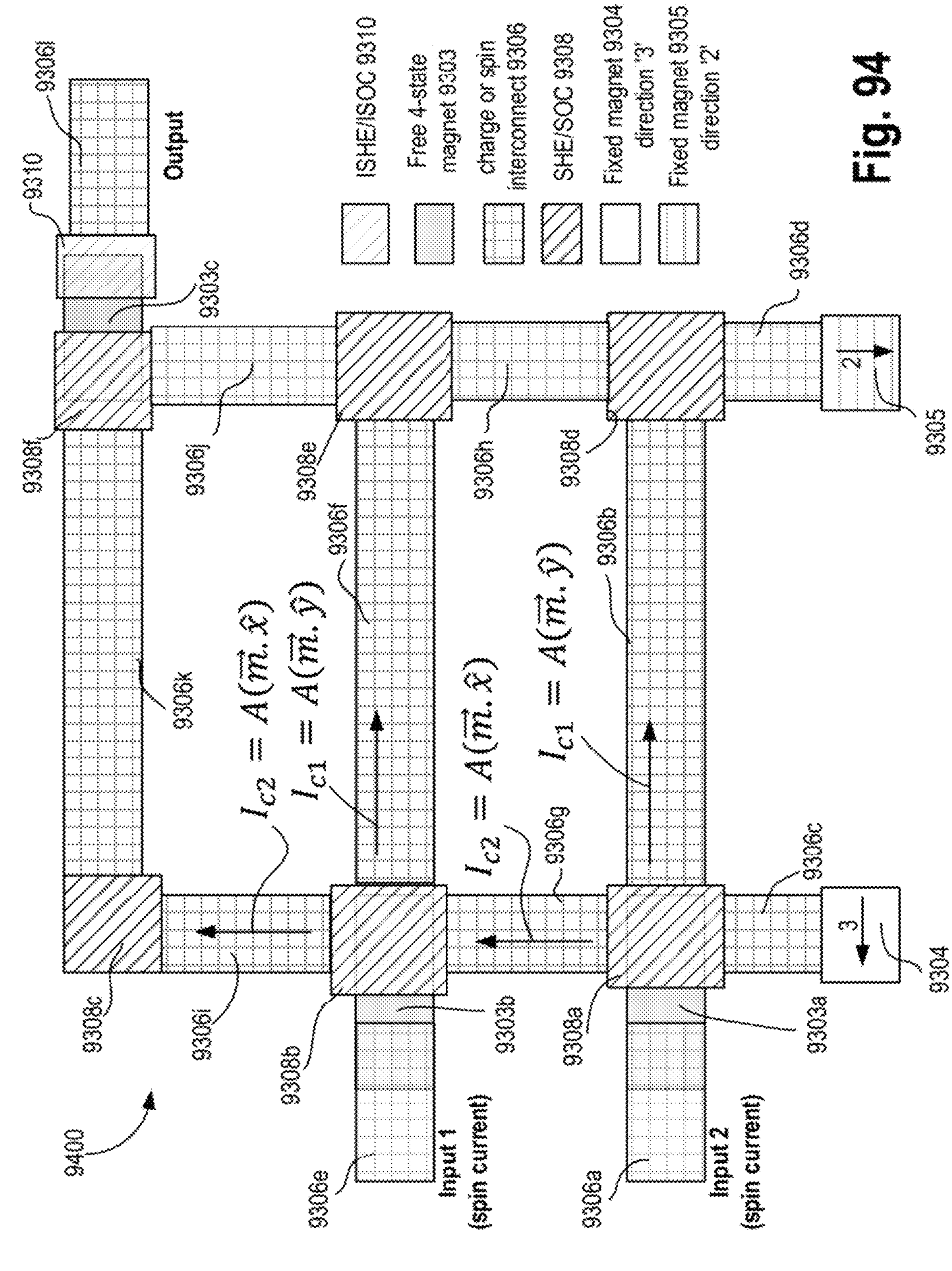
FIG. 94 illustrates a top view of a max-gate, according to some embodiments of the disclosure.

FIG. 94 illustrates top view 9400 of a max-gate 9300, according to some embodiments of the disclosure. It is pointed out that those elements of FIG. 94 having the same reference numbers (or names) as the elements of any other figure can operate or function in any manner similar to that described, but are not limited to such.

The spin input currents on interconnects 9306*a* and 9306*e* of max gate 9300 are first transduced to charge via spin orbit effect stacks 9308*a* and 9308*b*, respectively. In some embodiments, vertical wire/interconnect 9306*c/g/i* of the first conduction path carries the spin to charge transduced information from magnetic inputs 1 and 2 along the directions '0' or '3' (+x or −x directions, respectively). This current is labeled as $I_{c2}$ which is the current component in the x-direction, where:

$$I_{c2}=A(\vec{m}\cdot\hat{x})$$

In some embodiments, horizontal wires 9806*b* and 9306*f* of second and third conduction paths, respectively, carry the spin to charge transduced information from magnetic inputs 2 and 1, respectively, along the directions '1' and '2'. For example, the current in interconnect 9306*b* is $I_{c1}$ which is the current in the y-direction, where:

$$I_{c1}=A(\vec{m}\cdot\hat{y})$$

In some embodiments, wire or interconnect 9306*k* carries the spin current injected into wire 9306*k* from vertical wire 9306*c/g/i* due to the SOC layer 9308*c*. In some embodiments, vertical wires 9306*d/h/j* carries the spin current injected into vertical wires 9306*d/h/j* from horizontal wires 9306*f* and 9306*b* due to the SOC layer 9308*b* SOC layers 9308*a*, respectively.

Table 11 is the truth table of the max gate 9300.

TABLE 11

| Max gate 9300 | | | | |
|---|---|---|---|---|
| | Input1 | | | |
| Input 2 | 0 | 1 | 2 | 3 |
| 0 | 0 | 1 | 2 | 3 |
| 1 | 1 | 1 | 2 | 3 |
| 2 | 2 | 2 | 2 | 3 |
| 3 | 3 | 3 | 3 | 3 |

Table 11 illustrates spin directions of input 1 (i.e., spins in interconnect 9306*e*) and input 2 (i.e., spins in interconnect 9306*a*), and corresponding magnetization direction of output magnet 9303*c*.

There are two operation modes—mode-1 and mode-2—of the max gate characterized by the inputs, according to some embodiments. In some embodiments, in mode-1, both inputs (i.e., input 1 and input 2) have spin directions that are both '1' or '2'. Mode 1 is illustrated as a shared central region in Table 11.

In some embodiments, in mode-2, both inputs (i.e., input 1 and input 2) have spin directions that are not both '1' or '2' (e.g., the input spins are either of directions '0' and '3'). In some embodiments, fixed magnets 9304 and 9305 (or their equivalent SOC realization) operate in their particular operation modes. In some embodiments, fixed magnet 9304 is pinned along direction '3' (i.e., along −x direction) and injects charge or biases during operation mode 2. In some embodiments, fixed magnet 9305 is pinned along direction '2' (i.e., along −y direction) and injects spin or biases during operation mode '1'.

In some embodiments, during mode-1, ferromagnet 9304 is off (i.e., supply is not applied to that magnet) and the signal on wire 9306*c/g/i* is close to zero since wire 9306*g* transduces the information from '0' and '3' states of the magnets. In some embodiments, wire 9306*f* and 9306*b* carry the charge currents proportional to the magnetization in the y-directions. Hence spin currents are injected into interconnects 9306*d/h/j* in logic '1' or '2' directions. The presence of the spin injection from ferromagnet 9305 produces an output of '2' unless both spin currents from wire 9306*f* and 9306*b* are '1'.

In some embodiments, during mode-2, ferromagnet 9305 is off and the signal of wires 9306*c/g/i* is simply determined by wire 9306*f* and wire 9306*b*. When at least one of the inputs is '3', wire 9306*c/g/i* produces a net positive current due to the presence of current from ferromagnet 9304. This leads to the output being '3' whenever any one of the inputs is '3'. In some embodiments, when both the inputs are '0', the output is zero since the wire 9306*c/g/i* is dominated by the inputs.

A special case of mode-2 is the case where one of the inputs is '0' or '3' and one of the inputs is '1' or '2'. In this case, the effect of the input '0' is nullified by fixed magnet 9304. The spin current injected by the magnets 9308*a/b* in state '1' or '2' dominates the final current leading to a switching as identified in the truth table. This completes all the entries of the max gate.

In some embodiments, the minimum gate for quaternary logic is identical in structure except for changes in the biases and operating modes.

FIGS. 95-106 illustrate top views of max-gate 9300 which is biased for modes 1 and 2, in accordance with some embodiments. It is pointed out that those elements of FIGS. 95-106 having the same reference numbers (or names) as the elements of any other figure can operate or function in any manner similar to that described, but are not limited to such.

Figure 95:
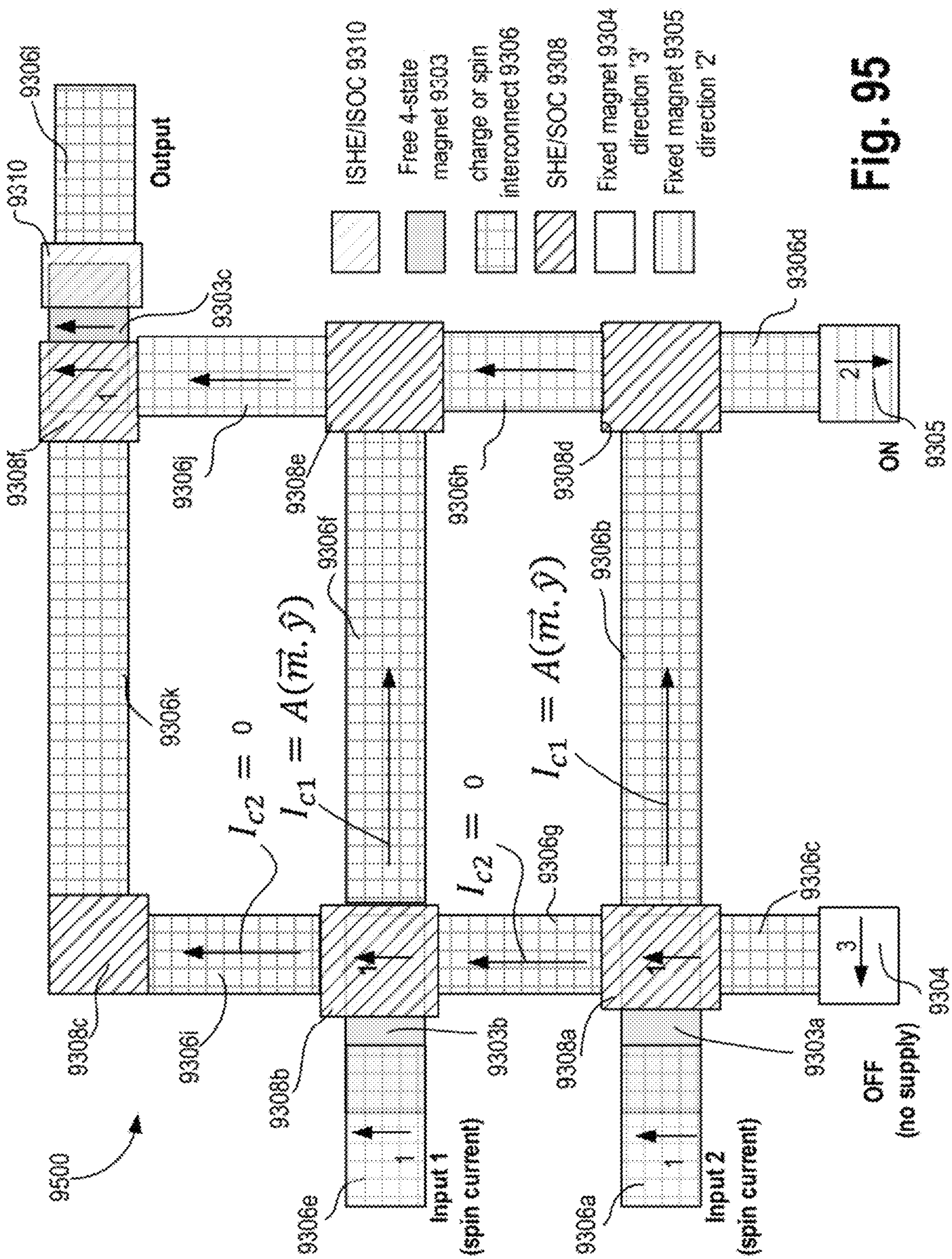
FIG. 95 illustrates a top view of a max-gate which is biased to process inputs in the +y direction (i.e., both inputs are in direction '1'), according to some embodiments of the disclosure.

FIG. 95 illustrates top view 9500 of max-gate 9300 which is biased to process inputs in the +y direction (i.e., both inputs are in direction '1'), according to some embodiments of the disclosure. This case is a mode-1 case. In this case, the supply to the fixed magnet 9304 is off while the supply to fixed magnet 9305 is on. Here, the input magnets 9306*e* and 9306*a* are magnetized in direction '1' and the output magnet 9303*c* is magnetized in direction '1'. Current $I_{c2}$=0 because the input spin currents do not have spins in the x-direction. The input currents being in y-direction generate current $I_{c1}$.

Figure 96:
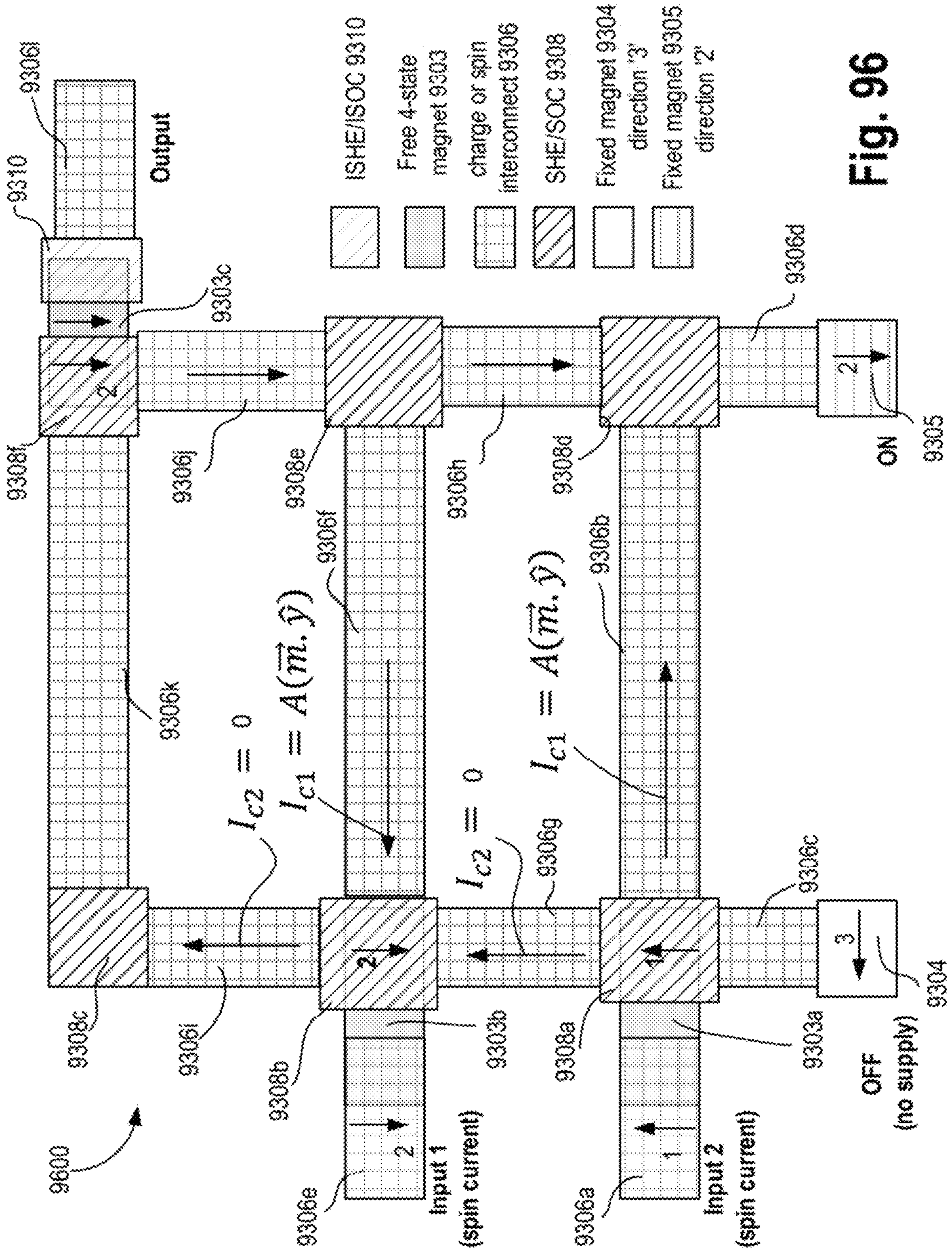
FIG. 96 illustrates a top view of a max-gate which is biased to process input 1 in the −y direction (i.e., in direction '2') and input 2 in the +y direction (i.e., in direction '1'), according to some embodiments of the disclosure.

FIG. 96 illustrates top view 9600 of max-gate 9300 which is biased to process input 1 in the −y direction (i.e., in direction '2') and input 2 in the +y direction (i.e., in direction '1'), according to some embodiments of the disclosure. This case is a mode-1 case. In this case, the supply to the fixed magnet 9304 is off while the supply to fixed magnet 9305 is on. Here, the input magnet 9306*e* is magnetized in direction '2' because of the input spins being in −y direction. The second input magnet 9306*a* is magnetized in direction '1' because the input spins are in +y direction. The output magnet 9303*c* is magnetized in direction '2'. Current $I_{c2}$=because the input spin currents do not have spins in the x-direction. The input currents being in y-direction generate current $I_{c1}$.

Figure 97:
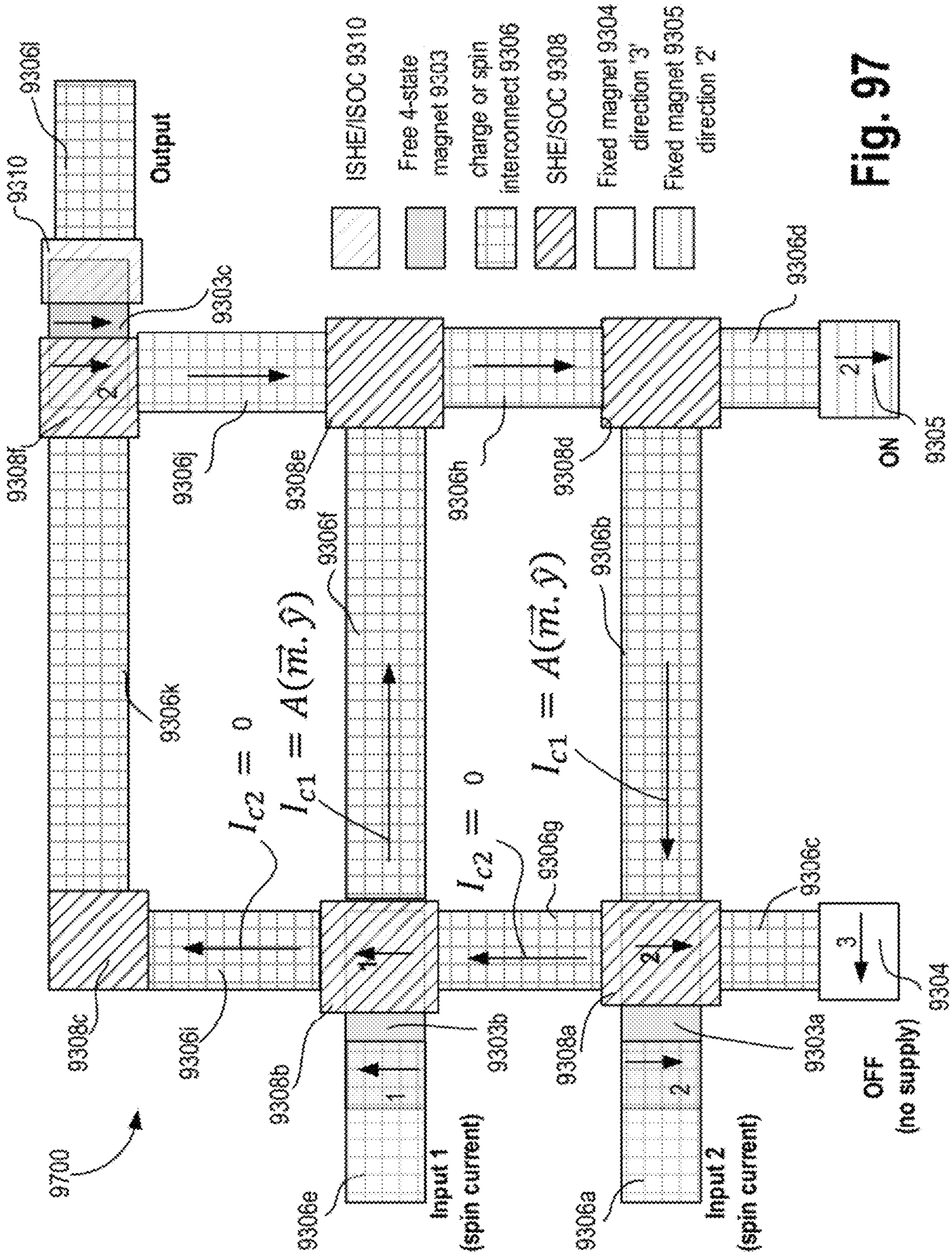
FIG. 97 illustrates a top view of a max-gate which is biased to process input 1 in the +y direction (i.e., in direction '1') and input 2 in the −y direction (i.e., in direction '2'), according to some embodiments of the disclosure.

FIG. 97 illustrates top view 9700 of max-gate 9300 which is biased to process input 1 in the +y direction (i.e., in direction '1') and input 2 in the −y direction (i.e., in direction '2'), according to some embodiments of the disclosure. This case is a mode-1 case. In this case, the supply to the fixed magnet 9304 is off while the supply to fixed magnet 9305 is on. Here, the input magnet 9306*e* is magnetized in direction '1' because of the input spins being in +y direction. The second input magnet 9306*a* is magnetized in direction '2' because the input spins are in −y direction. The output magnet 9303*c* is magnetized in direction '2'. Current $I_{c2}$=0 because the input spin currents do not have spins in the x-direction. The input currents being in y-direction generate current $I_{c1}$.

Figure 98:
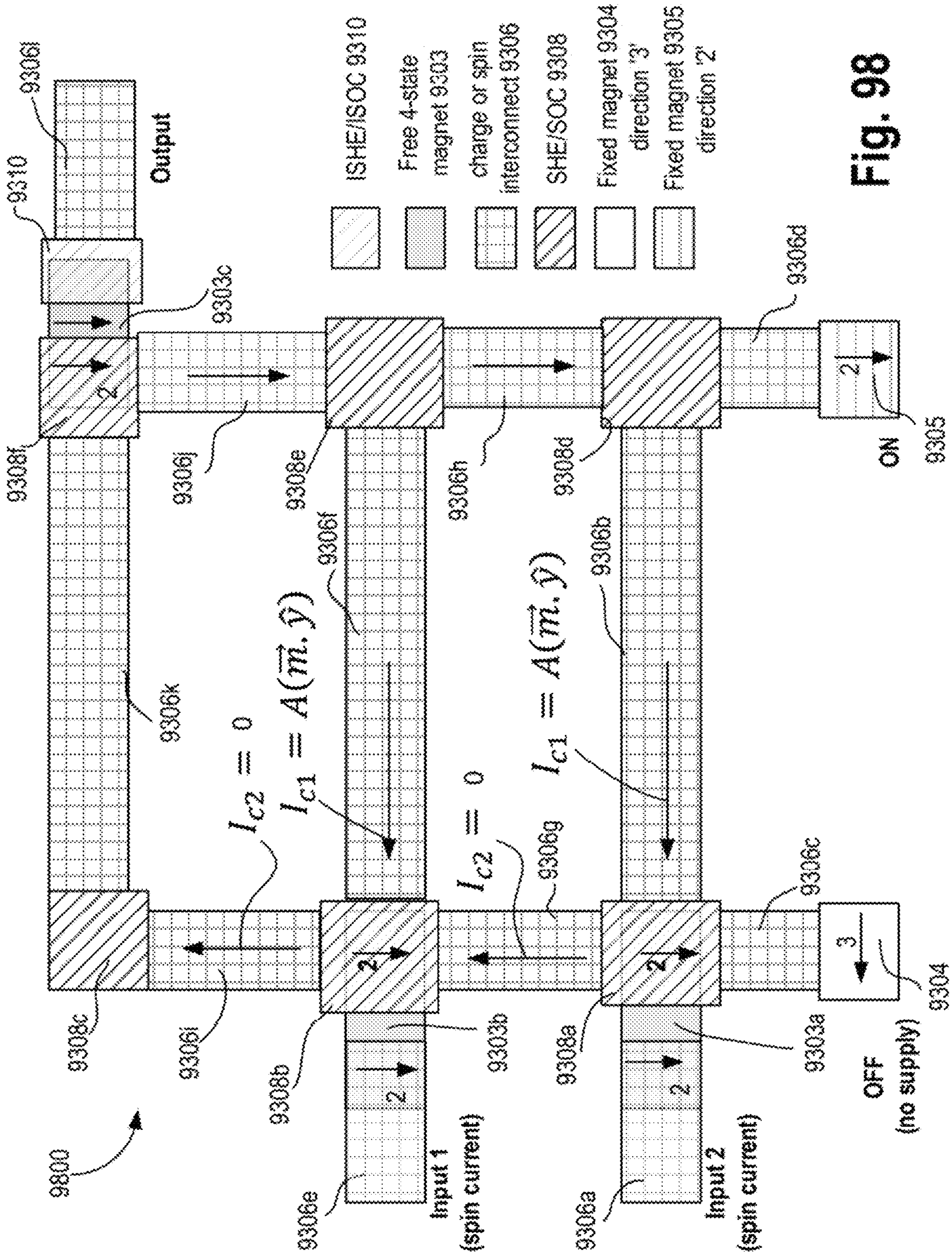
FIG. 98 illustrates a top view of a max-gate which is biased to process inputs in the −y direction (i.e., both inputs are in direction '2'), according to some embodiments of the disclosure.

FIG. 98 illustrates top view 9800 of max-gate 9300 which is biased to process inputs in the −y direction (i.e., both inputs are in direction '2'), according to some embodiments of the disclosure. This case is a mode-1 case. In this case, the supply to the fixed magnet 9304 is off while the supply to fixed magnet 9305 is on. Here, the input magnet 9306*e* is magnetized in direction '2' because of the input spins being in −y direction. The second input magnet 9306*a* is magnetized in direction '2' because the input spins are in −y direction. The output magnet 9303*c* is magnetized in direction '2'. Current $I_{c2}$=0 because the input spin currents do not have spins in the x-direction. The input currents being in y-direction generate current $I_{c1}$.

Figure 99:
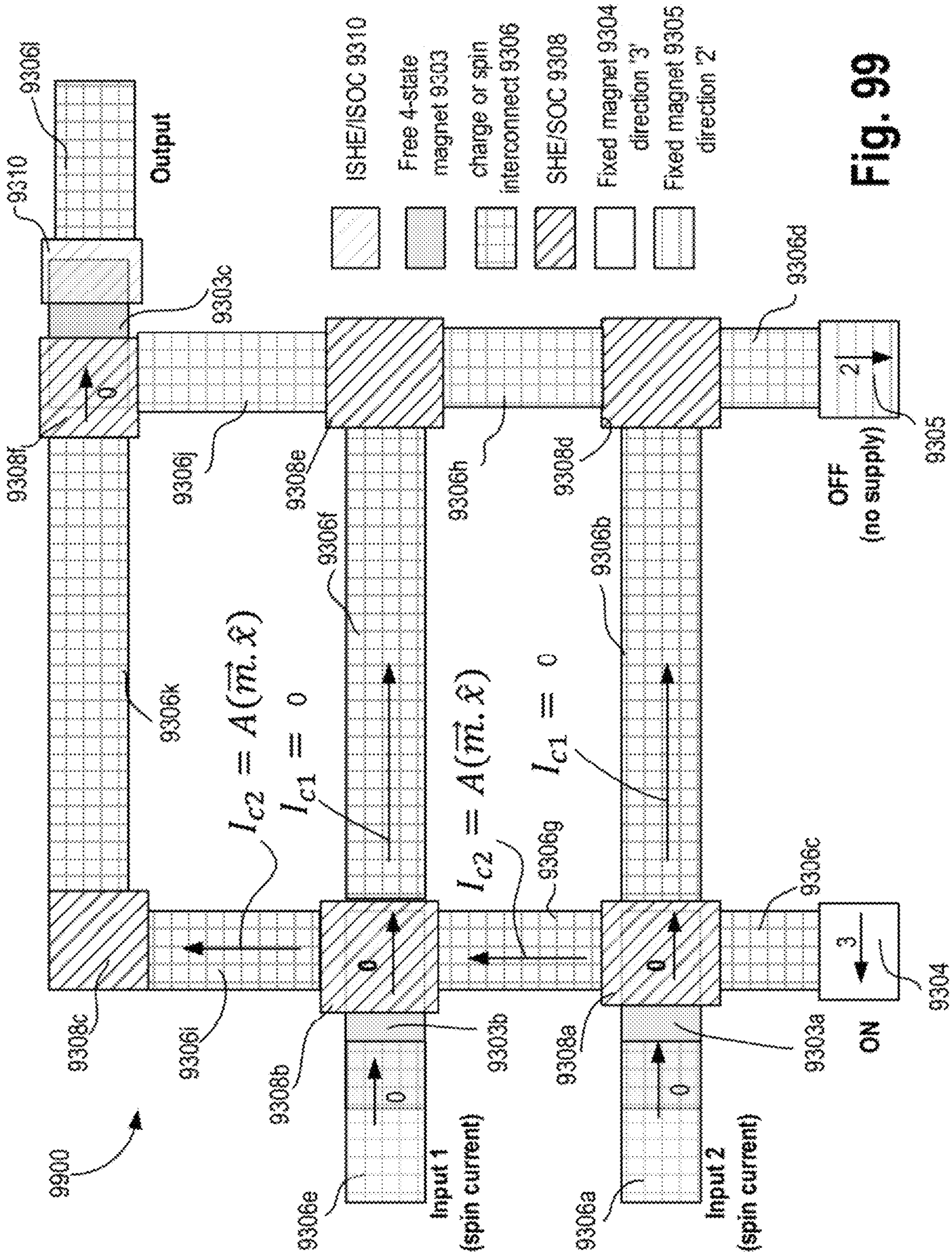
FIG. 99 illustrates a top view of a max-gate which is biased to process inputs in the +x direction (i.e., both inputs are in direction '0'), according to some embodiments of the FIG. 100 illustrates a top view of a max-gate which is biased to process input 1 in the +x direction (i.e., in direction '0') and input 2 in the +y direction (i.e., in direction '1'), according to some embodiments of the disclosure.

FIG. 99 illustrates top view 9900 of max-gate 9300 which is biased to process inputs in the +x direction (i.e., both inputs are in direction '0'), according to some embodiments of the disclosure. This case is a mode-2 case. In this case, the supply to the fixed magnet 9305 is off while the supply to fixed magnet 9304 is on. Here, the input magnet 9306*e* is magnetized in direction '0' because of the input spins being in +x direction. The second input magnet 9306*a* is magnetized in direction '0' because the input spins are in +x direction. The output magnet 9303*c* is magnetized in direction '0'. Current $I_{c1}$=0 because the input spin currents do not have spins in the y-direction. The input currents being in x-direction generate current $I_{c2}$.

Figure 100:
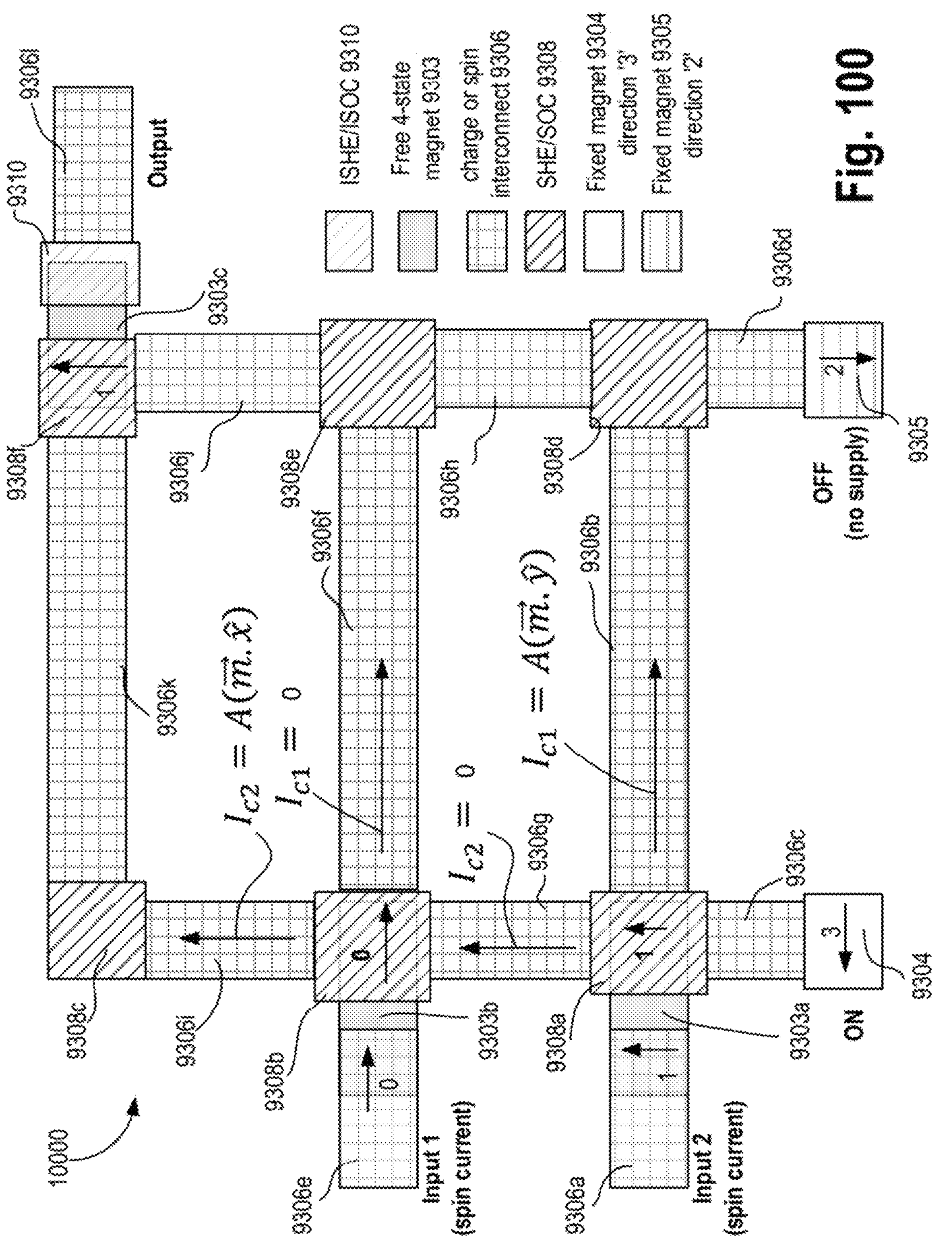

FIG. 100 illustrates top view 10000 of max-gate 9300 which is biased to process input 1 in the +x direction (i.e., in direction '0') and input 2 in the +y direction (i.e., in direction '1'), according to some embodiments of the disclosure. This case is a mode-2 case. In this case, the supply to the fixed magnet 9305 is off while the supply to fixed magnet 9304 is on. Here, the input magnet 9306*e* is magnetized in direction '0' because of the input spins being in +x direction. The second input magnet 9306*a* is magnetized in direction '1' because the input spins are in +y direction. The output magnet 9303*c* is magnetized in direction '1'. Current $I_{c2}$=0 for interconnect 9306*f* because the input spin currents do not have spins in the y-direction. Current $I_{c1}$ is non-zero for interconnect 9306*b* because the input spin currents have spins in the y-direction. The input currents being in x-direction generate current $I_{c2}$.

Figure 101:
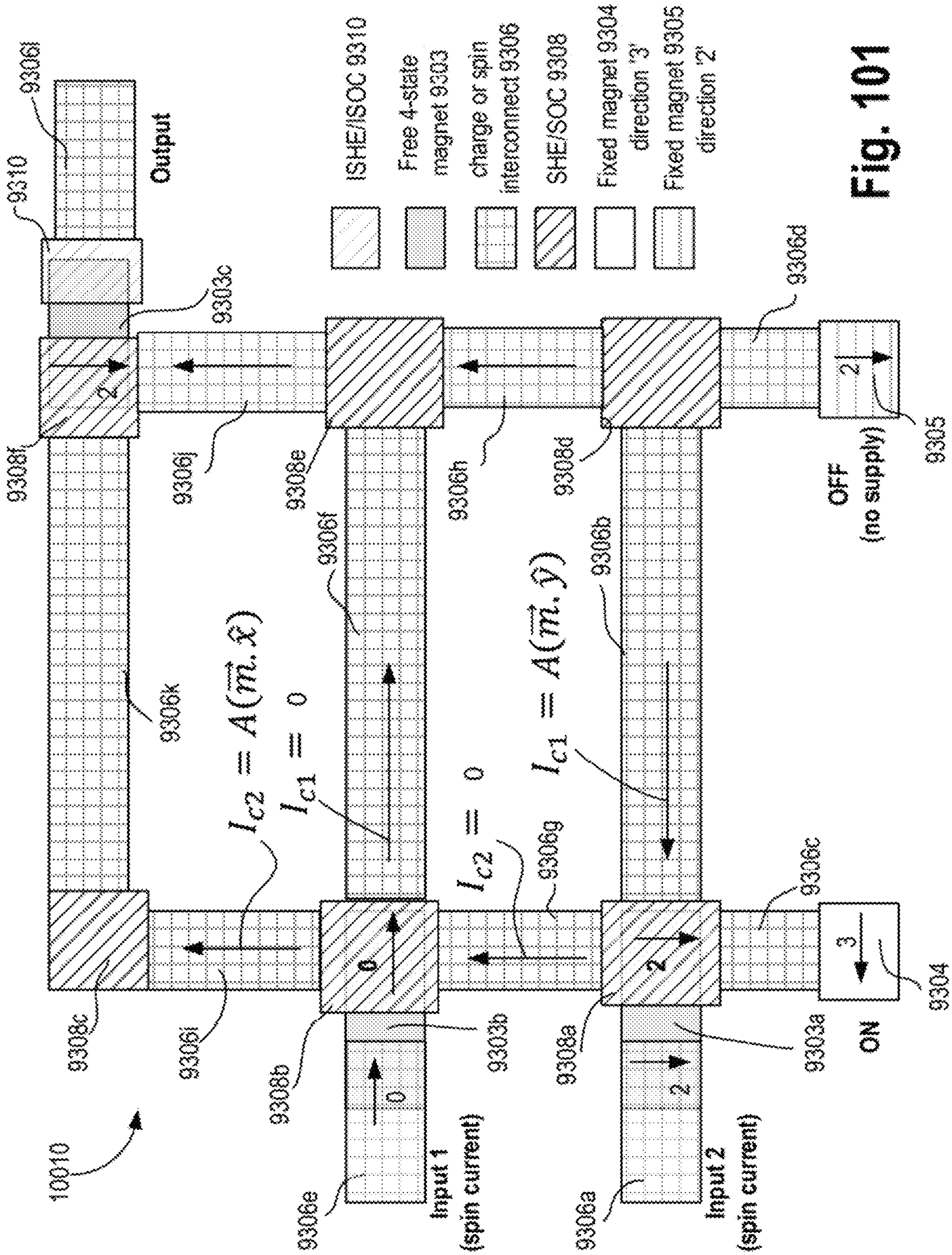
FIG. 101 illustrates a top view of a max-gate which is biased to process input 1 in the +x direction (i.e., in direction '0') and input 2 in the −y direction (i.e., in direction '2'), according to some embodiments of the disclosure.

FIG. 101 illustrates top view 10010 of max-gate 9300 which is biased to process input 1 in the +x direction (i.e., in direction '0') and input 2 in the −y direction (i.e., in direction '2'), according to some embodiments of the disclosure. This case is a mode-2 case. In this case, the supply to the fixed magnet 9305 is off while the supply to fixed magnet 9304 is on. Here, the input magnet 9306*e* is magnetized in direction '0' because of the input spins being in +x direction. The second input magnet 9306*a* is magnetized in direction '2' because the input spins are in −y direction. The output magnet 9303*c* is magnetized in direction '2'. Current $I_{c1}$=0 for interconnect 9306*f* because the input spin currents do not have spins in the y-direction. Current $I_{c1}$ is non-zero for interconnect 9306*b* because the input spin currents have spins in the y-direction. The input currents being in x-direction generate current $I_{C2}$ in interconnect 9306*i*.

Figure 102:
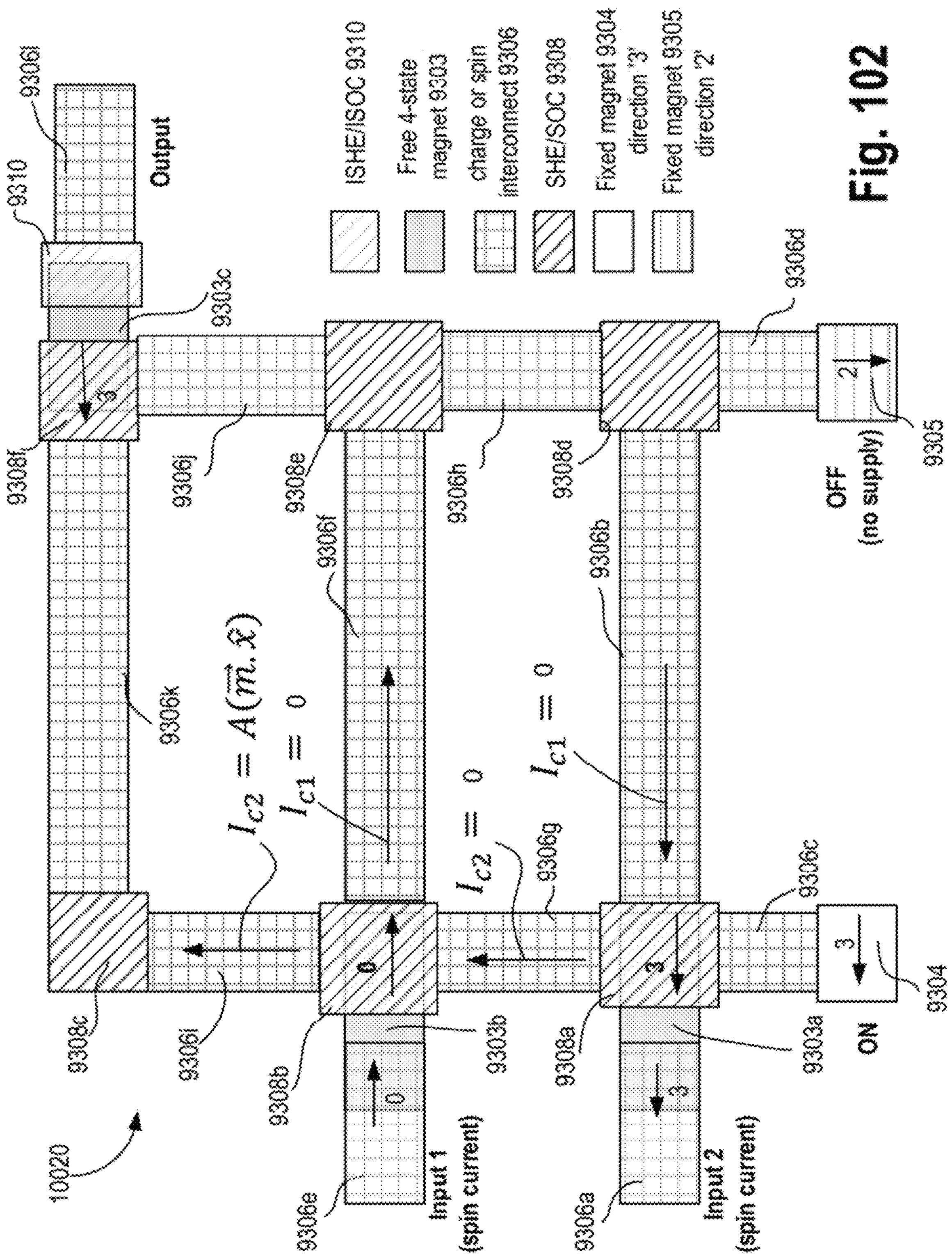
FIG. 102 illustrates a top view of a max-gate which is biased to process input 1 in the +x direction (i.e., in direction '0') and input 2 in the −x direction (i.e., in direction '3'), according to some embodiments of the disclosure.

FIG. 102 illustrates top view 10020 of max-gate 9300 which is biased to process input 1 in the +x direction (i.e., in direction '0') and input 2 in the −x direction (i.e., in direction '3'), according to some embodiments of the disclosure. This case is a mode-2 case. In this case, the supply to the fixed magnet 9305 is off while the supply to fixed magnet 9304 is on. Here, the input magnet 9306*e* is magnetized in direction '0' because of the input spins being in +x direction. The second input magnet 9306*a* is magnetized in direction '3' because the input spins are in −x direction. The output magnet 9303*c* is magnetized in direction '3'. Current $I_{c1}$=0 because the input spin currents do not have spins in the y-direction. The input currents being in x-direction generate current $I_{c2}$.

Figure 103:
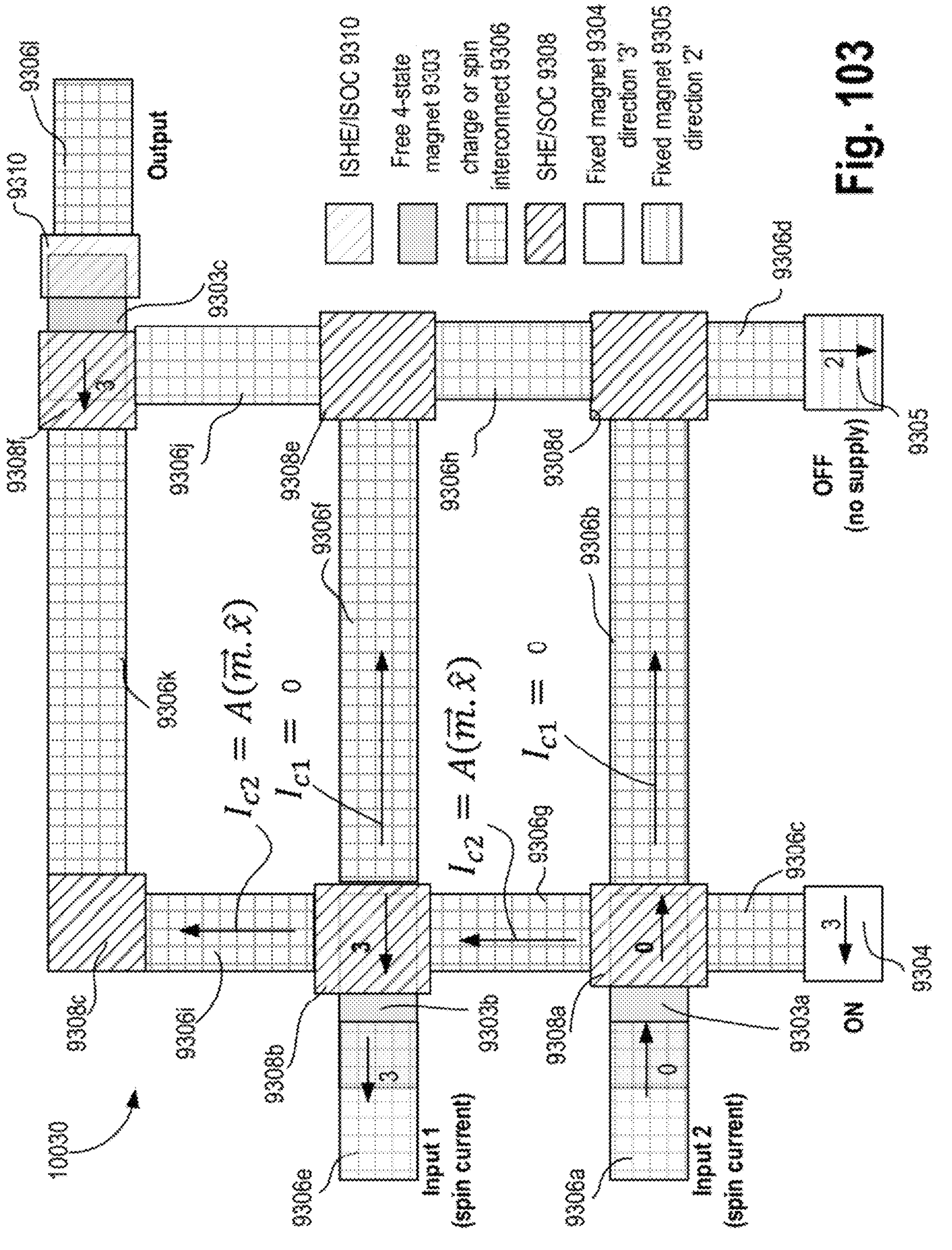
FIG. 103 illustrates a top view of a max-gate which is biased to process input 1 in the −x direction (i.e., in direction '3') and input 2 in the +x direction (i.e., in direction '0'), according to some embodiments of the disclosure.

FIG. 103 illustrates top view 10030 of max-gate 9300 which is biased to process input 1 in the −x direction (i.e., in direction '3') and input 2 in the +x direction (i.e., in direction '0'), according to some embodiments of the disclosure. This case is a mode-2 case. In this case, the supply to the fixed magnet 9305 is off while the supply to fixed magnet 9304 is on. Here, the input magnet 9306*e* is magnetized in direction '3' because of the input spins being in −x direction. The second input magnet 9306*a* is magnetized in direction '0' because the input spins are in +x direction. The output magnet 9303*c* is magnetized in direction '3'. Current $I_{c1}$=0 because the input spin currents do not have spins in the y-direction. The input currents being in x-direction generate current $I_{c2}$.

Figure 104:
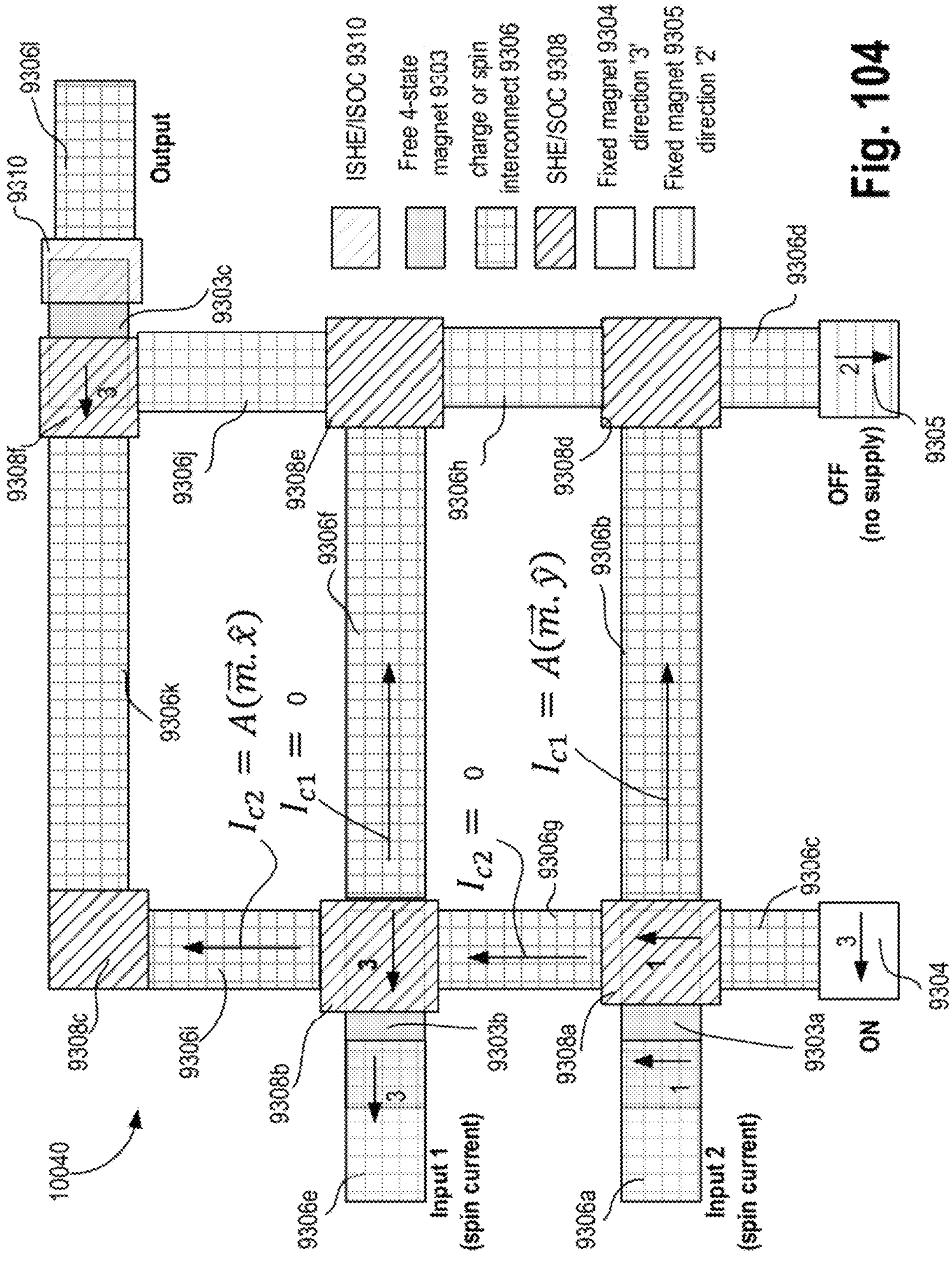
FIG. 104 illustrates a top view of a max-gate which is biased to process input 1 in the −x direction (i.e., in direction '3') and input 2 in the +y direction (i.e., in direction '1'), according to some embodiments of the disclosure.

FIG. 104 illustrates top view 10040 of max-gate 9300 which is biased to process input 1 in the −x direction (i.e., in direction '3') and input 2 in the +y direction (i.e., in direction '1'), according to some embodiments of the disclosure. This case is a mode-2 case. In this case, the supply to the fixed magnet 9305 is off while the supply to fixed magnet 9304 is on. Here, the input magnet 9306*e* is magnetized in direction '3' because of the input spins being in −x direction. The second input magnet 9306*a* is magnetized in direction '1' because the input spins are in +y direction. The output magnet 9303*c* is magnetized in direction '3'. Current $I_{c1}$=0 for interconnect 9306*f* because the input spin currents do not have spins in the y-direction. Current $I_{c1}$ is non-zero for interconnect 9306*b* because the input spin currents have spins in the y-direction. The input currents being in x-direction generate current $I_{c2}$ in interconnect 9306*i*.

Figure 105:
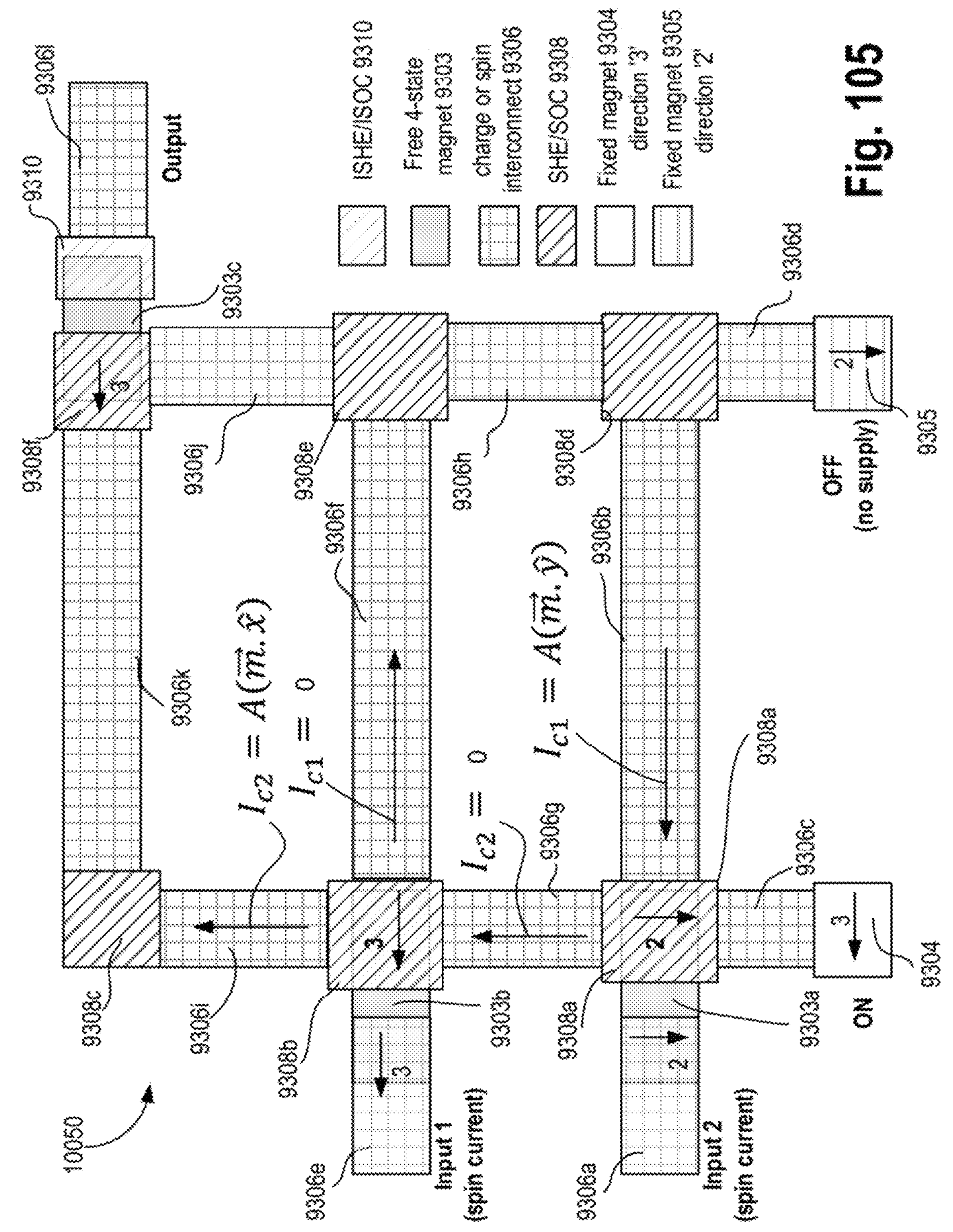
FIG. 105 illustrates a top view of a max-gate which is biased to process input 1 in the −x direction (i.e., in direction '3') and input 2 in the −y direction (i.e., in direction '2'), according to some embodiments of the disclosure.

FIG. 105 illustrates top view 10050 of max-gate 9300 which is biased to process input 1 in the −x direction (i.e., in direction '3') and input 2 in the −y direction (i.e., in direction '2'), according to some embodiments of the disclosure. This case is a mode-2 case. In this case, the supply to the fixed magnet 9305 is off while the supply to fixed magnet 9304 is on. Here, the input magnet 9306*e* is magnetized in direction '3' because of the input spins being in −x direction. The second input magnet 9306*a* is magnetized in direction '2' because the input spins are in −y direction. The output magnet 9303*c* is magnetized in direction '3'. Current $I_{c1}$=0 for interconnect 9306*f* because the input spin currents do not have spins in the y-direction. Current $I_{c1}$ is non-zero for interconnect 9306*b* because the input spin currents have spins in the y-direction. The input currents being in x-direction generate current $I_{c2}$ in interconnect 9306*i*.

Figure 106:
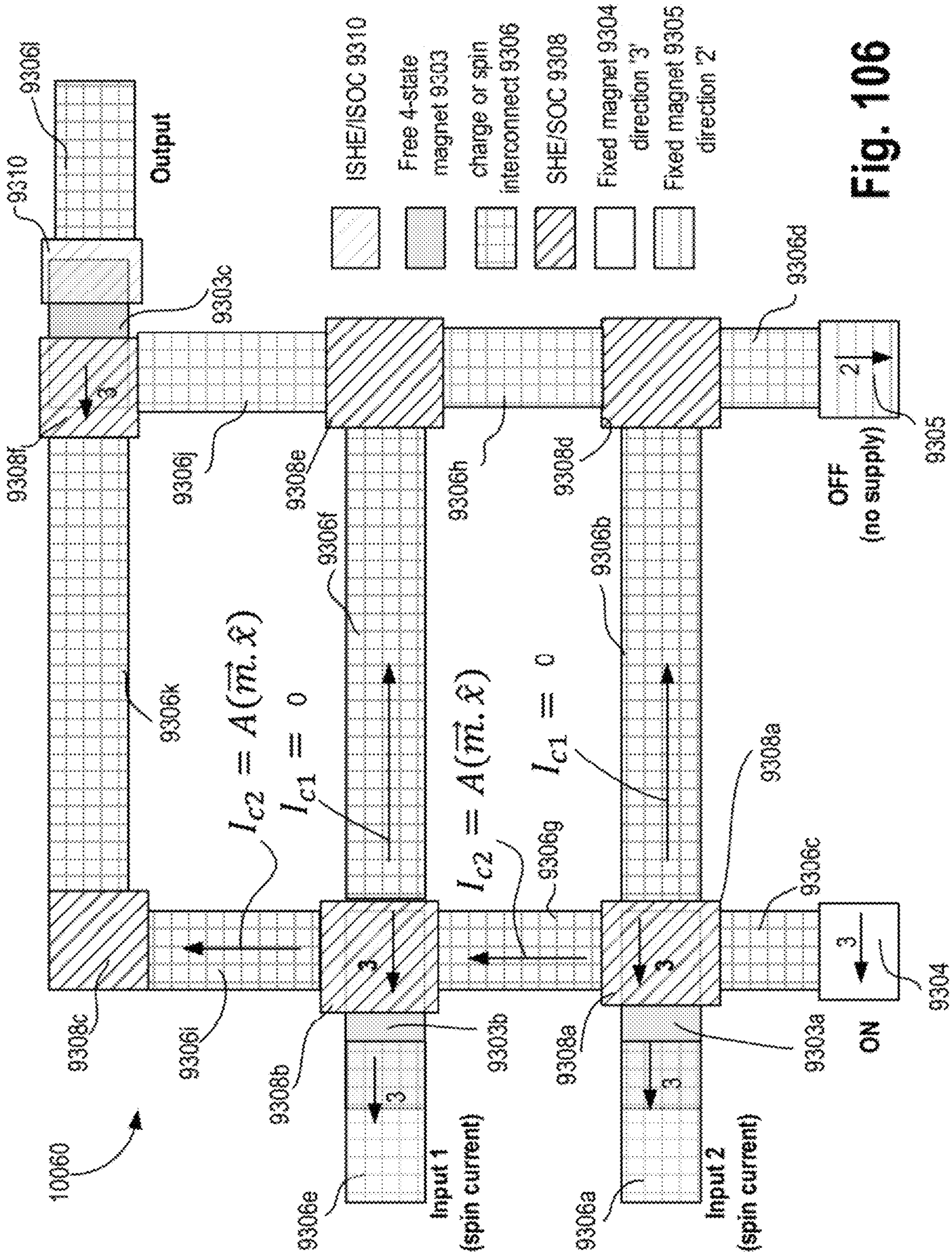
FIG. 106 illustrates a top view of a max-gate which is biased to process input 1 in the −x direction (i.e., in direction '3') and input 2 in the −x direction (i.e., in direction '3'), according to some embodiments of the disclosure.

FIG. 106 illustrates top view 10060 of max-gate 9300 which is biased to process input 1 in the −x direction (i.e., in direction '3') and input 2 in the −x direction (i.e., in direction '3'), according to some embodiments of the disclosure. This case is a mode-2 case. In this case, the supply to the fixed magnet 9305 is off while the supply to fixed magnet 9304 is on. Here, the input magnet 9306*e* is magnetized in direction '3' because of the input spins being in −x direction. The second input magnet 9306*a* is magnetized in direction '3' because the input spins are in −x direction. The output magnet 9303*c* is magnetized in direction '3'. Current $I_{c1}$=0 for interconnects 9306*f/b* because the input spin currents do not have spins in the y-direction. The input currents being in x-direction generate current $I_{c2}$ in interconnect 9306*i*.

3-Input Quaternary Logic Gate

Figure 107:
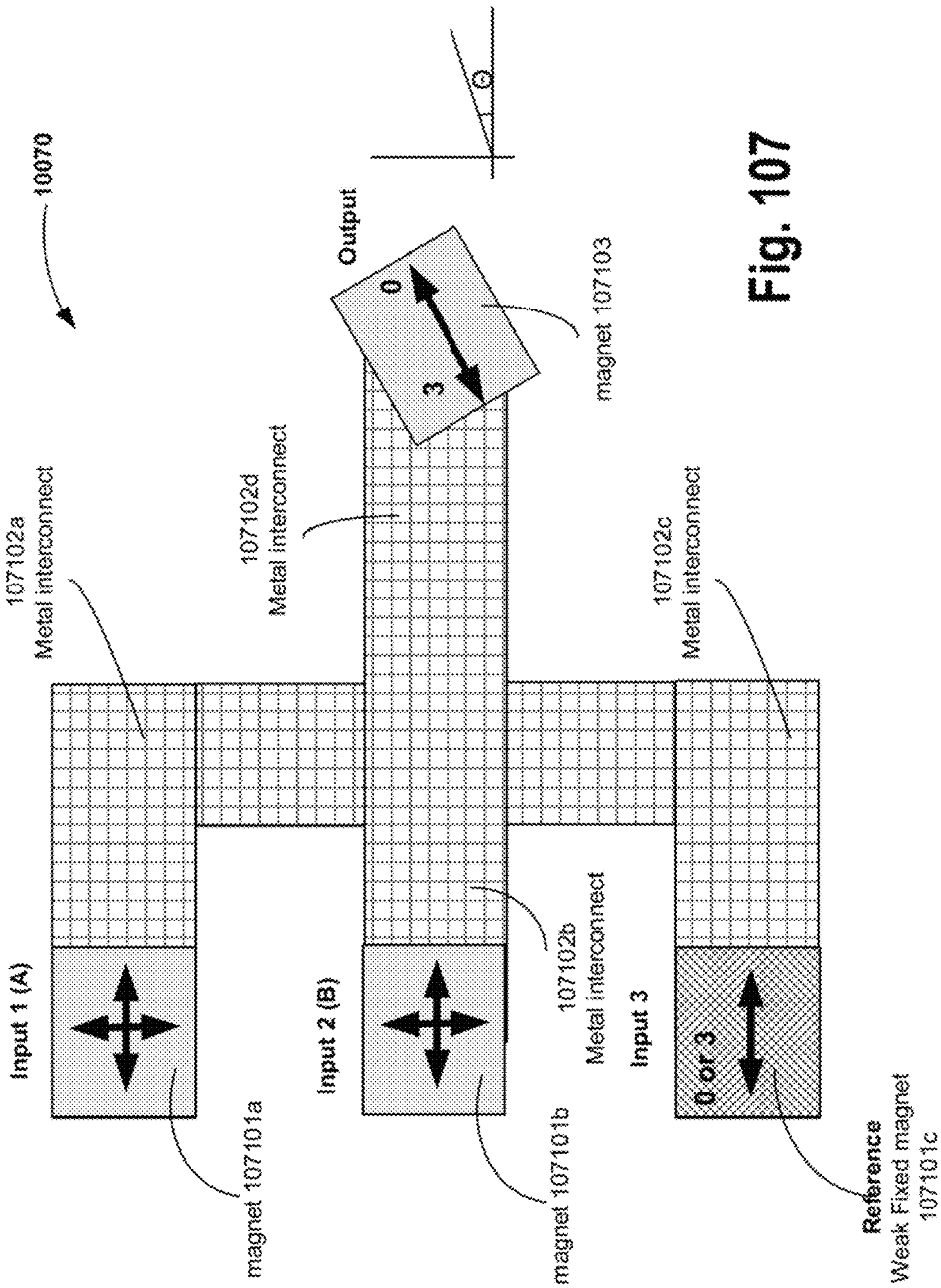
FIG. 107 illustrates a top view of a 3-input quaternary gate with one input being a weak reference fixed magnet, according to some embodiments of the disclosure.

FIG. 107 illustrates top view 10070 of a 3-input quaternary gate with one input being a weak reference fixed magnet, according to some embodiments of the disclosure. It is pointed out that those elements of FIG. 107 having the same reference numbers (or names) as the elements of any other figure can operate or function in any manner similar to that described, but are not limited to such.

In some embodiments, 3-input quaternary gate comprises a first 4-state free input magnet 107101*a* (also referred to as Input 1 (A)), second 4-state free input magnet 107101*b* (also referred to as Input 2 (B)), third 2-state fixed input magnet 107101*c*, metal interconnect 107102*a*, 107102*d*, 107102*c*, and 2-state free output magnet 107103 which is titled at an angle θ relative to the other magnets. The 3-input quaternary gate of FIG. 107 forms a majority gate where third 2-state fixed input magnet 107101*c* provides a weak magnetization compared to the magnetization of other input magnets. In some embodiments, the angle θ is in the range of 5 and 40 degrees. With reference to the embodiments of FIGS. 108-177, the angle θ is 17.458 degrees relative to length of interconnect 107102*d* (or relative to the length of the input magnets). However, the embodiments are not limited to that angle and that other angles for output magnet 107103 can be used such that the magnetization of the output magnet 107103 deterministically resolves to a certain magnetization direction depending on the input magnetizations of magnets 107101*a/b/c*.

In some embodiments, reference or fixed magnet 107101*c* is fixed to either +x direction (i.e., magnetization direction '0') or −x direction (i.e., magnetization direction '3'). Relative to the strength of magnetization of input magnets 107101*a* and 107101*b*, reference or fixed magnet 107101*c* has weaker magnetization which assists in resolving the majority gate function so that the output magnet 107103 deterministically resolves its magnetization in either direction '0' or direction '3'. Material wise, magnets 107101*a/b* comprise materials as discussed with reference to 4-state magnets, magnet 107101*c* comprises materials as discussed with reference to a fixed in-plane 2-state magnets, and output magnet 107103 comprises materials discussed with reference to free in-plane 2-state magnets.

Figure 108:
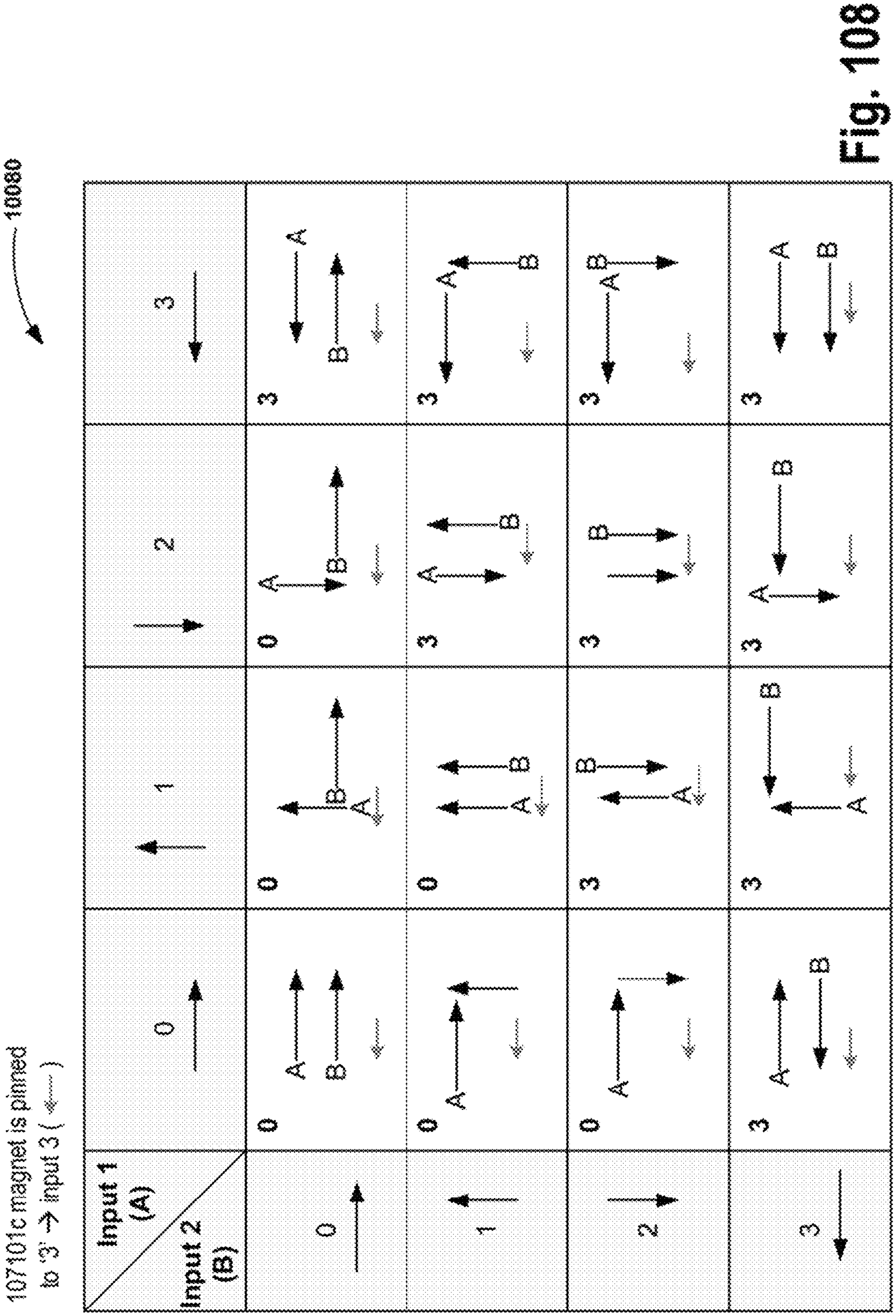
FIG. 108 illustrates a truth table of the 3-input quaternary gate of FIG. 107 when the weak reference fixed magnet has a magnetization along the −x-direction (i.e., in direction '3'), according to some embodiments of the disclosure.
Figure 125:
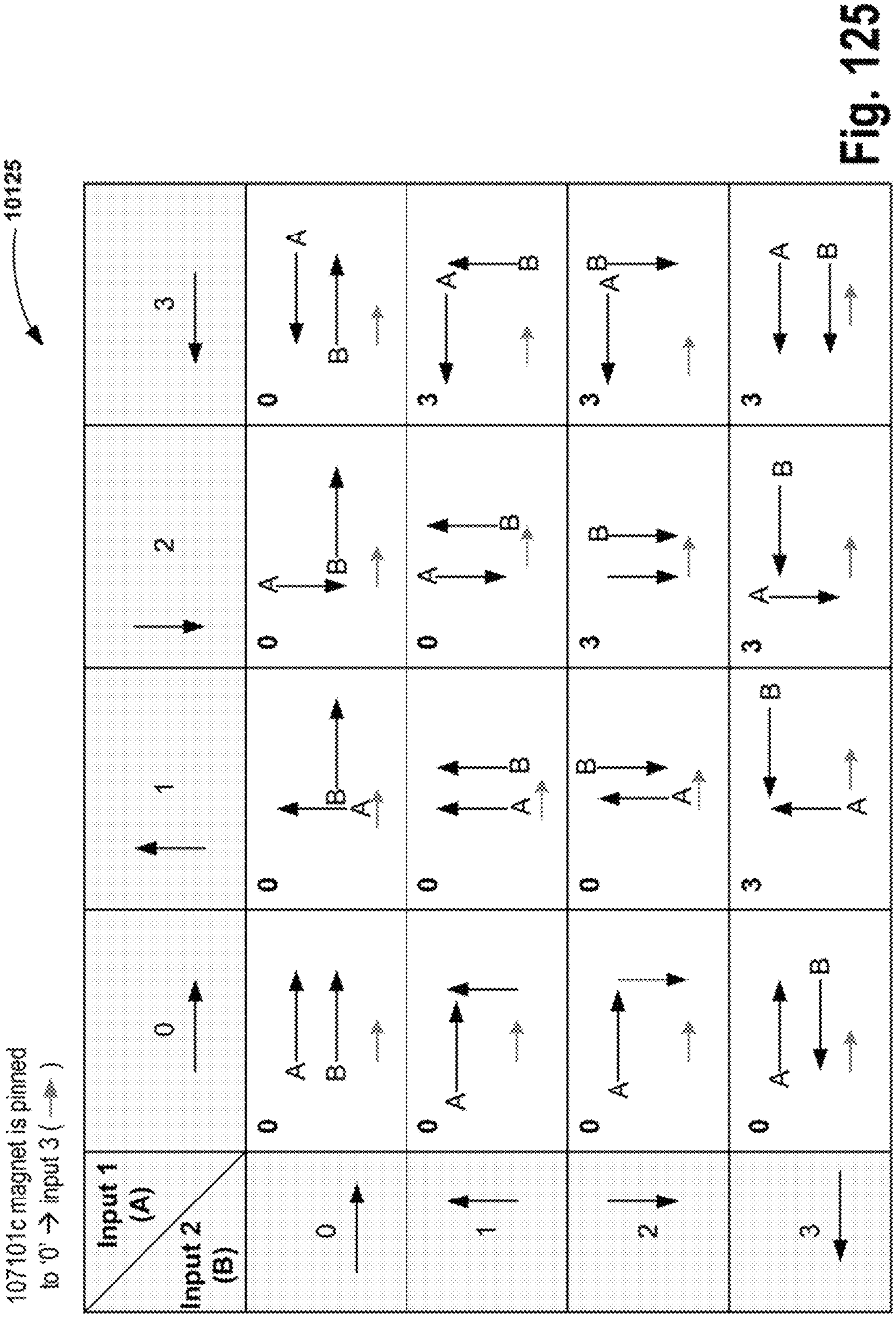
FIG. 125 illustrates a truth table of the 3-input quaternary gate of FIG. 107 when the weak reference fixed magnet has a magnetization along the +x-direction (i.e., in direction '0'), according to some embodiments of the disclosure.
Figure 126:
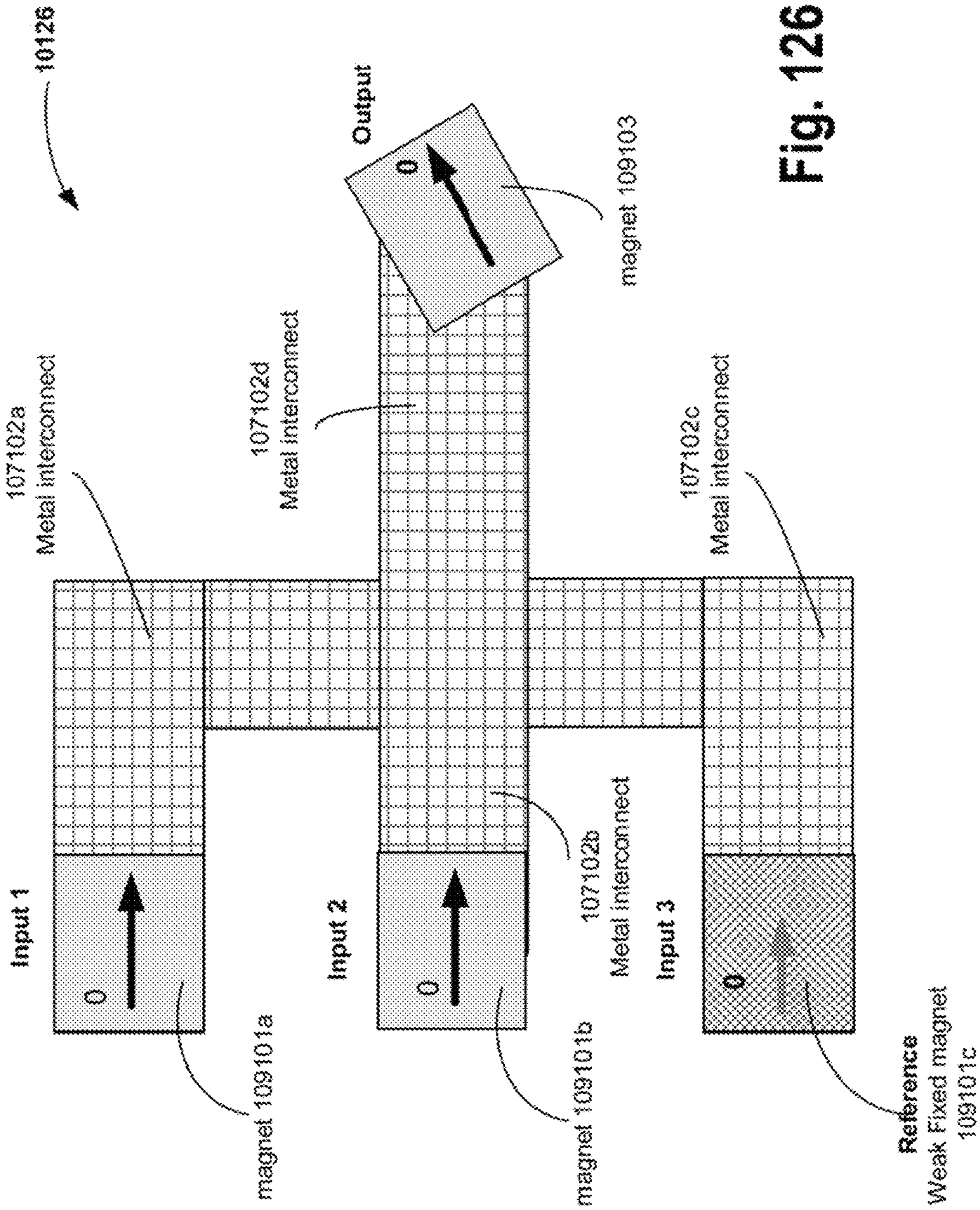
FIGS. 126-141 illustrates 3-input quaternary gates implementing the truth table of FIG. 125, according to some embodiments of the disclosure.

FIG. 108 illustrates a truth table associated with FIG. 107 when the reference fixed magnet 107101*c* is fixed in the −x direction (i.e., direction '3') while FIG. 125 illustrates a truth table associated with FIG. 107 when the reference fixed magnet 107101*c* is fixed in the +x direction (i.e., direction '0'). These truth tables can be used for forming a variety of logic gates, according to some embodiments of the disclosure.

FIG. 108 illustrates truth table 10080 of the 3-input quaternary gate of FIG. 107 when the weak reference fixed magnet has a magnetization along the −x-direction (i.e., in direction '3'), according to some embodiments of the disclosure. It is pointed out that those elements of FIG. 108 having the same reference numbers (or names) as the elements of any other figure can operate or function in any manner similar to that described, but are not limited to such.

The top first row of truth table 10080 lists the four possible magnetizations for first input magnet 107101*a* (e.g., Input 1 (A)). The left most column of truth table 10080 lists the four possible magnetizations for second input magnet 107101*b* (e.g., Input 2 (B)). The input magnetization conditions are shown in the shaded boxes. The other remaining boxes illustrate the output magnetization of magnet 107103 in the top left corner of each box according to the magnetizations of the first and second input magnets 107101*a/b*. A person skilled in the art would appreciate that the truth table of FIG. 108 is a mirror image or reflection along the vertical axis (or y-axis) of the truth table of a lower threshold gate.

FIGS. 109-124 illustrates 3-input quaternary gates 10090, 10110, 101111, 101112, 101113, 101114, 101115, 101116, 101117, 101118, 101119, 101120, 101121, 101122, 101123, 101124, respectively, implementing the truth table of FIG. 108, according to some embodiments of the disclosure. It is pointed out that those elements of FIGS. 109-124 having the same reference numbers (or names) as the elements of any other figure can operate or function in any manner similar to that described, but are not limited to such.

Figure 109:
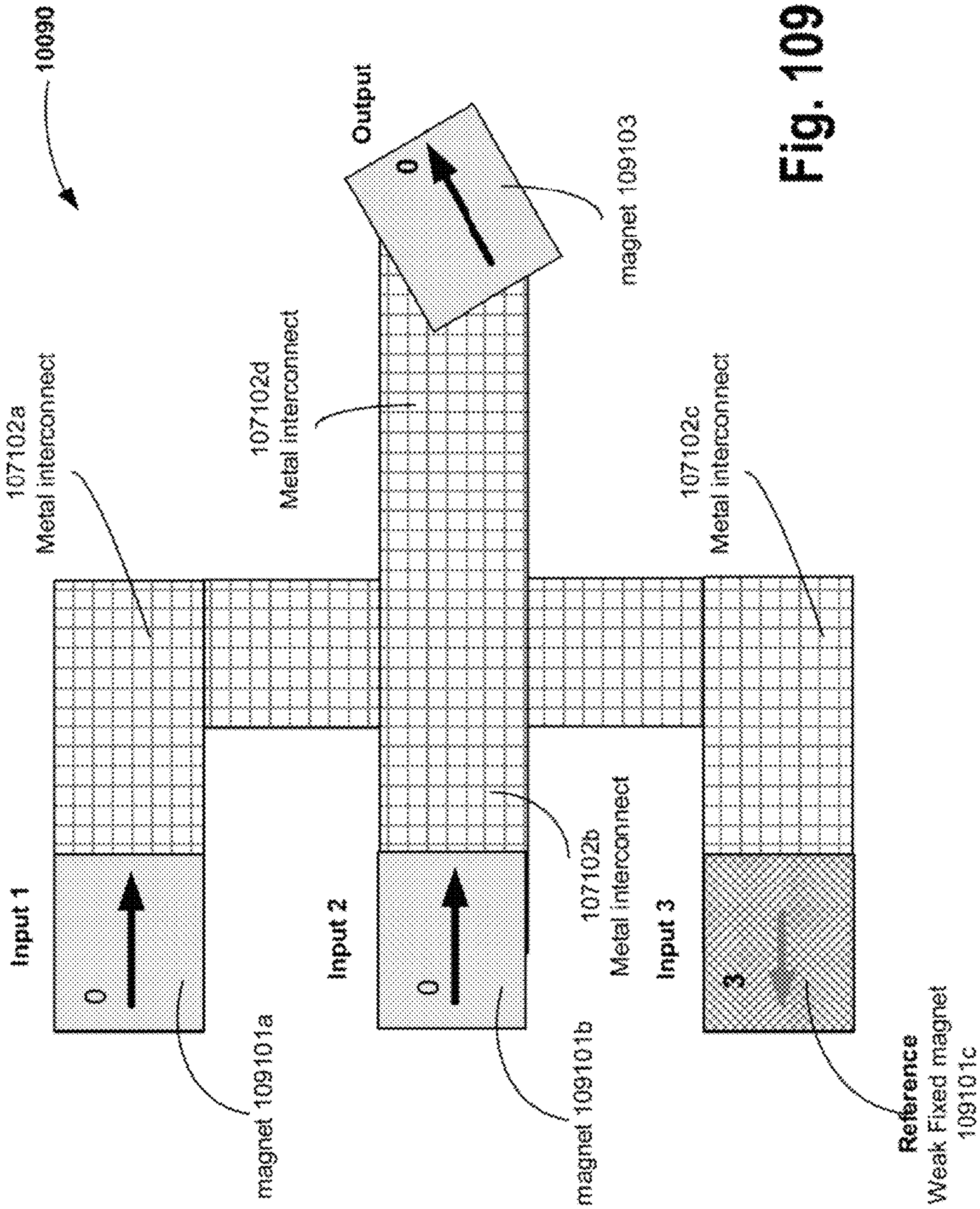
FIGS. 109-124 illustrates 3-input quaternary gates implementing the truth table of FIG. 108, according to some embodiments of the disclosure.

FIG. 109 illustrates the case when first input magnet 109101*a* (same as 107101*a*) has magnetization along +x direction (i.e., direction '0'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0'. The spins from magnets 109101*a*, 109101*b*, and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103 because the two input magnets have magnetization along direction '0' which overwhelms the weak magnetization from fixed magnet 109101*c*.

Figure 110:
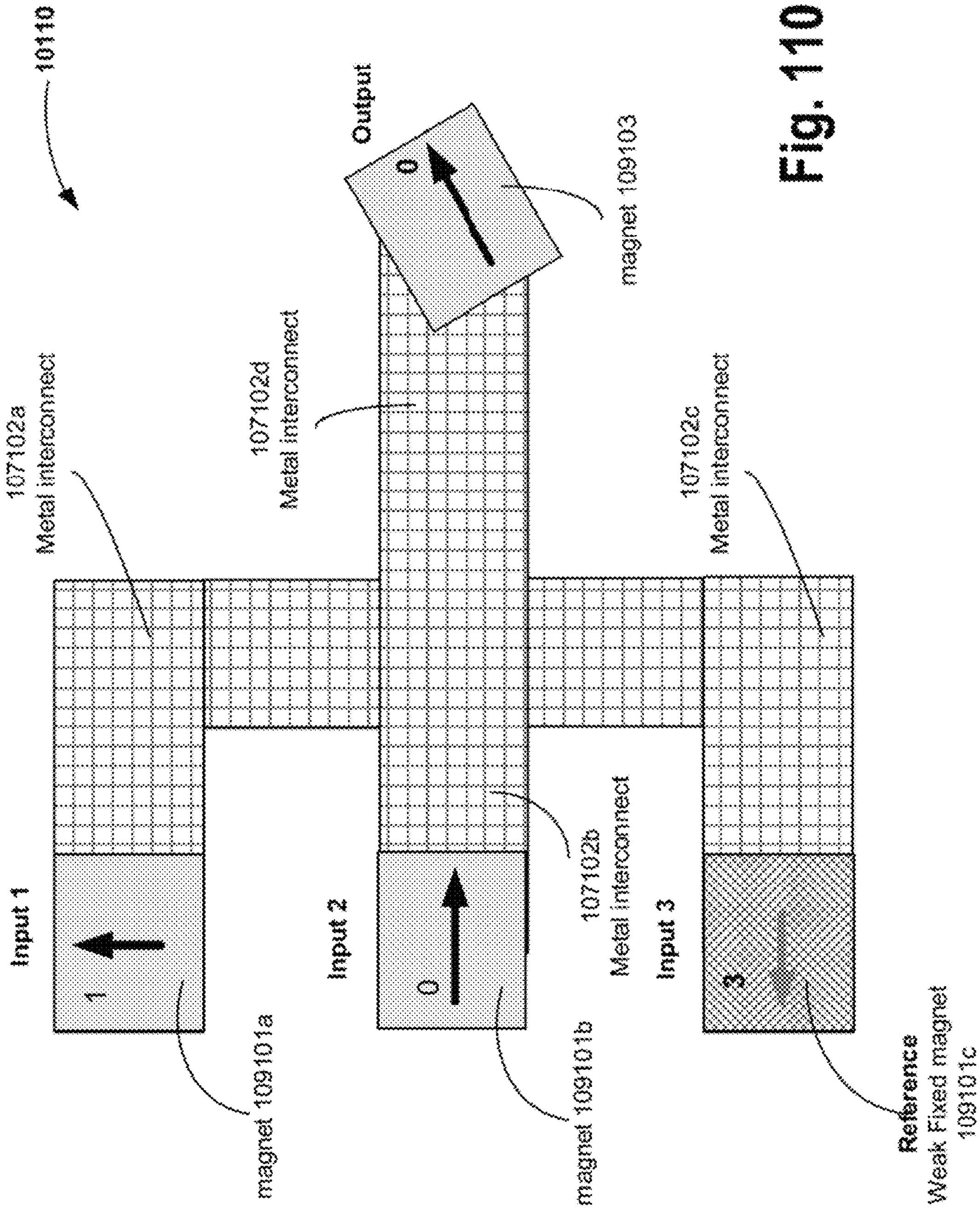

FIG. 110 illustrates the case when first input magnet 109101*a* (same as 107101*a*) has magnetization along +y direction (i.e., direction '1'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '1'. The fixed weak magnetization in direction '3' from magnet 109101*c* further pushes the resultant magnetization of output magnet 109103 towards direction '1'. Since output magnet 109103 is a 2-state magnet that can either resolve to magnetization along '0' or '3' directions, the resultant spin in metal interconnect 107102*d* causes output titled magnet 109103 to resolve its magnetization along direction '0'.

Figure 111:
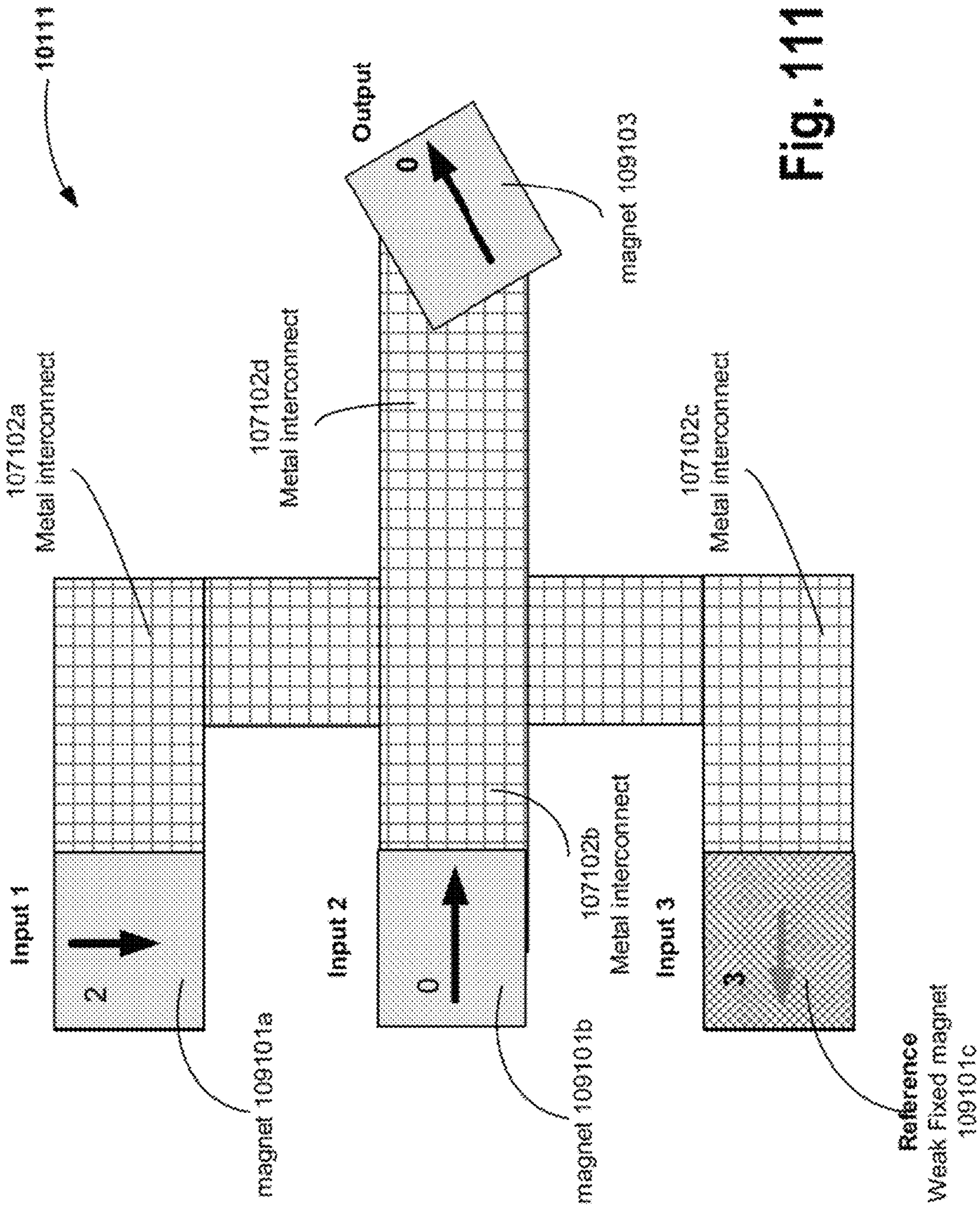

FIG. 111 illustrates the case when first input magnet 109101*a* (same as 107101*a*) has magnetization along −y direction (i.e., direction '2'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '2'. The fixed weak magnetization in direction '3' from magnet 109101*c* further pushes the resultant magnetization of output magnet 109103 towards a direction which causes output titled magnet 109103 to resolve its magnetization along direction '0'.

Figure 112:
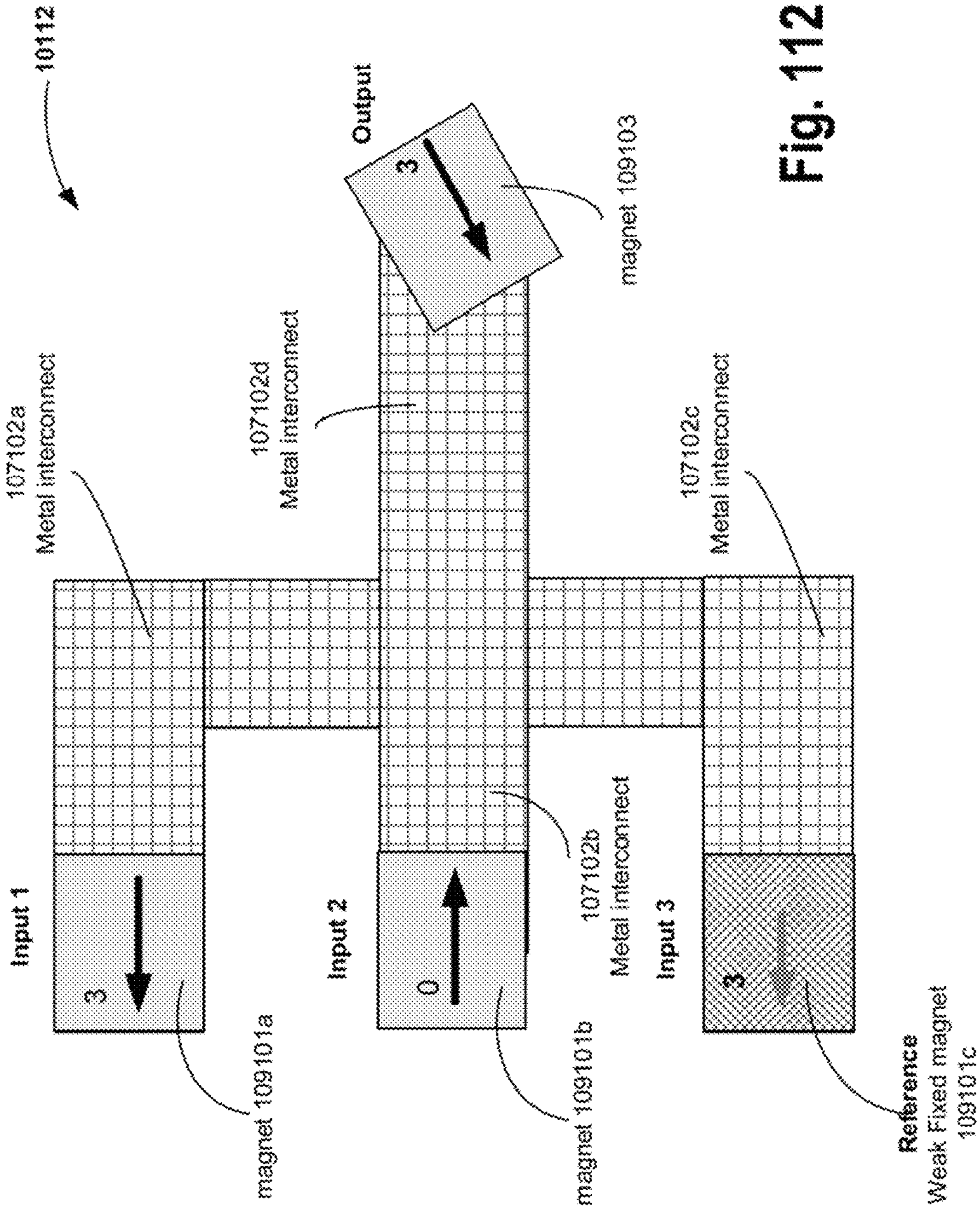

FIG. 112 illustrates the case when first input magnet 109101*a* (same as 107101*a*) has magnetization along −x direction (i.e., direction '3'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '0' and '3'. The fixed weak magnetization in direction '3' from magnet 109101*c* further pushes the resultant magnetization of output magnet 109103 towards a direction which causes output titled magnet 109103 to resolve its magnetization along direction '3'.

Figure 113:
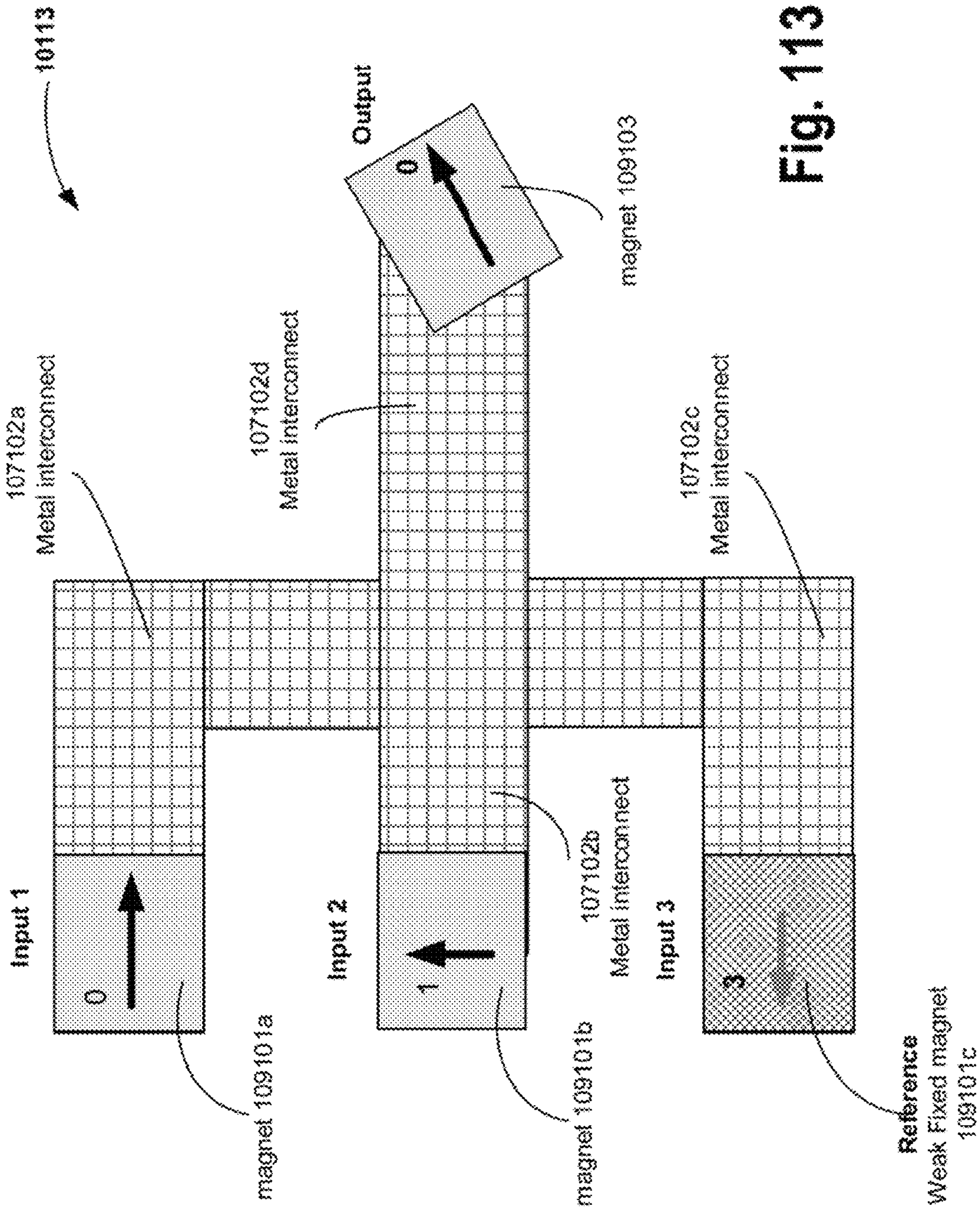

FIG. 113 illustrates the case when first input magnet 109101*a* (same as 107101*a*) has magnetization along +x direction (i.e., direction '0'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '1'. The fixed weak magnetization in direction '3' from magnet 109101*c* further pushes the resultant magnetization of output magnet 109103 towards a direction which causes output titled magnet 109103 to resolve its magnetization along direction '0'.

Figure 114:
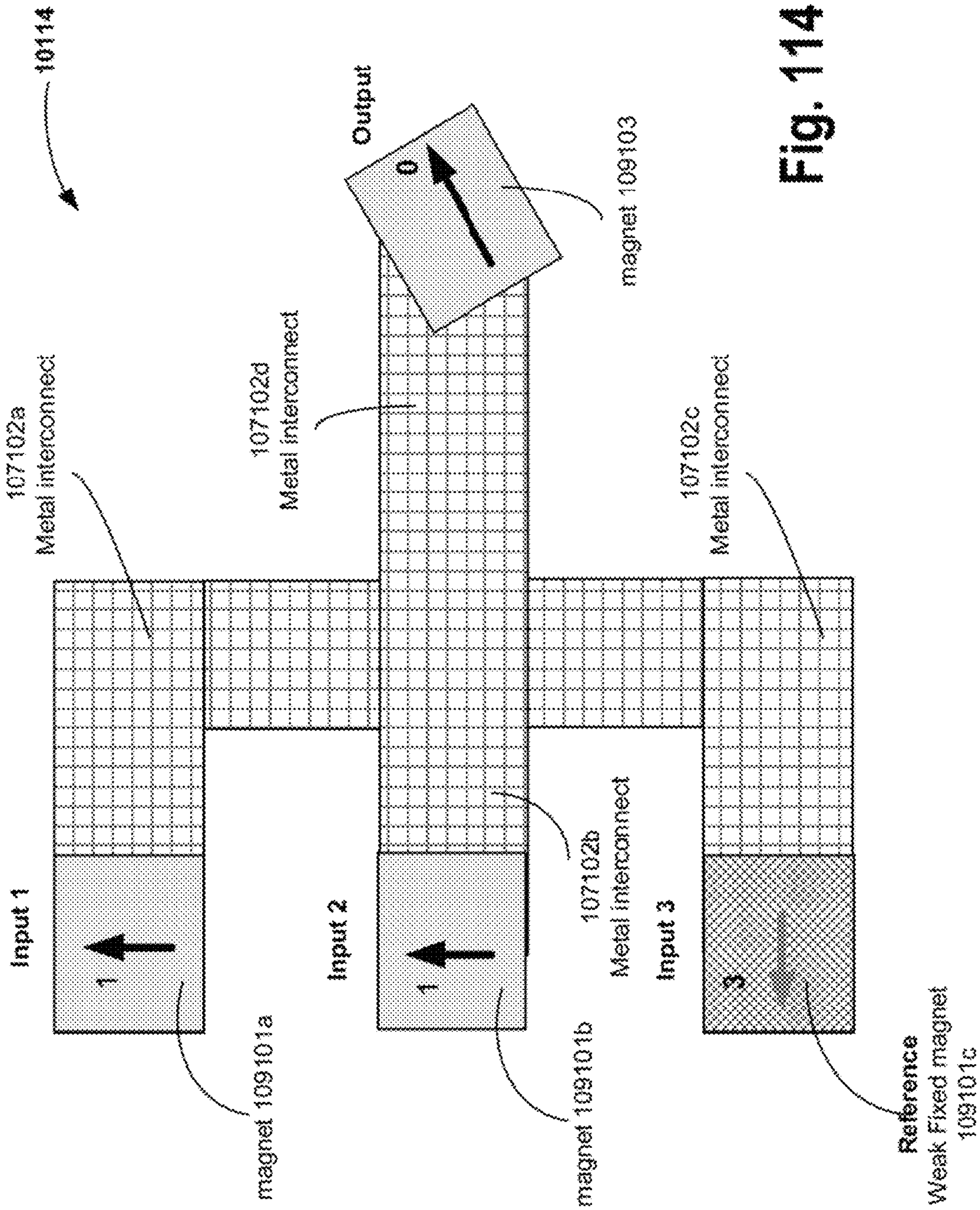

FIG. 114 illustrates the case when first input magnet 109101*a* (same as 107101*a*) has magnetization along +y direction (i.e., direction '1'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization towards '1'. The fixed weak magnetization in direction '3' from magnet 109101*c* further pushes the resultant magnetization of output magnet 109103 towards a direction which causes output titled magnet 109103 to resolve its magnetization along direction '0'.

Figure 115:
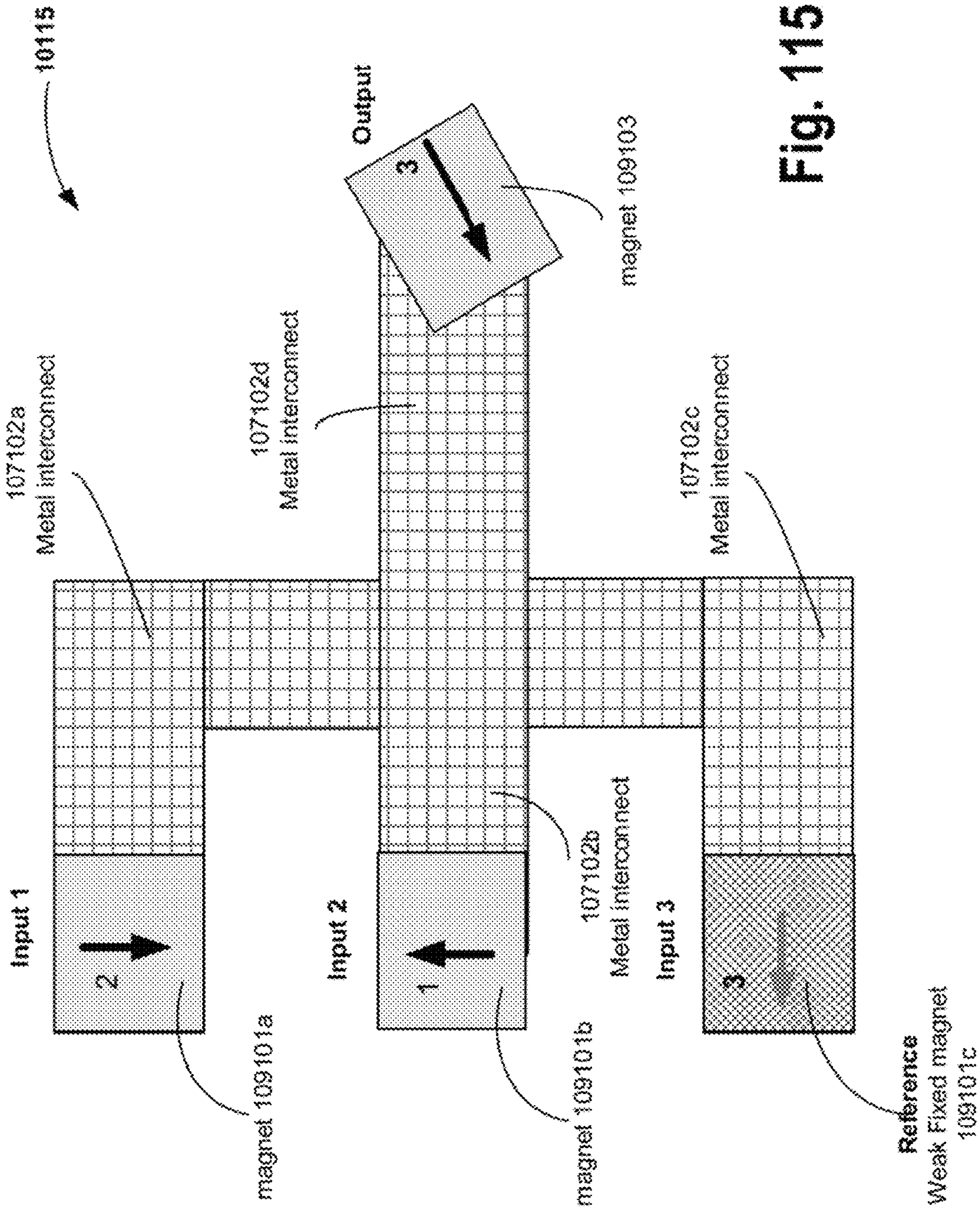

FIG. 115 illustrates the case when first input magnet 109101*a* (same as 107101*a*) has magnetization along −y direction (i.e., direction '2'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '1' and '2'. The fixed weak magnetization in direction '3' from magnet 109101*c* further pushes the resultant magnetization of output magnet 109103 towards a direction which causes output titled magnet 109103 to resolve its magnetization along direction '3'.

Figure 116:
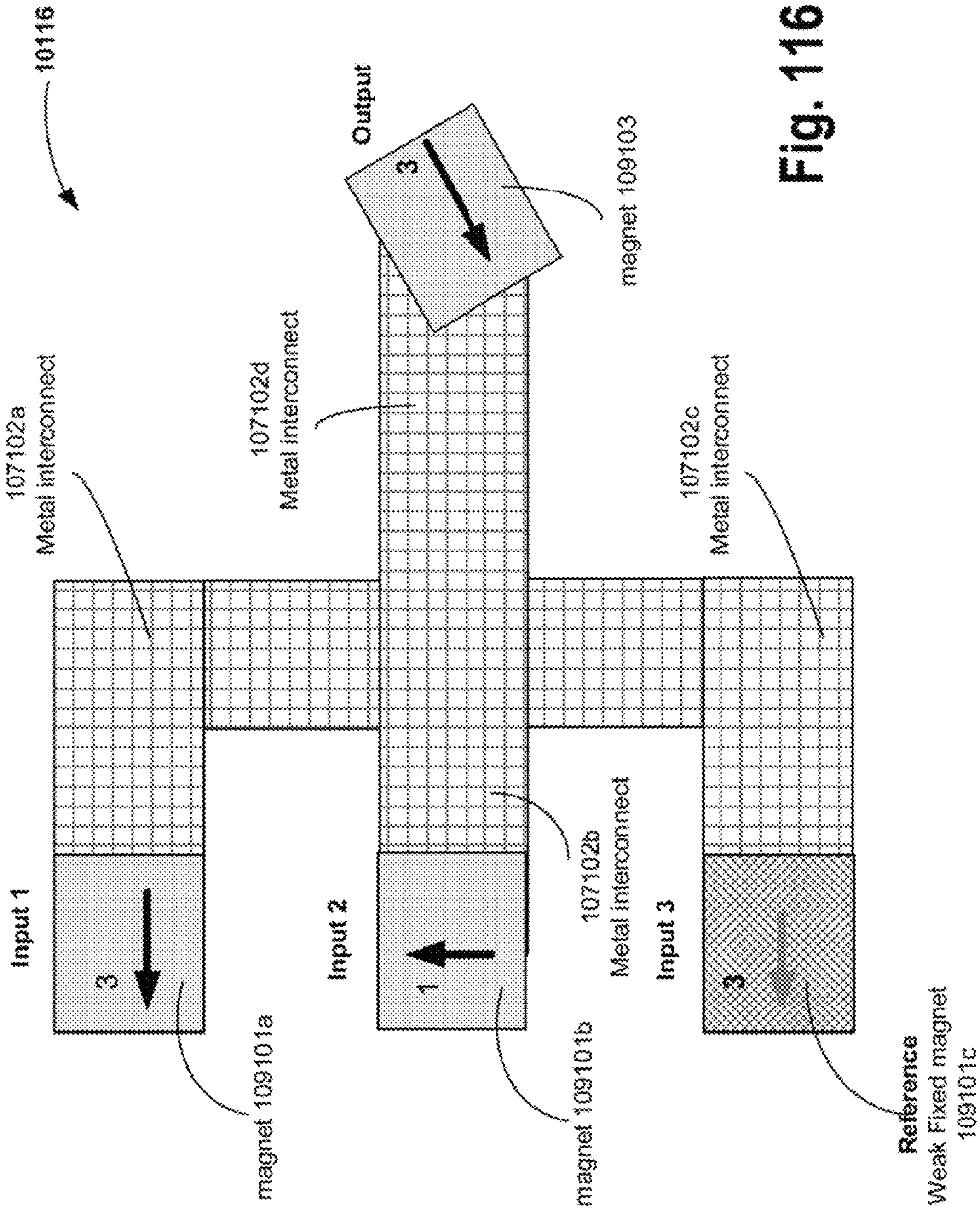

FIG. 116 illustrates the case when first input magnet 109101*a* (same as 107101*a*) has magnetization along −x direction (i.e., direction '3'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '1' and '3'. The fixed weak magnetization in direction '3' from magnet 109101*c* further pushes the resultant magnetization of output magnet 109103 towards a direction which causes output titled magnet 109103 to resolve its magnetization along direction '3'.

Figure 117:
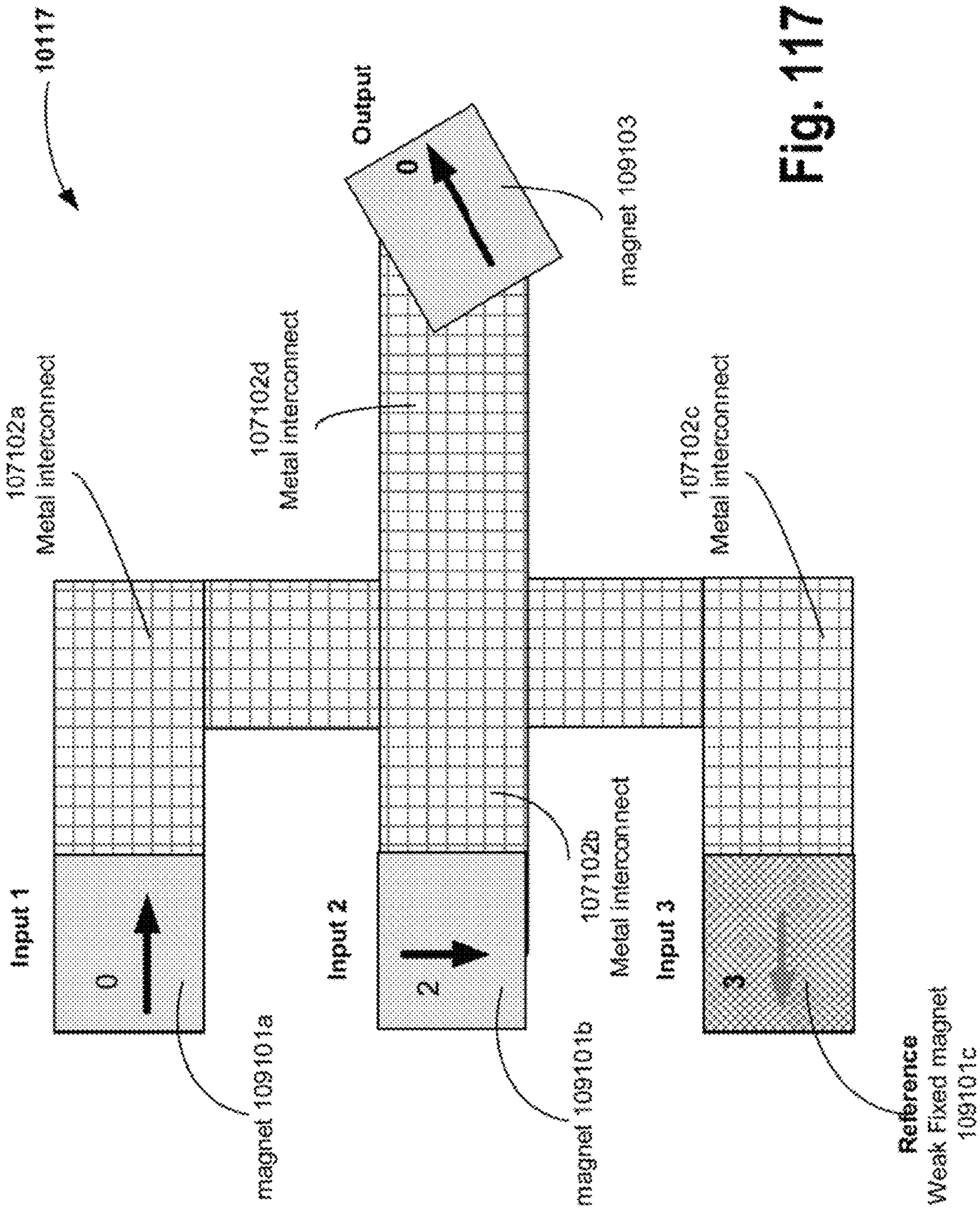

FIG. 117 illustrates the case when first input magnet 109101*a* (same as 107101*a*) has magnetization along +x direction (i.e., direction '0'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '2'. The fixed weak magnetization in direction '3' from magnet 109101*c* further pushes the resultant magnetization of output magnet 109103 towards a direction which causes output titled magnet 109103 to resolve its magnetization along direction '0'.

Figure 118:
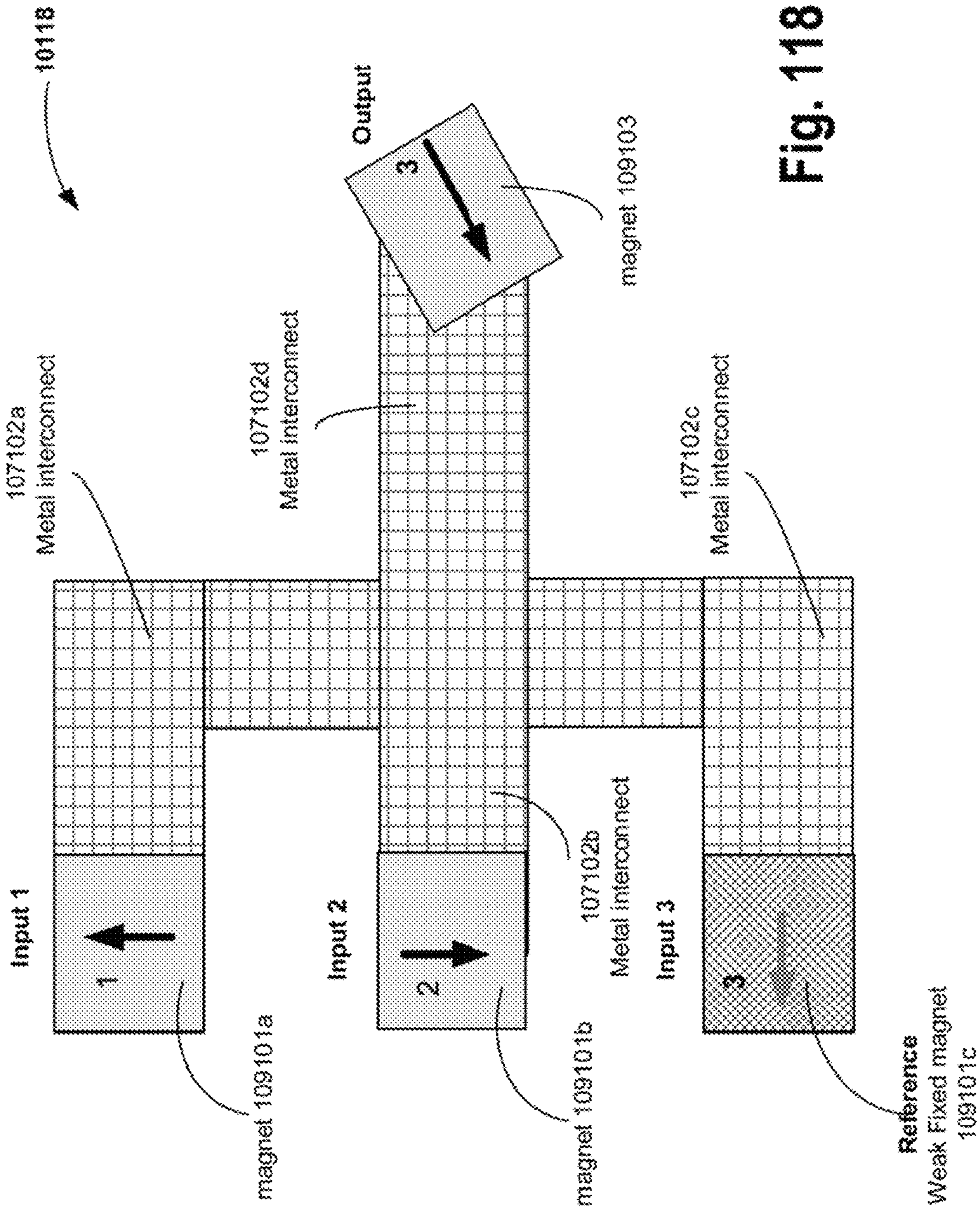

FIG. 118 illustrates the case when first input magnet 109101*a* (same as 107101*a*) has magnetization along +y direction (i.e., direction '1'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '1' and '2'. The fixed weak magnetization in direction '3' from magnet 109101*c* further pushes the resultant magnetization of output magnet 109103 towards a direction which causes output titled magnet 109103 to resolve its magnetization along direction '3'.

Figure 119:
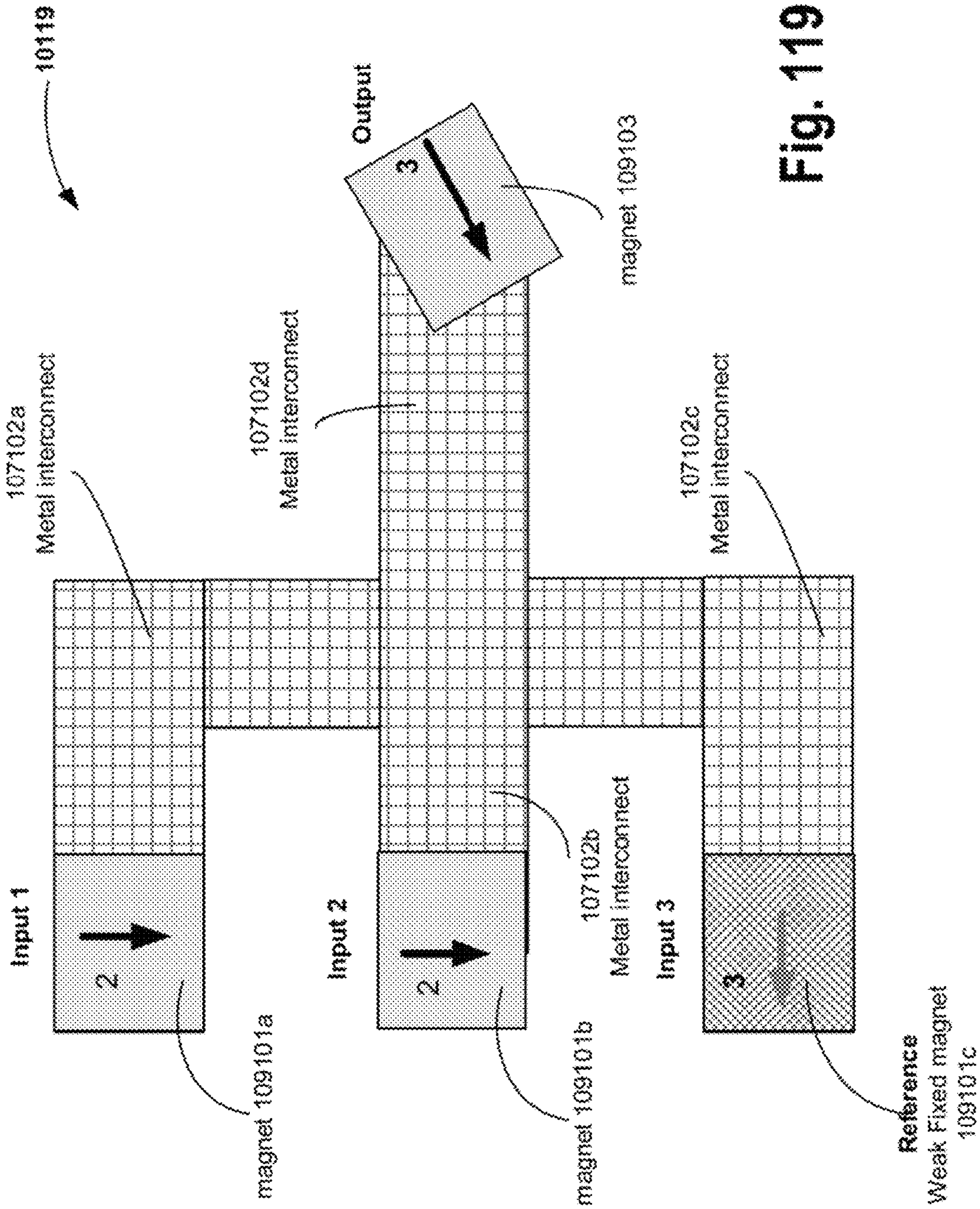

FIG. 119 illustrates the case when first input magnet 109101*a* (same as 107101*a*) has magnetization along −y direction (i.e., direction '2'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization towards '2'. The fixed weak magnetization in direction '3' from magnet 109101*c* further pushes the resultant magnetization of output magnet 109103 towards a direction which causes output titled magnet 109103 to resolve its magnetization along direction '3'.

Figure 120:
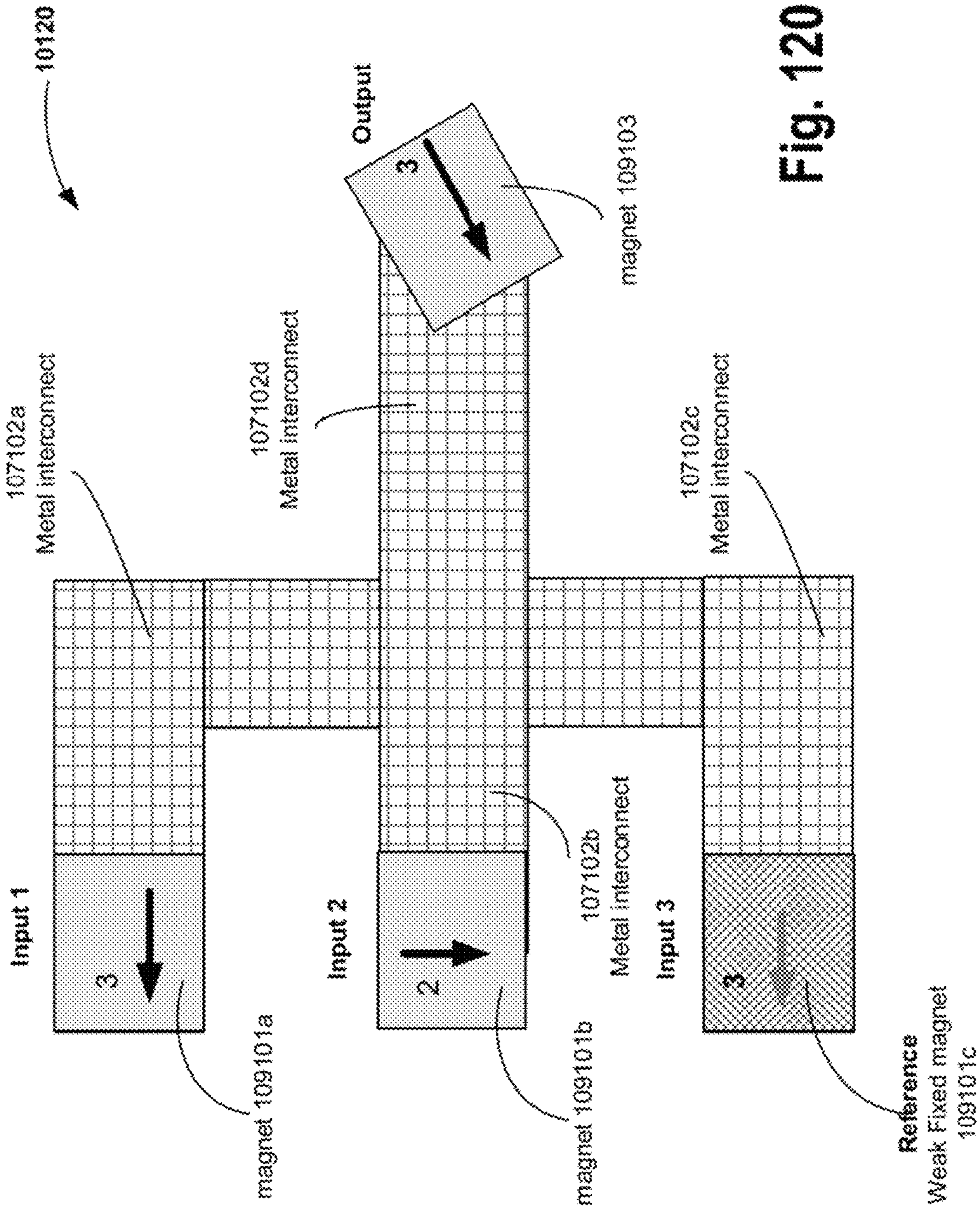

FIG. 120 illustrates the case when first input magnet 109101*a* (same as 107101*a*) has magnetization along −x direction (i.e., direction '3'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '3' and '2'. The fixed weak magnetization in direction '3' from magnet 109101*c* further pushes the resultant magnetization of output magnet 109103 towards a direction which causes output titled magnet 109103 to resolve its magnetization along direction '3'.

Figure 121:
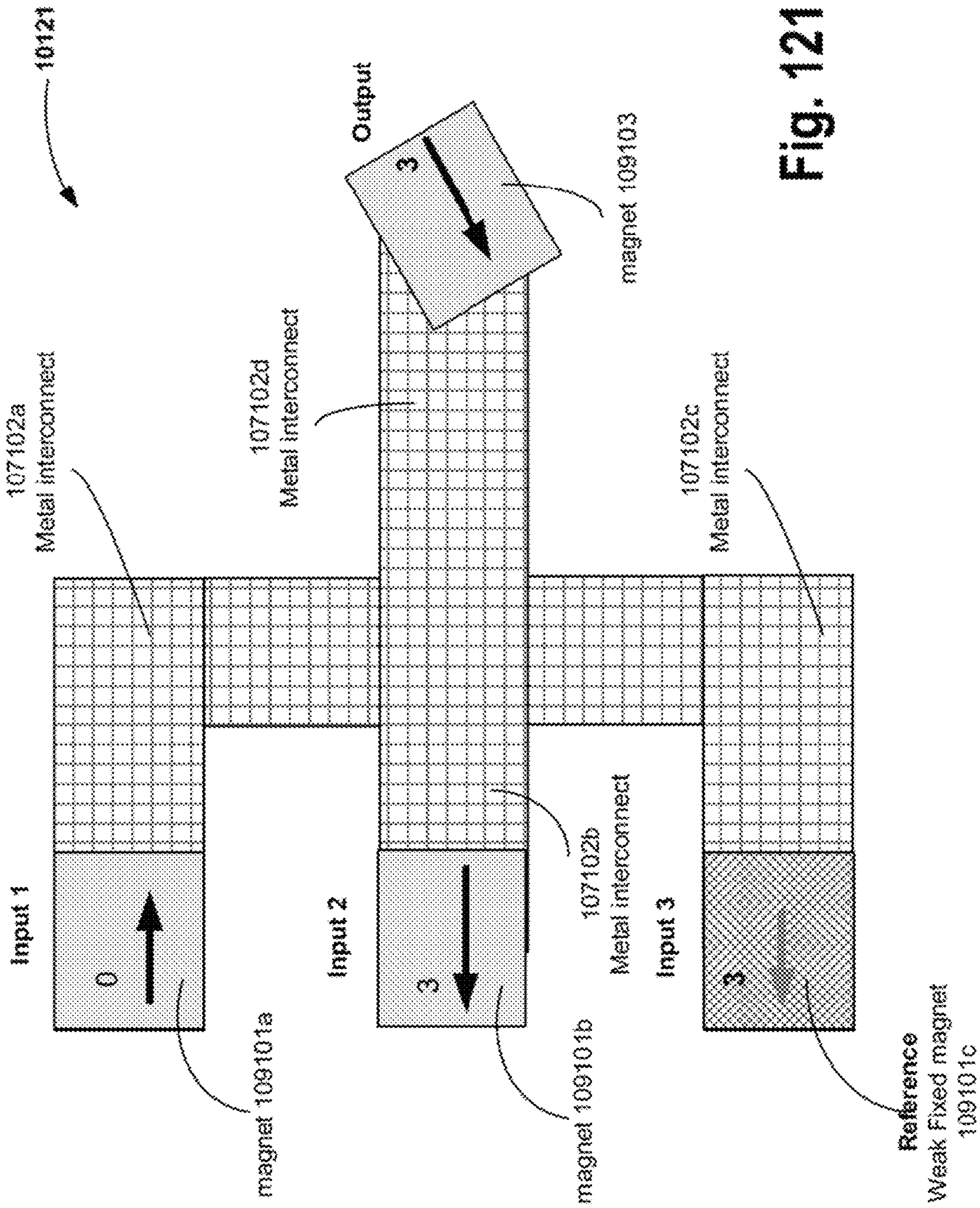

FIG. 121 illustrates the case when first input magnet 109101*a* (same as 107101*a*) has magnetization along +x direction (i.e., direction '0'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '0' and '3'. The fixed weak magnetization in direction '3' from magnet 109101*c* further pushes the resultant magnetization of output magnet 109103 towards a direction which causes output titled magnet 109103 to resolve its magnetization along direction '3'.

Figure 122:
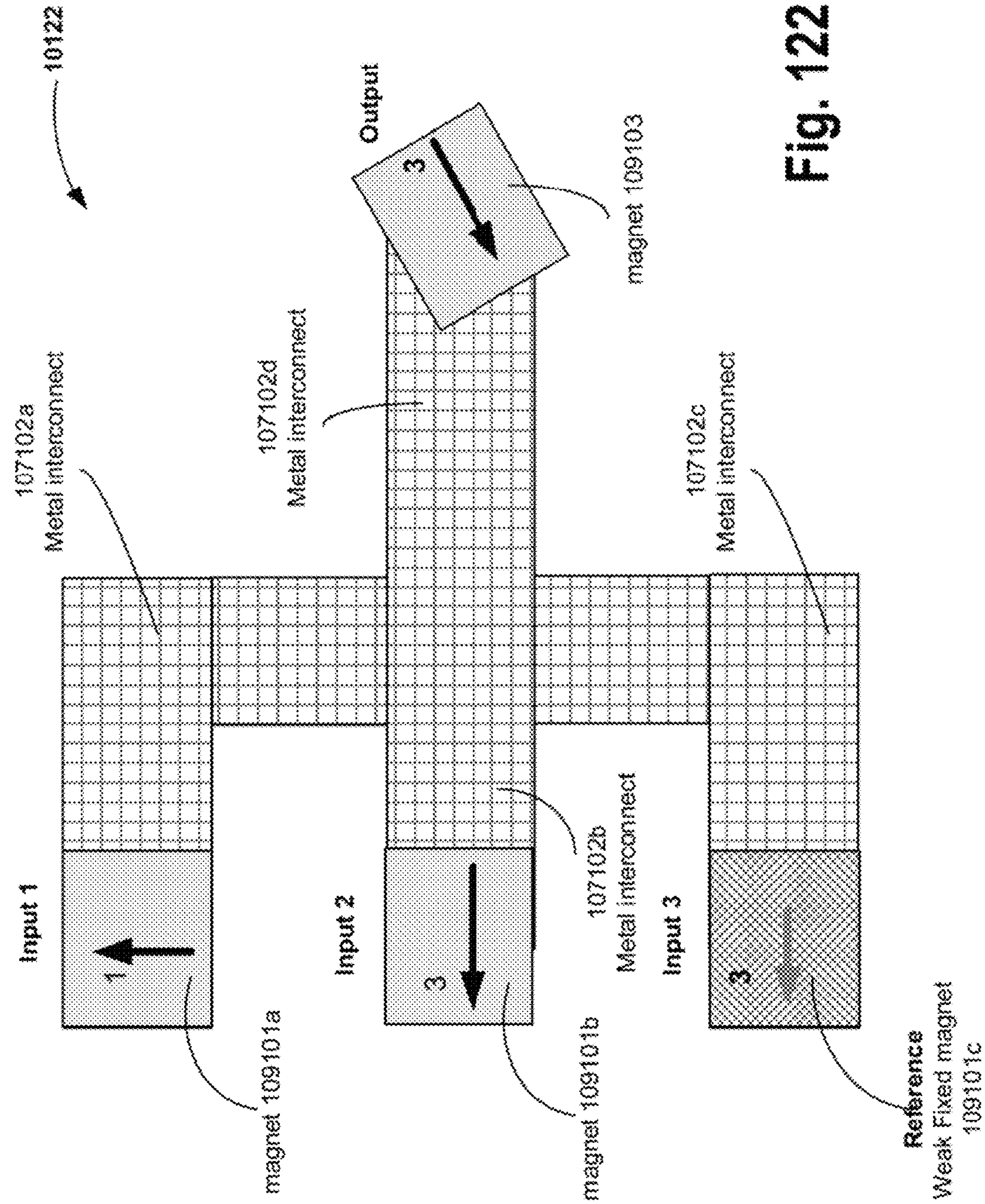

FIG. 122 illustrates the case when first input magnet 109101*a* (same as 107101*a*) has magnetization along +y direction (i.e., direction '1'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '1' and '3'. The fixed weak magnetization in direction '3' from magnet 109101*c* further pushes the resultant magnetization of output magnet 109103 towards a direction which causes output titled magnet 109103 to resolve its magnetization along direction '3'.

Figure 123:
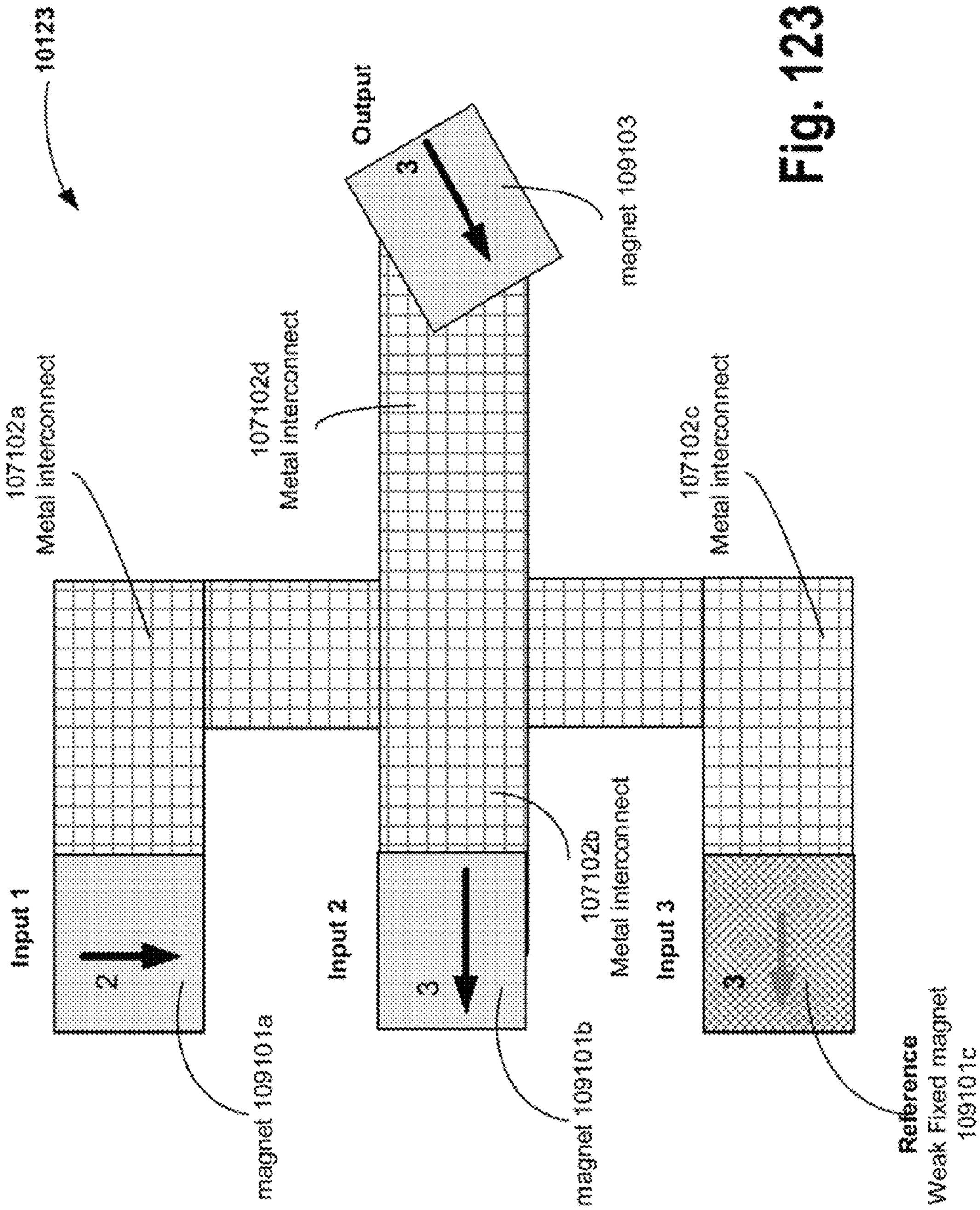

FIG. 123 illustrates the case when first input magnet 109101*a* (same as 107101*a*) has magnetization along −y direction (i.e., direction '2'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '2' and '3'. The fixed weak magnetization in direction '3' from magnet 109101*c* further pushes the resultant magnetization of output magnet 109103 towards a direction which causes output titled magnet 109103 to resolve its magnetization along direction '3'.

Figure 124:
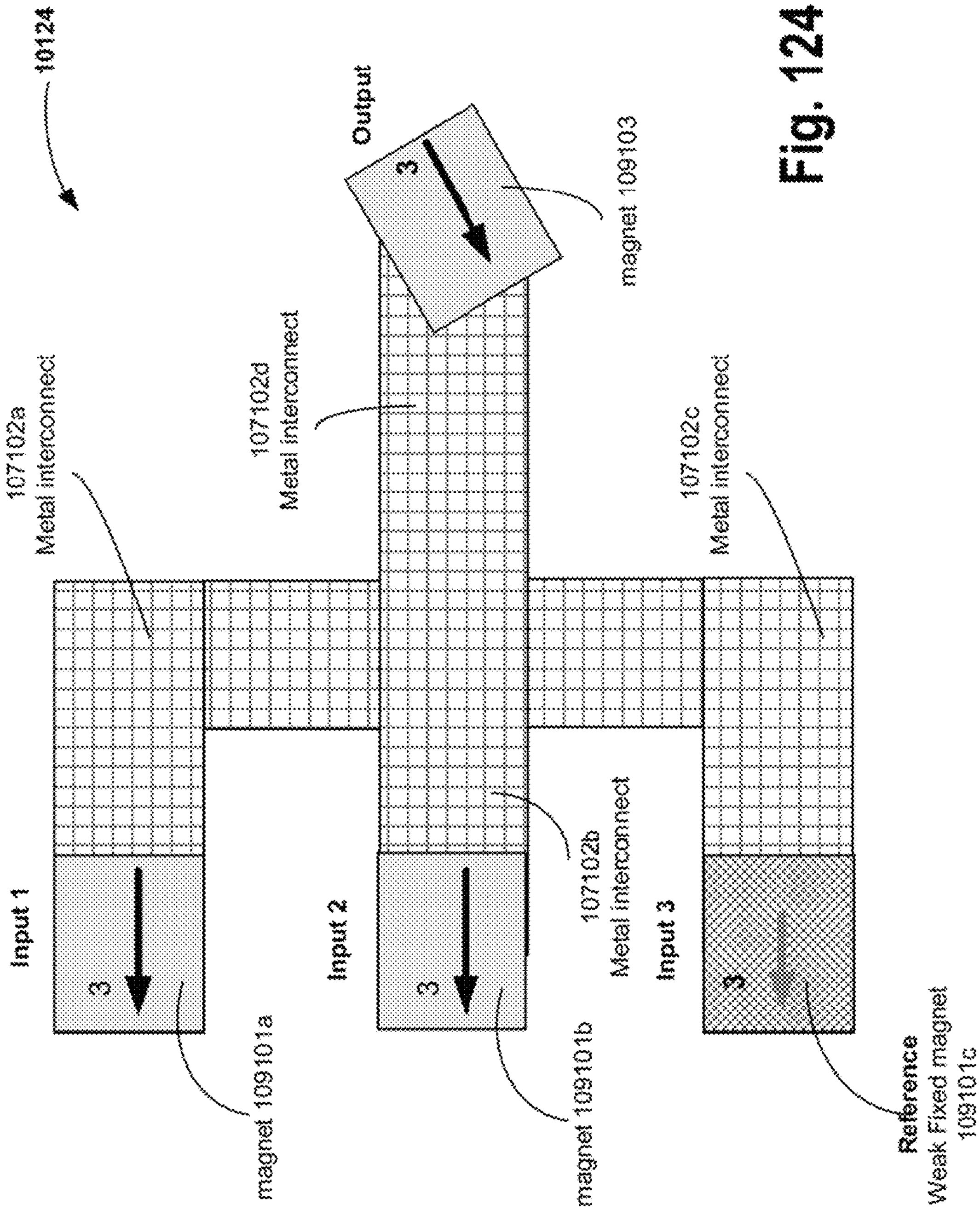

FIG. 124 illustrates the case when first input magnet 109101*a* (same as 107101*a*) has magnetization along −x direction (i.e., direction '3'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization in direction '3'. The fixed weak magnetization in direction '3' from magnet 109101*c* further pushes the resultant magnetization of output magnet 109103 towards a direction which causes output titled magnet 109103 to resolve its magnetization along direction '3'.

FIG. 125 illustrates truth table 10125 of the 3-input quaternary gate of FIG. 107 when the weak reference fixed magnet has a magnetization along the +x-direction (i.e., in direction '0'), according to some embodiments of the disclosure. It is pointed out that those elements of FIG. 125 having the same reference numbers (or names) as the elements of any other figure can operate or function in any manner similar to that described, but are not limited to such.

The top first row of truth table 10125 lists the four possible magnetizations for first input magnet 107101*a* (e.g., Input 1 (A)). The left most column of truth table 10125 lists the four possible magnetizations for second input magnet 107101*b* (e.g., Input 2 (B)). The input magnetization conditions are shown in the shaded boxes. The other remaining boxes illustrate the output magnetization of magnet 107103 in the top left corner of each box according to the magnetizations of the first and second input magnets 107101*a/b*. A person skilled in the art would appreciate that the truth table of FIG. 125 is a mirror image or reflection along the vertical axis (or y-axis) of the truth table of an upper threshold gate.

FIGS. 126-141 illustrates 3-input quaternary gates 10126, 10127, 10128, 10129, 10130, 10131, 10132, 10133, 10134, 10135, 10136, 10137, 10138, 10139, 10140, 10141, respectively, implementing the truth table of FIG. 125, according to some embodiments of the disclosure. It is pointed out that those elements of FIG. 126-141 having the same reference numbers (or names) as the elements of any other figure can operate or function in any manner similar to that described, but are not limited to such.

Figure 127:
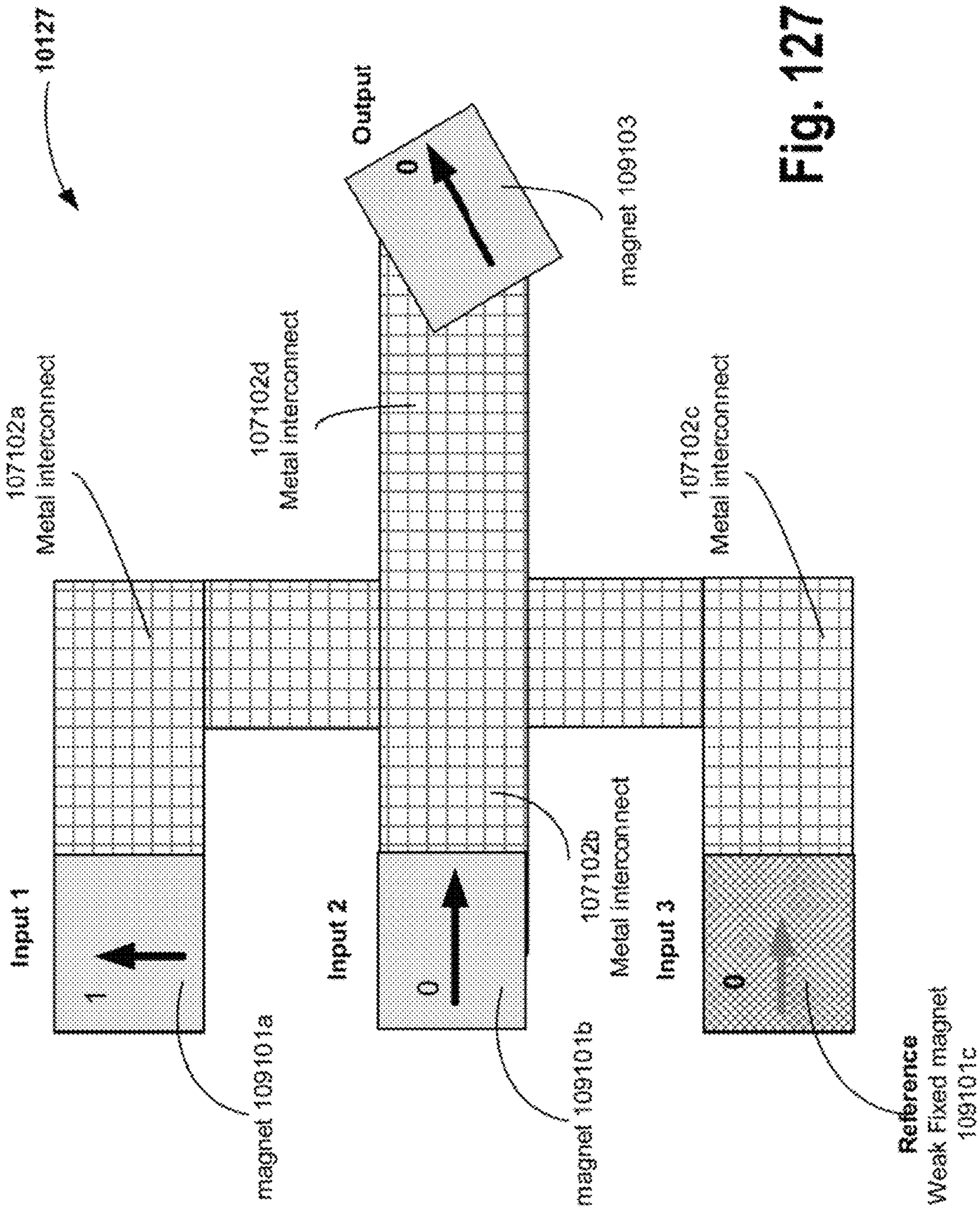

FIG. 127 illustrates the case when first input magnet 109101*a* (same as 107101*a*) has magnetization along +x direction (i.e., direction '0'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '0'. The spins from magnets 109101*a*, 109101*b*, and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103 because the two input magnets have magnetization along direction '0' which overwhelms the weak magnetization from fixed magnet 109101*c*.

FIG. 127 illustrates the case when first input magnet 109101*a* (same as 107101*a*) has magnetization along +y direction (i.e., direction '1'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '1'. The fixed weak magnetization in direction '0' from magnet 109101*c* further pushes the resultant magnetization of output magnet 109103 towards direction '1'. Since output magnet 109103 is a 2-state magnet that can either resolve to magnetization along '0' or '3' directions, the resultant spin in metal interconnect 107102*d* causes output titled magnet 109103 to resolve its magnetization along direction '0'.

Figure 128:
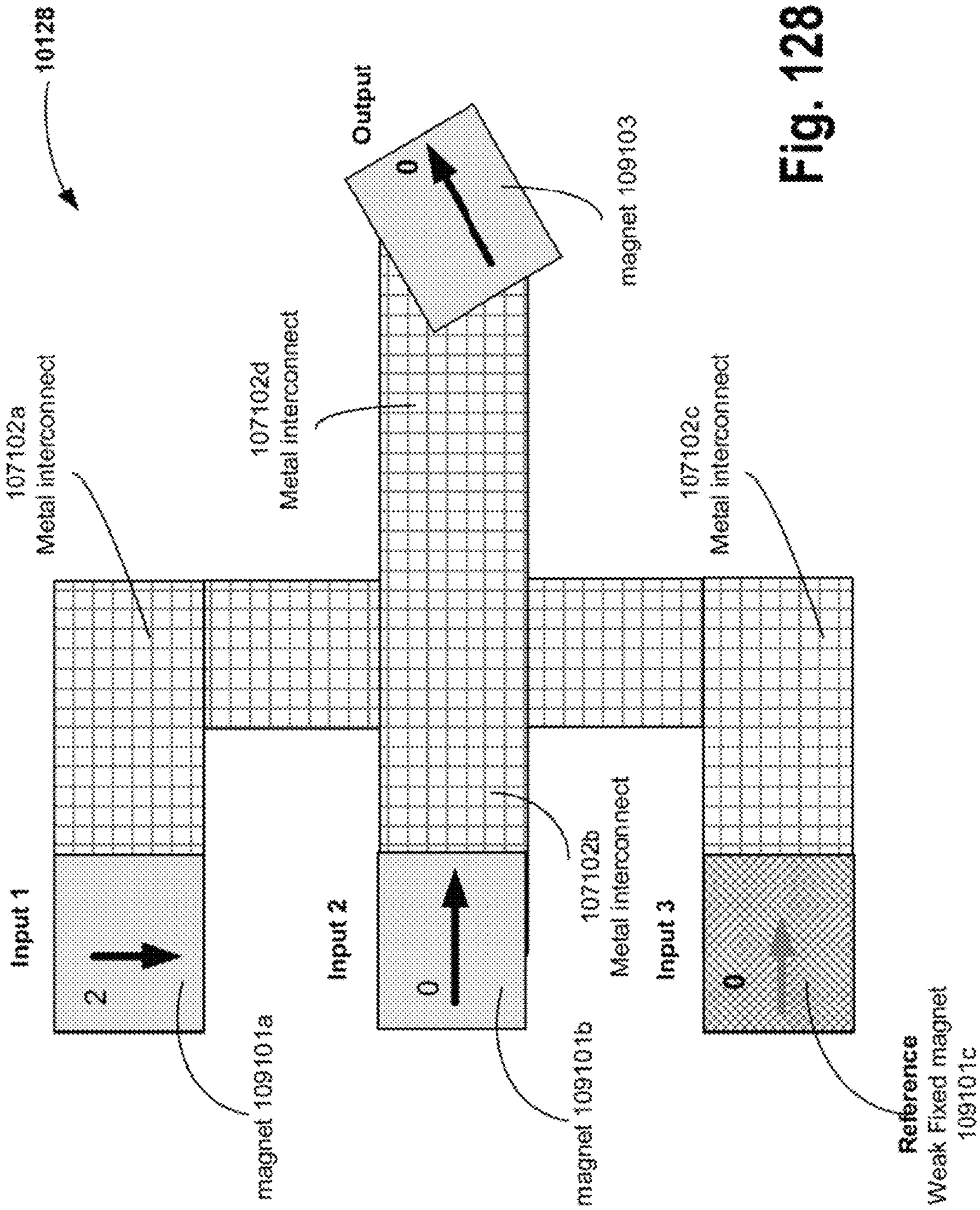

FIG. 128 illustrates the case when first input magnet 109101*a* (same as 107101*a*) has magnetization along −y direction (i.e., direction '2'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '2'. The fixed weak magnetization in direction '0' from magnet 109101*c* further pushes the resultant magnetization of output magnet 109103 towards a direction which causes output titled magnet 109103 to resolve its magnetization along direction '0'.

Figure 129:
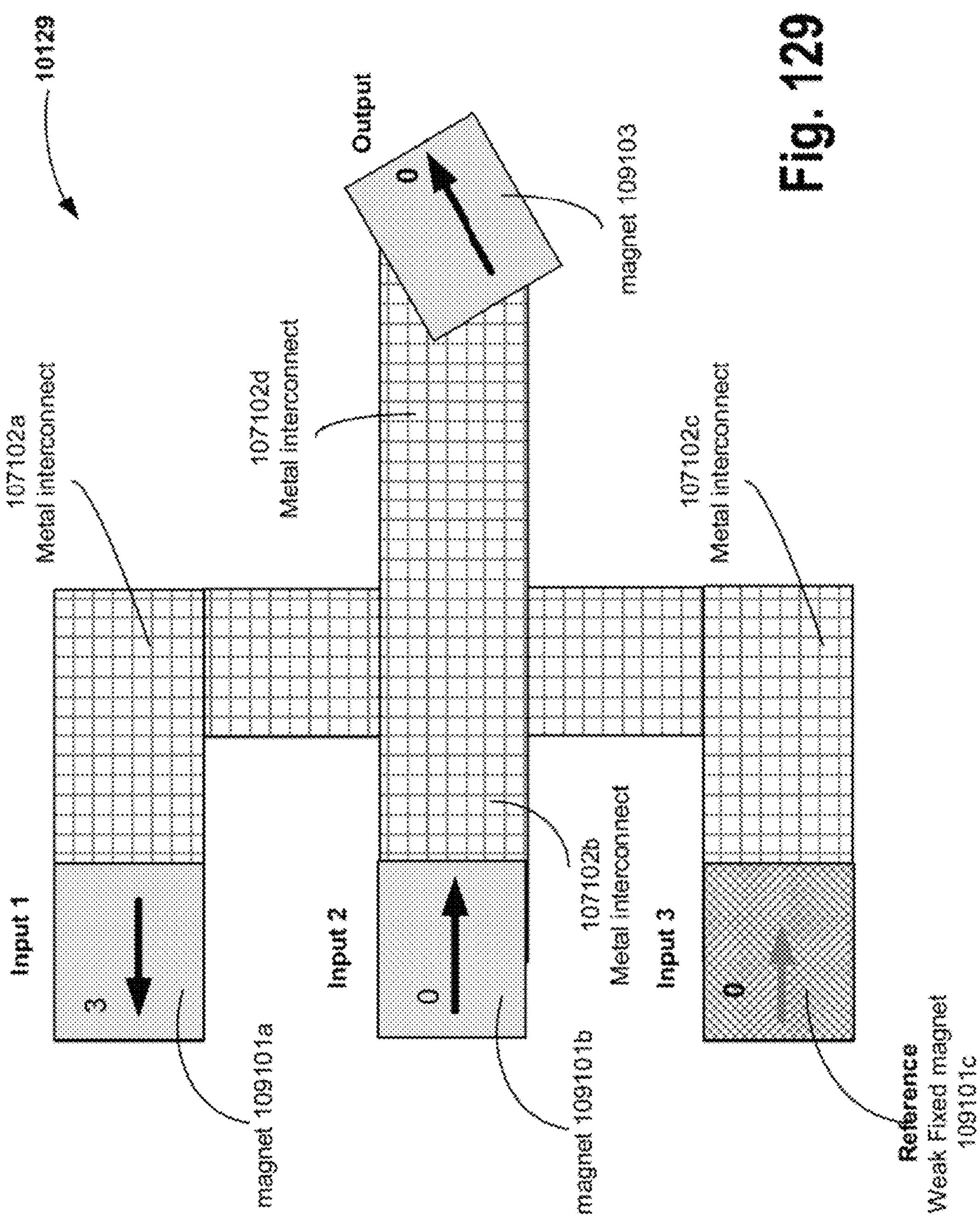

FIG. 129 illustrates the case when first input magnet 109101*a* (same as 107101*a*) has magnetization along −x direction (i.e., direction '3'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '3'. The fixed weak magnetization in direction '0' from magnet 109101*c* further pushes the resultant magnetization of output magnet 109103 towards a direction which causes output titled magnet 109103 to resolve its magnetization along direction '0'.

Figure 130:
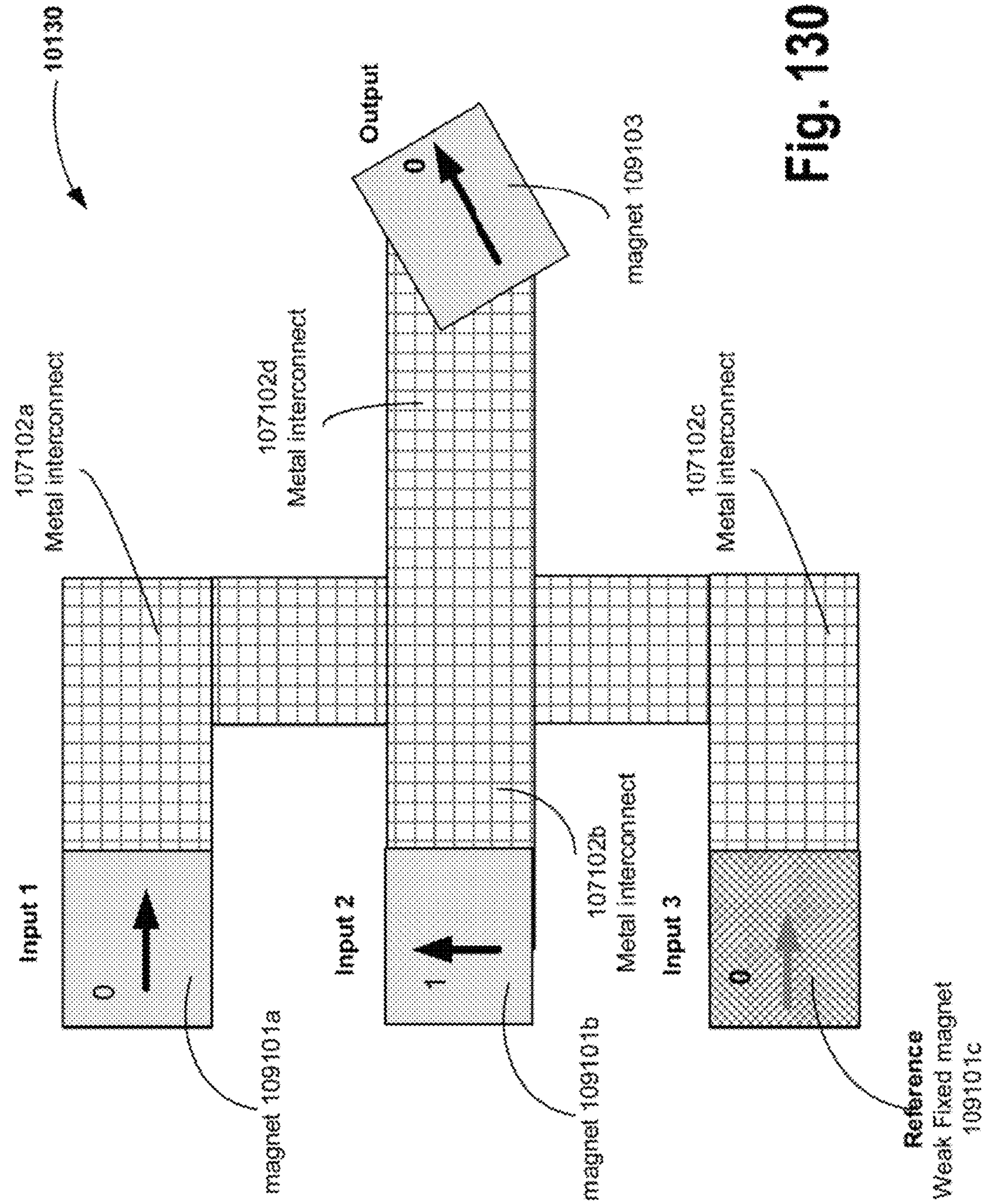

FIG. 130 illustrates the case when first input magnet 109101*a* (same as 107101*a*) has magnetization along +x direction (i.e., direction '0'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '0'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '1'. The fixed weak magnetization in direction '0' from magnet 109101*c* further pushes the resultant magnetization of output magnet 109103 towards a direction which causes output titled magnet 109103 to resolve its magnetization along direction '0'.

Figure 131:
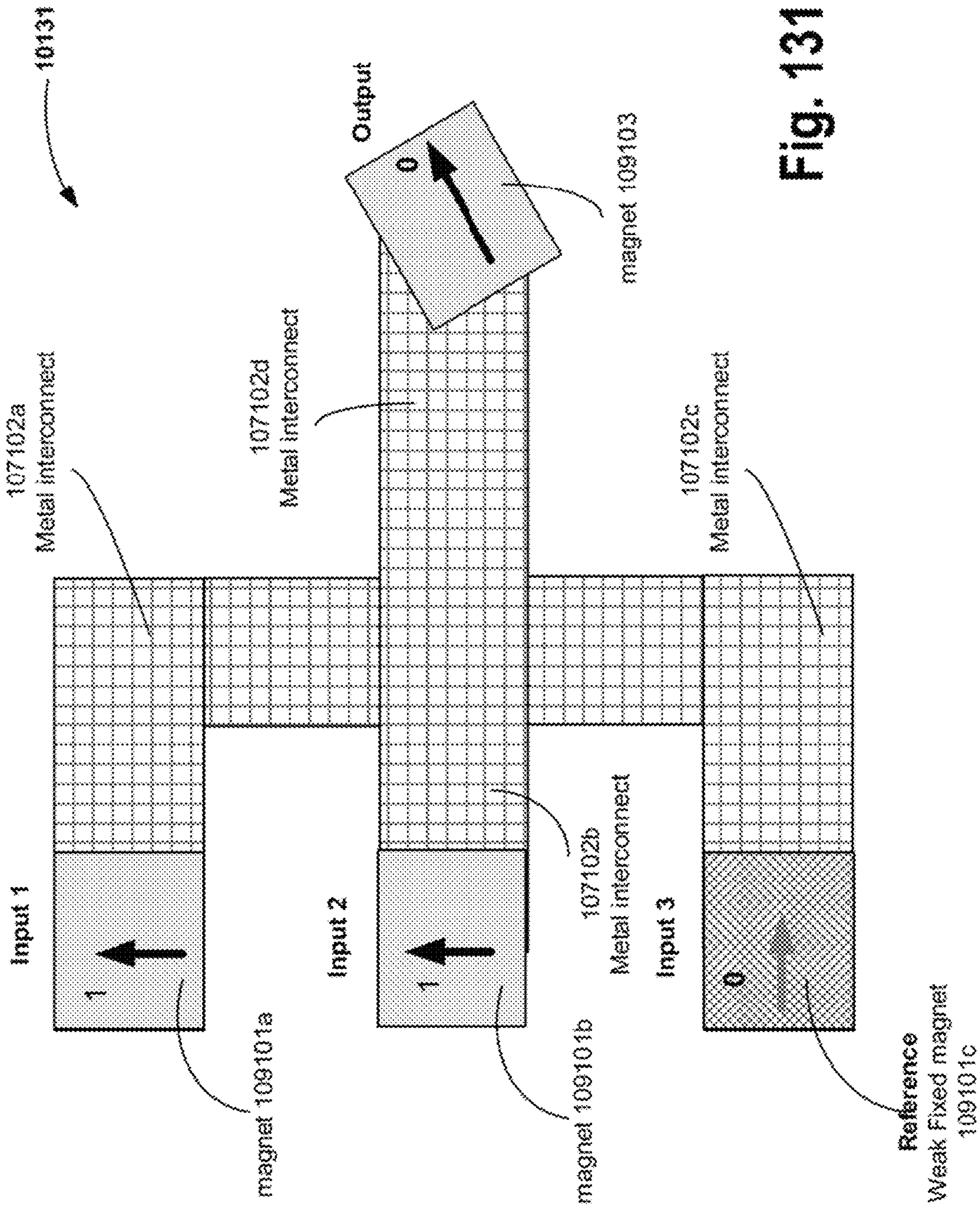

FIG. 131 illustrates the case when first input magnet 109101*a* (same as 107101*a*) has magnetization along +y direction (i.e., direction '1'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization towards '1'. The fixed weak magnetization in direction '0' from magnet 109101*c* further pushes the resultant magnetization of output magnet 109103 towards a direction which causes output titled magnet 109103 to resolve its magnetization along direction '0'.

Figure 132:
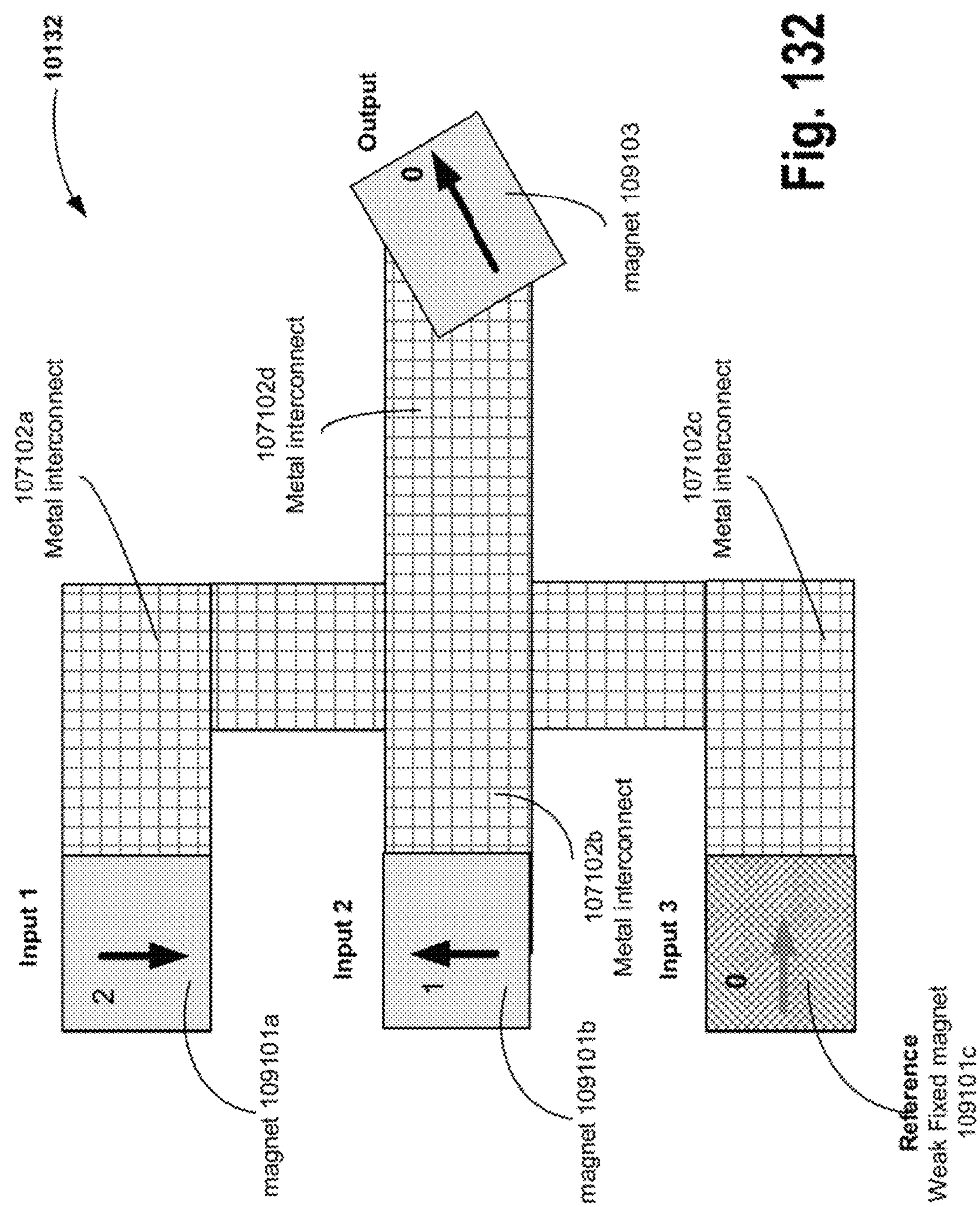

FIG. 132 illustrates the case when first input magnet 109101*a* (same as 107101*a*) has magnetization along −y direction (i.e., direction '2'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '1' and '2'. The fixed weak magnetization in direction '0' from magnet 109101*c* further pushes the resultant magnetization of output magnet 109103 towards a direction which causes output titled magnet 109103 to resolve its magnetization along direction '0'.

Figure 133:
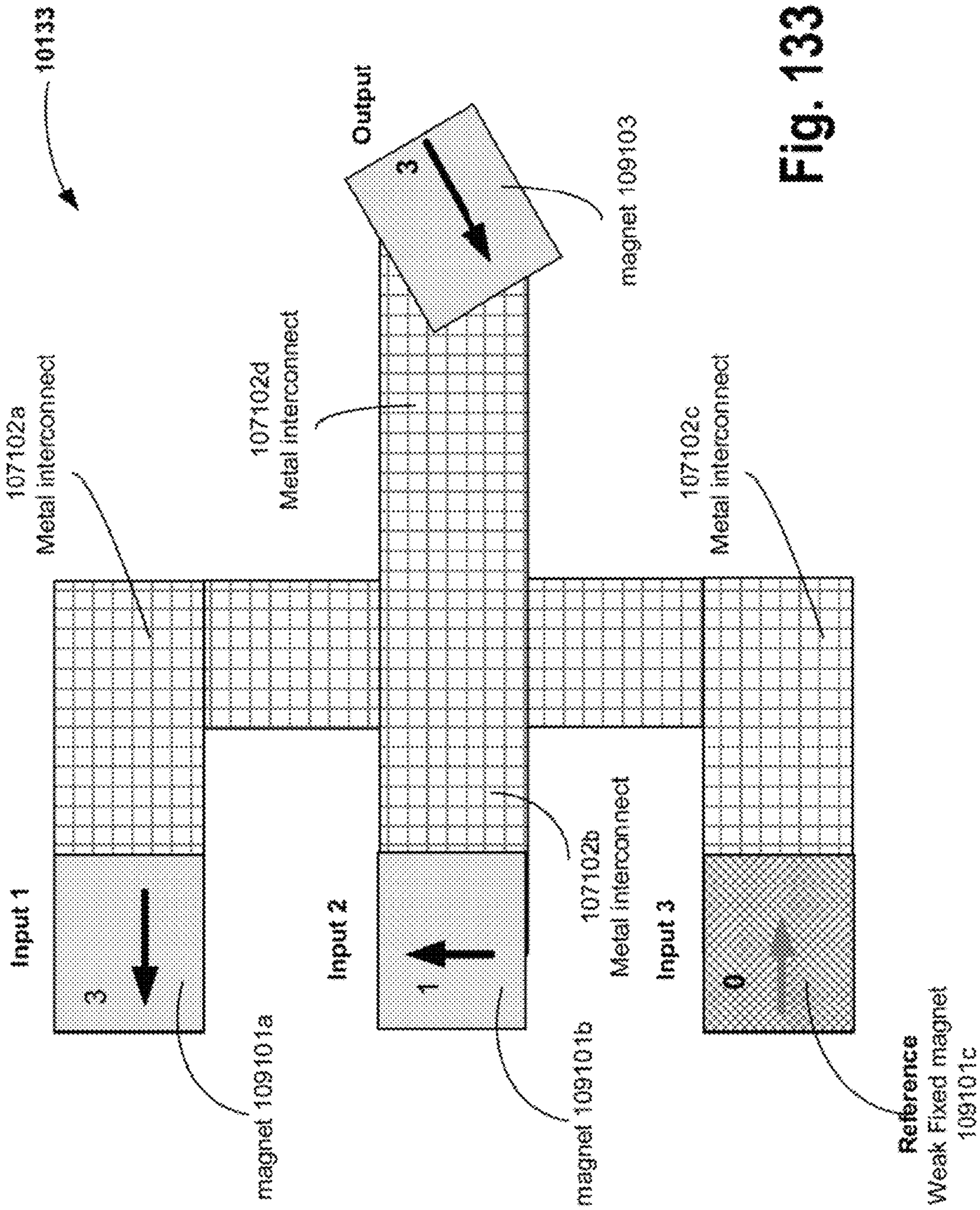

FIG. 133 illustrates the case when first input magnet 109101*a* (same as 107101*a*) has magnetization along −x direction (i.e., direction '3'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3'. The spins from magnets 109101_a_, 109101_b_, and 109101_c_ travel through metal interconnects 107102_a_, 107102_b_, and 107102_c_, respectively, and combine in metal interconnect 107102_d_. The resultant spin in metal interconnect 107102_d_ determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '1' and '3'. The fixed weak magnetization in direction '0' from magnet 109101_c_ further pushes the resultant magnetization of output magnet 109103 towards a direction which causes output titled magnet 109103 to resolve its magnetization along direction '3'.

Figure 134:
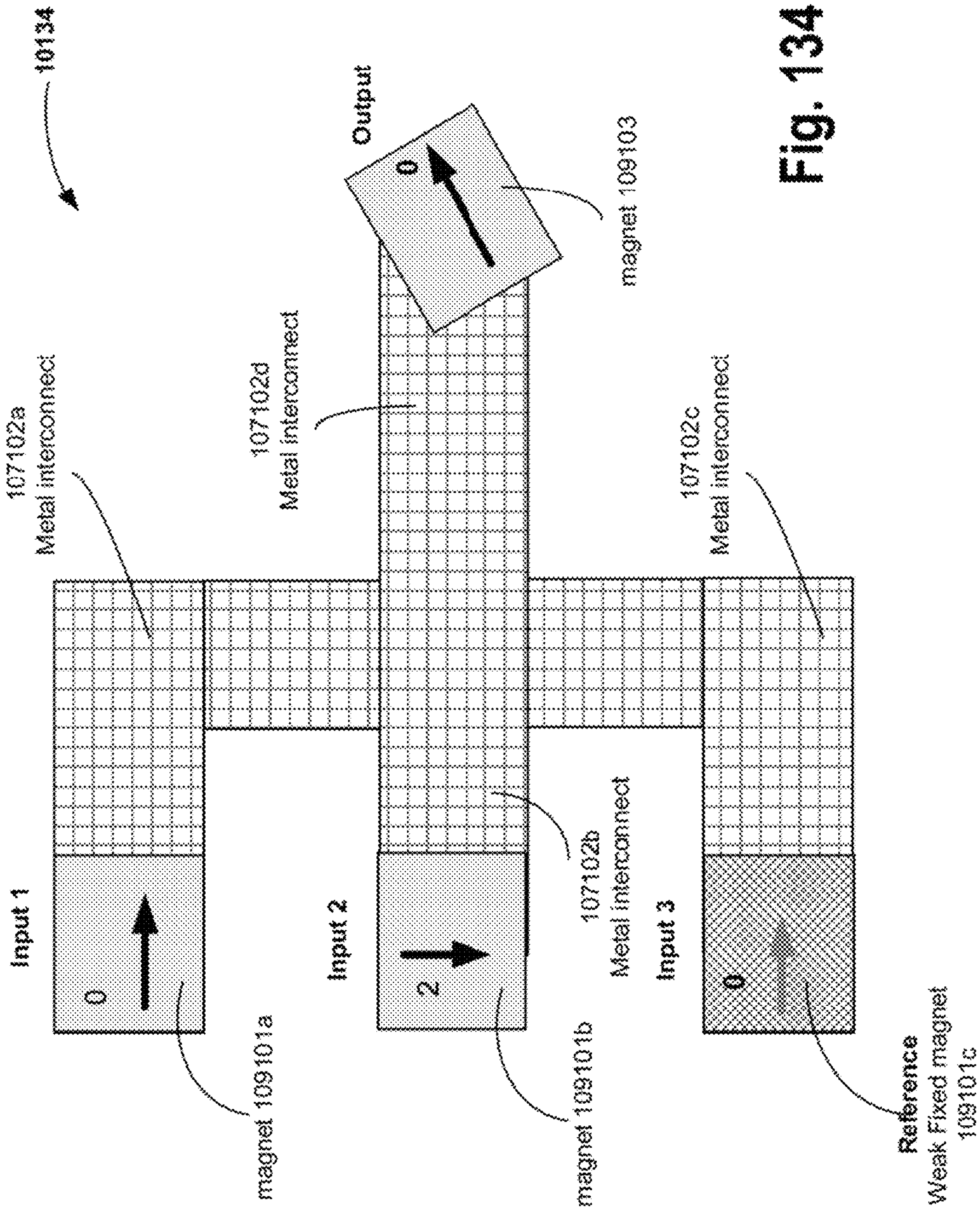

FIG. 134 illustrates the case when first input magnet 109101_a_ (same as 107101_a_) has magnetization along +x direction (i.e., direction '0'), second input magnet 109101_b_ (same as 107101_b_) has magnetization along −y direction (i.e., direction '2'), third input fixed magnet 109101_c_ (same as 109101_c_) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101_a_ is along direction '0'. The spins from magnets 109101_a_, 109101_b_, and 109101_c_ travel through metal interconnects 107102_a_, 107102_b_, and 107102_c_, respectively, and combine in metal interconnect 107102_d_. The resultant spin in metal interconnect 107102_d_ determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '2'. The fixed weak magnetization in direction '0' from magnet 109101_c_ further pushes the resultant magnetization of output magnet 109103 towards a direction which causes output titled magnet 109103 to resolve its magnetization along direction '0'.

Figure 135:
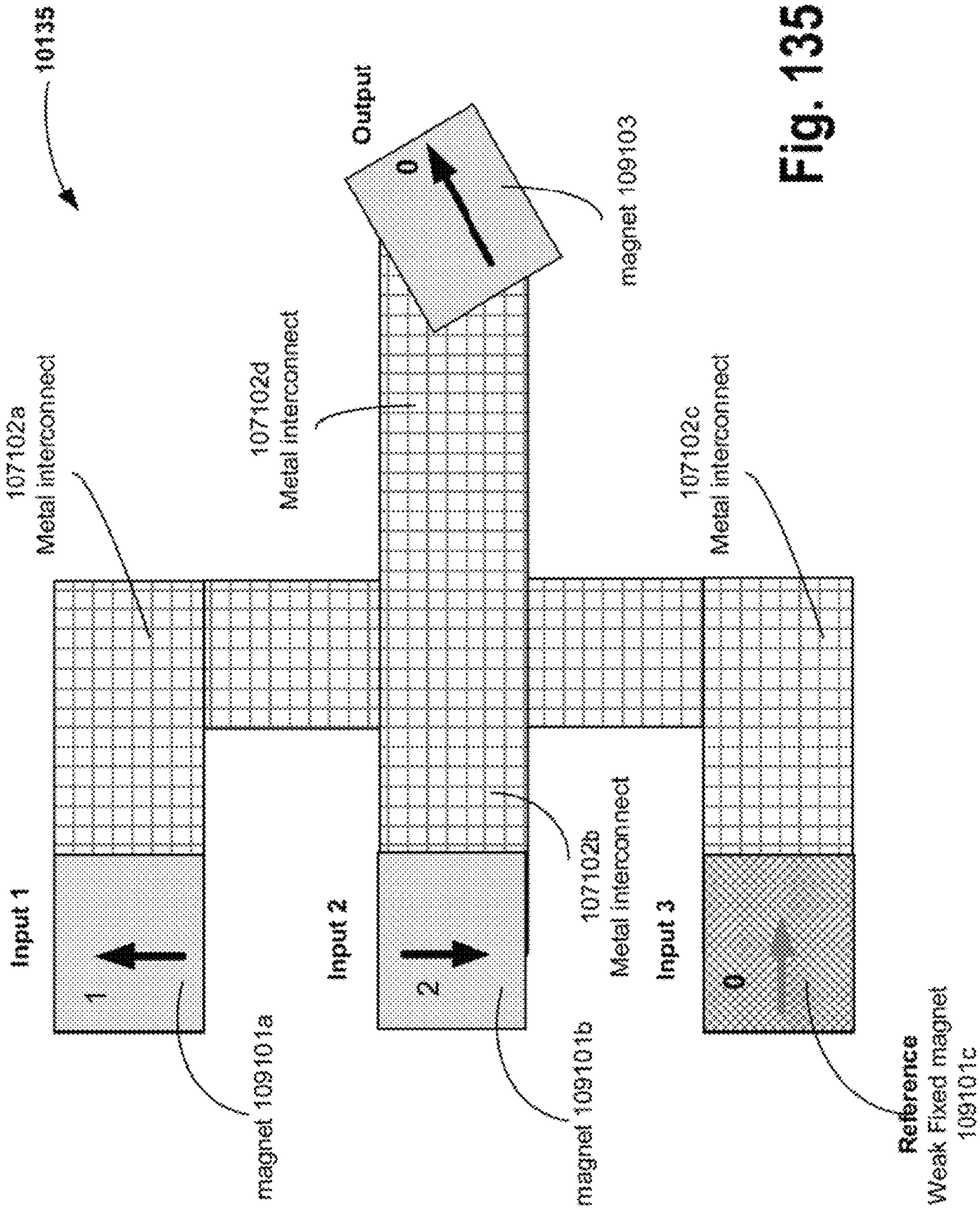

FIG. 135 illustrates the case when first input magnet 109101_a_ (same as 107101_a_) has magnetization along +y direction (i.e., direction '1'), second input magnet 109101_b_ (same as 107101_b_) has magnetization along −y direction (i.e., direction '2'), third input fixed magnet 109101_c_ (same as 109101_c_) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101_a_ is along direction '1'. The spins from magnets 109101_a_, 109101_b_, and 109101_c_ travel through metal interconnects 107102_a_, 107102_b_, and 107102_c_, respectively, and combine in metal interconnect 107102_d_. The resultant spin in metal interconnect 107102_d_ determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '1' and '2'. The fixed weak magnetization in direction '0' from magnet 109101_c_ further pushes the resultant magnetization of output magnet 109103 towards a direction which causes output titled magnet 109103 to resolve its magnetization along direction '0'.

Figure 136:
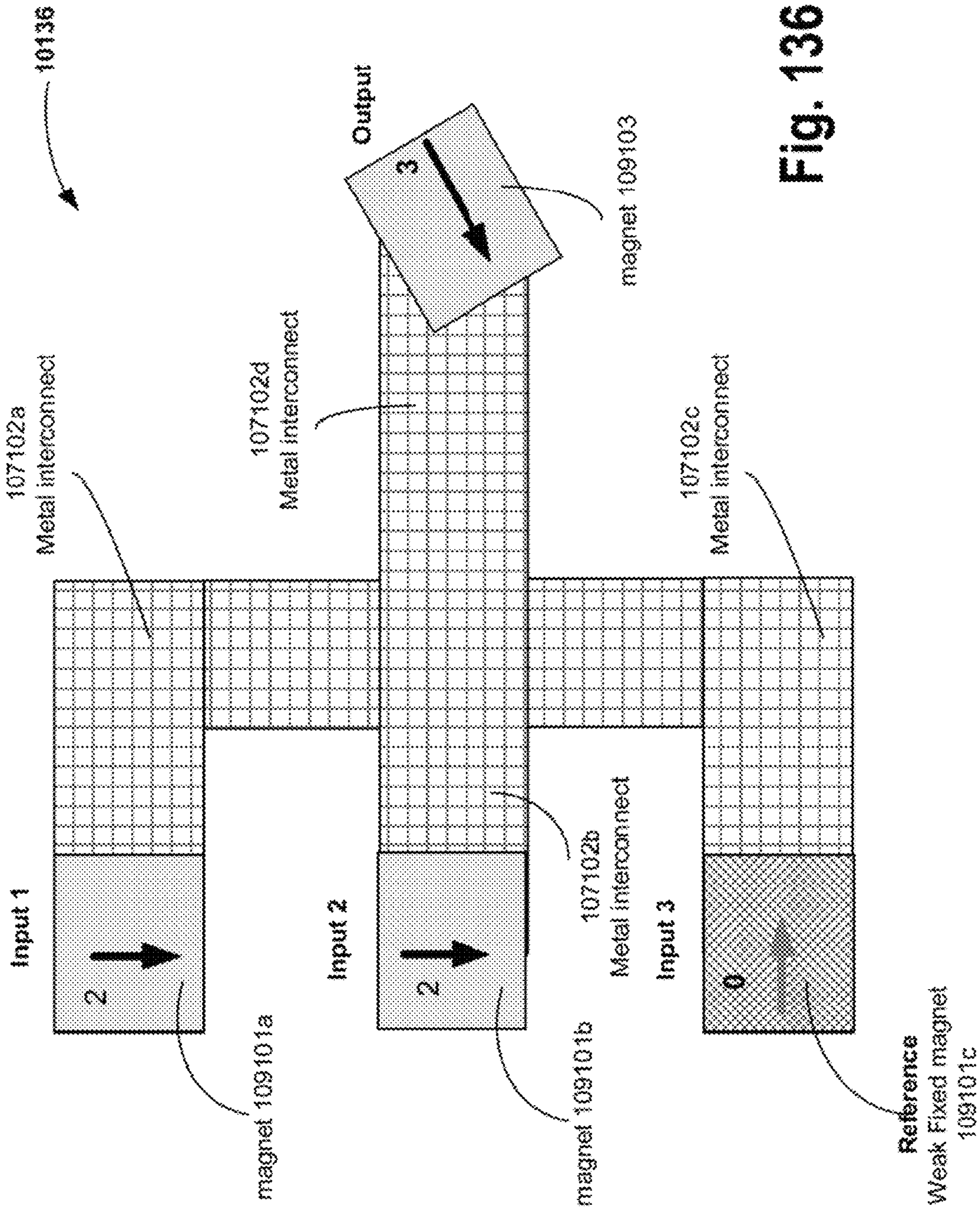

FIG. 136 illustrates the case when first input magnet 109101_a_ (same as 107101_a_) has magnetization along −y direction (i.e., direction '2'), second input magnet 109101_b_ (same as 107101_b_) has magnetization along −y direction (i.e., direction '2'), third input fixed magnet 109101_c_ (same as 109101_c_) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101_a_ is along direction '2'. The spins from magnets 109101_a_, 109101_b_, and 109101_c_ travel through metal interconnects 107102_a_, 107102_b_, and 107102_c_, respectively, and combine in metal interconnect 107102_d_. The resultant spin in metal interconnect 107102_d_ determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization towards '2'. The fixed weak magnetization in direction '0' from magnet 109101_c_ further pushes the resultant magnetization of output magnet 109103 towards a direction which causes output titled magnet 109103 to resolve its magnetization along direction '3'.

Figure 137:
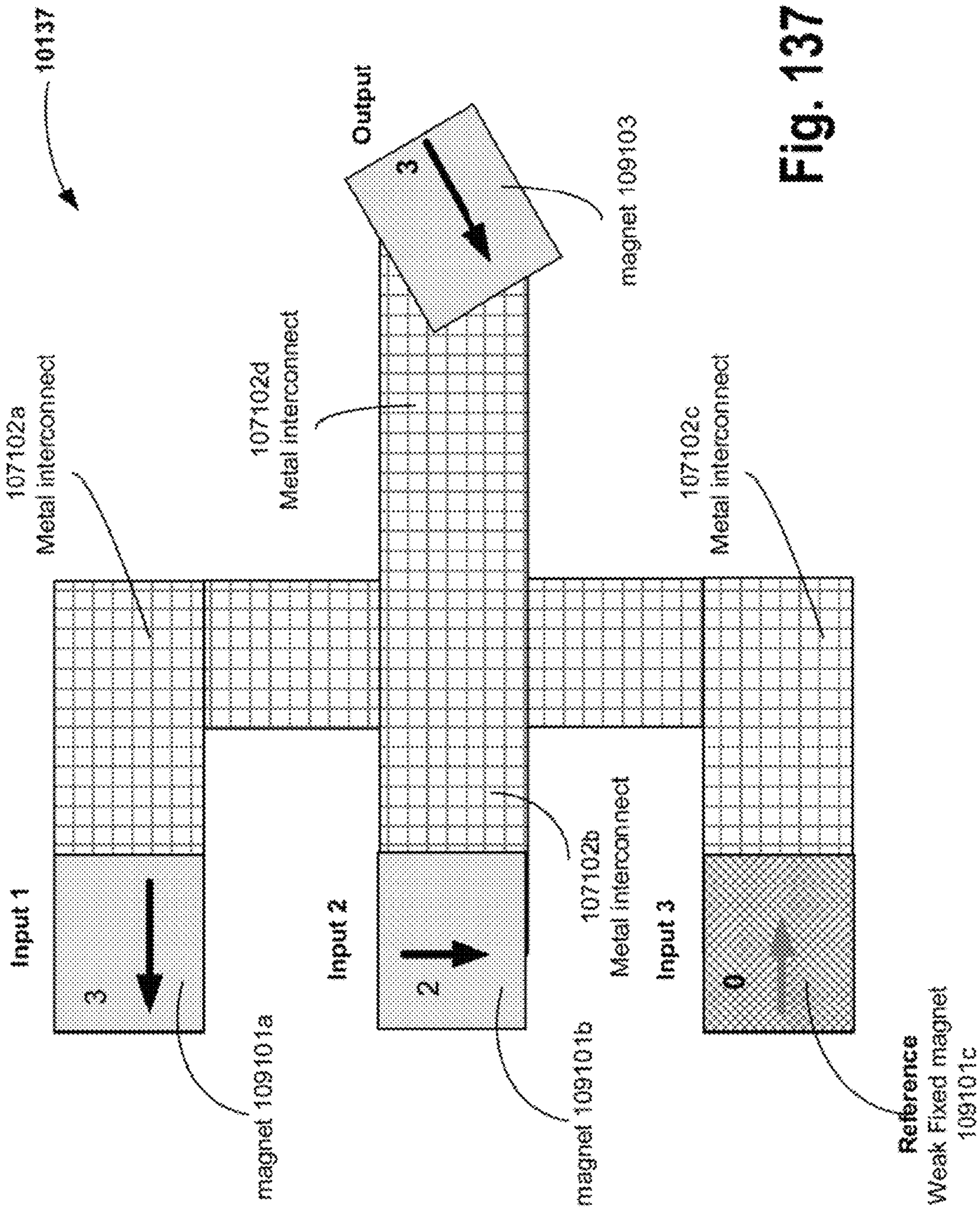

FIG. 137 illustrates the case when first input magnet 109101_a_ (same as 107101_a_) has magnetization along −x direction (i.e., direction '3'), second input magnet 109101_b_ (same as 107101_b_) has magnetization along −y direction (i.e., direction '2'), third input fixed magnet 109101_c_ (same as 109101_c_) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101_a_ is along direction '3'. The spins from magnets 109101_a_, 109101_b_, and 109101_c_ travel through metal interconnects 107102_a_, 107102_b_, and 107102_c_, respectively, and combine in metal interconnect 107102_d_. The resultant spin in metal interconnect 107102_d_ determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '3' and '2'. The fixed weak magnetization in direction '0' from magnet 109101_c_ further pushes the resultant magnetization of output magnet 109103 towards a direction which causes output titled magnet 109103 to resolve its magnetization along direction '3'.

Figure 138:
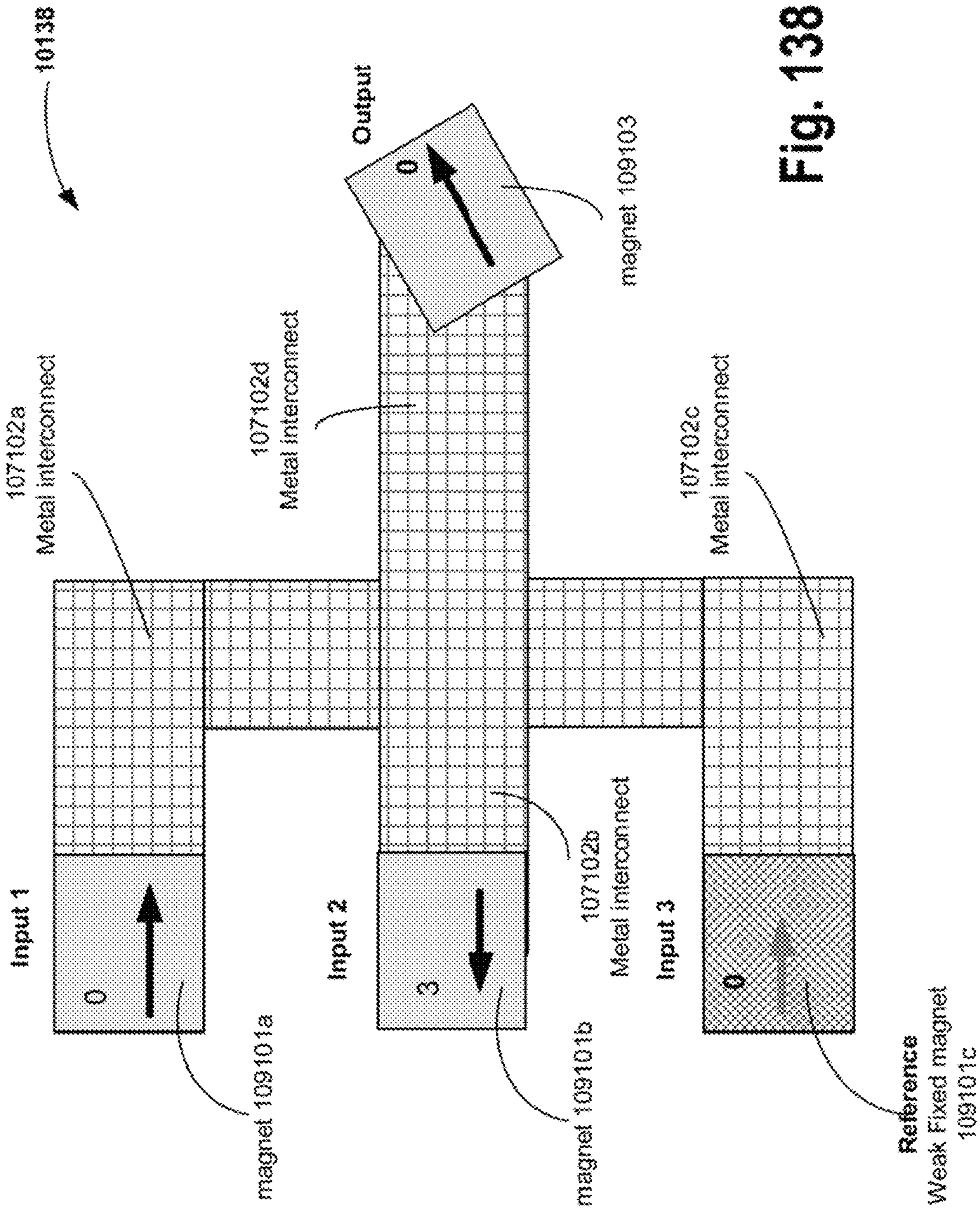

FIG. 138 illustrates the case when first input magnet 109101_a_ (same as 107101_a_) has magnetization along +x direction (i.e., direction '0'), second input magnet 109101_b_ (same as 107101_b_) has magnetization along −x direction (i.e., direction '3'), third input fixed magnet 109101_c_ (same as 109101_c_) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101_a_ is along direction '0'. The spins from magnets 109101_a_, 109101_b_, and 109101_c_ travel through metal interconnects 107102_a_, 107102_b_, and 107102_c_, respectively, and combine in metal interconnect 107102_d_. The resultant spin in metal interconnect 107102*d* determines the magnetization of output magnet 109103 (same as 107103), in accordance with some embodiments. In this case, the majority spin direction causes titled output magnet 109103 to have magnetization along direction '0' because the two input magnets have magnetizations that would result in a resultant magnetization between direction '0' and '3'. The fixed weak magnetization in direction '0' from magnet 109101*c* further pushes the resultant magnetization of output magnet 109103 towards a direction which causes output titled magnet 109103 to resolve its magnetization along direction '0'.

Figure 139:
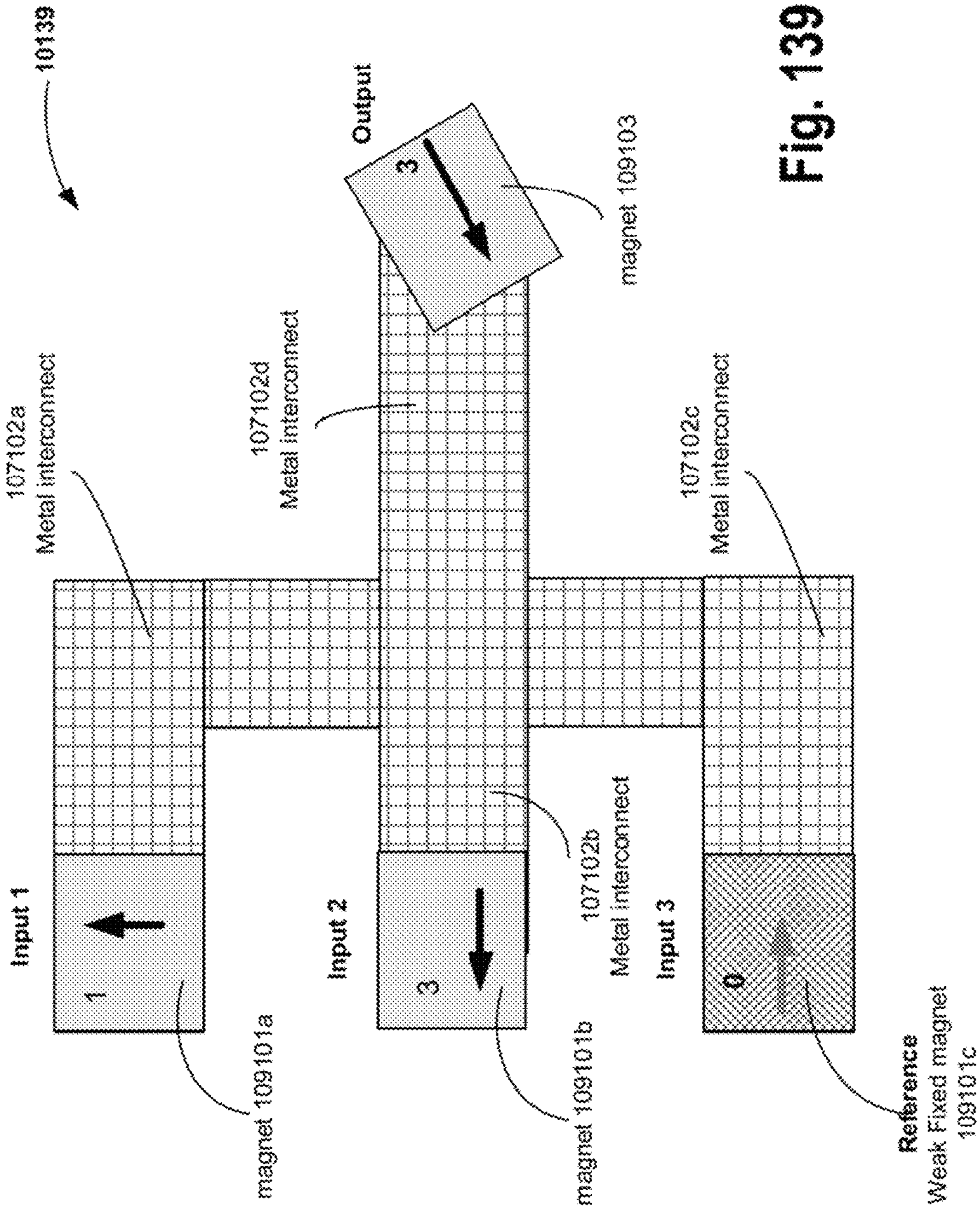

FIG. 139 illustrates the case when first input magnet 109101*a* (same as 107101*a*) has magnetization along +y direction (i.e., direction '1'), second input magnet 109101*b* (same as 107101*b*) has magnetization along −x direction (i.e., direction '3'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '1'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '1' and '3'. The fixed weak magnetization in direction '0' from magnet 109101*c* further pushes the resultant magnetization of output magnet 109103 towards a direction which causes output titled magnet 109103 to resolve its magnetization along direction '3'.

Figure 140:
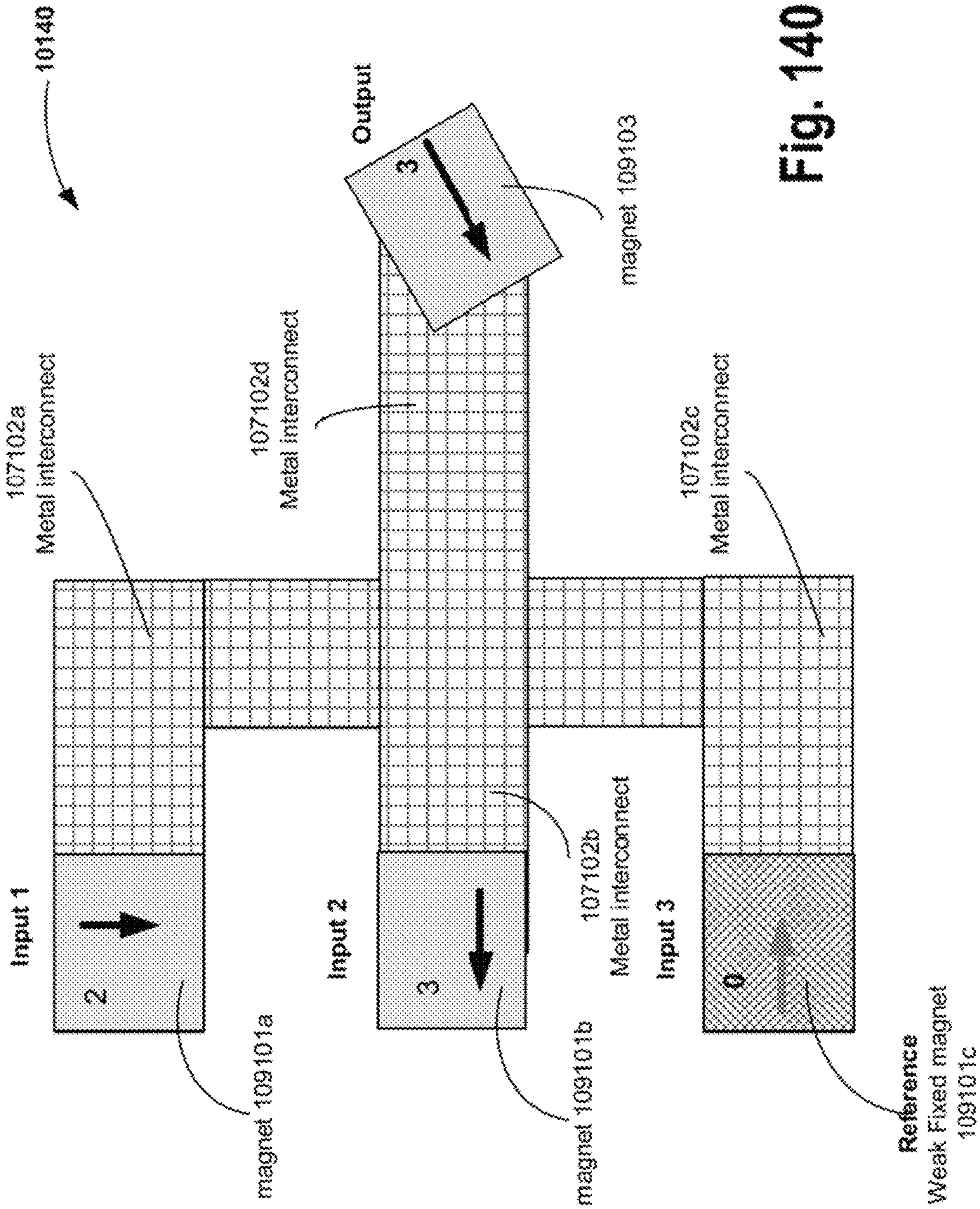

FIG. 140 illustrates the case when first input magnet 109101*a* (same as 107101*a*) has magnetization along −y direction (i.e., direction '2'), second input magnet 109101*b* (same as 107101*b*) has magnetization along −x direction (i.e., direction '3'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization between direction '2' and '3'. The fixed weak magnetization in direction '0' from magnet 109101*c* further pushes the resultant magnetization of output magnet 109103 towards a direction which causes output titled magnet 109103 to resolve its magnetization along direction '3'.

Figure 141:
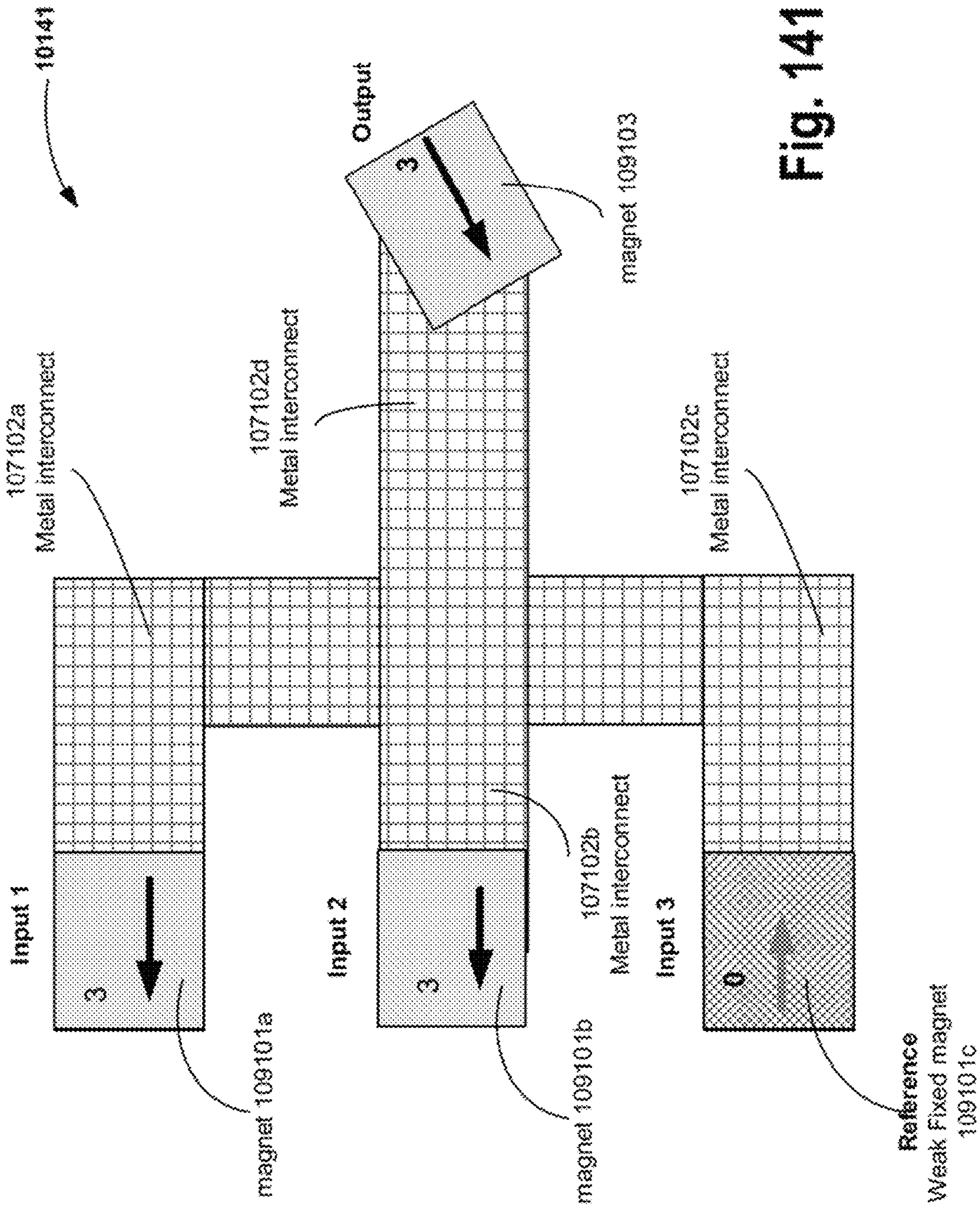

FIG. 141 illustrates the case when first input magnet 109101*a* (same as 107101*a*) has magnetization along −x direction (i.e., direction '3'), second input magnet 109101*b* (same as 107101*b*) has magnetization along −x direction (i.e., direction '3'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3'. The spins from magnets 109101*a*, 109101*b*, and 109101*c* travel through metal interconnects 107102*a*, 107102*b*, and 107102*c*, respectively, and combine in metal interconnect 107102*d*. The resultant spin in metal interconnect 107102*d* determines the magnetization of output magnet 109103 (same as 107103), in accordance with some embodiments. In this case, the majority spin direction causes titled output magnet 109103 to have magnetization along direction '3' because the two input magnets have magnetizations that would result in a resultant magnetization in direction '3'. The fixed weak magnetization in direction '0' from magnet 109101*c* further pushes the resultant magnetization of output magnet 109103 towards a direction which causes output titled magnet 109103 to resolve its magnetization along direction '3'.

3-Input Quaternary Lower and Upper Threshold Gate

Figure 142:
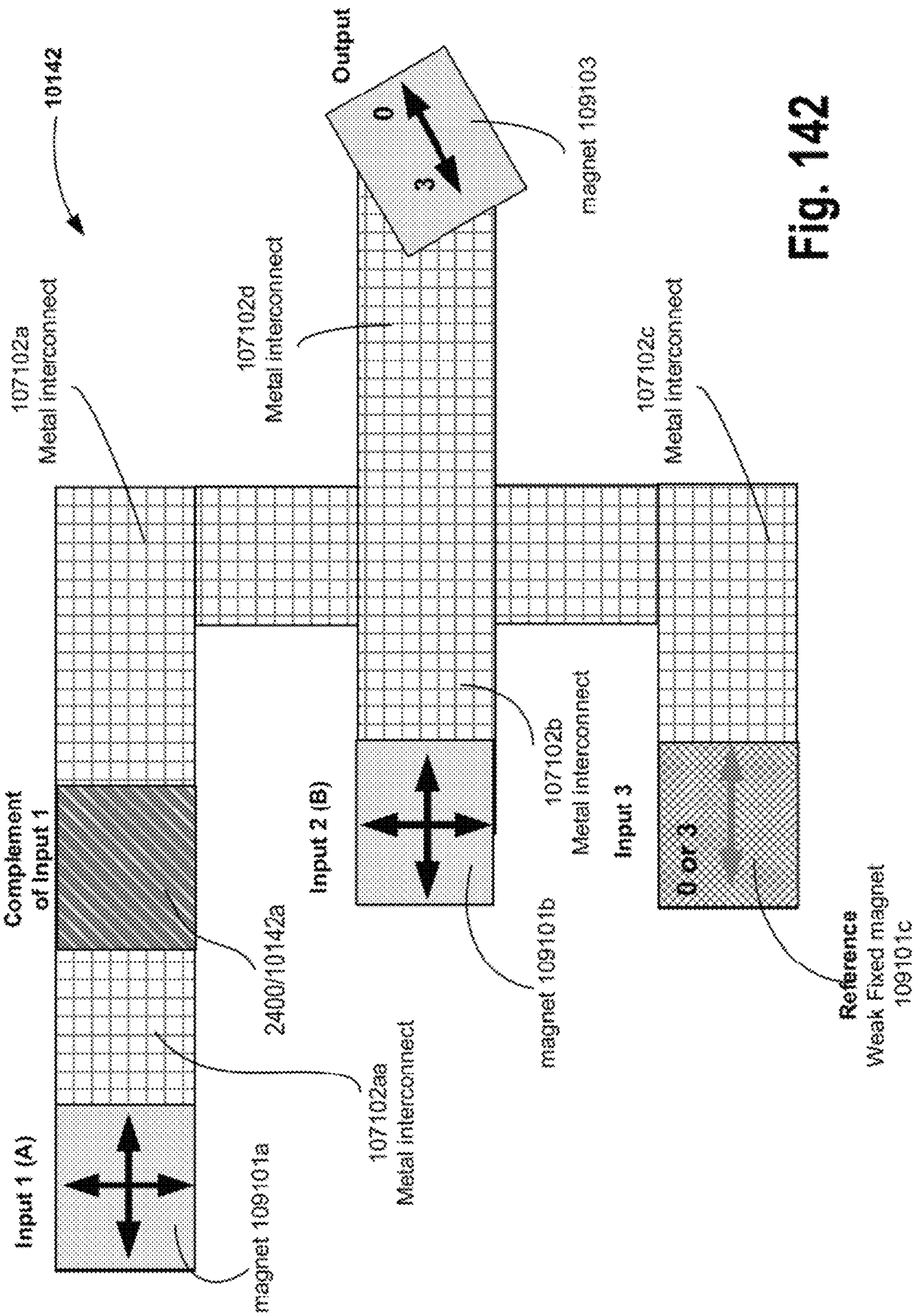
FIG. 142 illustrates a top view of a 3-input quaternary gate with one input being a weak reference fixed magnet, and a quaternary clockwise (cw) cyclic+2 and 1.5-complmenet logic gate associated with the first input of the 2-input quaternary gate, according to some embodiments of the disclosure.

FIG. 142 illustrates top view 10142 of a 3-input quaternary gate with one input being a weak reference fixed magnet, and in inverter, or equivalently, complement logic gate associated with the first input of the 2-input quaternary gate, according to some embodiments of the disclosure. It is pointed out that those elements of FIG. 142 having the same reference numbers (or names) as the elements of any other figure can operate or function in any manner similar to that described, but are not limited to such.

FIG. 142 is similar to FIG. 107 except that a complement gate 2400/10142*a* is used to complement input 1 (A), and the output interconnect 206*c* of complement gate 2400/10142*a* is coupled to metal interconnect 107102*a*, according to some embodiments. In this embodiment, the input interconnect 206*a* of complement gate 2400/10142*a* is coupled to metal interconnect 107102*aa* which is also coupled to magnet 109101*a*. Embodiments of a complement gate are described with reference to FIG. 24. In some embodiments, by selecting the reference magnet 109101*c* to have magnetization in direction '3', the 3-input quaternary gate of FIG. 142 functions as a lower threshold gate. In some embodiments, by selecting the reference magnet 109101*c* to have magnetization in direction '0', the 3-input quaternary gate of FIG. 142 functions as an upper threshold gate.

3-Input Quaternary Lower Threshold Gate

Figure 143:
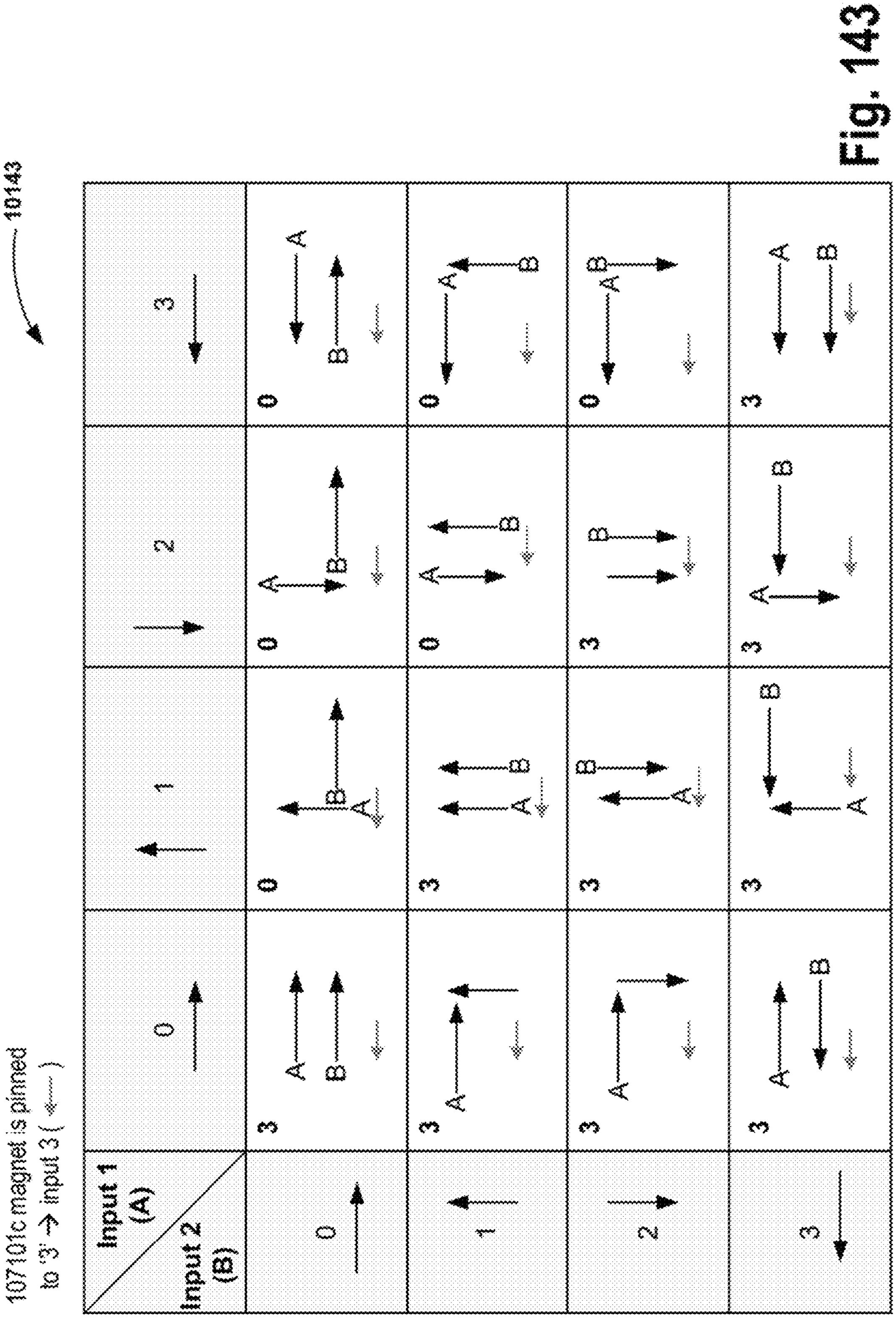
FIG. 143 illustrates a truth table of the 3-input quaternary gate of FIG. 142 when the weak reference fixed magnet has a magnetization along the −x-direction (i.e., in direction '3'), according to some embodiments of the disclosure.

FIG. 143 illustrates truth table 10143 of the 3-input quaternary gate of FIG. 142 when the weak reference fixed magnet has a magnetization along the −x-direction (i.e., in direction '3'), according to some embodiments of the disclosure. It is pointed out that those elements of FIG. 143 having the same reference numbers (or names) as the elements of any other figure can operate or function in any manner similar to that described, but are not limited to such.

The top first row of truth table 10143 lists the four possible magnetizations for first input magnet 107101*a* (e.g., Input 1 (A)). The left most column of truth table 10143 lists the four possible magnetizations for second input magnet 107101*b* (e.g., Input 2 (B)). The input magnetization conditions are shown in the shaded boxes. The other remaining boxes illustrate the output magnetization of magnet 107103 in the top left corner of each box according to the magnetizations of the first and second input magnets 107101*a/b*. A person skilled in the art would appreciate that the truth table of FIG. 143 is that of a lower threshold gate.

FIGS. 144-159 illustrates 3-input quaternary gates 10144, 10145, 10146, 10147, 10148, 10149, 10150, 10151, 10152, 10153, 10154, 10155, 10156, 10157, 10158, and 10159, respectively, implementing the truth table of FIG. 143, according to some embodiments of the disclosure. It is pointed out that those elements of FIGS. 144-159 having the same reference numbers (or names) as the elements of any other figure can operate or function in any manner similar to that described, but are not limited to such.

Figure 144:
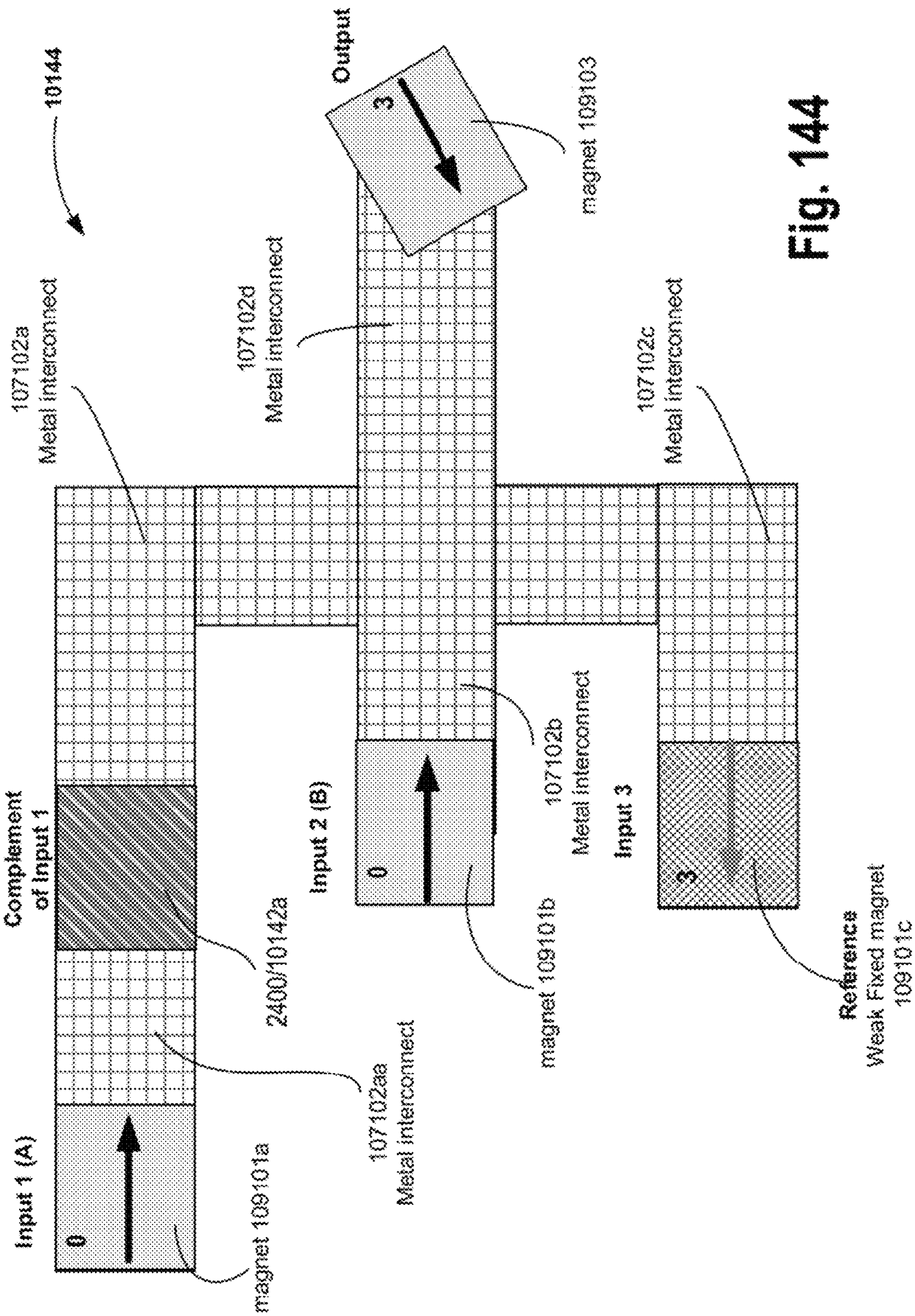
FIGS. 144-159 illustrates 3-input quaternary gates implementing the truth table of FIG. 143, according to some embodiments of the disclosure.

FIG. 144 illustrates the case when first input magnet 109101*a* (same as 107101*a*) has magnetization along +x direction (i.e., direction '0'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 144, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 145:
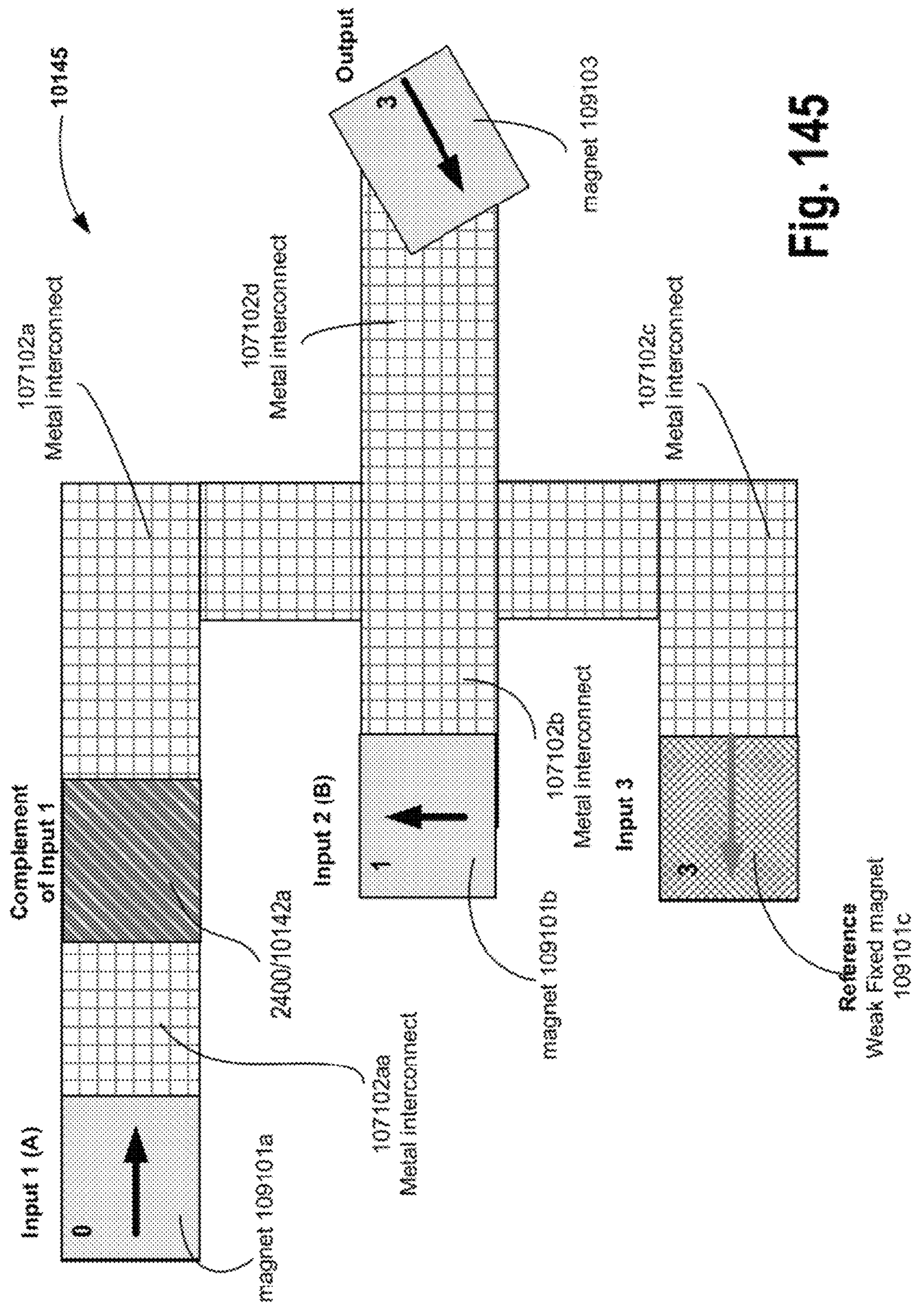

FIG. 145 illustrates the case when first input magnet 109101*a* (same as 107101*a*) has magnetization along +x direction (i.e., direction '0'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 145, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 146:
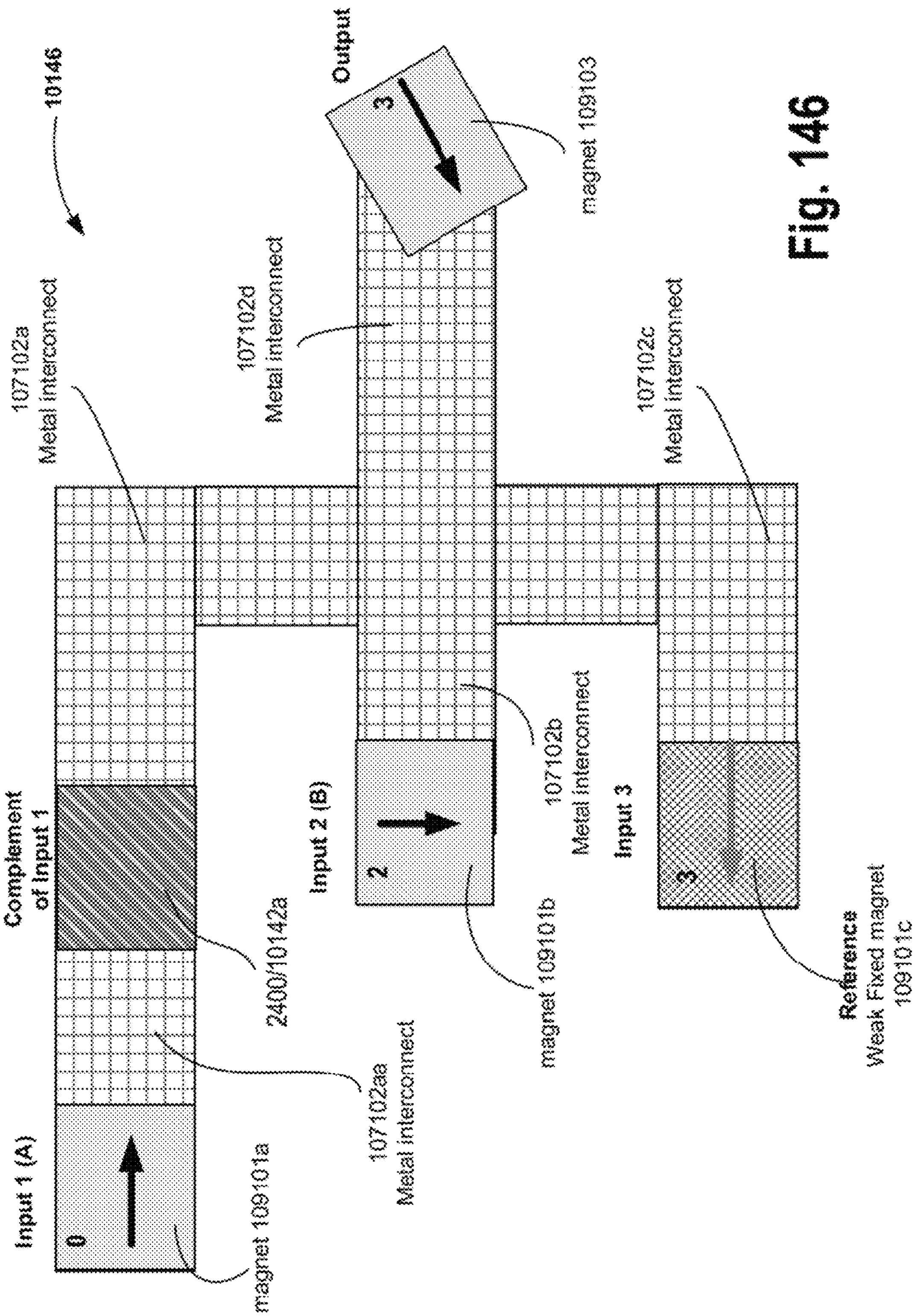

FIG. 146 illustrates the case when first input magnet 109101*a* (same as 107101*a*) has magnetization along +0 direction (i.e., direction '0'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 146, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 147:
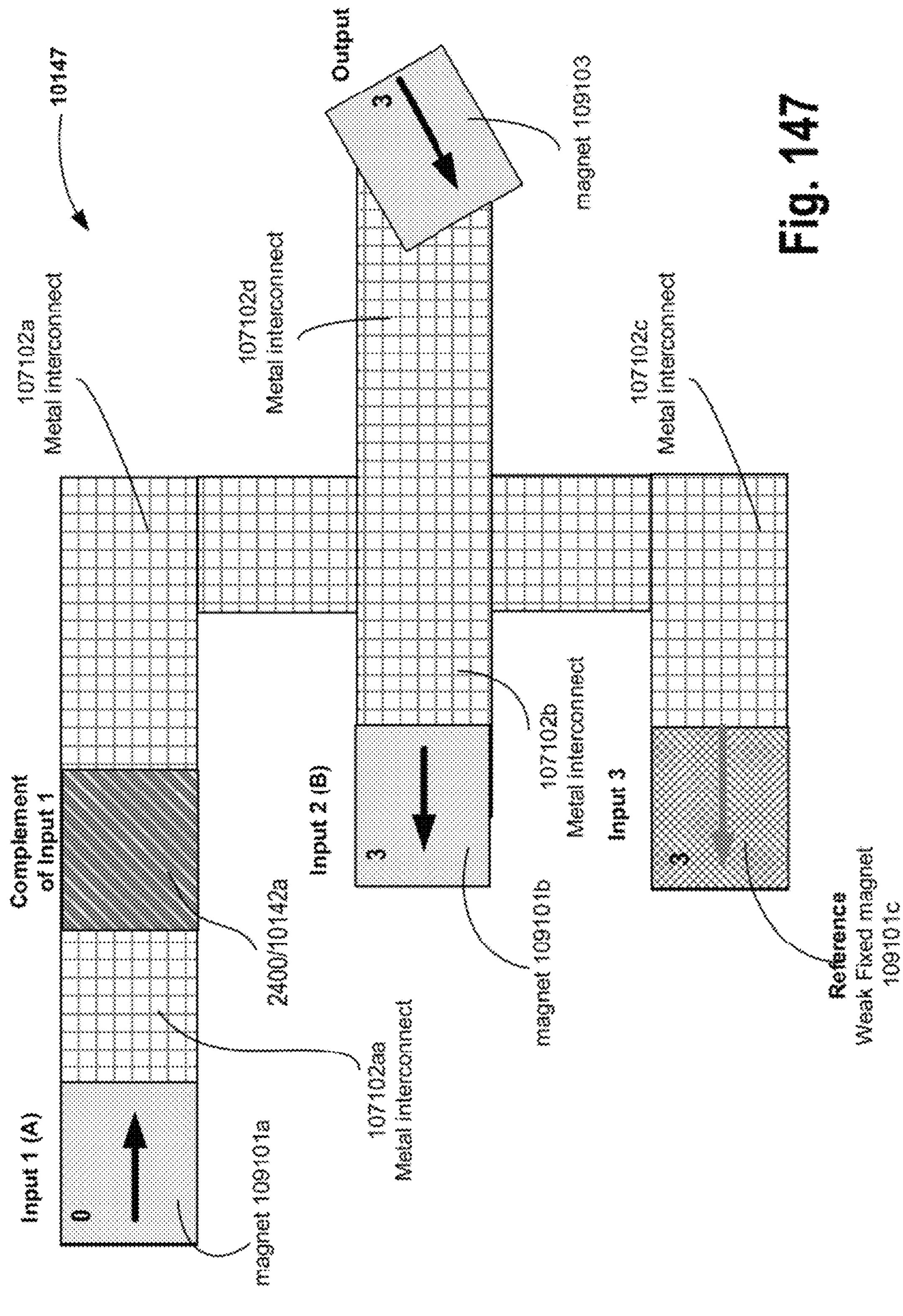

FIG. 147 illustrates the case when first input magnet 109101*a* (same as 107101*a*) has magnetization along +x direction (i.e., direction '0'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 147, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 148:
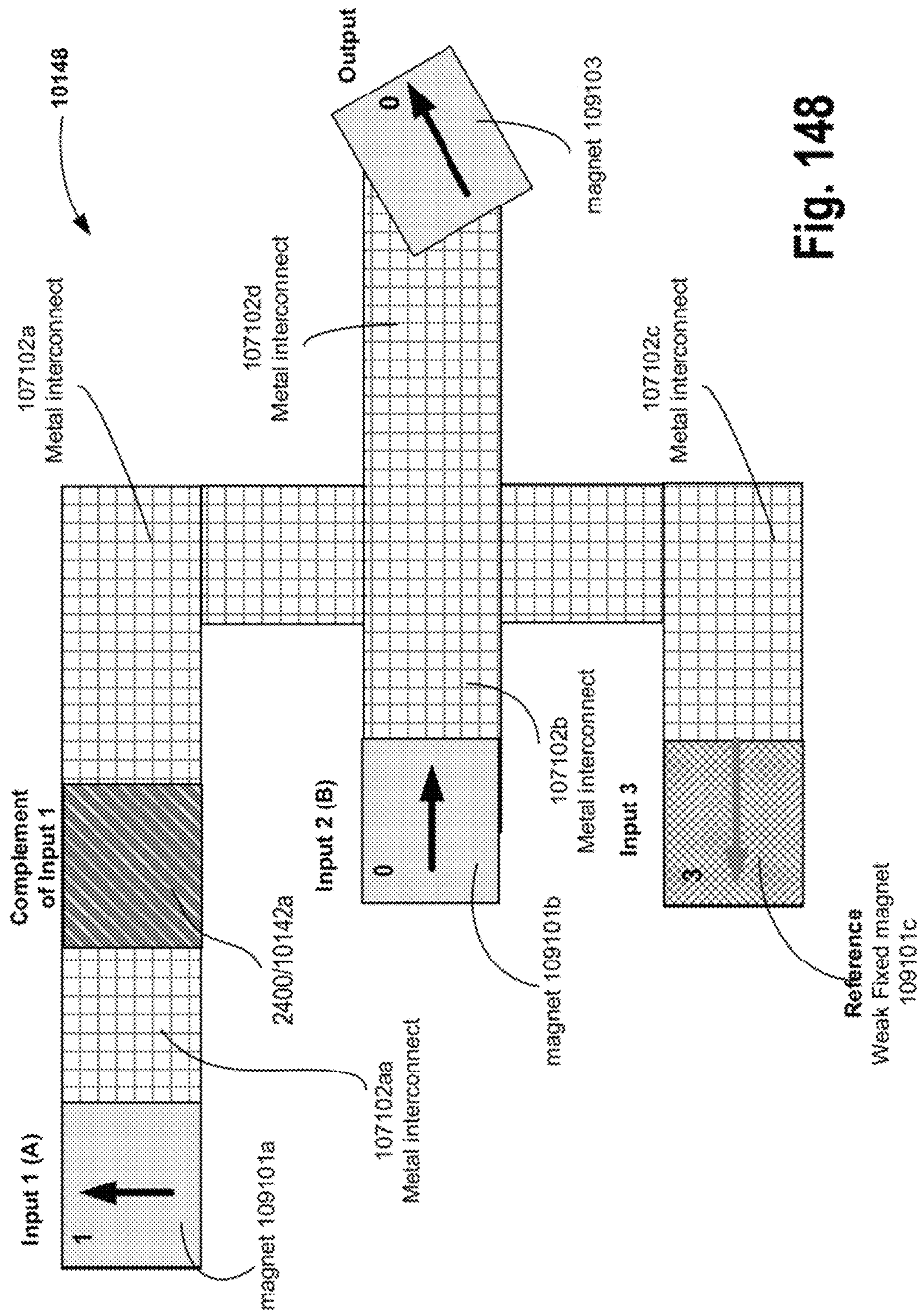

FIG. 148 illustrates the case when first input magnet 109101*a* (same as 107101*a*) has magnetization along +y direction (i.e., direction '1'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 148, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 149:
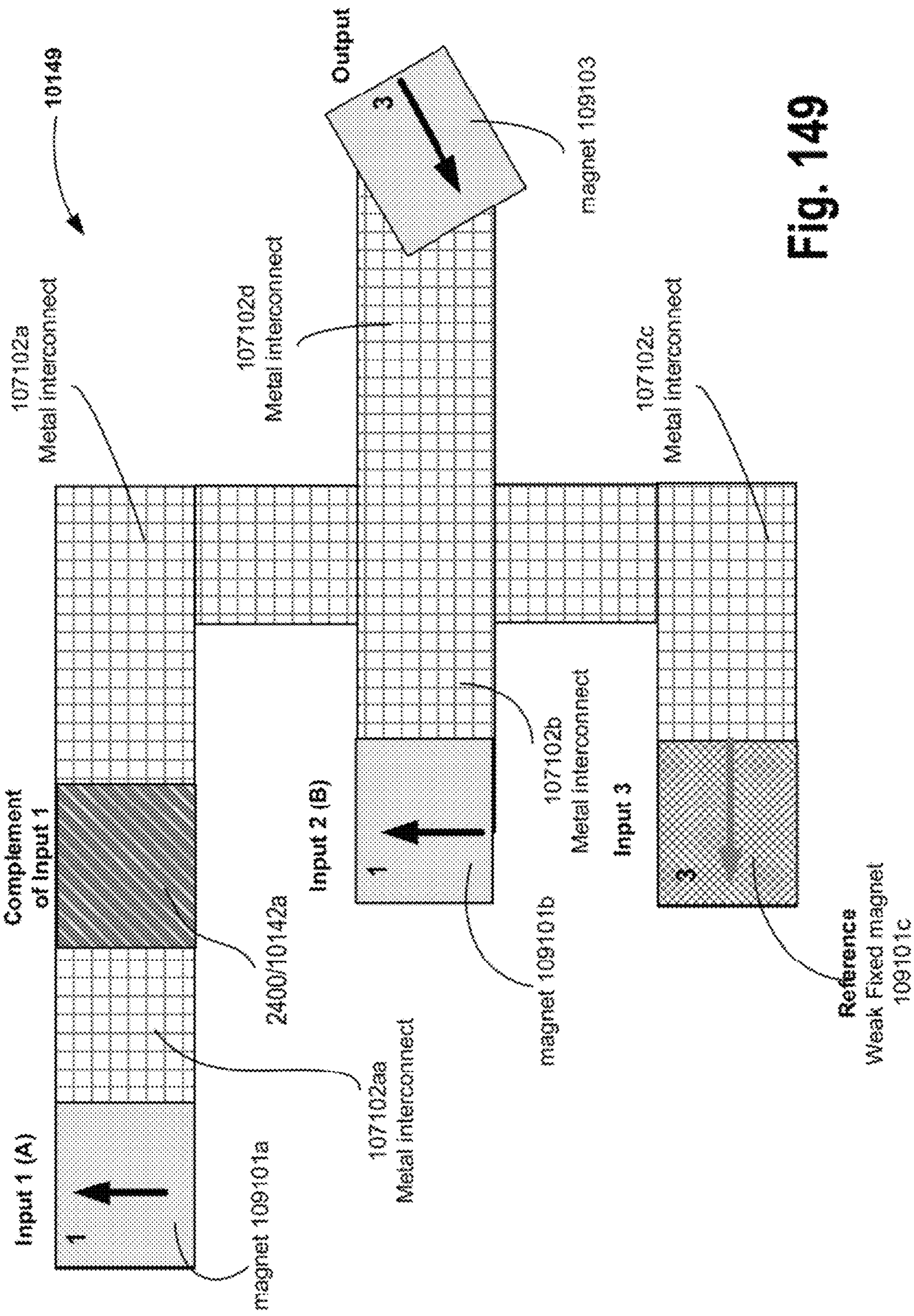

FIG. 149 illustrates the case when first input magnet 109101*a* (same as 107101*a*) has magnetization along +y direction (i.e., direction '1'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 149, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 150:
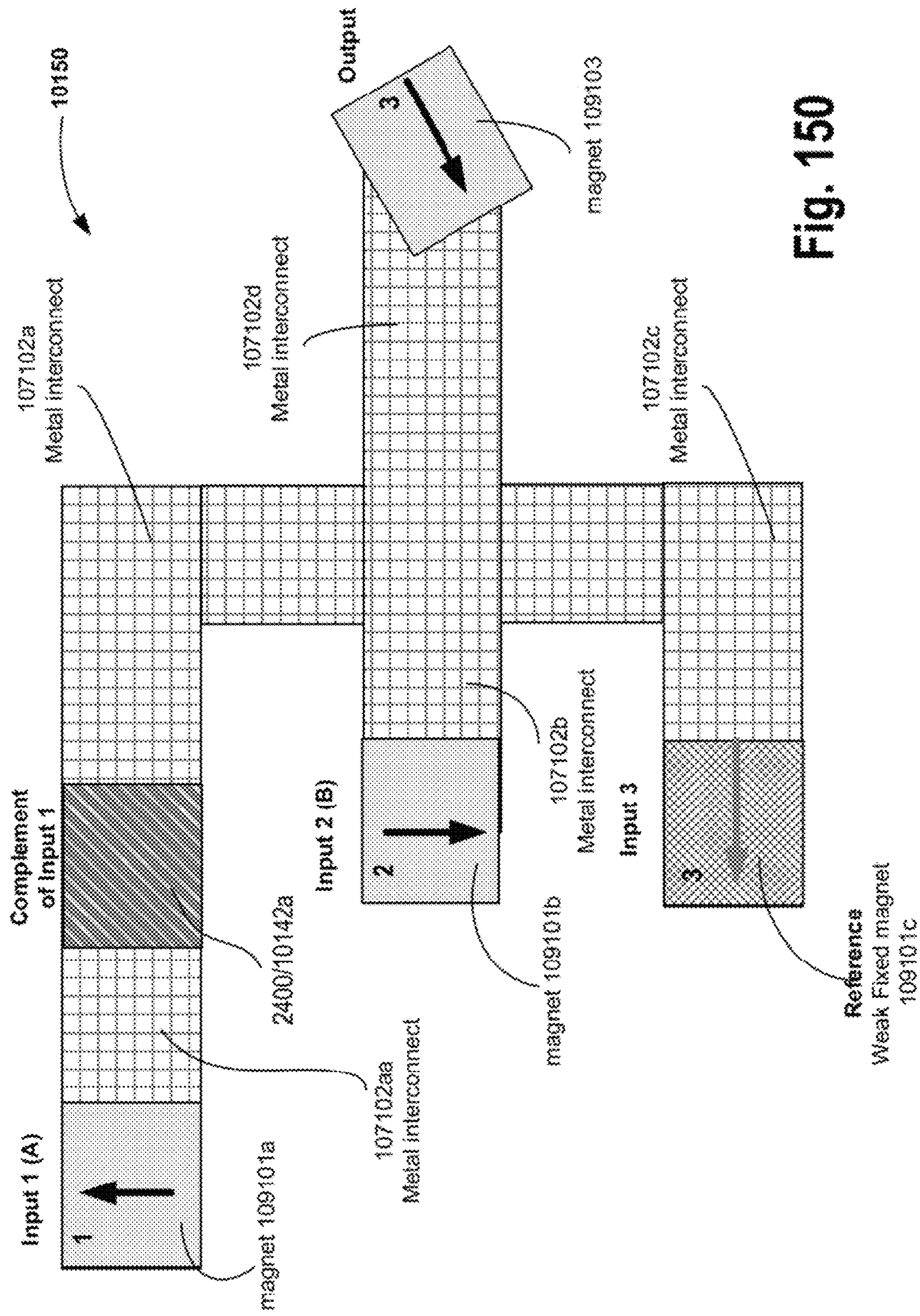

FIG. 150 illustrates the case when first input magnet 109101*a* (same as 107101*a*) has magnetization along +y direction (i.e., direction '1'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 150, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 151:
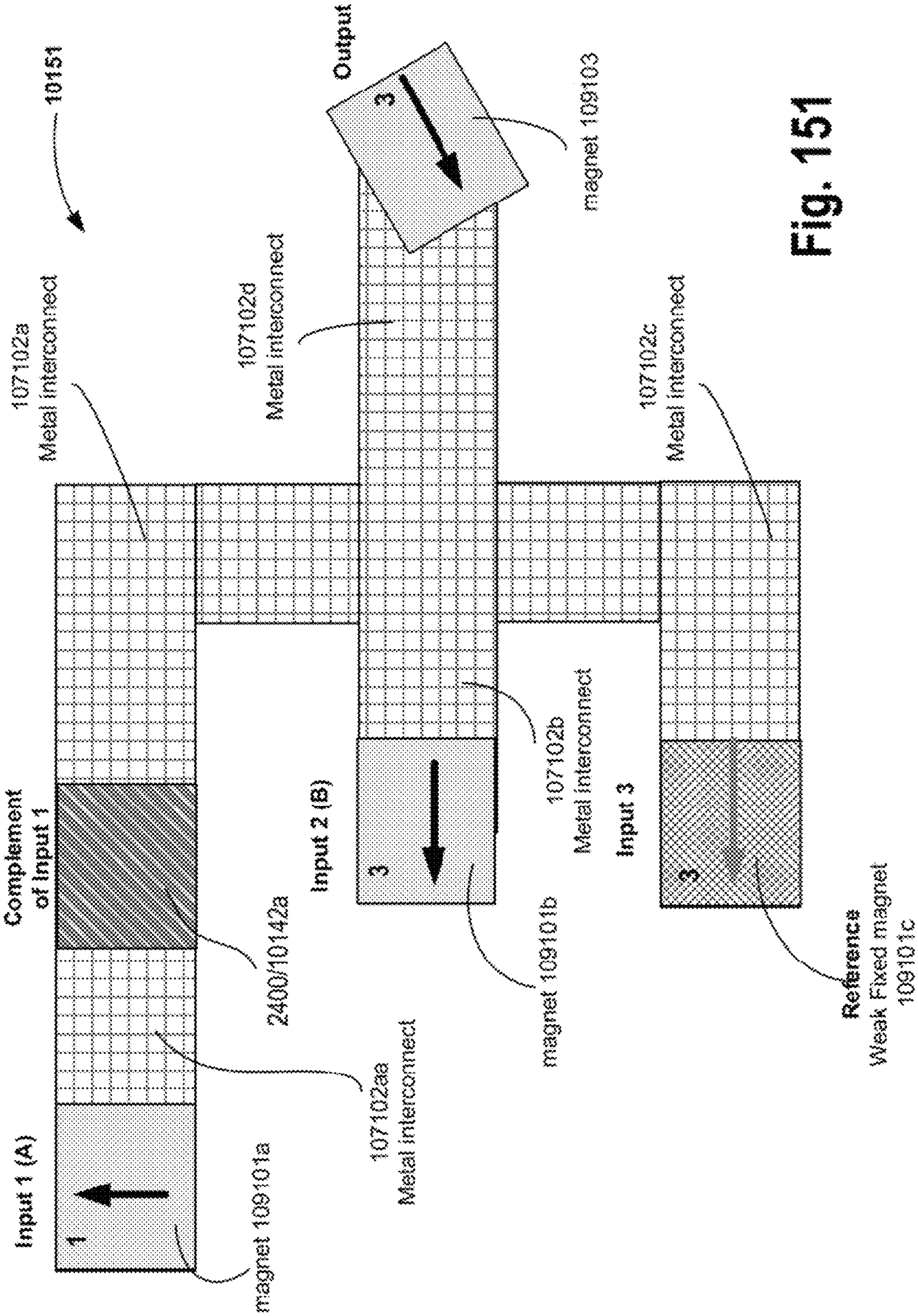

FIG. 151 illustrates the case when first input magnet 109101*a* (same as 107101*a*) has magnetization along +y direction (i.e., direction '1'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 151, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 152:
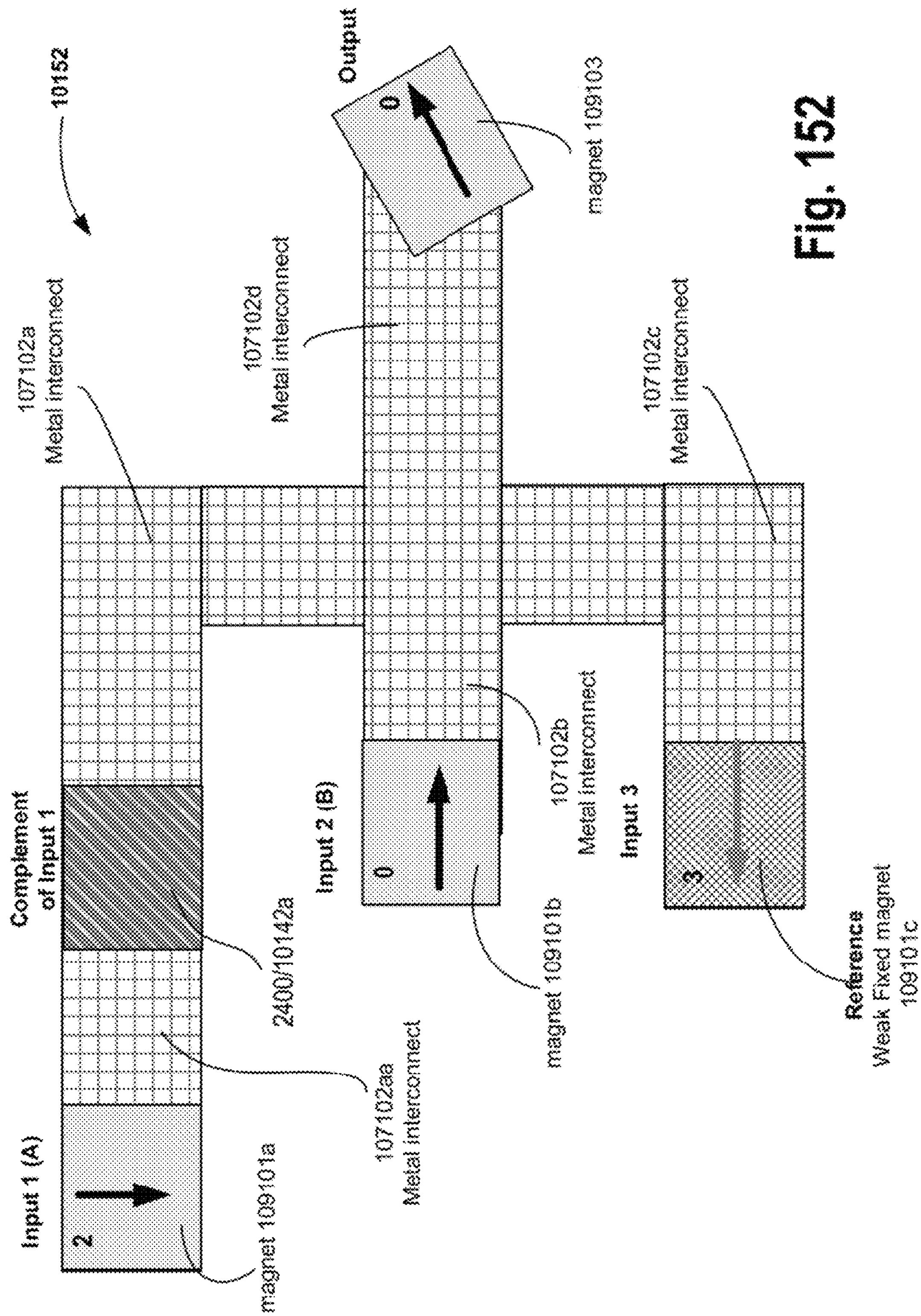

FIG. 152 illustrates the case when first input magnet 109101*a* (same as 107101*a*) has magnetization along −y direction (i.e., direction '2'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 152, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 153:
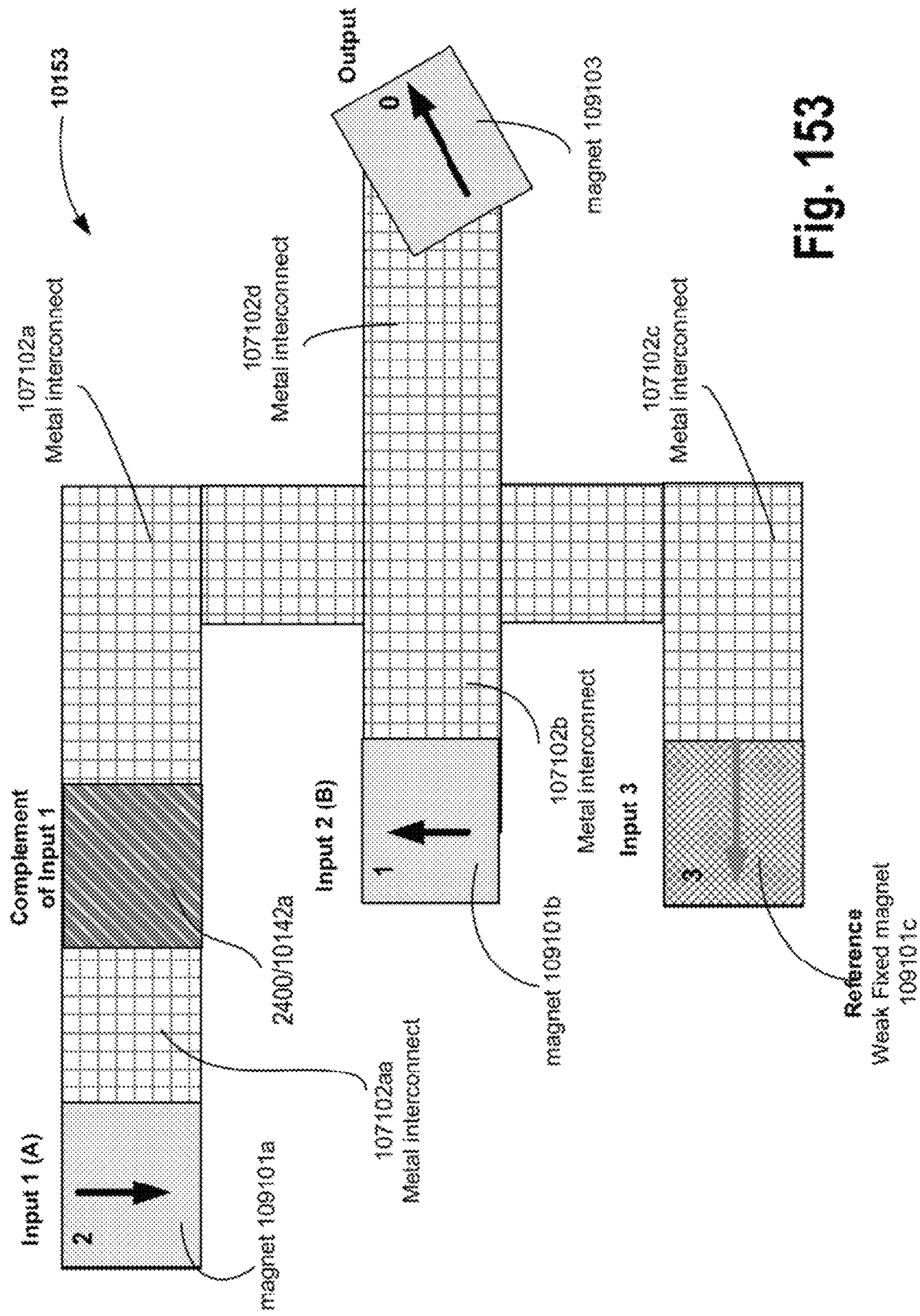

FIG. 153 illustrates the case when first input magnet 109101*a* (same as 107101*a*) has magnetization along −y direction (i.e., direction '2'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 153, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 154:
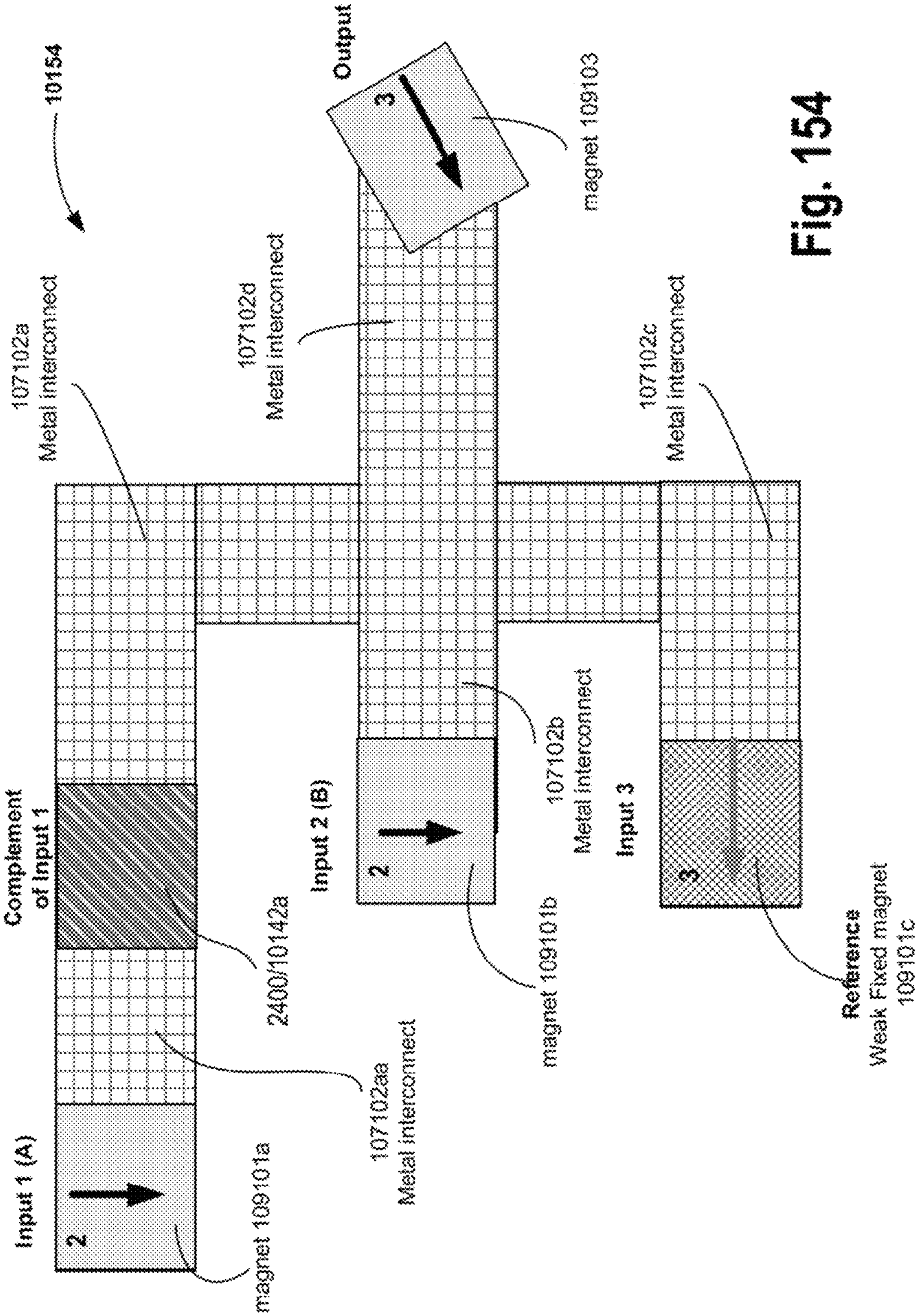

FIG. 154 illustrates the case when first input magnet 109101*a* (same as 107101*a*) has magnetization along −y direction (i.e., direction '2'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 154, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 155:
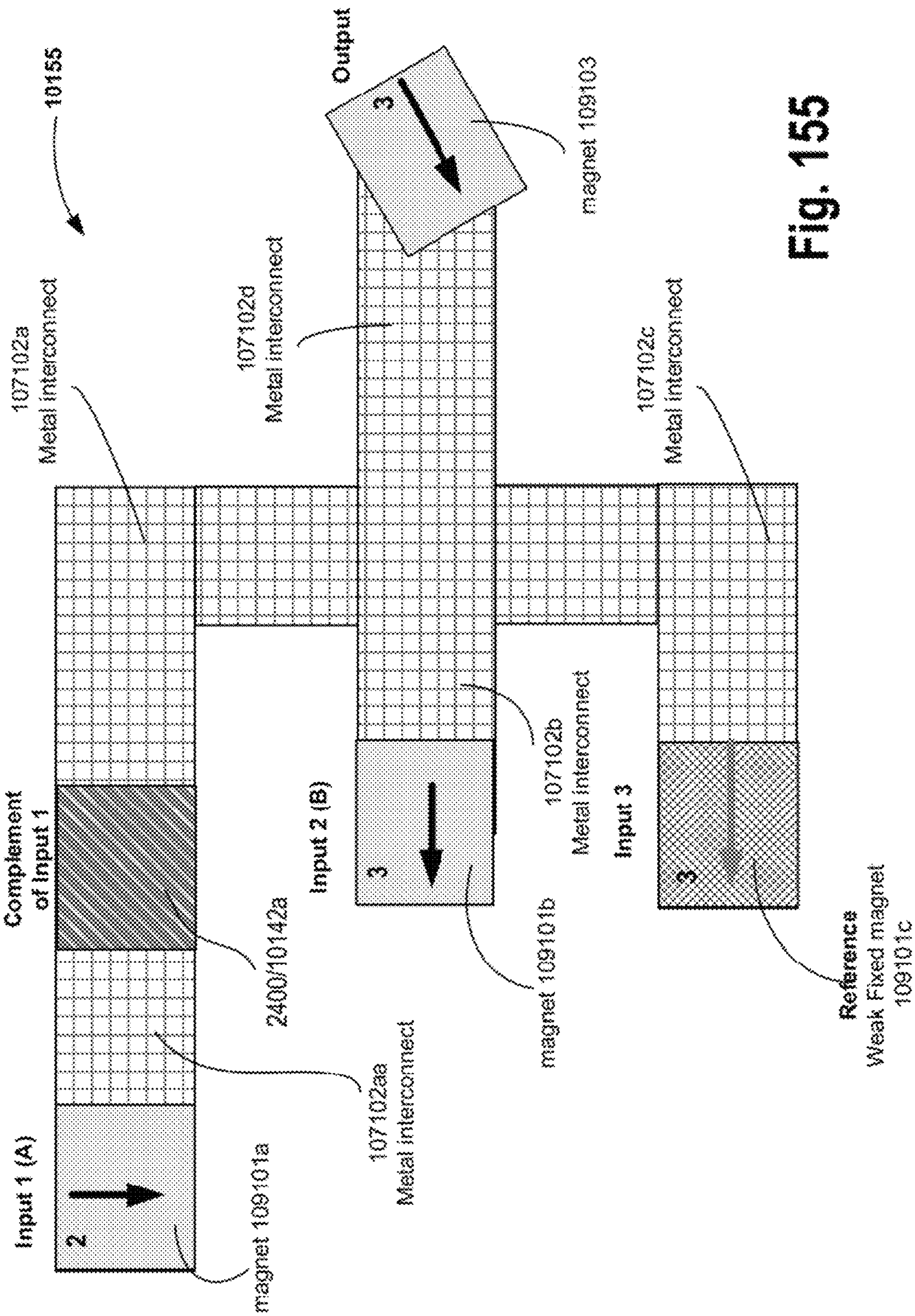

FIG. 155 illustrates the case when first input magnet 109101*a* (same as 107101*a*) has magnetization along −y direction (i.e., direction '2'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 155, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 156:
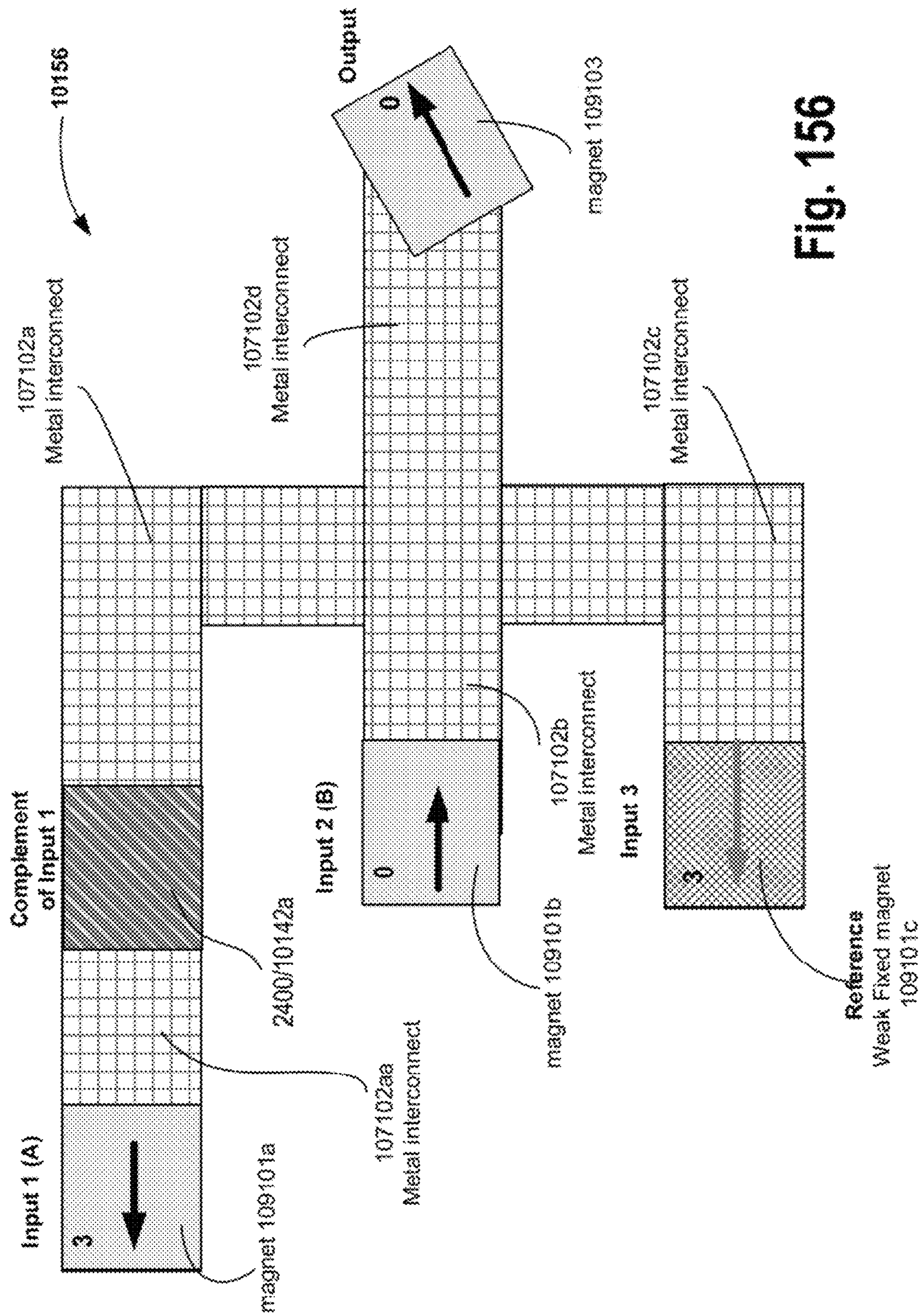

FIG. 156 illustrates the case when first input magnet 109101*a* (same as 107101*a*) has magnetization along −x direction (i.e., direction '3'), second input magnet 109101*b* (same as 107101*b*) has magnetization along +x direction (i.e., direction '0'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 156, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 157:
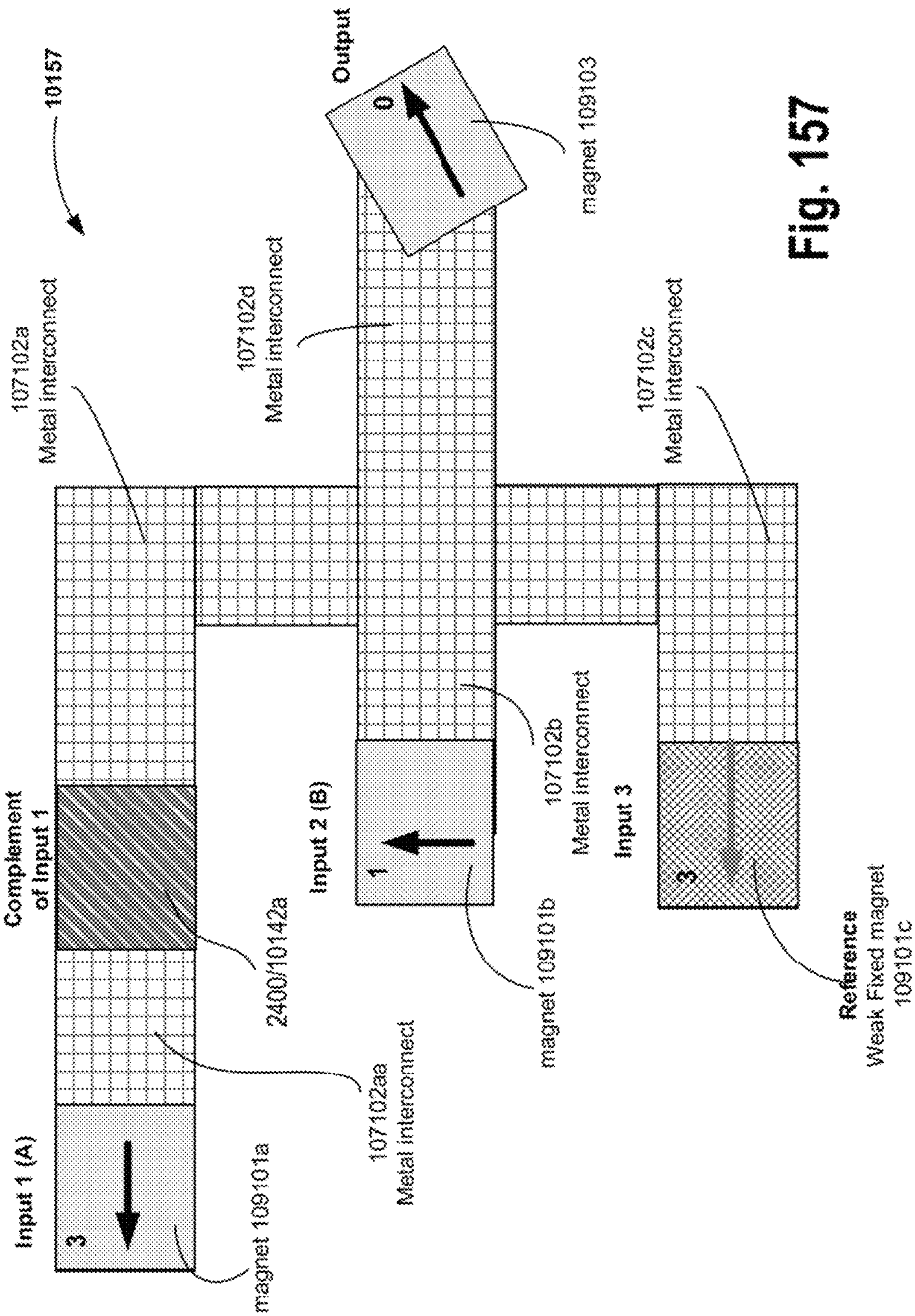

FIG. 157 illustrates the case when first input magnet 109101*a* (same as 107101*a*) has magnetization along −x direction (i.e., direction '3'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 157, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 158:
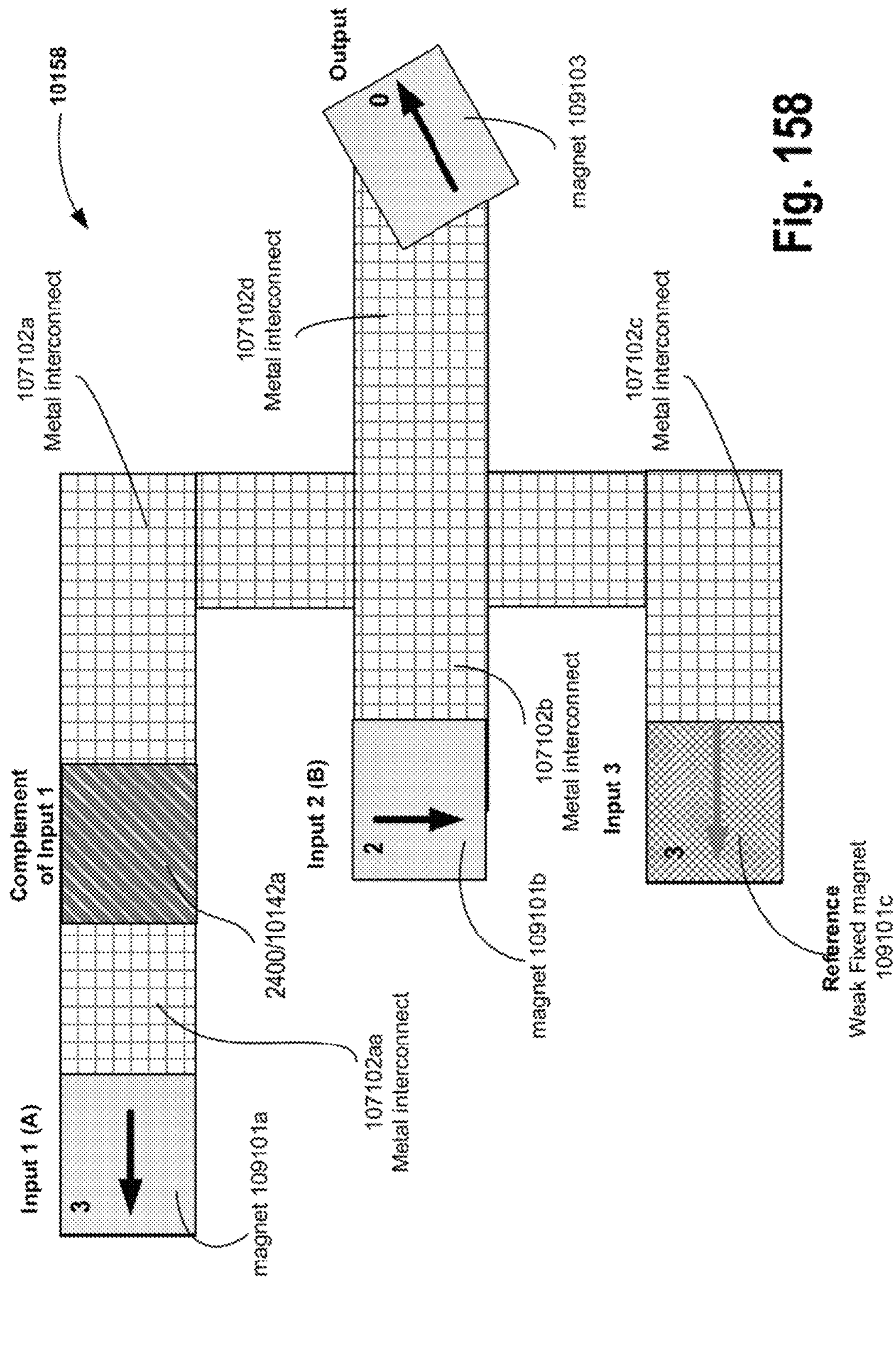

FIG. 158 illustrates the case when first input magnet 109101*a* (same as 107101*a*) has magnetization along −x direction (i.e., direction '3'), second input magnet 109101*b* (same as 107101*b*) has magnetization along −y direction (i.e., direction '2'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 157, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 159:
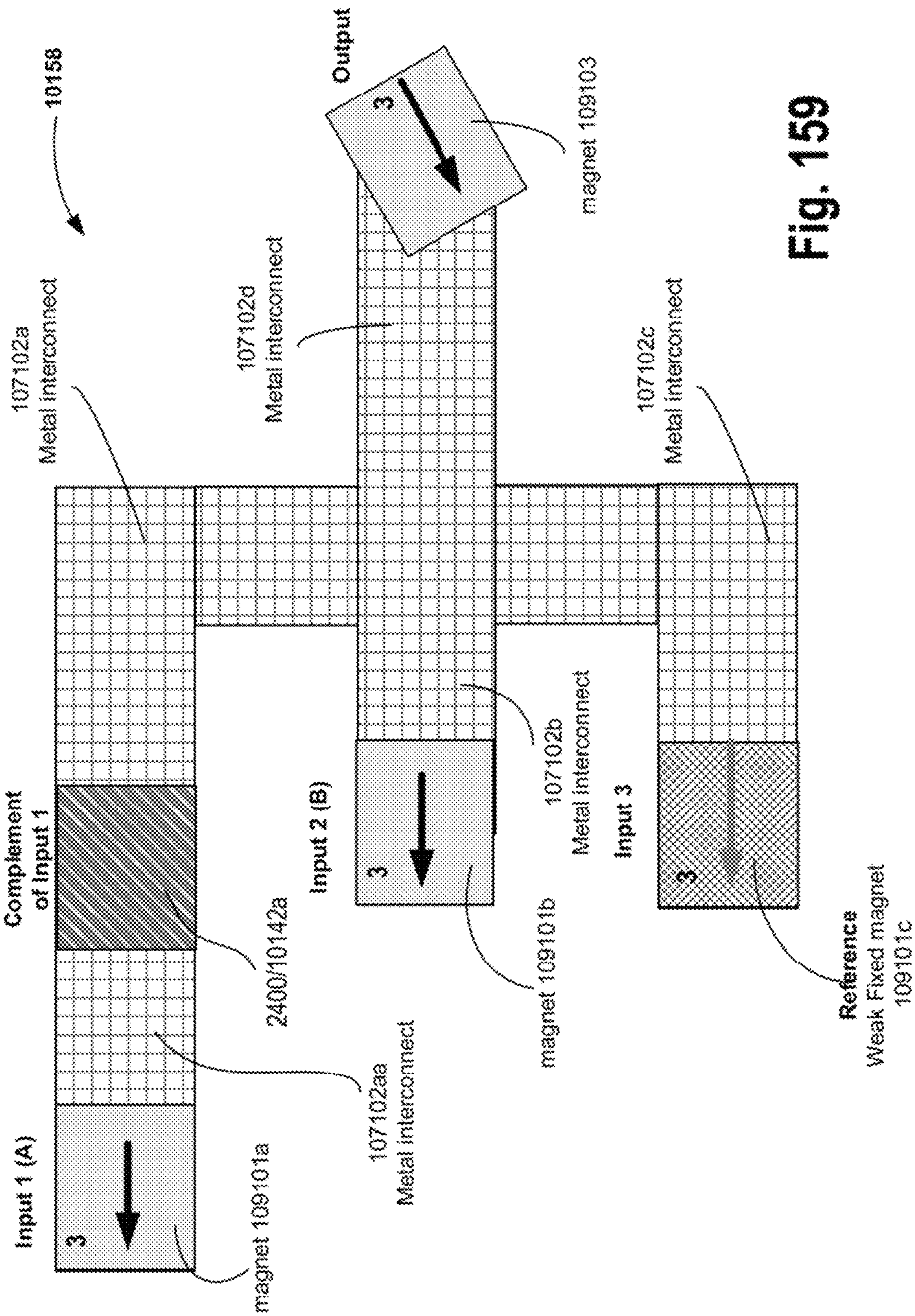

FIG. 159 illustrates the case when first input magnet 109101*a* (same as 107101*a*) has magnetization along −x direction (i.e., direction '3'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 159, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

3-Input Quaternary Upper Threshold Gate

Figure 160:
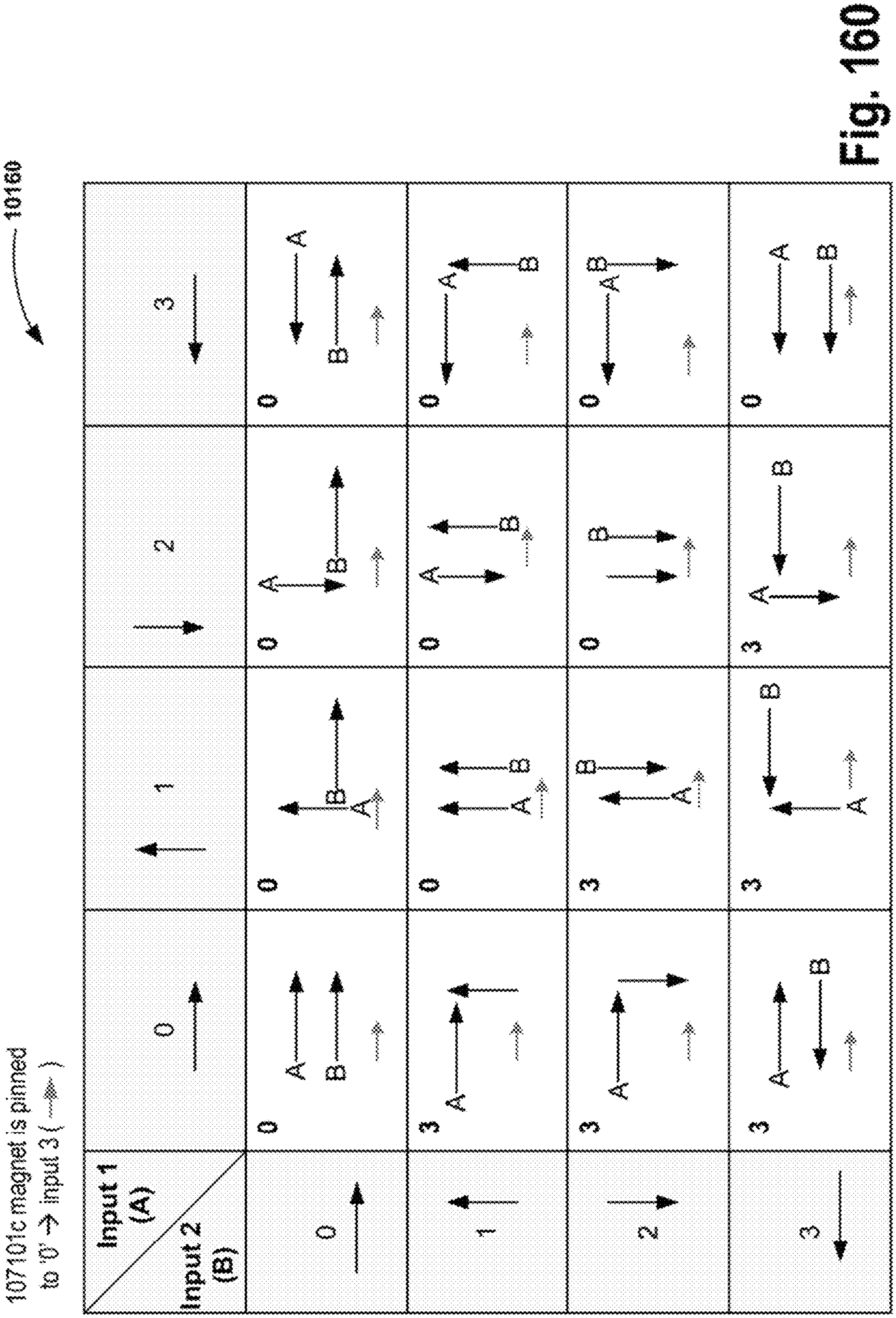
FIG. 160 illustrates a truth table of the 3-input quaternary gate of FIG. 142 when the weak reference fixed magnet has a magnetization along the +x-direction (i.e., in direction '0'), according to some embodiments of the disclosure.

FIG. 160 illustrates a truth table of the 3-input quaternary gate of FIG. 142 when the weak reference fixed magnet has a magnetization along the +x-direction (i.e., in direction '0'), according to some embodiments of the disclosure. It is pointed out that those elements of FIG. 160 having the same reference numbers (or names) as the elements of any other figure can operate or function in any manner similar to that described, but are not limited to such.

The top first row of truth table 10160 lists the four possible magnetizations for first input magnet 107101*a* (e.g., Input 1 (A)). The left most column of truth table 10143 lists the four possible magnetizations for second input magnet 107101*b* (e.g., Input 2 (B)). The input magnetization conditions are shown in the shaded boxes. The other remaining boxes illustrate the output magnetization of magnet 107103 in the top left corner of each box according to the magnetizations of the first and second input magnets 107101*a/b*. A person skilled in the art would appreciate that the truth table of FIG. 160 is that of an upper threshold gate.

FIGS. 161-177 illustrates 3-input quaternary gates 10161, 10162, 10163, 10164, 10164, 10165, 10166, 10167, 10168, 10169, 10170, 10171, 10172, 10173, 10174, 10175, 10176, and 10177, respectively implementing the truth table of FIG. 143, according to some embodiments of the disclosure.

Figure 161:
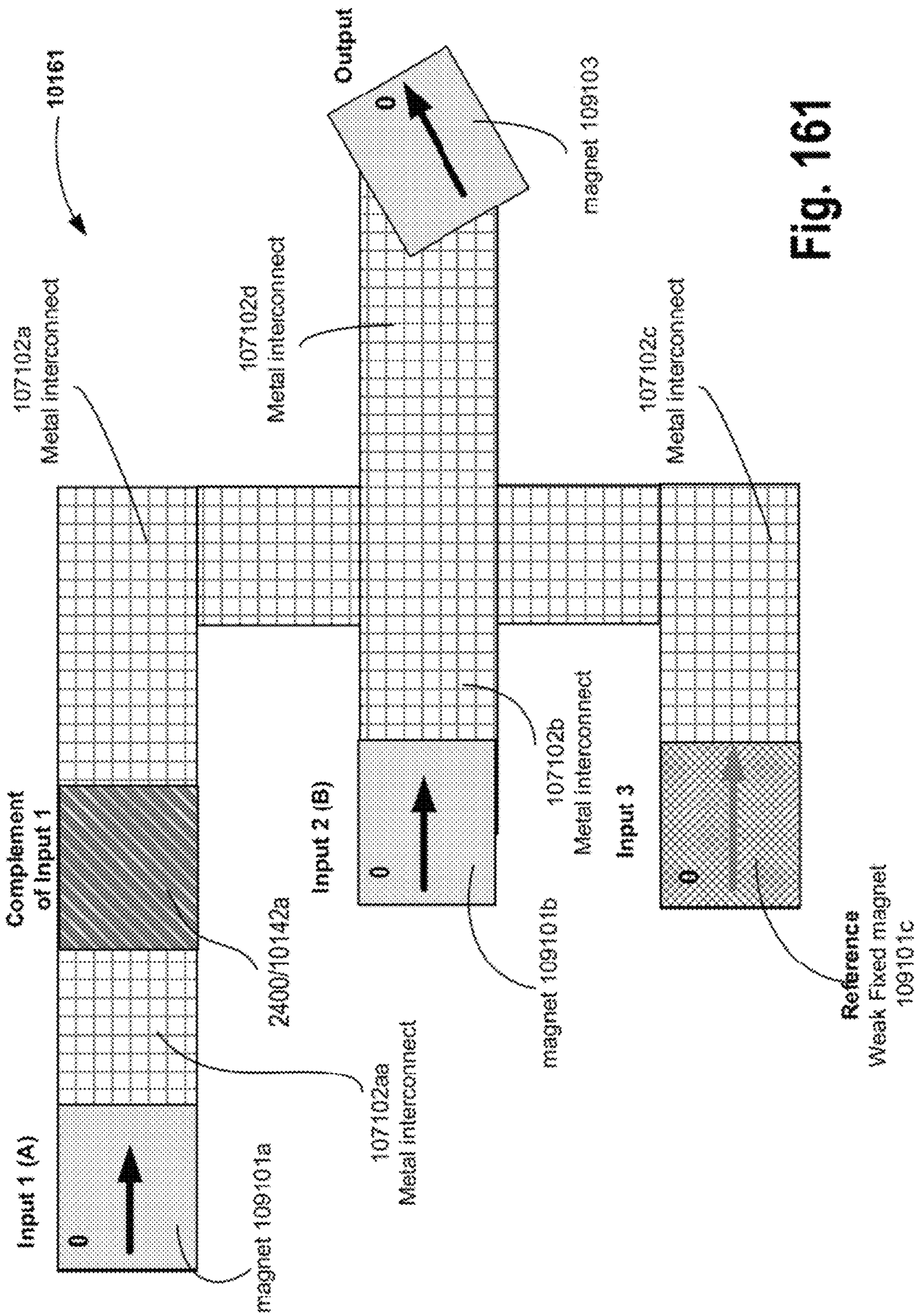
FIGS. 161-176 illustrates 3-input quaternary gates implementing the truth table of FIG. 143, according to some embodiments of the disclosure.

FIG. 161 illustrates the case when first input magnet 109101*a* (same as 107101*a*) has magnetization along +x direction (i.e., direction '0'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 161, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 162:
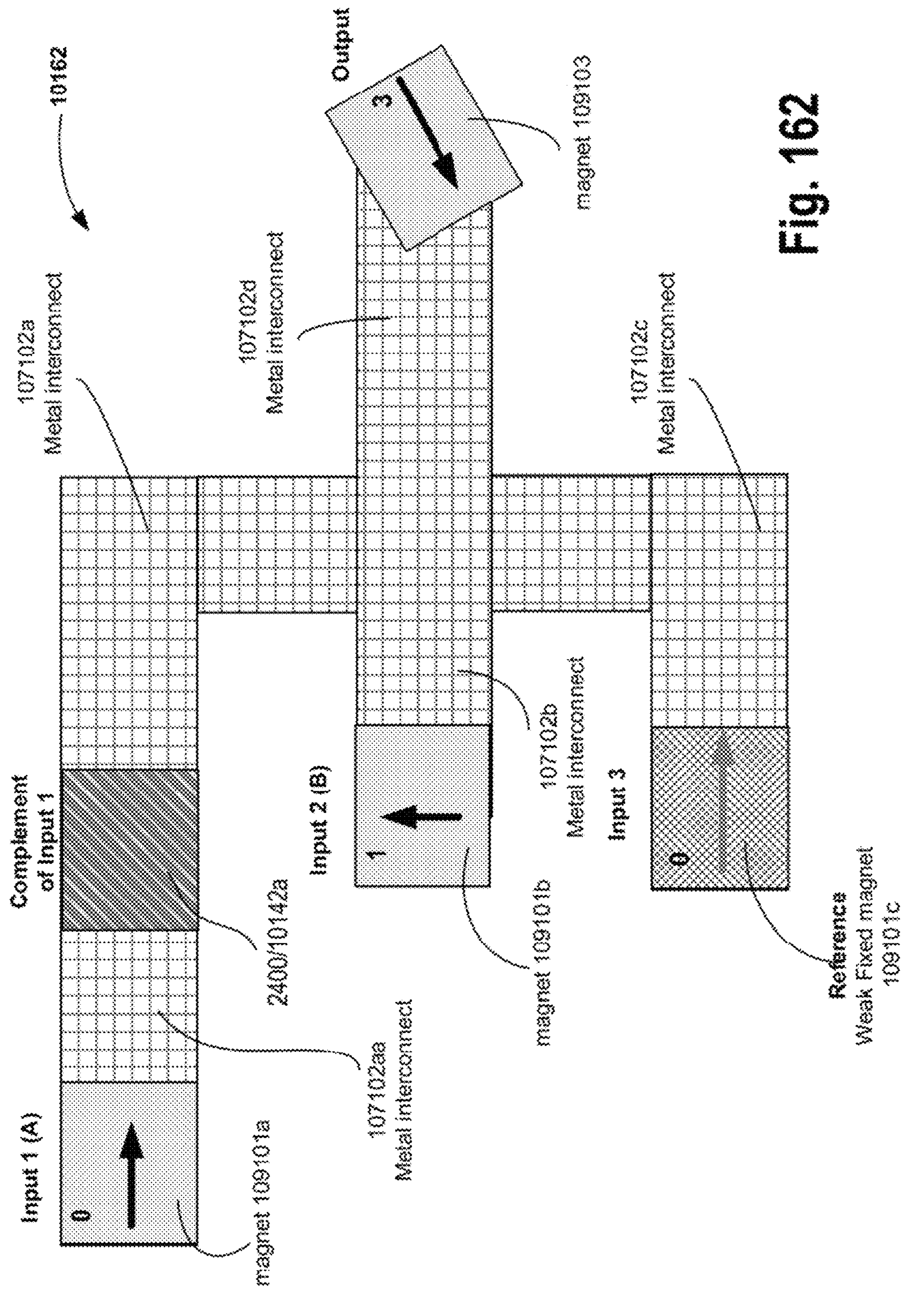

FIG. 162 illustrates the case when first input magnet 109101*a* (same as 107101*a*) has magnetization along +x direction (i.e., direction '0'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 162, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 163:
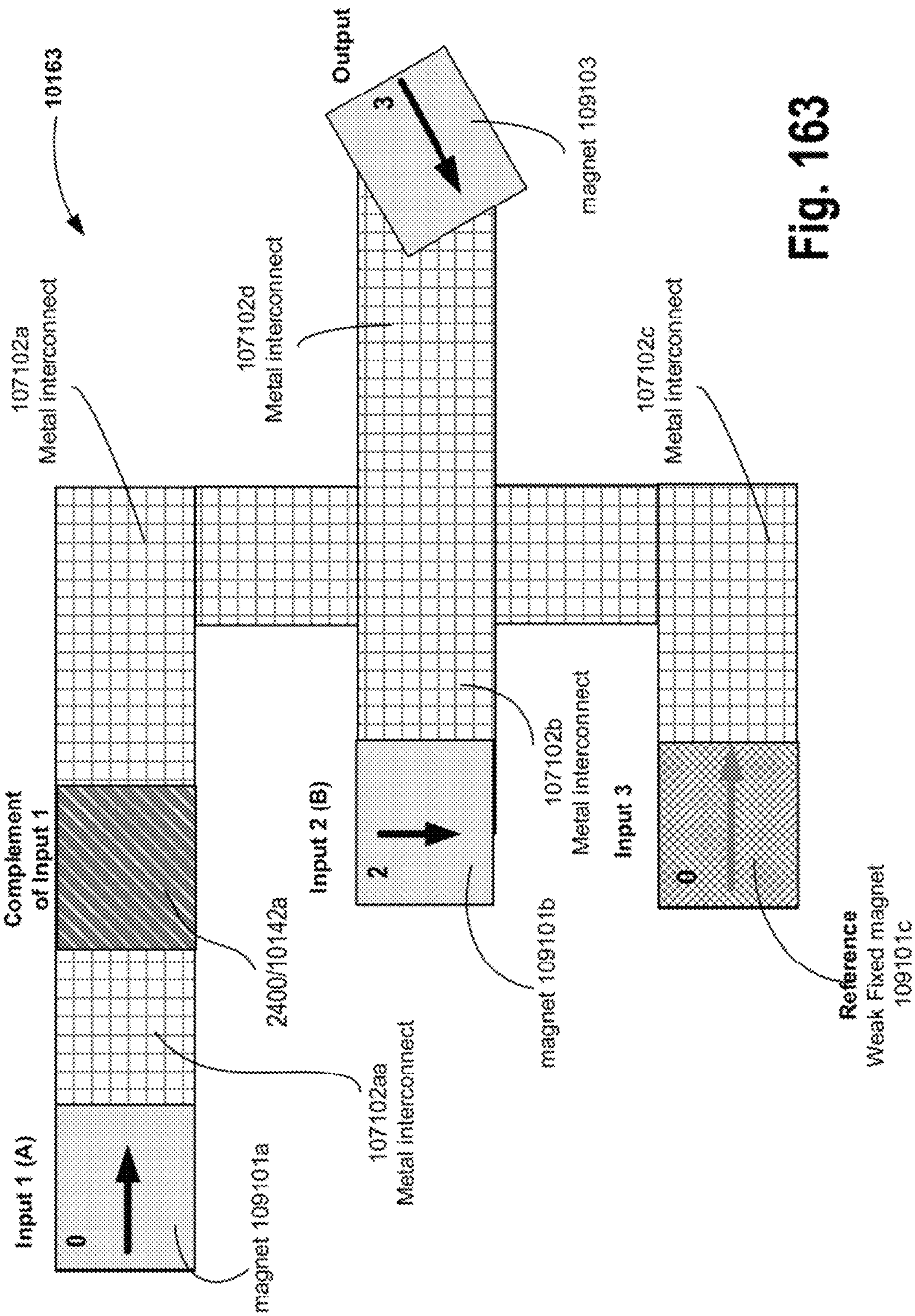

FIG. 163 illustrates the case when first input magnet 109101*a* (same as 107101*a*) has magnetization along +0 direction (i.e., direction '0'), second input magnet 109101*b* (same as 107101*b*) has magnetization along −y direction (i.e., direction '2'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 163, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 164:
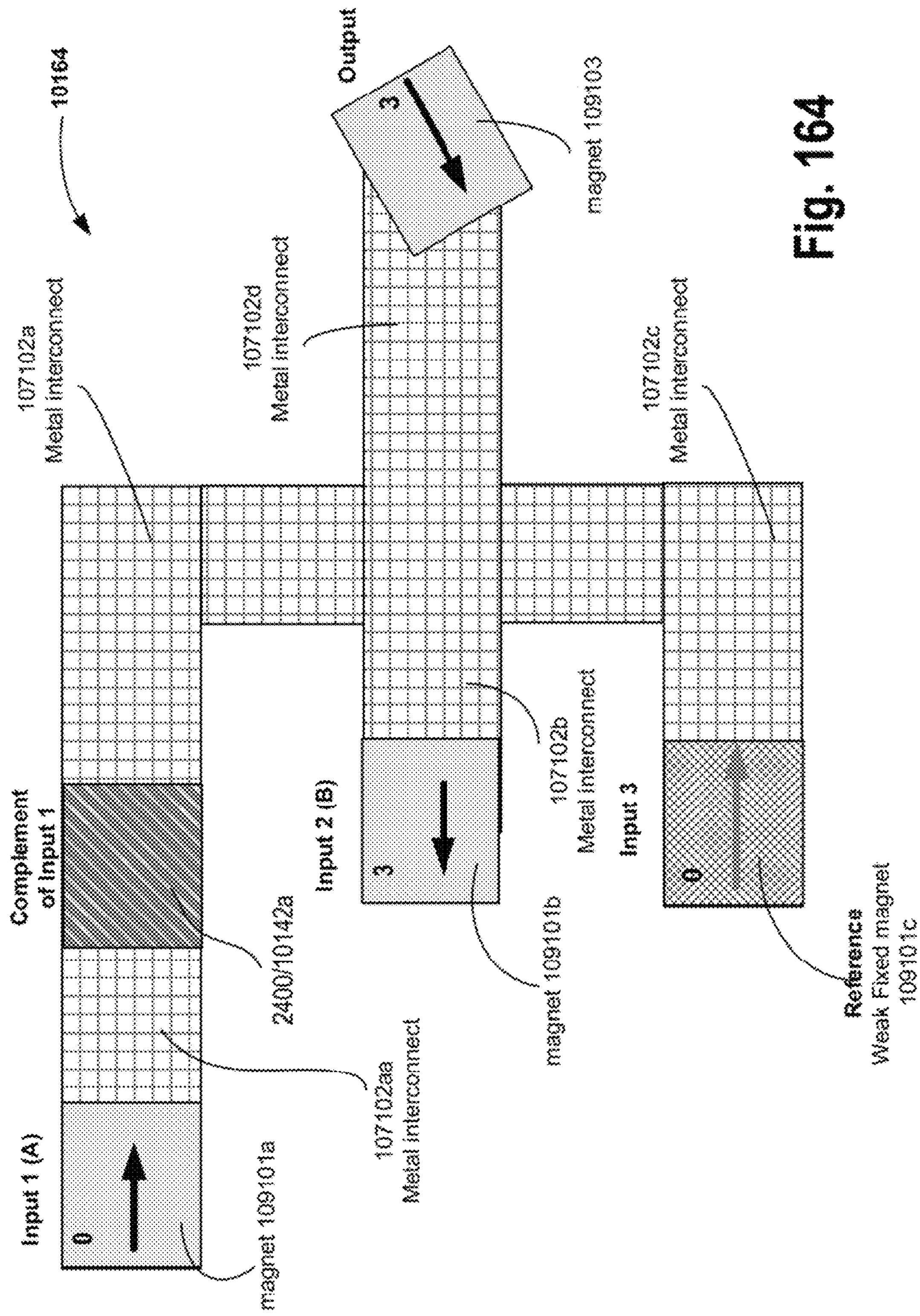

FIG. 164 illustrates the case when first input magnet 109101*a* (same as 107101*a*) has magnetization along +x direction (i.e., direction '0'), second input magnet 109101*b* (same as 107101*b*) has magnetization along −x direction (i.e., direction '3'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 164, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 165:
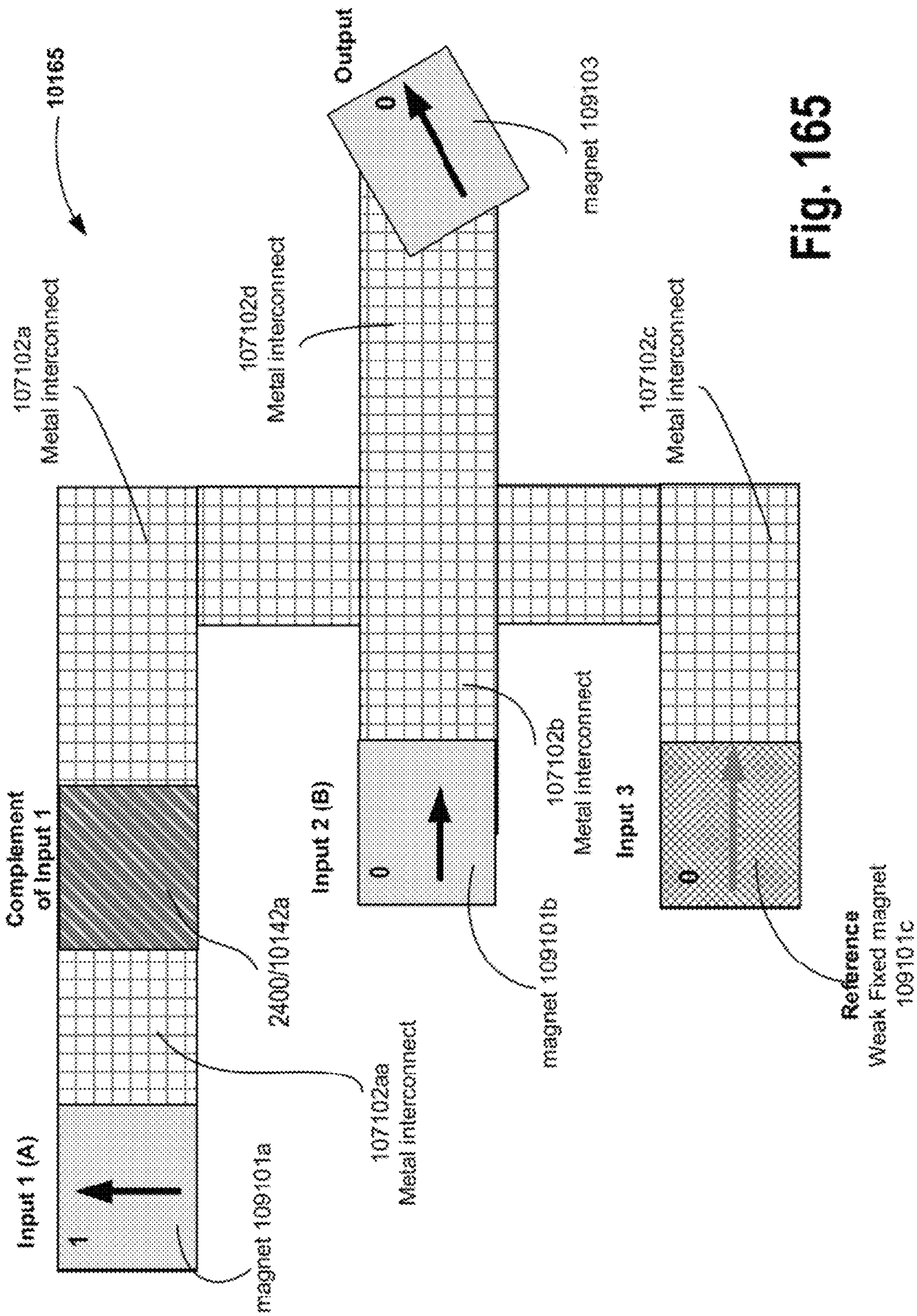

FIG. 165 illustrates the case when first input magnet 109101*a* (same as 107101*a*) has magnetization along +y direction (i.e., direction '1'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 165, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 166:
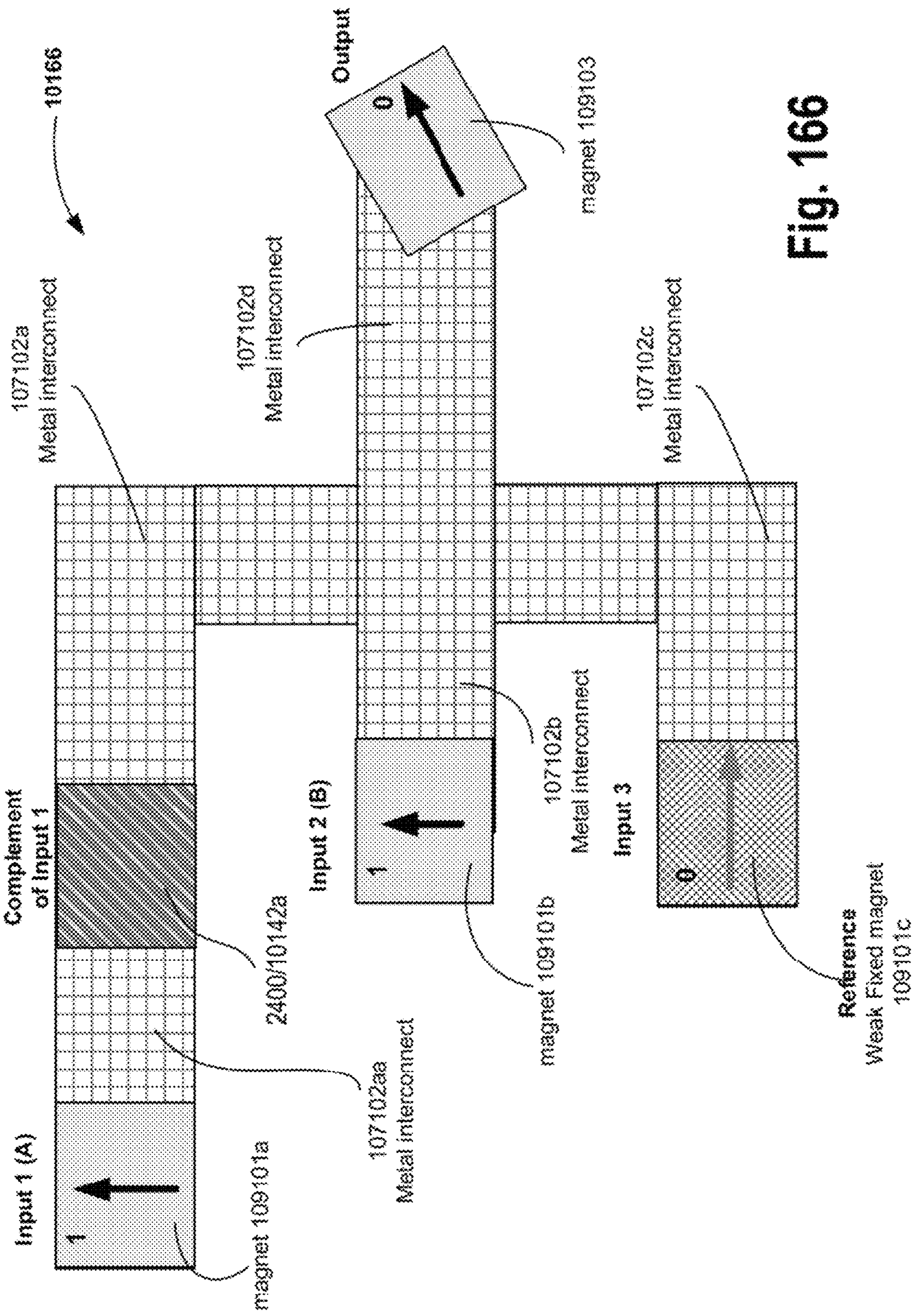

FIG. 166 illustrates the case when first input magnet 109101*a* (same as 107101*a*) has magnetization along +y direction (i.e., direction '1'), second input magnet 109101*b* (same as 107101*b*) has magnetization along +y direction (i.e., direction '1'), third input fixed magnet 109101*c* (same as 109101*c*) has fixed but relatively weak magnetization along −x direction (i.e., direction '3'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 166, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction 03' for tilted output magnet 109103.

Figure 167:
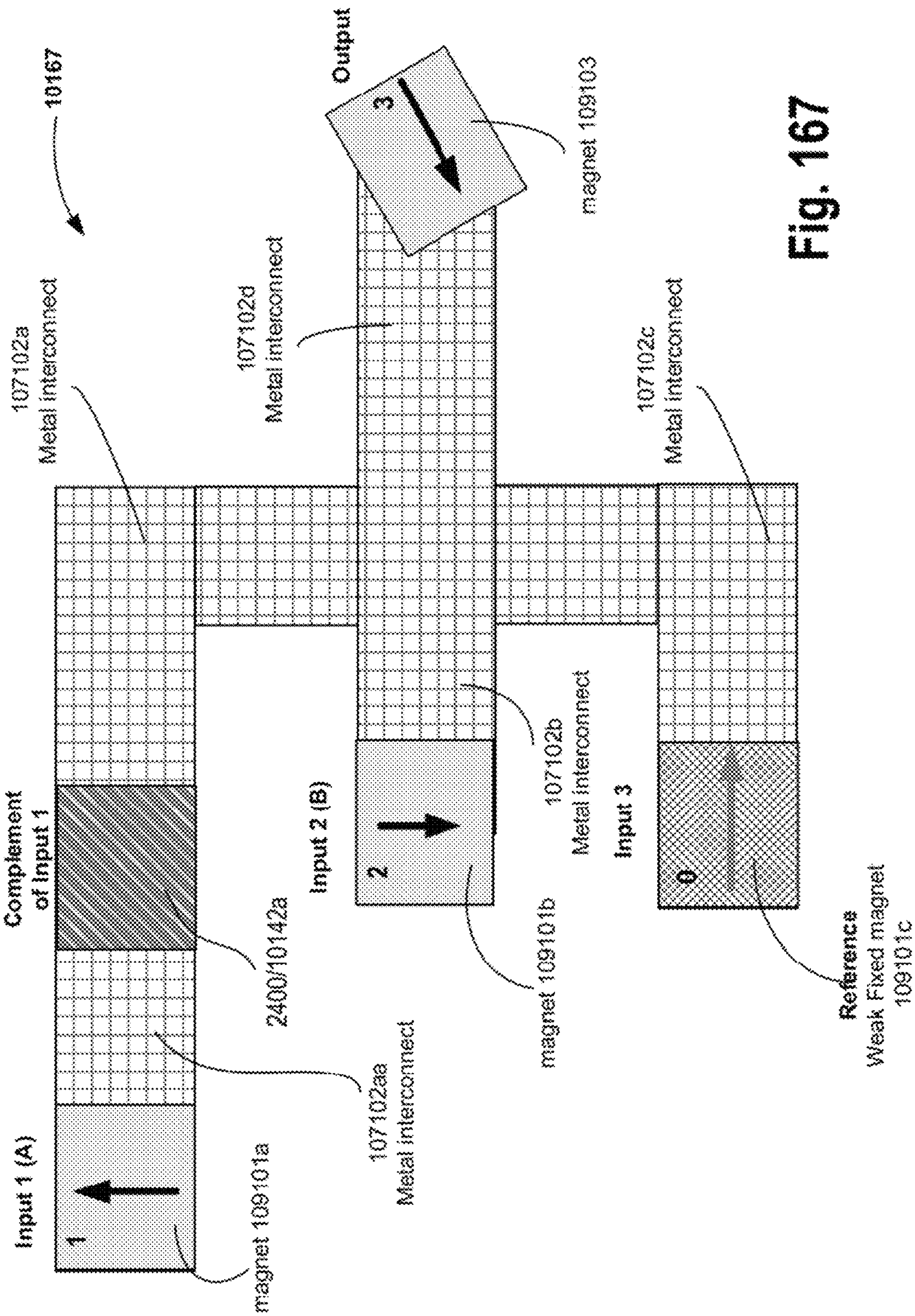

FIG. 167 illustrates the case when first input magnet 109101*a* (same as 107101*a*) has magnetization along +y direction (i.e., direction '1'), second input magnet 109101*b* (same as 107101*b*) has magnetization along −y direction (i.e., direction '2'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '1' in metal interconnect 107102*aa*. The spins from magnets 109101*a* are then received by gate 2400//10142*a* which performs a compliment function as discussed with reference to FIG. 24. Referring back to FIG. 167, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 168:
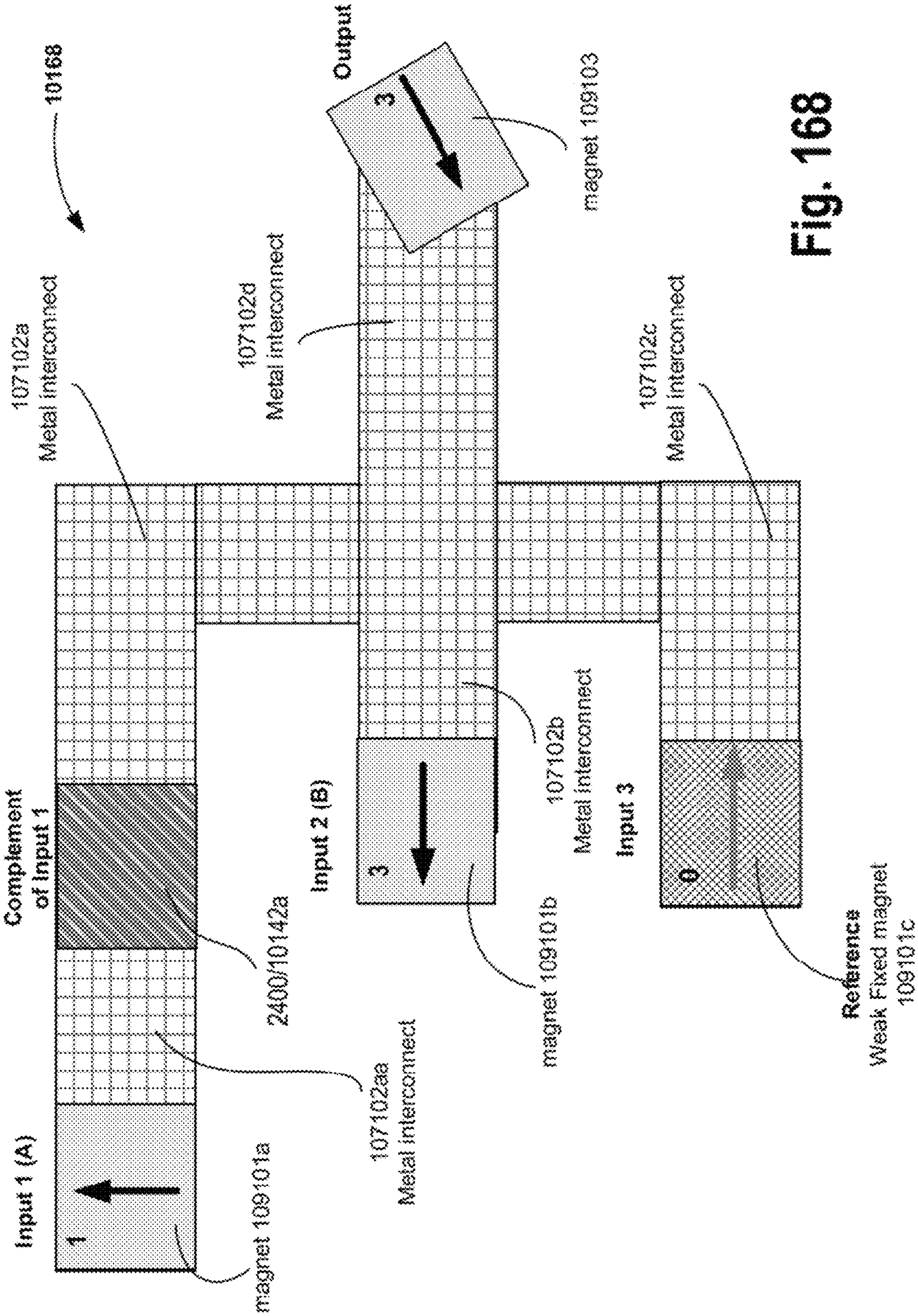

FIG. 168 illustrates the case when first input magnet 109101*a* (same as 107101*a*) has magnetization along +y direction (i.e., direction '1'), second input magnet 109101*b* (same as 107101*b*) has magnetization along −x direction (i.e., direction '3'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '1 in metal interconnect 107102*aa*. The spins from magnets 109101*a* are then received by gate 2400//10142*a* which performs a compliment function as discussed with reference to FIG. 24. Referring back to FIG. 168, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 169:
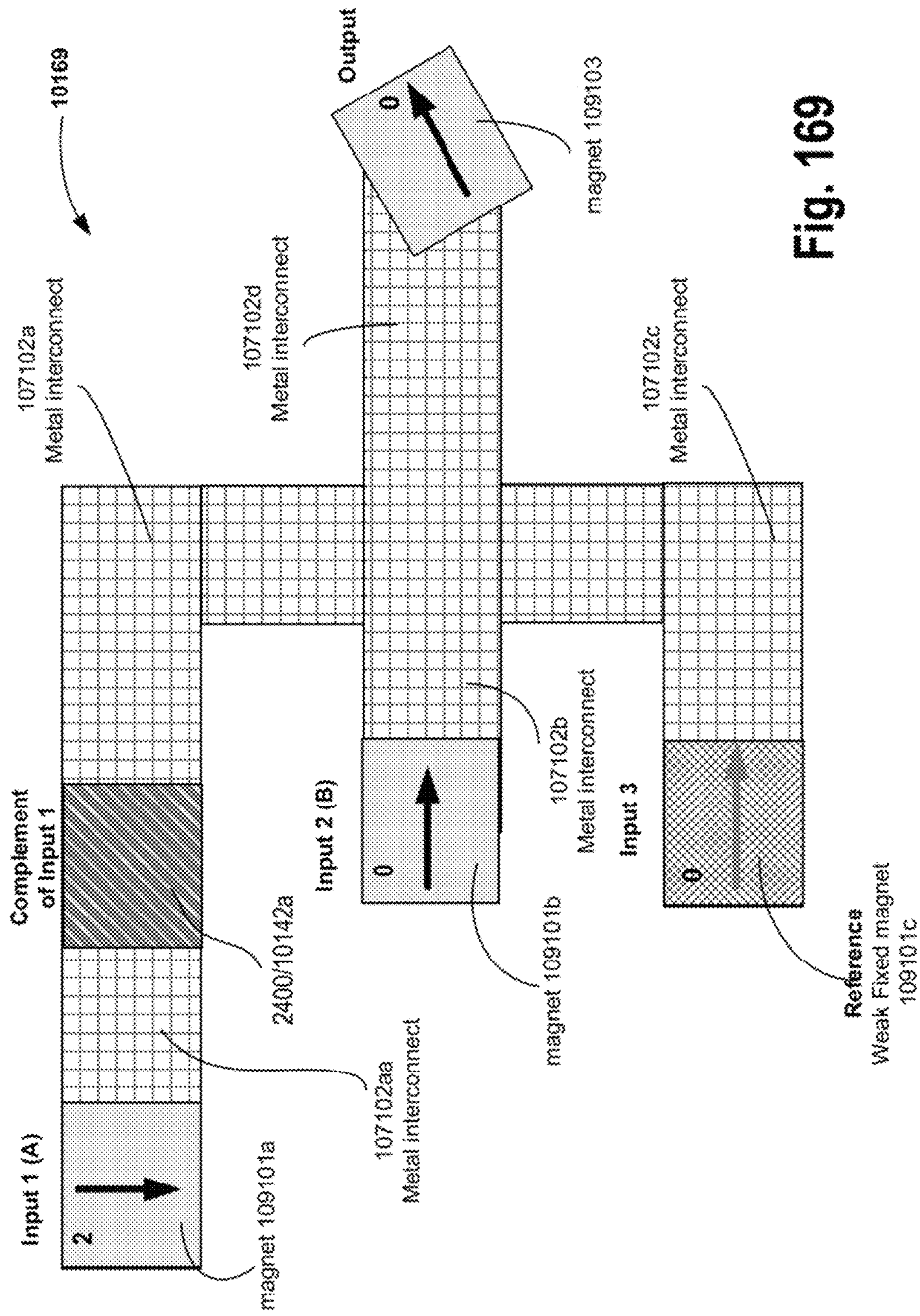

FIG. 169 illustrates the case when first input magnet 109101*a* (same as 107101*a*) has magnetization along −y direction (i.e., direction '2'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 169, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 170:
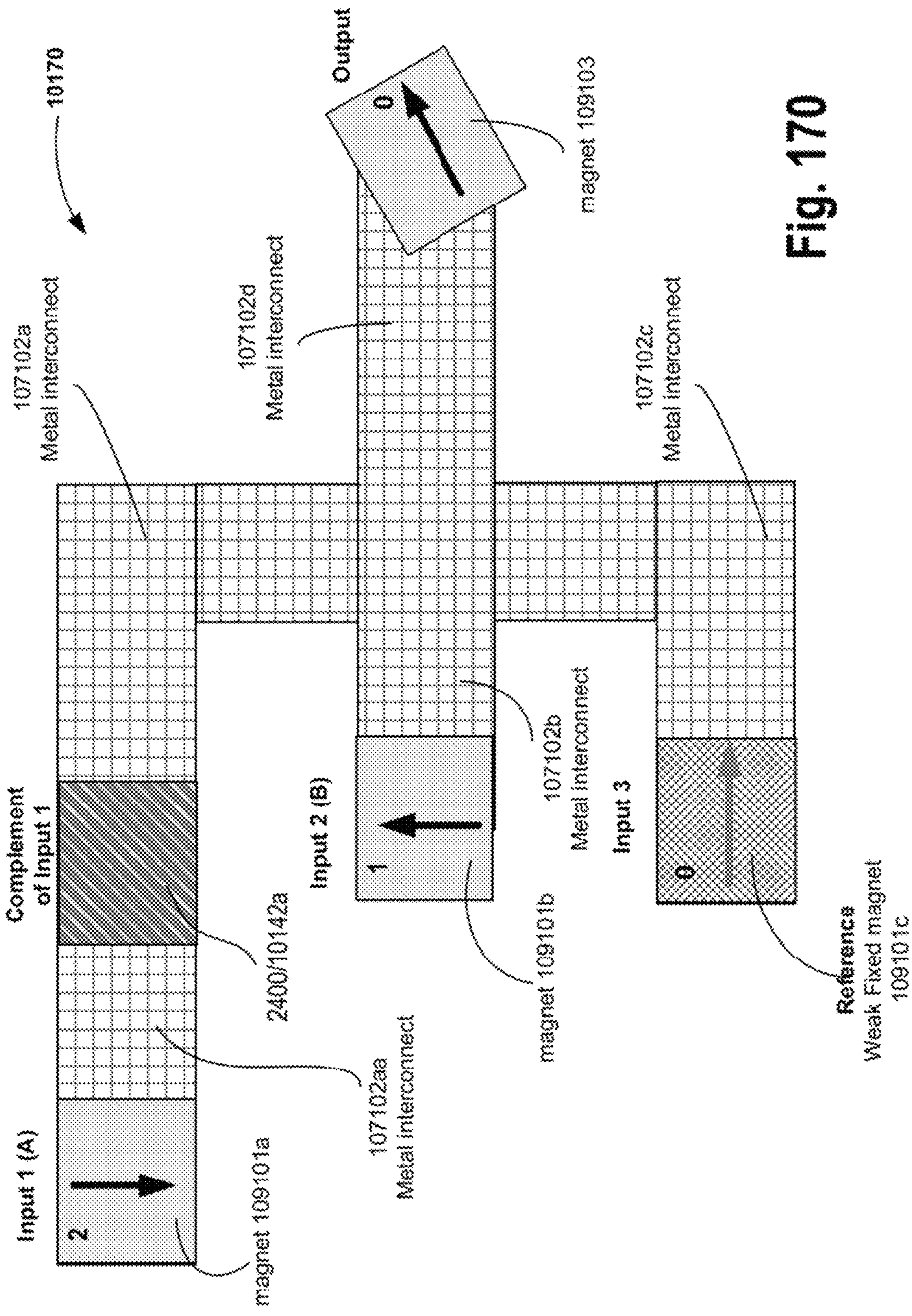

FIG. 170 illustrates the case when first input magnet 109101*a* (same as 107101*a*) has magnetization along −y direction (i.e., direction '2'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 170, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 171:
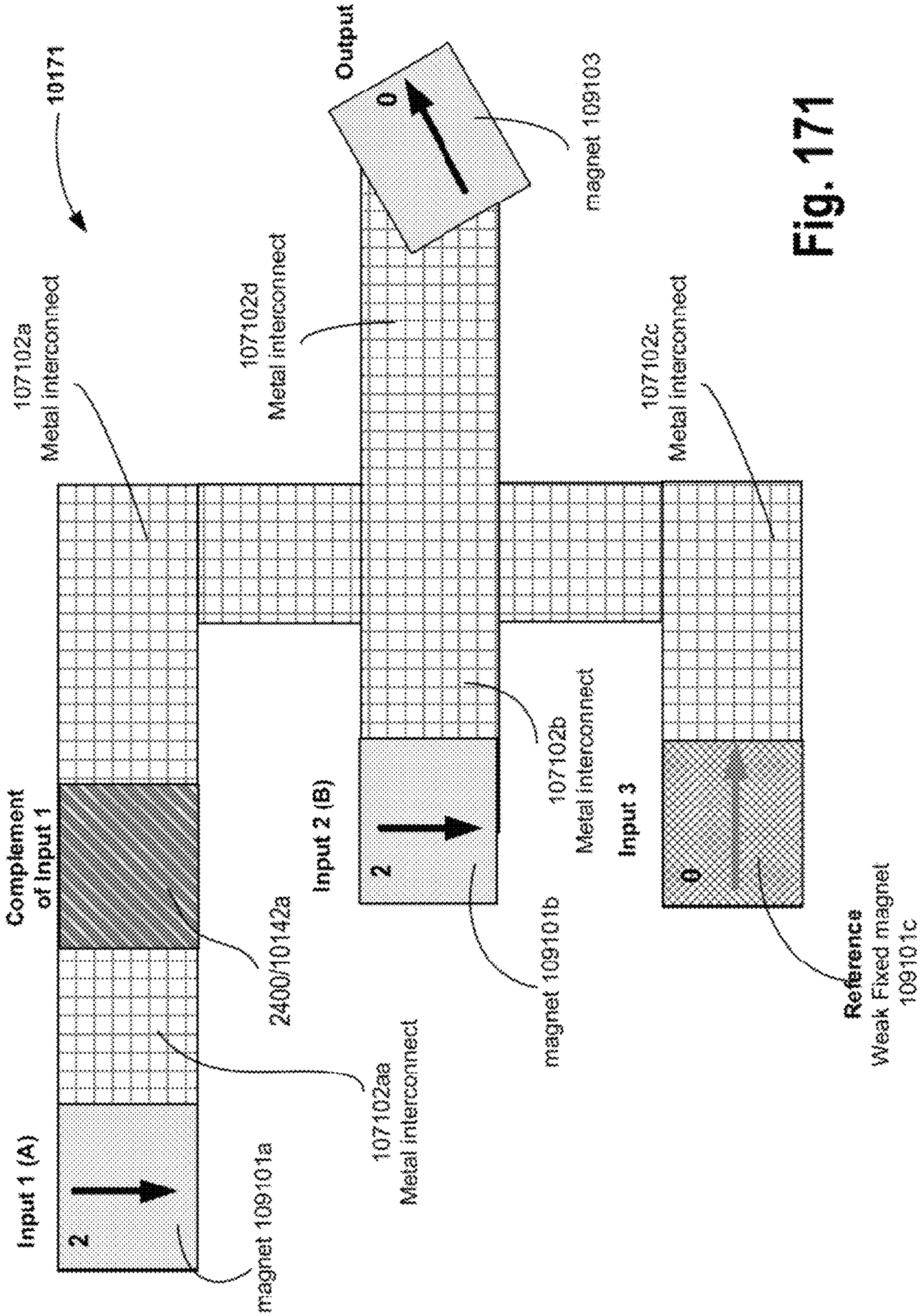

FIG. 171 illustrates the case when first input magnet 109101*a* (same as 107101*a*) has magnetization along −y direction (i.e., direction '2'), second input magnet 109101*b* (same as 107101*b*) has magnetization along −y direction (i.e., direction '2'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 171, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 172:
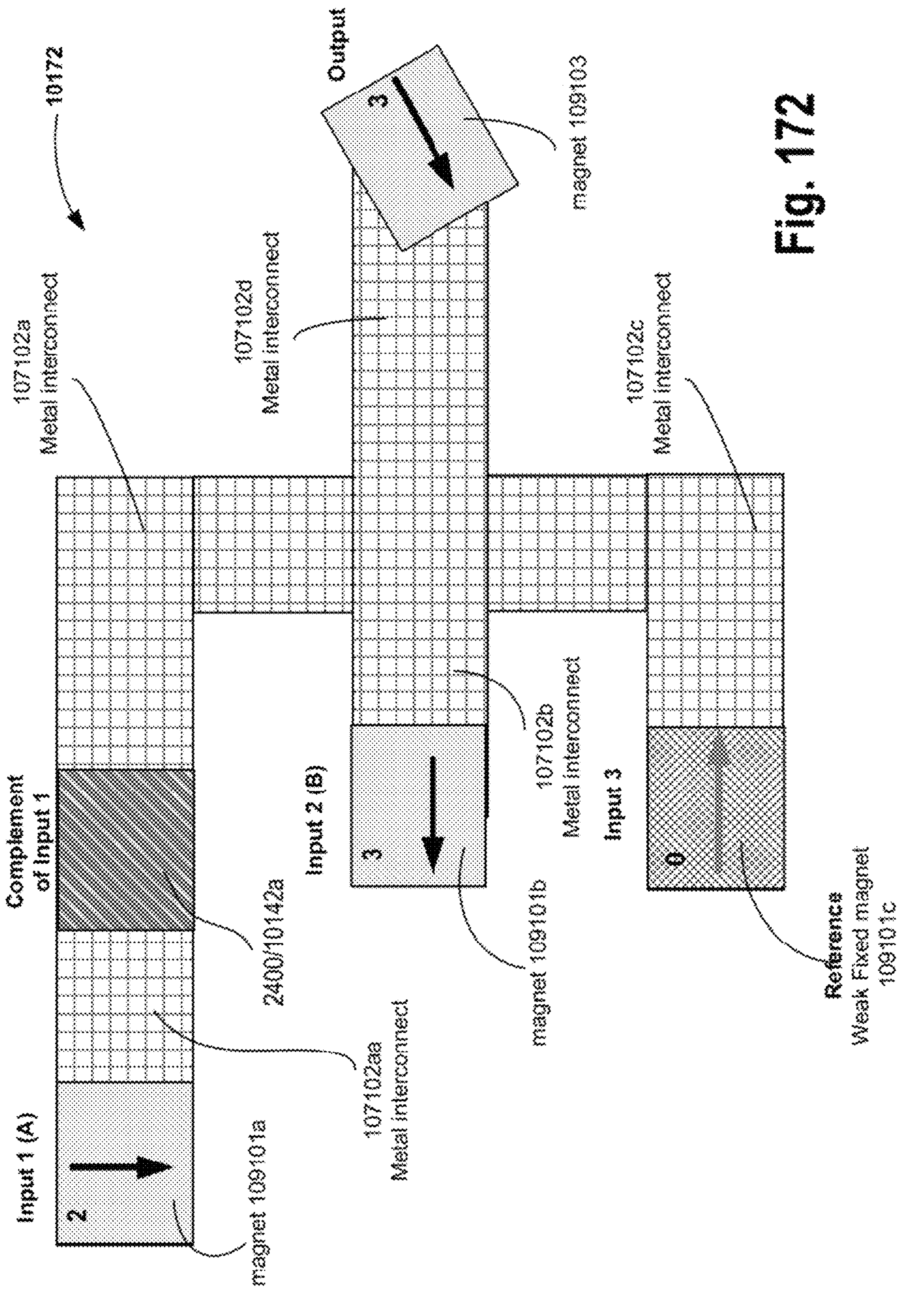

FIG. 172 illustrates the case when first input magnet 109101*a* (same as 107101*a*) has magnetization along −y direction (i.e., direction '2'), second input magnet 109101*b* (same as 107101*b*) has magnetization along −x direction (i.e., direction '3'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '2' in metal interconnect 107102*aa*. The spins from magnets 109101*a* are then received by gate 2400//10142*a* which performs a compliment function as discussed with reference to FIG. 24. Referring back to FIG. 172, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '3' for tilted output magnet 109103.

Figure 173:
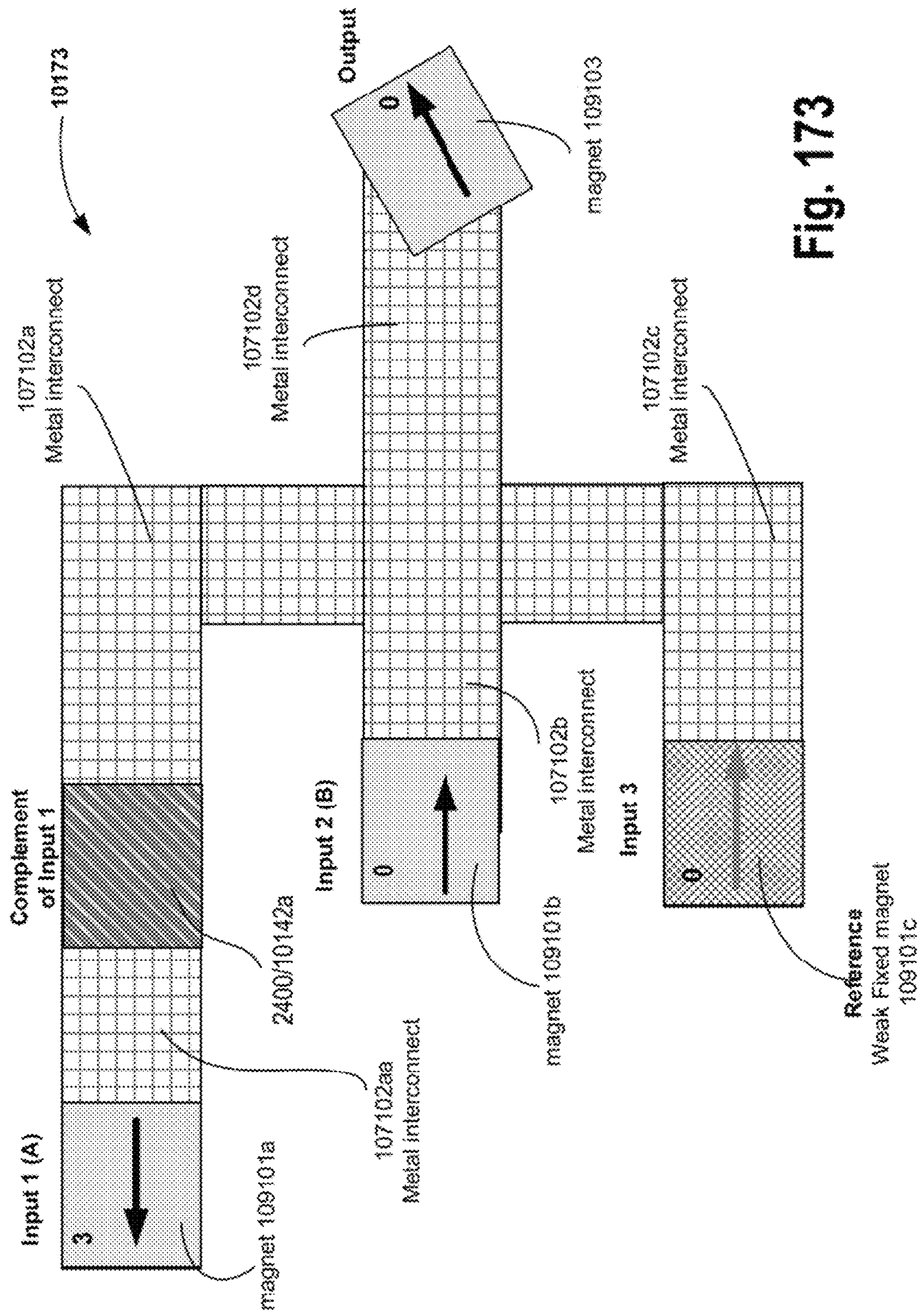

FIG. 173 illustrates the case when first input magnet 109101*a* (same as 107101*a*) has magnetization along −x direction (i.e., direction '3'), second input magnet 109101*b* (same as 107101*b*) has magnetization along +x direction (i.e., direction '0'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 173, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 174:
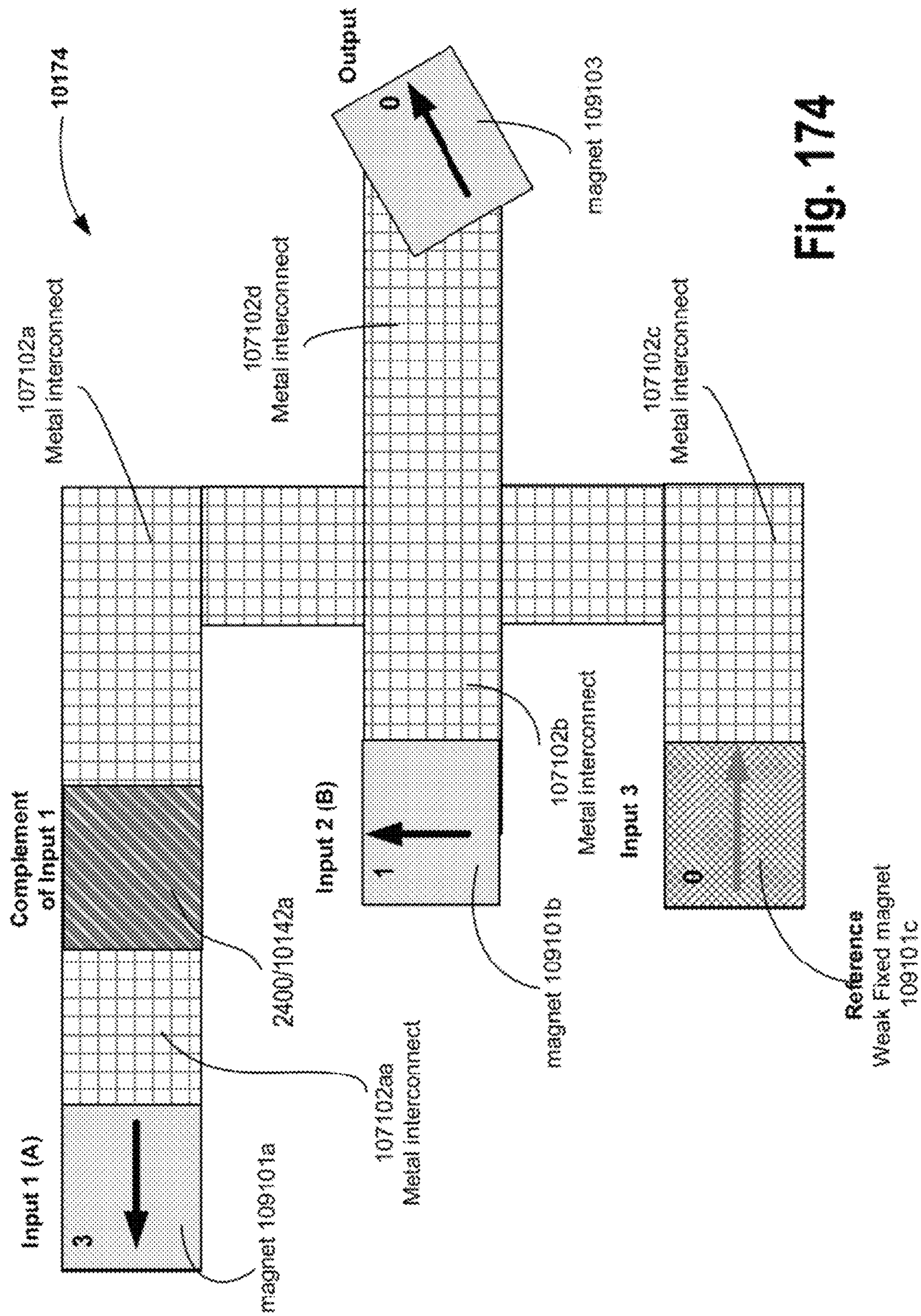

FIG. 174 illustrates the case when first input magnet 109101*a* (same as 107101*a*) has magnetization along −x direction (i.e., direction '3'), second input magnet 109101*b* (same as 107101*b*) has magnetization along +y direction (i.e., direction '1'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 174, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 175:
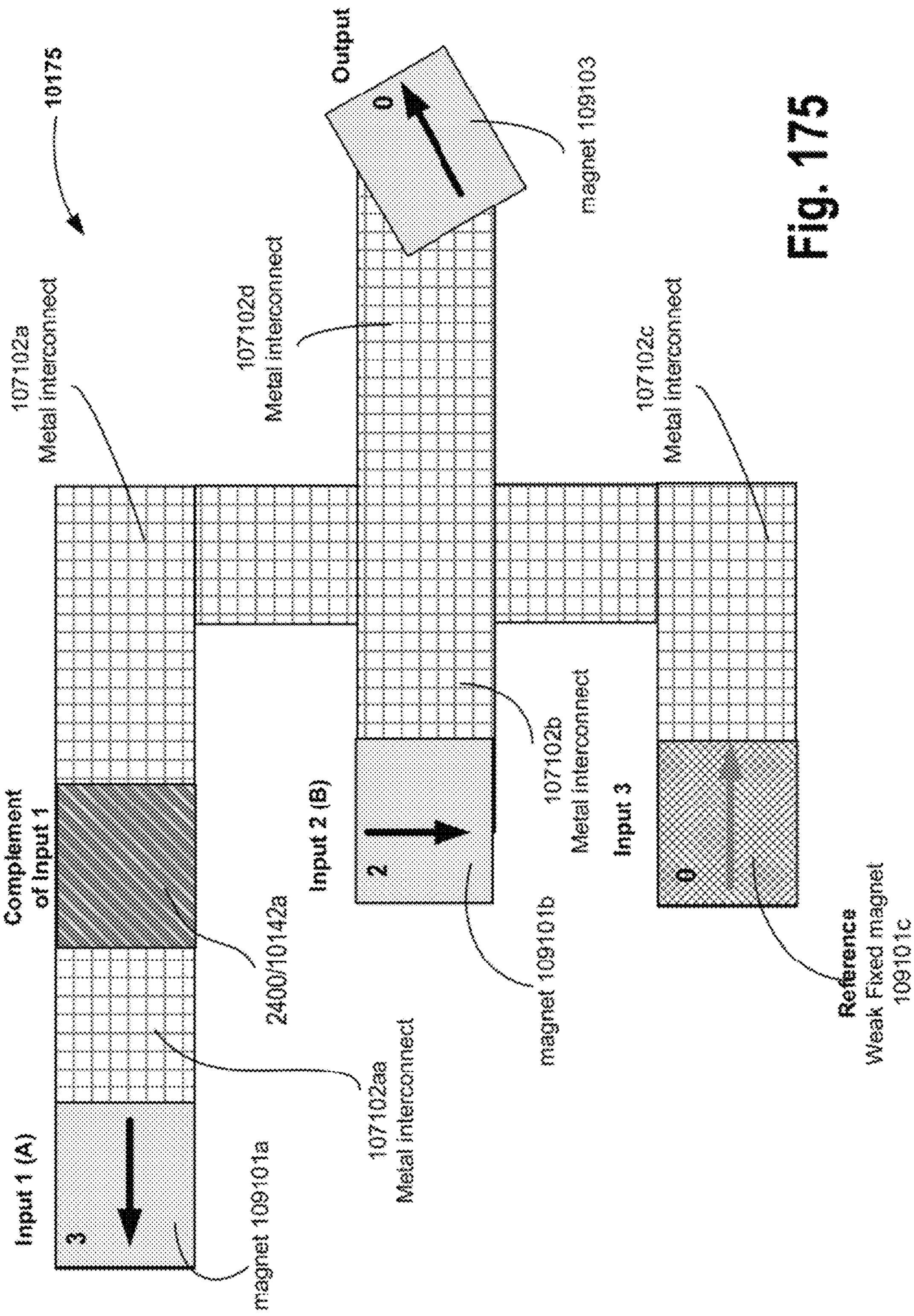

FIG. 175 illustrates the case when first input magnet 109101*a* (same as 107101*a*) has magnetization along −x direction (i.e., direction '3'), second input magnet 109101*b* (same as 107101*b*) has magnetization along −y direction (i.e., direction '2'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '0' in metal interconnect 107102*aa*. The spins from magnets 109101*a* are then received by gate 2400//10142*a* which performs a compliment function as discussed with reference to FIG. 24. Referring back to FIG. 175, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

Figure 176:
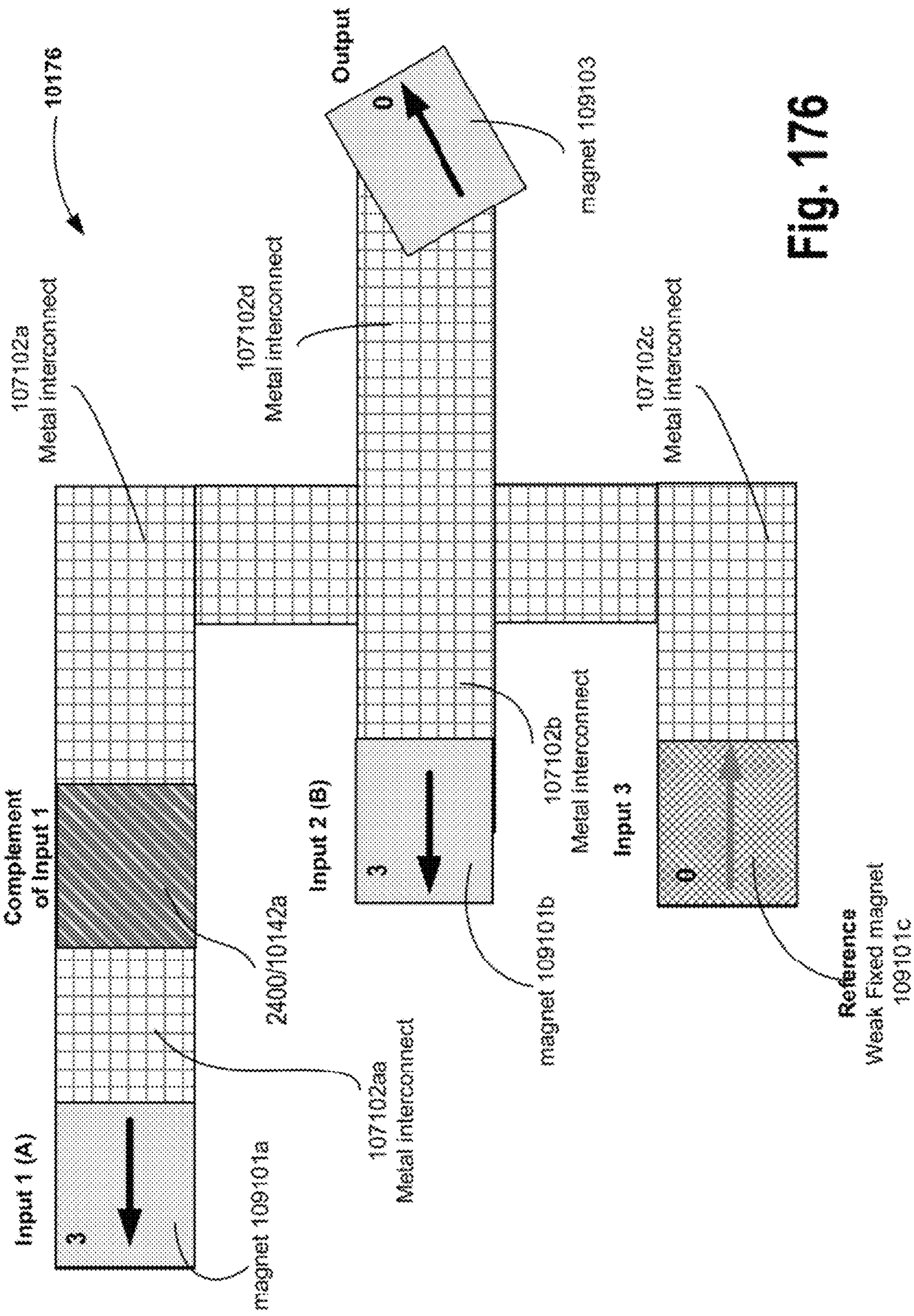

FIG. 176 illustrates the case when first input magnet 109101*a* (same as 107101*a*) has magnetization along −x direction (i.e., direction '3'), second input magnet 109101*b* (same as 107101*b*) has magnetization along −x direction (i.e., direction '3'), third input fixed magnet 109101*c* (same as 109101*c*) has fixed but relatively weak magnetization along +x direction (i.e., direction '0'). The magnetization directions of the input magnets also dictates the direction of spins that are injected into the metal interconnects by the magnets, according to some embodiments. For example, spin current injected by magnet 109101*a* is along direction '3' in metal interconnect 107102*aa*. The spins from magnets 109101*a* are then received by gate 2400//10142*a* which performs a compliment function as discussed with reference to FIG. 24. Referring back to FIG. 176, the compliment of spins in 107102*aa* are injected into metal interconnect 107102*a*. The spins injected from gate 2400/10142*a*, magnets 109101*b* and 109101*c* travel through metal interconnects 107102*a*, 107102*b*, and 107102*c*, respectively, and combine in metal interconnect 107102*d*. The resultant spin determines the magnetization of output magnet 109103 (same as 107103), in accordance with some embodiments. In this case, the majority spin direction causes output magnet to have magnetization along direction '0' for tilted output magnet 109103.

System Diagram Description (e.g., Smart Device)

Figure 177:
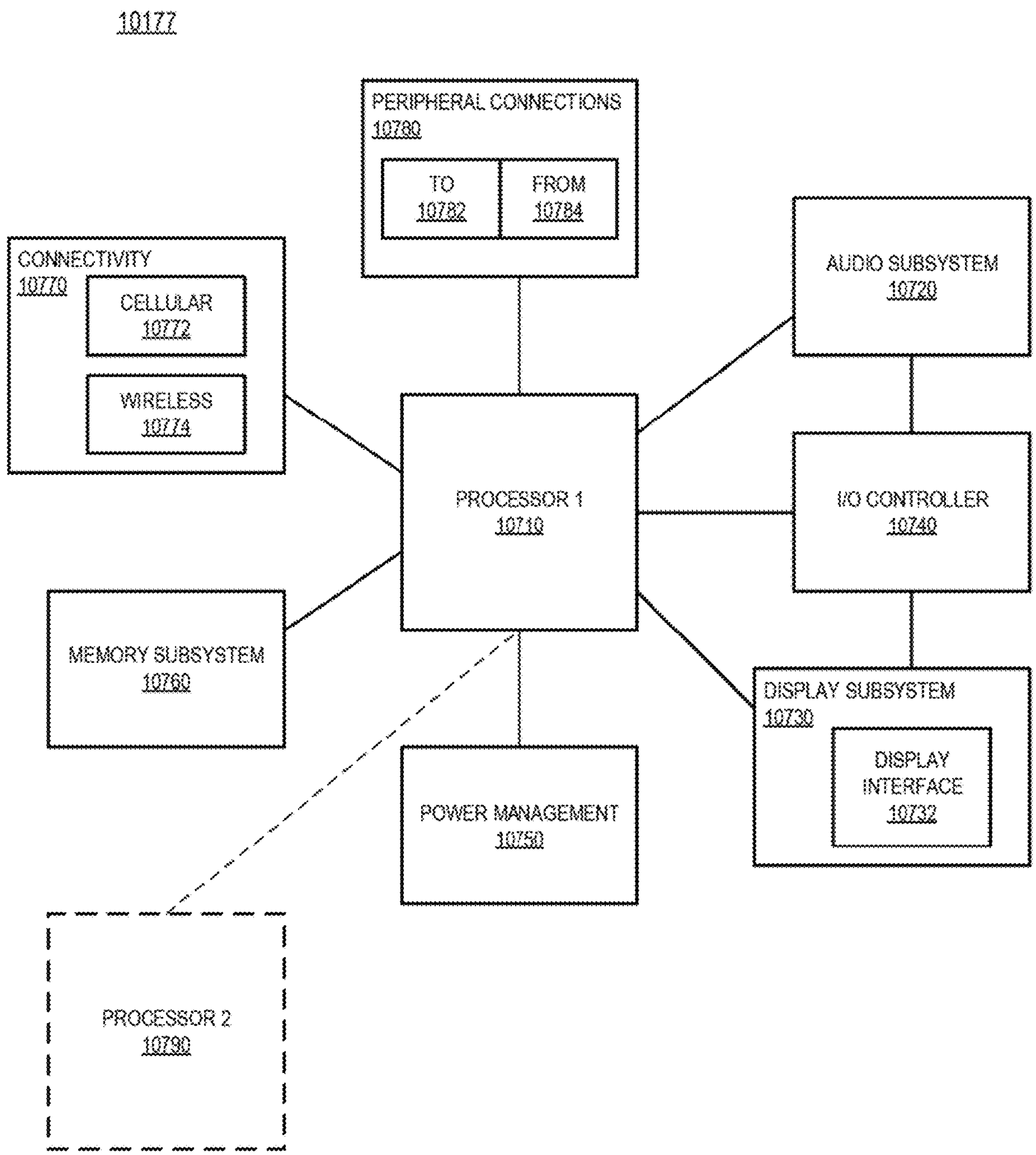
FIG. 177 illustrates a smart device or a computer system or a SoC (System-on-Chip) with a spin logic device with 4-state magnets, according to some embodiments of the disclosure.

FIG. 177 illustrates a smart device or a computer system or a SoC (System-on-Chip) 10177 with a spin logic device with 4-state magnet, according to some embodiments of the disclosure. Spin logic devices of various embodiments can be used for making high density embedded memory to improve performance of computer system. Spin logic devices (e.g., 200-500) an also be used to form non-volatile logic components to enable improved power and performance optimization. As such, battery life for the smart device of computer system can improve (i.e., last longer). It is pointed out that those elements of FIG. 177 having the same reference numbers (or names) as the elements of any other figure can operate or function in any manner similar to that described, but are not limited to such.

FIG. 177 illustrates a block diagram of an embodiment of a mobile device in which flat surface interface connectors could be used. In some embodiments, computing device 10177 represents a mobile computing device, such as a computing tablet, a mobile phone or smart-phone, a wireless-enabled e-reader, or other wireless mobile device. It will be understood that certain components are shown generally, and not all components of such a device are shown in computing device 10177.

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, eFET, etc., may be used without departing from the scope of the disclosure.

In some embodiments, computing device 10177 includes first processor 10177 with a spin logic device using one or more 4-state magnets, according to some embodiments discussed. Other blocks of the computing device 10177 may also include a spin logic device using one or more 4-state magnets, according to some embodiments. The various embodiments of the present disclosure may also comprise a network interface within 10177 such as a wireless interface so that a system embodiment may be incorporated into a wireless device, for example, cell phone or personal digital assistant.

In some embodiments, processor 10710 (and/or processor 10790) can include one or more physical devices, such as microprocessors, application processors, microcontrollers, programmable logic devices, or other processing means. The processing operations performed by processor 10710 include the execution of an operating platform or operating system on which applications and/or device functions are executed. The processing operations include operations related to I/O (input/output) with a human user or with other devices, operations related to power management, and/or operations related to connecting the computing device 10700 to another device. The processing operations may also include operations related to audio I/O and/or display I/O.

In some embodiments, computing device 10700 includes audio subsystem 10720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 10177, or connected to the computing device 10177. In one embodiment, a user interacts with the computing device 10177 by providing audio commands that are received and processed by processor 10710.

In some embodiments, computing device 10177 comprises display subsystem 10730. Display subsystem 10730 represents hardware (e.g., display devices) and software (e.g., drivers) components that provide a visual and/or tactile display for a user to interact with the computing device 10177. Display subsystem 10730 includes display interface 10732, which includes the particular screen or hardware device used to provide a display to a user. In one embodiment, display interface 10732 includes logic separate from processor 10710 to perform at least some processing related to the display. In one embodiment, display subsystem 10730 includes a touch screen (or touch pad) device that provides both output and input to a user.

In some embodiments, computing device 10177 comprises I/O controller 10740. I/O controller 10740 represents hardware devices and software components related to interaction with a user. I/O controller 10740 is operable to manage hardware that is part of audio subsystem 10720 and/or display subsystem 10730. Additionally, I/O controller 10740 illustrates a connection point for additional devices that connect to computing device 10177 through which a user might interact with the system. For example, devices that can be attached to the computing device 10700 might include microphone devices, speaker or stereo systems, video systems or other display devices, keyboard or keypad devices, or other I/O devices for use with specific applications such as card readers or other devices.

As mentioned above, I/O controller 10740 can interact with audio subsystem 10720 and/or display subsystem 10730. For example, input through a microphone or other audio device can provide input or commands for one or more applications or functions of the computing device 10177. Additionally, audio output can be provided instead of, or in addition to display output. In another example, if display subsystem 10730 includes a touch screen, the display device also acts as an input device, which can be at least partially managed by I/O controller 10740. There can also be additional buttons or switches on the computing device 10700 to provide I/O functions managed by I/O controller 10740.

In some embodiments, I/O controller 10740 manages devices such as accelerometers, cameras, light sensors or other environmental sensors, or other hardware that can be included in the computing device 10177. The input can be part of direct user interaction, as well as providing environmental input to the system to influence its operations (such as filtering for noise, adjusting displays for brightness detection, applying a flash for a camera, or other features).

In some embodiments, computing device 10177 includes power management 10750 that manages battery power usage, charging of the battery, and features related to power saving operation. Memory subsystem 10760 includes memory devices for storing information in computing device 10177. Memory can include nonvolatile (state does not change if power to the memory device is interrupted) and/or volatile (state is indeterminate if power to the memory device is interrupted) memory devices. Memory subsystem 10760 can store application data, user data, music, photos, documents, or other data, as well as system data (whether long-term or temporary) related to the execution of the applications and functions of the computing device 10700.

Elements of embodiments are also provided as a machine-readable medium (e.g., memory 10760) for storing the computer-executable instructions (e.g., instructions to implement any other processes discussed herein). The machine-readable medium (e.g., memory 10760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 10177 comprises connectivity 10770. Connectivity 10770 includes hardware devices (e.g., wireless and/or wired connectors and communication hardware) and software components (e.g., drivers, protocol stacks) to enable the computing device 10177 to communicate with external devices. The computing device 10177 could be separate devices, such as other computing devices, wireless access points or base stations, as well as peripherals such as headsets, printers, or other devices.

Connectivity 10770 can include multiple different types of connectivity. To generalize, the computing device 10177 is illustrated with cellular connectivity 10772 and wireless connectivity 10774. Cellular connectivity 10772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 10774 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 10177 comprises peripheral connections 10780. Peripheral connections 10780 include hardware interfaces and connectors, as well as software components (e.g., drivers, protocol stacks) to make peripheral connections. It will be understood that the computing device 10177 could both be a peripheral device ("to" 10782) to other computing devices, as well as have peripheral devices ("from" 10784) connected to it. The computing device 10177 commonly has a "docking" connector to connect to other computing devices for purposes such as managing (e.g., downloading and/or uploading, changing, synchronizing) content on computing device 10177. Additionally, a docking connector can allow computing device 10177 to connect to certain peripherals that allow the computing device 10177 to control content output, for example, to audiovisual or other systems.

In addition to a proprietary docking connector or other proprietary connection hardware, the computing device 10177 can make peripheral connections 10780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a 4-state input magnet; a first spin channel region adjacent to the 4-state input magnet; a 4-state output magnet; a second spin channel region adjacent to the 4-state input and output magnets; and a third spin channel region adjacent to the 4-state output magnet.

Example 2 includes all features of example 1, wherein the 4-state input and output magnets comprise a material which includes one of: Fe, Ni, Co and their alloys, magnetic insulators, or Heusler alloys of the form $X_2YZ$.

Example 3 includes all features of example 2, wherein the magnetic insulators comprise a material which includes one of: Fe, O, Y, Al, magnetite $Fe_3O_4$ or $Y_3Al_5O_{12}$.

Example 4 includes all features of example 2, wherein the Heusler alloys comprises one of: Co, Fe, Si, Mn, Ga, $Co_2FeSi$ or $Mn_2Ga$.

Example 5 includes features of any one of examples 1 to 4, wherein the first, second, and third spin channel regions comprise a material which includes one of: Cu, Ag, Al, or 2D conducting materials.

Example 6 includes all features of example 5, wherein the 2D conducting materials is graphene.

Example 7 includes features of any one of examples 1 to 4, wherein the apparatus of example 7 comprises a first oxide region separating at least a portion of the first spin channel region from the second spin channel region.

Example 8 includes features of example 7, wherein the apparatus of example 8 comprises a second oxide region separating at least a portion the second spin channel region from the third spin channel region.

Example 9 includes features of example 8, wherein a portion of the first spin channel region is adjacent to a portion of the second spin channel region, and wherein a portion of the second spin channel region is adjacent to a portion of the third spin channel region.

Example 10 includes features of example 9, wherein the apparatus of example 10 comprises a third oxide region separating the 4-state input magnet from the 4-state output magnet.

Example 11 includes features according to any one of examples 1 to 4, wherein the apparatus of example 11 comprises: a non-magnetic metal adjacent to the 4-state input magnet from the 4-state output magnet.

Example 12 includes features of example 11, wherein the non-magnetic metal is coupled to a positive supply to configure the apparatus as a buffer.

Example 13 includes features of example 11, wherein the non-magnetic metal is coupled to a negative supply to configure the apparatus as an inverter.

Example 14 includes features according to any one of examples 1 to 4, wherein the apparatus of example 14 comprises: a via adjacent to the second spin channel region; and a non-magnetic metal adjacent to via.

Example 15 includes features according to any one of examples 1 to 4, wherein the 4-state input and output magnets have cubic magnetic crystalline anisotropy.

Example 16 includes features according to any one of examples 1 to 4, wherein the 4-state input magnet overlaps the second spin channel region more than 4-state output magnet overlaps the second spin channel region.

Example 17 is an apparatus which comprises: a 4-state input magnet; a first filter layer adjacent to the 4-state input magnet; a first spin channel region adjacent to the first filter layer; a 4-state output magnet; a second filter layer adjacent to the 4-state output magnet; a second spin channel region adjacent to the first and second filter layers; and a third spin channel region adjacent to the second filter layer.

Example 18 includes all features of example 17, wherein the 4-state input and output magnets comprises a material which includes one of: Fe, Ni, Co and their alloys, magnetic insulators, or Heusler alloys of the form $X_2YZ$.

Example 19 includes all features of example 18, wherein the magnetic insulators comprises a material which includes one of: Fe, O, Y, Al, magnetite $Fe_3O_4$ or $Y_3Al_5O_{12}$.

Example 20 includes all features of example 18, wherein the Heusler alloys includes one of: Co, Fe, Si, Mn, Ga, $Co_2FeSi$ or $Mn_2Ga$.

Example 21 includes features according to any one of examples 17 to 20, wherein the first, second, and third spin channel regions comprise a material which includes one of: Cu, Ag, Al, or 2D conducting materials.

Example 22 includes features of example 21, wherein the 2D conducting materials include graphene.

Example 23 includes features according to any one of examples 17 to 20, wherein the first and second filter layers comprise a material which includes one of: Mg, O, Al, O, B, N, Zn, Si, Ni, Fe, MgO, $Al_2O_3$, BN, $MgAl_2O_4$, $ZnAl_2O_4$, $SiMg_2O_4$, and $SiZn_2O_4$, or NiFeO.

Example 24 includes features according to any one of examples 17 to 20, wherein the 4-state input magnet and the first filter layer overlap the second spin channel region more than 4-state output magnet and second filter layer overlap the second spin channel region.

Example 25 is a system which comprises a memory; a processor coupled to the memory, the processor including an apparatus according to any one of apparatus examples 1 to 16 or apparatus examples 17 to 24; and a wireless interface for allowing the processor to communicate with another device.

Example 26 is an apparatus which comprises: input and output magnets, each configured to have four stable magnetic states including zero state, first state, second state, and third state, wherein the zero state is to point in a +x-direction, wherein the first state is to point in a +y-direction, wherein the second state is to point in a −y-direction, and wherein the third state is to point in a −x-direction.

Example 27 includes all features of example 26, wherein a thermal barrier between the zero, first, second, and third, is greater than or equal to 10 kT.

Example 28 includes features according to any one of examples 26 to 27, wherein the example 28 comprises: a first spin channel region adjacent to the input magnet; a second spin channel region adjacent to the input and output magnets; and a third spin channel region adjacent to the output magnet.

Example 29 includes features according to any one of apparatus examples 26 to 28, wherein the input and output magnets comprises a material which includes one of: Fe, Ni, Co and their alloys, magnetic insulators, or Heusler alloys of the form $X_2YZ$.

Example 30 includes features of example 29, wherein the magnetic insulators comprises a material which includes one of: Fe, O, Y, Al, magnetite $Fe_3O_4$ or $Y_3Al_5O_{12}$.

Example 31 includes features of example 30, wherein the Heusler alloys includes one of: Co, Fe, Si, Mn, Ga, $Co_2FeSi$ or $Mn_3Ga$.

Example 32 includes features of example 28, wherein the first, second, and third spin channel regions comprises a material which includes one of: Cu, Ag, Al, or 2D conducting materials.

Example 33 includes features of example 32, wherein the 2D conducting materials include one of: Mo, S, W, S, Se, graphene, $MoS_2$, MoSe, WS, or WSe.

Example 34 includes features of example 32, wherein the apparatus of example 34 comprises: a first oxide region separating at least a portion of the first spin channel region from the second spin channel region; and a second oxide region separating at least a portion the second spin channel region from the third spin channel region.

Example 35 includes features of example 34, wherein a portion of the first spin channel region is adjacent to a portion of the second spin channel region, and wherein a portion of the second spin channel region is adjacent to a portion of the third spin channel region.

Example 36 includes features of example 35, wherein the apparatus of example 36 comprises a third oxide region separating the input magnet from the output magnet.

Example 37 includes features of example 32, wherein the apparatus of example 37 comprises a non-magnetic metal adjacent to the input magnet and the output magnet.

Example 38 includes features of example 37, wherein the non-magnetic metal is coupled to a positive supply to configure the apparatus as a buffer.

Example 39 includes features of example 38, wherein the non-magnetic metal is coupled to a negative supply to configure the apparatus as an inverter.

Example 40 is a system which comprises: a memory; a processor coupled to the memory, the processor including an apparatus according to any one of apparatus examples 26 to 39; and a wireless interface for allowing the processor to communicate with another device.

Example 41 is a method which comprises: forming a 4-state input magnet; forming a first spin channel region adjacent to the 4-state input magnet; forming a 4-state output magnet; forming a second spin channel region adjacent to the 4-state input and output magnets; and forming a third spin channel region adjacent to the 4-state output magnet.

Example 42 includes features of example 41, wherein the 4-state input and output magnets comprise a material which includes one of: Fe, Ni, Co and their alloys, magnetic insulators, or Heusler alloys of the form $X_2YZ$.

Example 43 includes features of example 42, wherein the magnetic insulators comprise a material which includes one of: Fe, O, Y, Al, magnetite $Fe_3O_4$ or $Y_3Al_5O_{12}$.

Example 44 includes features of example 42, wherein the Heusler alloys comprises one of: Co, Fe, Si, Mn, Ga, $Co_2FeSi$ or $Mn_2Ga$.

Example 45 is according to any one of method examples 41 to 44, wherein the first, second, and third spin channel regions comprise a material which includes one of: Cu, Ag, Al, or 2D conducting materials.

Example 46 includes all features of example 45, wherein the 2D conducting materials is graphene.

Example 47 is according to any one of method examples 41 to 44, wherein the method of example 47 comprises forming a first oxide region separating at least a portion of the first spin channel region from the second spin channel region.

Example 48 includes feature of example 47, wherein the method of example 48 comprises forming a second oxide region separating at least a portion the second spin channel region from the third spin channel region.

Example 49 includes features of example 48, wherein the method of example 48 comprises: positioning a portion of the first spin channel region adjacent to a portion of the second spin channel region; and positioning a portion of the second spin channel region is adjacent to a portion of the third spin channel region.

Example 50 includes features of example 49, wherein the method of example 49 comprises forming a third oxide region separating the 4-state input magnet from the 4-state output magnet.

Example 51 includes features of example 47, wherein the method of example 47 comprises forming a non-magnetic metal adjacent to the 4-state input magnet from the 4-state output magnet.

Example 52 includes features of example 51, wherein the method of example 52 comprises coupling the non-magnetic metal to a positive supply to operate as a buffer.

Example 53 includes features of example 51, wherein the method of example 51 comprises: coupling the non-magnetic metal to a negative supply to operate as an inverter.

Example 54 includes features of example 47, wherein the method of example 54 comprises: forming a via adjacent to the second spin channel region; and forming a non-magnetic metal adjacent to via.

Example 55 is according to any one of method claims 41 to 44, wherein the 4-state input and output magnets have cubic magnetic crystalline anisotropy.

Example 56 is according to any one of method claims 41 to 44, wherein the method of example 56 comprises overlapping the 4-state input magnet the second spin channel region more than 4-state output magnet overlaps the second spin channel region.

Example 57 is a method which comprises: forming a 4-state input magnet; forming a first filter layer adjacent to the 4-state input magnet; forming a first spin channel region adjacent to the first filter layer; forming a 4-state output magnet; forming a second filter layer adjacent to the 4-state output magnet; forming a second spin channel region adjacent to the first and second filter layers; and forming a third spin channel region adjacent to the second filter layer.

Example 58 includes all features of example 57, wherein the 4-state input and output magnets comprises a material which includes one of: Fe, Ni, Co and their alloys, magnetic insulators, or Heusler alloys of the form $X_2YZ$.

Example 59 includes all features of example 58, wherein the magnetic insulators comprises a material which includes one of: Fe, O, Y, Al, magnetite $Fe_3O_4$ or $Y_3Al_5O_{12}$.

Example 60 includes features of example 58, wherein the Heusler alloys includes one of: Co, Fe, Si, Mn, Ga, $Co_2FeSi$ or $Mn_2Ga$.

Example 61 is according to any one of method examples 57 to 60, wherein the first, second, and third spin channel regions comprise a material which includes one of: Cu, Ag, Al, or 2D conducting materials.

Example 62 includes features of example 61, wherein the 2D conducting materials include graphene.

Example 63 includes features of example 57, wherein the first and second filter layers comprise a material which includes one of: Mg, O, Al, O, B, N, Zn, Si, Ni, Fe, MgO, $Al_2O_3$, BN, $MgAl_2O_4$, $ZnAl_2O_4$, $SiMg_2O_4$, and $SiZn_2O_4$, and NiFeO.

Example 64 includes all features of example 57, wherein the method of example 57 comprises overlapping the 4-state input magnet and the first filter layer to the second spin channel region more than 4-state output magnet and second filter layer are overlap the second spin channel region.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
- a first magnet having one of four possible stable magnetization states;
- a first structure adjacent to the first magnet, the first structure including a first material;
- a second magnet having one of four possible stable magnetization states;
- a second structure adjacent to the first and second magnets, the second structure including a second material;
- a third structure adjacent to the second magnet, the third structure including a third material, wherein the first structure is separated from the second structure, wherein the second structure is separated from the third structure, and wherein the first, second, and third materials include spin conductive materials;
- a via adjacent to the second structure; and
- a metal structure comprising non-magnetic material, wherein the metal structure is adjacent to the via.

2. The apparatus of claim 1, wherein the first or second magnets comprise a material which includes one of: Fe, Ni, Co and their alloys, magnetic insulators, or Heusler alloys of a form $X_2YZ$.

3. The apparatus of claim 2, wherein the magnetic insulators comprise a material which includes one of: Fe, O, Y, Al, or a magnetite.

4. The apparatus of claim 2, wherein the Heusler alloys comprises one of: Co, Fe, Si, Mn, or Ga.

5. The apparatus of claim 1, wherein the first, second, and third structures comprise a material which includes one of: Cu, Ag, Al, or 2D conductive materials.

6. The apparatus of claim 5, wherein the 2D conductive materials include graphene.

7. The apparatus of claim 1, wherein the first structure is separated from the second structure by a first oxide region.

8. The apparatus of claim 7, wherein the second structure is separated from the third structure by a second oxide region.

9. The apparatus of claim 8, wherein a portion of the first structure is adjacent to a portion of the second structure, and wherein a portion of the second structure is adjacent to a portion of the third structure.

10. The apparatus of claim 9, wherein the first magnet and the second magnet are separated by a third oxide region.

11. The apparatus of claim 1 comprises a metal structure comprising a non-magnetic metal material, wherein the metal structure is adjacent to the first magnet.

12. The apparatus of claim 11, wherein the metal structure is coupled to a positive supply to configure the apparatus as a buffer.

13. The apparatus of claim 11, wherein the metal is coupled to a negative supply to configure the apparatus as an inverter.

14. The apparatus of claim 1, wherein the first magnet and the second magnet have cubic magnetic crystalline anisotropy.

15. The apparatus of claim 1, wherein the first magnet overlaps the second structure more than the second magnet overlaps the second structure.

16. An apparatus comprising:
- a first magnet having one of four possible stable magnetization states;
- a first filter layer adjacent to the first magnet;
- a first structure, having a first material, adjacent to the first filter layer;
- a second magnet;
- a second filter layer adjacent to the second magnet;
- a second structure, having a second material, adjacent to the first and second filter layers; and
- a third structure, having a third material, adjacent to the second filter layer, wherein the first structure is separate from the second structure, wherein the second structure is separate from the third structure, wherein the first, second, and third materials include spin conductive material.

17. The apparatus of claim 16, wherein the first magnet and the second magnet comprise a material which includes one of: Fe, Ni, Co and their alloys, magnetic insulators, or Heusler alloys of a form $X_2YZ$.

18. The apparatus of claim 17, wherein the magnetic insulators comprise a material which includes one of: Fe, O, Y, Al, or magnetite.

19. The apparatus of claim 17, wherein the Heusler alloys includes one of: Co, Fe, Si, Mn, or Ga.

20. The apparatus of claim 16, wherein the first, second, and third spin conductive material comprise a material which includes one of: Cu, Ag, Al, or 2D conductive materials, and wherein the 2D conductive materials include graphene.

21. The apparatus of claim 16, wherein the first and second filter layers comprise a material which includes one of: Mg, O, Al, O, B, N, Zn, Si, Ni, or Fe.

22. The apparatus of claim 16, wherein the first magnet and the first filter layer overlap the second structure more than the second magnet and the second filter layer overlap the second structure.

23. A system comprising:
- a memory; a processor coupled to the memory, the processor including an apparatus which comprises:
  - a 4-state input magnet;
  - a first spin channel region adjacent to the 4-state input magnet;
  - a 4-state output magnet;
  - a second spin channel region adjacent to the 4-state input and output magnets;
  - a third spin channel region adjacent to the 4-state output magnet;
  - a via adjacent to the second spin channel region;
  - a metal structure comprising non-magnetic material, wherein the metal structure is adjacent to the via; and
  - a wireless interface to allow the processor to communicate with another device.

24. The system of claim 23, wherein the 4-state magnet and the second magnet have cubic magnetic crystalline anisotropy.

* * * * *